US009887366B2

(12) United States Patent
Cho et al.

(10) Patent No.: US 9,887,366 B2
(45) Date of Patent: Feb. 6, 2018

(54) ORGANIC LIGHT-EMITTING DIODE

(71) Applicant: SAMSUNG DISPLAY CO., LTD., Yongin, Gyeonggi-do (KR)

(72) Inventors: Hwan-Hee Cho, Yongin (KR); Mi-Kyung Kim, Yongin (KR); Dae-Yup Shin, Yongin (KR); Se-Hun Kim, Yongin (KR); Kwan-Hee Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 816 days.

(21) Appl. No.: 14/018,387

(22) Filed: Sep. 4, 2013

(65) Prior Publication Data

US 2014/0319472 A1 Oct. 30, 2014

(30) Foreign Application Priority Data

Apr. 23, 2013 (KR) ........................ 10-2013-0045003

(51) Int. Cl.
*H01L 51/54* (2006.01)
*C09K 11/06* (2006.01)
(Continued)

(52) U.S. Cl.
CPC .......... *H01L 51/0071* (2013.01); *C09K 11/06* (2013.01); *H01L 51/006* (2013.01);
(Continued)

(58) Field of Classification Search
CPC ............... H01L 51/0032; H01L 51/005; H01L 51/0051; H01L 51/0052; H01L 51/0059; H01L 51/006; H01L 51/0061; H01L 51/0067; H01L 51/0069; H01L 51/0071; H01L 51/0072; H01L 51/0058; H01L 51/0084; H01L 51/0085; H01L 51/50; H01L 51/5012; H01L 51/5016; H01L 51/5056; C07D 409/00; C07D 409/02; C07D 409/10; C07D 215/00;
(Continued)

(56) References Cited

U.S. PATENT DOCUMENTS

2008/0014464 A1 1/2008 Kawamura et al.
2011/0279020 A1* 11/2011 Inoue .................. C07D 209/82 313/504
(Continued)

FOREIGN PATENT DOCUMENTS

JP 2003151774 A * 5/2003
KR 10-2009-0021174 A 2/2009
(Continued)

OTHER PUBLICATIONS

Machine translation of KR2011-0066766. Date of publication: Jun. 17, 2011.*
(Continued)

*Primary Examiner* — Andrew K Bohaty
(74) *Attorney, Agent, or Firm* — Lewis Roca Rothgerber Christie LLP

(57) ABSTRACT

An organic light-emitting diode including a first electrode, a second electrode, and an organic layer between the first electrode and the second electrode. The organic layerincludes an emission layer with at least one light-emitting material, and a region between the first electrode and the emission layer with at least one hole transport material. The light-emitting material is represented by Formula 1 and the hole transport material is represented by one of Formulae 2 to 4:

<Formula 1>

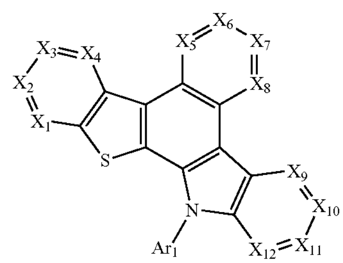

<Formula 2>

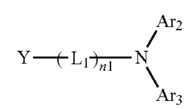

<Formula 3>

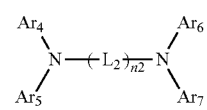

<Formula 4>

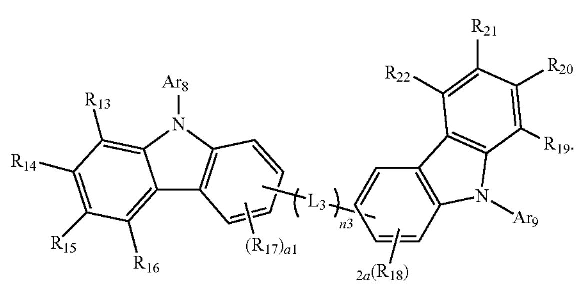

17 Claims, 1 Drawing Sheet

(51) Int. Cl.
*H01L 51/00* (2006.01)
*H01L 51/50* (2006.01)

(52) U.S. Cl.
CPC ...... *H01L 51/0058* (2013.01); *H01L 51/0061* (2013.01); *H01L 51/0072* (2013.01); *H01L 51/0085* (2013.01); *H01L 51/5012* (2013.01); *H01L 51/5056* (2013.01); *H01L 2251/308* (2013.01)

(58) Field of Classification Search
CPC .. C07D 215/02; C07D 215/04; C07D 215/06; C07D 217/00; C07D 217/02; C07D 217/04; C07D 239/72; C07D 251/00; C07D 251/02; C07D 251/04; C07D 251/14; C07D 209/82; C09K 2211/00; C09K 2211/10; C09K 2211/1018; C09K 2211/1003; C09K 2211/1007; C09K 2211/1014; C09K 2211/1011; C09K 11/06
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

2012/0146014 A1* 6/2012 Kato .................... C07D 209/86 257/40
2013/0112950 A1* 5/2013 Yokoyama ........... C07D 209/86 257/40

FOREIGN PATENT DOCUMENTS

KR 10-2010-0079458 A 7/2010
KR 10-2011-0066766 A 6/2011
WO WO 2011021520 A1 * 2/2011 ........... C07D 209/86
WO WO 2012001986 A1 * 1/2012 ........... C07D 209/86

OTHER PUBLICATIONS

Lee et al. SID Symposium Digest of Technical Papers 2005, 36, 843-845. Date of publication: May 2005.*
Machine translation of JP2003-151774. Date of publication: May 23, 2003.*

* cited by examiner

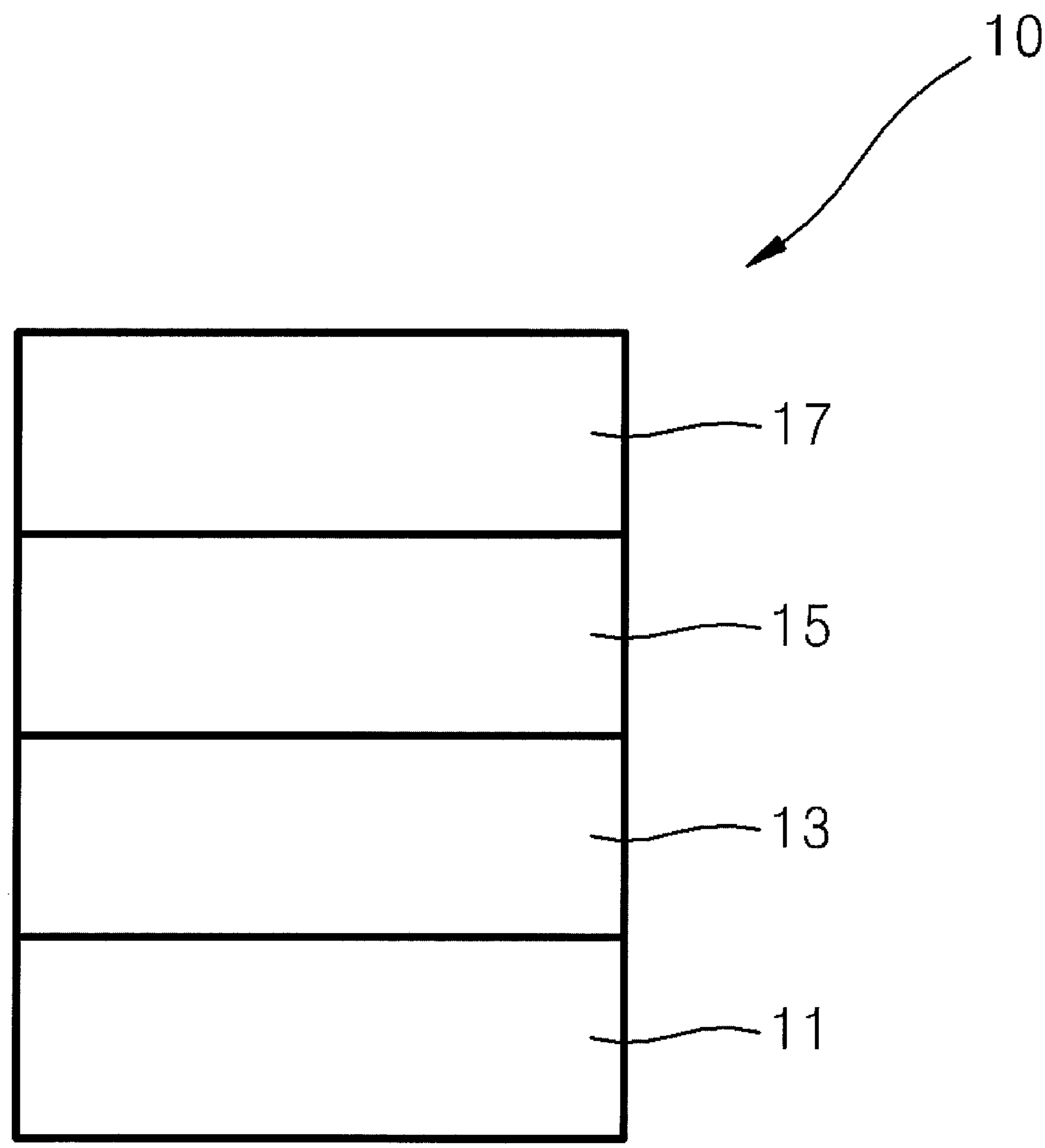
10
17
15
13
11

ORGANIC LIGHT-EMITTING DIODE

CROSS-REFERENCE TO RELATED APPLICATION

This application claims priority to and the benefit of Korean Patent Application No. 10-2013-0045003, filed on Apr. 23, 2013, in the Korean Intellectual Property Office, the entire content of which is incorporated herein by reference.

BACKGROUND

1. Field

One aspect of an embodiment of the present invention relates to organic light-emitting diodes.

2. Description of the Related Art

Organic light-emitting diodes (OLEDs), which are self-emitting devices, have advantages such as wide viewing angles, excellent contrast, quick response, high brightness, excellent driving voltage characteristics, and can provide multicolored images.

A typical OLED has a structure including a substrate, an anode, a hole transport layer (HTL), an emission layer (EML), an electron transport layer (ETL), and a cathode, which are sequentially stacked on the substrate. In this regard, the HTL, the EML, and the ETL are organic thin films formed of organic compounds.

An operating principle of an OLED having the above-described structure is as follows:

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more aspects of embodiments of the present invention are directed towards a high-quality organic light-emitting diode.

Additional aspects will be set forth in part in the description which follows and, in part, will be apparent from the description, or may be learned by practice of the presented embodiments.

According to an embodiment of the present invention, an organic light-emitting diode includes: a first electrode; a second electrode; and an organic layer positioned between the first electrode and the second electrode, the organic layer including an emission layer including at least one light-emitting material represented by Formula 1 below, and a region between the first electrode and the emission layer including at least one hole transport material represented by one of Formulae 2 to 4 below:

<Formula 1>

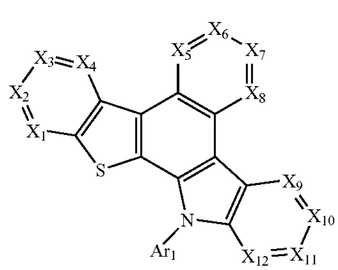

-continued

<Formula 2>

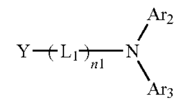

<Formula 3>

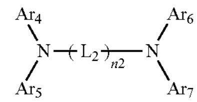

<Formula 4>

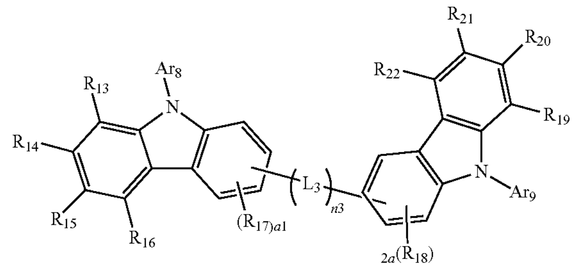

wherein, in Formulae 1 to 4, $X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N;

$R_1$ to $R_{22}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, and a substituted or unsubstituted $C_2$-$C_{60}$heteroaryl group;

a1 and a2 are each independently selected from an integer from 0 to 3, wherein, when a1 is an integer of 2 or greater, a plurality of $R_{17}$s are the same or different, and when a2 is an integer of 2 or greater, a plurality of $R_{18}$s are the same or different;

$Ar_1$ to $Ar_9$ are each independently selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_6$-$C_{60}$arylene group, and a substituted or unsubstituted $C_2$-$C_{60}$ heteroarylene group;

$L_1$ to $L_3$ are each independently selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_6$-$C_{60}$arylene group, and a substituted or unsubstituted $C_2$-$C_{60}$heteroarylene group;

n1 to n3 are each independently selected from an integer from 0 to 5, wherein, when n1 is an integer of 2 or greater, a plurality of $L_1$s are the same or different; when n2 is an integer of 2 or greater, a plurality of $L_2$s are the same or different; and when n3 is an integer of 2 or greater, a plurality of $L_3$s are the same or different; and Y is selected from a substituted or unsubstituted $C_2$-$C_{10}$heterocycloalkyl group, a substituted or unsubstituted $C_2$-$C_{10}$heterocycloalkenyl group, and a substituted or unsubstituted $C_2$-$C_{30}$heteroaryl group.

According to another embodiment of the present invention, an organic light-emitting diode includes: a first electrode; a second electrode; and an organic layer between the first electrode and the second electrode, the organic layer including an emission layer including at least one light-emitting material represented by Formula 1 below, and a region between the first electrode and the emission layer including at least one hole transport material represented by one of Formulae 2c to 2f below:

<Formula 1>

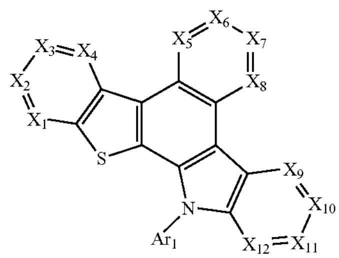

<Formula 2c>

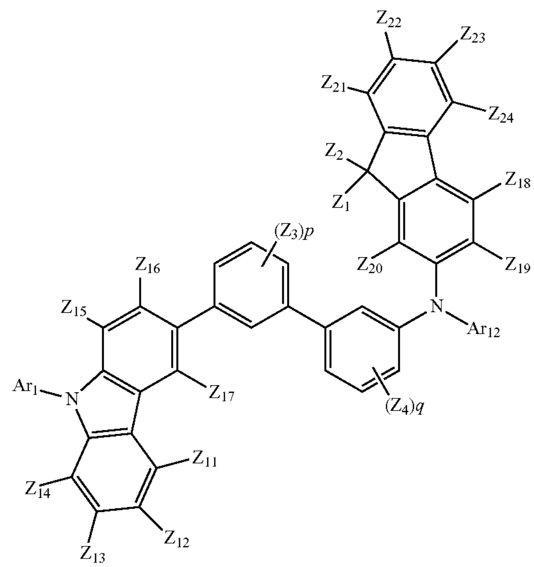

<Formula 2d>

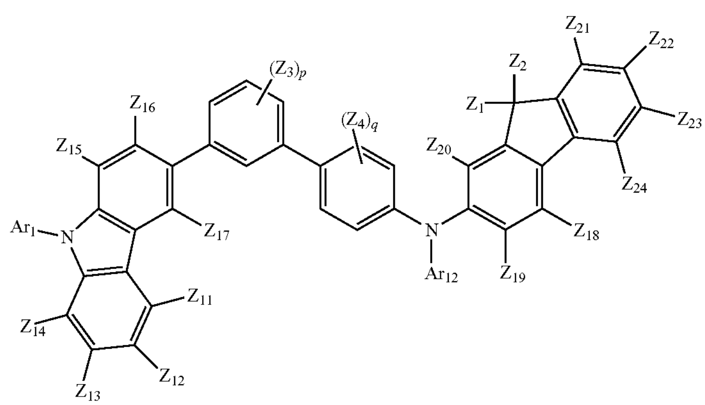

<Formula 2e>

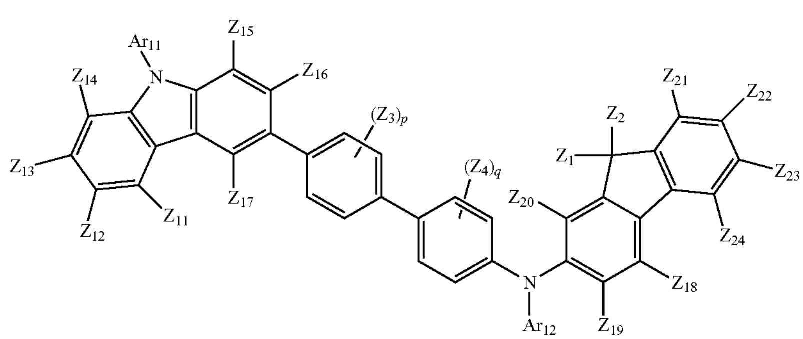

-continued

<Formula 2f>

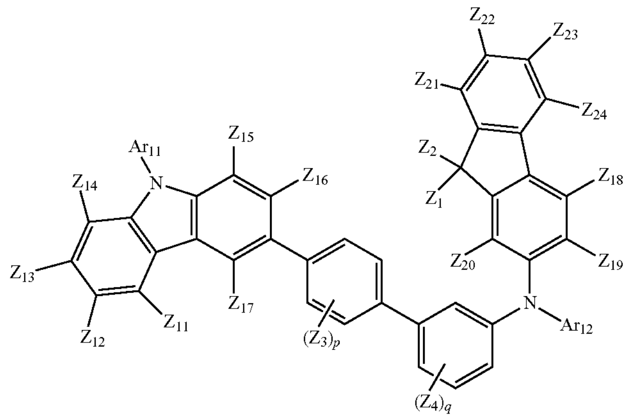

wherein, in Formula 1, and Formulae 2c to 2f:

$X_1$ is $CR_1$ or N; $X_2$ is $CR_2$ or N; $X_3$ is $CR_3$ or N; $X_4$ is $CR_4$ or N; $X_5$ is $CR_6$ or N; $X_6$ is $CR_6$ or N; is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N;

$R_1$ to $R_{12}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, and a substituted or unsubstituted $C_2$-$C_{60}$heteroaryl group;

$Ar_1$, $Ar_{11}$, and $Ar_{12}$ are each independently selected from a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, and a substituted or unsubstituted $C_2$-$C_{60}$heteroaryl group;

$Z_1$ to $Z_4$, and $Z_{11}$ to $Z_{24}$ are each independently selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, and $C_1$-$C_{60}$alkoxy group, a $C_1$-$C_{60}$alkyl group, a $C_2$-$C_{60}$alkenyl group, a $C_2$-$C_{60}$alkynyl group, and a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group, and —$N(Q_{11})(Q_{12})$, —$Si(Q_{13})(Q_{14})(Q_{15})$, and —$B(Q_{16})(Q_{17})$, where $Q_{11}$ and $Q_{17}$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group; and p and q are each independently selected from an integer from 1 to 4.

BRIEF DESCRIPTION OF THE DRAWING

These and/or other aspects will become apparent and more readily appreciated from the following description of the embodiments, taken in conjunction with the accompanying drawing of which:

The drawing schematically illustrates the structure of an organic light-emitting diode according to an embodiment of the present invention.

DETAILED DESCRIPTION

Reference will now be made in detail to embodiments, examples of which are illustrated in the accompanying drawing, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Further, the use of "may" when describing embodiments of the present invention, refers to "one or more embodiments of the present invention".

As used herein, "(for example, the organic layer) including at least one of light-emitting material represented by Formula 1 above" means that "(the organic layer) including one of the light-emitting materials of Formula 1 above, or at least two different light-emitting materials of Formula 1 above".

As used herein, the term "organic layer" refers to a single layer and/or a plurality of layers located between the first and second electrodes of the organic light-emitting diode.

According to an embodiment of the present invention, an organic light-emitting diode includes a first electrode, a second electrode, and an organic layer between the first electrode and the second electrode, the organic layer including an emission layer including at least one light-emitting material represented by Formula 1 below, and a region between the first electrode and the emission layer including at least one hole transport material represented by one of Formulae 2 to 4 below:

<Formula 1>

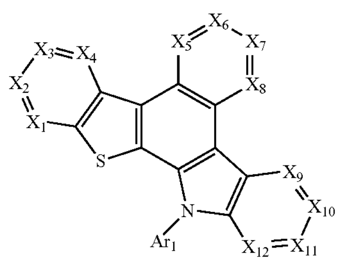

<Formula 2>

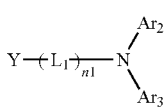

<Formula 3>

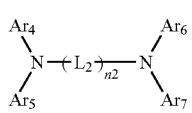

<Formula 4>

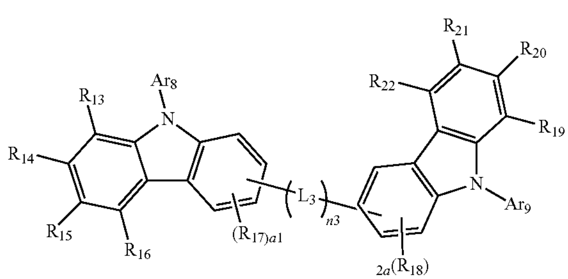

In Formula 1, $X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; and $X_{12}$ is $CR_{12}$ or N.

In some embodiments, in Formula 1, $X_1$ may be $CR_1$; $X_2$ may be $CR_2$; $X_3$ may be $CR_3$; $X_4$ may be $CR_4$; $X_5$ may be $CR_5$; $X_6$ may be $CR_6$; $X_7$ may be $CR_7$; $X_8$ may be $CR_8$; $X_9$ may be $CR_9$; $X_{10}$ may be $CR_{10}$; $X_{11}$ may be $CR_{11}$; and $X_{12}$ may be $CR_{12}$, but embodiments of the present invention are not limited thereto.

In some other embodiments, in Formula 1, at least one of $X_1$ to $X_4$ may be N; $X_5$ may be $CR_5$ or N; $X_6$ may be $CR_6$ or N; $X_7$ may be $CR_7$ or N; $X_8$ may be $CR_8$ or N; $X_9$ may be $CR_9$ or N; $X_{10}$ may be $CR_{10}$ or N; $X_{11}$ may be $CR_{11}$ or N; and $X_{12}$ may be $CR_{12}$ or N, but embodiments of the present invention are not limited thereto.

In still other embodiments, in Formula 1, at least one of $X_5$ to $X_8$ may be N; $X_1$ may be $CR_1$ or N; $X_2$ may be $CR_2$ or N; $X_3$ may be $CR_3$ or N; $X_4$ may be $CR_4$ or N; $X_9$ may be $CR_9$ or N; $X_{10}$ may be $CR_{10}$ or N; $X_{11}$ may be $CR_{11}$ or N; and $X_{12}$ may be $CR_{12}$ or N, but embodiments of the present invention are not limited thereto.

In yet other embodiments, in Formula 1, at least one of $X_9$ to $X_{12}$ may be N; $X_1$ may be $CR_1$ or N; $X_2$ may be $CR_2$ or N; $X_3$ may be $CR_3$ or N; $X_4$ may be $CR_4$ or N; $X_5$ may be $CR_5$ or N; $X_6$ may be $CR_6$ or N; $X_7$ may be $CR_7$ or N; and $X_8$ may be $CR_8$ or N, but embodiments of the present invention are not limited thereto.

In Formulae 1 to 4 above, $R_1$ to $R_{22}$ may be each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, and a substituted or unsubstituted $C_2$-$C_{60}$heteroaryl group.

In some embodiments, in Formulae 1 to 4, $R_1$ to $R_{22}$ may be each independently selected from:

a hydrogen atom, a deuterium atom, a halogen atom, a hydroxyl group, a cyano group, a nitro group, and a $C_1$-$C_{10}$alkyl group; and a $C_6$-$C_{16}$aryl group, and a $C_2$-$C_{16}$heteroaryl group, each substituted with at least one selected from:

a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{10}$alkyl group, a $C_1$-$C_{10}$alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid group or a salt thereof, a $C_6$-$C_{16}$aryl group, and a $C_2$-$C_{16}$heteroaryl group, and a $C_6$-$C_{16}$aryl group and a $C_2$-$C_{16}$heteroaryl group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_6$-$C_{16}$aryl group, and a $C_2$-$C_{16}$heteroaryl group, but are not limited thereto.

In some other embodiments, in Formulae 1 to 4, $R_1$ to $R_{22}$ may be each independently selected from:

a hydrogen atom, a deuterium atom, a halogen atom, cyano group, and a nitro group;

a pyridyl group, a pyrimidyl group, and a triazinyl group, each substituted with at least one of a phenyl group, a naphthyl group, and an anthryl group; and a phenyl group, a naphthyl group, and an anthryl group, each substituted with at least one selected from a pyridyl group, a pyrimidyl group, and a triazinyl group, each substituted with at least one of a phenyl group, a naphthyl group, and an anthryl group, but are not limited thereto.

In still other embodiments, in Formulae 1 to 4, $R_1$ to $R_{12}$ may be each independently selected from a hydrogen atom, a phenyl group, a pyrimidyl group substituted with a phenyl group, and a phenyl group substituted with a pyrimidyl group substituted with a phenyl group, but are not limited thereto.

In yet other embodiments, in Formulae 1 to 4, $R_{13}$ to $R_{22}$ may be each independently selected from a hydrogen atom and a phenyl group, but are not limited thereto.

In Formula 4, a1 and a2 indicates the numbers of $R_{17}$s and $R_{18}$s, respectively. In Formula 4, a1 and a2 may be each independently selected from an integer from 0 to 3. When a1 is an integer of 2 or greater, a plurality of $R_{17}$s may be the same or different. When a2 is an integer of 2 or greater, a plurality of $R_{18}$s may be the same or different.

In some embodiments, a1 and a2 in Formula 4 may both be zero, but are not limited thereto.

In Formulae 1 to 4, $Ar_1$ to $Ar_9$ may be each independently selected from a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, and a substituted or unsubstituted $C_2$-$C_{60}$heteroaryl group.

In some embodiments, in Formulae 1 to 4, $Ar_1$ to $Ar_9$ may be each independently selected from a substituted or unsubstituted phenyl group, a substituted or unsubstituted biphenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridyl group, a substituted or unsubstituted pyrazinyl group, a substituted or unsubstituted pyrimidyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, and a substituted or unsubstituted benzocarbazolyl group, but are not limited thereto.

In some other embodiments, in Formulae 1 to 4, $Ar_1$ to $Ar_9$ may be each independently selected from:

a phenyl group, a biphenyl group, a naphthyl group, a fluorenyl group, a spiro-fluorenyl group, a phenanthrenyl group, a pyridyl group, a pyrimidyl group, a quinolinyl group, an isoquinolinyl group, a naphthyridinyl group, a quinazolinyl group, and a triazinyl group; and a phenyl group, a biphenyl group, a naphthyl group, a fluorenyl group, a spiro-fluorenyl group, a phenanthrenyl group, a pyridyl group, a pyrimidyl group, a quinolinyl group, an isoquinolinyl group, a naphthyridinyl group, a quinazolinyl group, and a triazinyl group, each substituted with at least one selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, —N($Q_1$)($Q_2$) (where $Q_1$ and $Q_2$ are each independently a $C_1$-$C_{10}$alkyl group or a $C_6$-$C_{16}$aryl group), and a $C_1$-$C_{10}$alkyl group, a $C_1$-$C_{10}$alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid group or a salt thereof;

a $C_6$-$C_{16}$aryl group, and a $C_2$-$C_{16}$heteroaryl group, and a $C_6$-$C_{16}$aryl group, and a $C_2$-$C_{16}$heteroaryl group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_6$-$C_{16}$aryl group, and a $C_2$-$C_{16}$heteroaryl group, but are not limited thereto.

In still other embodiments, in Formulae 1 to 4, $Ar_1$ to $Ar_9$ may be each independently selected from:

a phenyl group, a biphenyl group, a naphthyl group, a fluorenyl group, a spiro-fluorenyl group, a phenanthrenyl group, a pyridyl group, a pyrimidyl group, a quinolinyl group, an isoquinolinyl group, a naphthyridinyl group, a quinazolinyl group, and a triazinyl group; and a phenyl group, a biphenyl group, a naphthyl group, a fluorenyl group, a spiro-fluorenyl group, a phenanthrenyl group, a pyridyl group, a pyrimidyl group, a quinolinyl group, an isoquinolinyl group, a naphthyridinyl group, a quinazolinyl group, and a triazinyl group, each substituted with at least one selected from:

a deuterium atom, —F, a cyano group, a nitro group, —N($Q_1$)($Q_2$) (where $Q_1$ and $Q_2$ are each independently a phenyl group or a naphthyl group), a methyl group, an ethyl group, a n-propyl group, a iso-propyl group, a n-butyl group, a sec-butyl group, a iso-butyl group, and a t-butyl group; a phenyl group, a naphthyl group, a fluorenyl group, a phenanthrenyl group, a pyridyl group, a pyrimidyl group, a quinolinyl group, an isoquinolinyl group, a naphthyridinyl group, a quinazolinyl group, and a triazinyl group, and a phenyl group, a naphthyl group, a fluorenyl group, a phenanthrenyl group, a pyridyl group, a pyrimidyl group, a quinolinyl group, an isoquinolinyl group, a naphthyridinyl group, a quinazolinyl group, and a triazinyl group, each substituted with at least one of a deuterium atom, —F, a cyano group, a nitro group, —N($Q_1$)($Q_2$) (where $Q_1$ and $Q_2$ are each independently a phenyl group or a naphthyl group), a methyl group, an ethyl group, a n-propyl group, a iso-propyl group, a n-butyl group, a sec-butyl group, a iso-butyl group, a t-butyl group, a phenyl group, a naphthyl group, a fluorenyl group, a phenanthrenyl group, a pyridyl group, a pyrimidyl group, a quinolinyl group, an isoquinolinyl group, a naphthyridinyl group, a quinazolinyl group, and a triazinyl group.

In yet other embodiments, in Formulae 1 to 4, $Ar_1$ to $Ar_9$ may be each independently selected from:

a phenyl group, a biphenyl group, a naphthyl group, a fluorenyl group, a spiro-fluorenyl group, a phenanthrenyl group, a pyridyl group, a pyrimidyl group, a quinolinyl group, an isoquinolinyl group, a naphthyridinyl group, a quinazolinyl group, and a triazinyl group; and a phenyl group, a biphenyl group, a naphthyl group, a fluorenyl group, a spiro-fluorenyl group, a phenanthrenyl group, a pyridyl group, a pyrimidyl group, a quinolinyl group, an isoquinolinyl group, a naphthyridinyl group, a quinazolinyl group, and a triazinyl group, each substituted with at least one selected from:

—N($Q_1$)($Q_2$) (where $Q_1$ and $Q_2$ are each independently selected from a phenyl group, a methyl group, an ethyl group, and a iso-propyl group), a phenyl group, and a naphthyl group, and a phenyl group, a naphthyl group, a fluorenyl group, a phenanthrenyl group, a pyridyl group, a pyrimidyl group, a quinolinyl group, an isoquinolinyl group, a naphthyridinyl group, a quinazolinyl group, and a triazinyl group, each substituted with at least one of a phenyl group, a naphthyl group, a quinolinyl group, an isoquinolinyl group, a naphthyridinyl group, a quinazolinyl group, and a triazinyl group, but are not limited thereto.

For example, in Formula 1, $Ar_1$ may be selected from:

a phenyl group, a pyrimidyl group, a quinolinyl group, an isoquinolinyl group, a naphthyridinyl group, a quinazolinyl group, and a triazinyl group; and a phenyl group, a pyrimidyl group, a quinolinyl group, an isoquinolinyl group, a naphthyridinyl group, a quinazolinyl group, and a triazinyl group, each substituted with at least one selected from:

a phenyl group, a naphthyl group, and a pyridyl group, and a phenyl group, a naphthyl group, a pyridyl group, a pyrimidyl group, a quinolinyl group, an isoquinolinyl group, a naphthyridinyl group, a quinazolinyl group, and a triazinyl group, each substituted with at least one of a phenyl group, a naphthyl group, and a pyridyl group, but are not limited thereto.

For example, in Formulae 2 and 3, $Ar_2$ to $Ar_7$ may be each independently selected from:

a phenyl group, a biphenyl group, a naphthyl group, a fluorenyl group, a spiro-fluorenyl group, and a phenanthrenyl group; and a phenyl group, a biphenyl group, a naphthyl group, a fluorenyl group, a spiro-fluorenyl group, and a phenanthrenyl group, each substituted with at least one selected from:

a methyl group, an ethyl group, and a iso-propyl group, a phenyl group, and a naphthyl group, and a phenyl group, a naphthyl group, an anthracenyl group, a fluorenyl group, and a phenanthrenyl group, each substituted with at least one of a phenyl group, and a naphthyl group, but are not limited thereto.

For example, in Formula 4, $Ar_8$ and $Ar_9$ may be each independently selected from:

a phenyl group, a biphenyl group, and a naphthyl group; and a phenyl group, a biphenyl group, and a naphthyl group, each substituted with at least one selected from:

—N($Q_1$)($Q_2$) (where $Q_1$ and $Q_2$ are each independently selected from a phenyl group), and a phenyl group and a naphthyl group, each substituted with at least one of a phenyl group, and a naphthyl group, but are not limited thereto.

In Formulae 1 to 4 above, $L_1$ to $L_3$ may be each independently selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_8$-$C_{80}$arylene group, and a substituted or unsubstituted $C_2$-$C_{60}$heteroarylene group.

In some embodiments, in Formulae 1 to 4, $L_1$ to $L_3$ may be each independently selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted a heptalenylene group, a substituted or unsubstituted indacenylene group, a substituted or unsubstituted acenaphtylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzooxazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolyl group, but are not limited thereto.

In some other embodiments, in Formulae 1 to 4, $L_1$ to $L_3$ may be each independently selected from:

a phenylene group, a naphthylene group, an anthracenylene group, a phenanthrenylene group, a naphthacenylene group, a chrysenylene group, a fluorenylene group, a pyridinylene group, and a carbazolylene group;

a phenylene group, a naphthylene group, an anthracenylene group, a phenanthrenylene group, a naphthacenylene group, a chrysenylene group, a fluorenylene group, a pyridinylene group, and a carbazolylene group, each substituted with at least one selected from:

a $C_1$-$C_{10}$alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{10}$alkyl group; a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid group or a salt thereof, a $C_6$-$C_{16}$aryl group and a $C_2$-$C_{16}$heteroaryl group, and a $C_6$-$C_{16}$aryl group and a $C_2$-$C_{16}$heteroaryl group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_6$-$C_{16}$aryl group, and a $C_2$-$C_{16}$heteroaryl group, but are not limited thereto.

In still other embodiments, in Formulae 1 to 4, $L_1$ to $L_3$ may be each independently selected from:

a phenylene group, a naphthylene group, an anthracenylene group, a phenanthrenylene group, a naphthacenylene group, a chrysenylene group, a fluorenylene group, and a carbazolylene group; and a phenylene group, a naphthylene group, an anthracenylene group, a phenanthrenylene group, a naphthacenylene group, a chrysenylene group, a fluorenylene group, and a carbazolylene group, each substituted with at least one selected from a deuterium atom, —F, a cyano group, a nitro group, a methyl group, an ethyl group, a phenyl group, a naphthyl group, and anthracenyl group, but are not limited thereto.

In yet other embodiments, in Formulae 2 to 4, $L_1$ to $L_3$ may be each independently selected from a phenylene group, a naphthylene group, and a fluorenylene group, but are not limited thereto.

In Formulae 2 to 4, n1 to n3 indicates the numbers of $L_1$s to $L_3$s, respectively. In Formulae 2 to 4, n1 to n3 may be each independently selected from an integer from 0 to 5. When n1 is an integer of 2 or greater, a plurality of $L_1$s may be the same or different. When n2 is an integer of 2 or greater, a plurality of $L_2$s may be the same or different. When n3 is an integer of 2 or greater, a plurality of $L_3$s may be the same or different.

In some embodiments, in Formulae 2 and 3, n1 and n2 may be each independently selected from an integer from 1 to 3, but are not limited thereto.

For example, n1 in Formula 2 may be an integer of 2, but is not limited thereto.

For example, n3 in Formula 4 may be 0, but is not limited thereto. When n3 is 0, carbazoles may be bound directly to each other.

For example, a moiety represented as '$(L_1)_{n1}$' in Formula 2 may be selected from a group represented by one of Formulae 4-1 to 4-4, but is not limited thereto:

<Formula 4-1>

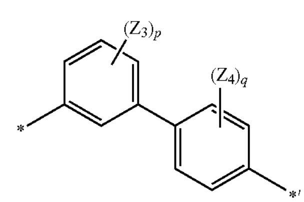

<Formula 4-2>

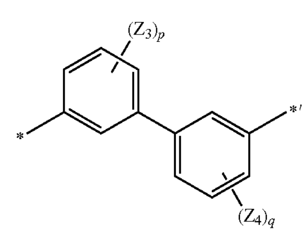

-continued

<Formula 4-3>

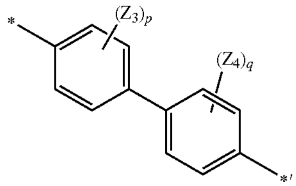

<Formula 4-4>

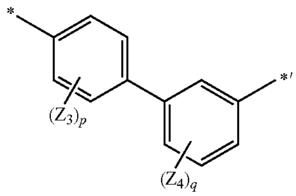

In Formulae 4-1 to 4-4:

$Z_3$ and $Z_4$ may be each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, and a heptyl group;

p and q, which indicate the numbers of $Z_3$s and $L_1$s, respectively, may be each independently selected from an integer from 1 to 4, wherein, when p is an integer of 2 or greater, a plurality of $Z_3$s may be the same or different, and when q is an integer of 2 or greater, a plurality of $Z_4$s may be the same or different;

* indicates a binding site of Y in Formula 2; and

*' indicates a binding site of N in Formula 2.

In Formula 2, Y may be selected from a substituted or unsubstituted $C_2$-$C_{10}$heterocycloalkyl group, a substituted or unsubstituted $C_2$-$C_{10}$heterocycloalkenyl group, and a substituted or unsubstituted $C_2$-$C_{30}$heteroaryl group.

In some embodiments, Y in Formula 2 may be selected from a substituted or unsubstituted pyrrolyl group, a substituted or unsubstituted imidazolyl group, a substituted or unsubstituted pyrazolyl group, a substituted or unsubstituted pyridyl group, a substituted or unsubstituted imidazopyridyl group, a substituted or unsubstituted pyrazinyl group, a substituted or unsubstituted pyrimidyl group, a substituted or unsubstituted pyridazinyl group, a substituted or unsubstituted isoindolyl group, a substituted or unsubstituted indolyl group, a substituted or unsubstituted indolizinyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted azacarbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted triazolyl group, a substituted or unsubstituted tetrazolyl group, a substituted or unsubstituted triazinyl group, and a benzocarbazolyl group, but is not limited thereto.

In some other embodiments, Y in Formula 2 may be selected from:

an imidazole group, a carbazolyl group, an indolyl group, an indolizinyl group, an imidazopyridyl group, a pyridyl group, a pyrimidyl group, and a triazinyl group; and an imidazole group, a carbazolyl group, an indolyl group, an indolizinyl group, an imidazopyridyl group, a pyridyl group, a pyrimidyl group, and a triazinyl group, each substituted with at least one of a deuterium atom, a halogen atom, and a phenyl group, but are not limited thereto.

For example, Y in Formula 2 may be a carbazolyl group, but is not limited thereto.

In still other embodiments, Y in Formula 2 may be selected from:

3-carbazolyl group and 9-carbazolyl group; and 3-carbazolyl group and 9-carbazolyl group, each substituted with at least one selected from a phenyl group, a biphenyl group, and a naphthyl group, but is not limited thereto.

In some embodiments, the light-emitting material of Formula 1 above may be a compound material represented by Formula 1a below, but is not limited thereto:

<Formula 1a>

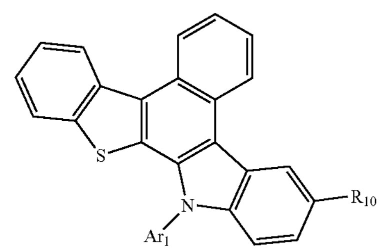

In Formula 1a, $R_{10}$ may be selected from a hydrogen atom and a phenyl group; a pyrimidyl group substituted with a phenyl group; and a phenyl group substituted with a pyrimidyl group substituted with a phenyl group, but is not limited thereto.

In Formula 1a, $Ar_1$ may be selected from:

a phenyl group, a pyrimidyl group, a quinolinyl group, an isoquinolinyl group, a naphthyridinyl group, a quinazolinyl group, and a triazinyl group; and a phenyl group, a pyrimidyl group, a quinolinyl group, an isoquinolinyl group, a naphthyridinyl group, a quinazolinyl group, and a triazinyl group, each substituted with at least one selected from a phenyl group, a naphthyl group, and a pyridyl group; and a phenyl group, a naphthyl group, a pyridyl group, a pyrimidyl group, a quinolinyl group, an isoquinolinyl group, a naphthyridinyl group, a quinazolinyl group, and a triazinyl group, each substituted with at least one of a phenyl group, a naphthyl group, and a pyridyl group, but are not limited thereto.

In some embodiments, the host transport material of Formula 2 above may be a compound represented by Formula 2a or 2b, but is not limited thereto:

<Formula 2a>

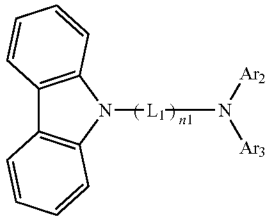

<Formula 2b>

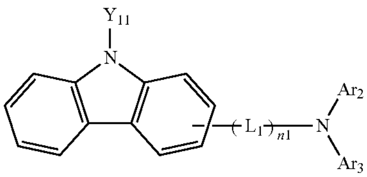

In Formulae 2a and 2b, $Ar_2$ and $Ar_3$ may be each independently selected from:

a phenyl group, a biphenyl group, a naphthyl group, a fluorenyl group, a spiro-fluorenyl group, and a phenanthrenyl group; and a phenyl group, a biphenyl group, a naphthyl group, a fluorenyl group, a spiro-fluorenyl group, and a phenanthrenyl group, each substituted with at least one selected from:

a methyl group, an ethyl group, and a iso-propyl group, a phenyl group, and a naphthyl group, and a phenyl group, a naphthyl group, an anthracenyl group, a fluorenyl group, and a phenanthrenyl group, each substituted with at least one of a phenyl group and a naphthyl group, but are not limited thereto.

In Formulae 2a and 2b, $L_1$ may be selected from:

a phenylene group, a naphthylene group, an anthracenylene group, a phenanthrenylene group, a naphthacenylene group, a chrysenylene group, a fluorenylene group, and a carbazolylene group; and a phenylene group, a naphthylene group, an anthracenylene group, a phenanthrenylene group, a naphthacenylene group, a chrysenylene group, a fluorenylene group, and a carbazolylene group, each substituted with at least one selected from a deuterium atom, —F, a cyano group, a nitro group, a methyl group, an ethyl group, a phenyl group, a naphthyl group, and anthracenyl group, but are not limited thereto.

For example, n1 in Formulae 2a and 2b may be selected from an integer from 1 to 3, but is not limited thereto.

For example, $Y_{11}$ in Formulae 2a and 2b may be selected from a phenyl group, a biphenyl group, and a naphthyl group, but is not limited thereto.

The hole transport material of Formula 3 above may include a compound represented by Formula 3a below, but is not limited thereto:

<Formula 3a>

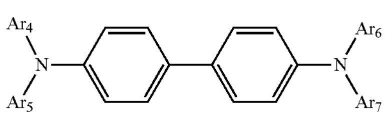

In Formula 3a, $Ar_4$ to $Ar_7$ may be each independently selected from:

a phenyl group, a biphenyl group, a naphthyl group, a fluorenyl group, a spiro-fluorenyl group, and a phenanthrenyl group; and a phenyl group, a biphenyl group, a naphthyl group, a fluorenyl group, a spiro-fluorenyl group, and a phenanthrenyl group, each substituted with at least one selected from:

a methyl group, an ethyl group, and an iso-propyl group; a phenyl group, and a naphthyl group, and a phenyl group, a naphthyl group, an anthracenyl group, a fluorenyl group, and a phenanthrenyl group, each substituted with at least one of a phenyl group and a naphthyl group, but are not limited thereto.

The hole transport material of Formula 4 above may include a compound represented by Formula 4a below, but is not limited thereto.

<Formula 4a>

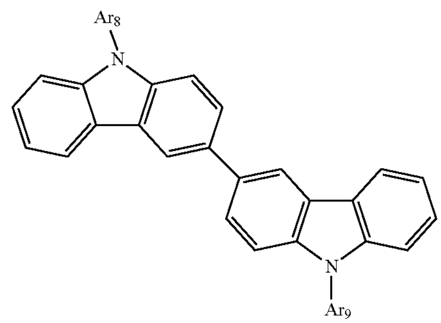

In Formula 4a, $Ar_8$ and $Ar_9$ may be each independently selected from:

a phenyl group, a biphenyl group, and a naphthyl group; and a phenyl group, a biphenyl group, and a naphthyl group, each substituted with at least one selected from —N($Q_1$)($Q_2$), where $Q_1$ and $Q_2$ are each independently selected from a phenyl group; and a phenyl group, and a naphthyl group, each substituted with at least one of a phenyl group, and a naphthyl group, but are not limited thereto.

The light-emitting material of Formula 1 above may be selected from one of Compounds 1-1 to 1-18 below, but is not limited thereto:

[Compound 1-1]

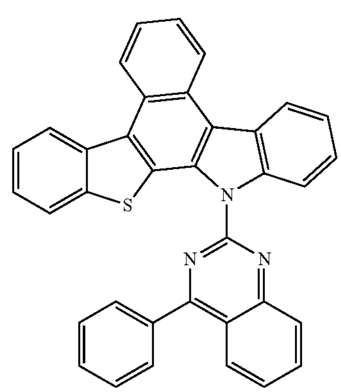

[Compound 1-2]
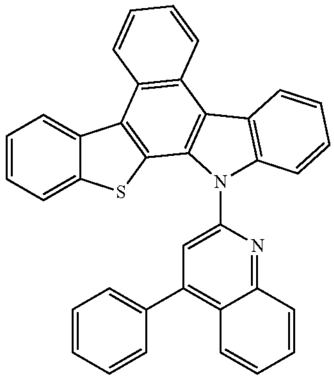
[Compound 1-3]
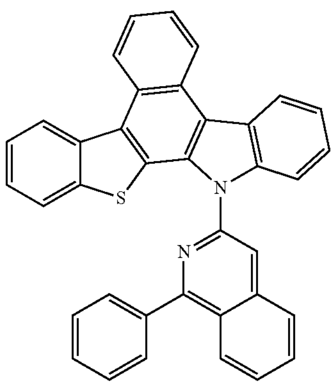
[Compound 1-4]
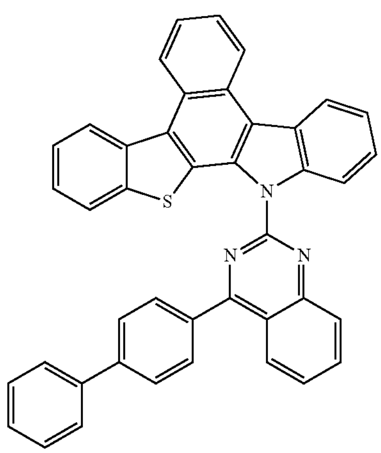
[Compound 1-5]
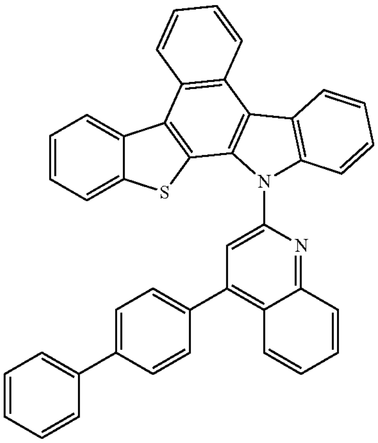
[Compound 1-6]
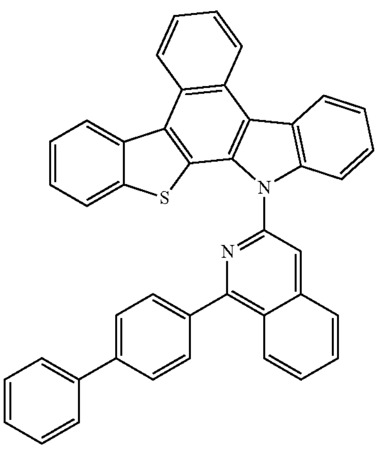
[Compound 1-7]
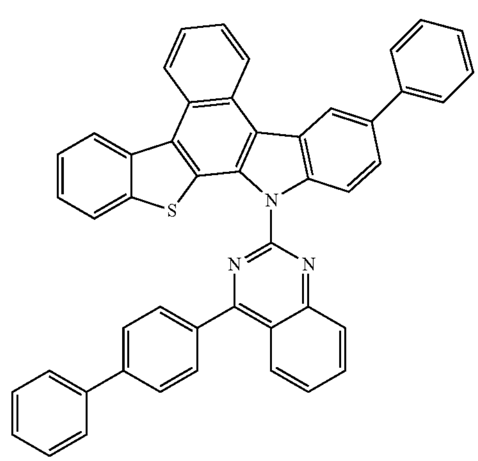

-continued
[Compound 1-8]
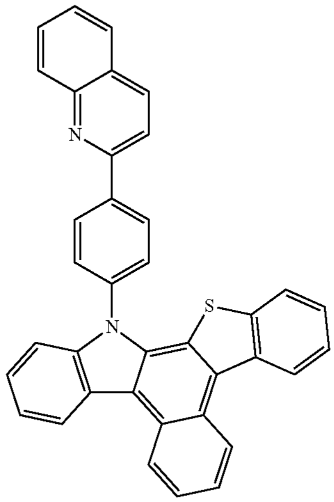
[Compound 1-9]
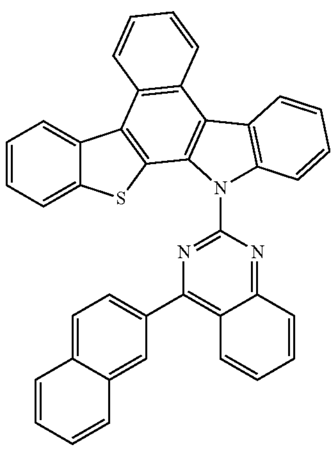
[Compound 1-10]
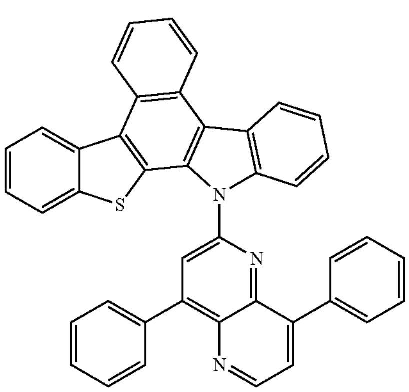
-continued
[Compound 1-11]
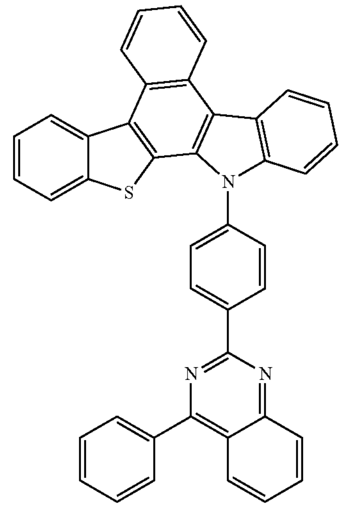
[Compound 1-12]
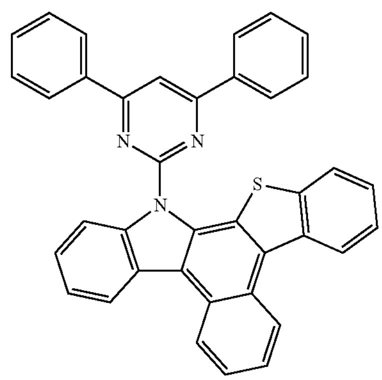
[Compound 1-13]
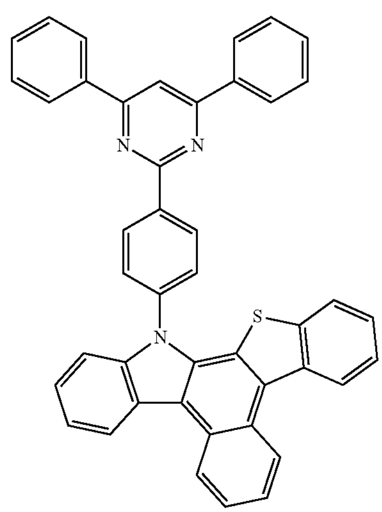

-continued
[Compound 1-14]
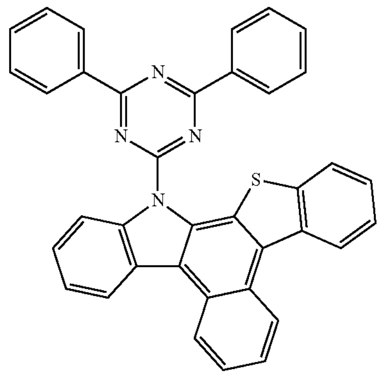
[Compound 1-15]
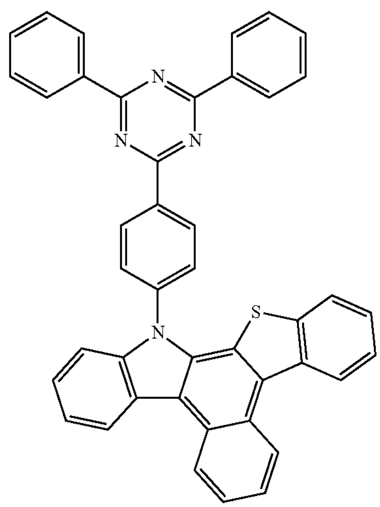
[Compound 1-16]
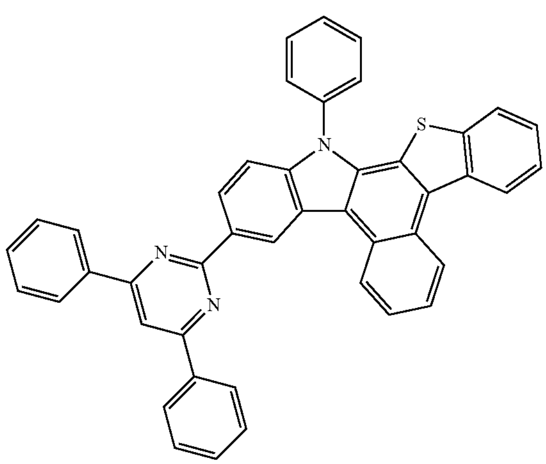
-continued
[Compound 1-17]
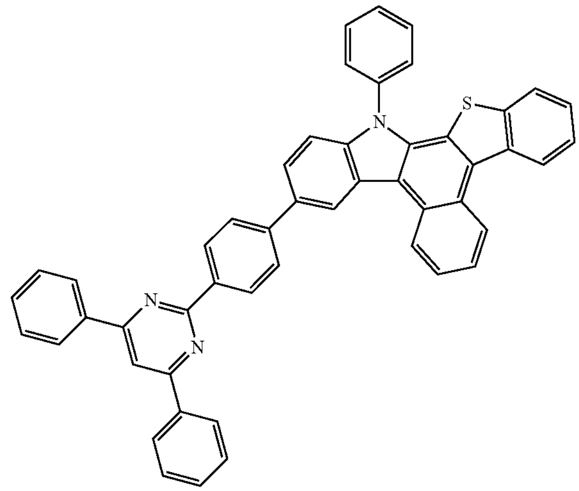
[Compound 1-18]
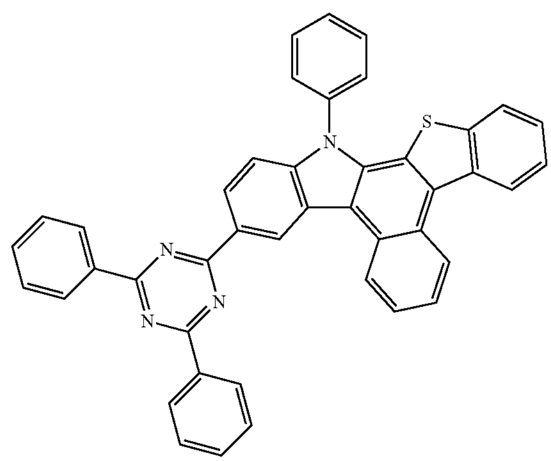
The hole transport material of Formula 2, 3, or 4 above may be selected from one of Compounds 2-1 to 2-65, Compounds 2-192 to 2-201, Compounds 3-1 to 3-39, Compounds 4-1 to 4-6, Compounds 5-1 to 5-144, and Compounds 6-1 to 6-144, but is not limited thereto:

2-1
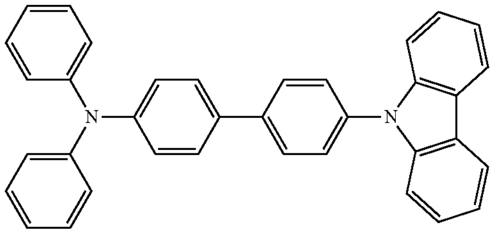
2-2
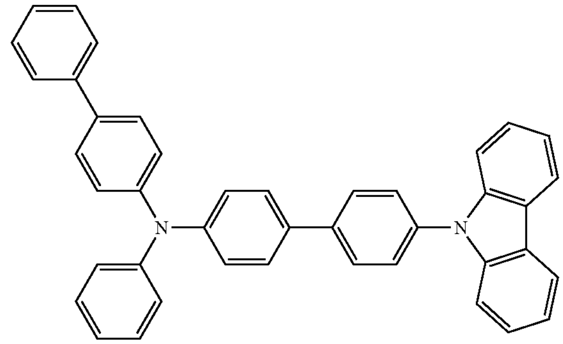
2-3
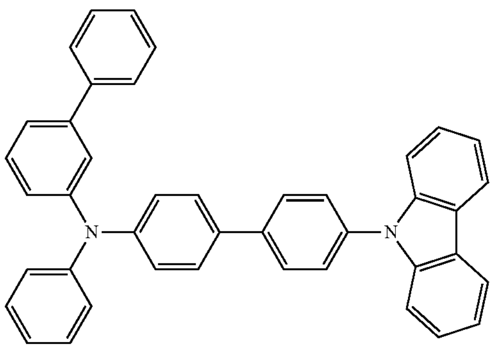
2-4
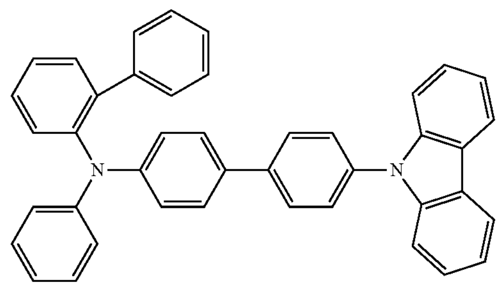
2-5
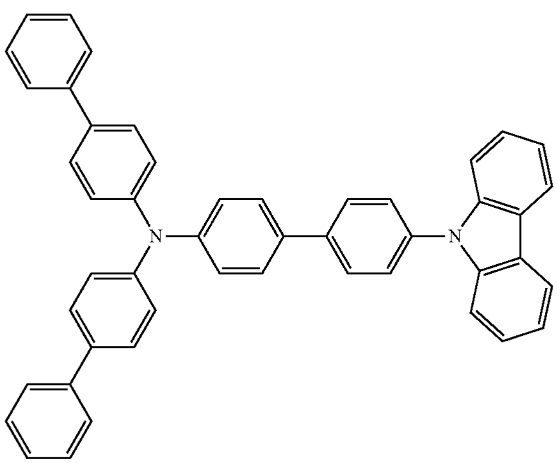
2-6
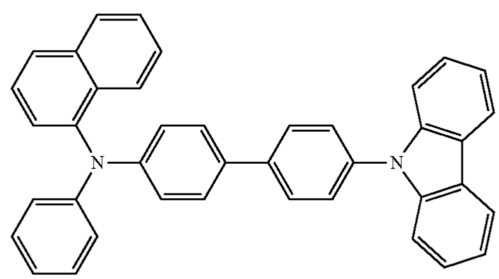
2-7
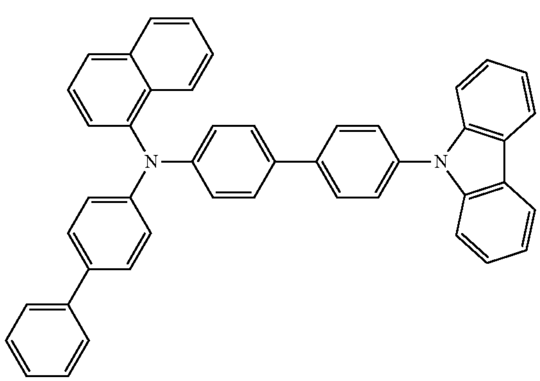
2-8
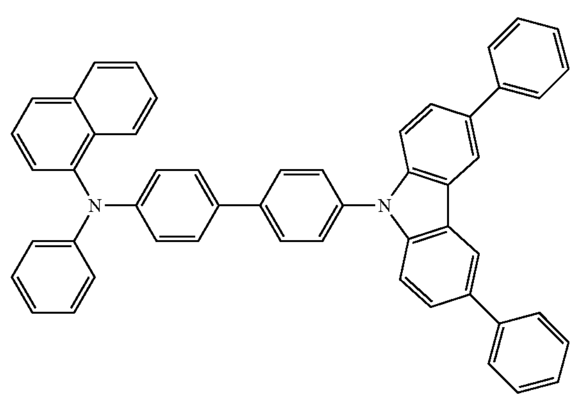

-continued
2-9
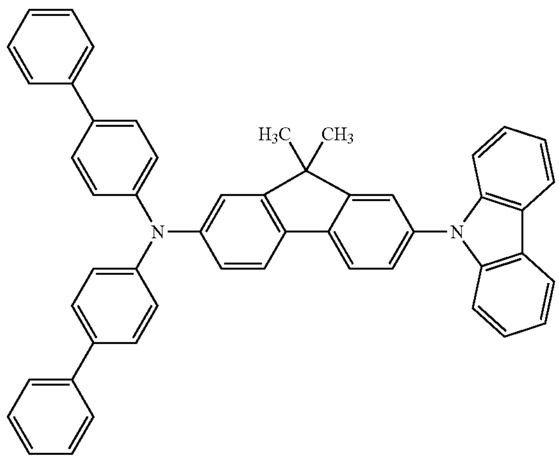
2-10
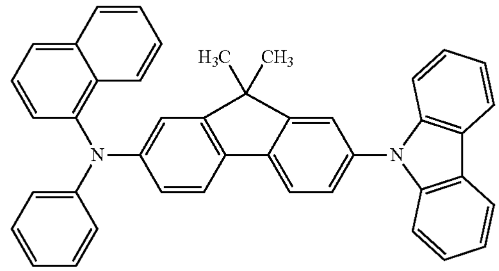
2-11
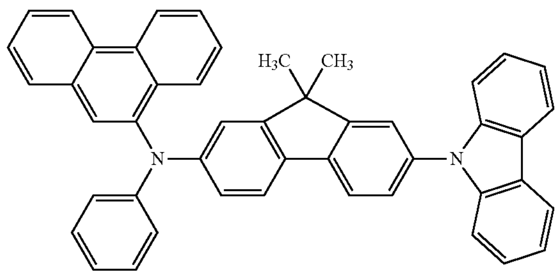
2-12
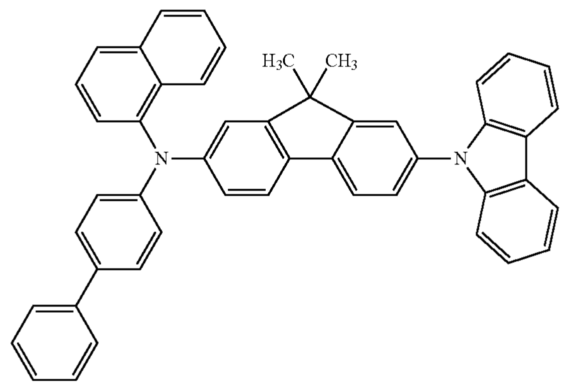
2-13
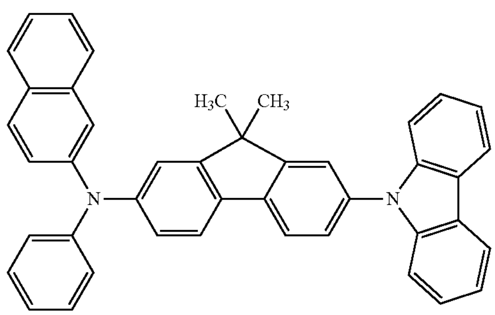
2-14
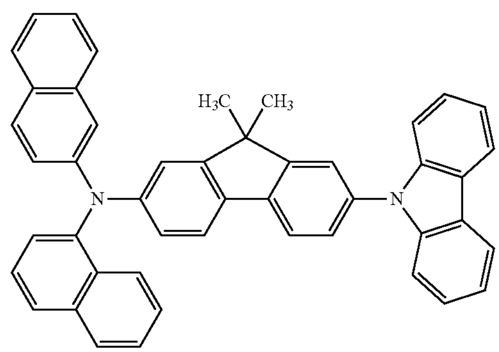
2-15
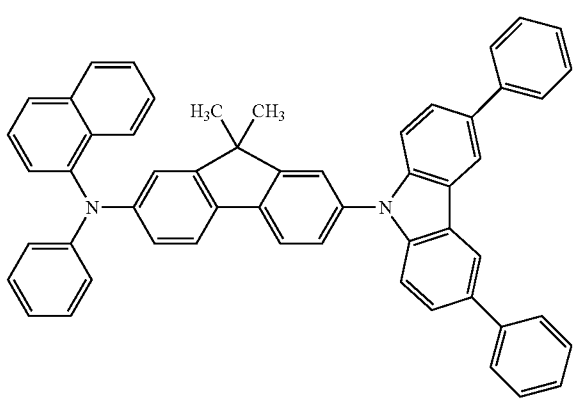
2-16
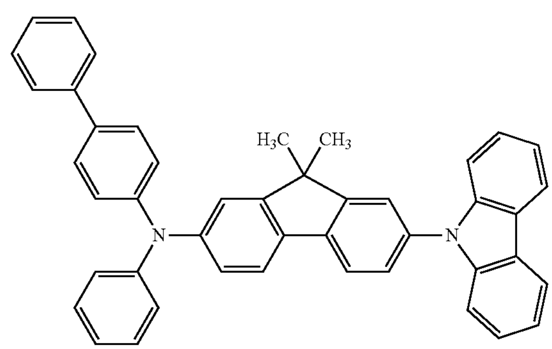

-continued
2-17
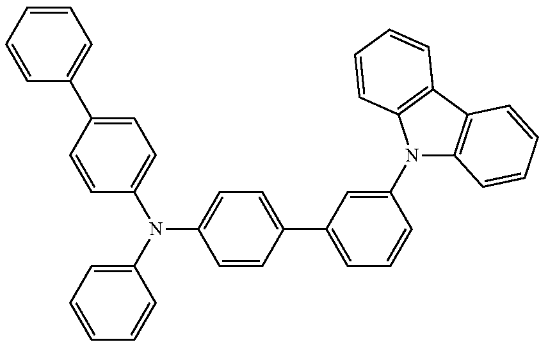
2-18
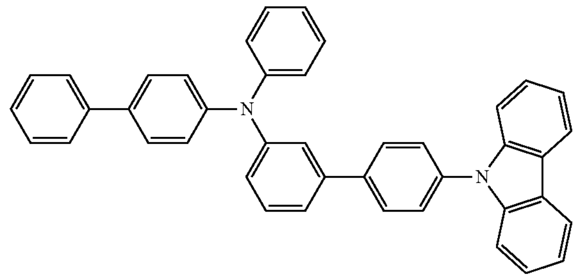
2-19
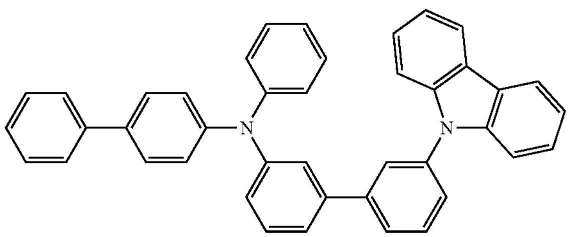
2-20
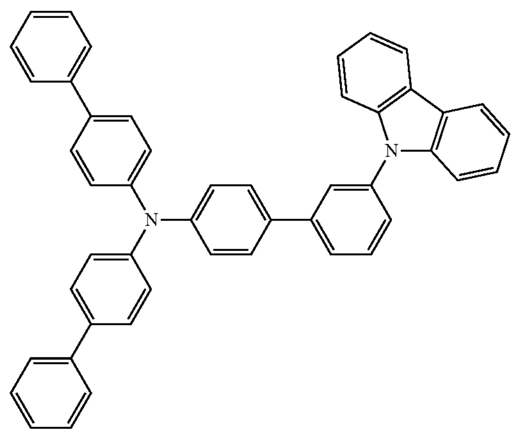
2-21
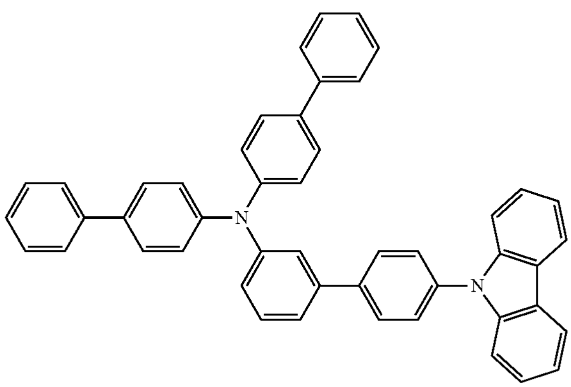
2-22
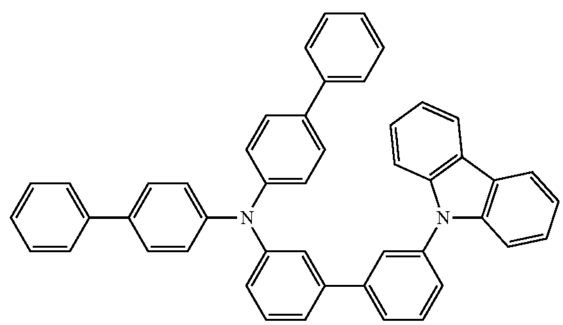
2-23
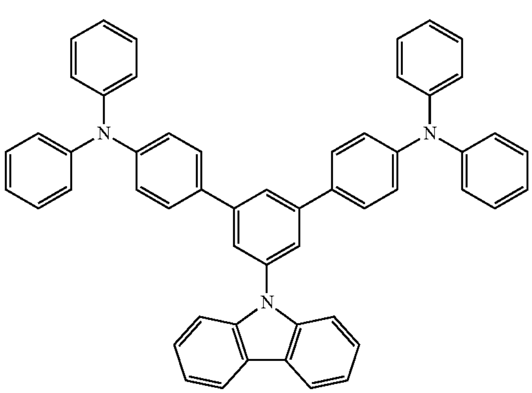
2-24
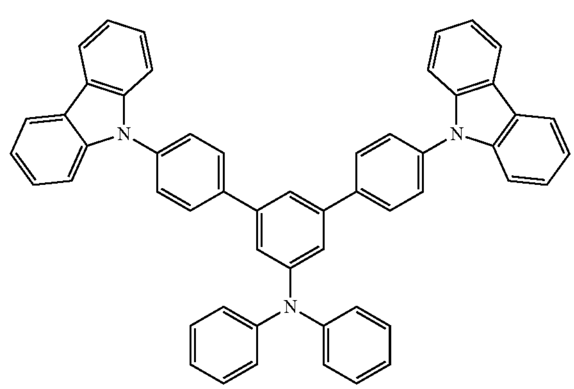

-continued
2-25
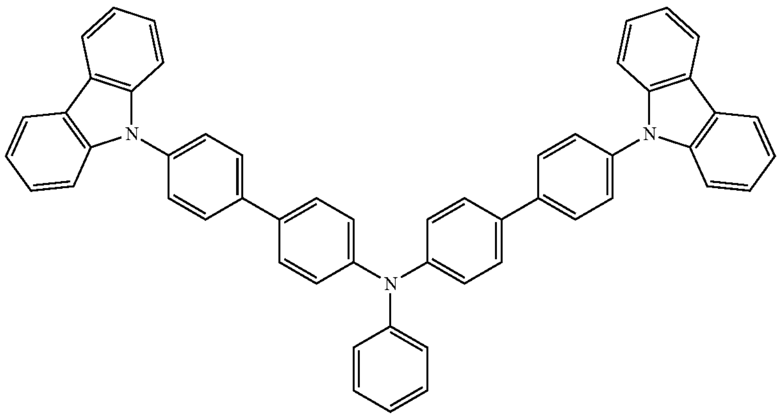
2-26
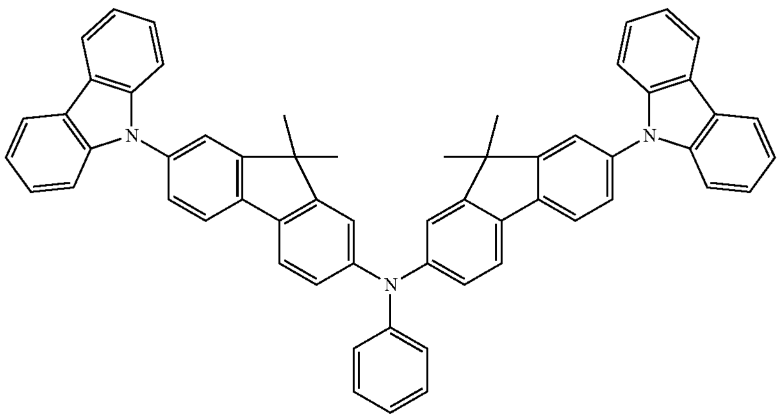
2-27
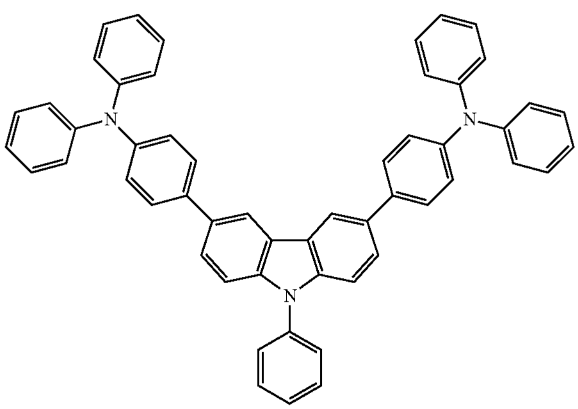
2-28
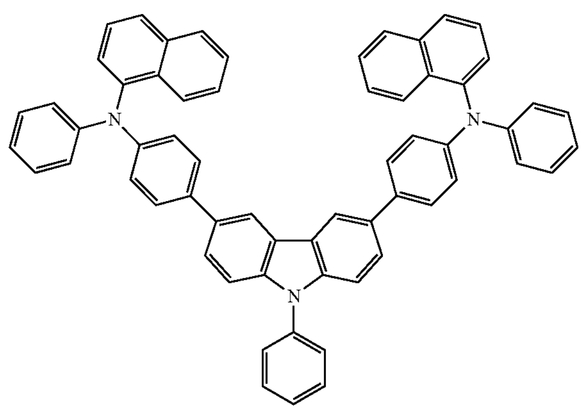
2-29
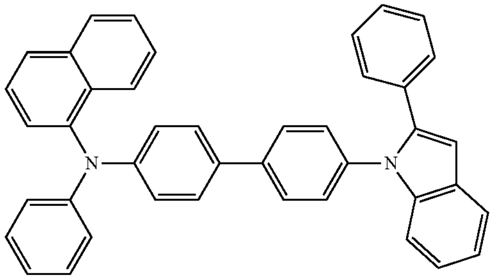
2-30
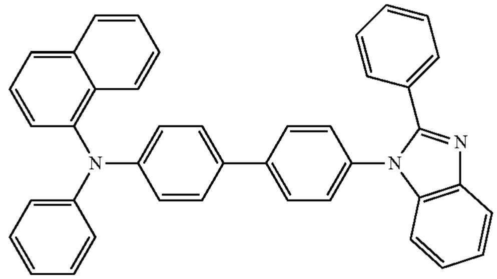

-continued
2-31
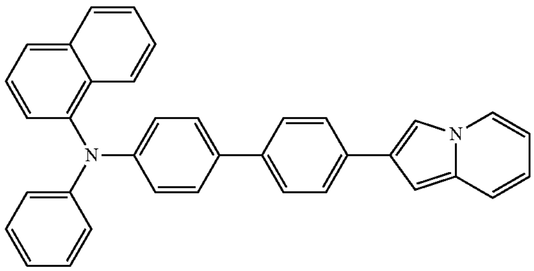
2-32
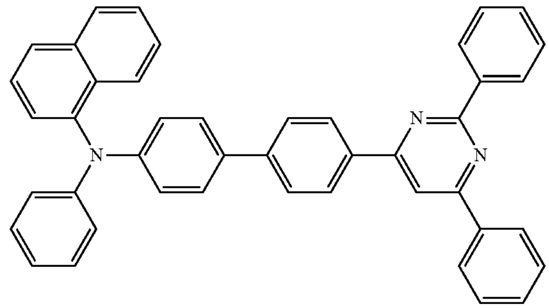
2-33
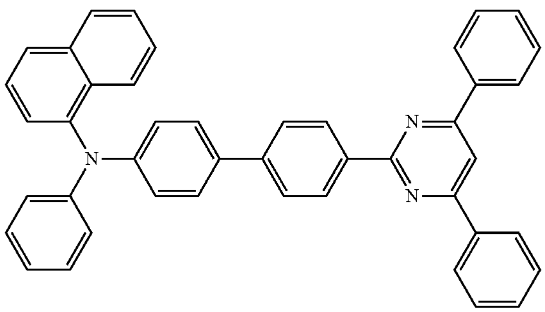
2-34
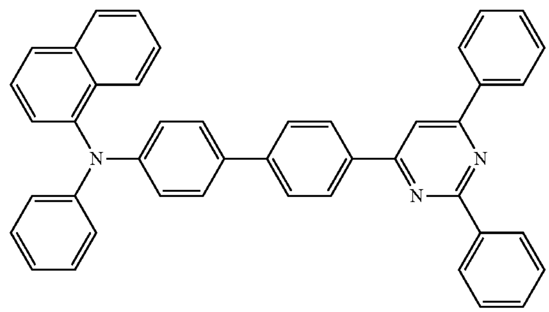
2-35
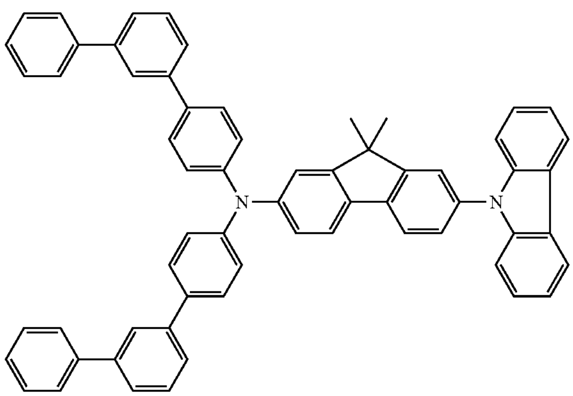
2-36
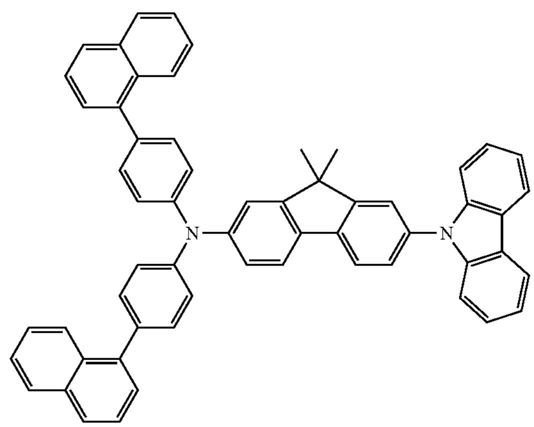
2-37
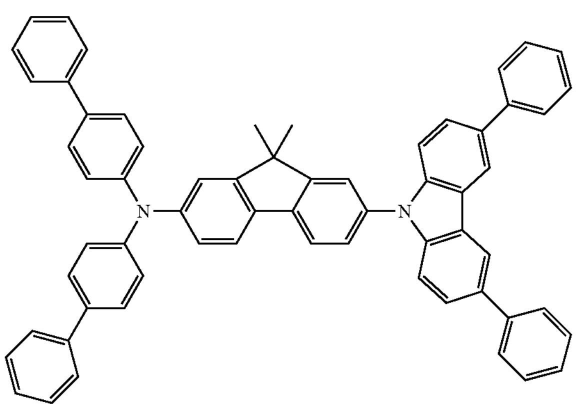
2-38
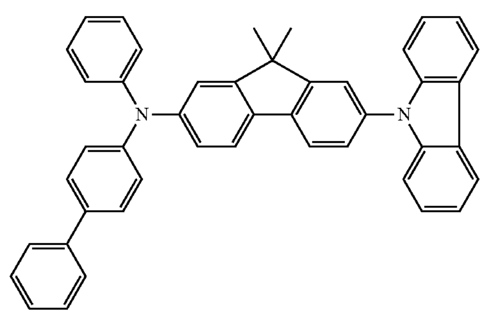

-continued
2-39
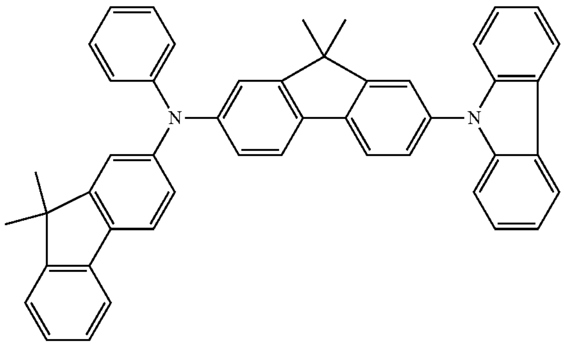
2-40
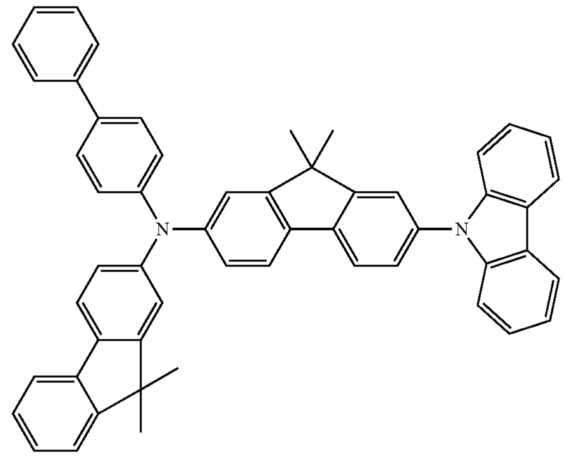
2-41
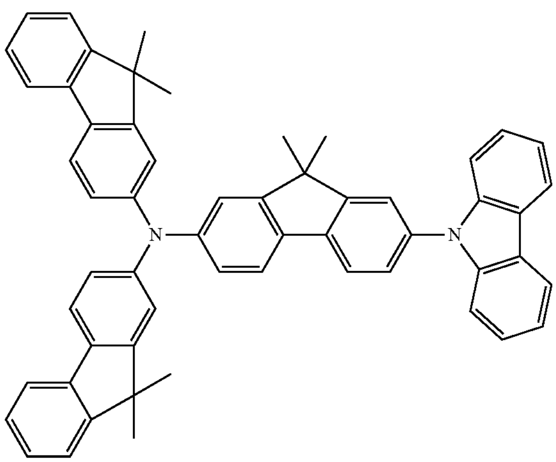
2-42
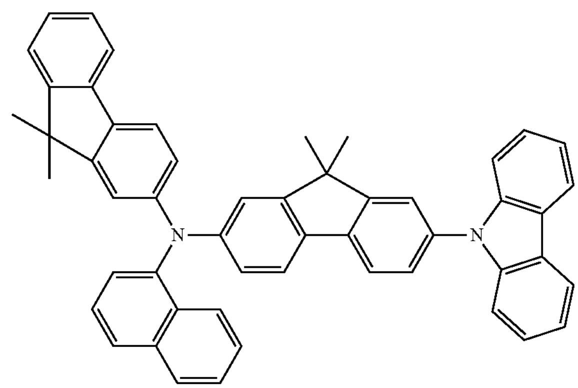
2-43
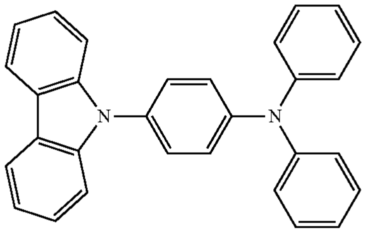
2-44
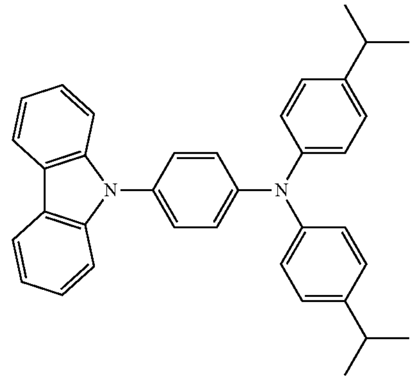

-continued
2-45
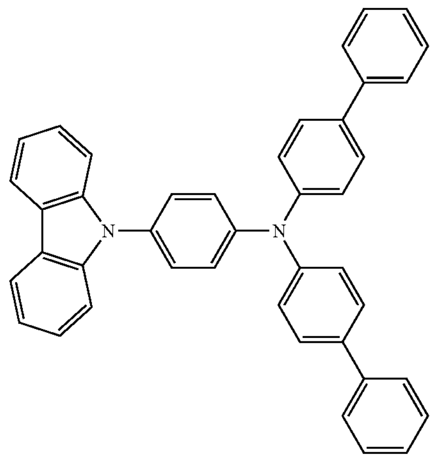
2-46
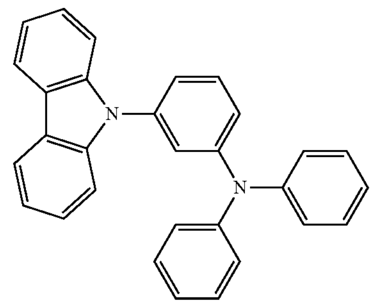
2-47
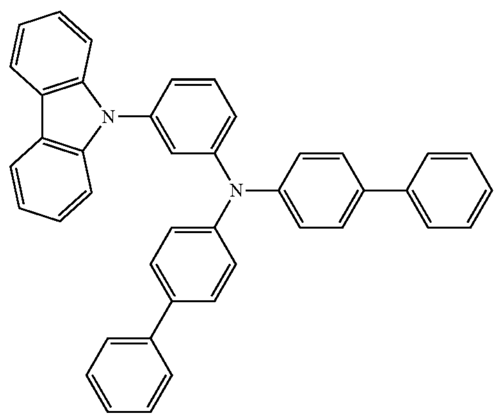
2-48
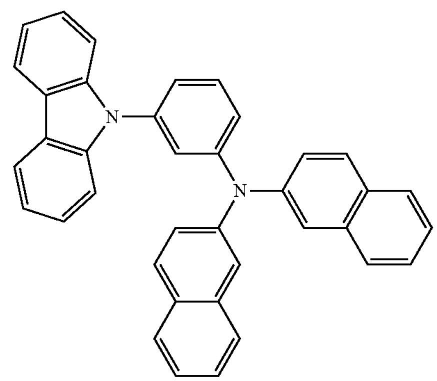
2-49
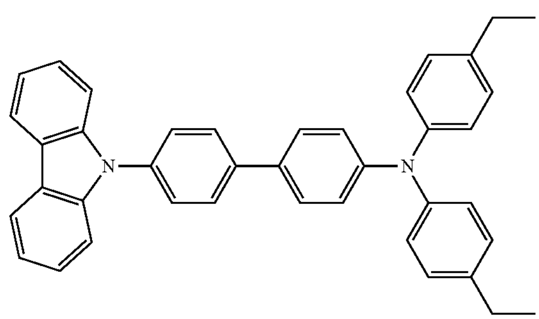
2-50
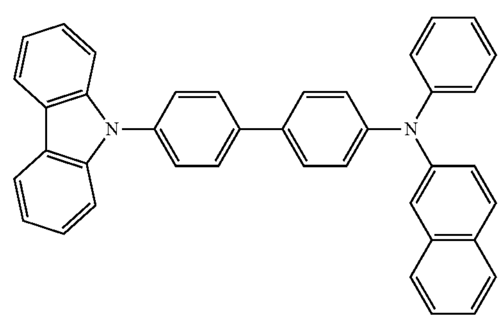
2-51
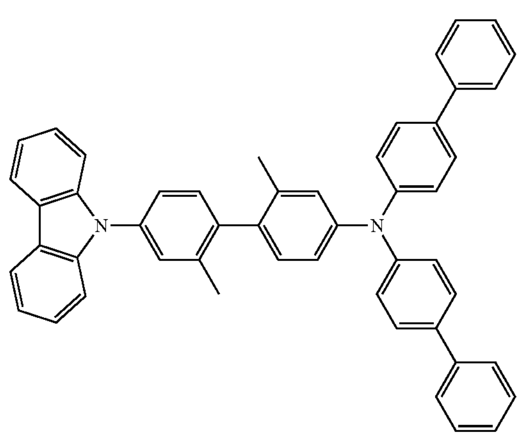
2-52
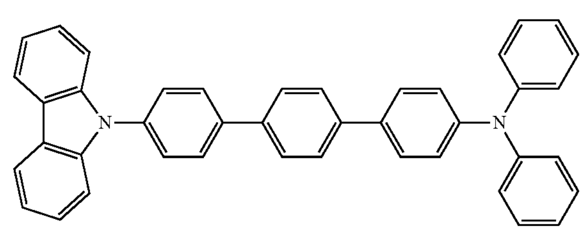

-continued
2-53
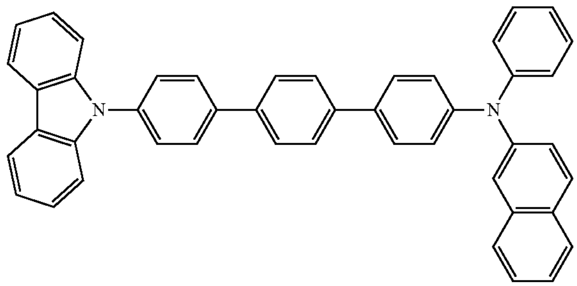
2-54
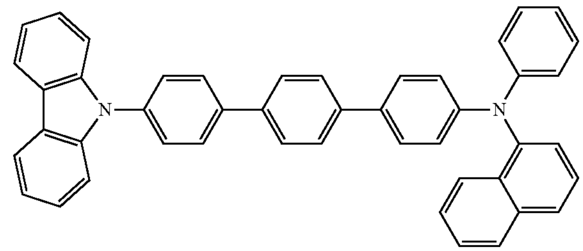
2-55
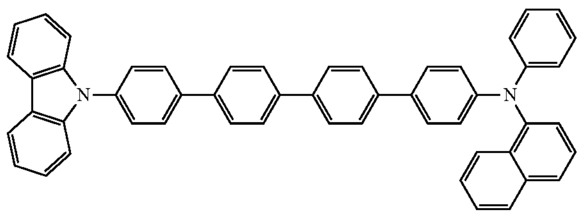
2-56
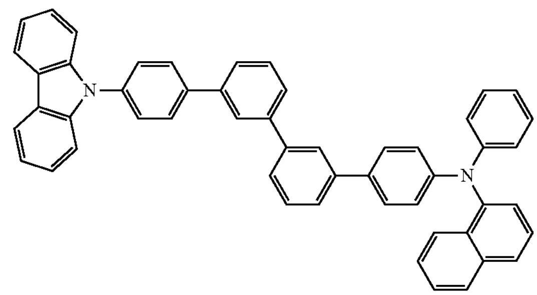
2-57
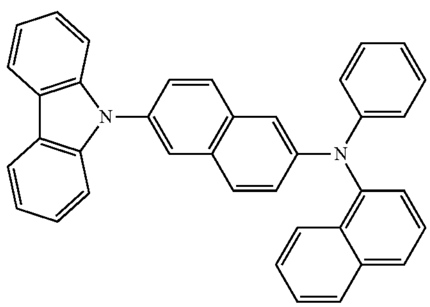
2-58
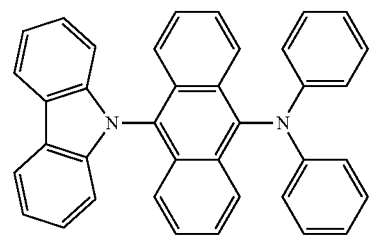
2-59
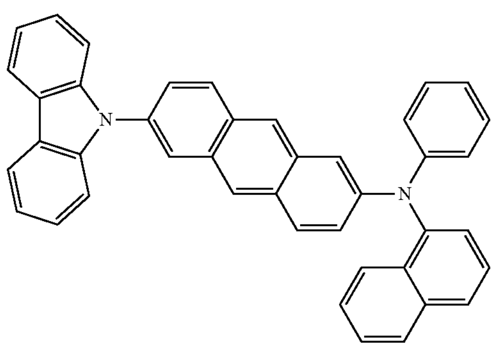
2-60
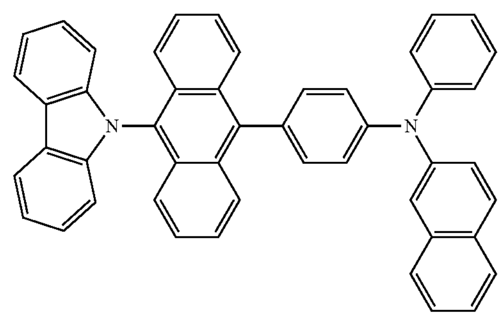
2-61
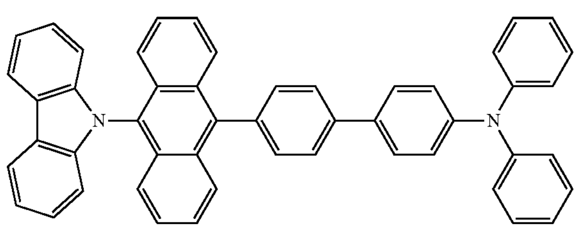
2-62
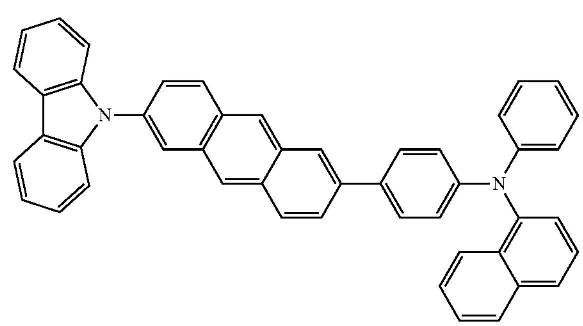

-continued
2-63
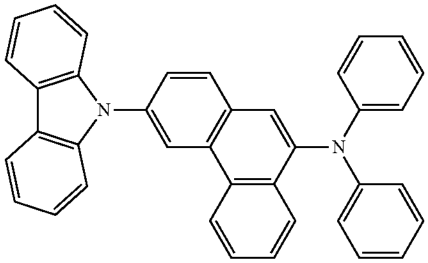
2-64
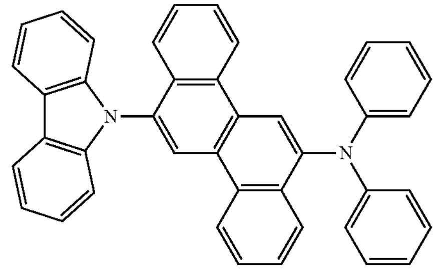
2-65
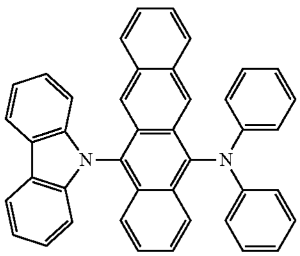
2-192
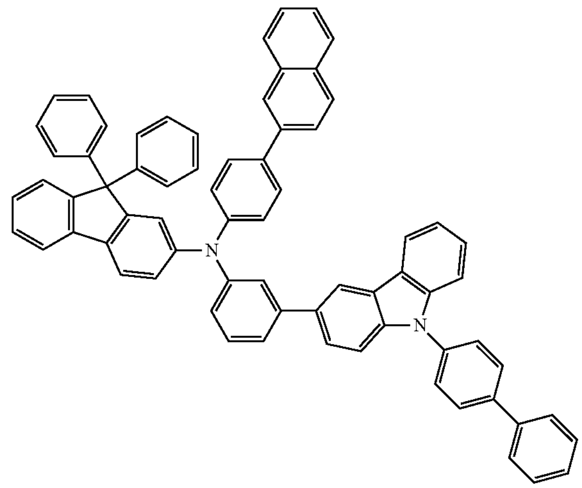
2-193
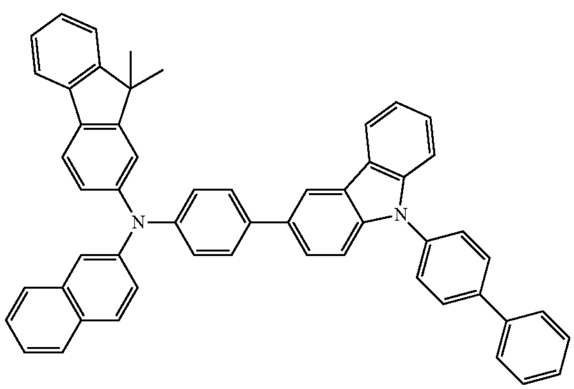
2-194
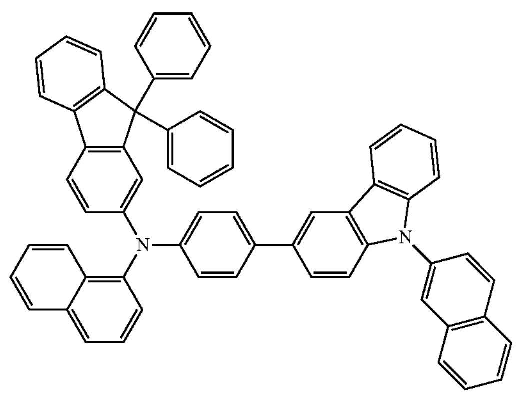
2-195
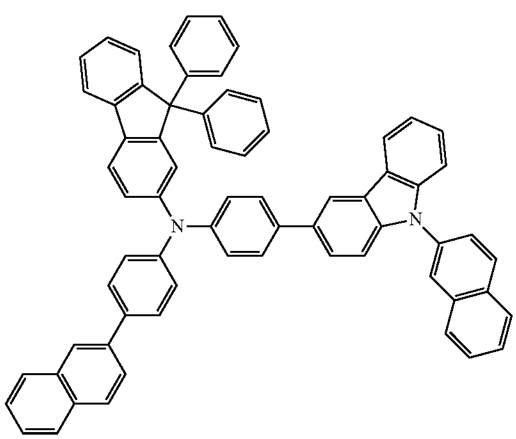
2-196
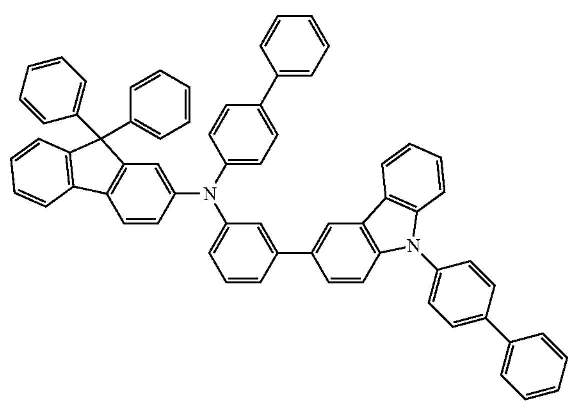

-continued
2-197
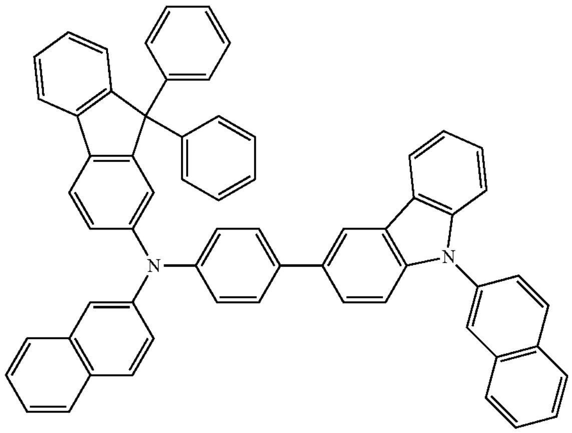
2-198
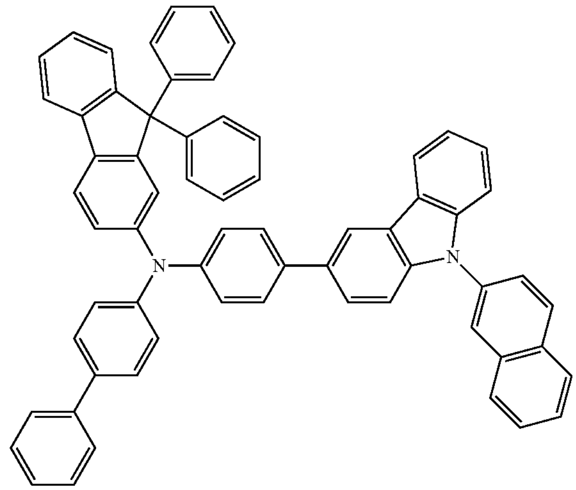
2-199
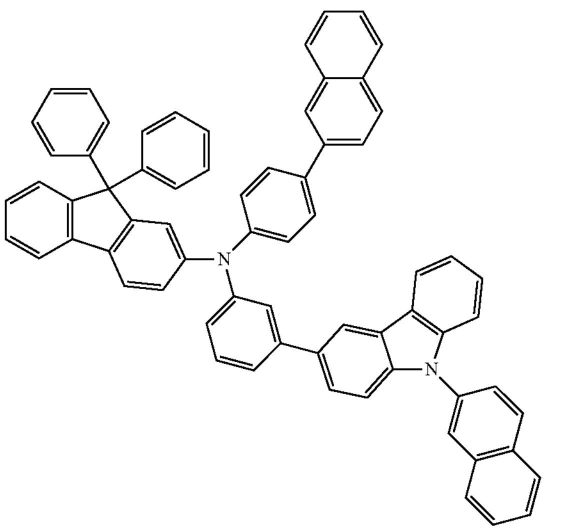
2-200
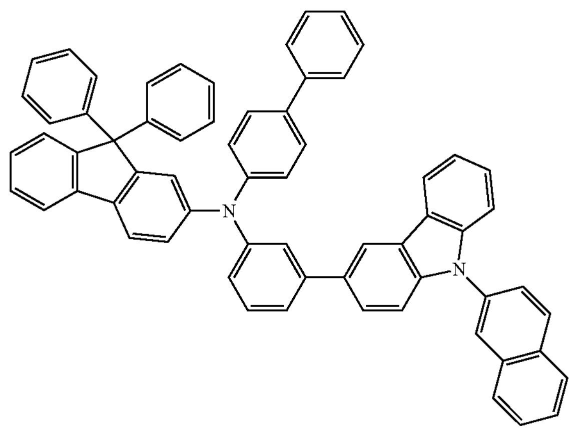
2-201
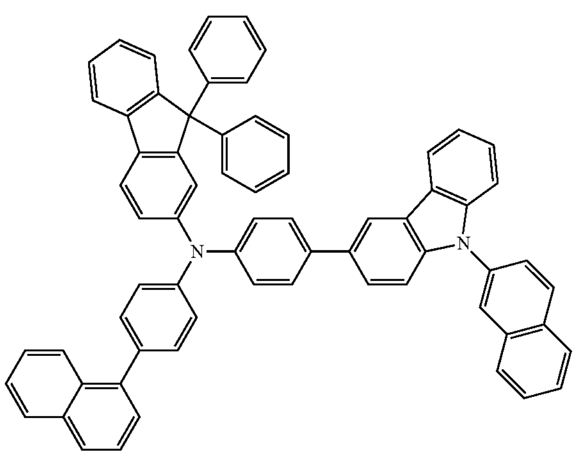
3-1
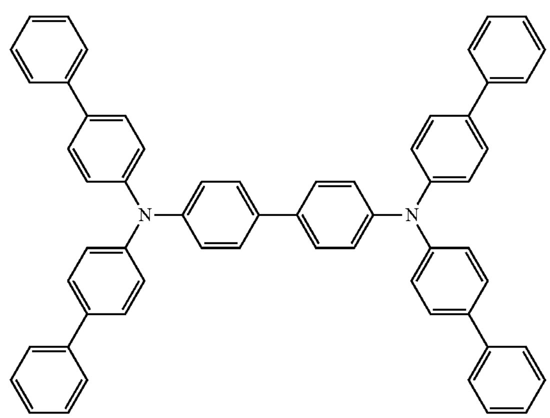

-continued
3-2
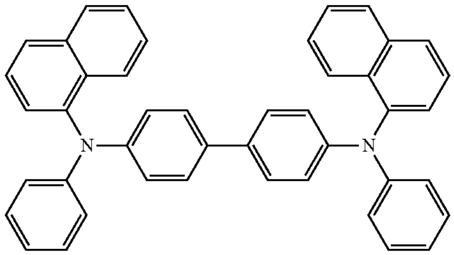
3-3
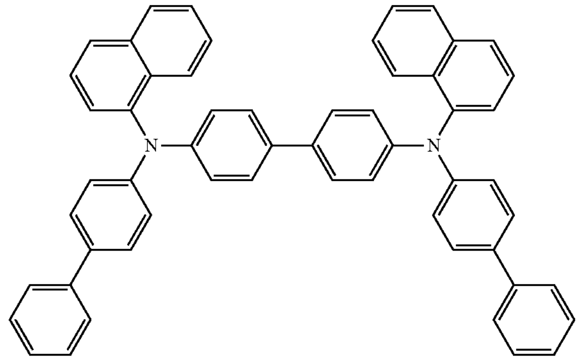
3-4
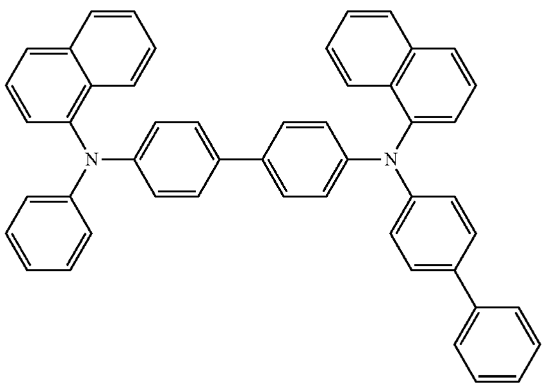
3-5
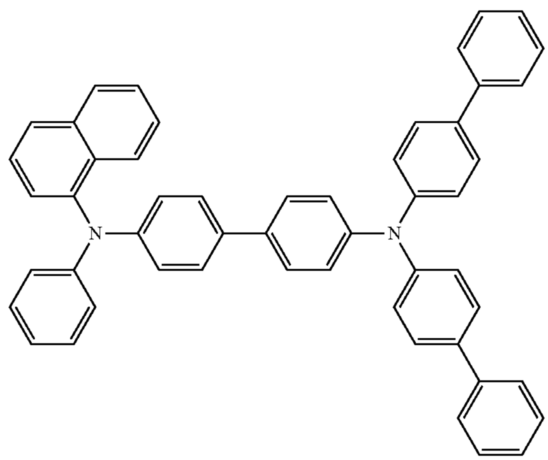
3-6
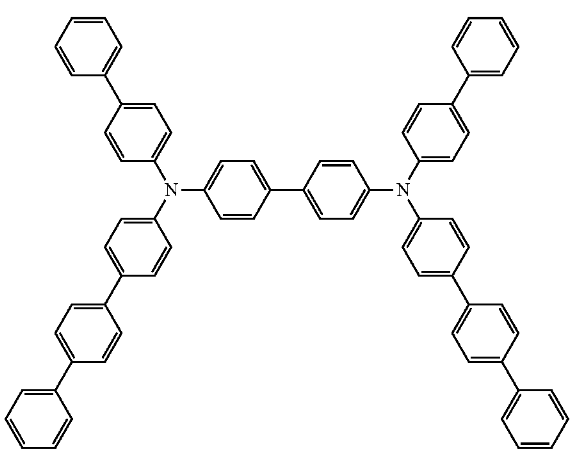
3-7
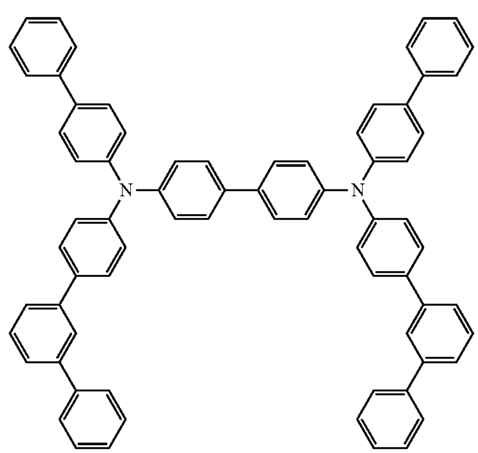

-continued
3-8
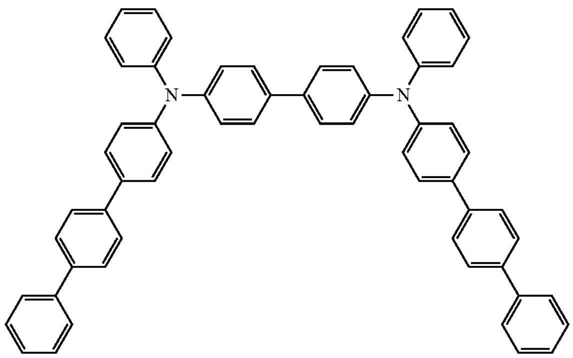
3-9
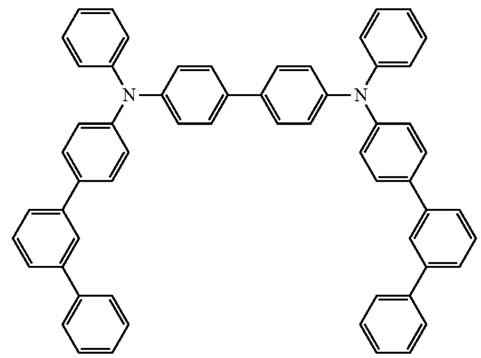
3-10
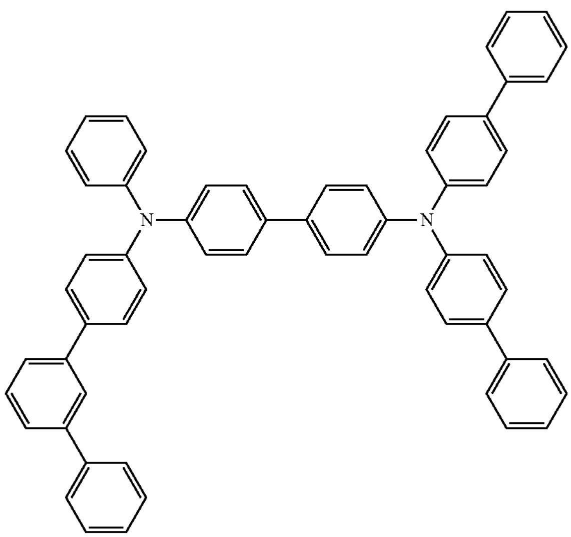
3-11
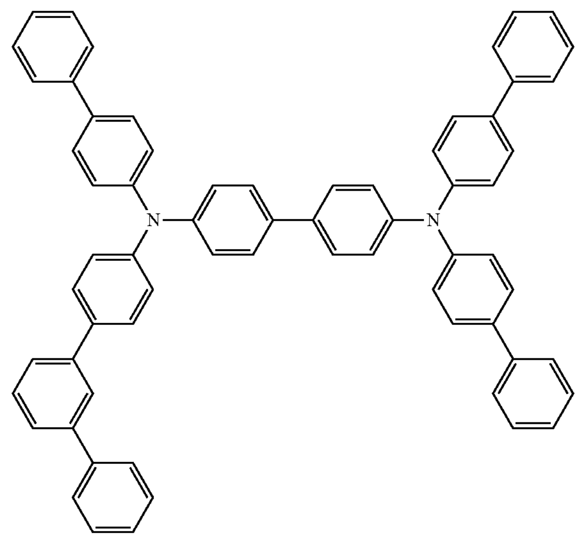
3-12
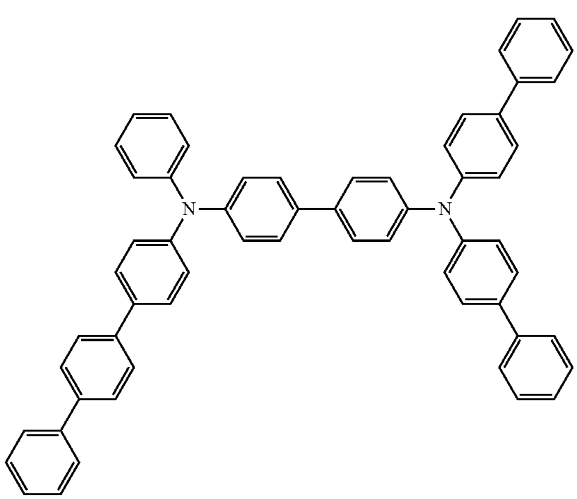
3-13
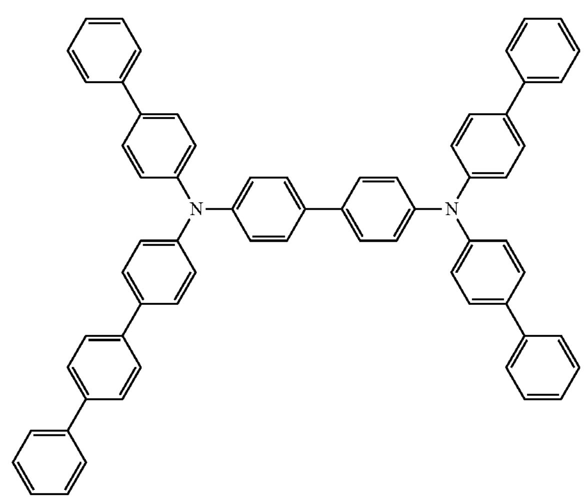

-continued
3-14
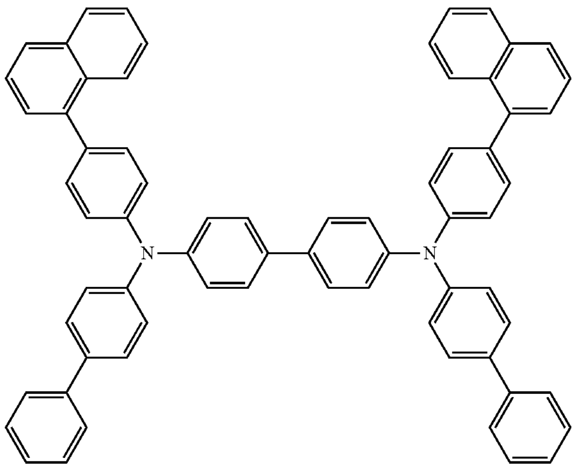
3-15
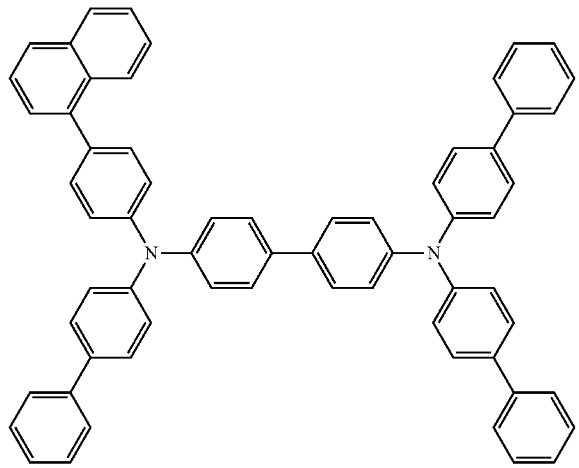
3-16
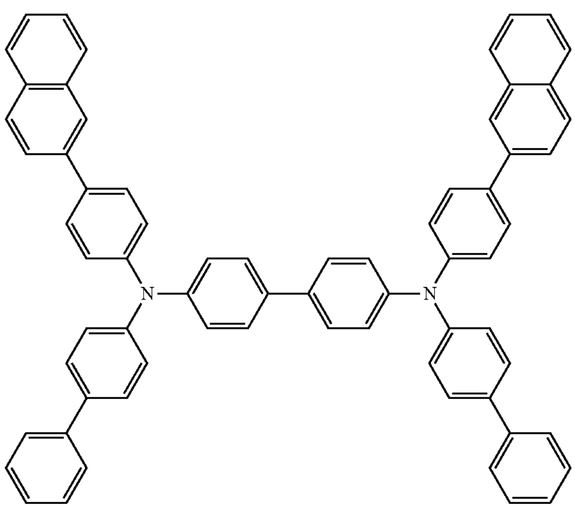
3-17
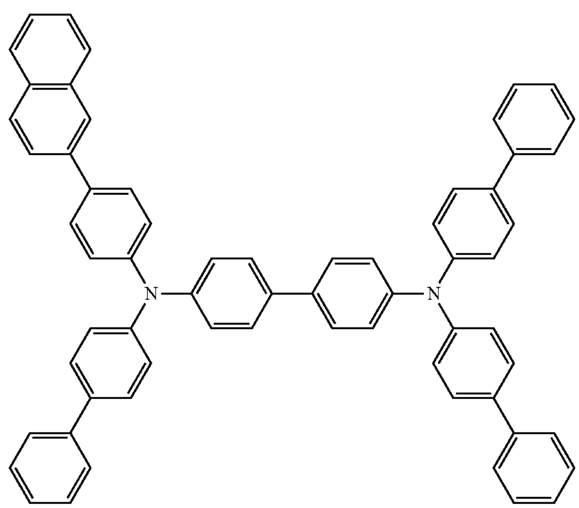
3-18
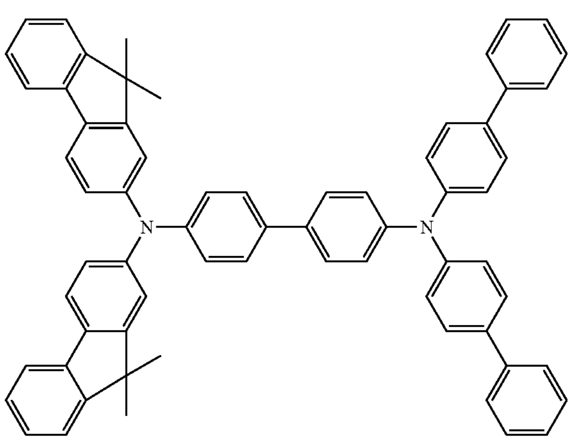
3-19
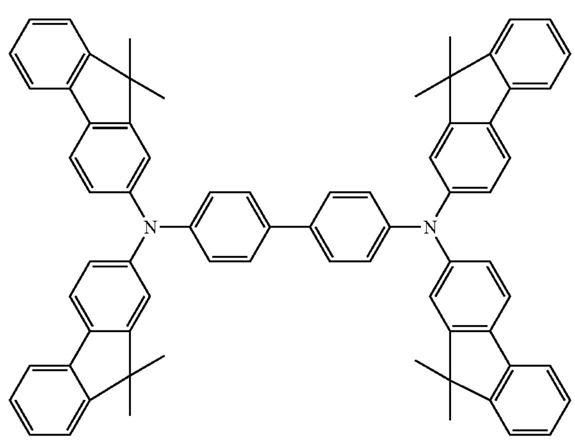

-continued
3-20
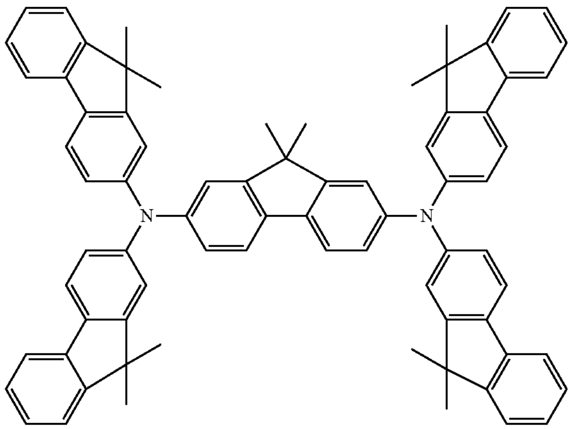
3-21
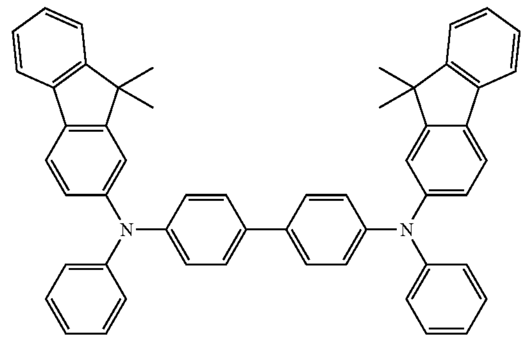
3-22
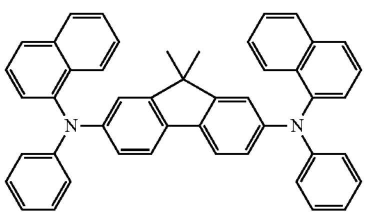
3-23
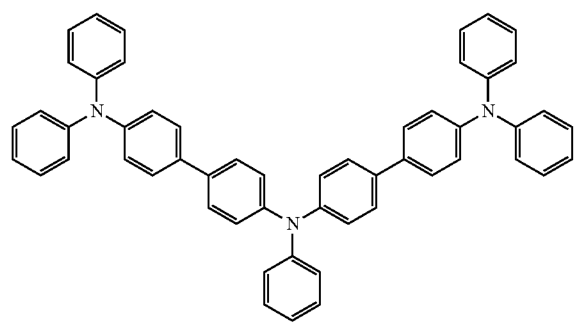
3-24
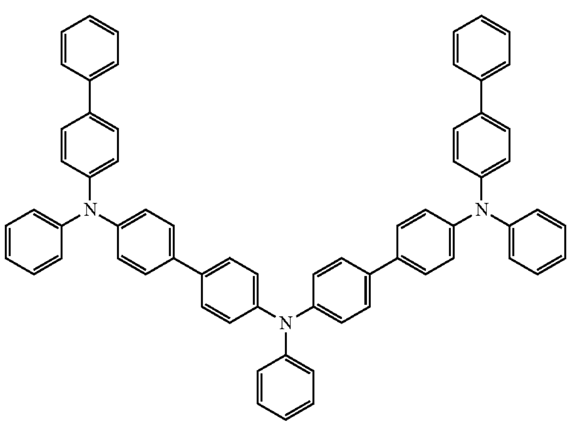
3-25
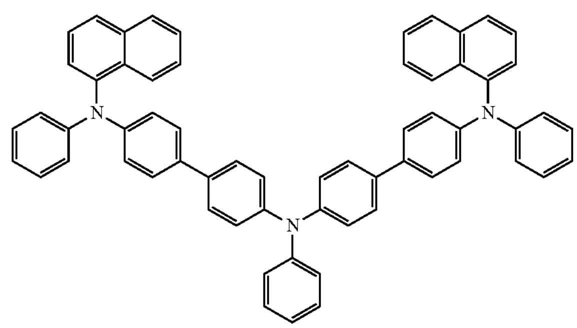

-continued
3-26
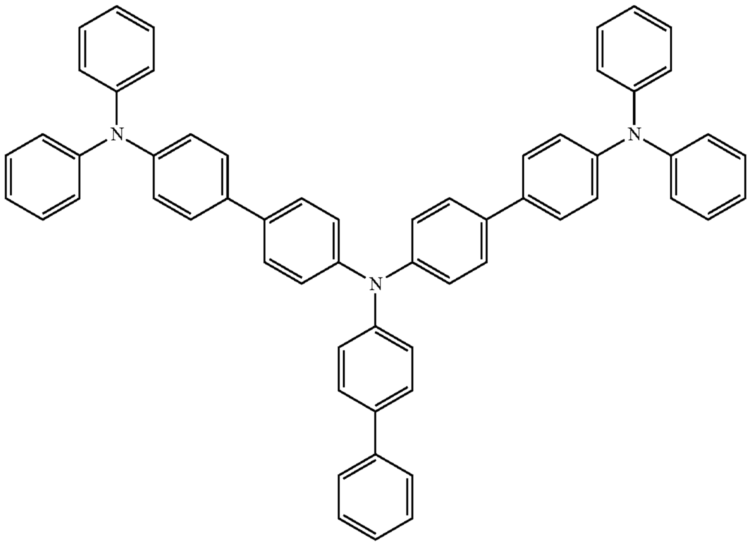
3-27
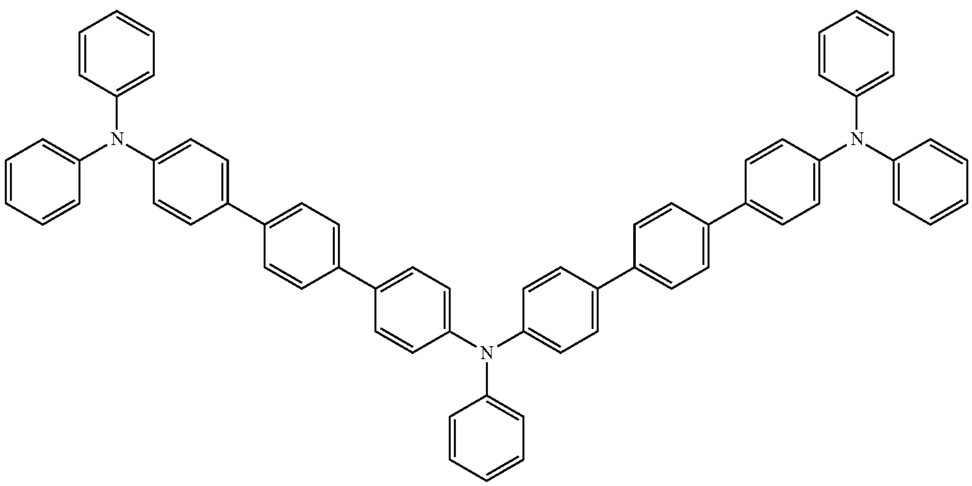
3-28
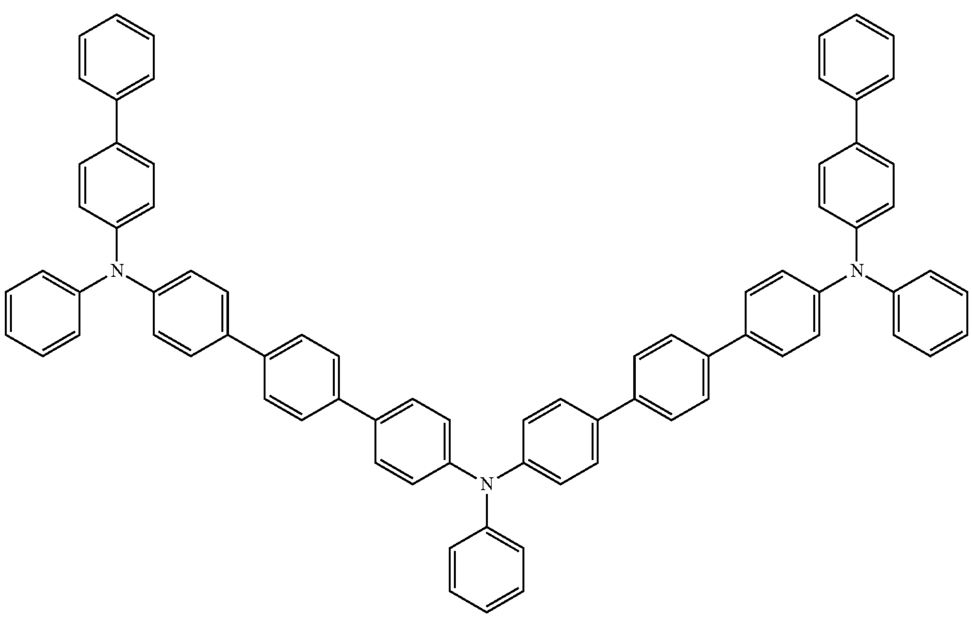

-continued
3-29
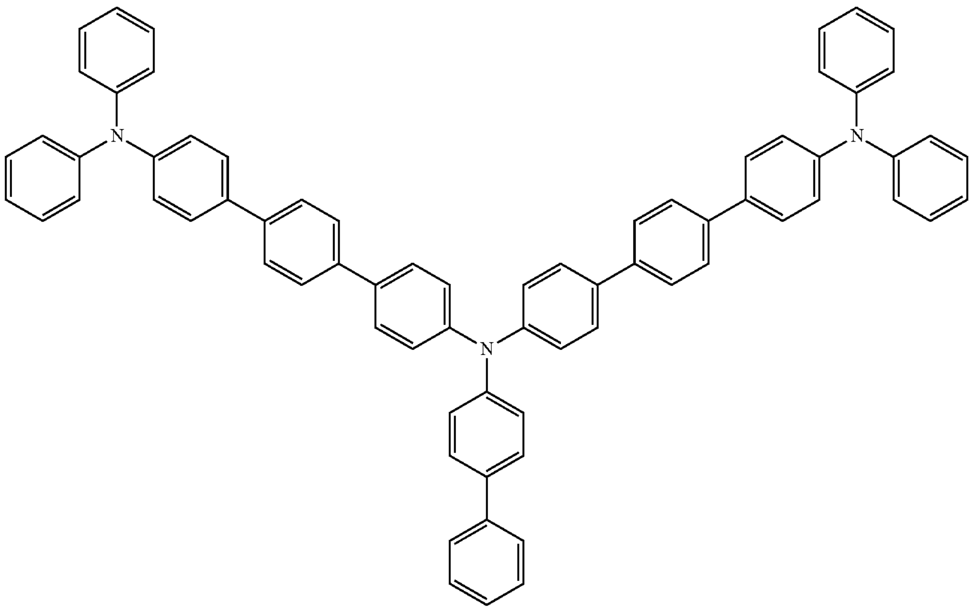
3-30
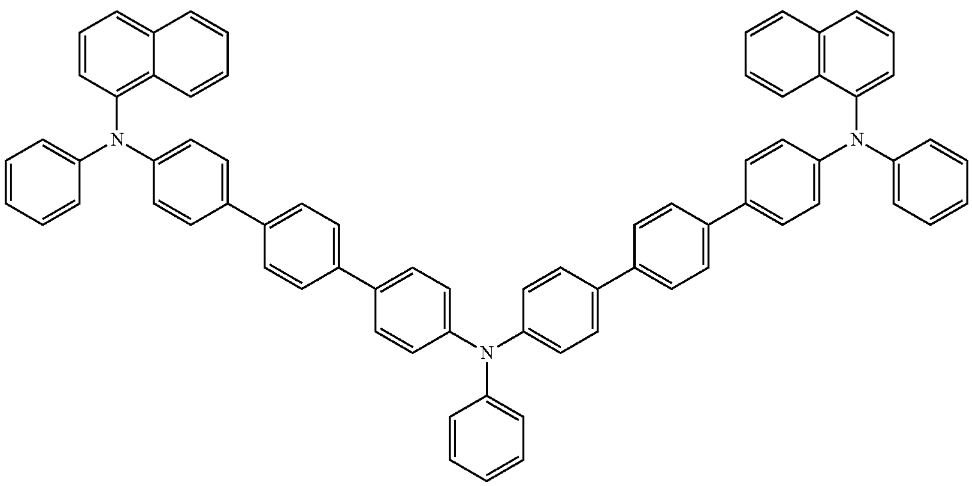
3-31
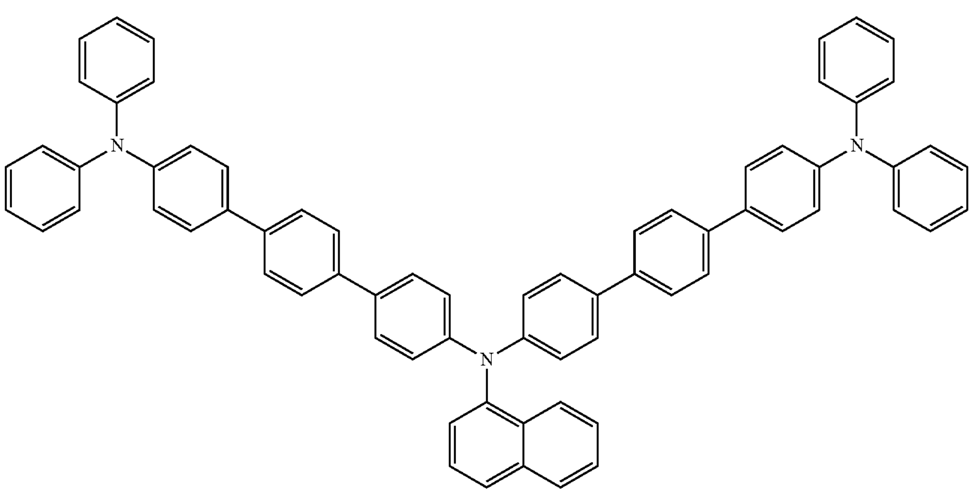

-continued
3-32
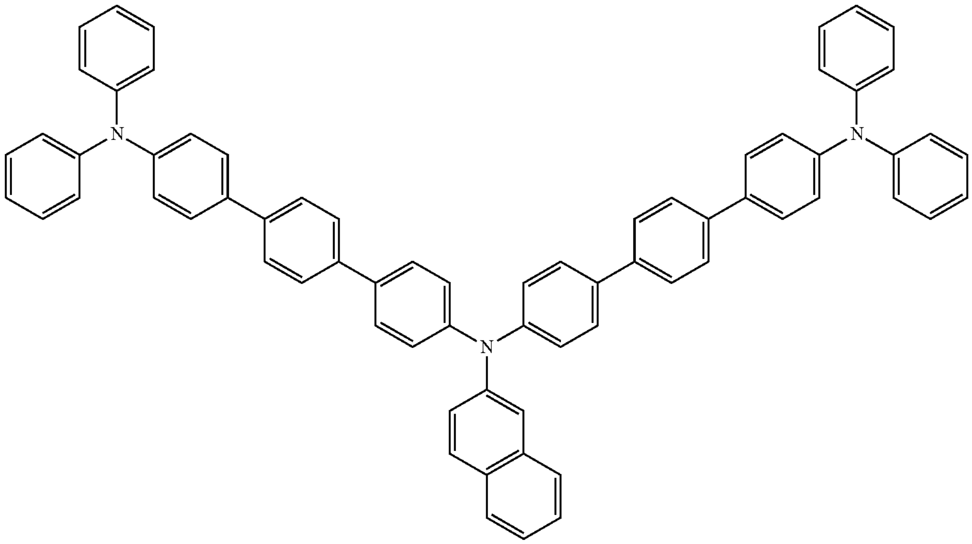
3-33
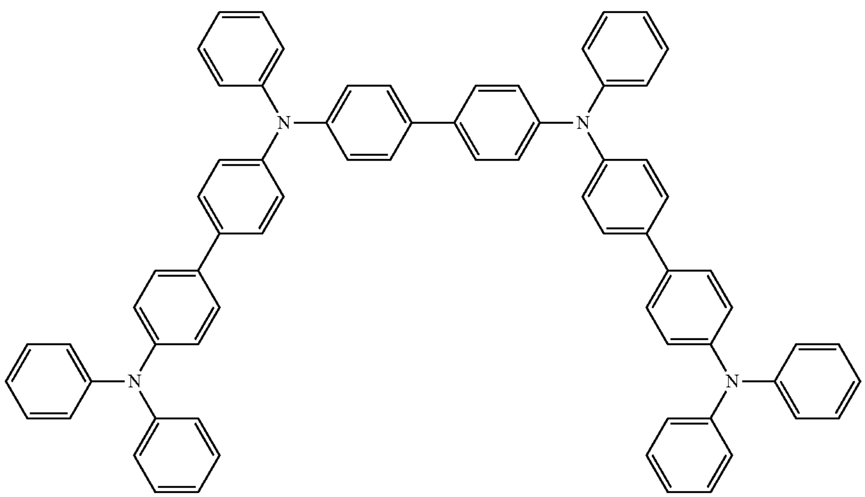
3-34
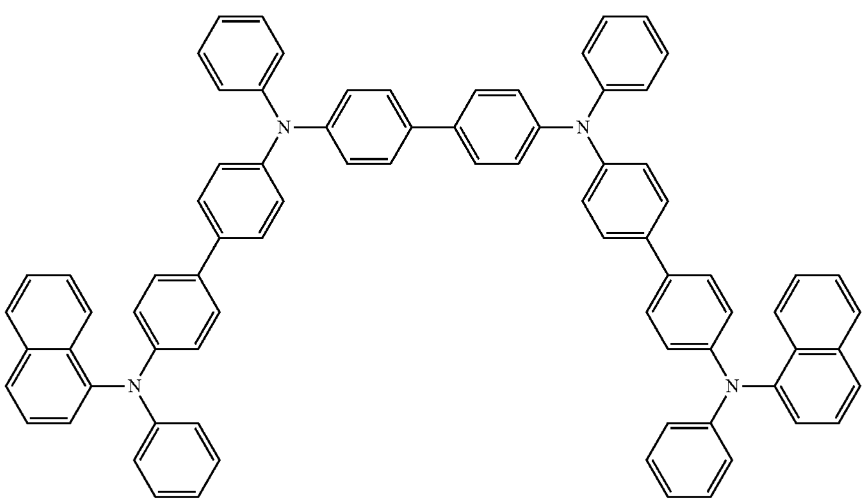

-continued
3-35
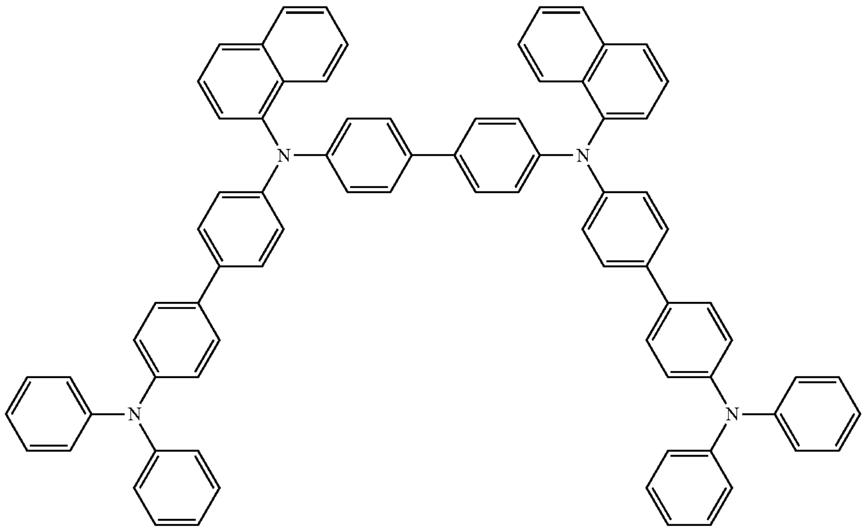
3-36
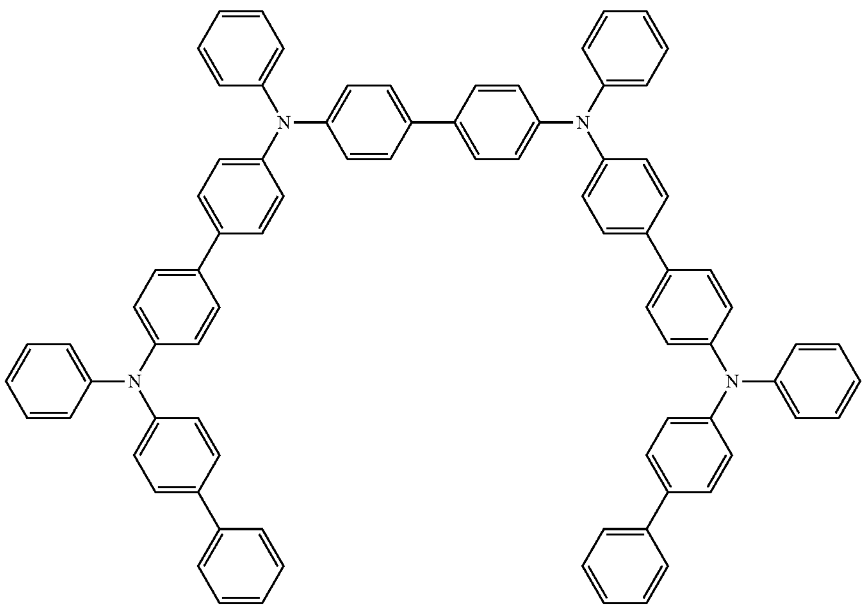
3-37
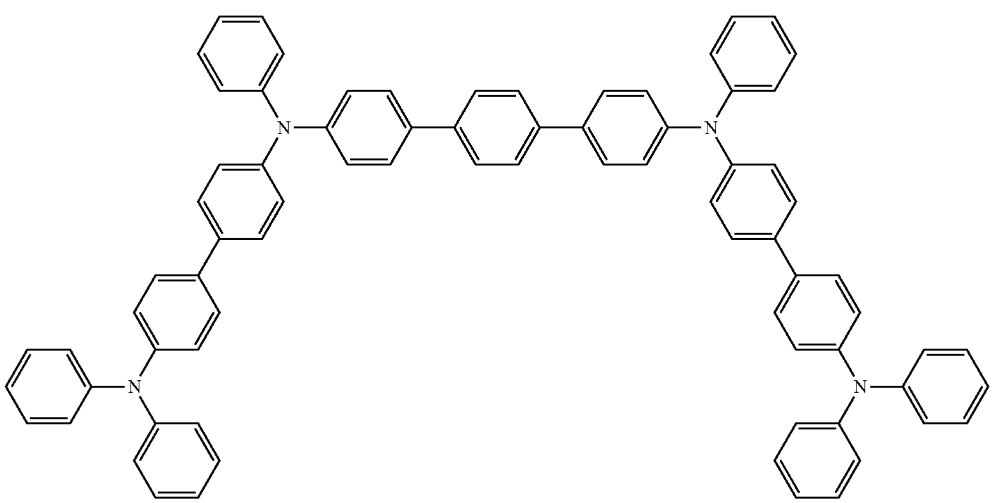

-continued
3-38
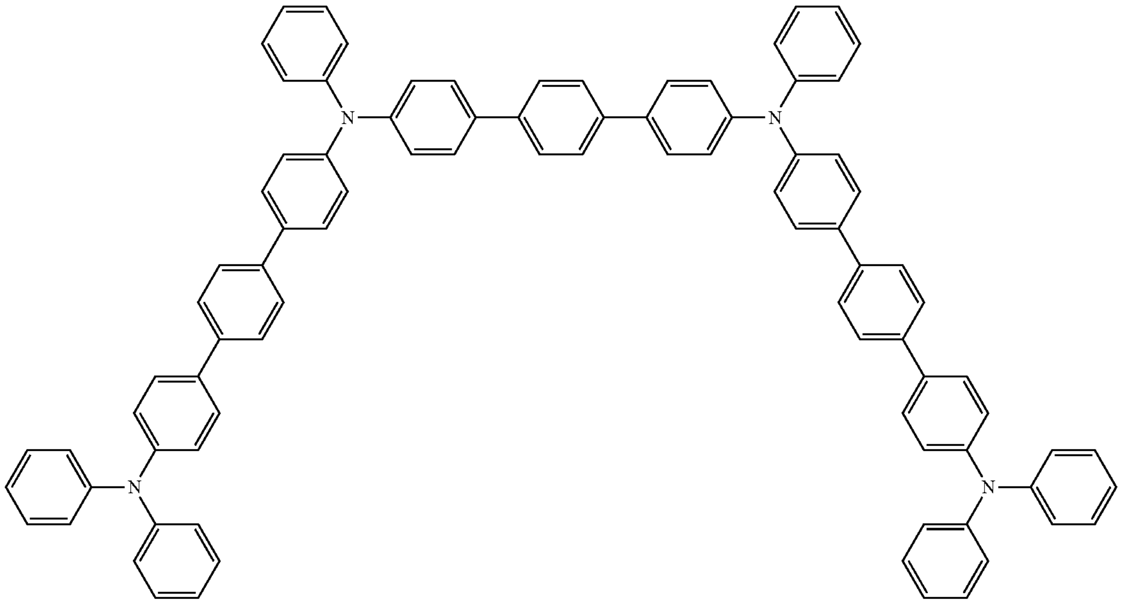
3-39
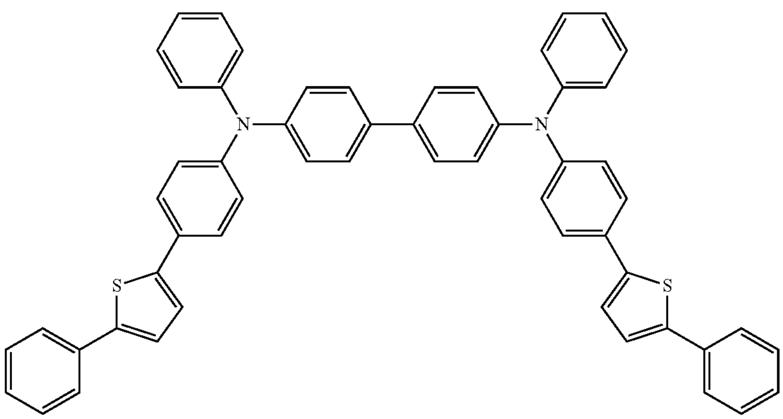
4-1
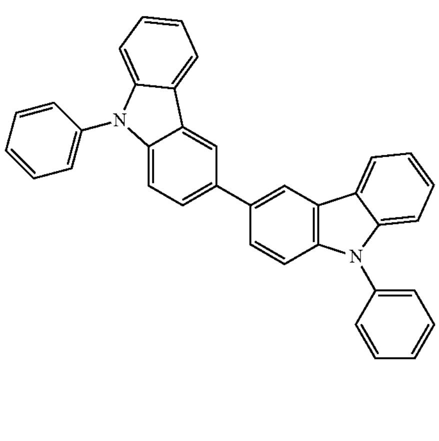
4-2
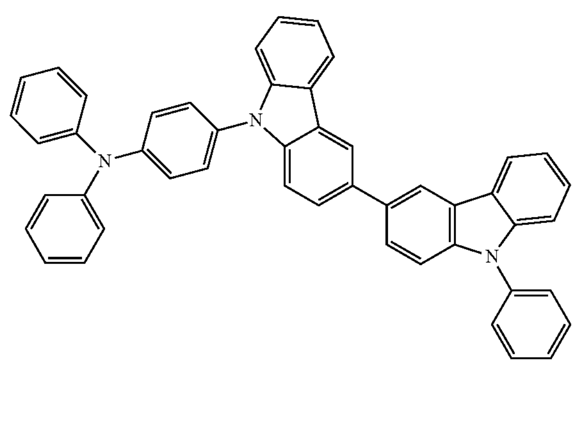

-continued
4-3
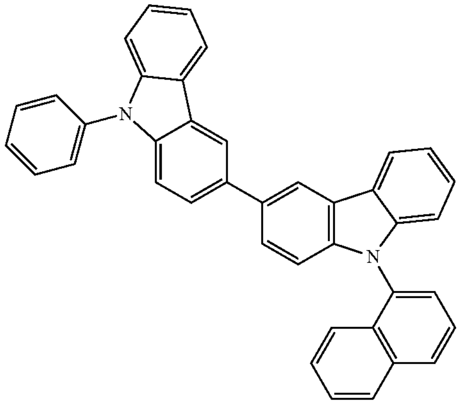
4-4
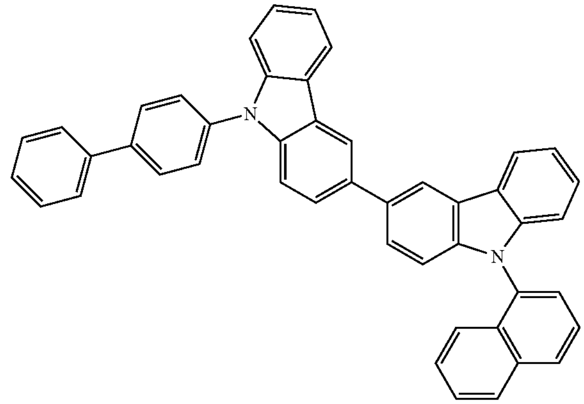
4-5
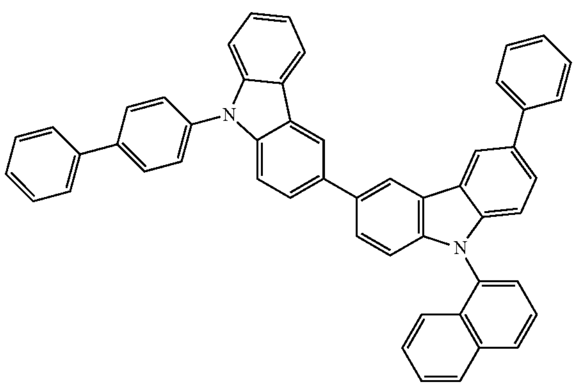
4-6
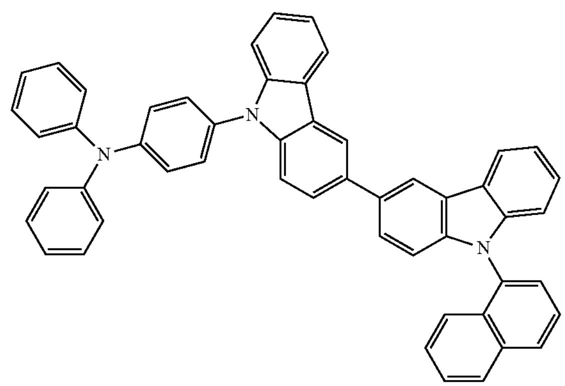
4-7
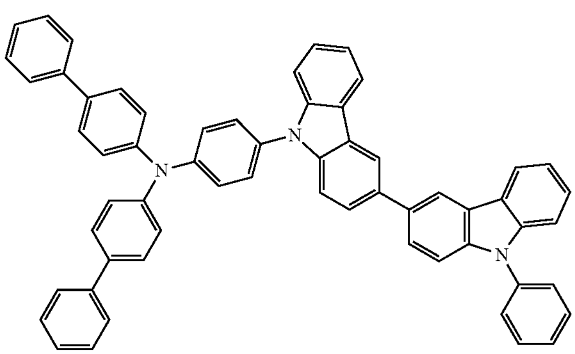
5-1
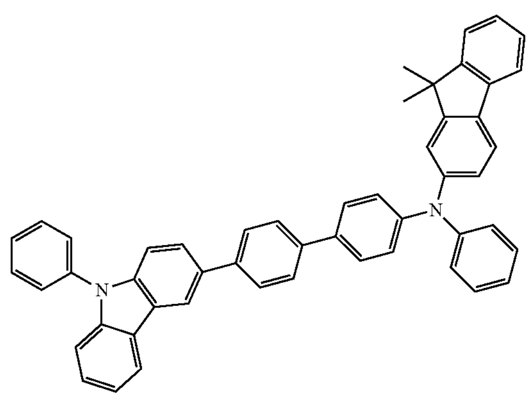
5-2
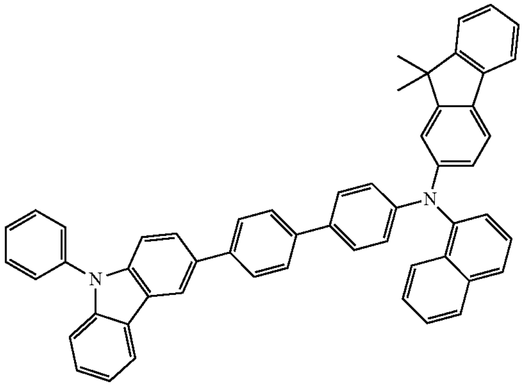
5-3
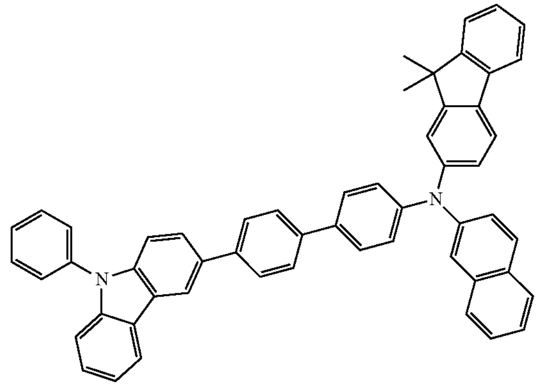

-continued
5-4
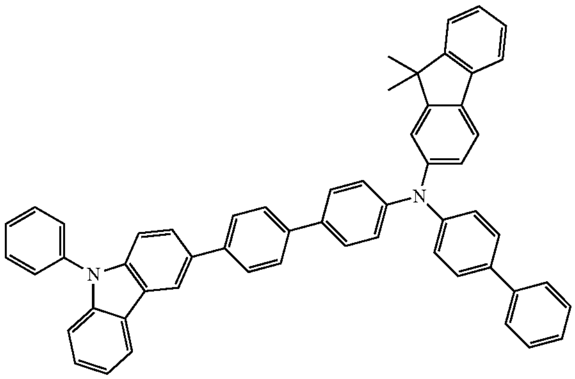
5-5
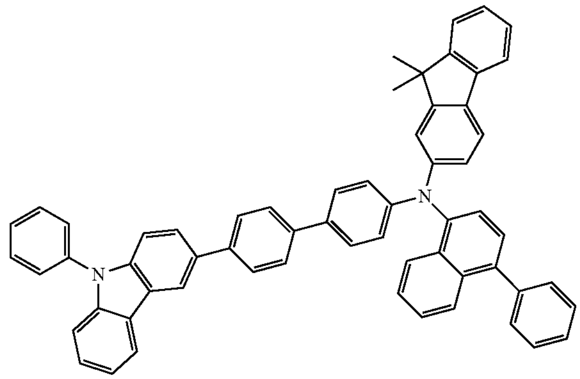
5-6
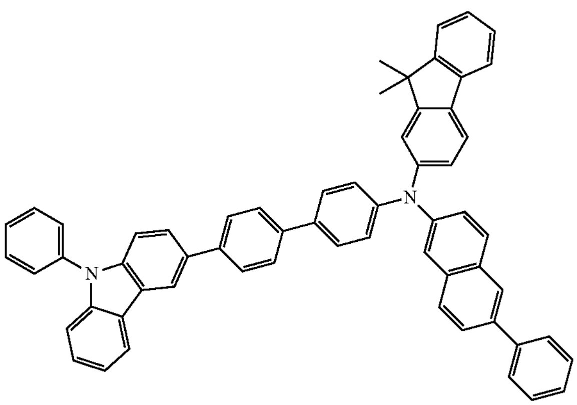
5-7
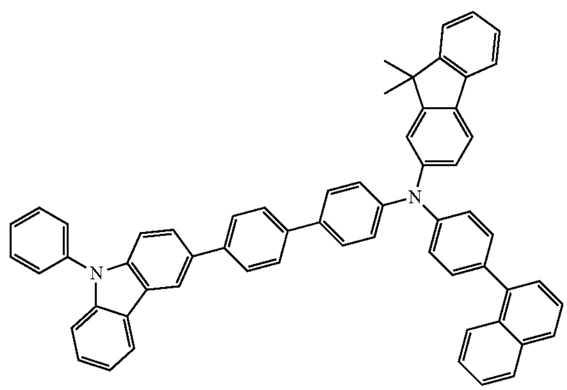
5-8
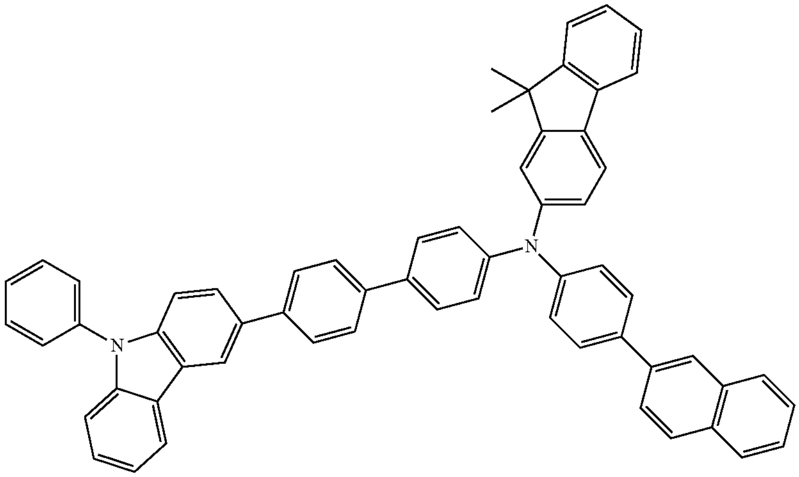

-continued
5-9
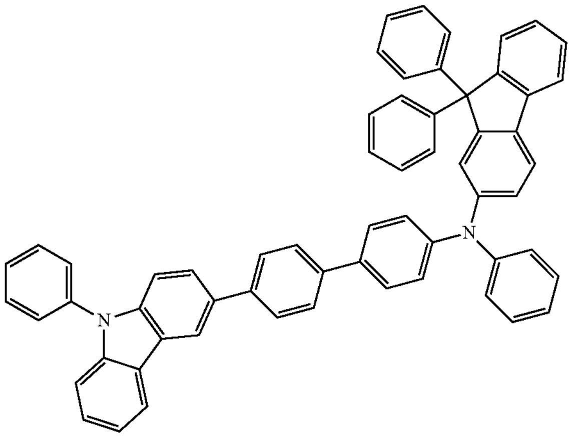
5-10
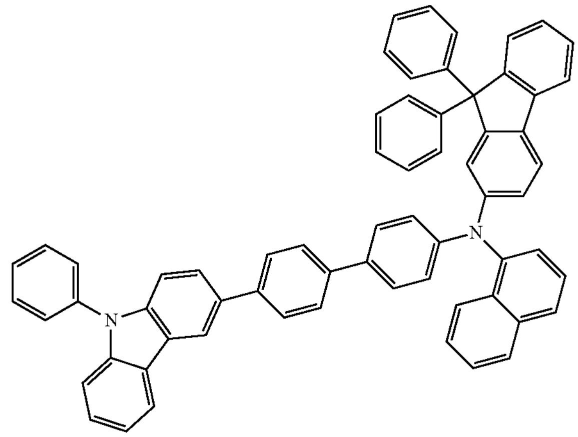
5-11
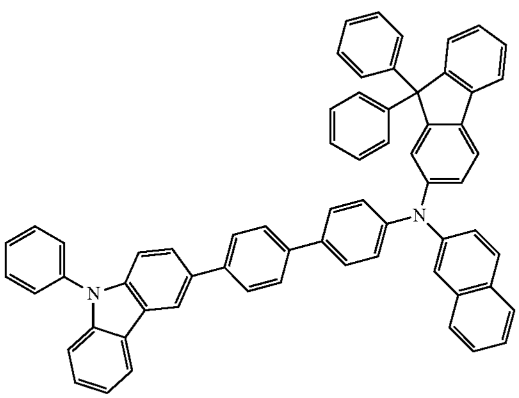
5-12
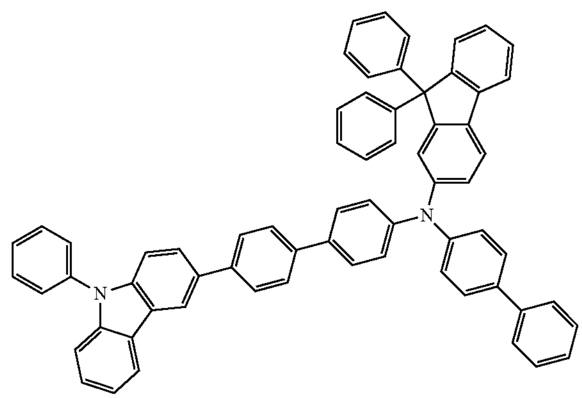
5-13
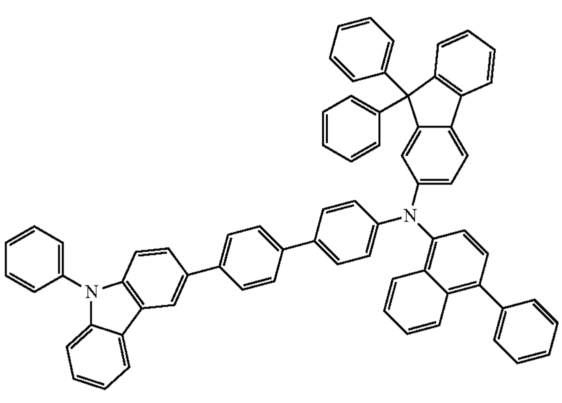
5-14
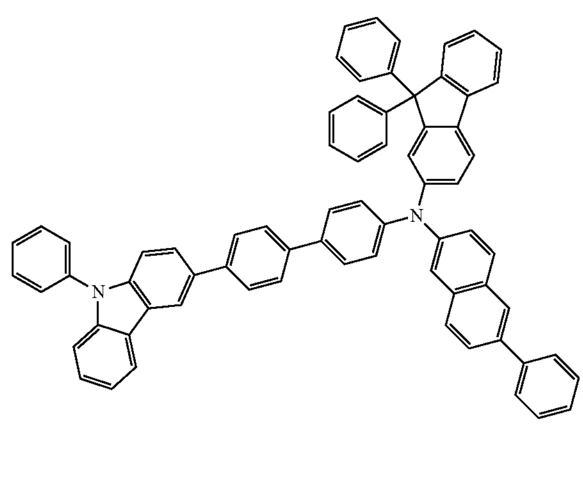

-continued
5-15
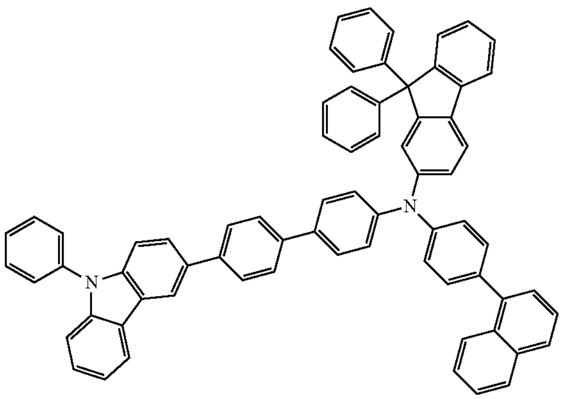
5-16
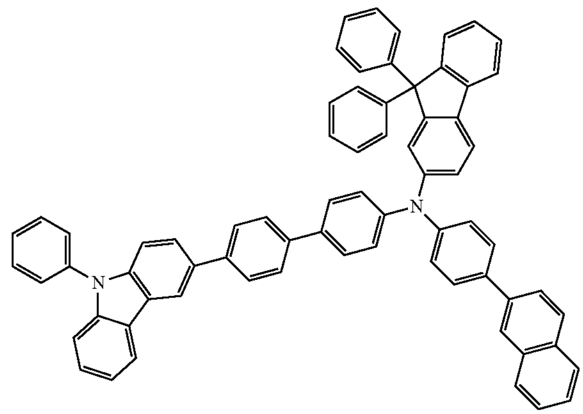
5-17
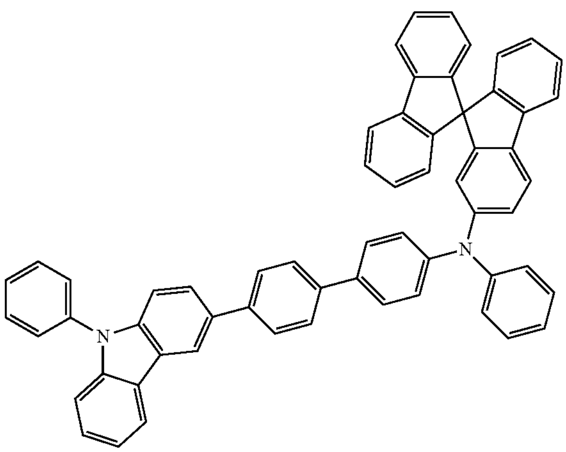
5-18
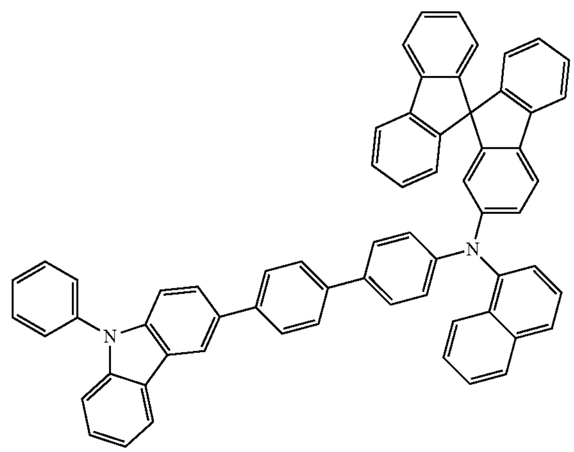
5-19
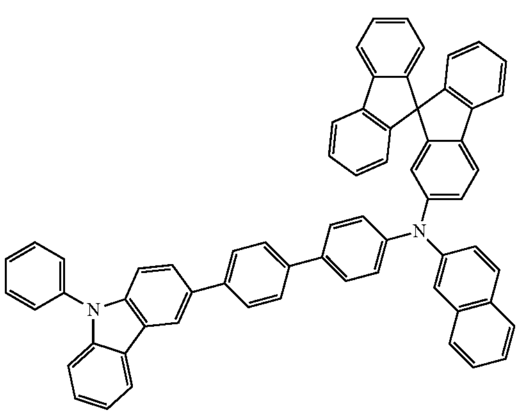
5-20
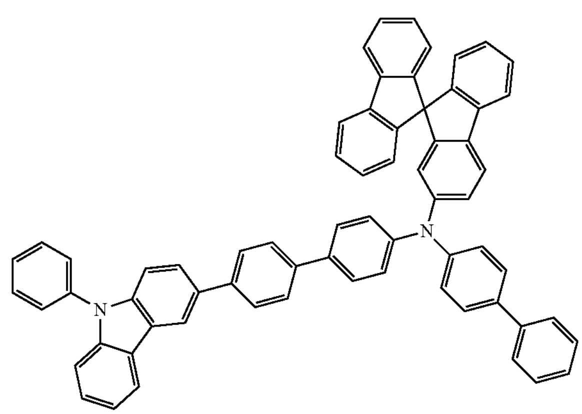

-continued
5-21
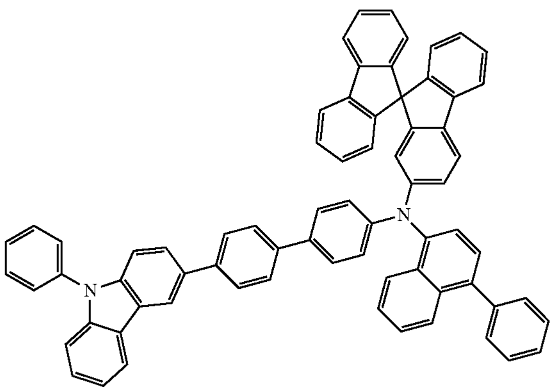
5-22
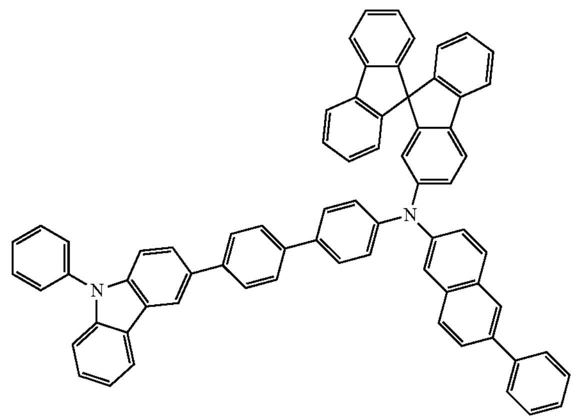
5-23
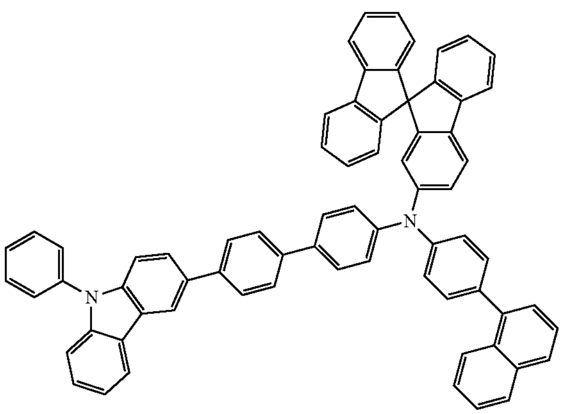
5-24
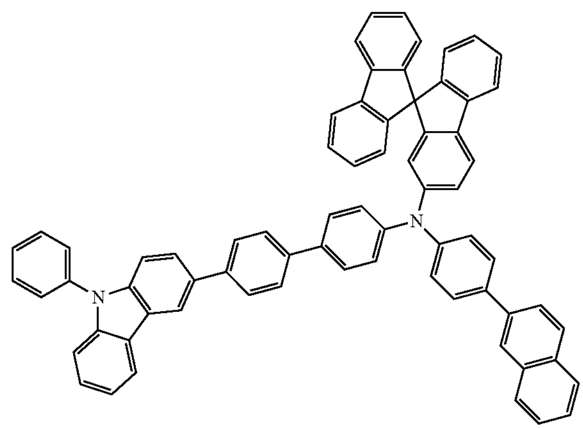
5-25
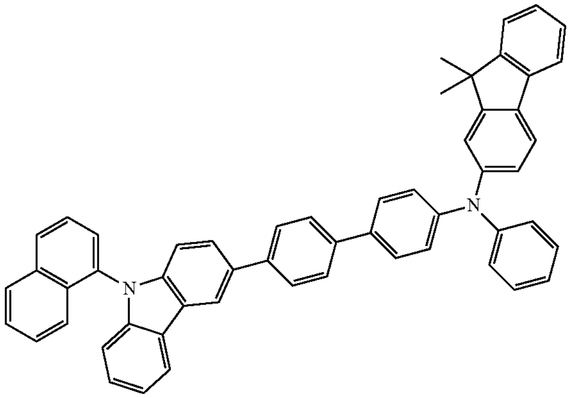
5-26
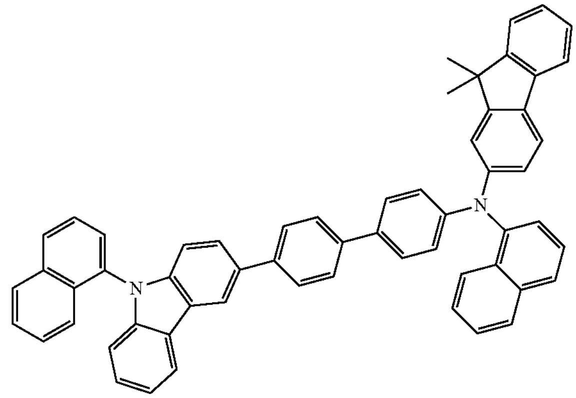

-continued
5-27
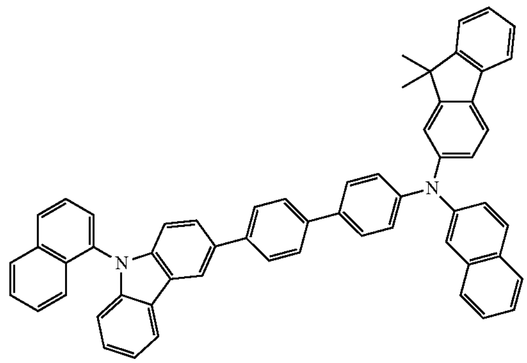
5-28
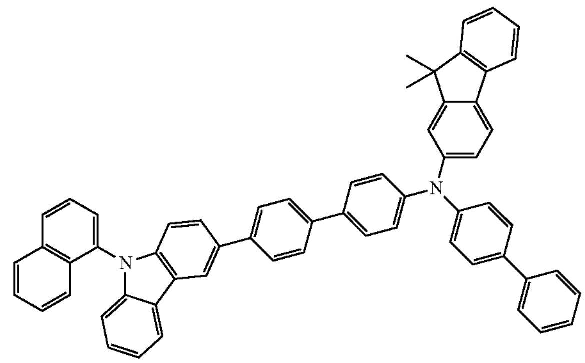
5-29
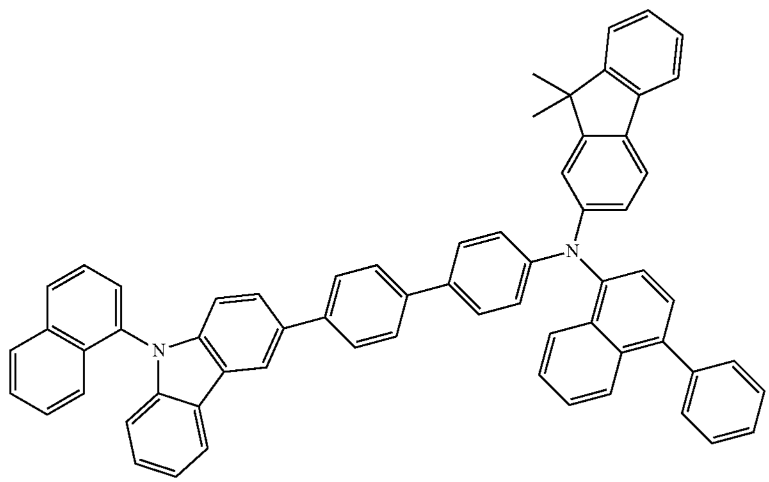
5-30
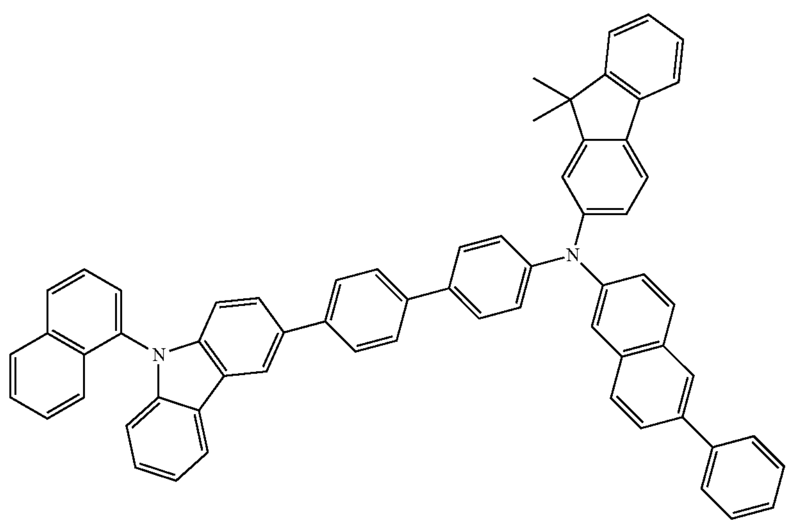

-continued
5-31
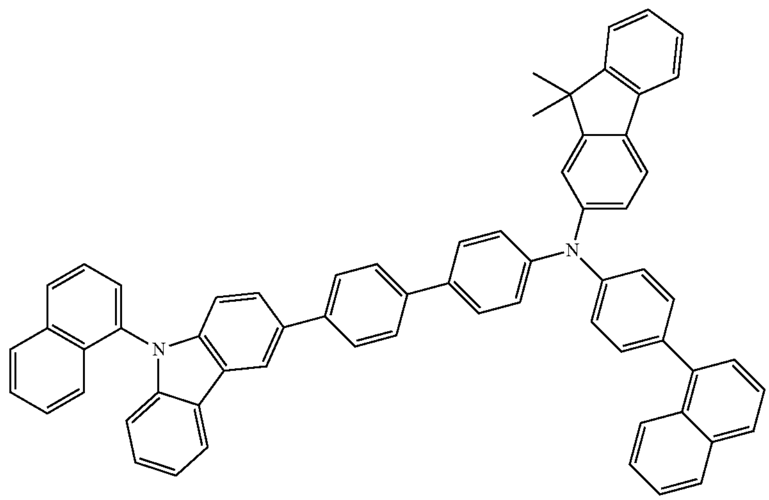
5-32
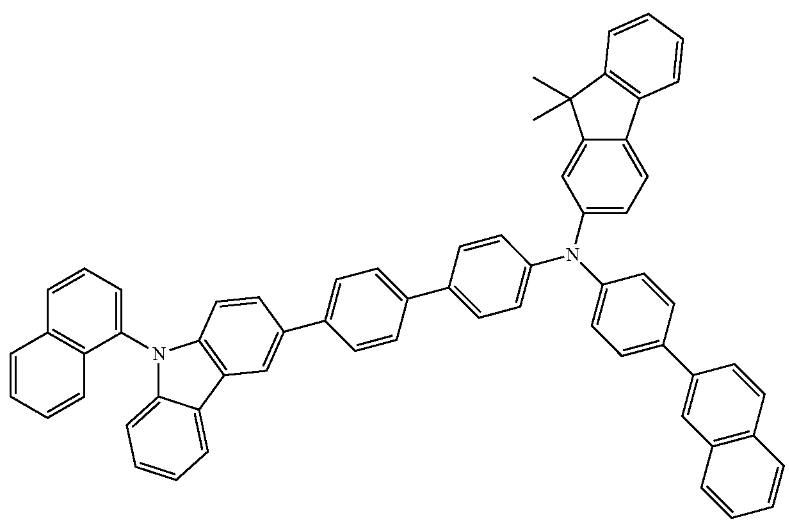
5-33
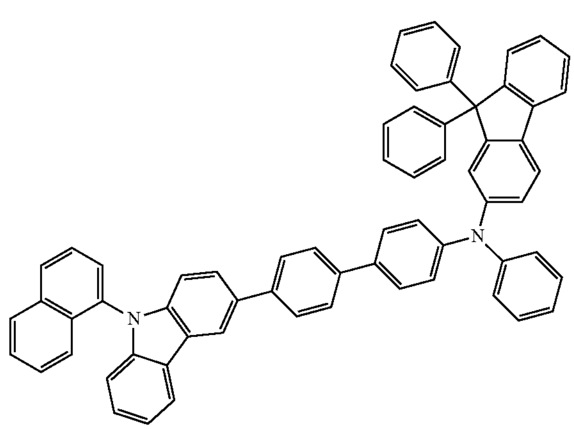
5-34
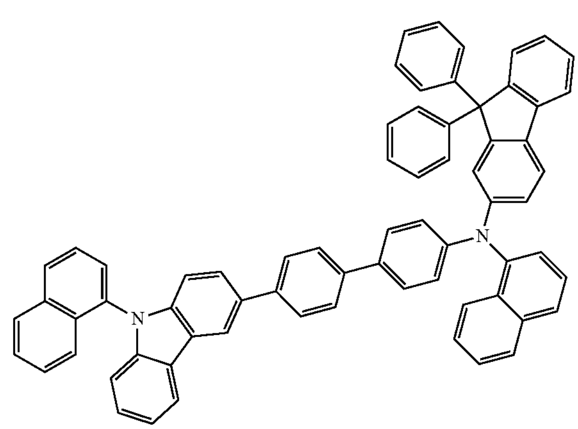

-continued
5-35
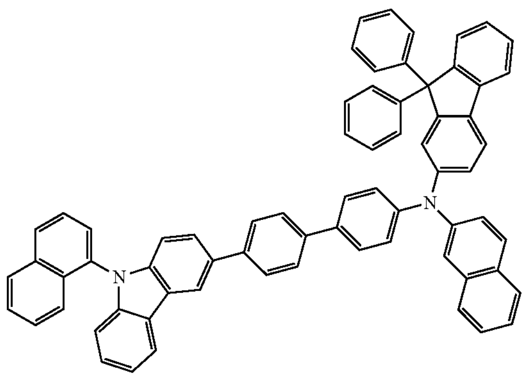
5-36
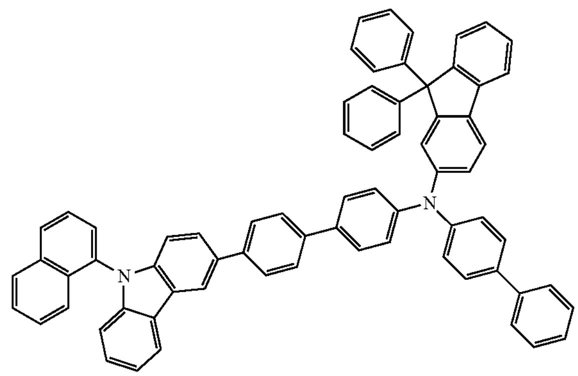
5-37
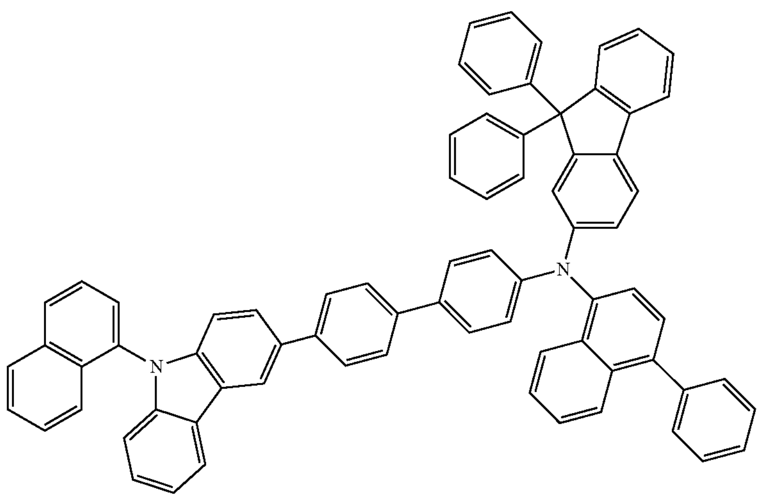
5-38
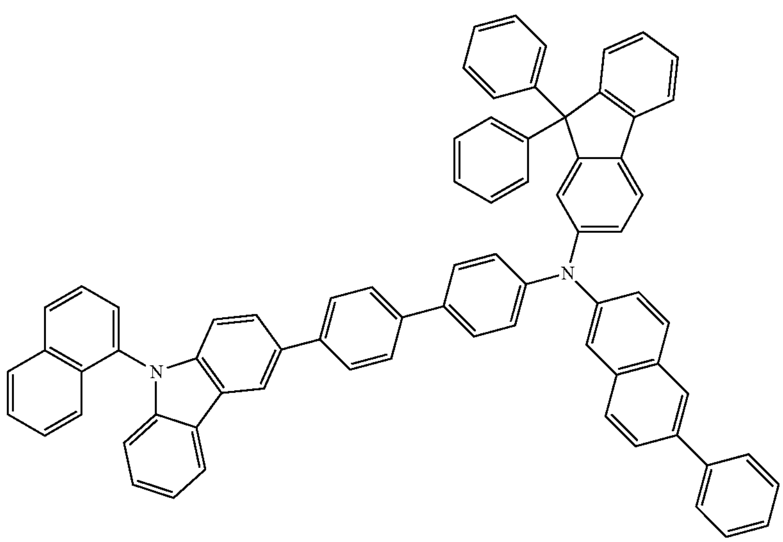

-continued
5-39
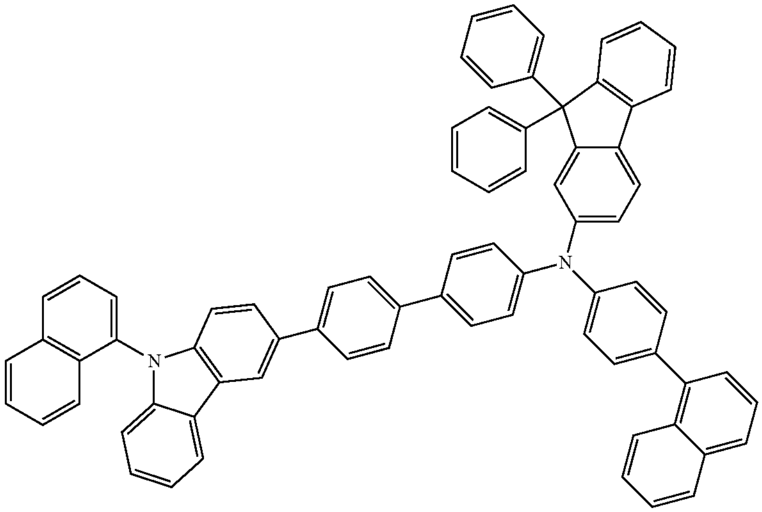
5-40
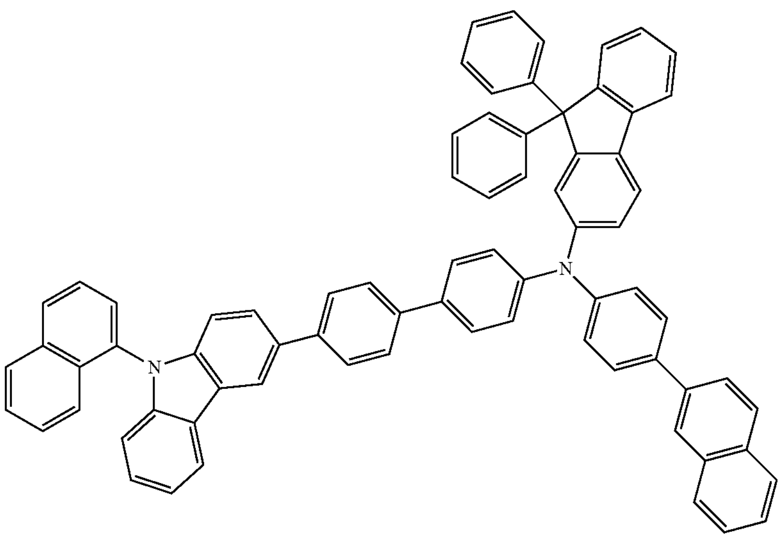
5-41
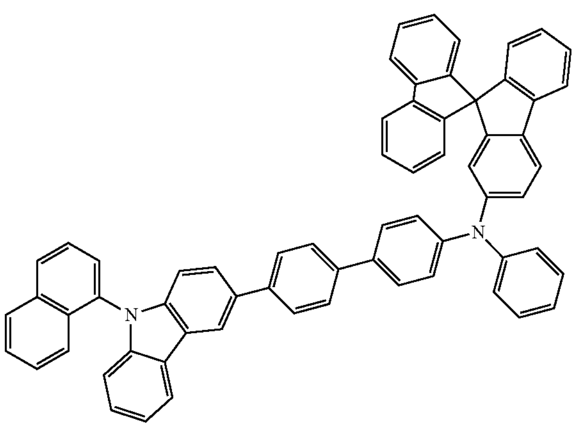
5-42
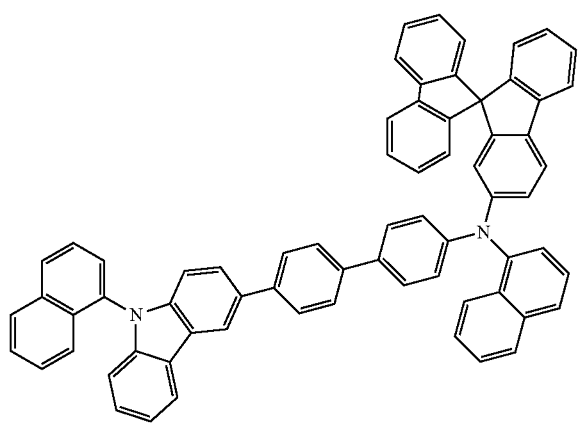

-continued
5-43
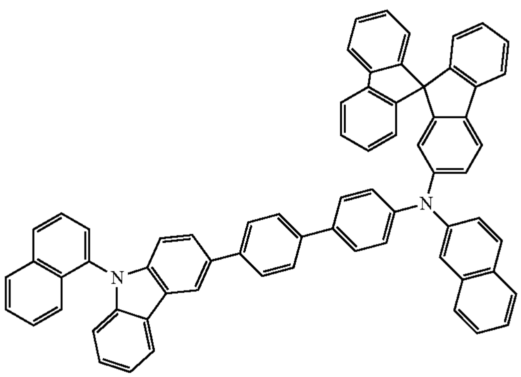
5-44
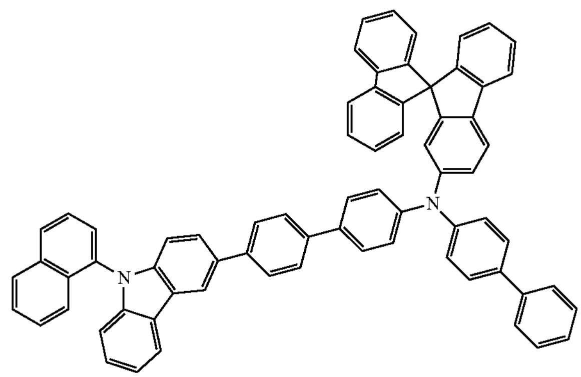
5-45
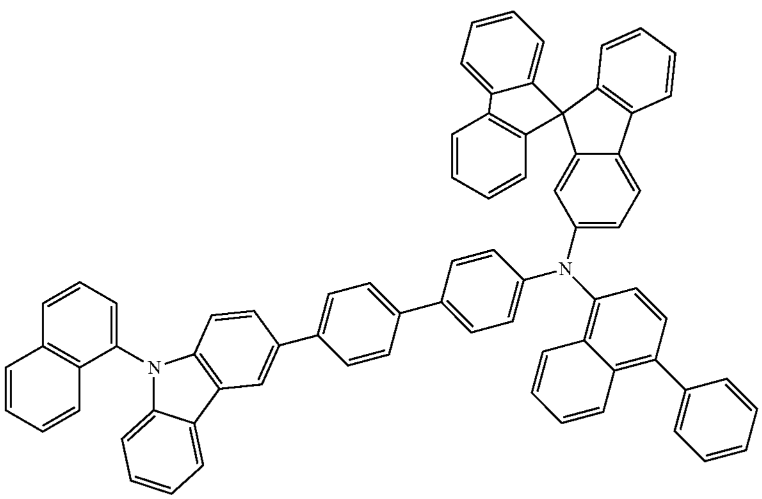
5-46
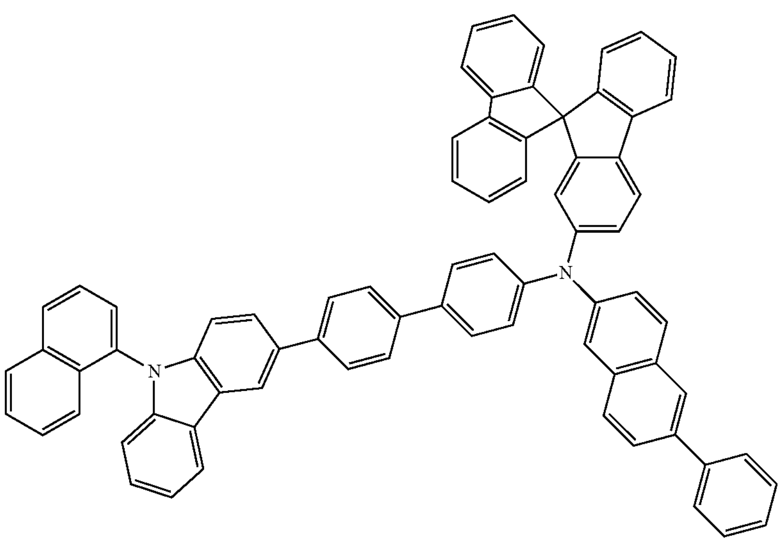

-continued
5-47
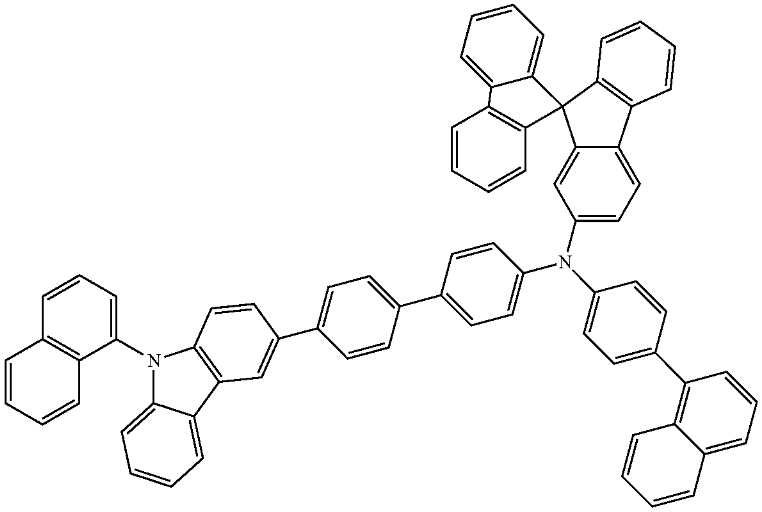
5-48
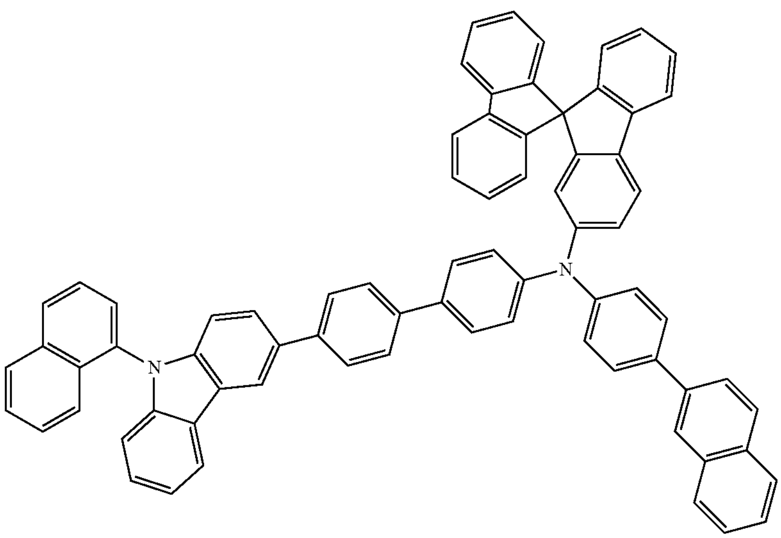
5-49
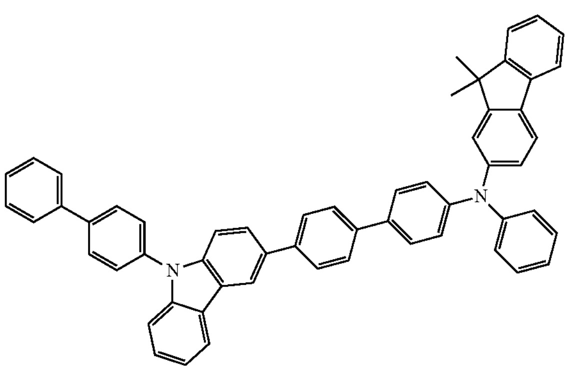
5-50
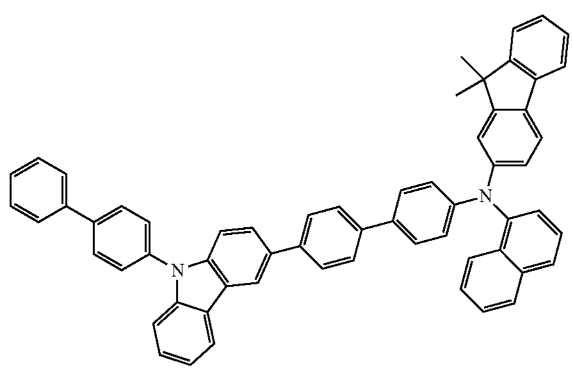

-continued
5-51
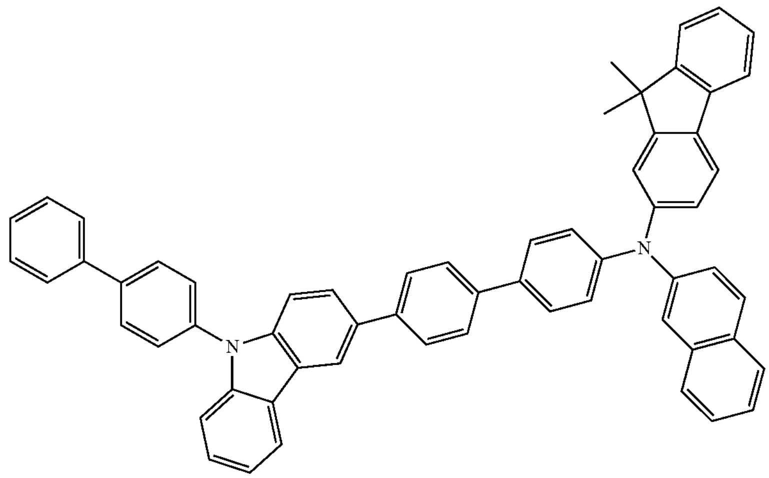
5-52
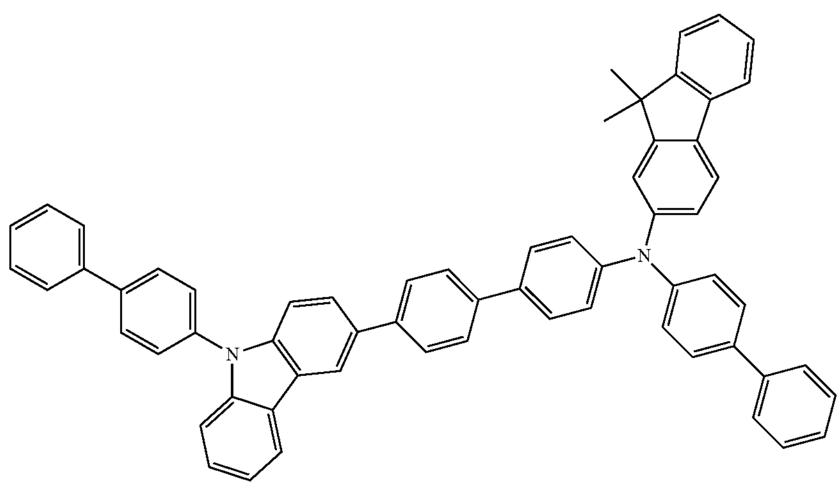
5-53
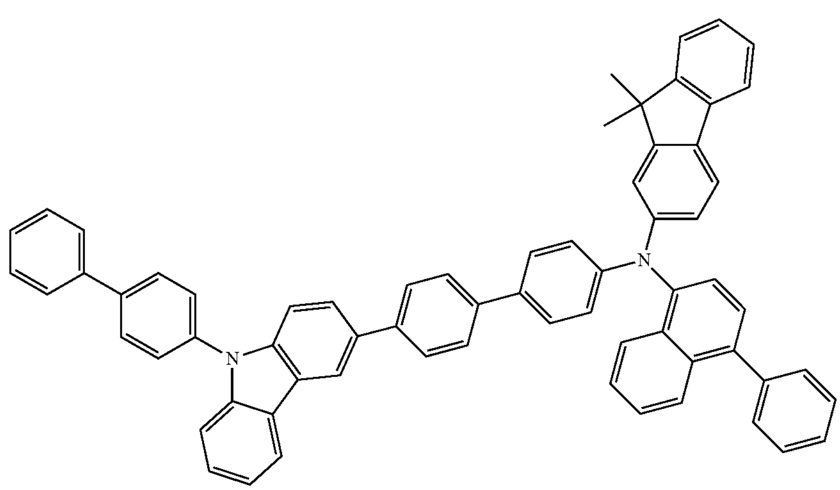

-continued
5-54
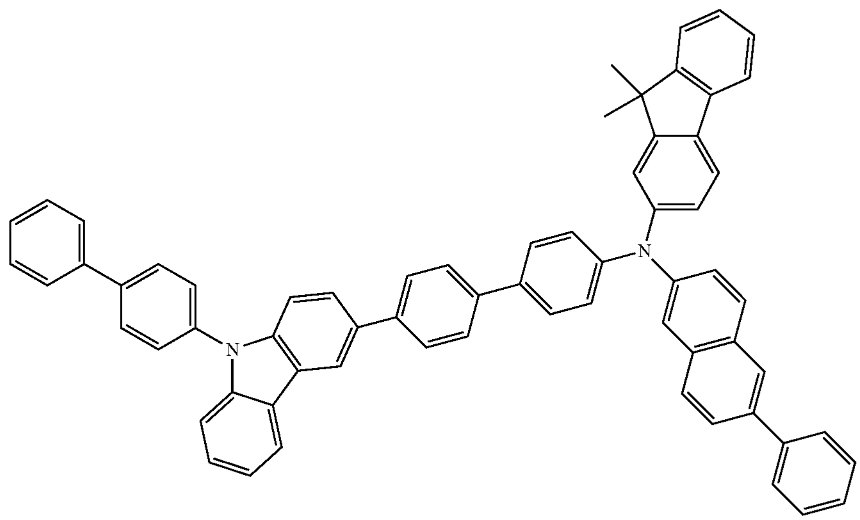
5-55
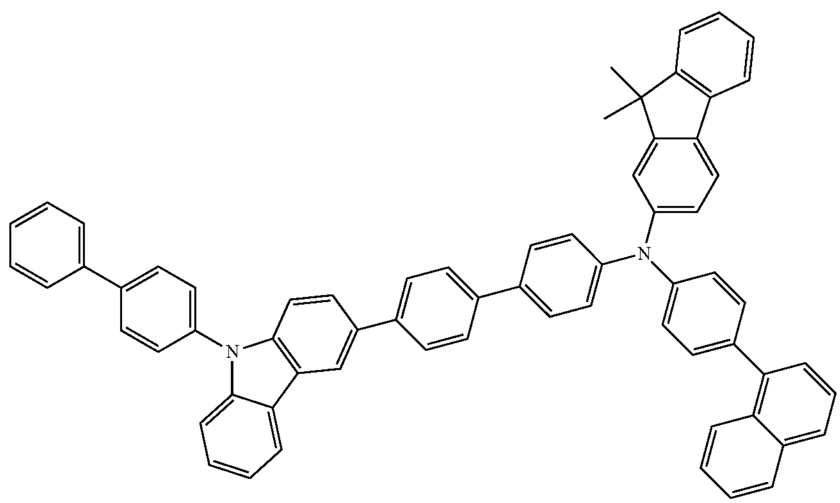
5-56
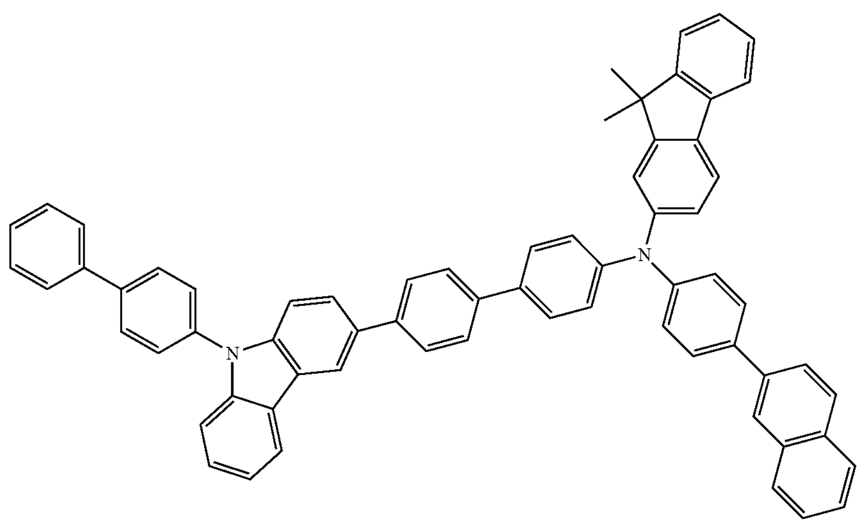

-continued
5-57
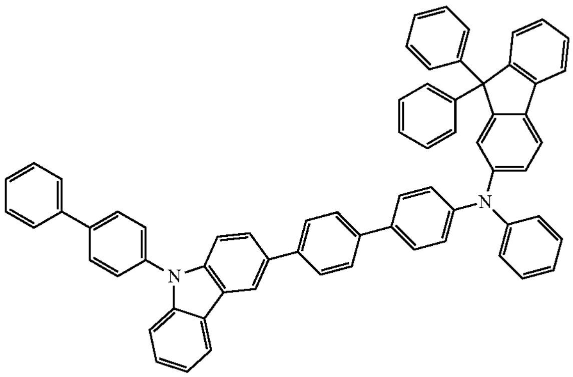
5-58
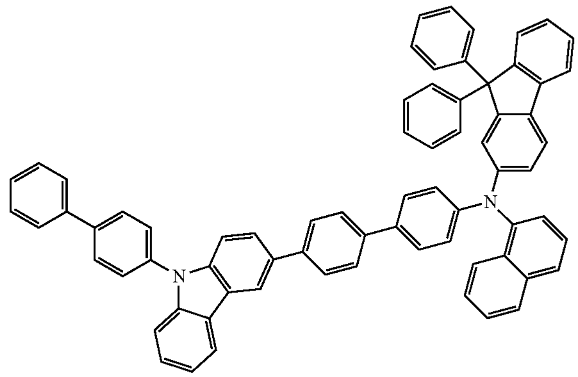
5-59
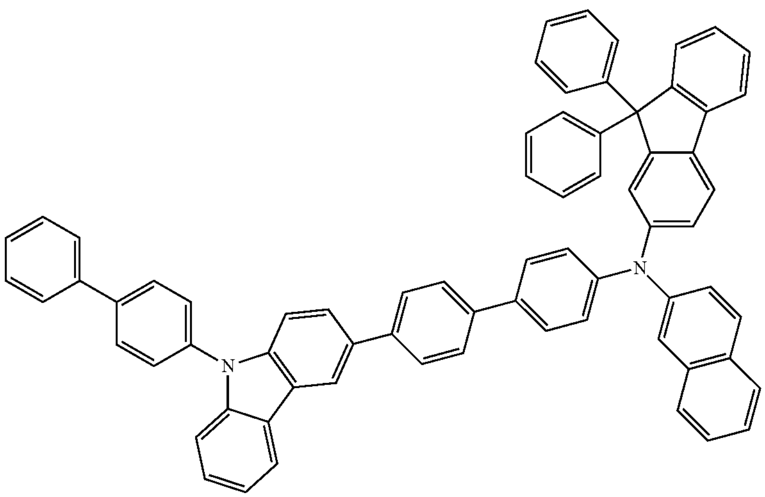
5-60
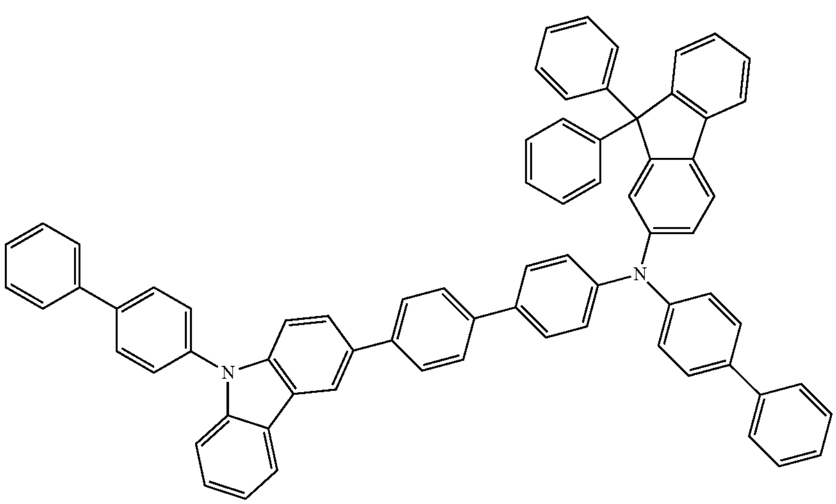

-continued
5-61
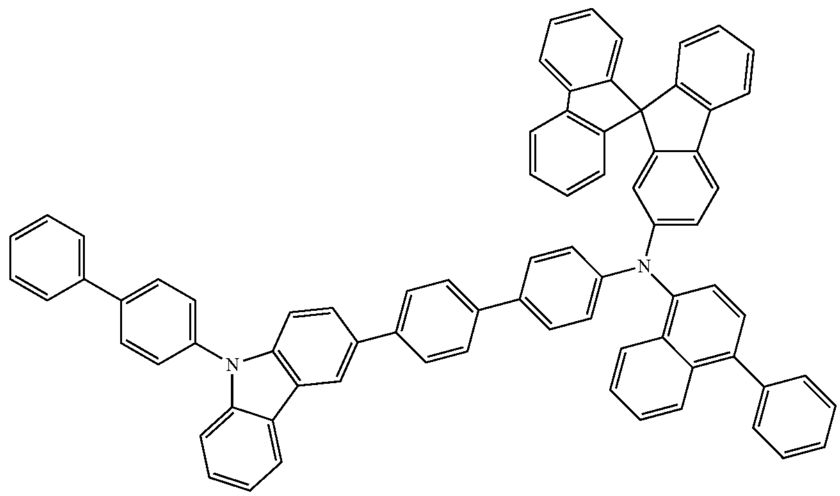
5-62
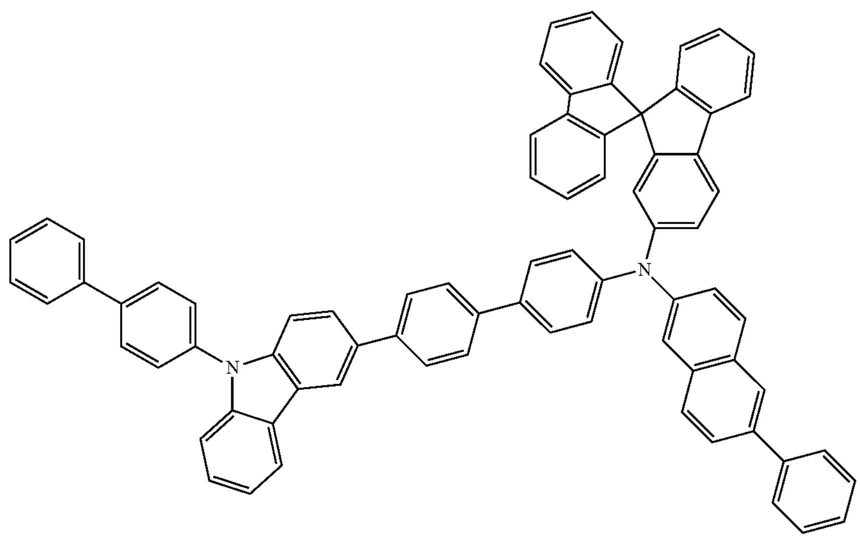
5-63
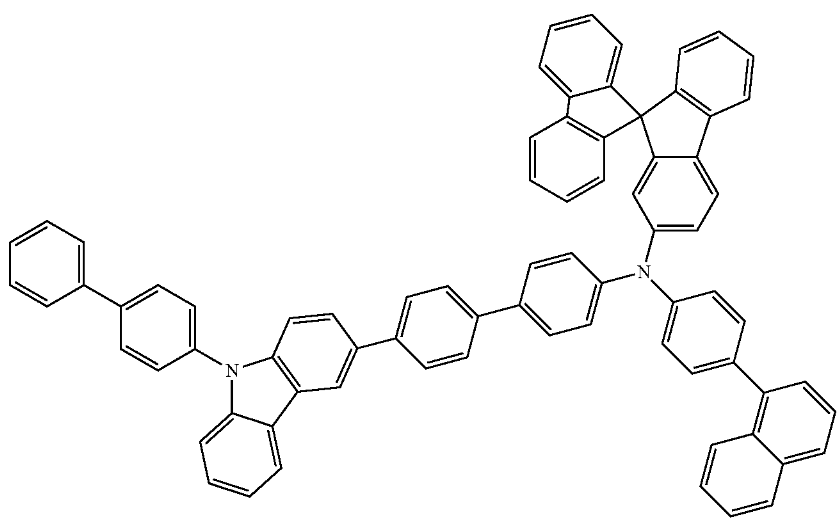

-continued
5-64
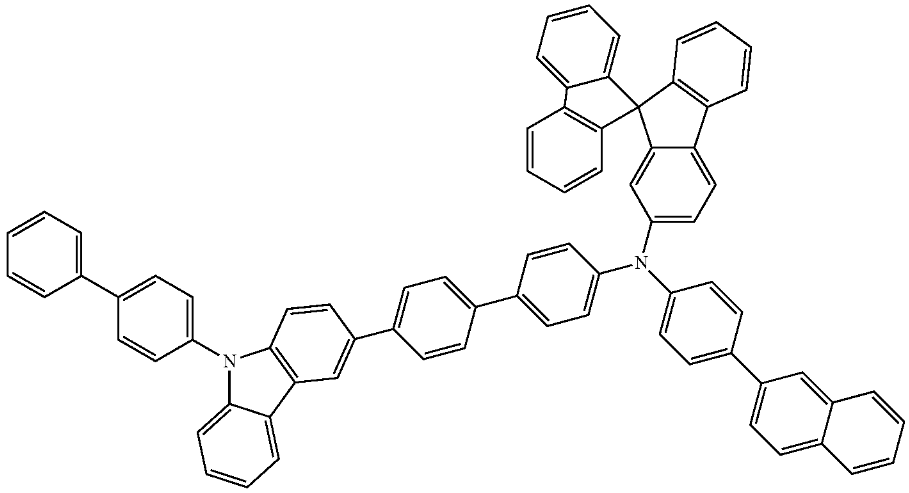
5-65
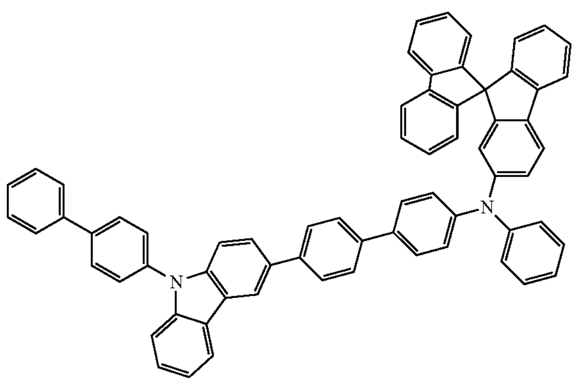
5-66
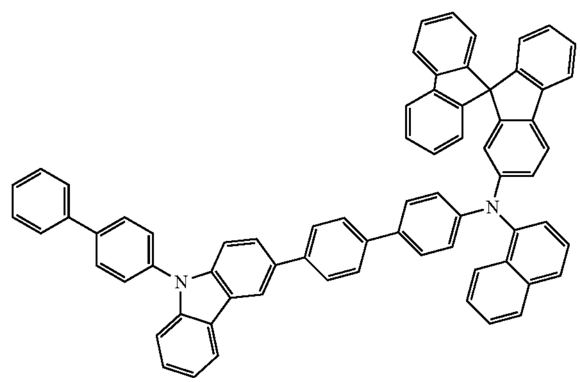
5-67
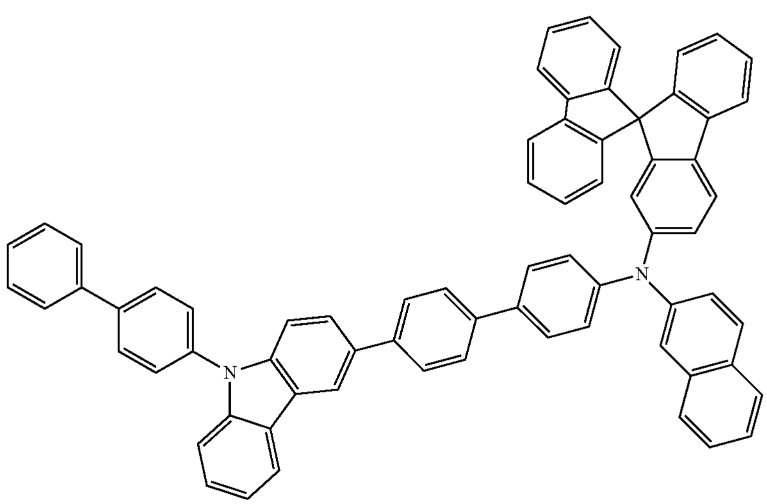

-continued
5-68
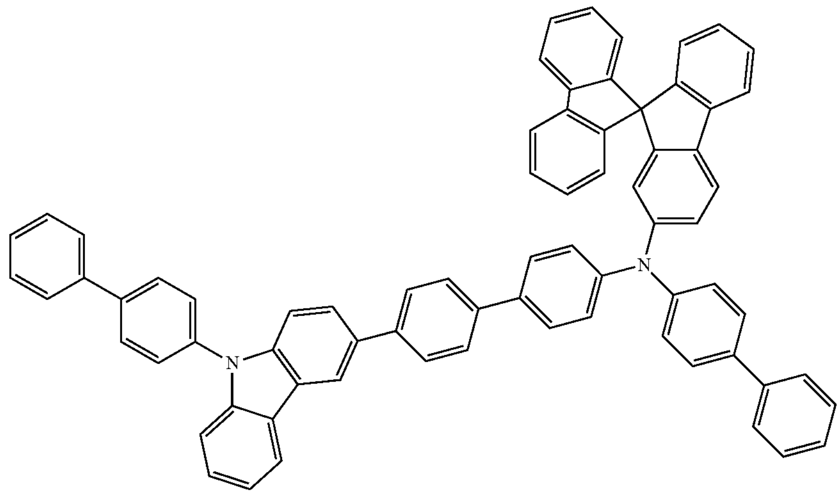
5-69
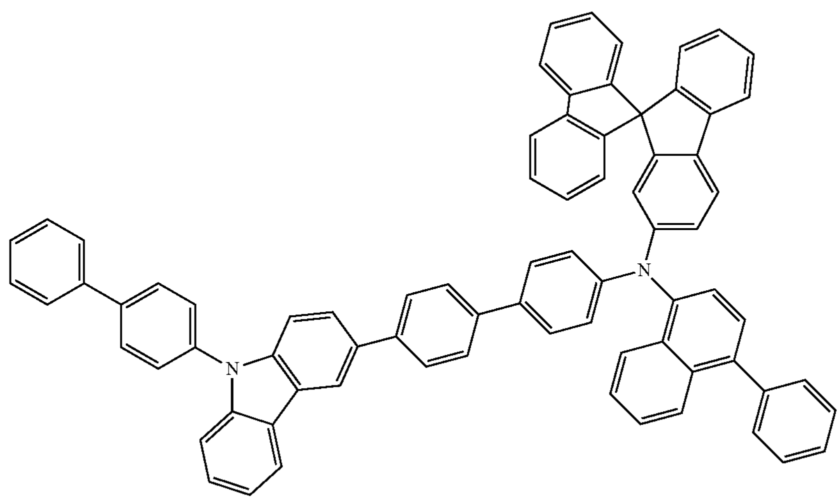
5-70
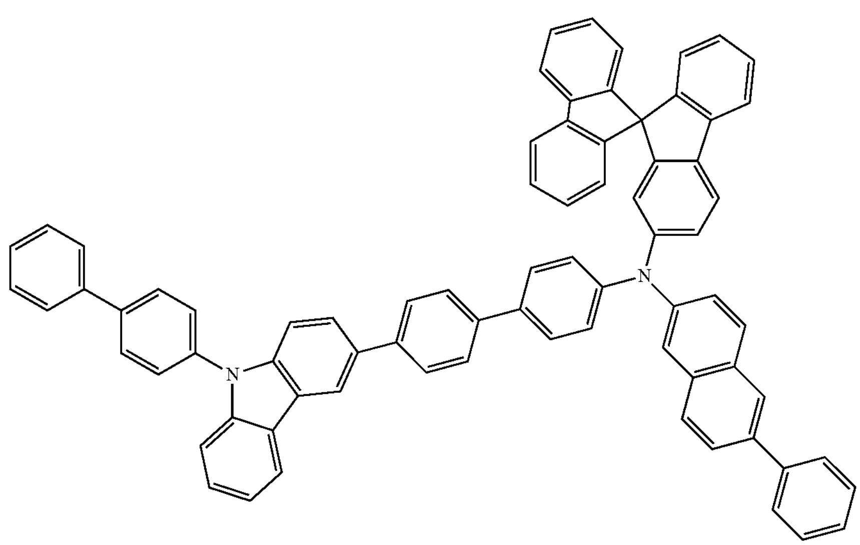

-continued
5-71
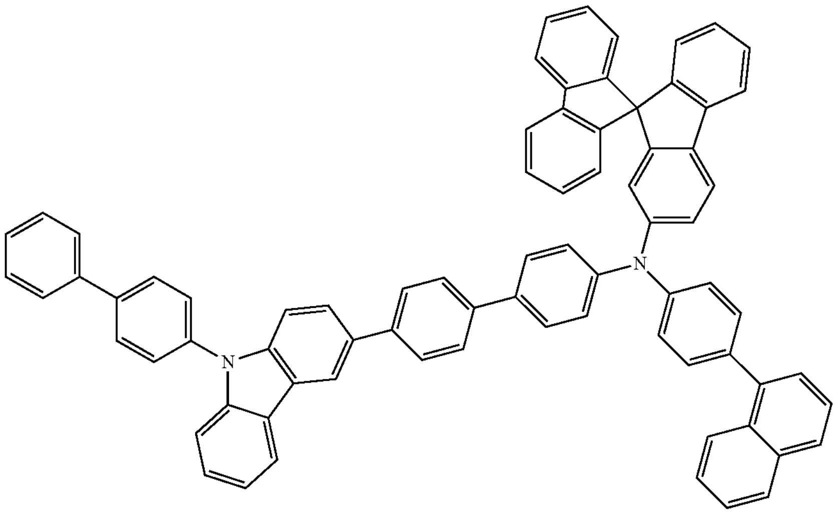
5-72
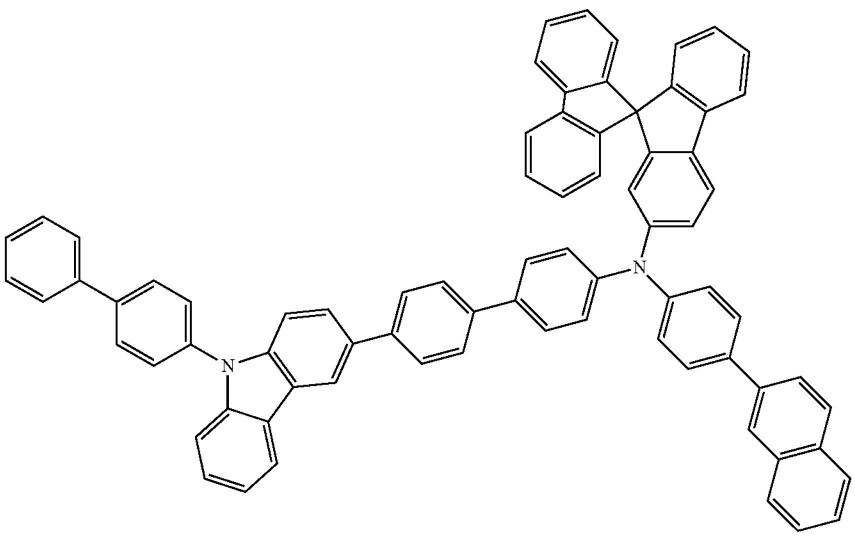
5-73
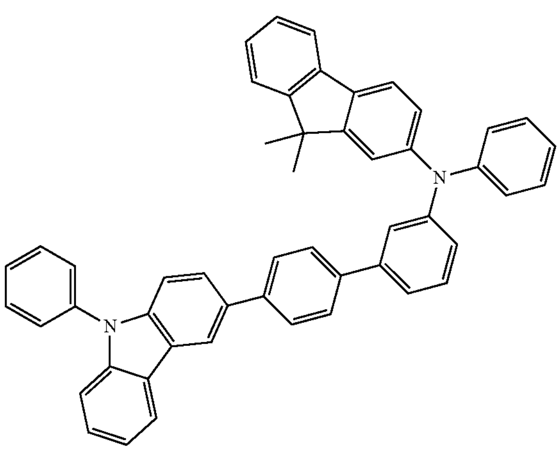
5-74
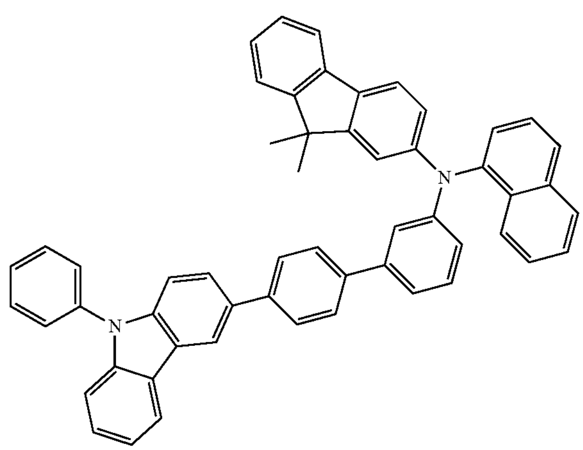

-continued
5-75
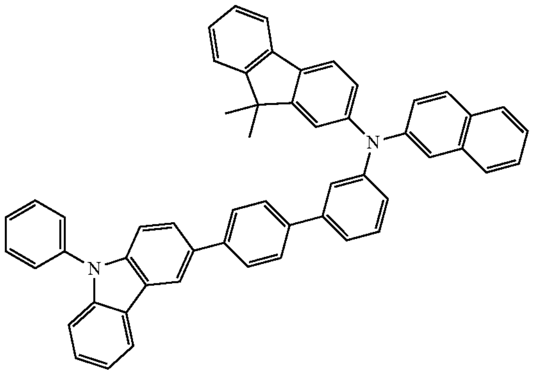
5-76
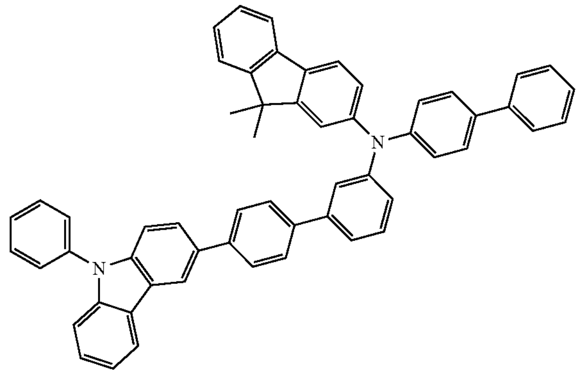
5-77
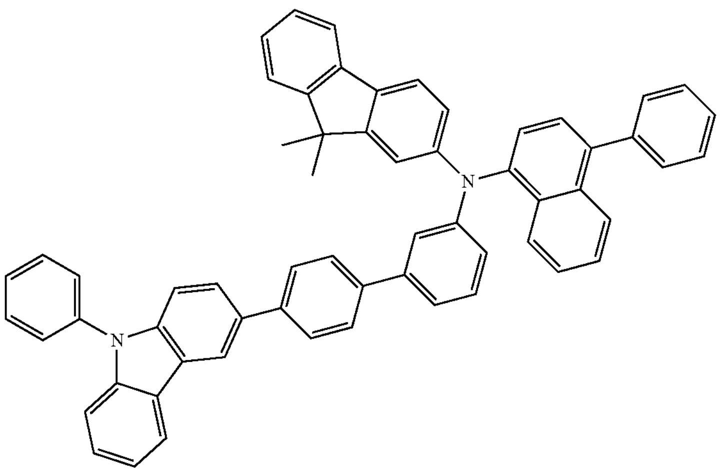
5-78
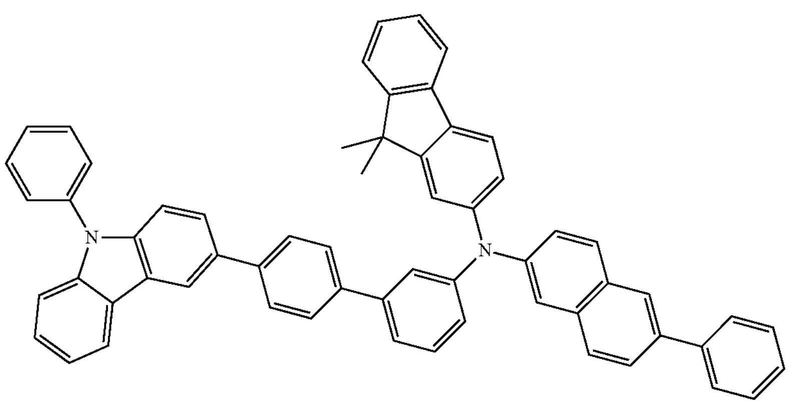

-continued
5-79
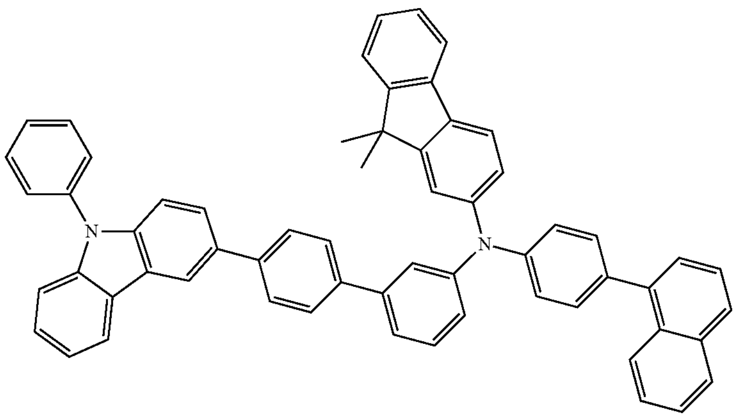
5-80
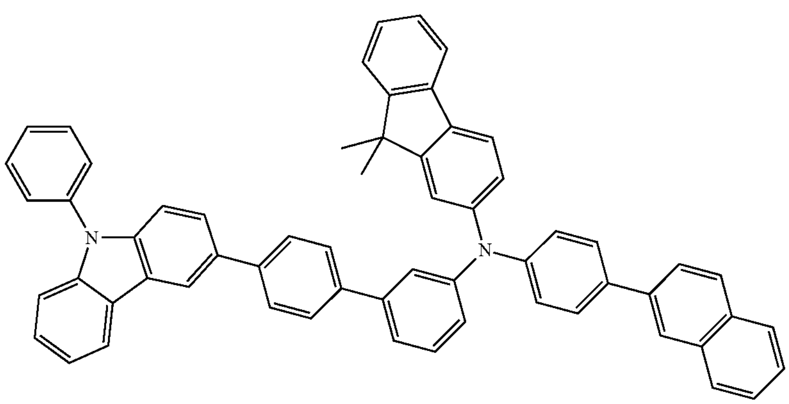
5-81
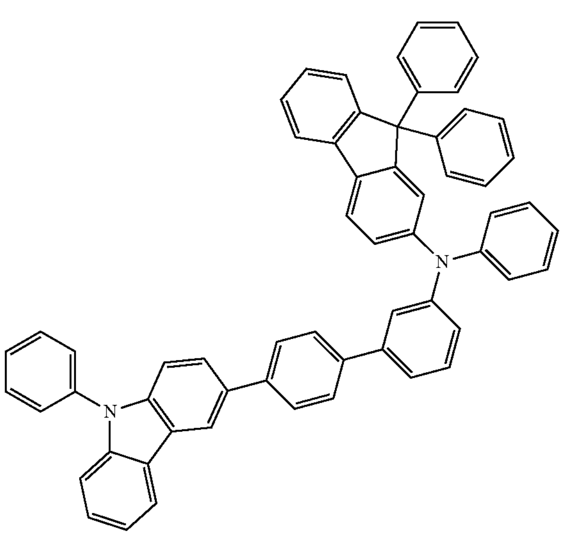
5-82
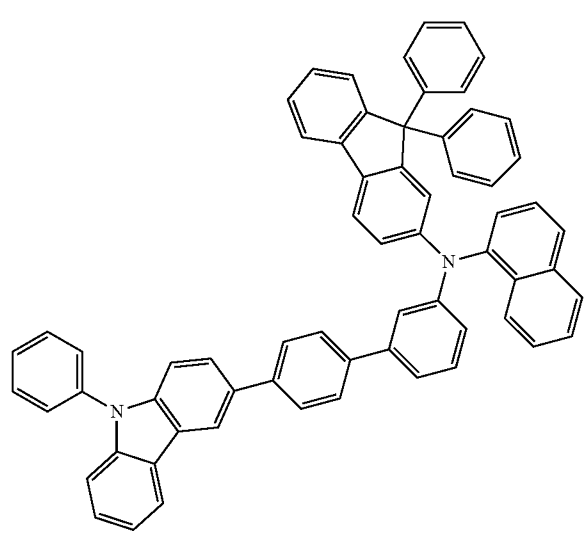

-continued
5-83
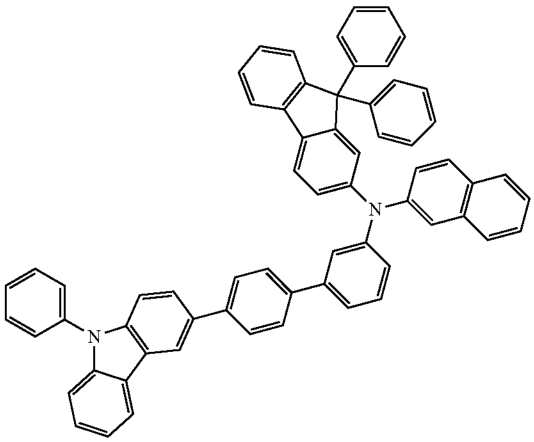
5-84
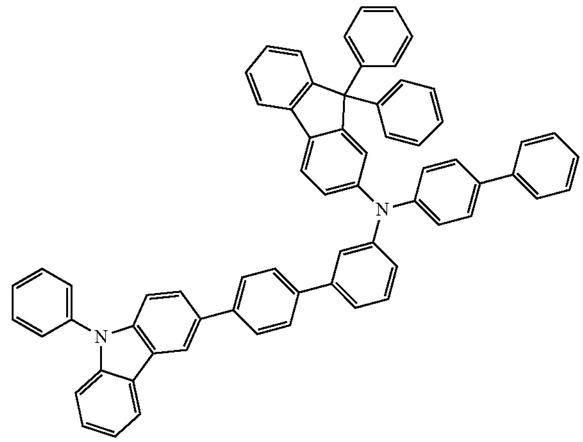
5-85
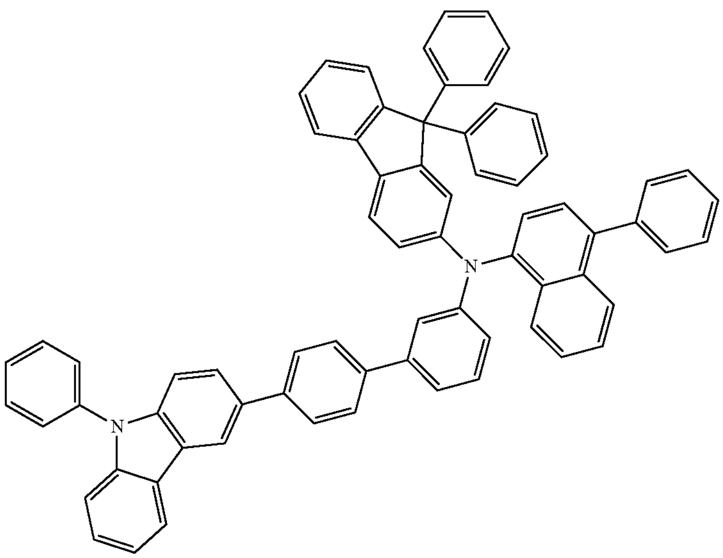
5-86
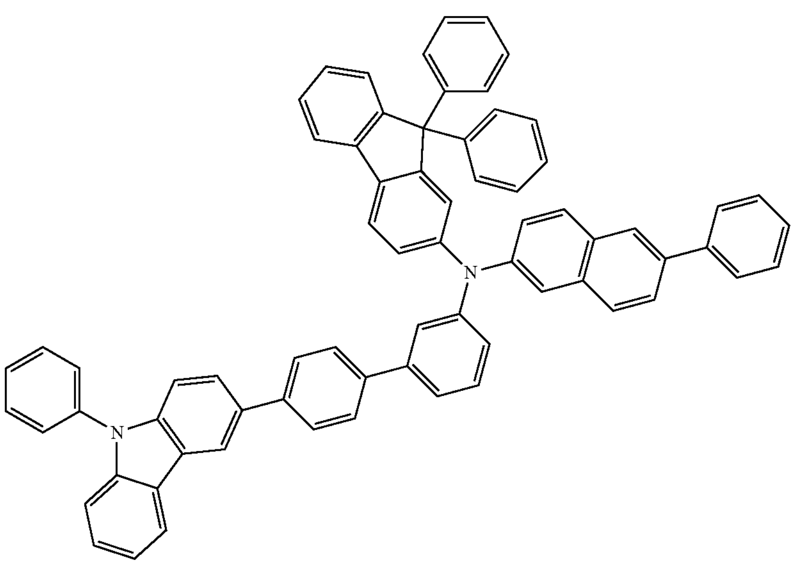

-continued
5-87
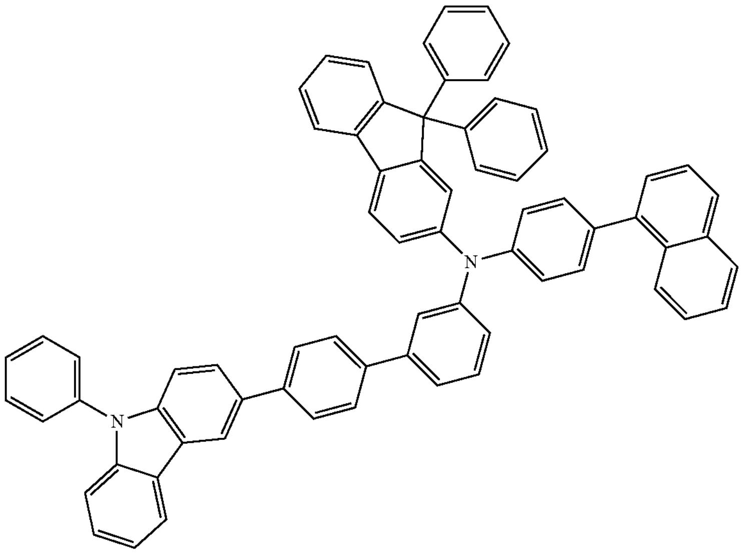
5-88
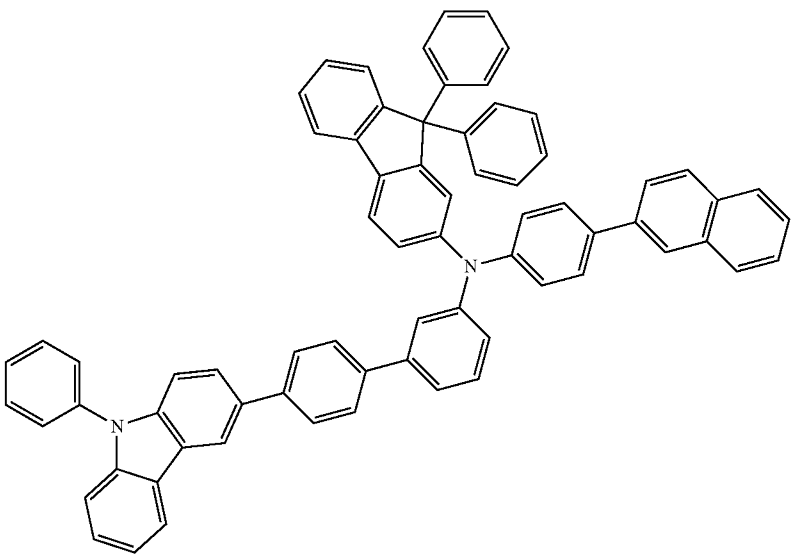
5-89
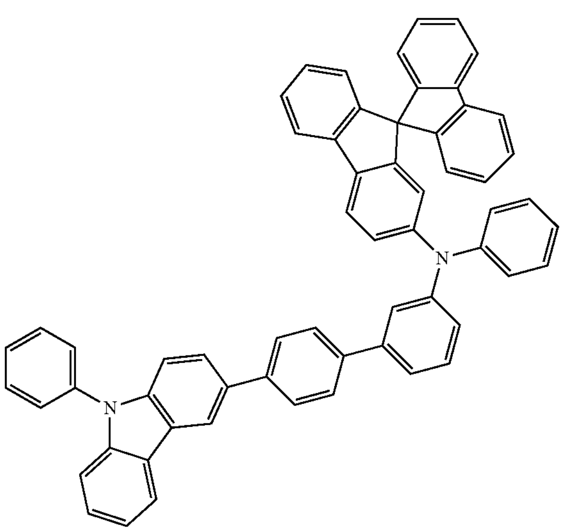
5-90
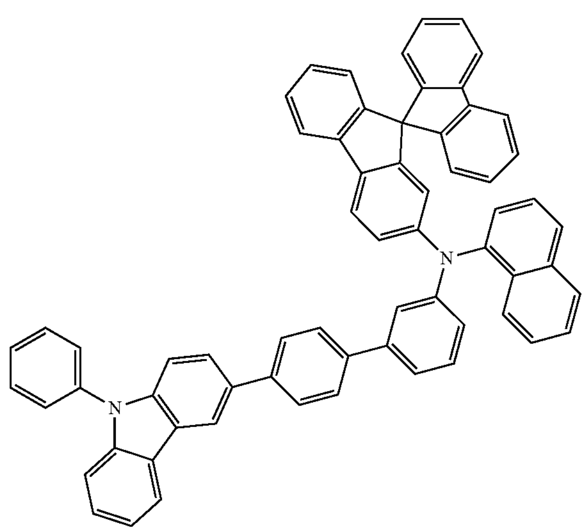

-continued
5-91
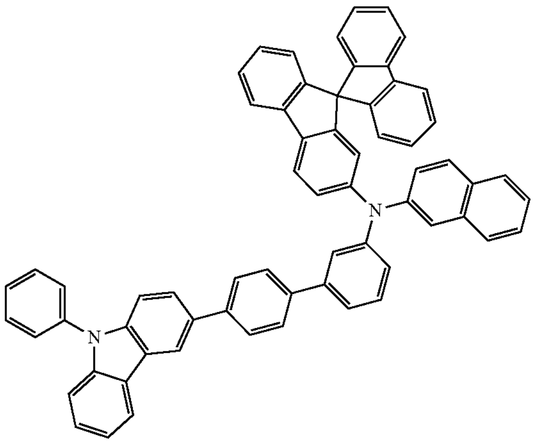
5-92
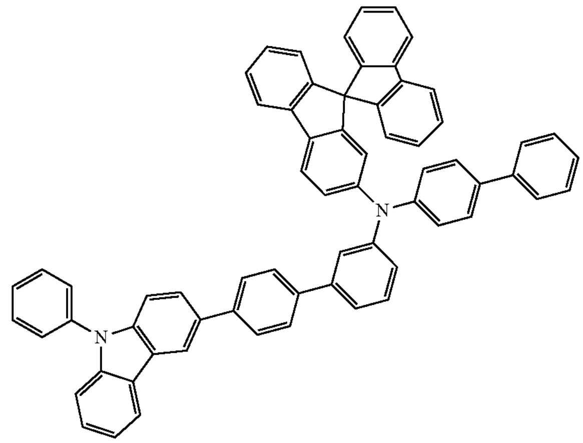
5-93
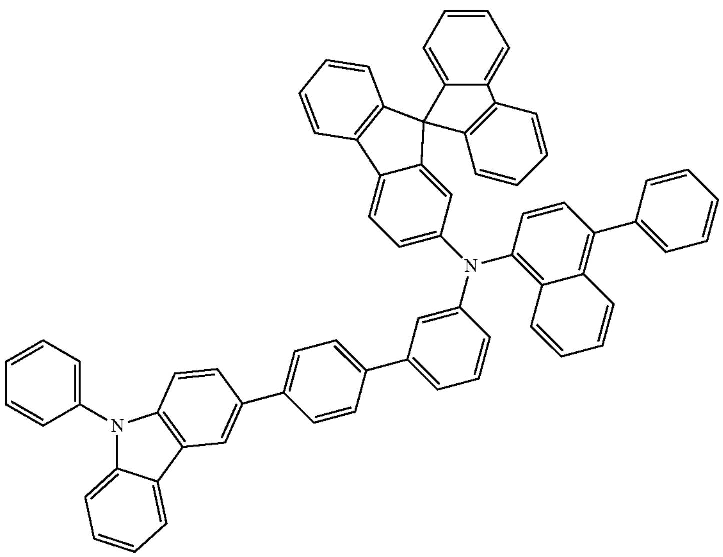
5-94
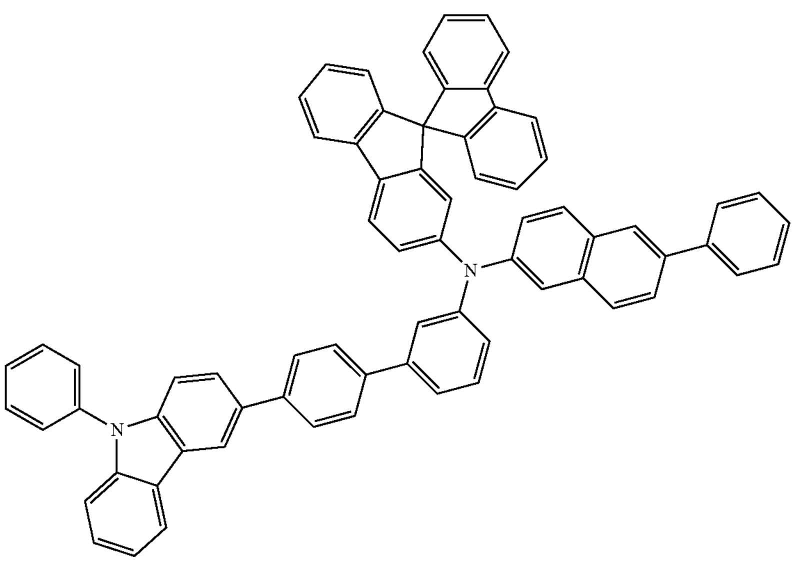

-continued
5-95
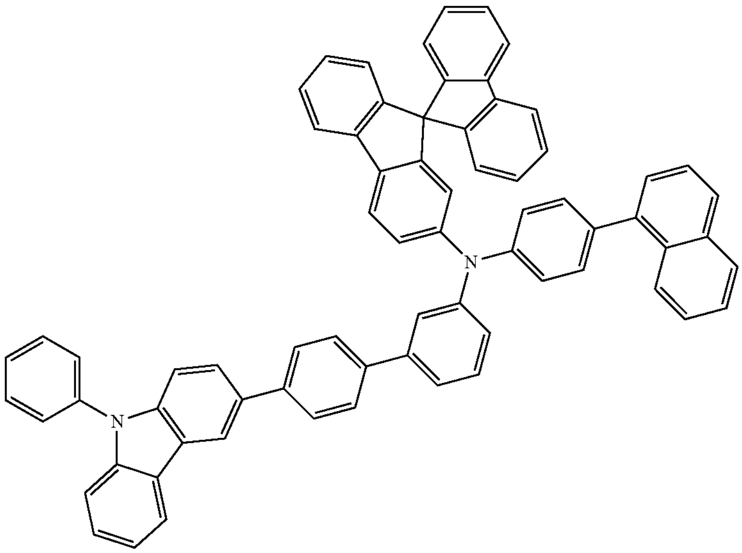
5-96
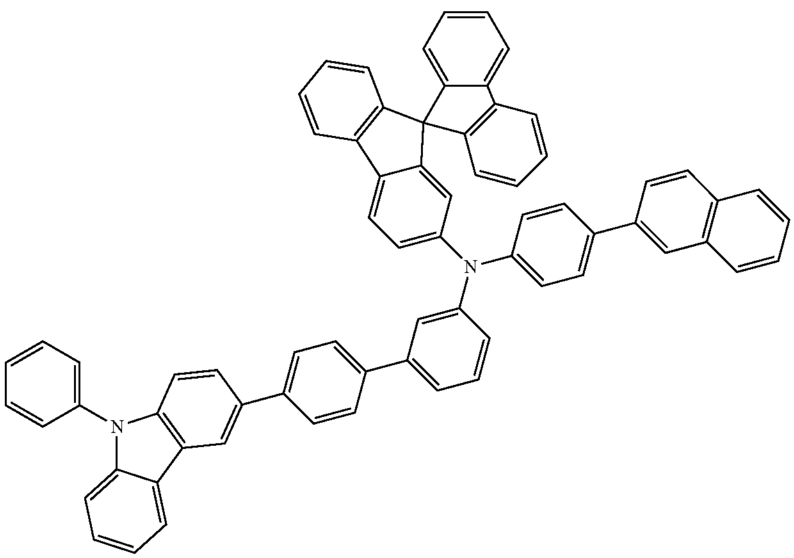
5-97
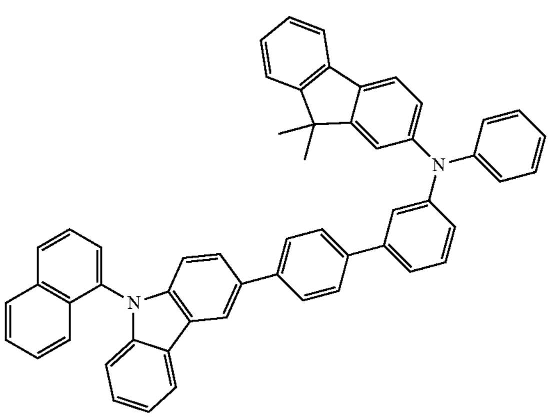
5-98
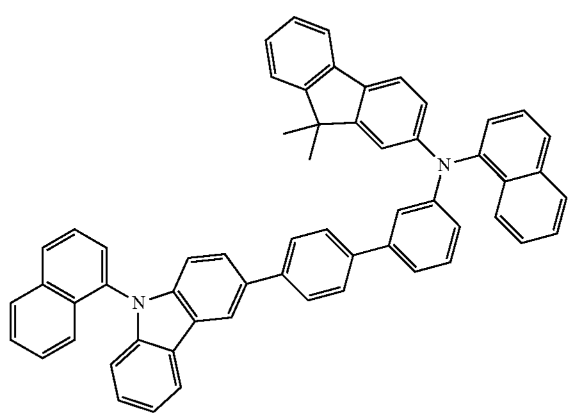

-continued
5-99
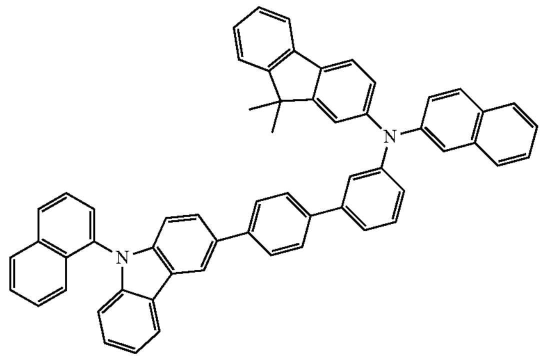
5-100
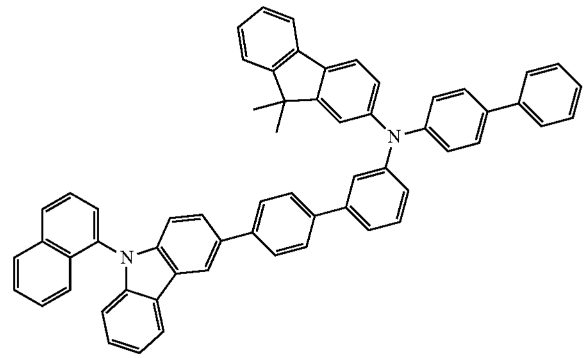
5-101
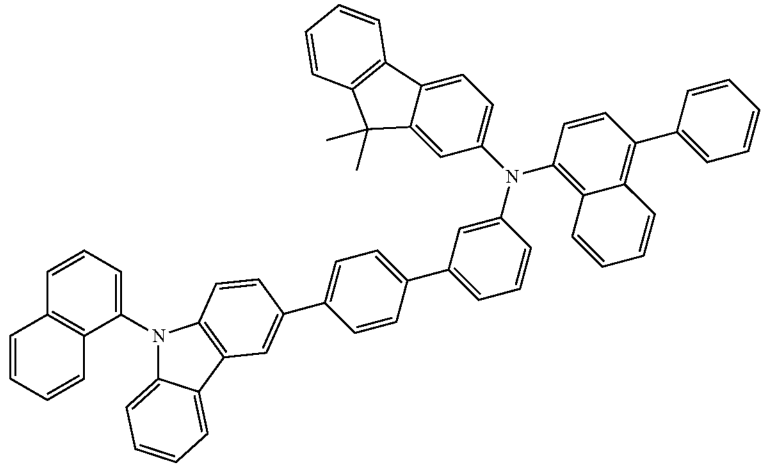
5-102
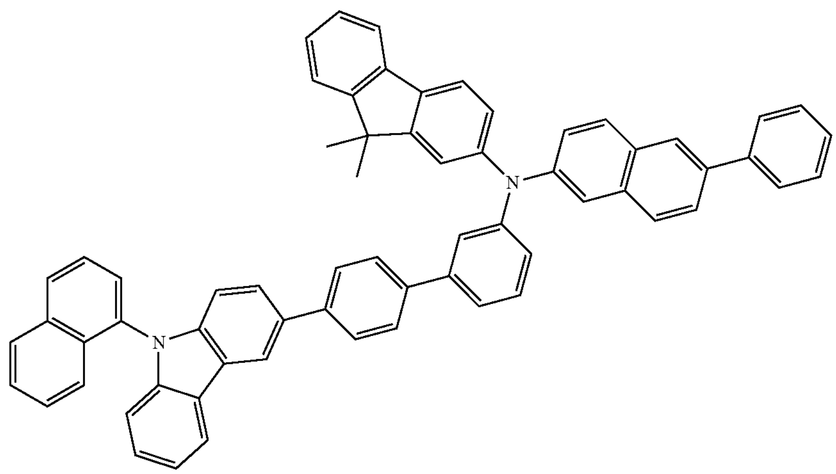

-continued
5-103
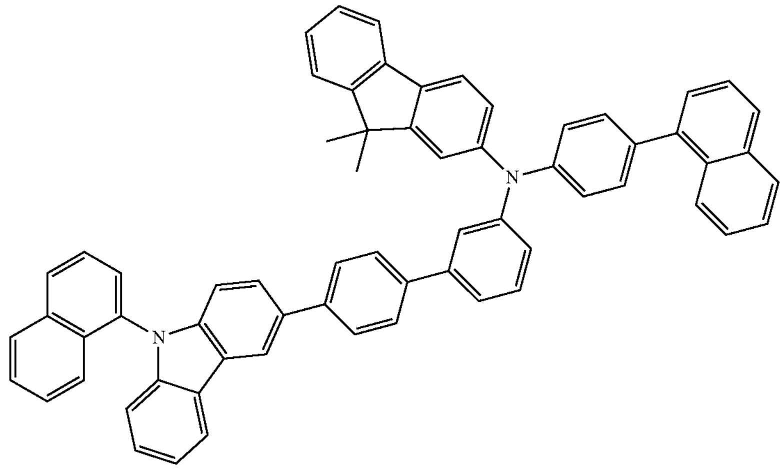
5-104
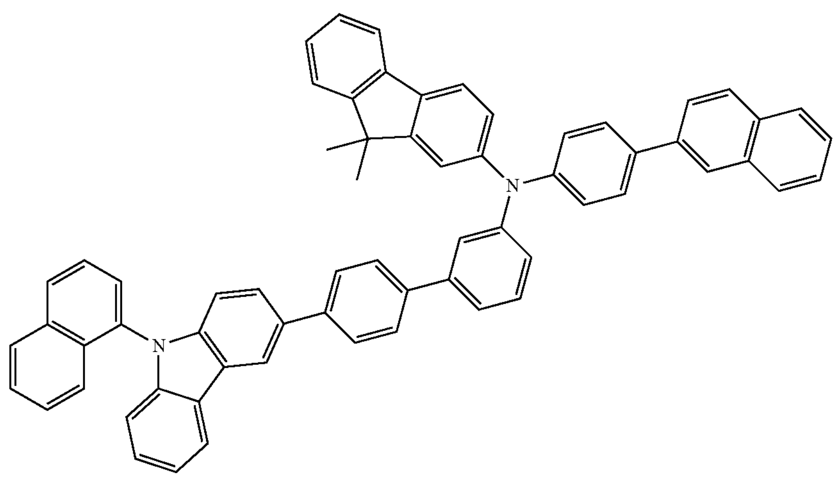
5-105
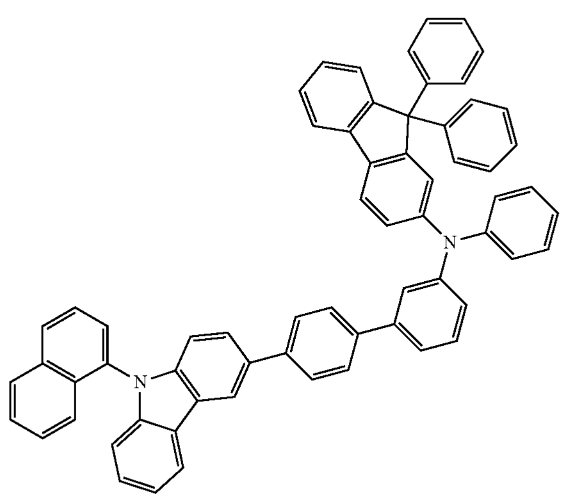
5-106
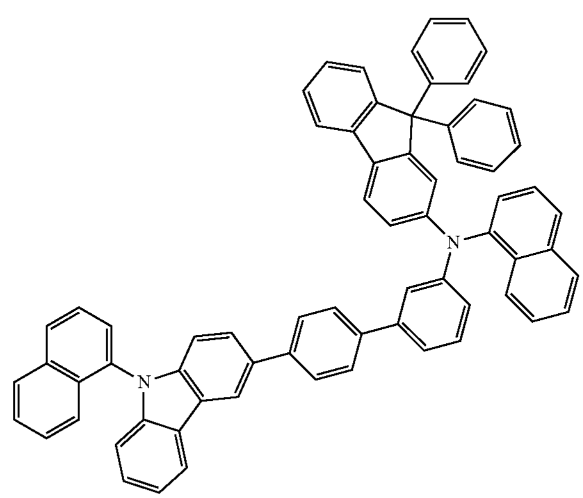

-continued
5-107
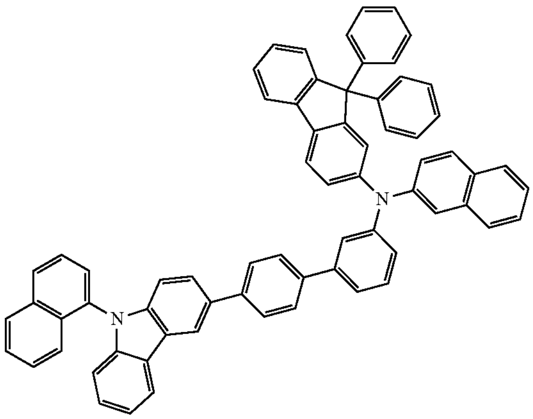
5-108
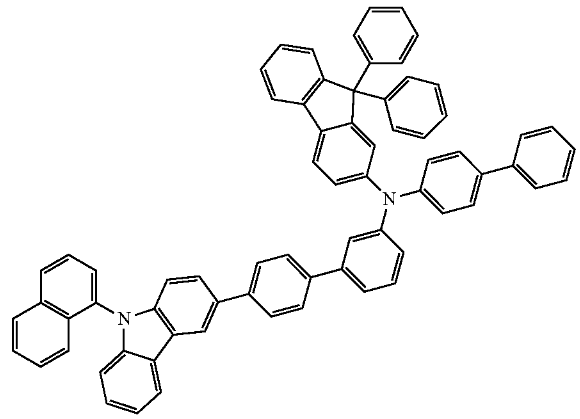
5-109
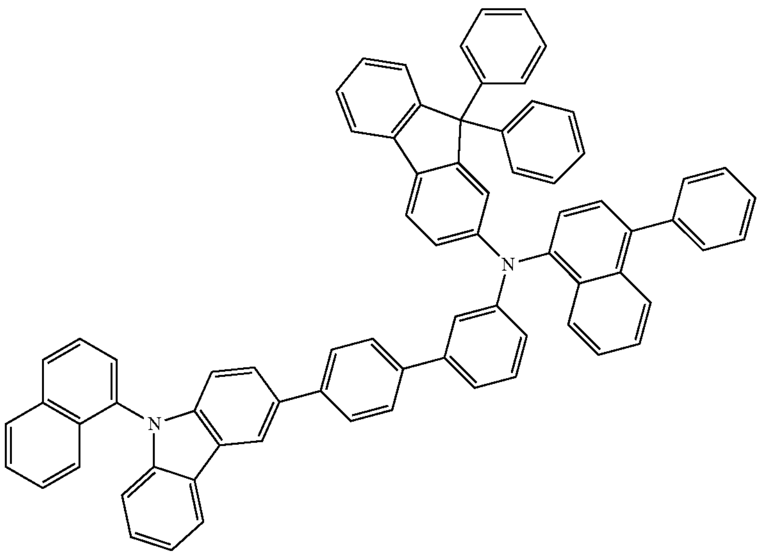
5-110
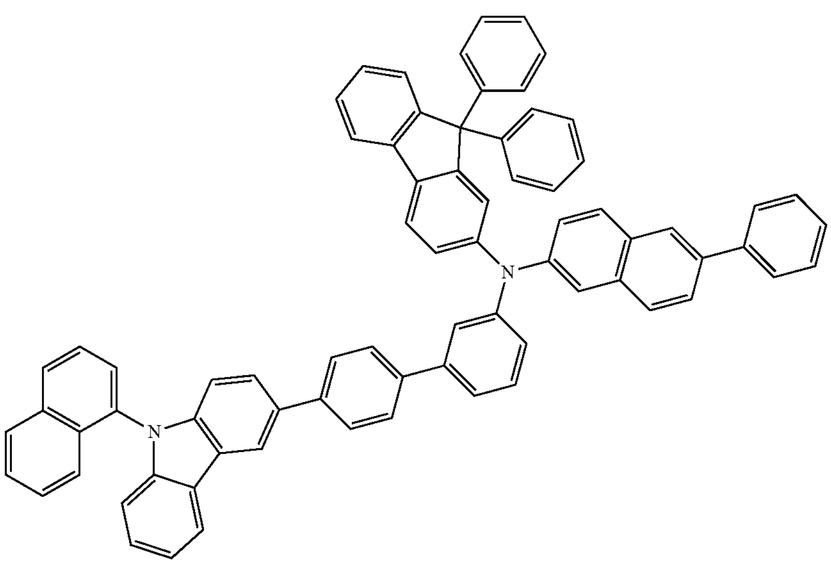

-continued
5-111
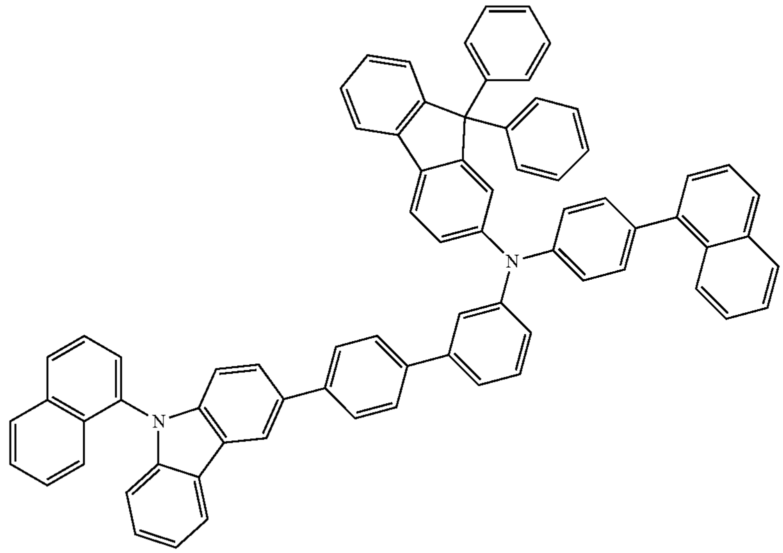
5-112
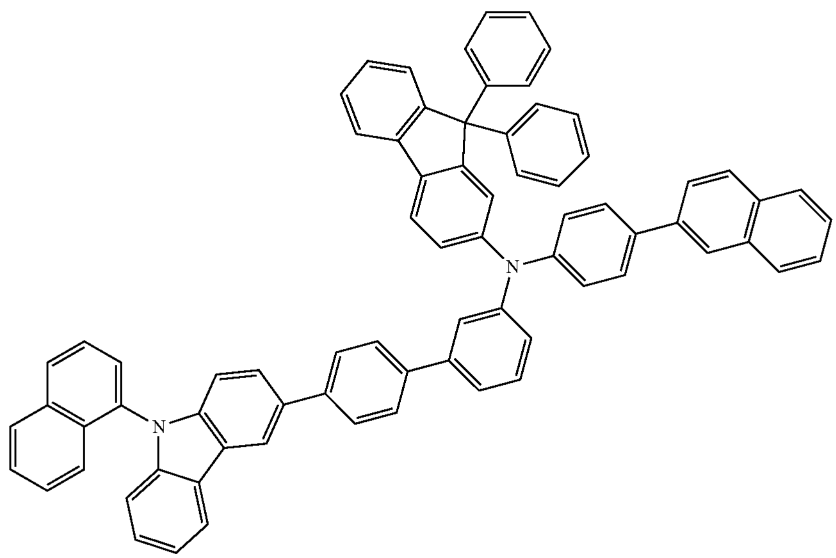
5-113
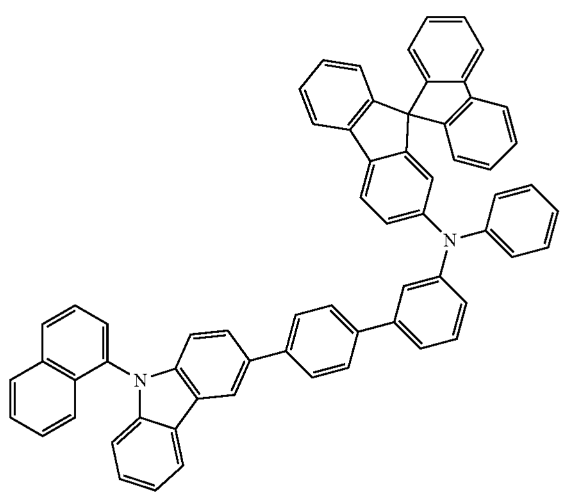
5-114
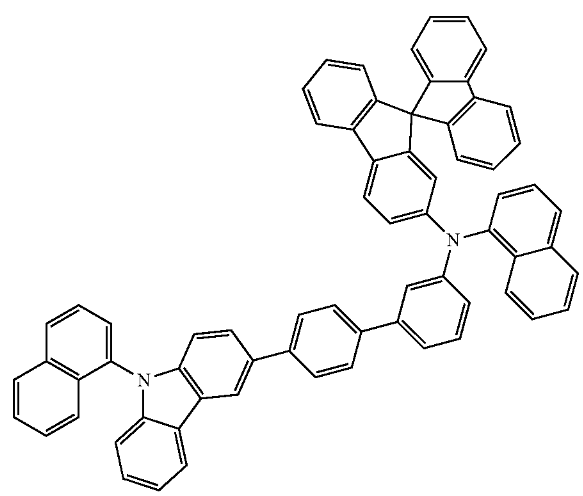

-continued
5-115
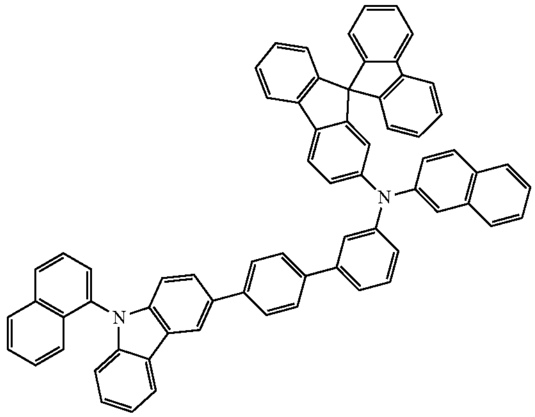
5-116
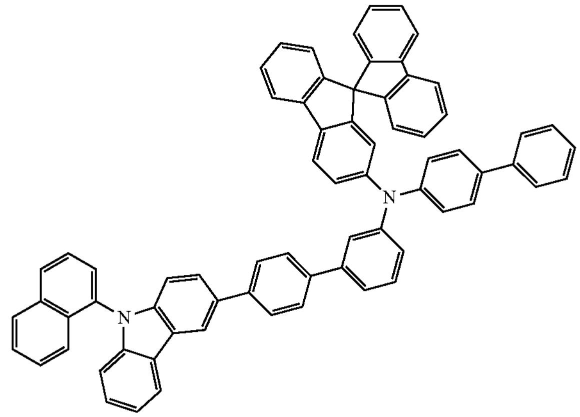
5-117
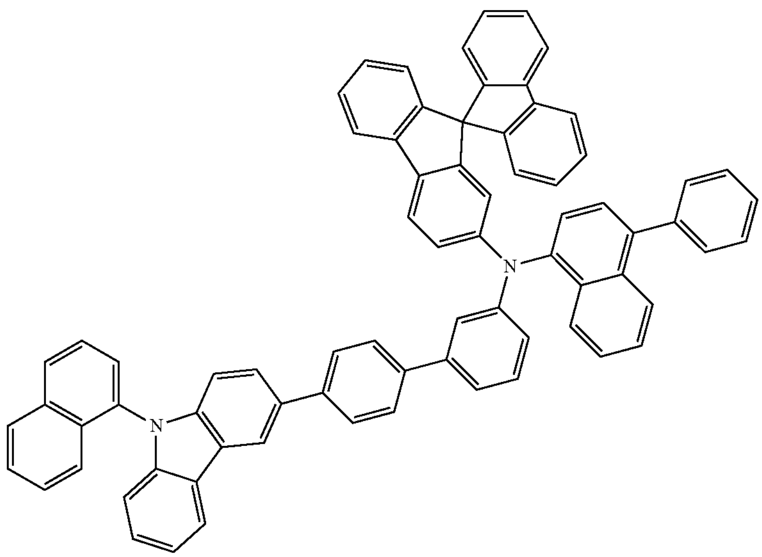
5-118
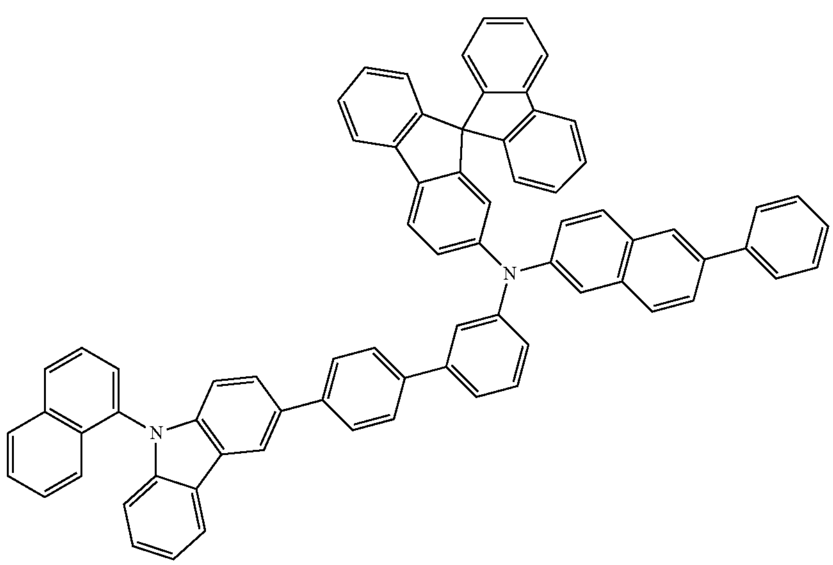

-continued
5-119
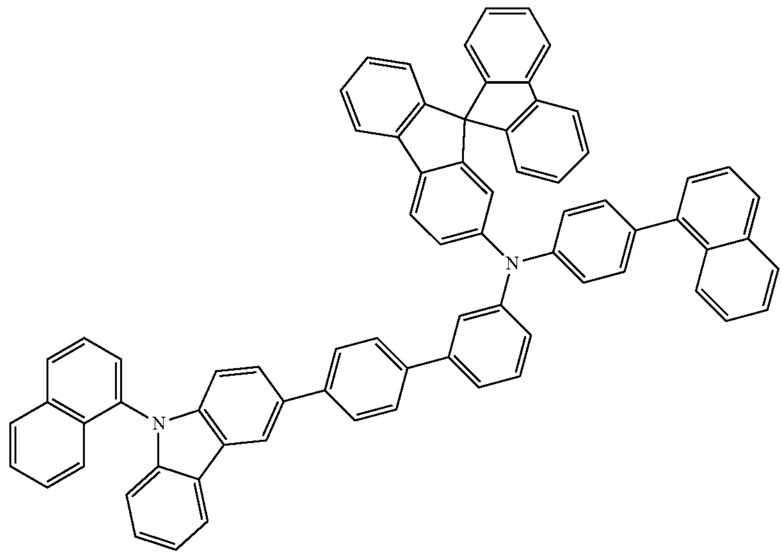
5-120
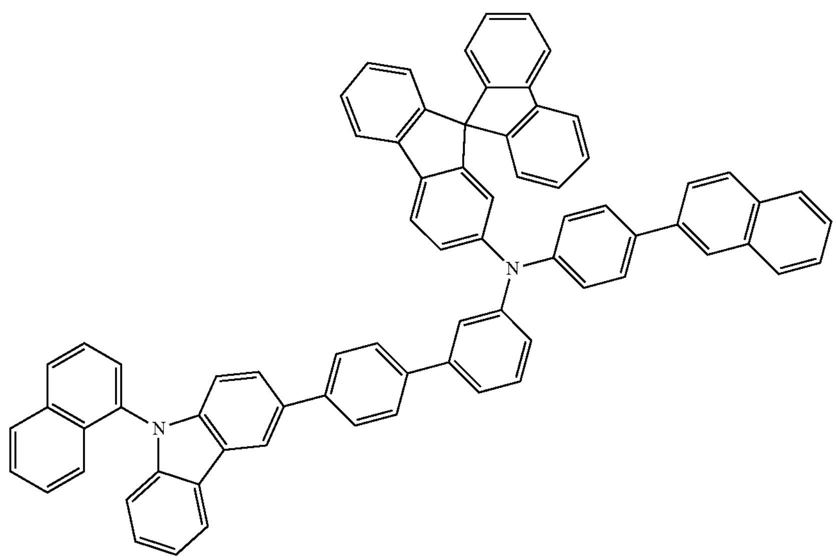
5-121
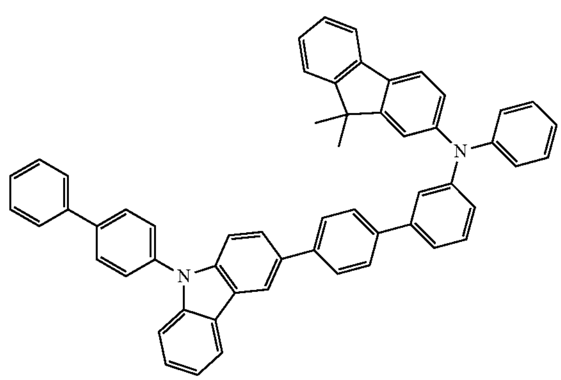
5-122
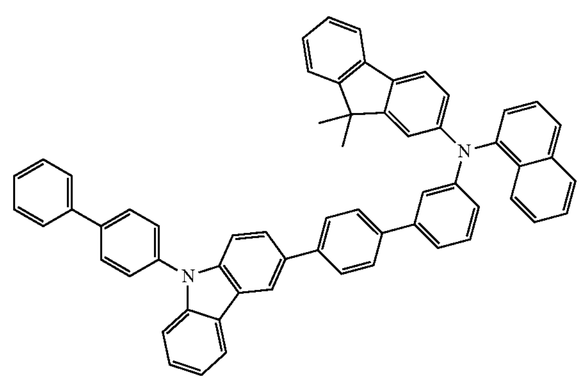

-continued
5-123
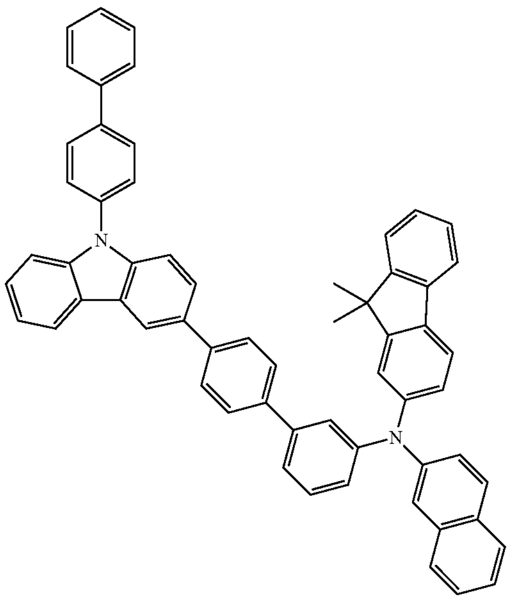
5-124
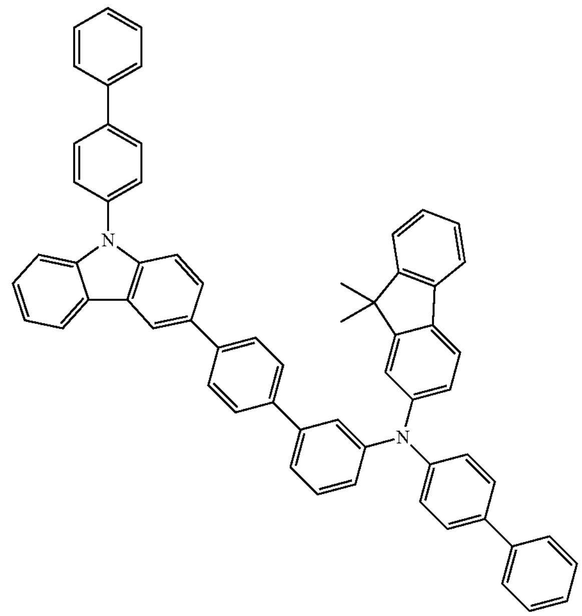
5-125
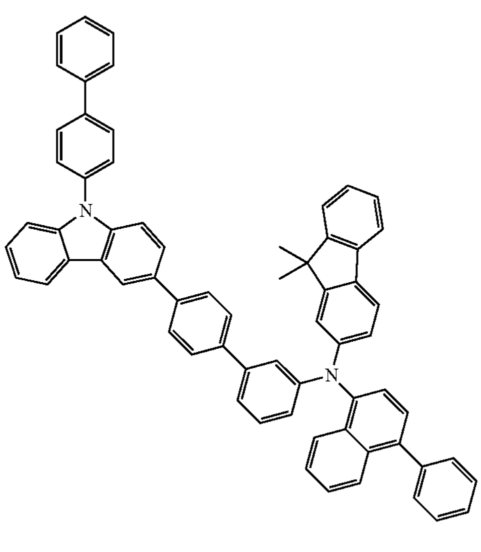
5-126
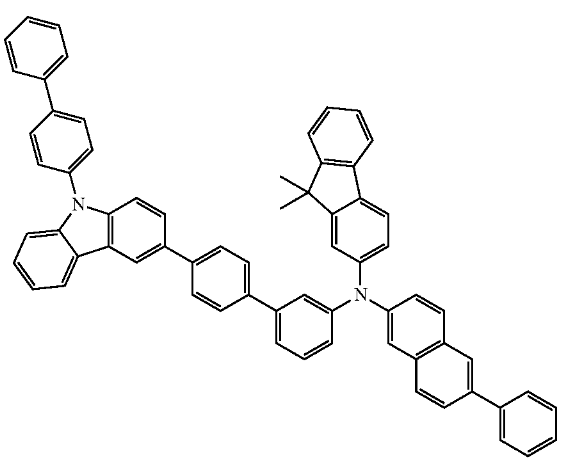

-continued
5-127
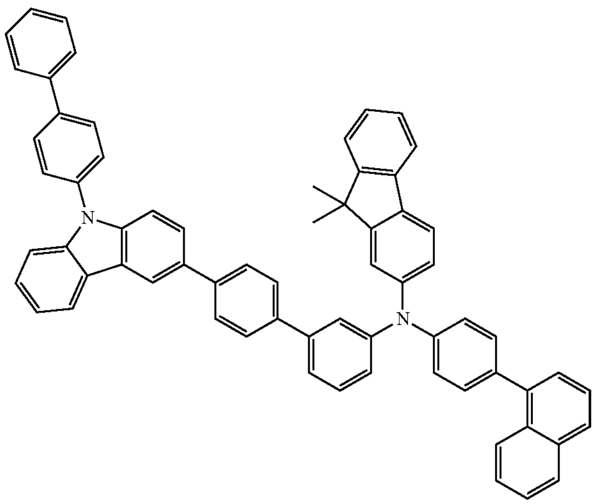
5-128
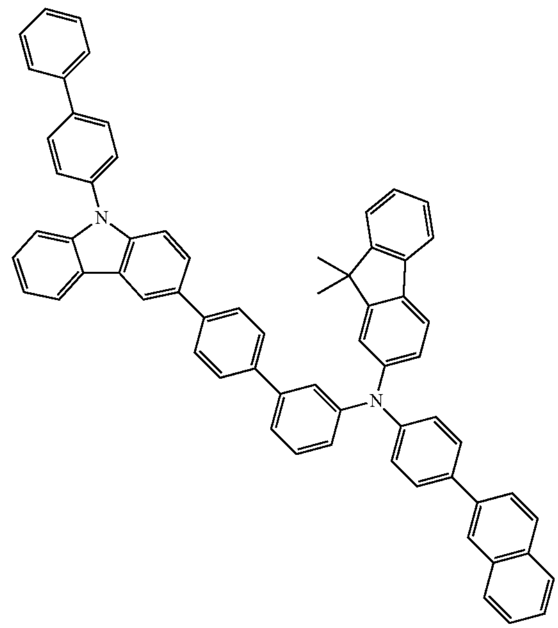
5-129
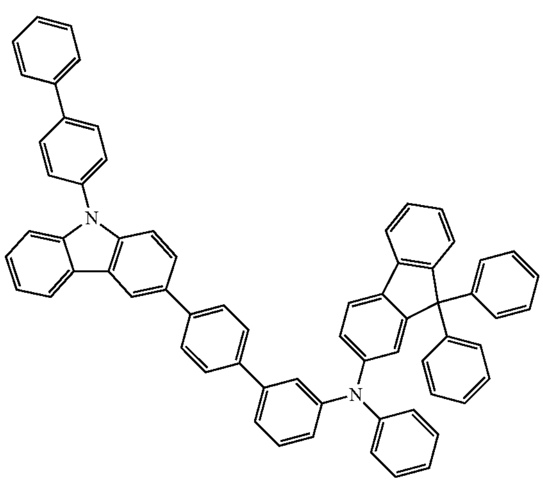
5-130
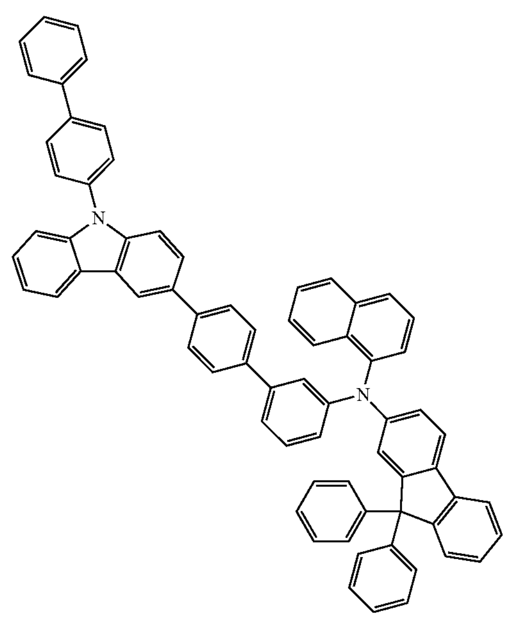

-continued
5-131
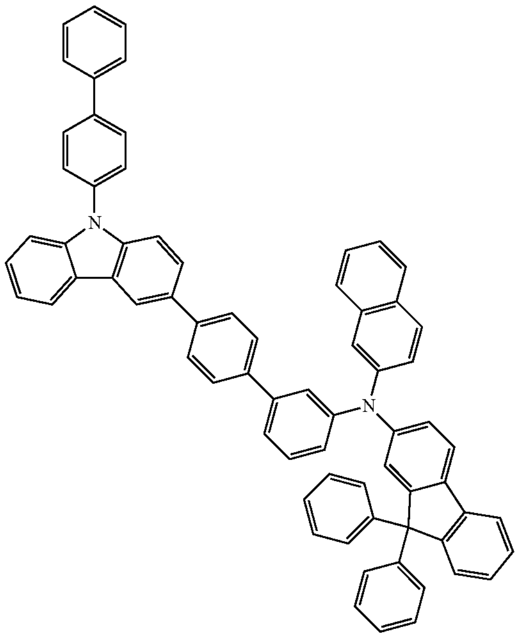
5-132
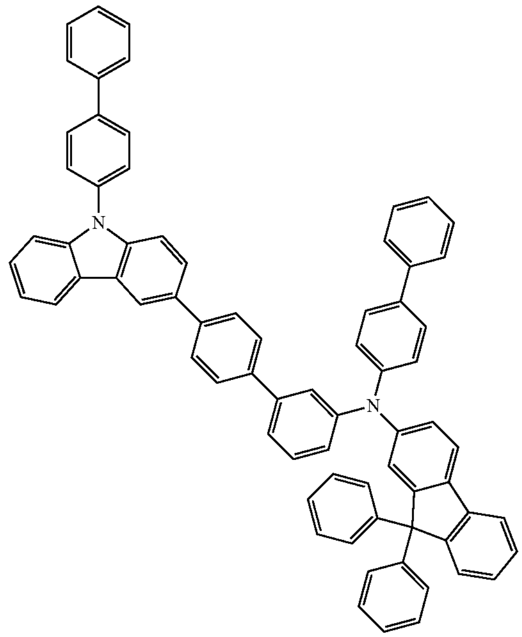
5-133
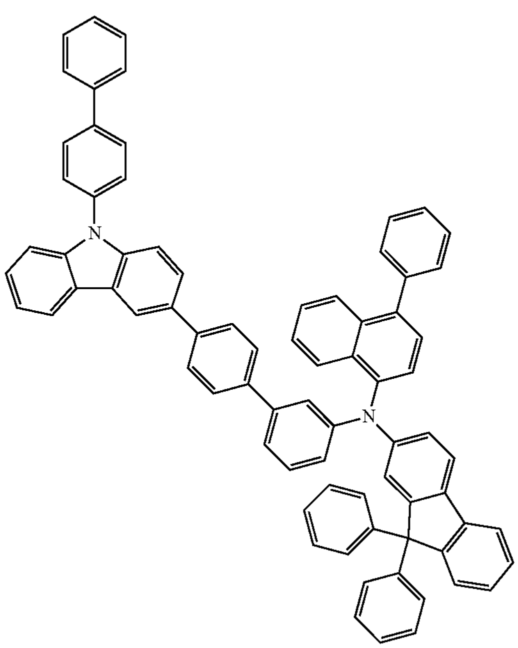

-continued
5-134
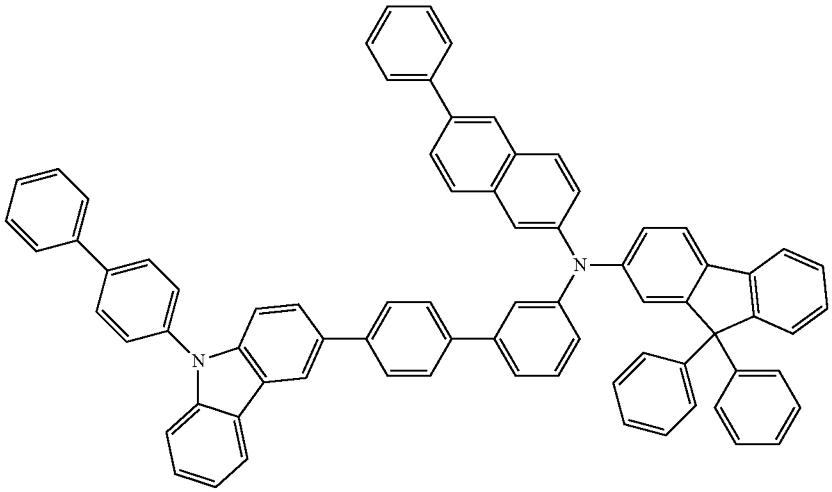
5-135
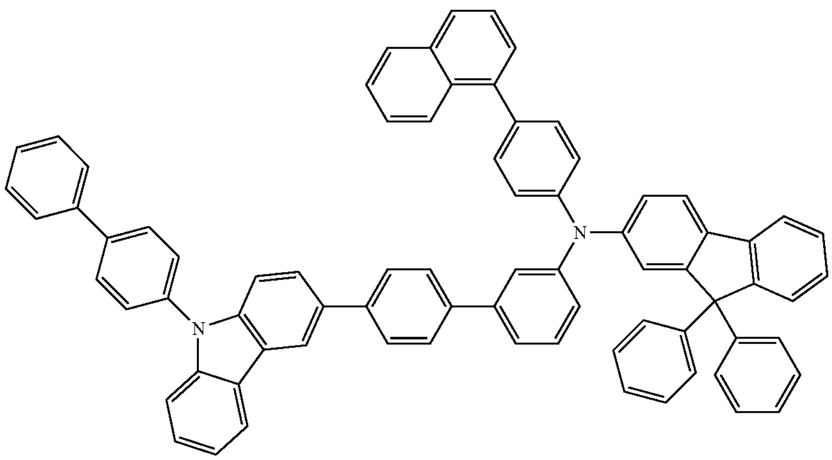
5-136
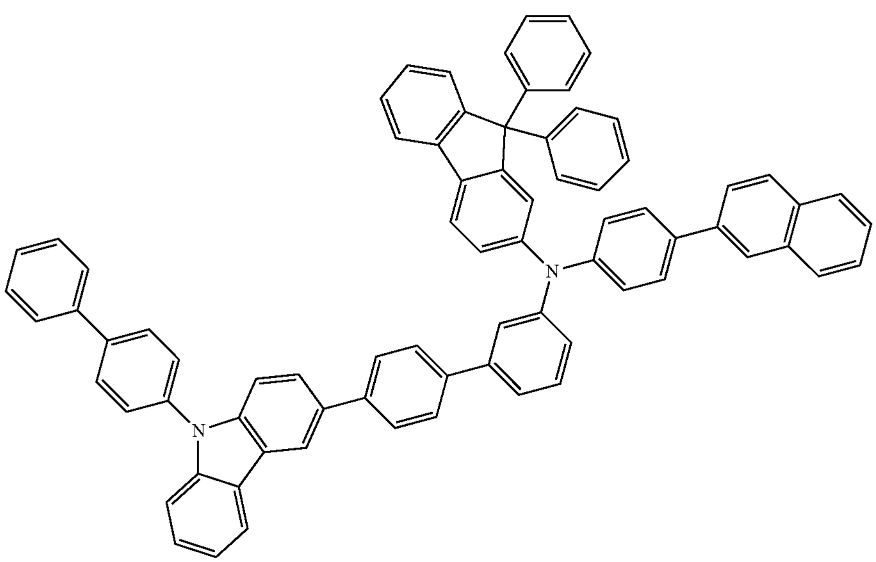

-continued
5-137
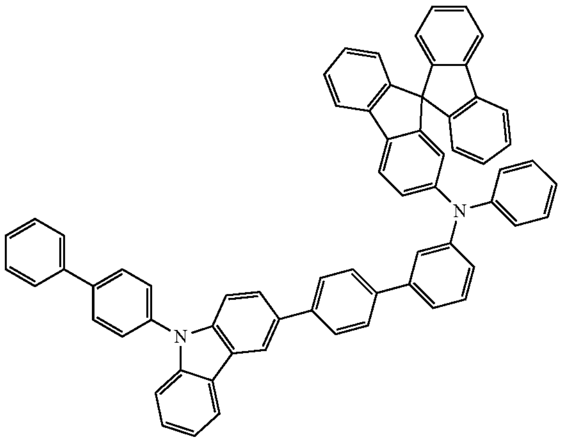
5-138
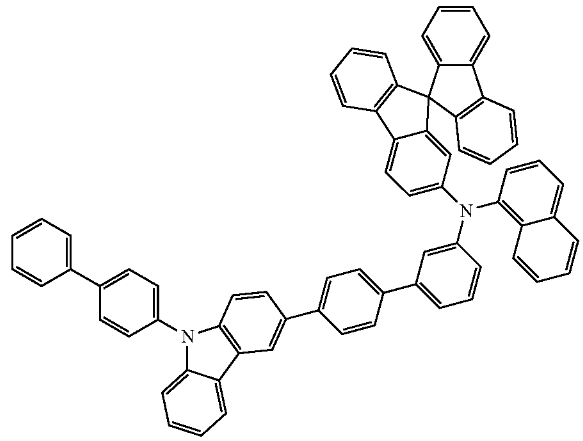
5-139
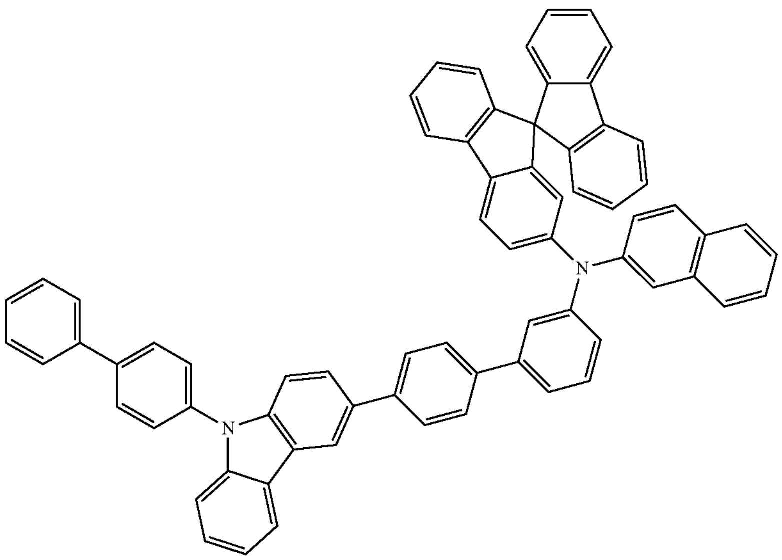
5-140
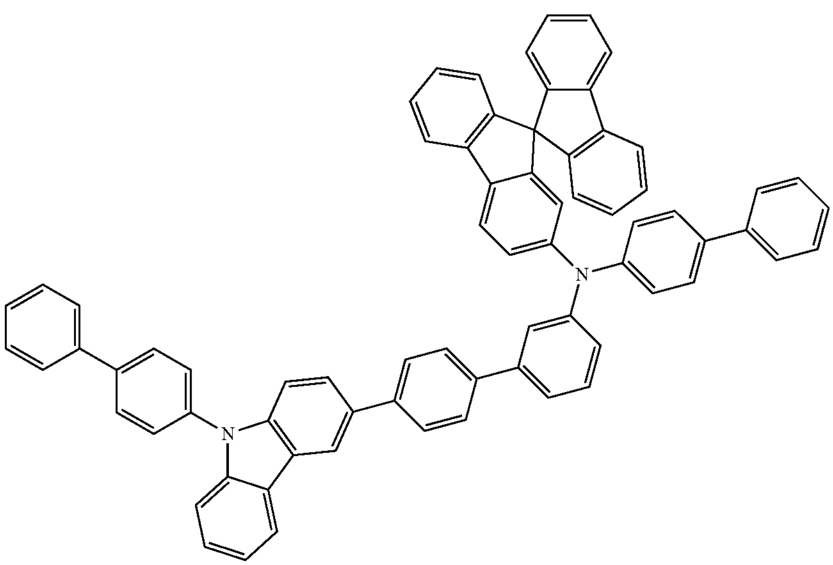

-continued
5-141
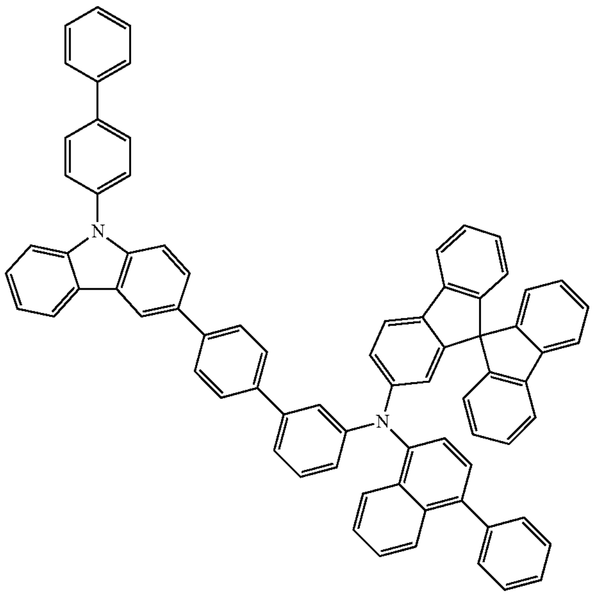
5-142
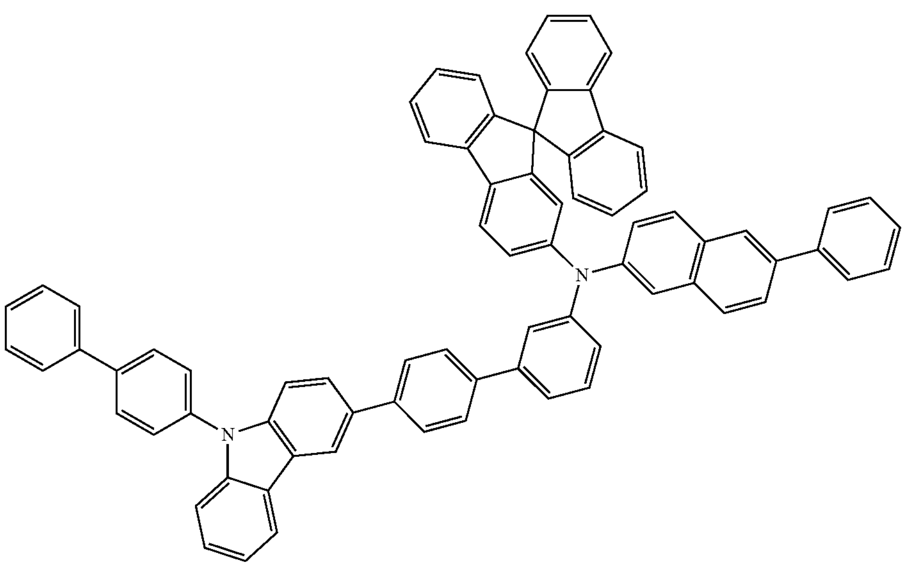

-continued
5-143
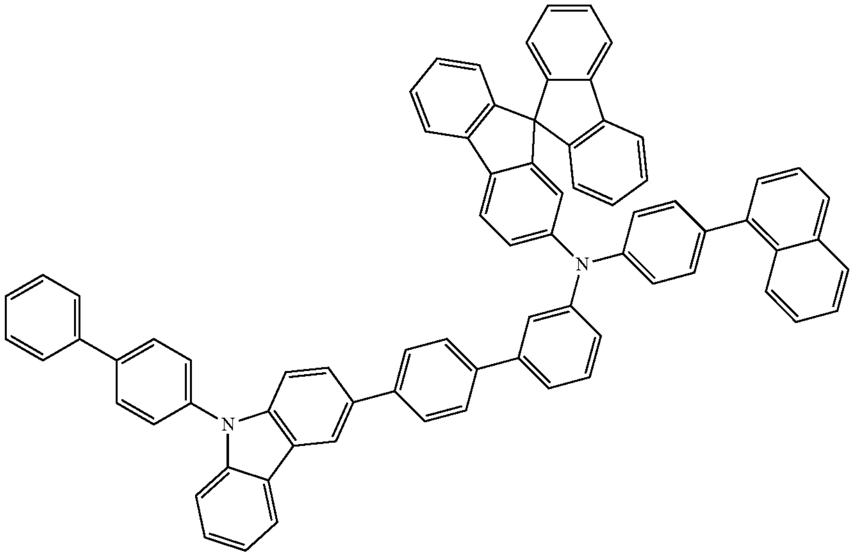
5-144
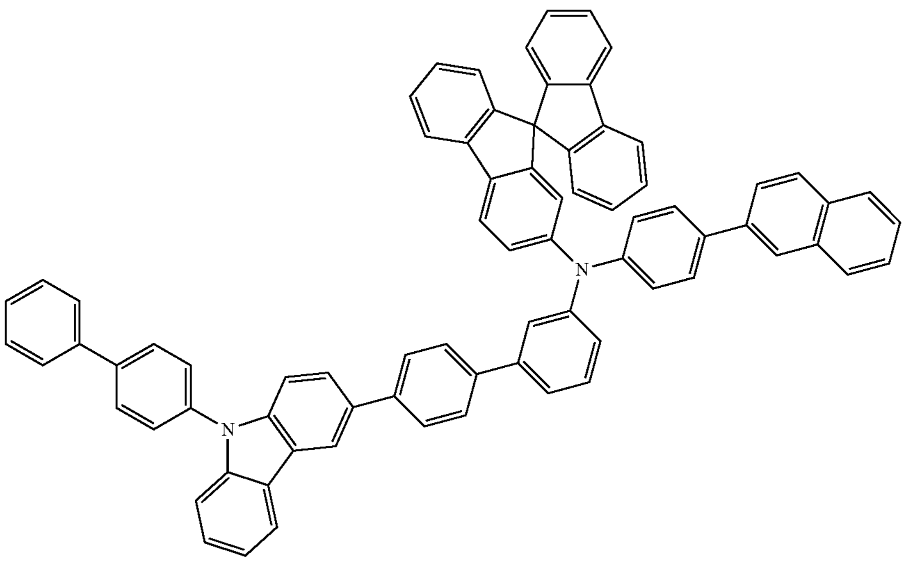
6-1
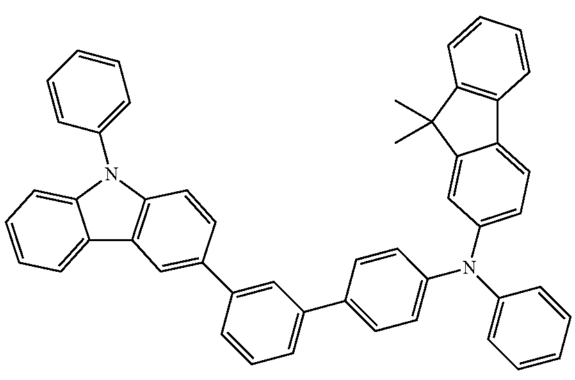
6-2
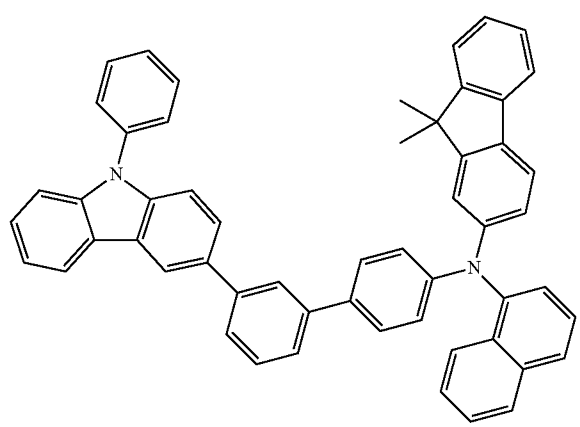

-continued
6-3
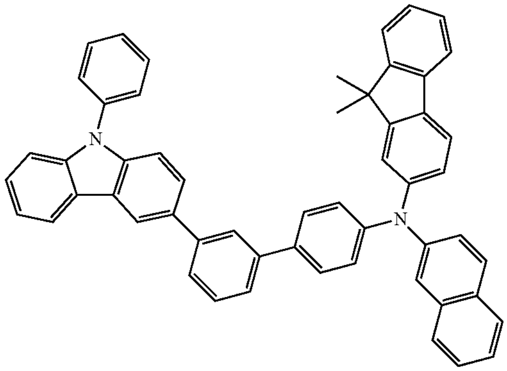
6-4
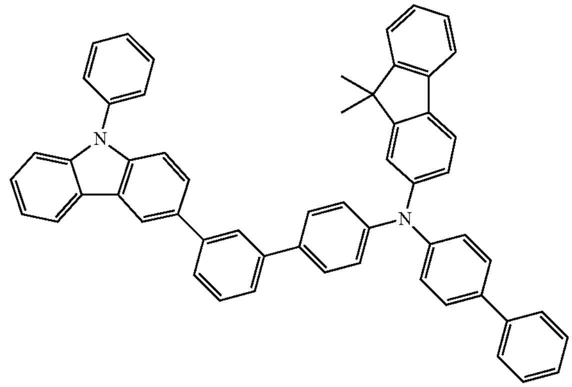
6-5
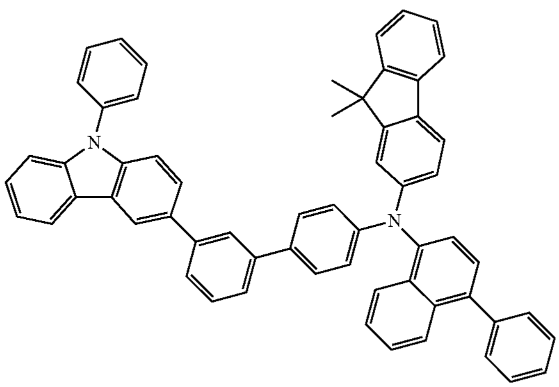
6-6
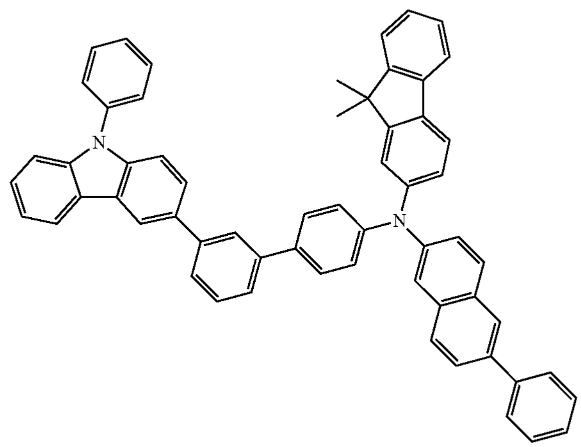
6-7
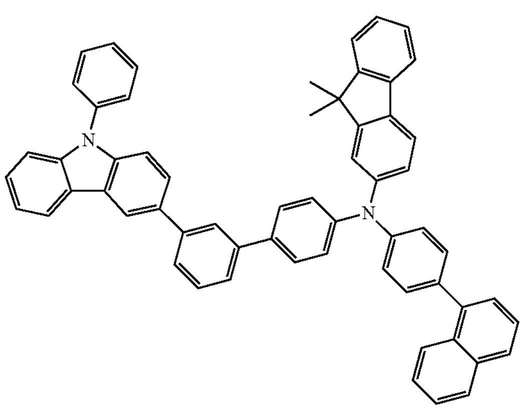
6-8
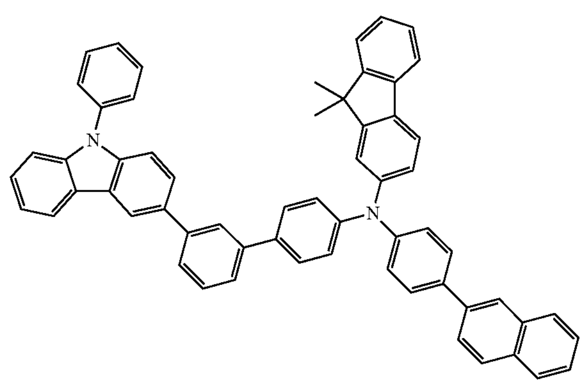

-continued
6-9
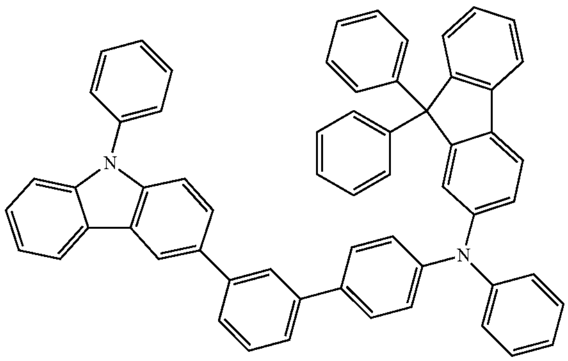
6-10
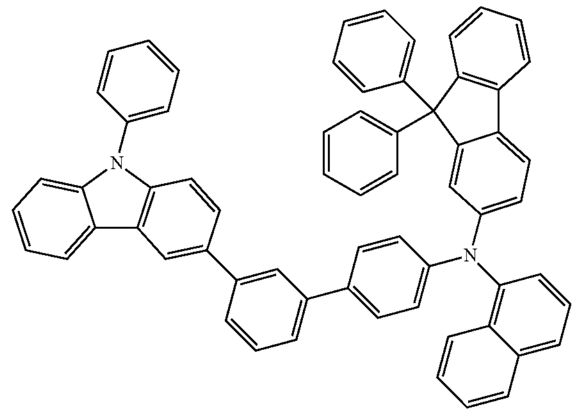
6-11
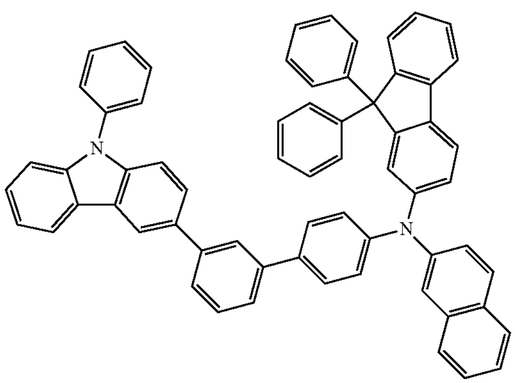
6-12
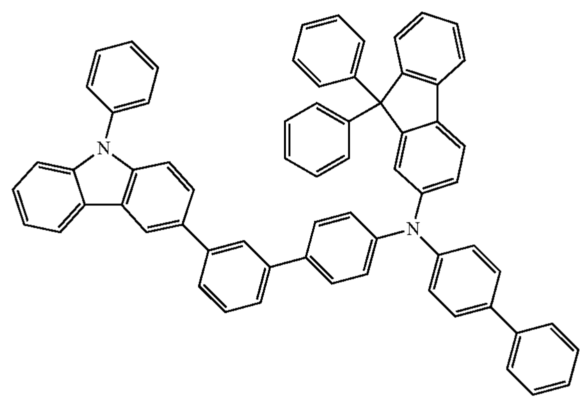
6-13
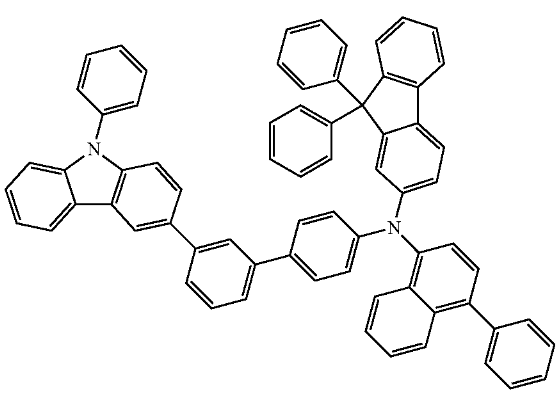
6-14
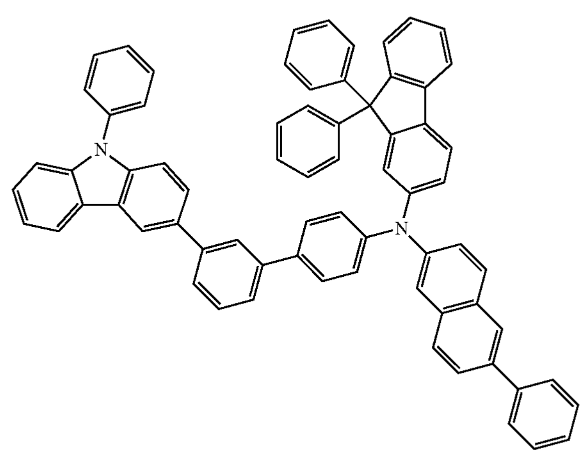

-continued
6-15
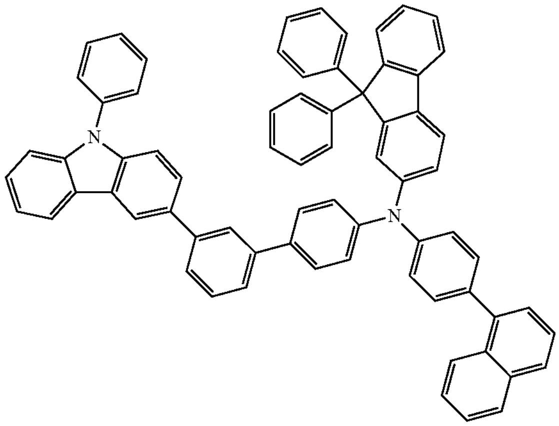
6-16
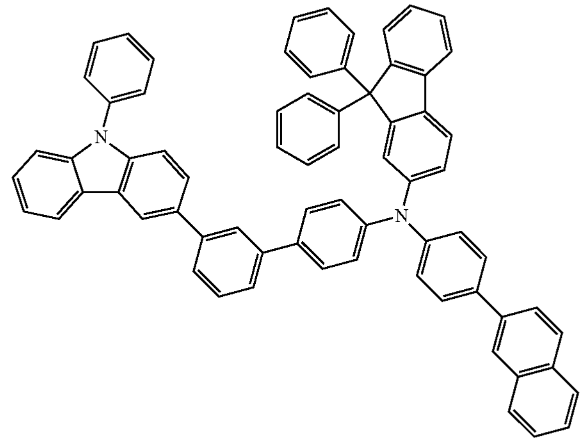
6-17
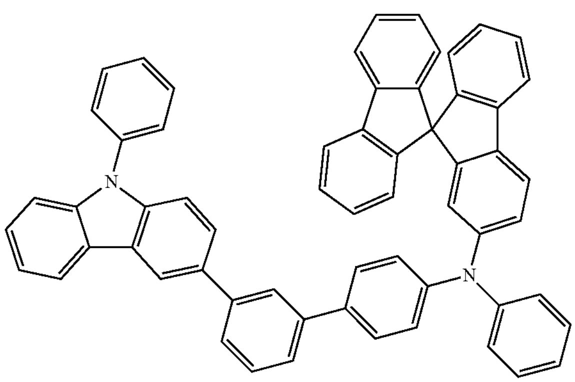
6-18
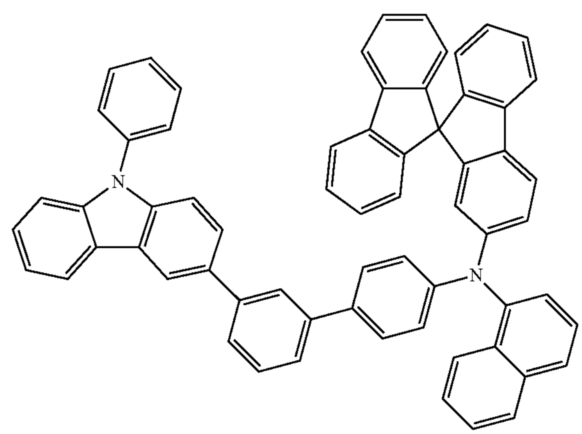
6-19
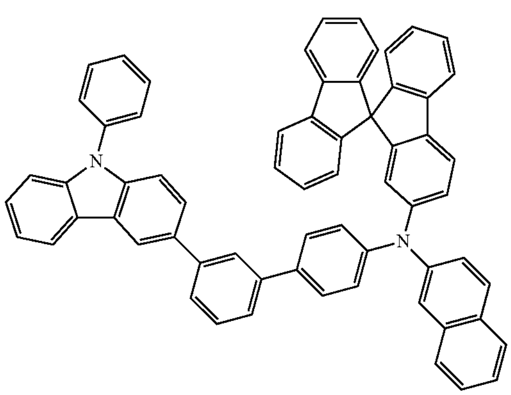
6-20
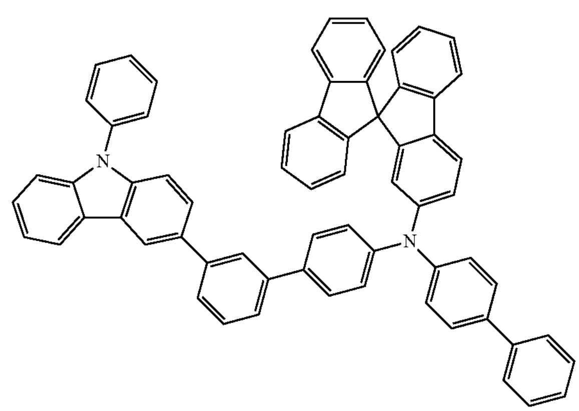

-continued
6-21
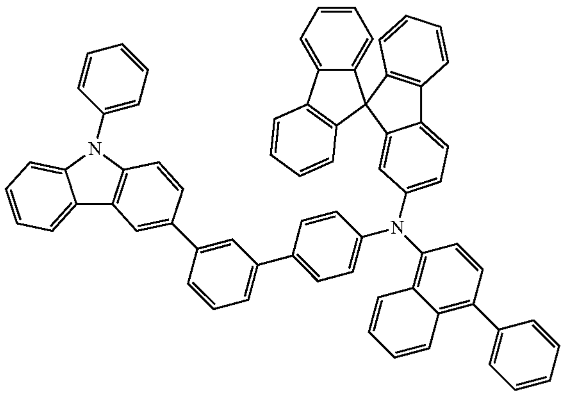
6-22
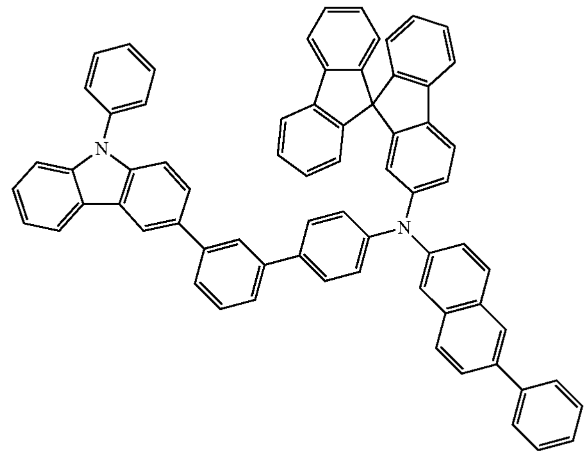
6-23
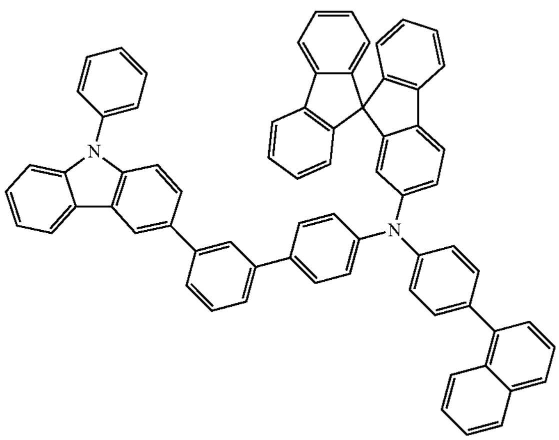
6-24
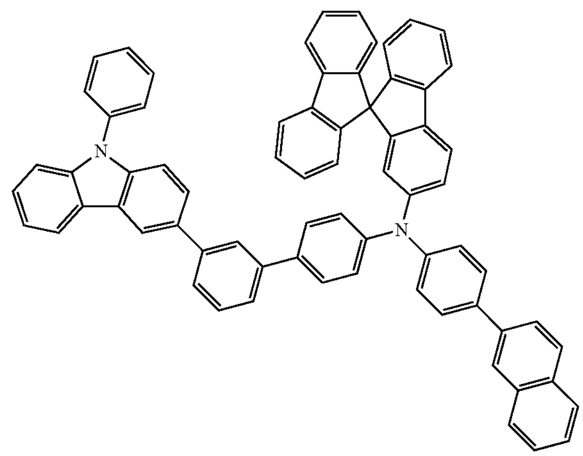
6-25
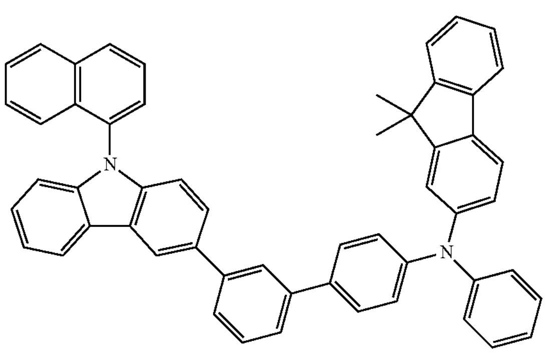
6-26
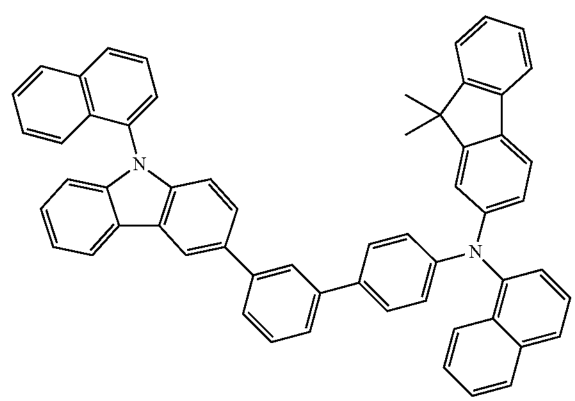

-continued
6-27
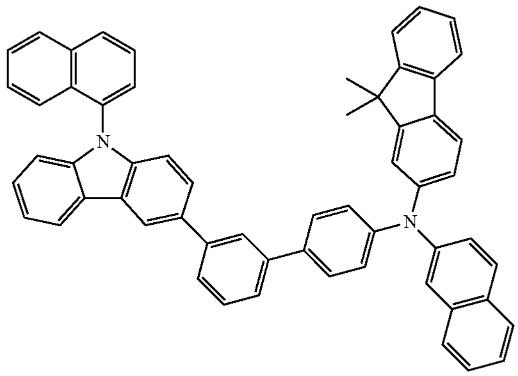
6-28
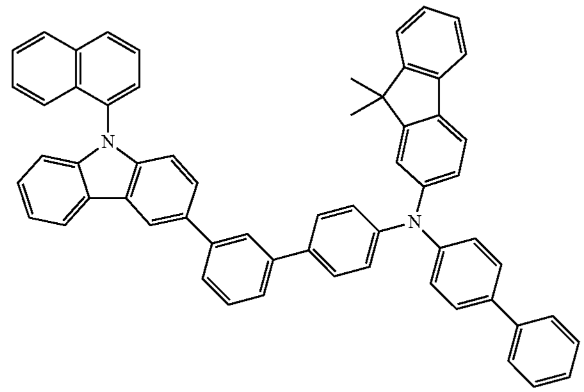
6-29
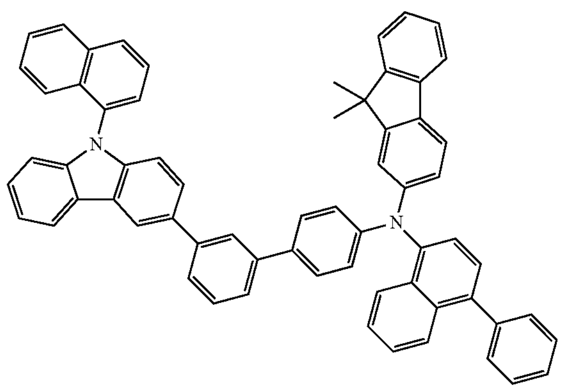
6-30
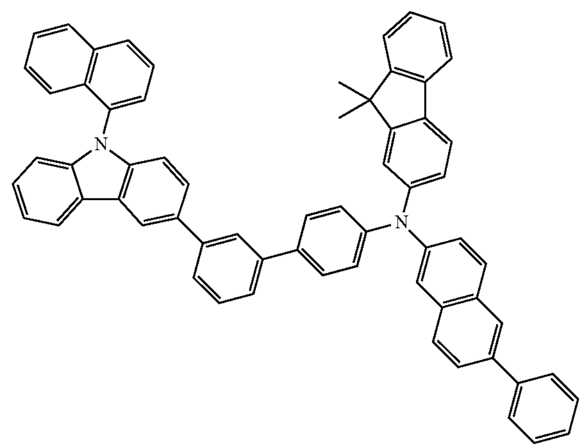
6-31
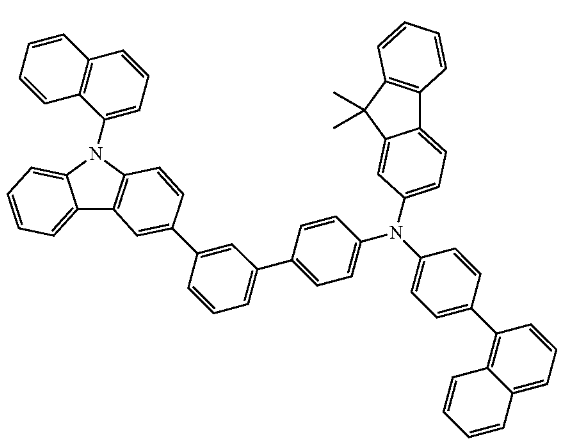
6-32
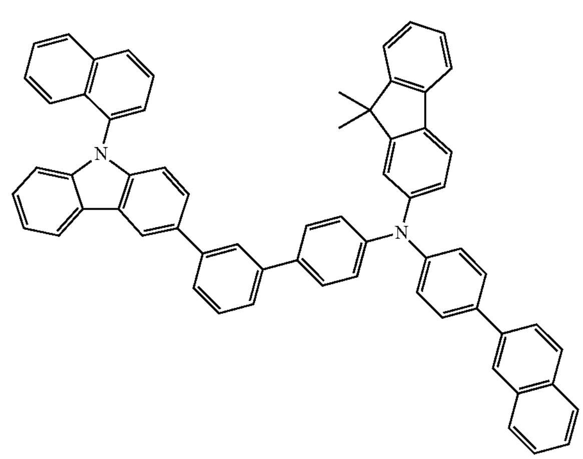

-continued
6-33
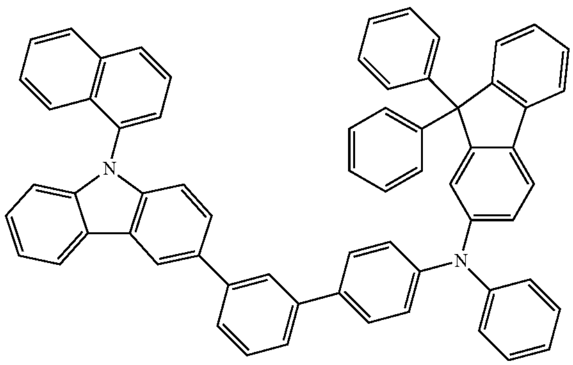
6-34
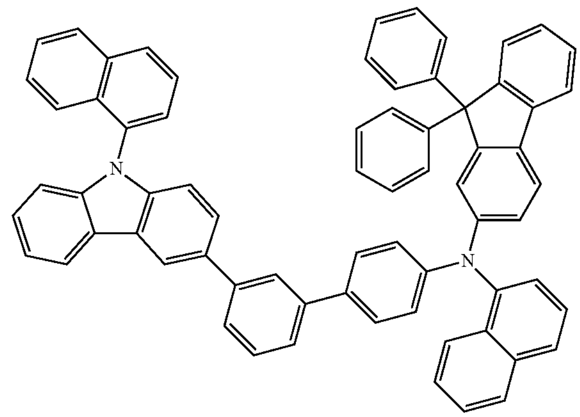
6-35
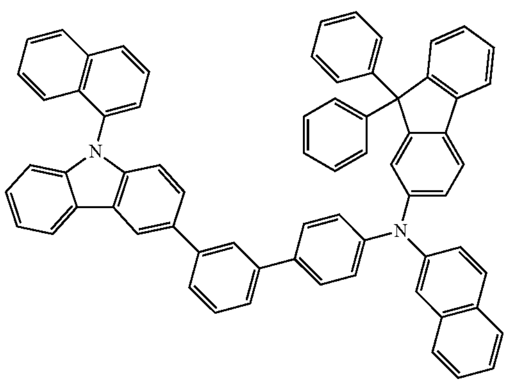
6-36
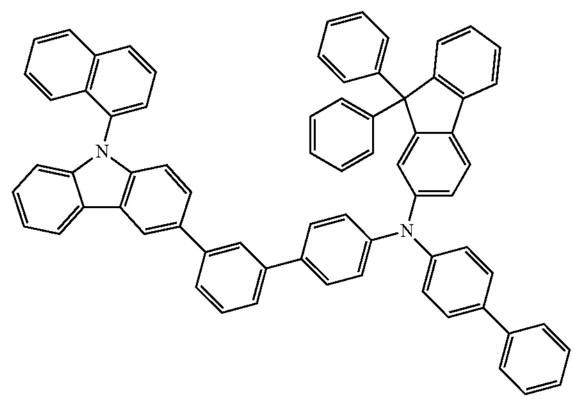
6-37
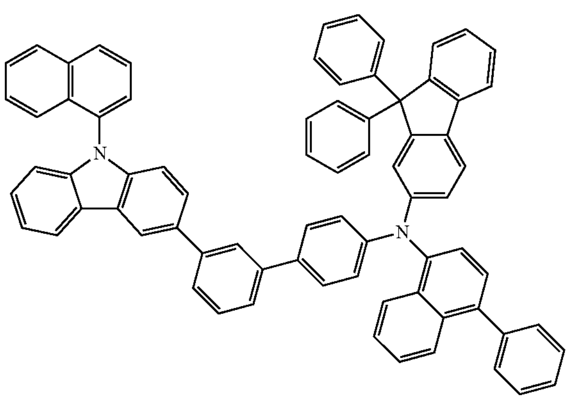
6-38
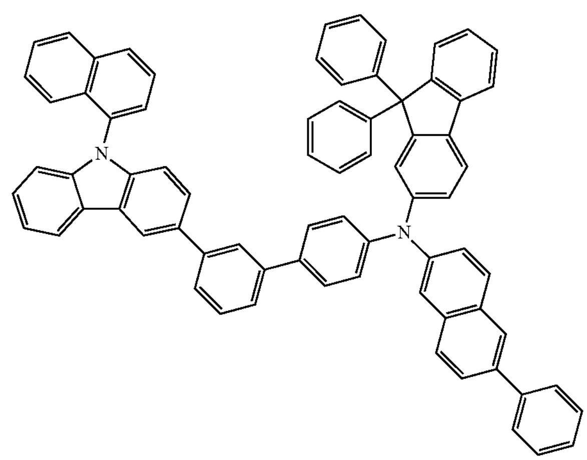

-continued
6-39
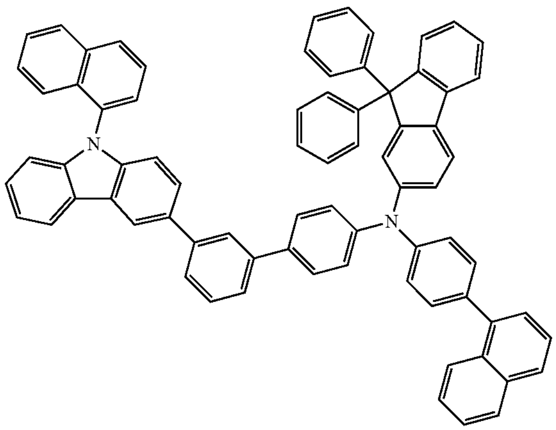
6-406
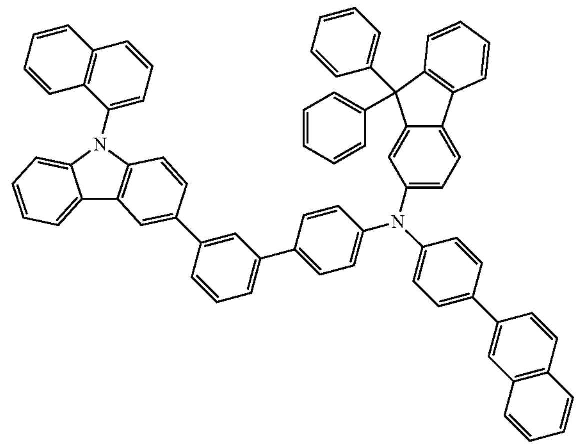
6-41
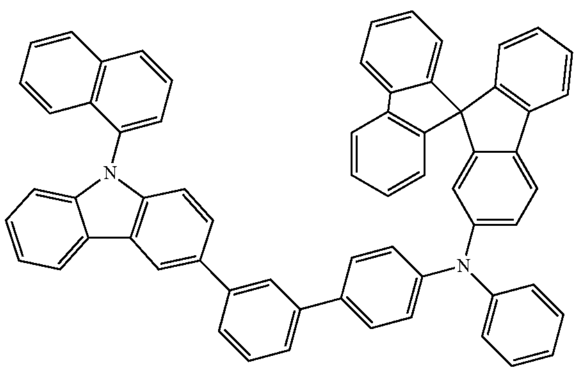
6-42
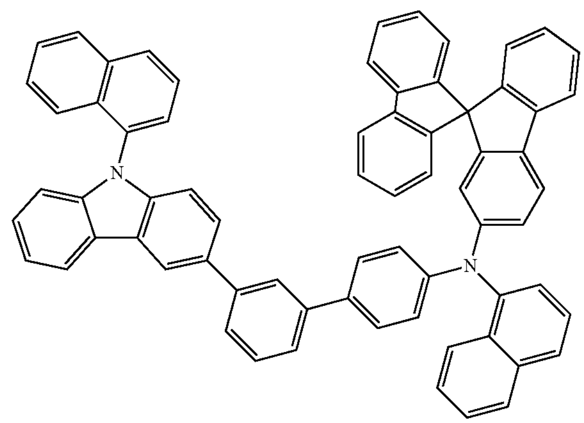
6-43
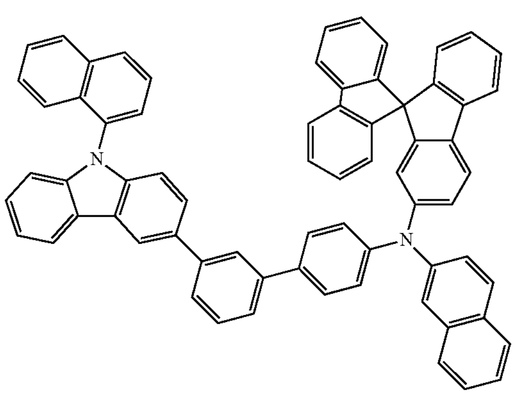
6-44
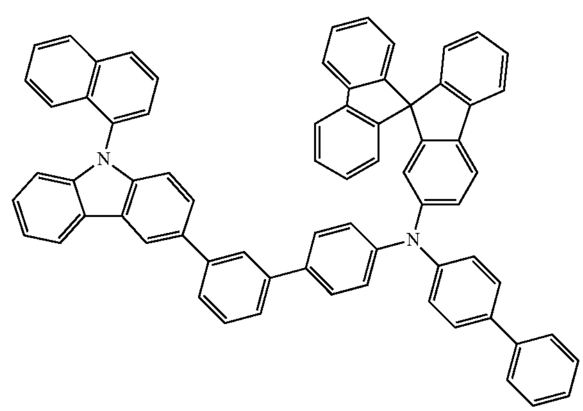

-continued
6-45
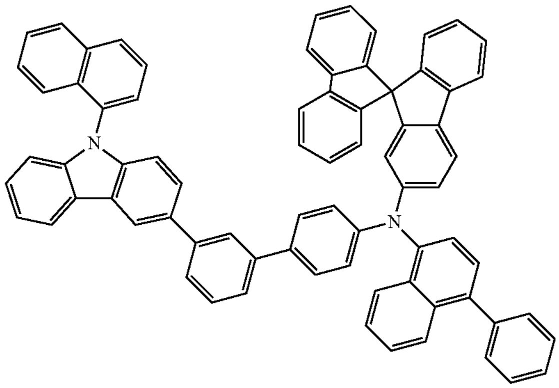
6-46
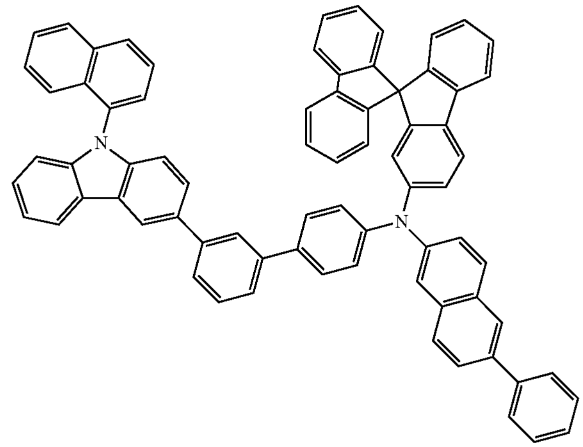
6-47
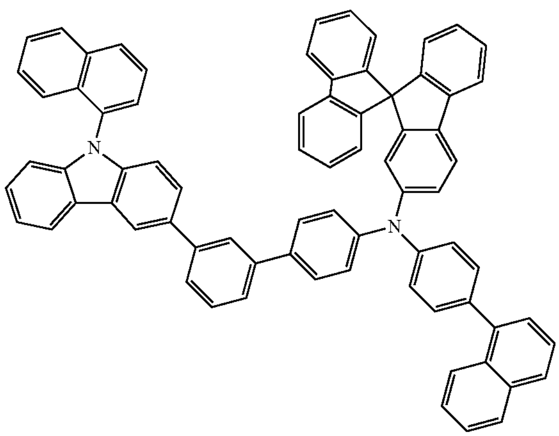
6-48
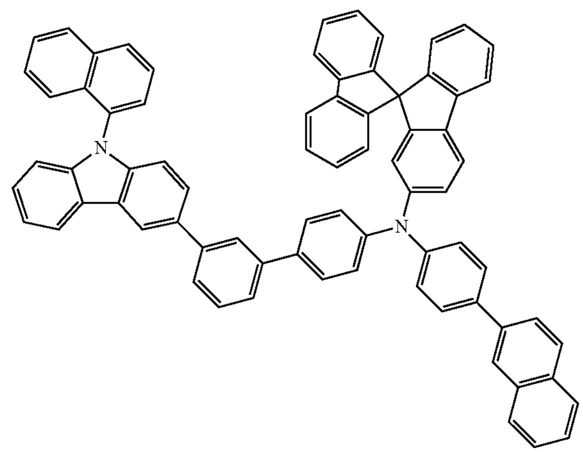
6-49
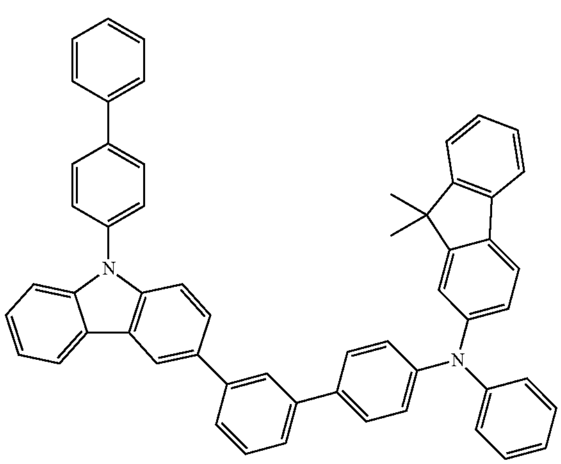
6-50
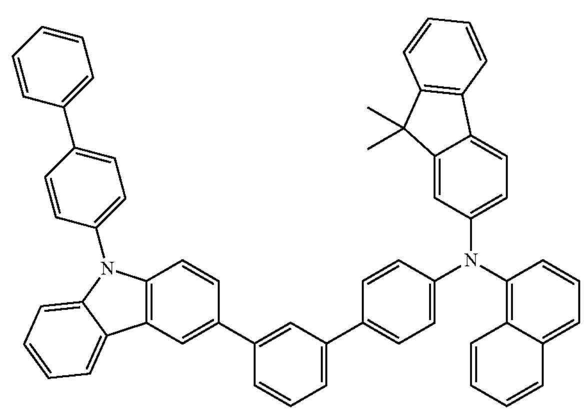

-continued
6-51
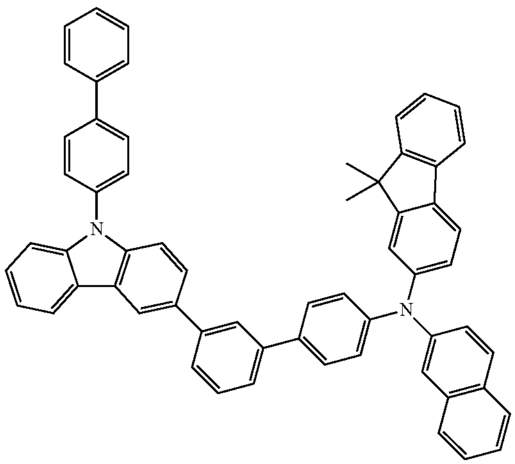
6-52
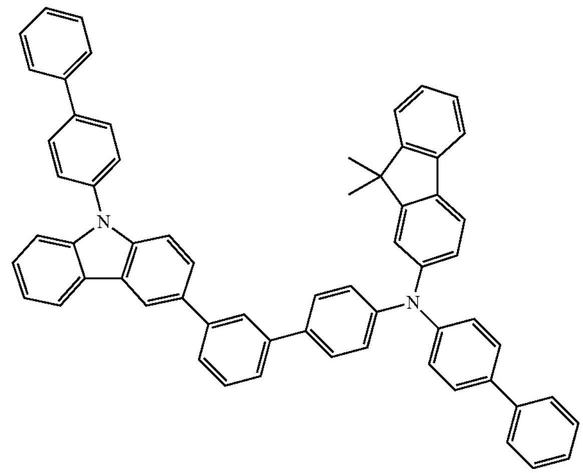
6-53
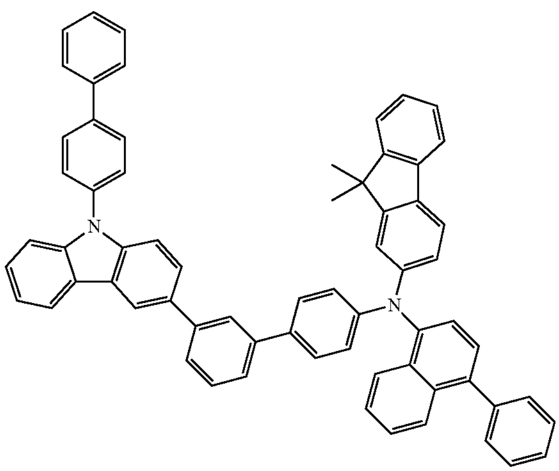
6-54
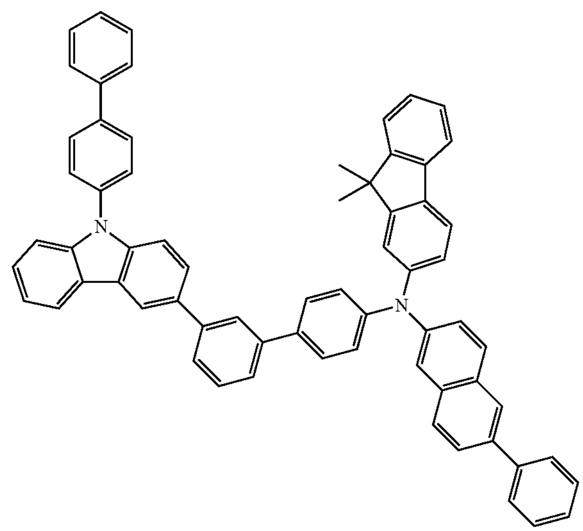
6-55
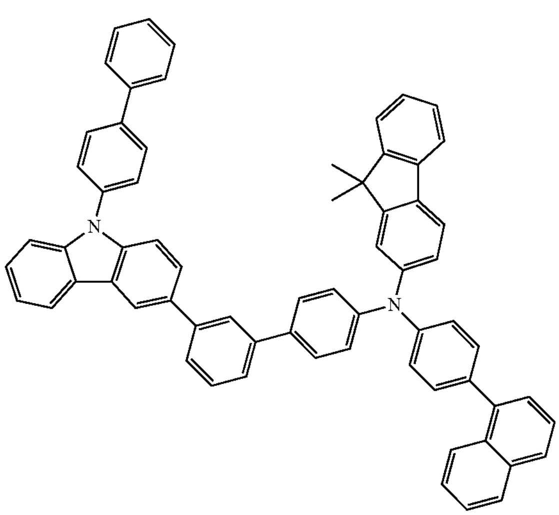
6-56
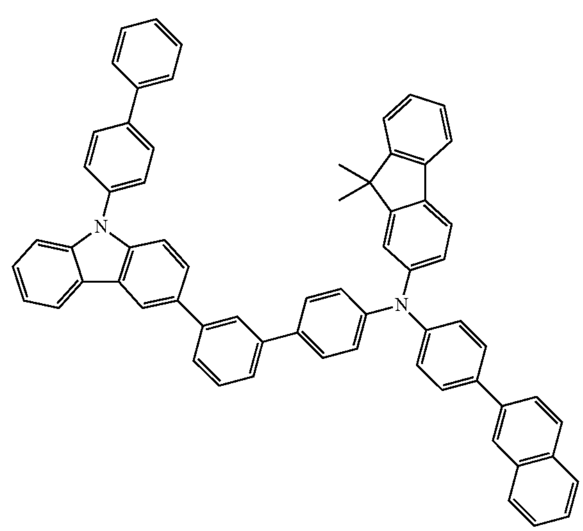

-continued
6-57
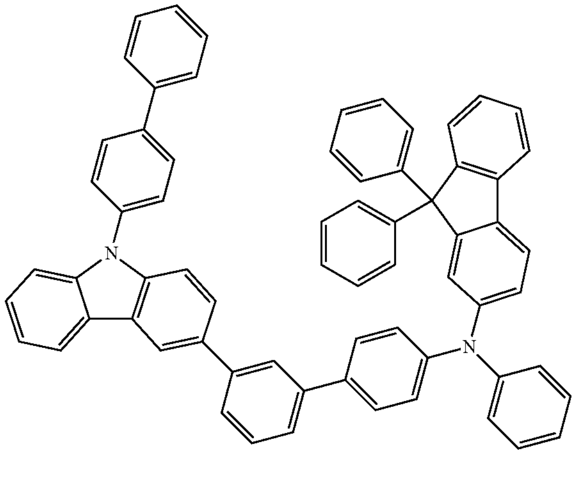
6-58
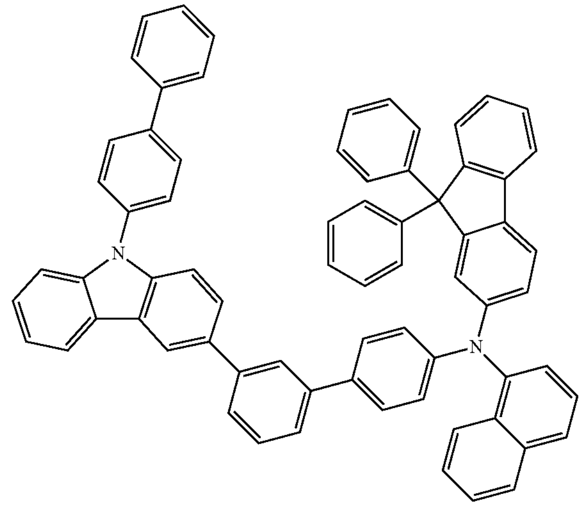
6-59
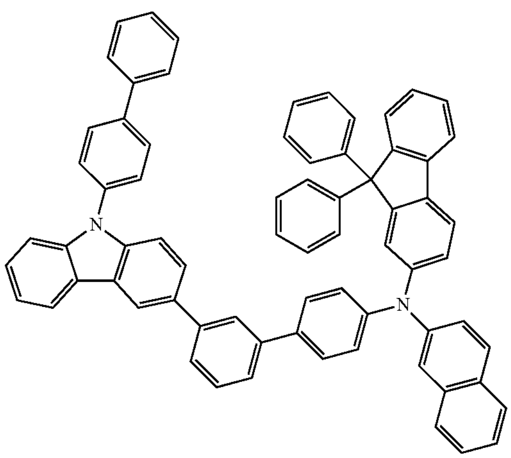
6-60
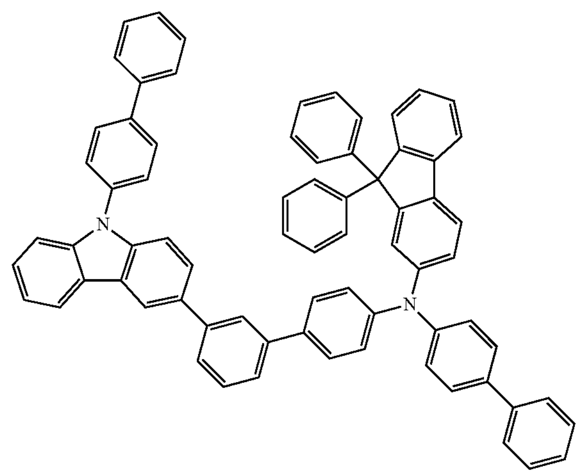
6-61
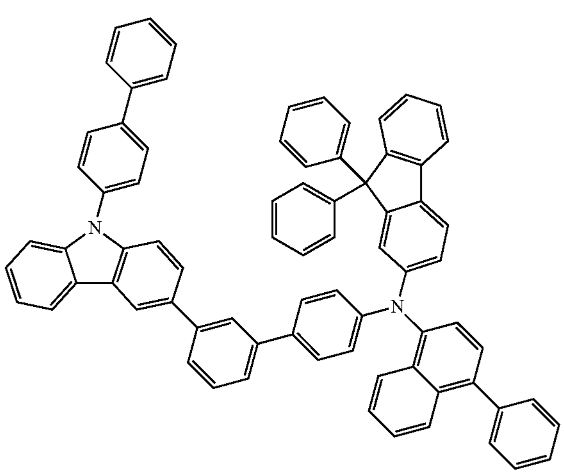
6-62
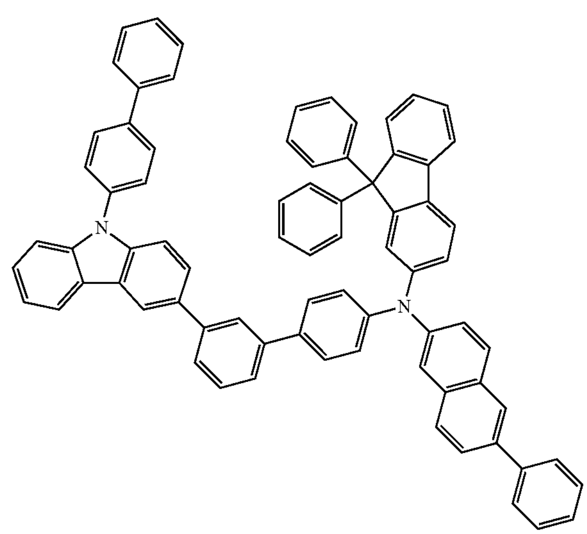

-continued
6-63
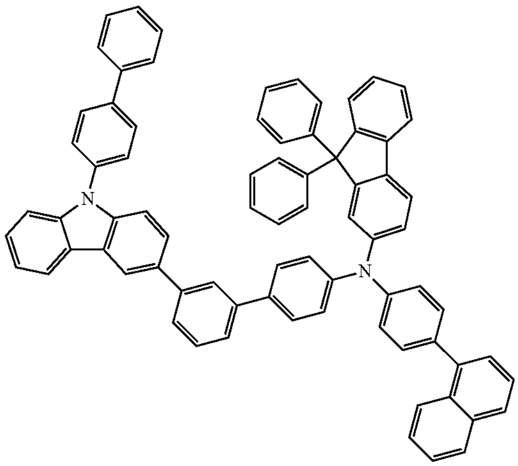
6-64
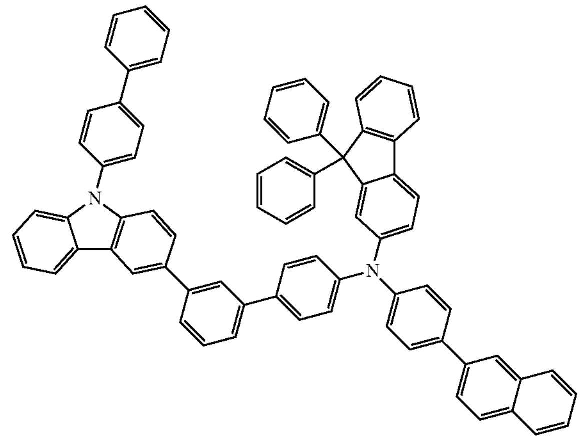
6-65
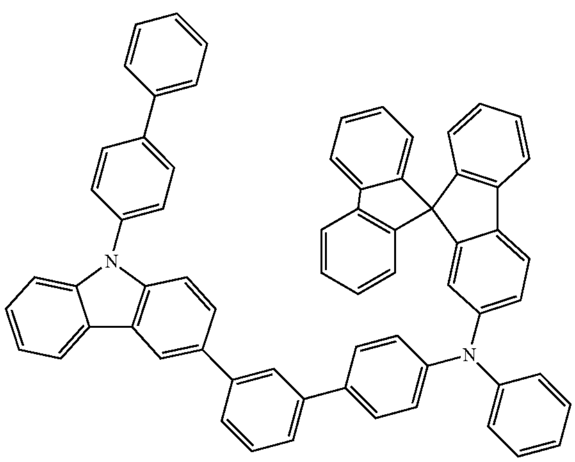
6-66
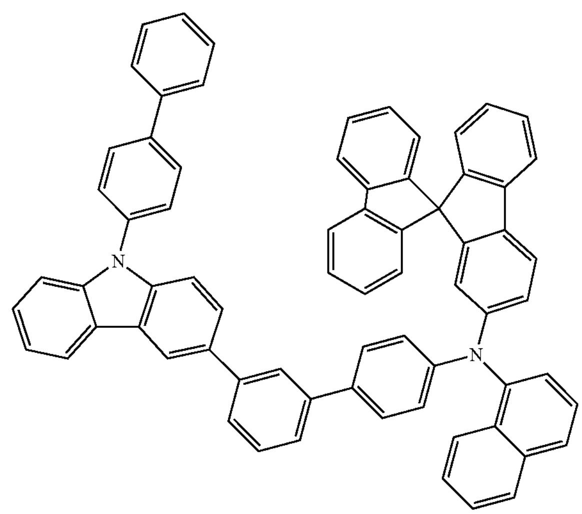
6-67
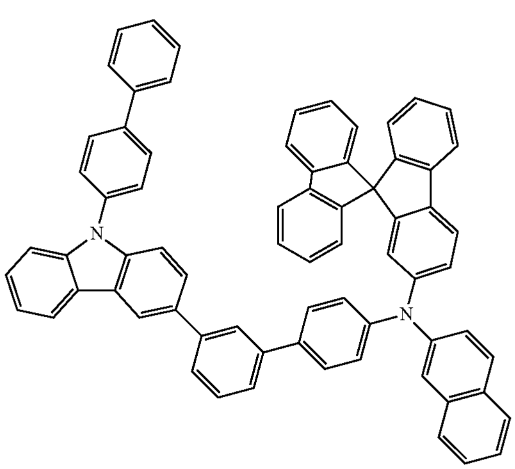
6-68
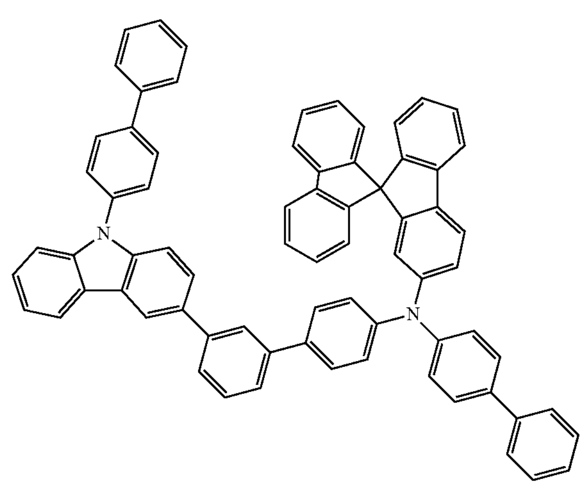

-continued
6-69
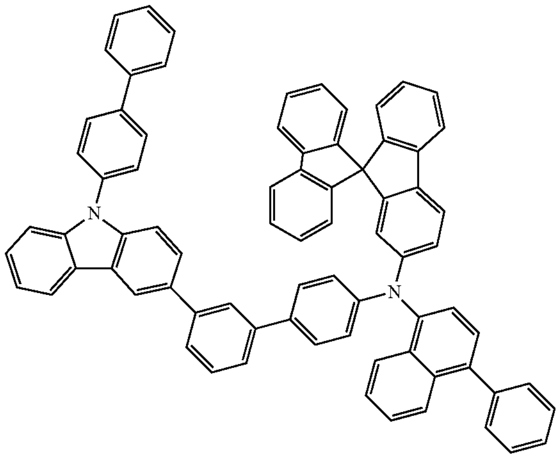
6-70
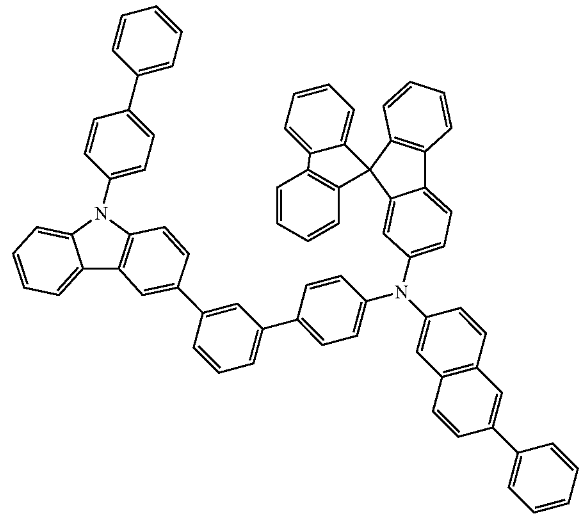
6-71
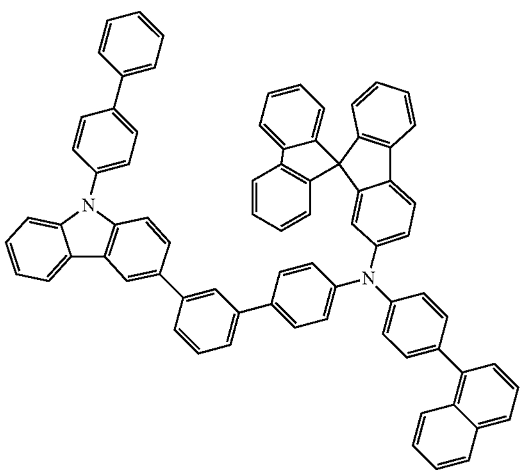
6-72
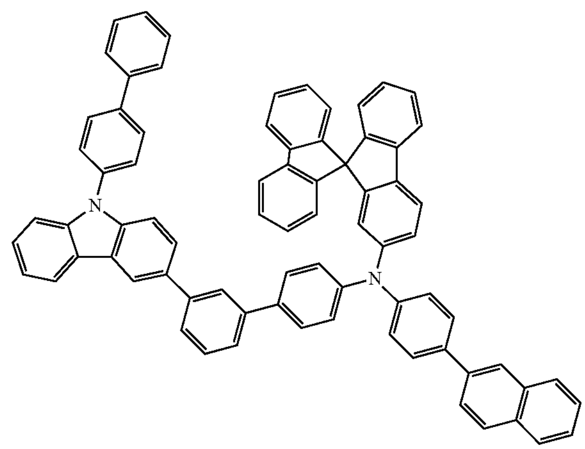
6-73
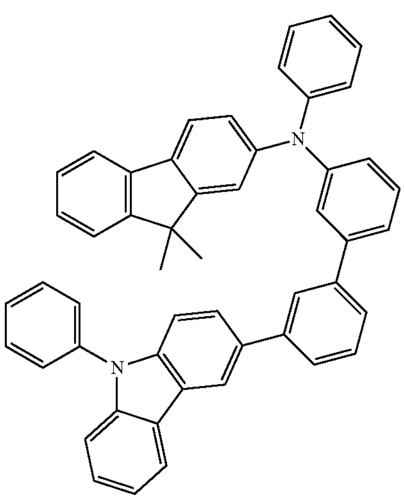
6-74
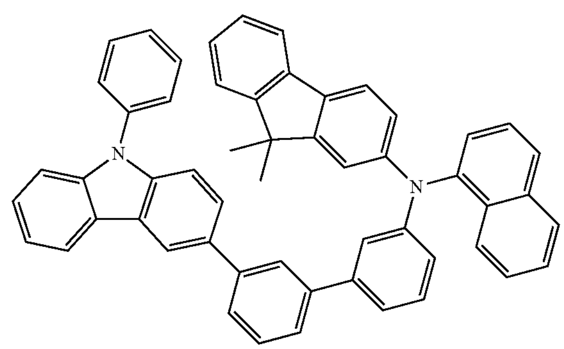

-continued
6-75
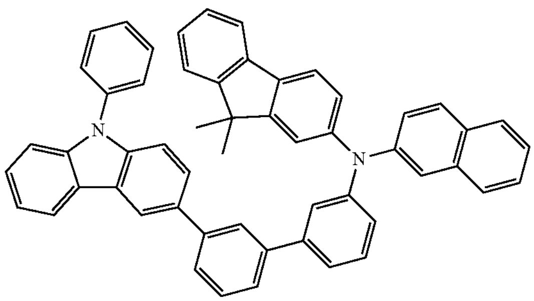
6-76
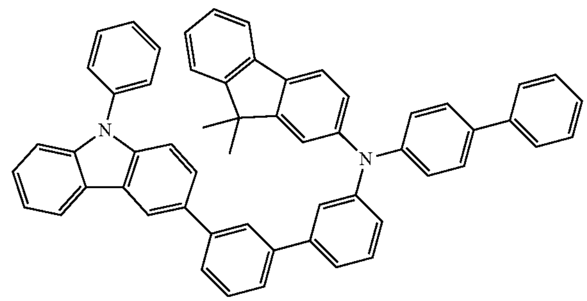
6-77
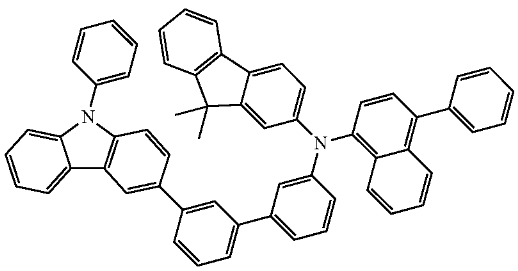
6-78
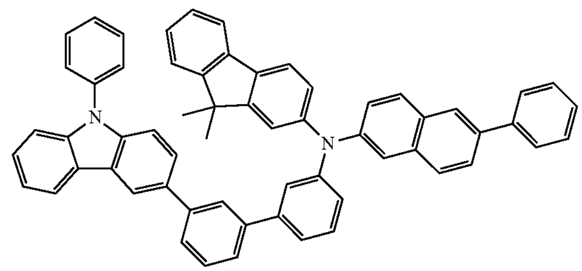
6-79
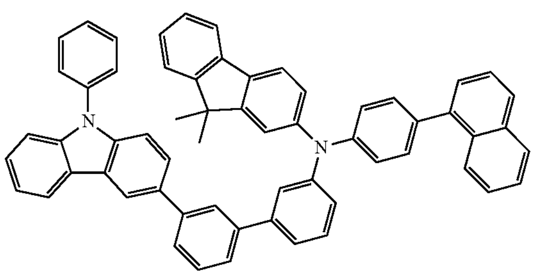
6-80
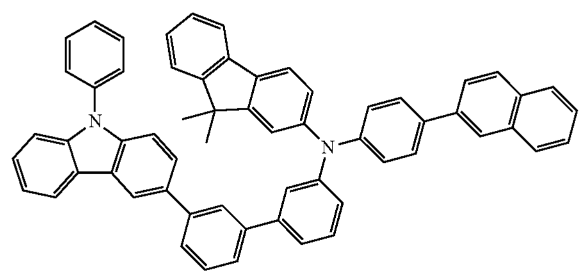
6-81
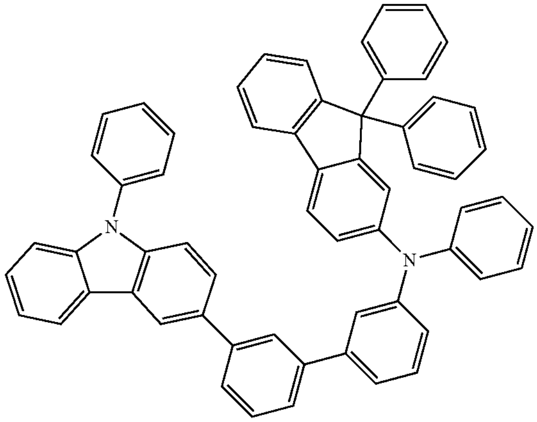
6-82
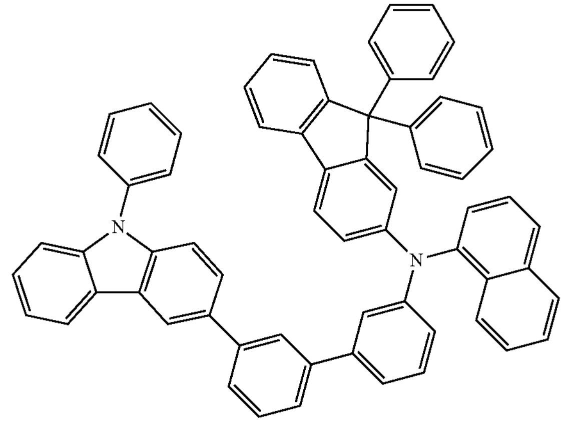

-continued
6-83
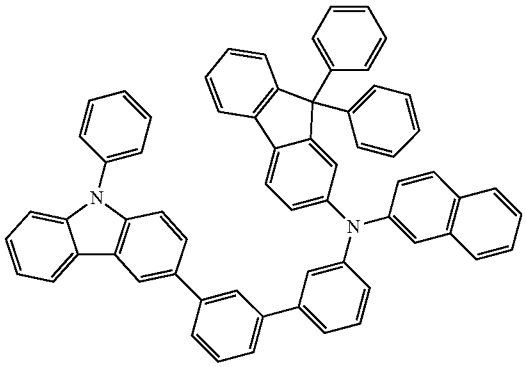
6-84
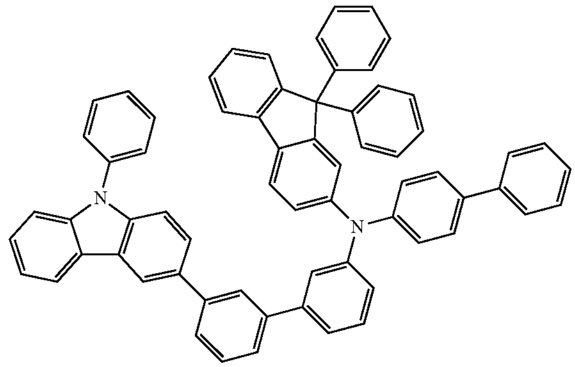
6-85
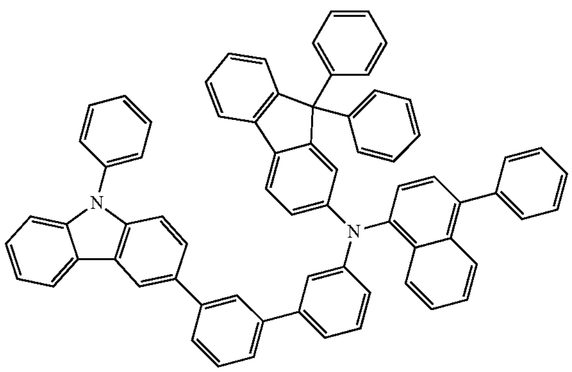
6-86
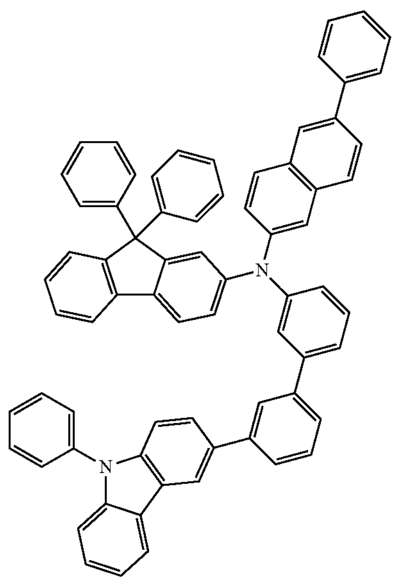
6-87
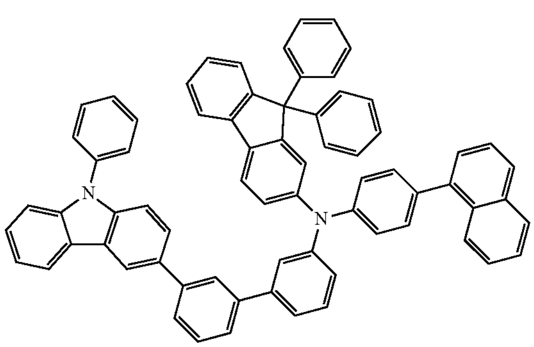
6-88
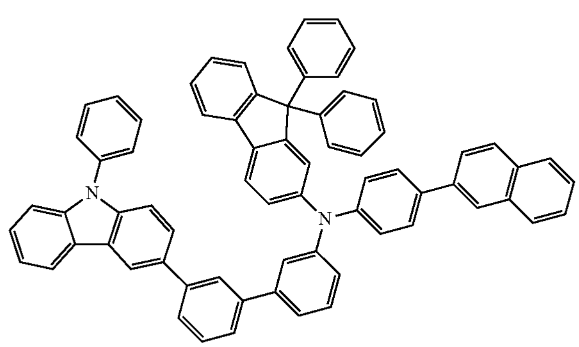

-continued
6-89
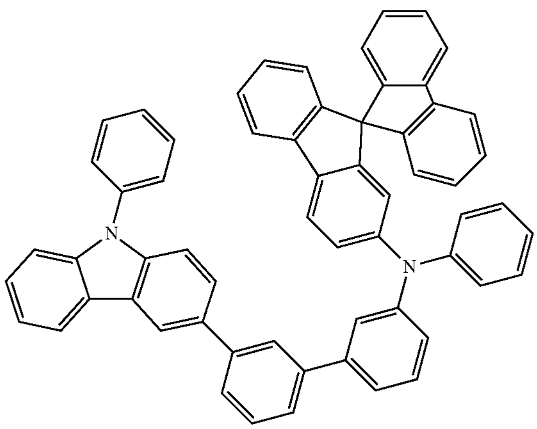
6-90
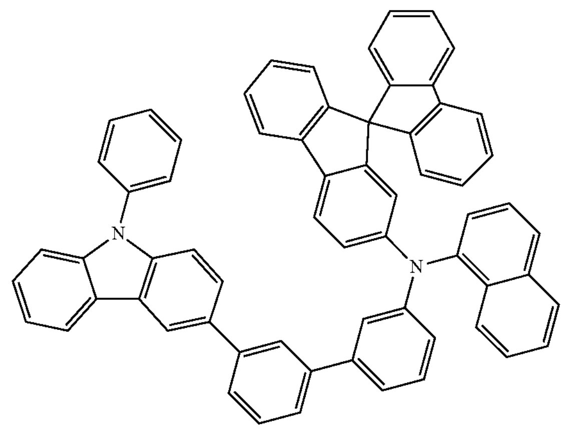
6-91
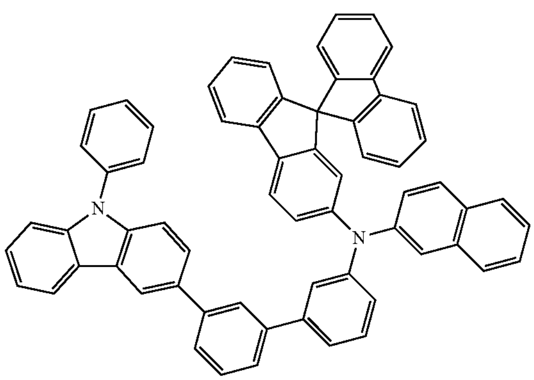
6-92
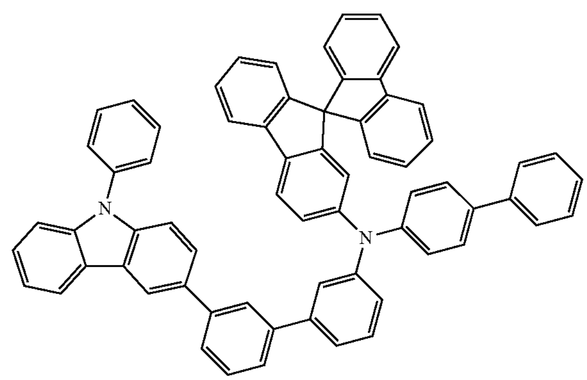
6-93
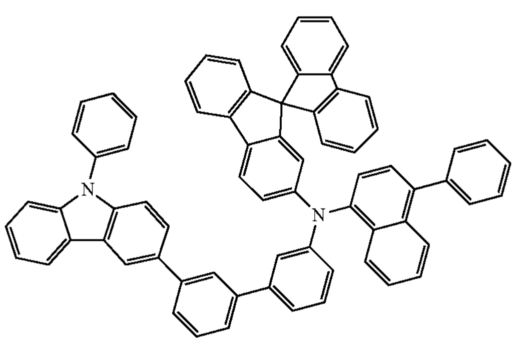
6-94
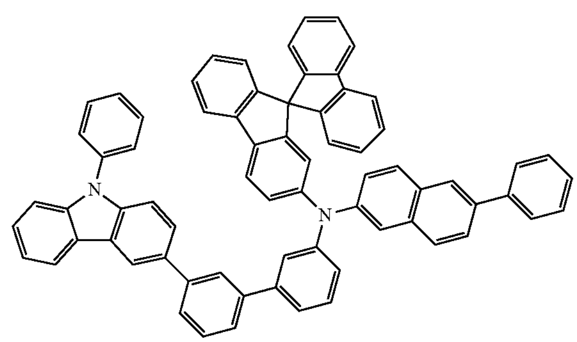
6-95
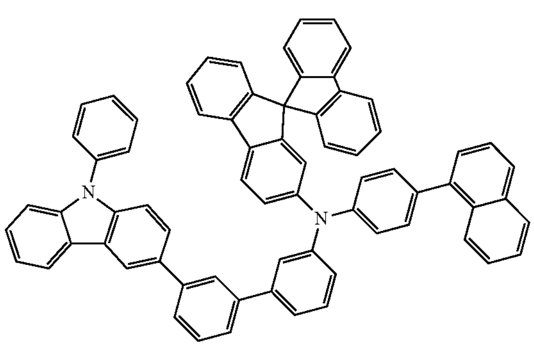
6-96
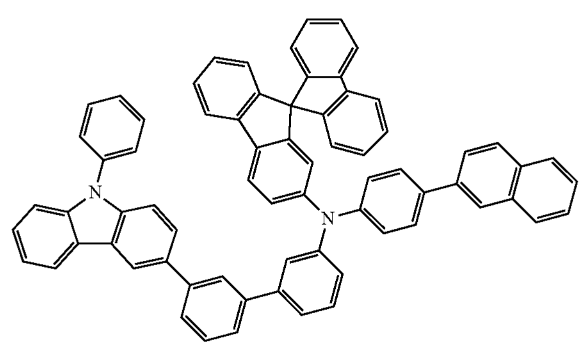

-continued
6-97
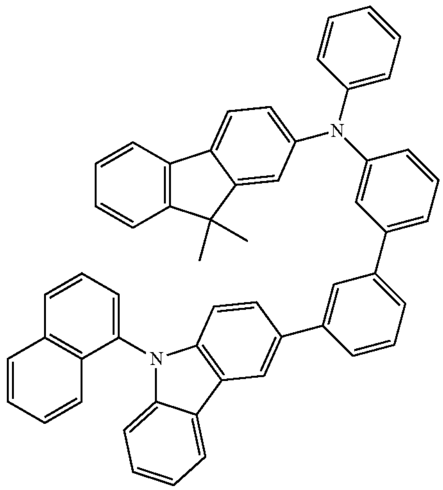
6-98
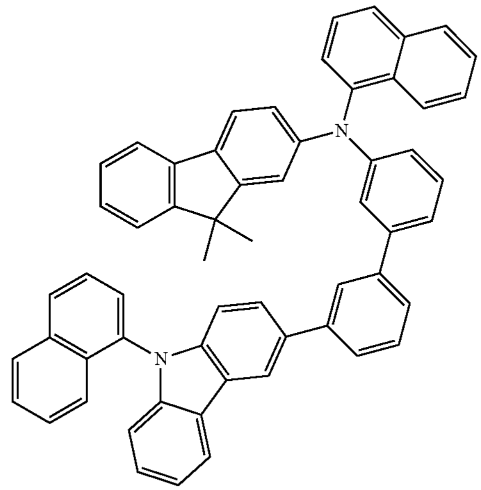
6-99
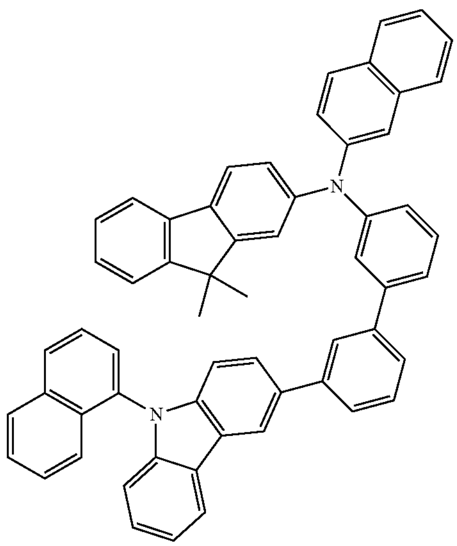
6-100
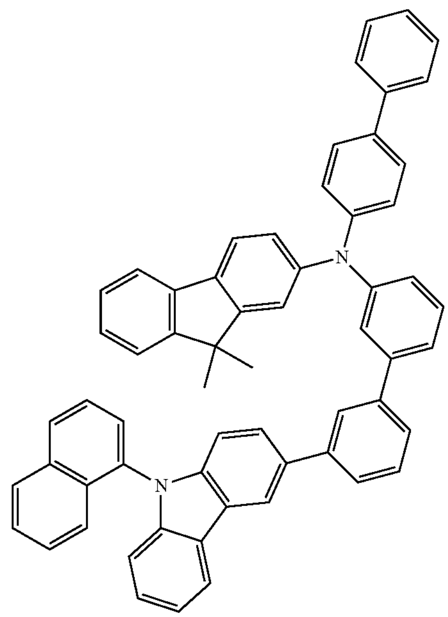
6-101
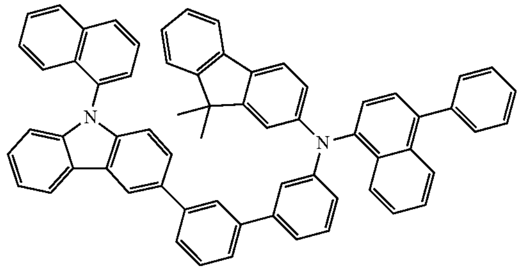
6-102
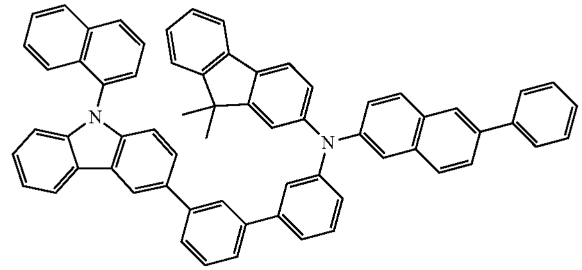

-continued
6-103
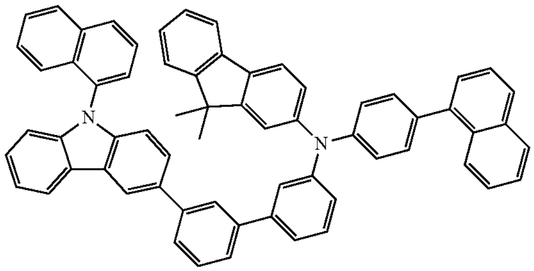
6-104
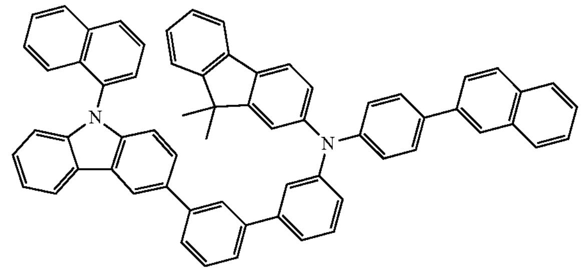
6-105
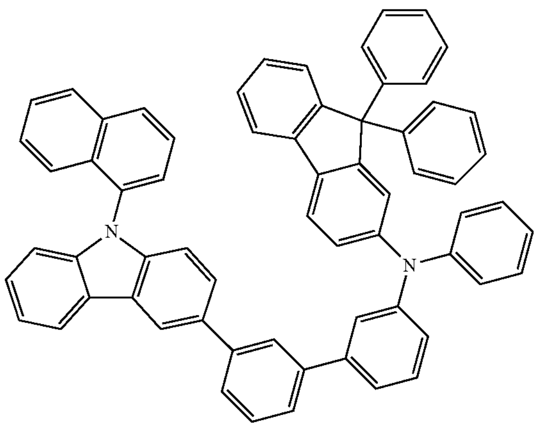
6-106
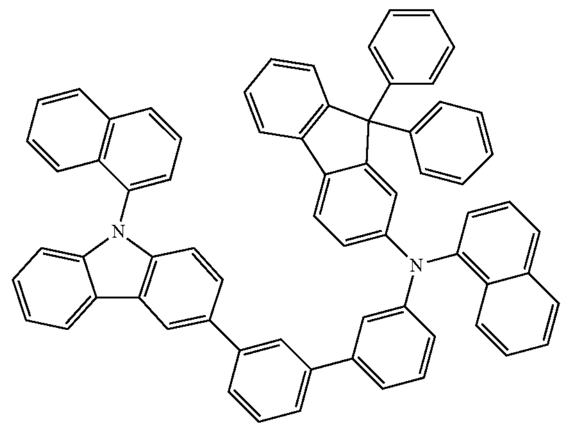
6-107
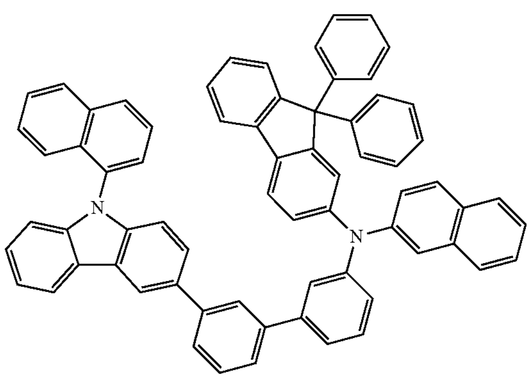
6-108
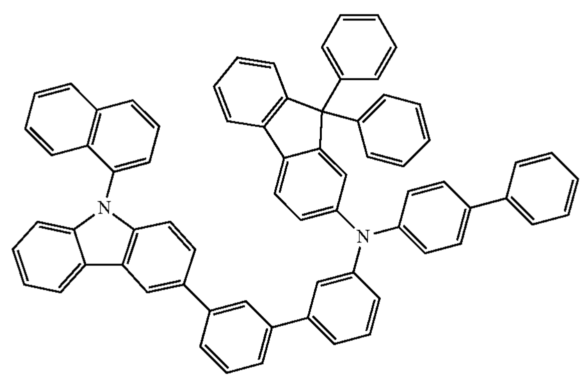
6-109
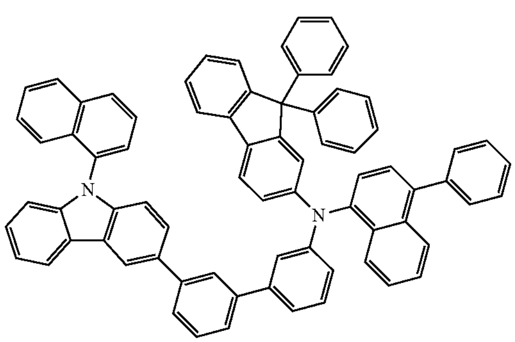
6-110
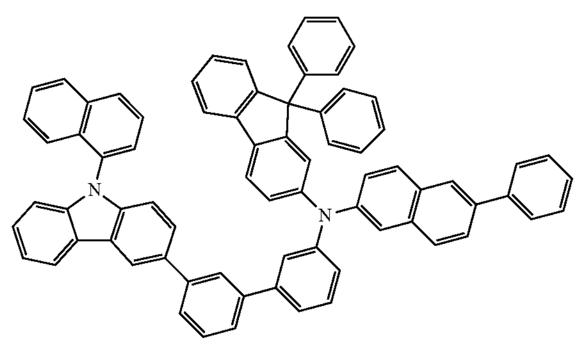

-continued
6-111
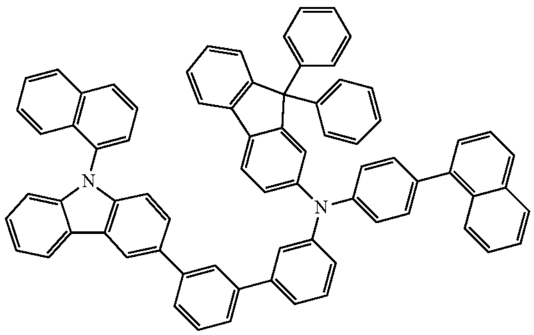
6-112
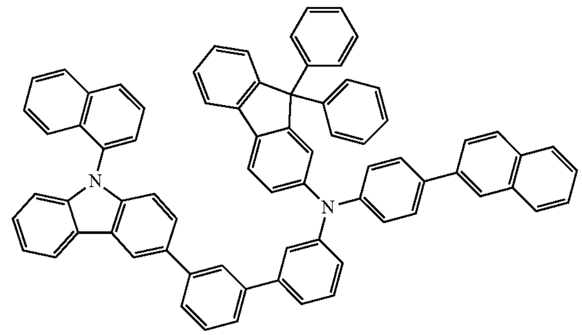
6-113
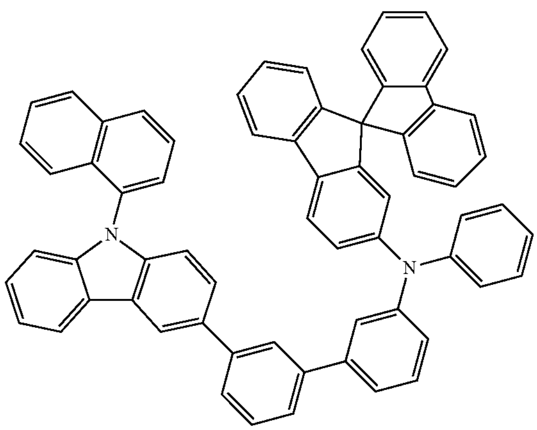
6-114
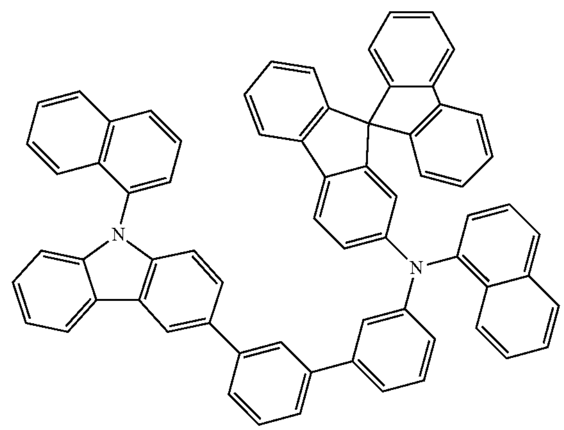
6-115
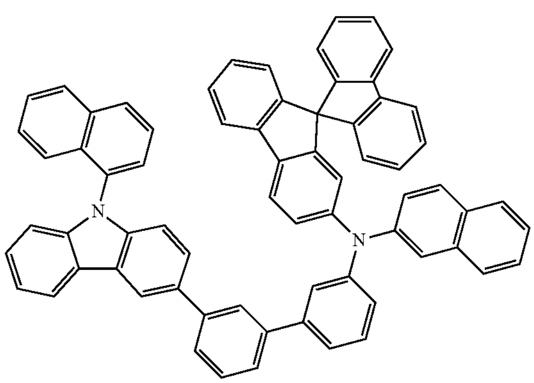
6-116
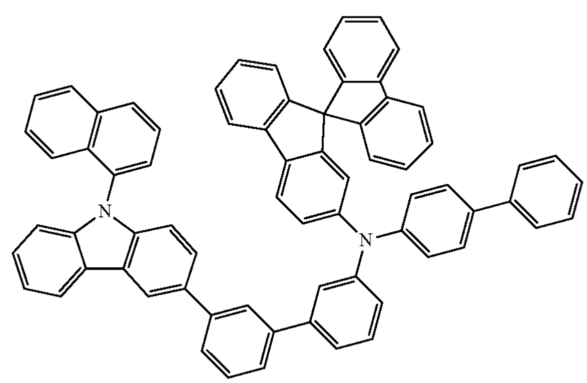
6-117
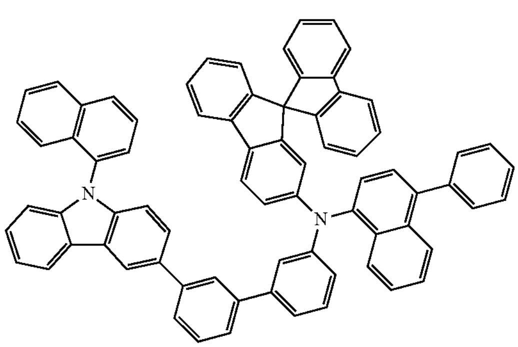
6-118
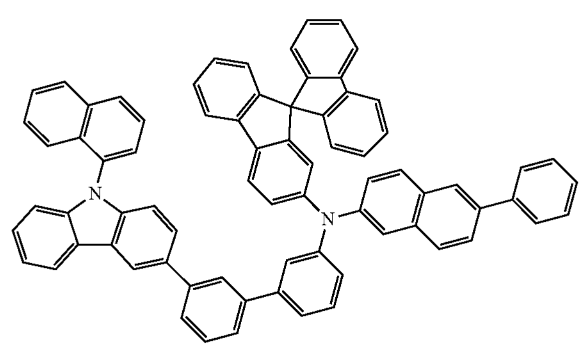

-continued
6-119
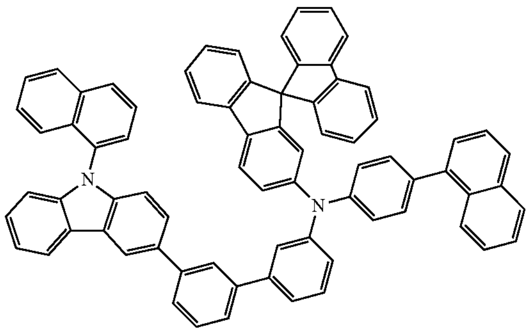
6-120
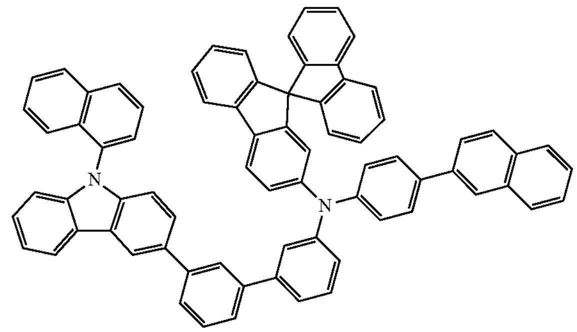
6-121
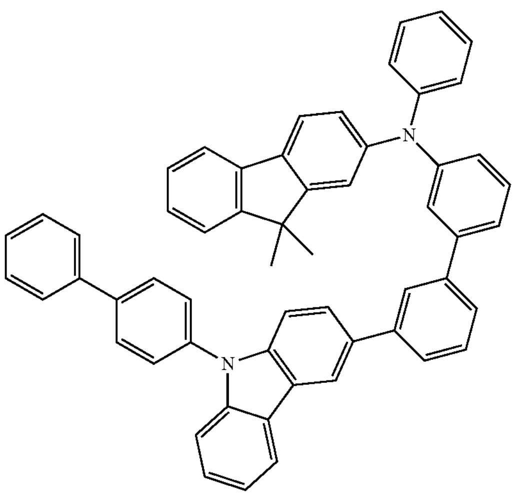
6-122
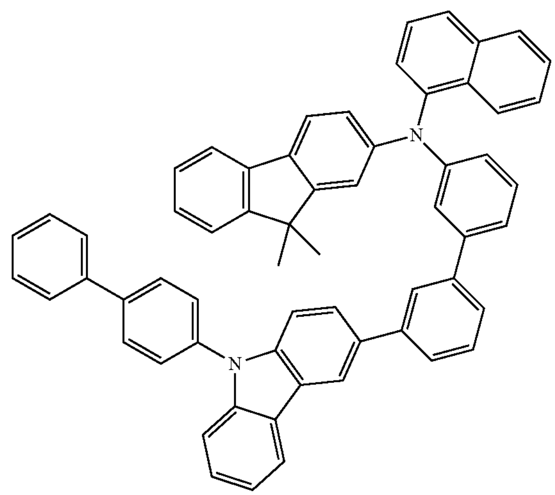
6-123
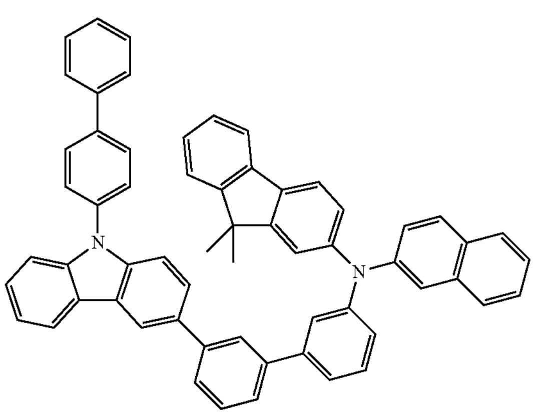
6-124
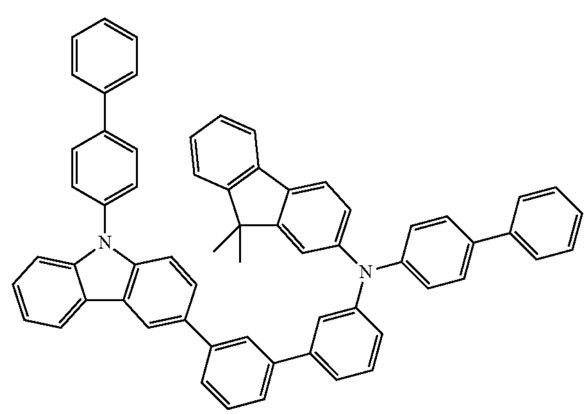

-continued
6-125
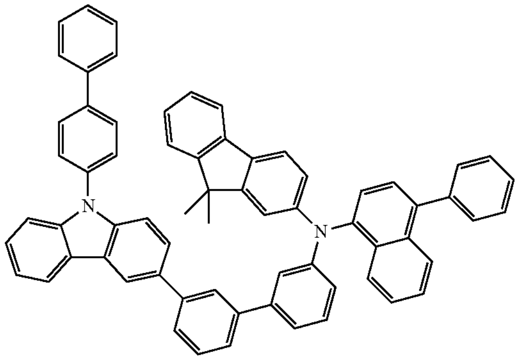
6-126
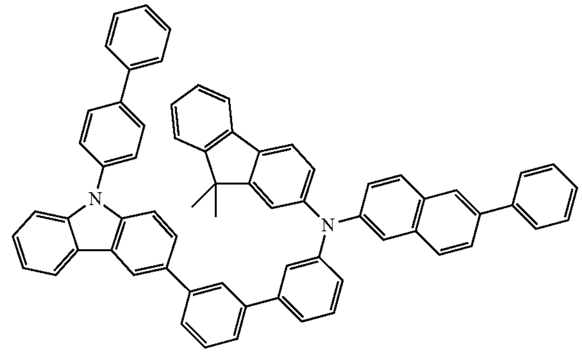
6-127
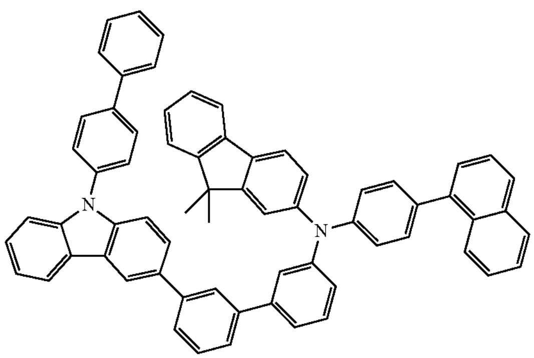
6-128
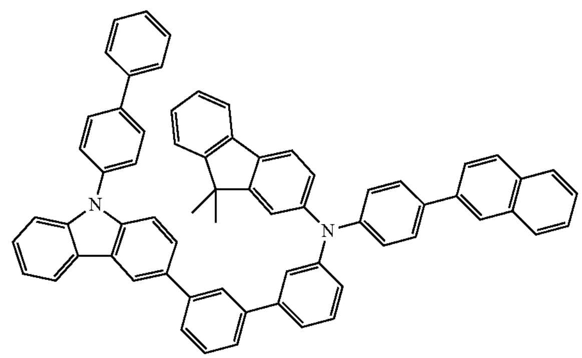
6-129
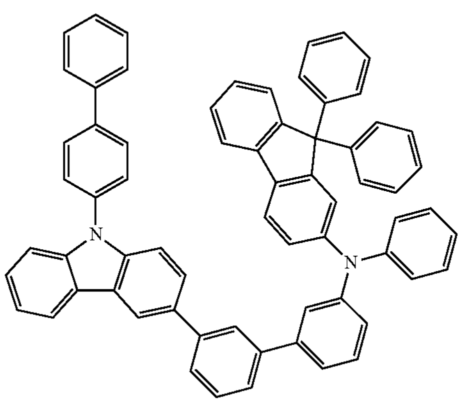
6-130
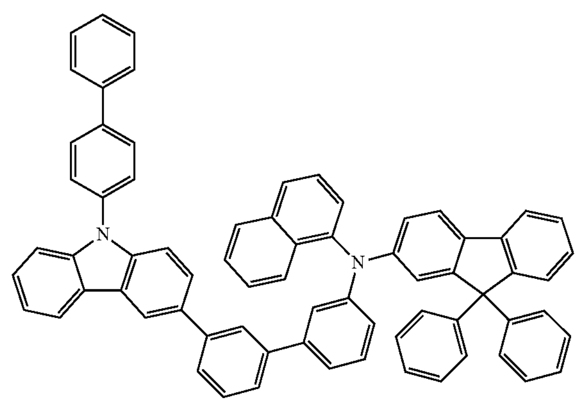
6-131
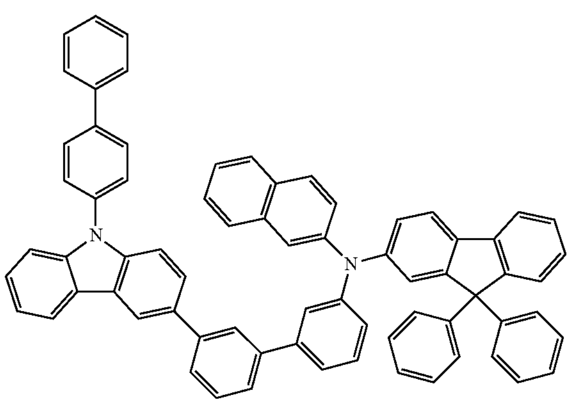
6-132
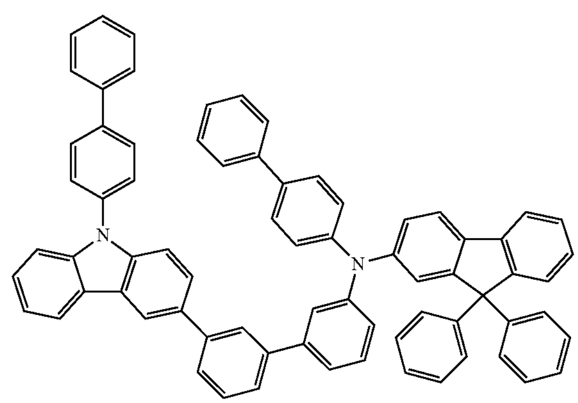

-continued
6-133
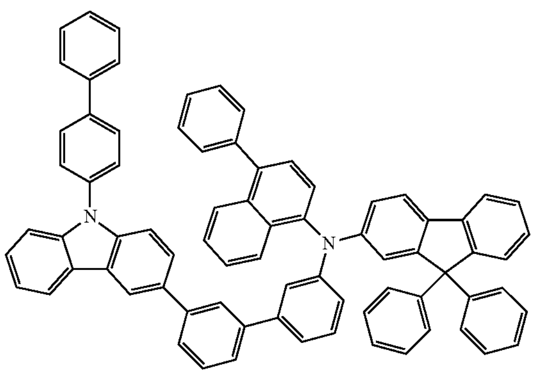
6-134
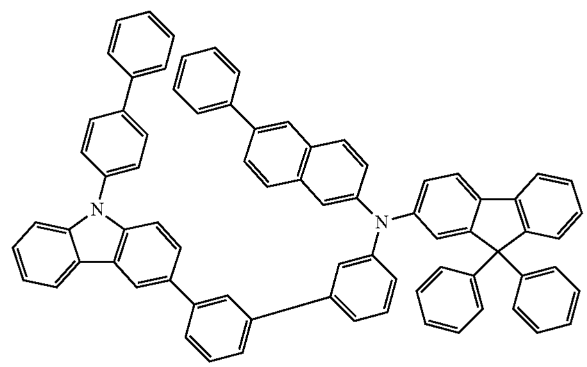
6-135
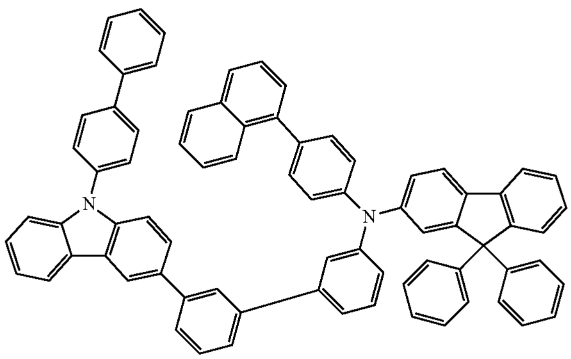
6-136
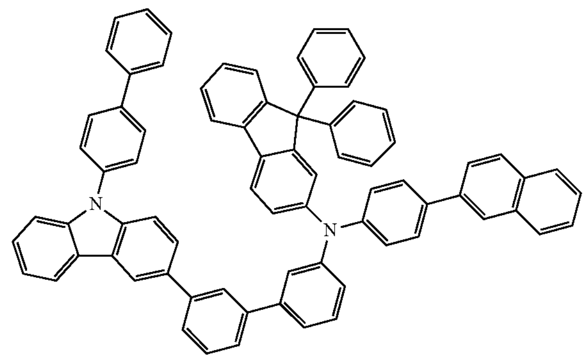
6-137
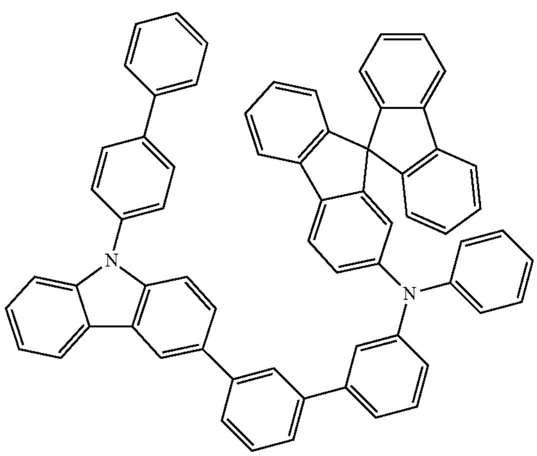
6-138
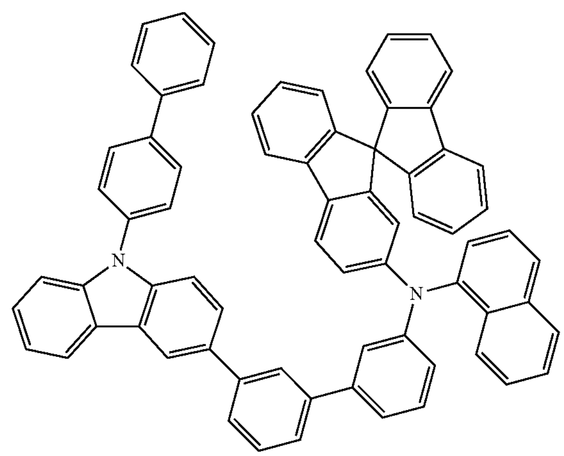
6-139
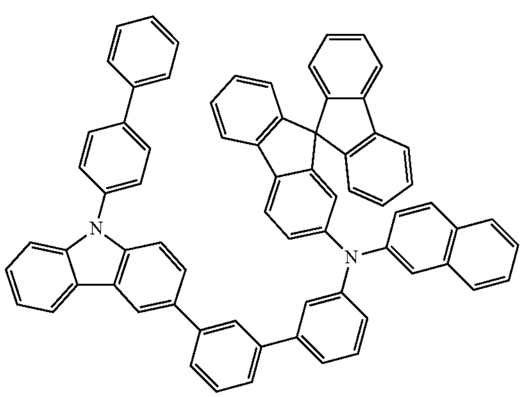
6-140
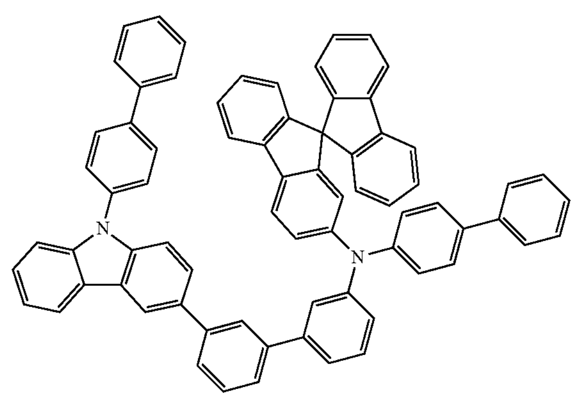

-continued 6-141

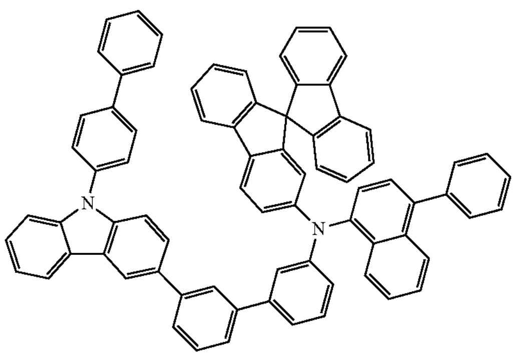

6-142

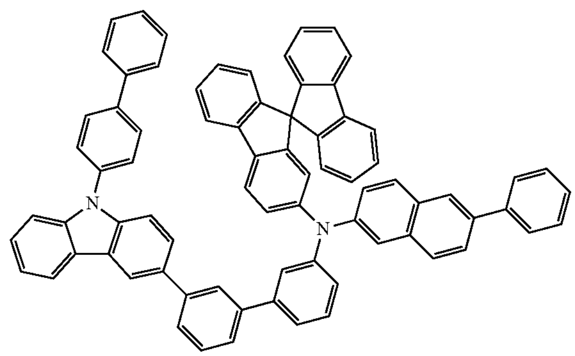

6-143

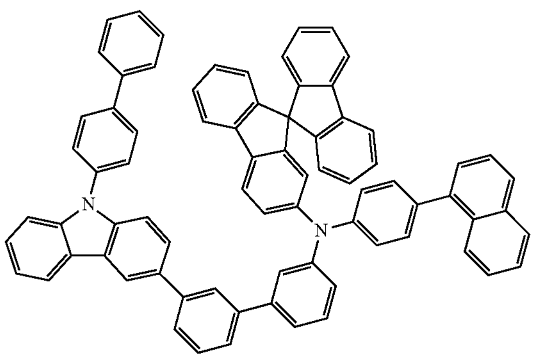

6-144

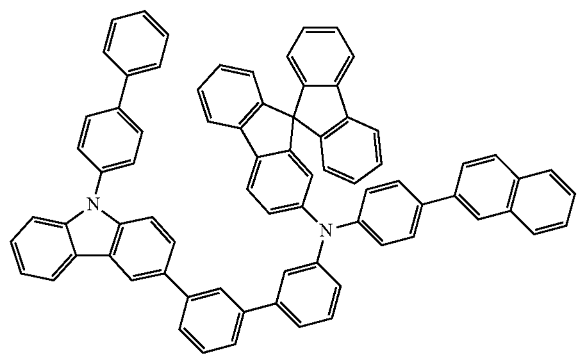

According to another embodiment of the present invention, an organic light-emitting diode includes a first electrode, a second electrode, and an organic layer between the first electrode and the second electrode, the organic layer including an emission layer including at least one light-emitting material represented by Formula 1 below, and a region between the first electrode and the emission layer including at least one hole transport material represented by one of Formulae 2c to 2f below:

<Formula 1>

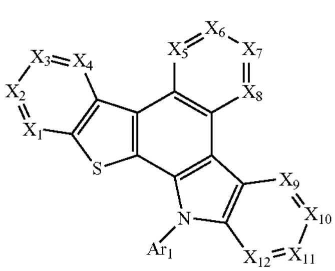

<Formula 2c>

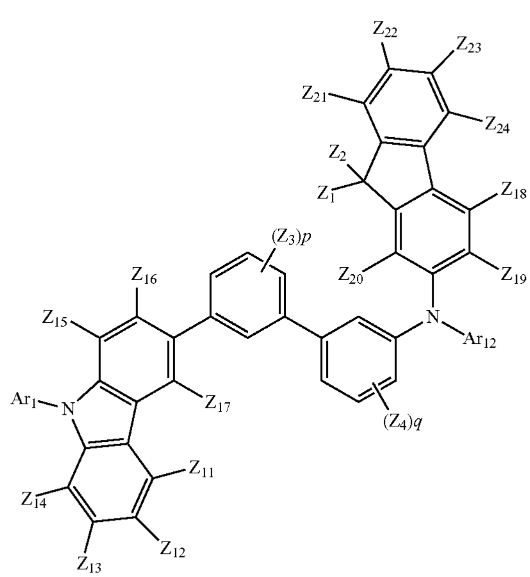

-continued

<Formula 2d>

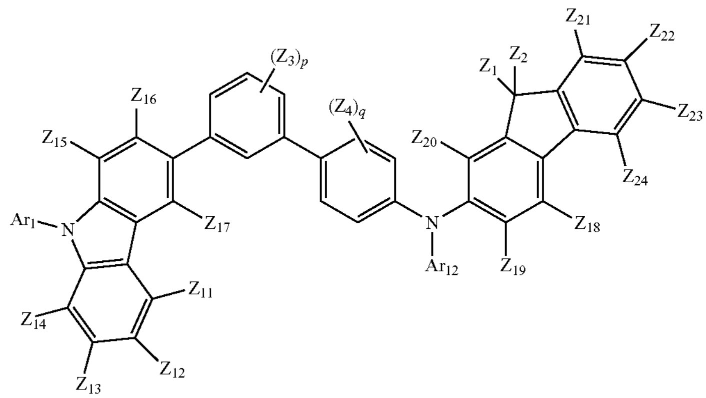

<Formula 2e>

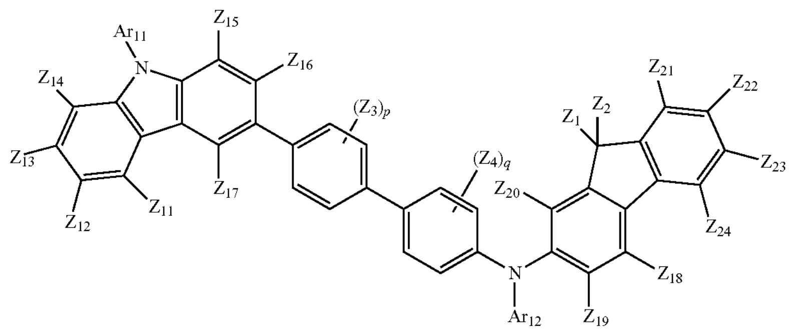

<Formula 2f>

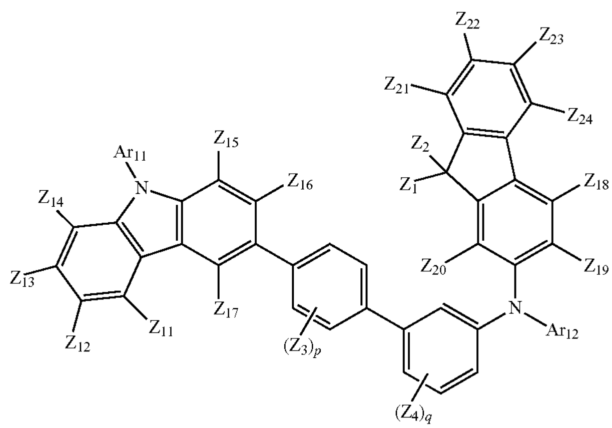

In Formula 1 above, $X_1$ to $X_{12}$, and $Ar_1$ are the same as defined above.

In Formulae 2c to 2f above, $Ar_{11}$ and $Ar_{12}$ may be each independently selected from a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, and a substituted or unsubstituted $C_2$-$C_{60}$heteroaryl group.

In some embodiments, in Formulae 2c to 2f, $Ar_{11}$ and $Ar_{12}$ may be each independently selected from:

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group; and a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group, but are not limited thereto.

In some other embodiments, in Formulae 2c to 2f, $Ar_{11}$ and $Ar_{12}$ may be each independently selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolylene group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolylene group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substitute with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a $C_6$-$C_{20}$aryl group, and a $C_2$-$C_{20}$heteroaryl group, but are not limited thereto.

In still other embodiments, in Formulae 2c to 2f, $Ar_{11}$ and $Ar_{12}$ may be each independently selected from:

a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, but are not limited thereto.

In yet other embodiments, in Formulae 2c to 2f, $Ar_{11}$ and $Ar_{12}$ may be each independently selected from one of the groups represented by Formulae 3-1 to 3-20 below, but are not limited thereto:

Formula 3-1

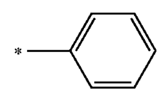

Formula 3-2

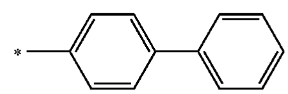

Formula 3-3

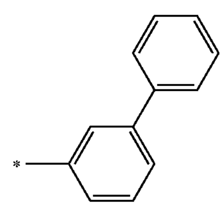

Formula 3-4

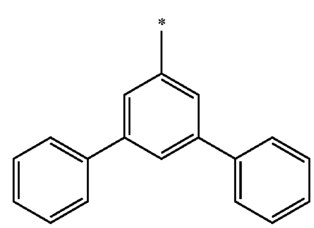

Formula 3-5

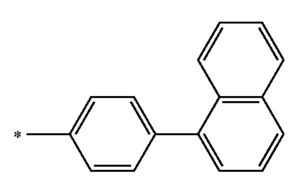

Formula 3-6

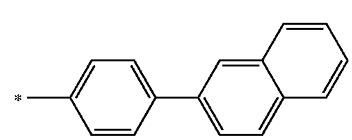

-continued

Formula 3-7

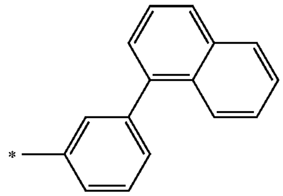

Formula 3-8

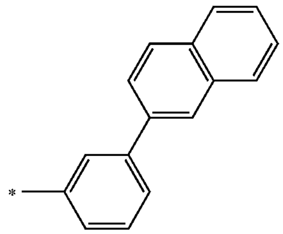

Formula 3-9

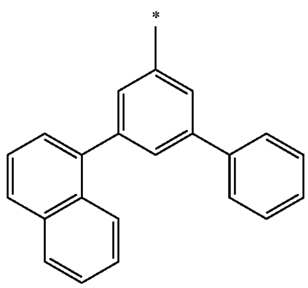

Formula 3-10

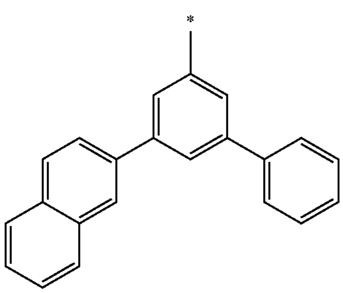

Formula 3-11

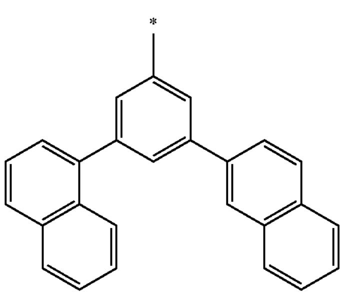

Formula 3-12

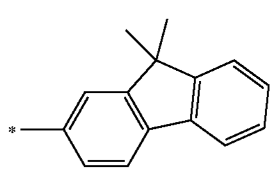

-continued

Formula 3-13

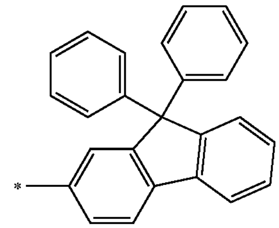

Formula 3-14

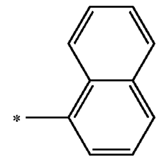

Formula 3-15

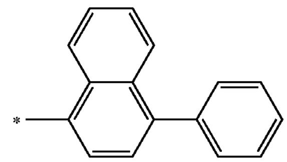

Formula 3-16

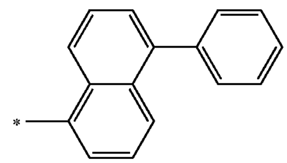

Formula 3-17

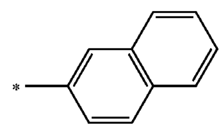

Formula 3-18

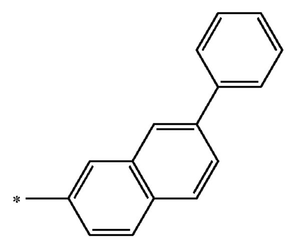

Formula 3-19

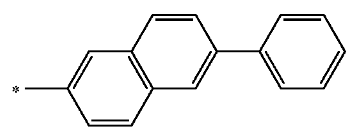

Formula 3-20

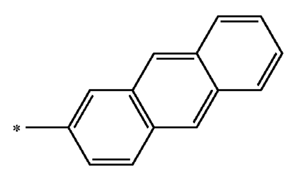

In Formulae 3-1 to 3-20 above, * indicates a binding site to a corresponding N in Formulae 2c to 2f.

In Formulae 2c to 2f above, $Z_1$ to $Z_4$, and $Z_{11}$ to $Z_{24}$ may be each independently selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, and $C_1$-$C_{60}$alkoxy group;

a $C_1$-$C_{60}$alkyl group, a $C_2$-$C_{60}$alkenyl group, a $C_2$-$C_{60}$alkynyl group, and a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group; and —$N(Q_{11})(Q_{12})$, —$Si(Q_{13})(Q_{14})(Q_{16})$, and —$B(Q_{16})(Q_{17})$, where $Q_{11}$ and $Q_{17}$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group.

In some embodiments, in Formulae 2c to 2f, $Z_1$ and $Z_2$ may be each independently selected from:

a $C_1$-$C_{60}$alkyl group, a $C_2$-$C_{60}$alkenyl group, a $C_2$-$C_{60}$alkynyl group, and a $C_1$-$C_{60}$alkoxy group;

a $C_1$-$C_{60}$alkyl group, a $C_2$-$C_{60}$alkenyl group, a $C_2$-$C_{60}$alkynyl group, and a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group; and a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group, but are not limited thereto.

In some other embodiments, in Formulae 2c to 2f, $Z_1$ and $Z_2$ may be each independently selected from:

a $C_1$-$C_{20}$alkyl group;

a $C_1$-$C_{20}$alkyl group substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, but are not limited thereto.

In still other embodiments, in Formulae 2c to 2f, $Z_1$ and $Z_2$ may be each independently selected from a methyl group, an ethyl group, a propyl group, a butyl group, a pentyl group, a hexyl group, a heptyl group, and a group represented by one of Formulae 3-1 to 3-20 below, but are not limited thereto.

For example, in Formulae 2c to 2f, $Z_3$, $Z_4$, and $Z_{11}$ to $Z_{24}$ may be each independently selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{20}$alkyl group;

a $C_1$-$C_{20}$alkyl group substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, but are not limited thereto.

In some embodiments, in Formulae 2c to 2f, $Z_3$, $Z_4$, and $Z_{11}$ to $Z_{24}$ may be each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{20}$alkyl group, but are not limited thereto.

In some other embodiments, in Formulae 2c to 2f, $Z_3$, $Z_4$, and $Z_{11}$ to $Z_{24}$ may be each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and the a group represented by one of Formulae 3-1 to 3-20 above, but are not limited thereto.

In Formulae 2c to 2f above, p and q, which indicate the numbers of $Z_3$s and $Z_4$s, respectively, may be each independently selected from an integer from 1 to 4. When p is an integer of 2 or greater, a plurality of $Z_3$s may be the same or different. When q is an integer of 2 or greater, a plurality of $Z_4$s may be the same or different.

For example, the light-emitting material of Formula 1 above may include a compound represented by Formula 1a below, and the hole transport material represented by one of Formulae 2c to 2f above may include a compound represented by one of Formulae 2g to 2j below:

<Formula 1a>

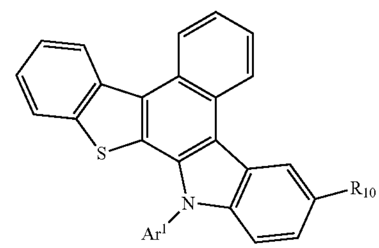

<Formula 2g>

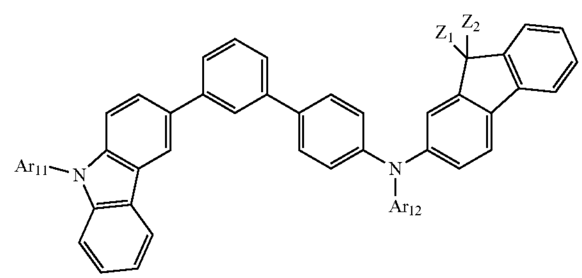

<Formula 2h>

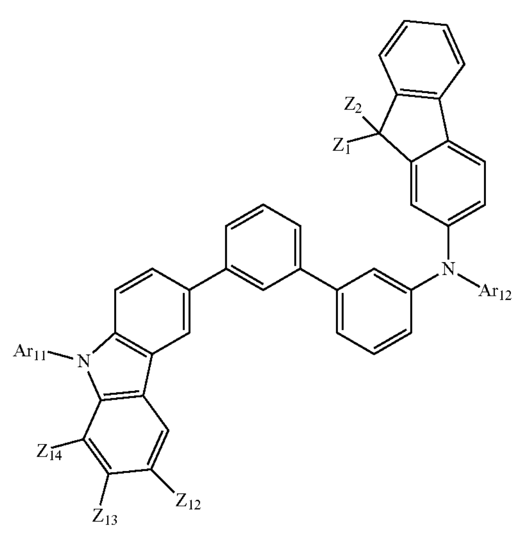

-continued

<Formula 2i>

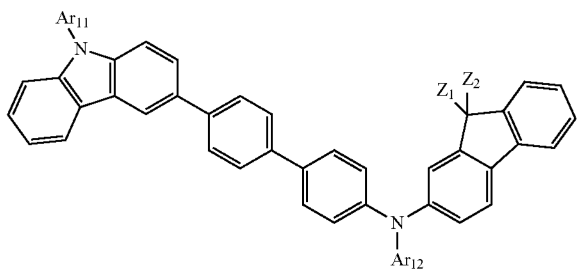

<Formula 2j>

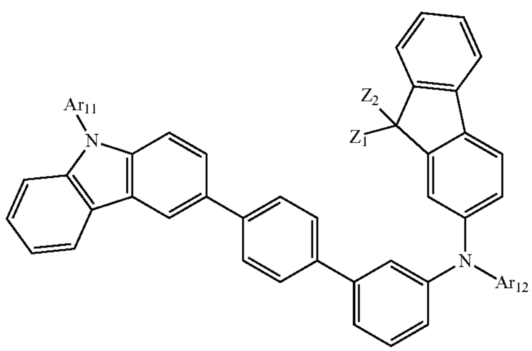

In Formula 1a, and Formulae 2g to 2j:

$R_{10}$ may be selected from a hydrogen atom and a phenyl group; a pyrimidyl group substituted with a phenyl group; and a phenyl group substituted with a pyrimidyl group substituted with a phenyl group;

$Ar_1$ may be selected from:

a phenyl group, a pyrimidyl group, a quinolinyl group, an isoquinolinyl group, a naphthyridinyl group, a quinazolinyl group, and a triazinyl group; and a phenyl group, a pyrimidyl group, a quinolinyl group, an isoquinolinyl group, a naphthyridinyl group, a quinazolinyl group, and a triazinyl group, each substituted with at least one selected from a phenyl group, a naphthyl group, and a pyridyl group; and a phenyl group, a naphthyl group, a pyridyl group, a pyrimidyl group, a quinolinyl group, an isoquinolinyl group, a naphthyridinyl group, a quinazolinyl group, and a triazinyl group, each substituted with at least one of a phenyl group, a naphthyl group, and a pyridyl group;

$Ar_{11}$ and $Ar_{12}$ may be each independently selected from a group represented by one of Formulae 3-1 to 3-20 above; and $Z_1$ and $Z_2$ may be each independently selected from a methyl group, an ethyl group, a propyl group, a butyl group, a pentyl group, a hexyl group, a heptyl group, and a group represented by one of Formulae 3-1 to 3-20 above.

For example, the light-emitting material of Formula 1 above may include one of Compounds 1-1 to 1-18 below, and the hole transport material of one of Formulae 2c to 2f above may include one of Compounds 5-1 to 5-144 and Compounds 6-1 to 6-144 below, but embodiments of the present invention are not limited thereto:

[Compound 1-1]

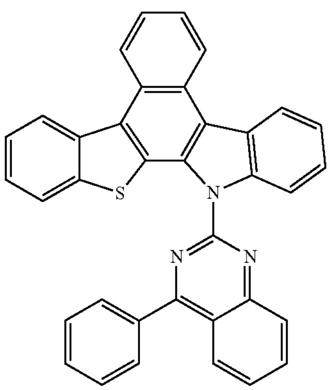

[Compound 1-2]

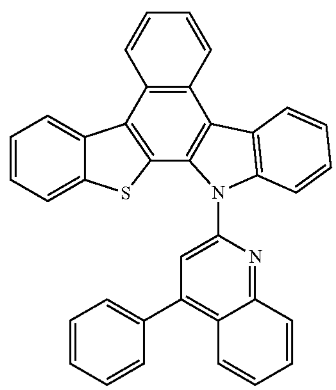

[Compound 1-3]

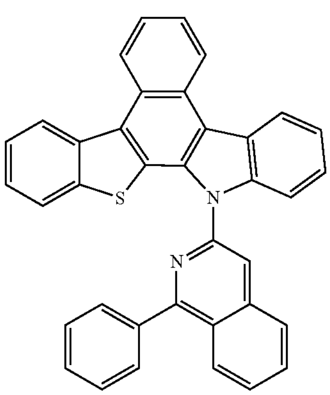

[Compound 1-4]

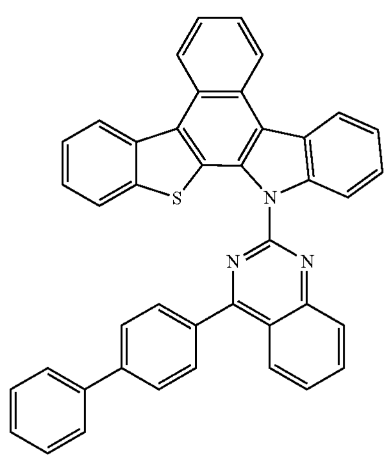

-continued
[Compound 1-5]
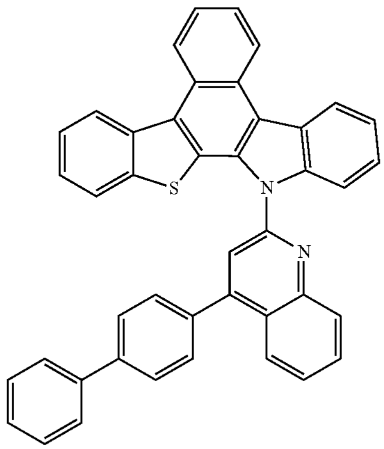
[Compound 1-6]
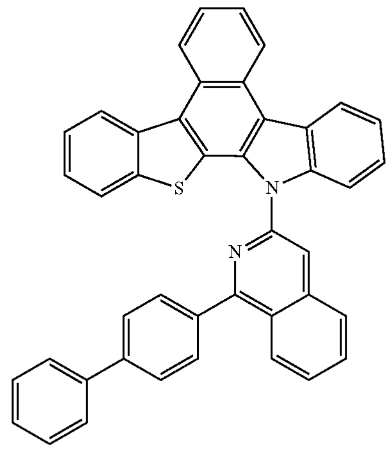
[Compound 1-7]
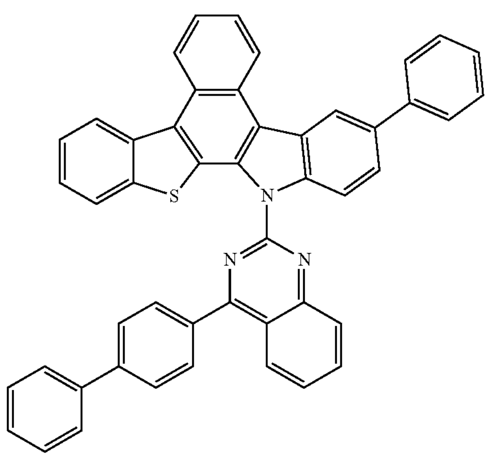
[Compound 1-8]
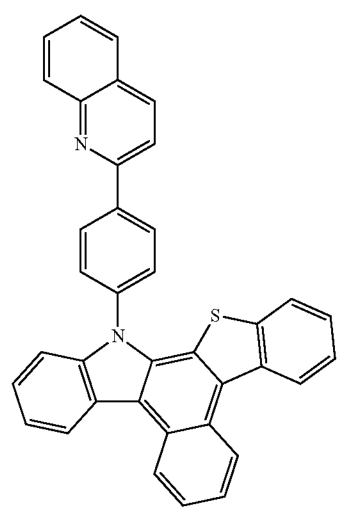
[Compound 1-9]
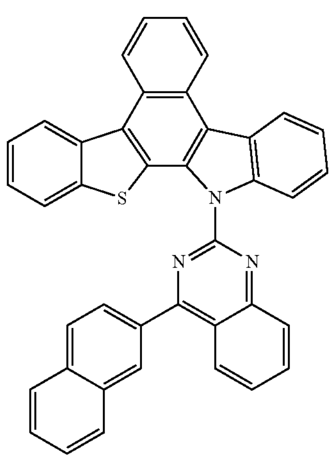
[Compound 1-10]
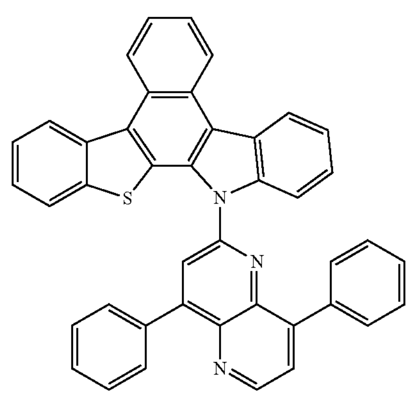

-continued
[Compound 1-11]
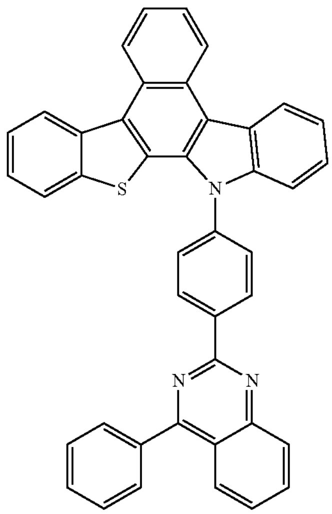
[Compound 1-12]
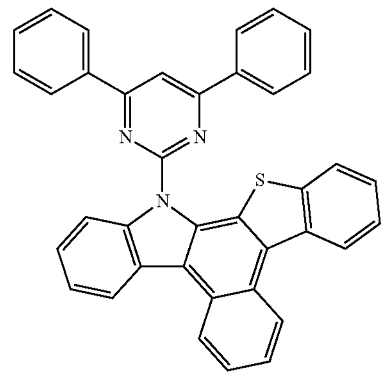
[Compound 1-13]
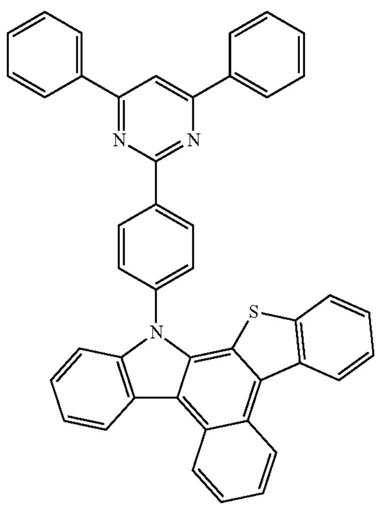
[Compound 1-14]
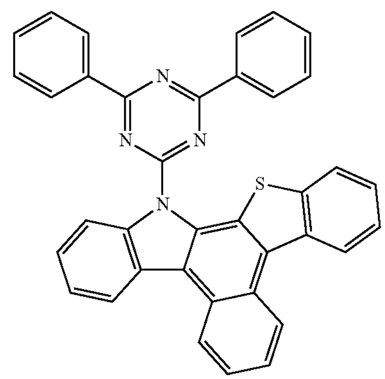
[Compound 1-15]
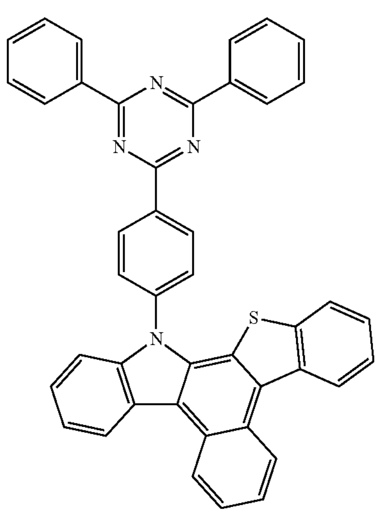
[Compound 1-16]
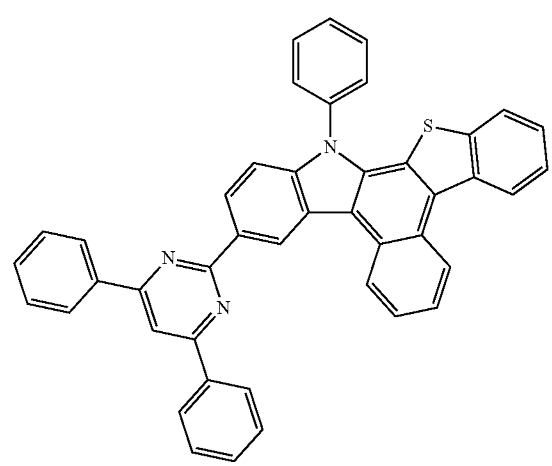

-continued
[Compound 1-17]
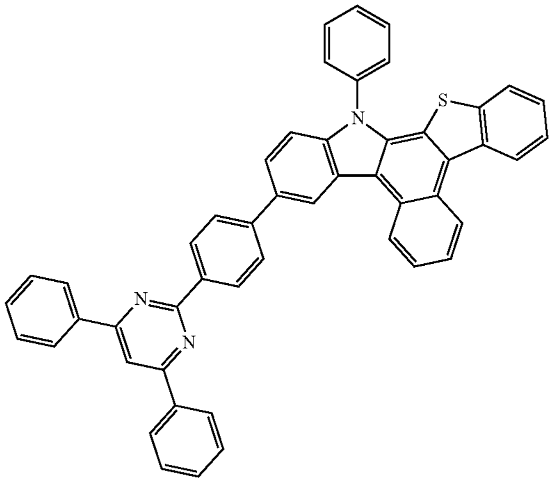
[Compound 1-18]
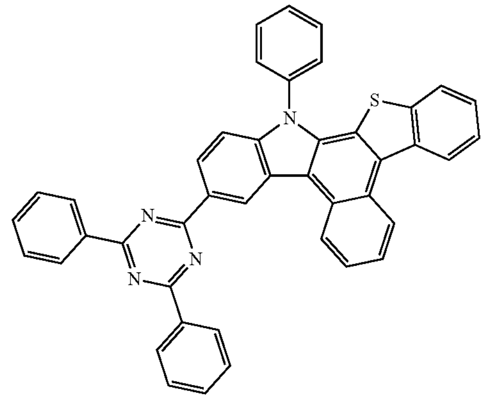
5-1
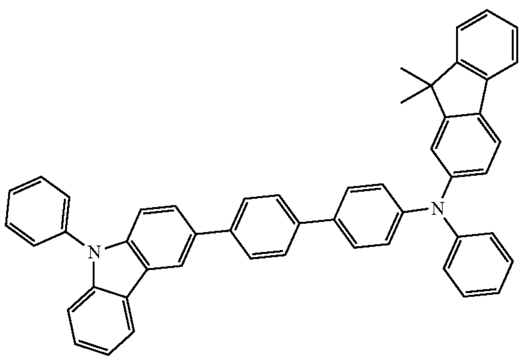
5-2
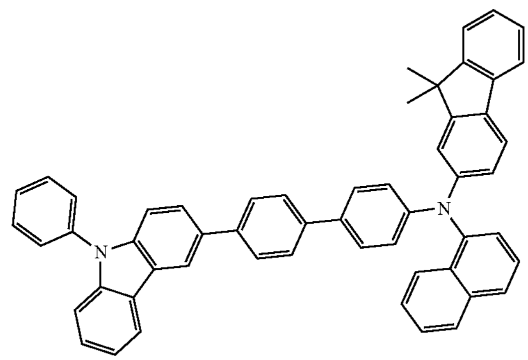
5-3
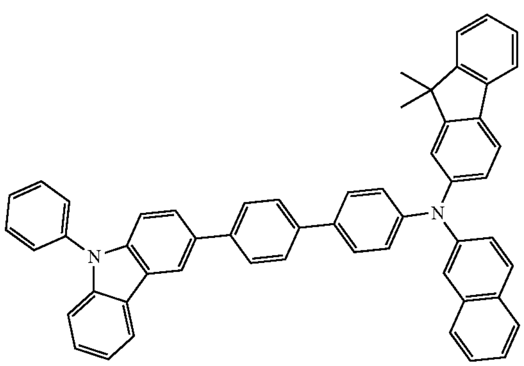
5-4
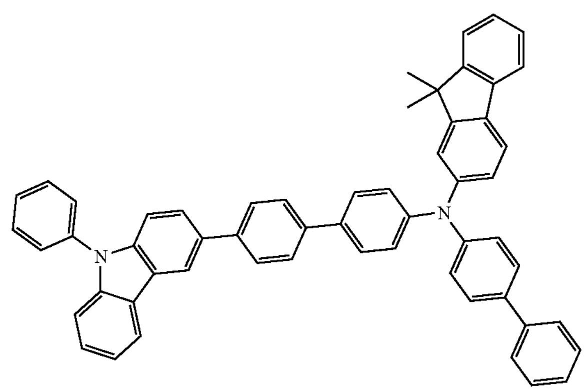

-continued
5-5
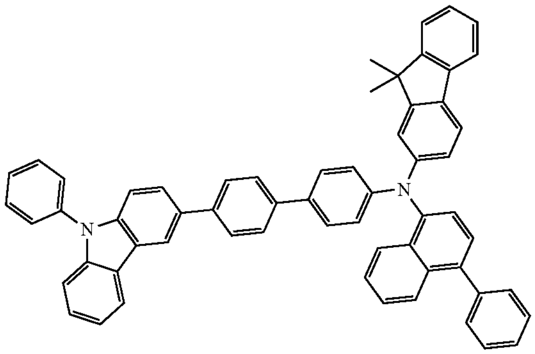
5-6
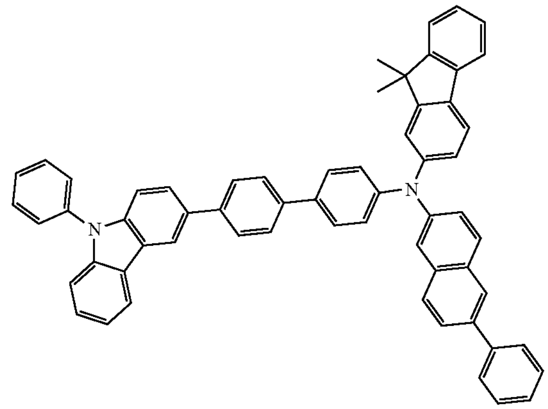
5-7
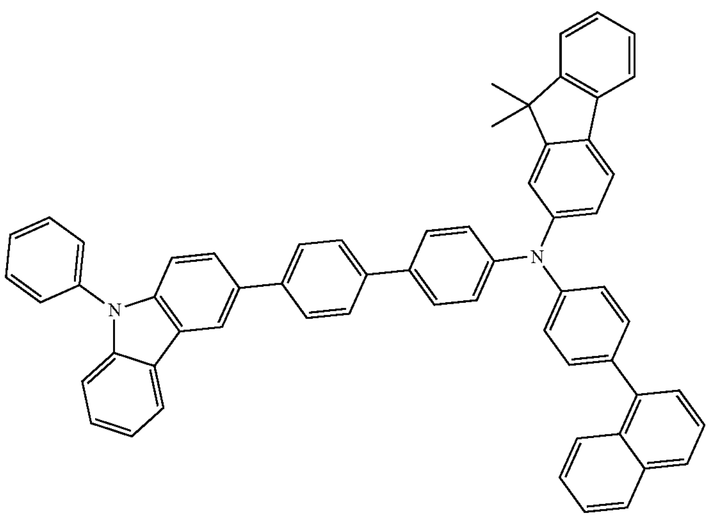
5-8
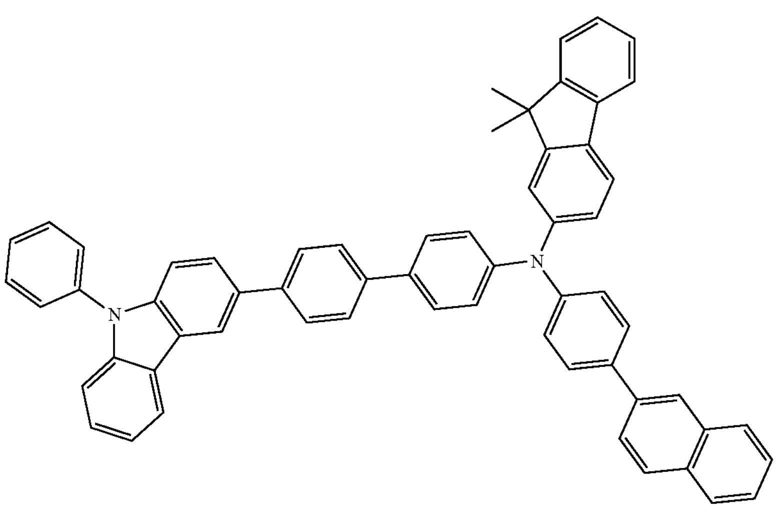

-continued
5-9
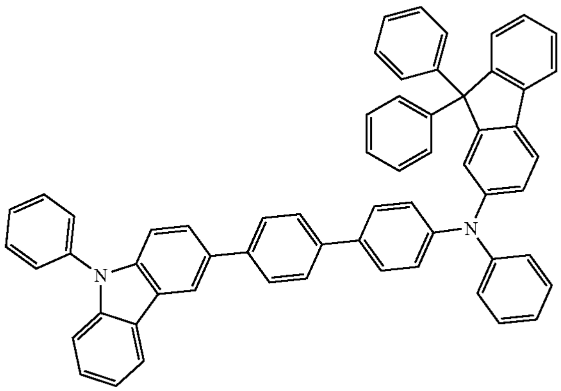
5-10
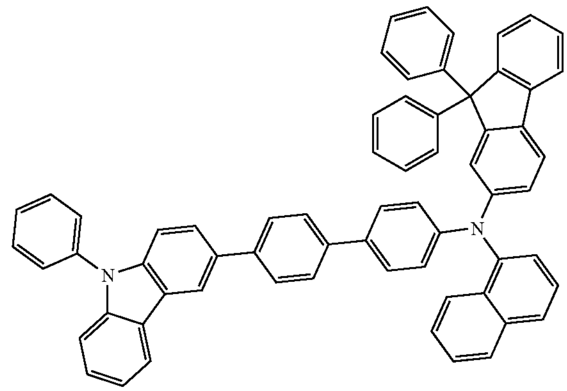
5-11
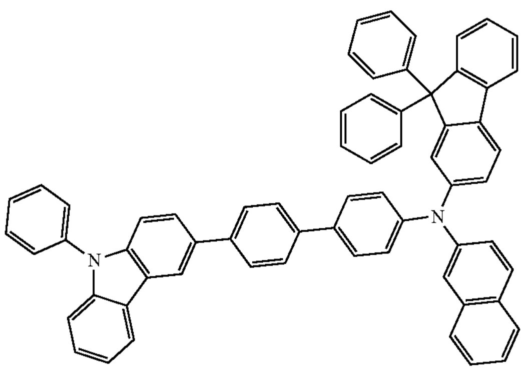
5-12
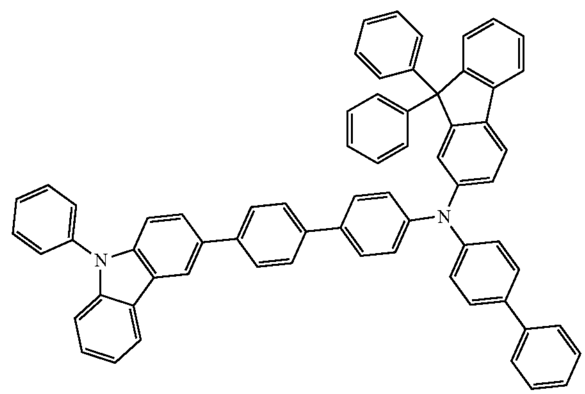
5-13
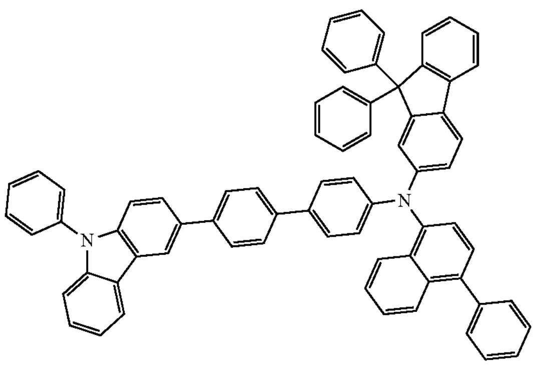
5-14
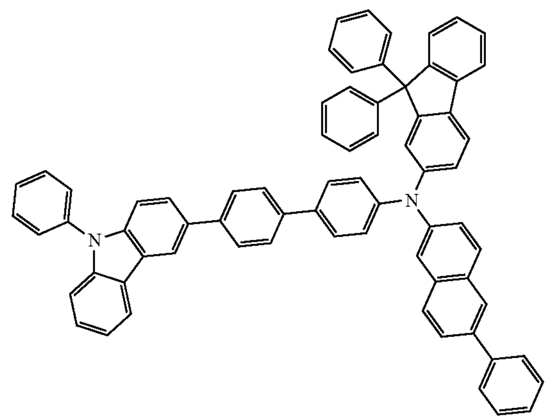
5-15
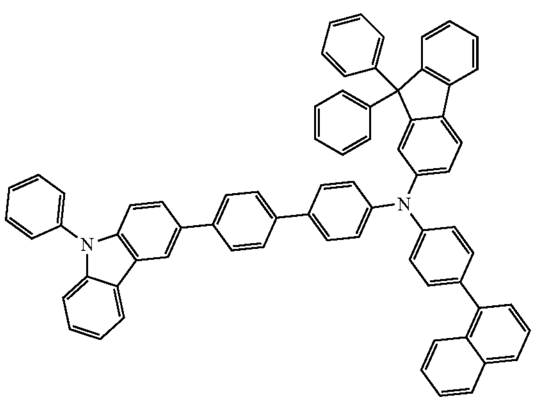
5-16
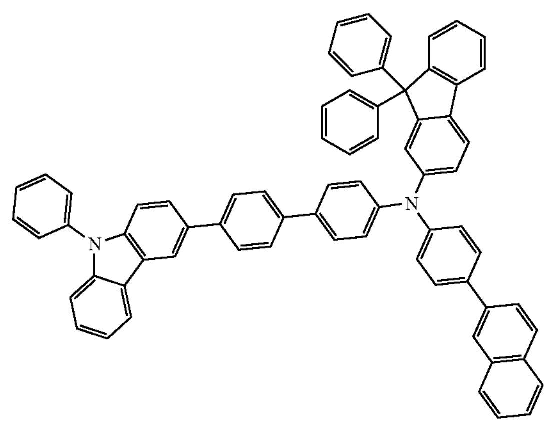

-continued
5-17
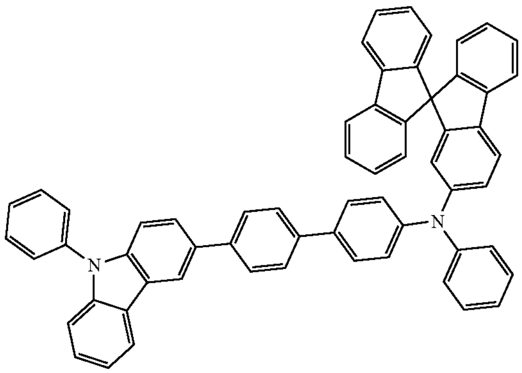
5-18
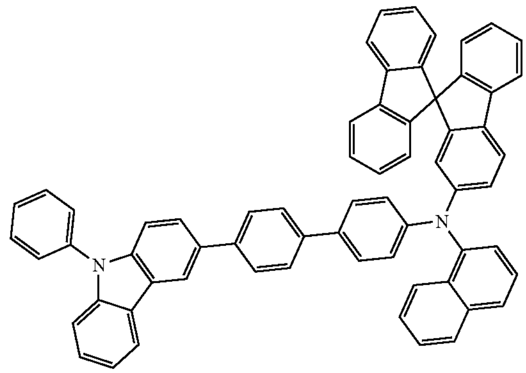
5-19
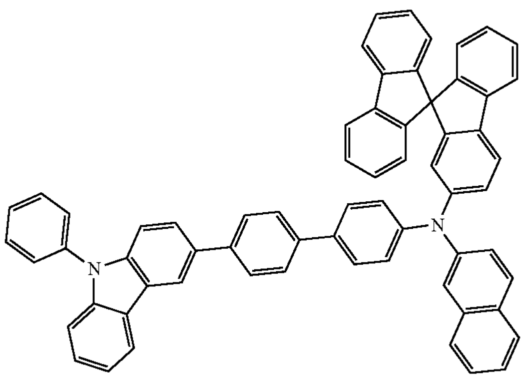
5-20
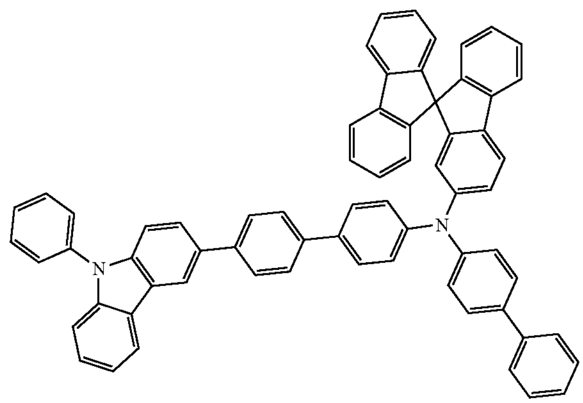
5-21
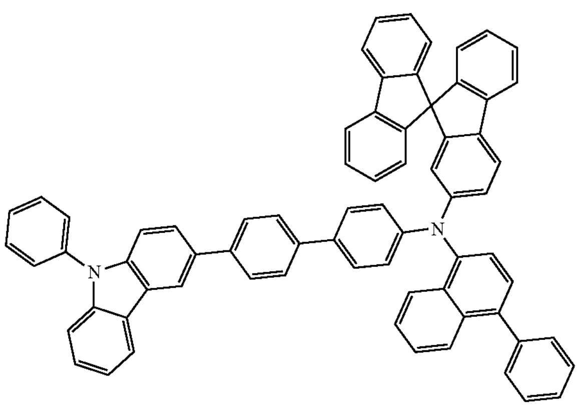
5-22
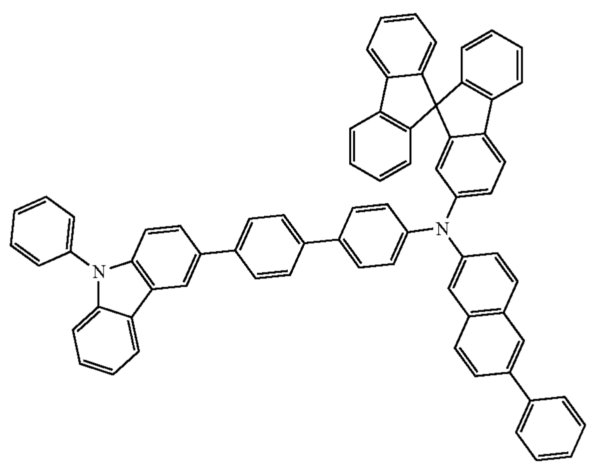

-continued
5-23
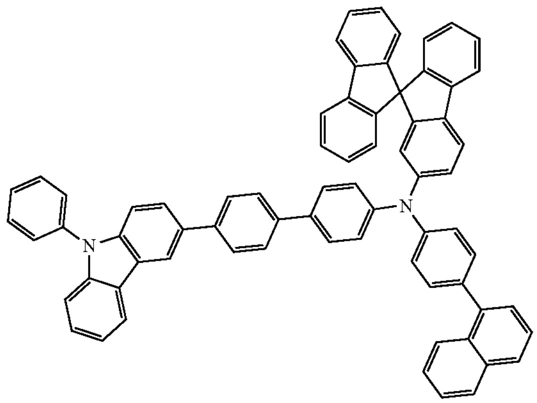
5-24
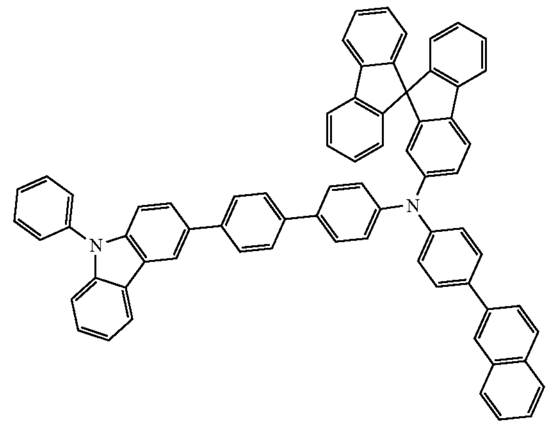
5-25
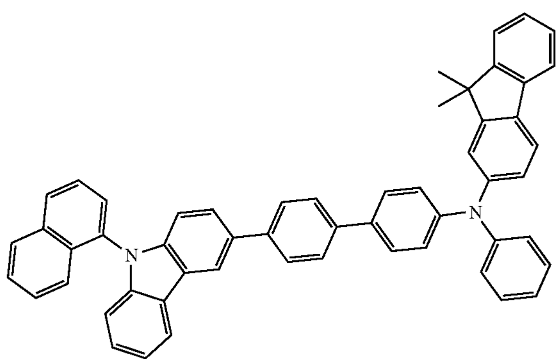
5-26
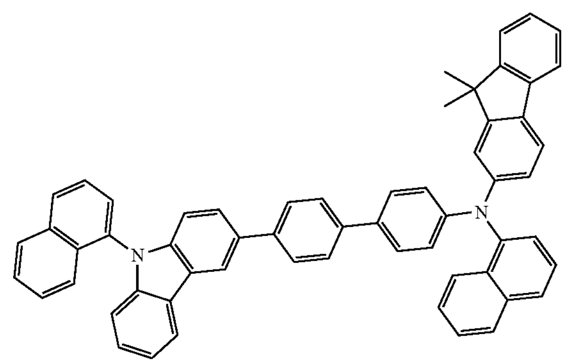
5-27
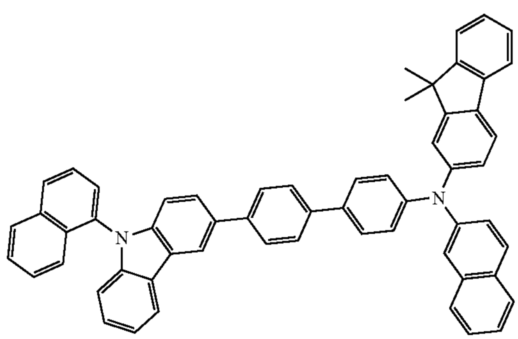
5-28
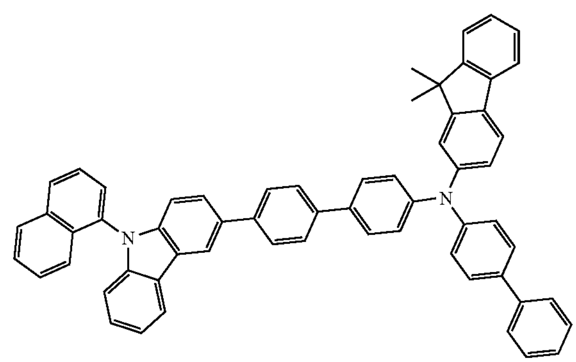
5-29
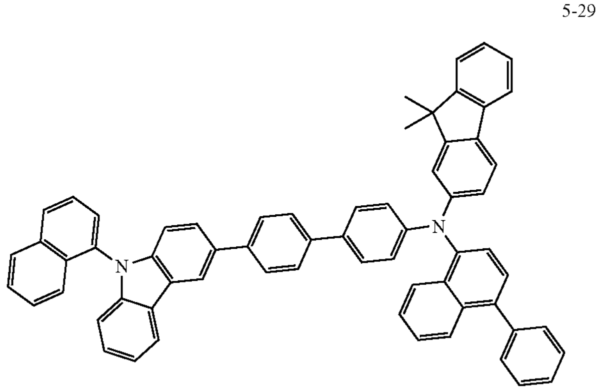
5-30
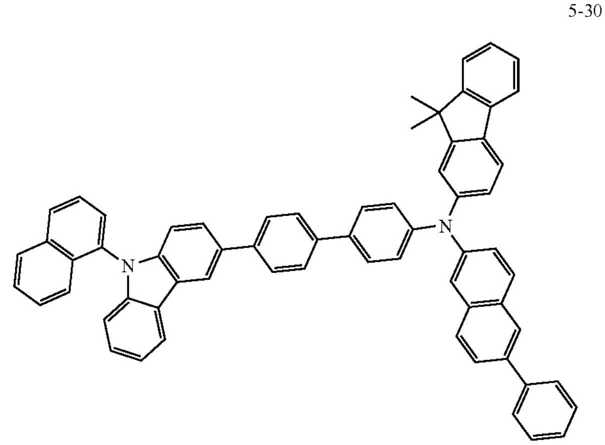

-continued
5-31
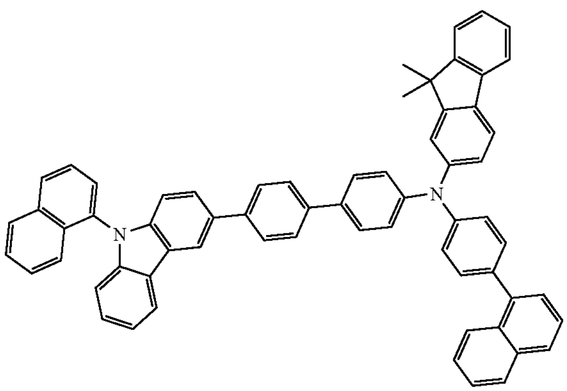
5-32
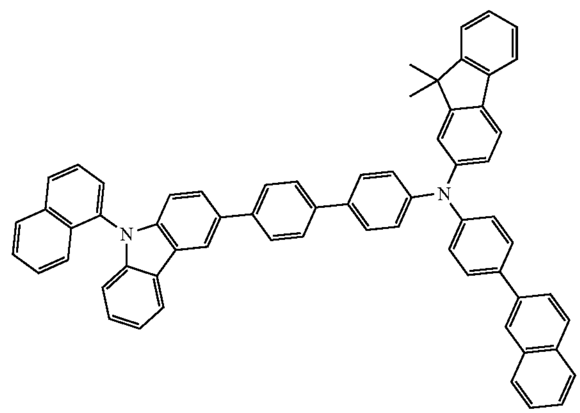
5-33
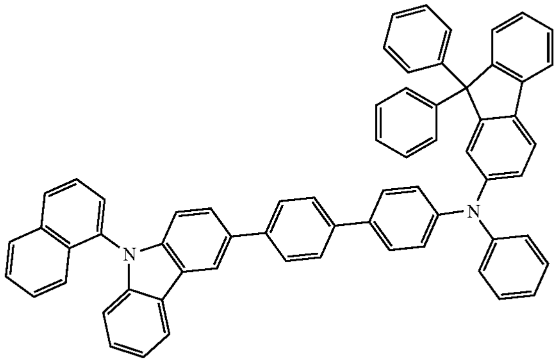
5-34
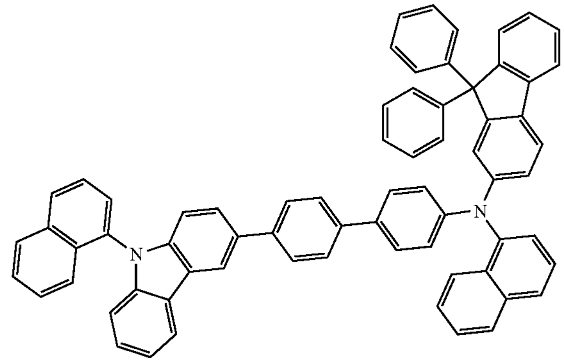
5-35
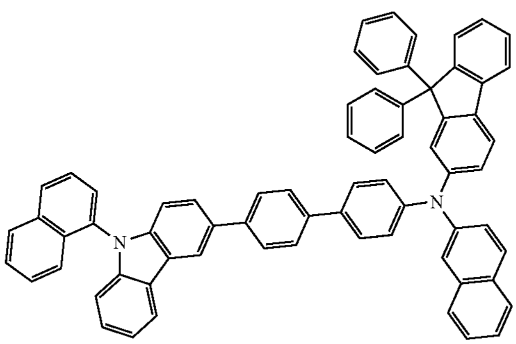
5-36
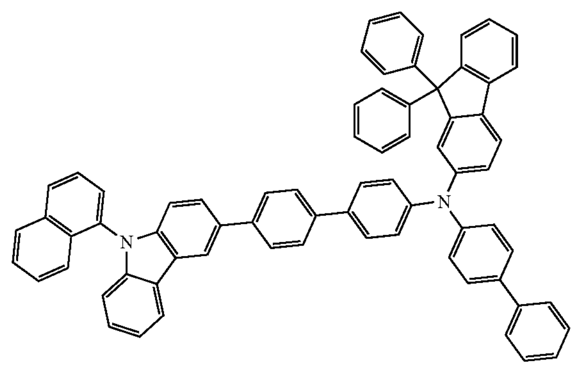
5-37
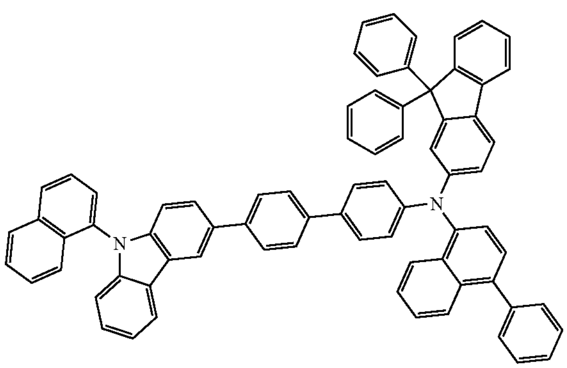
5-38
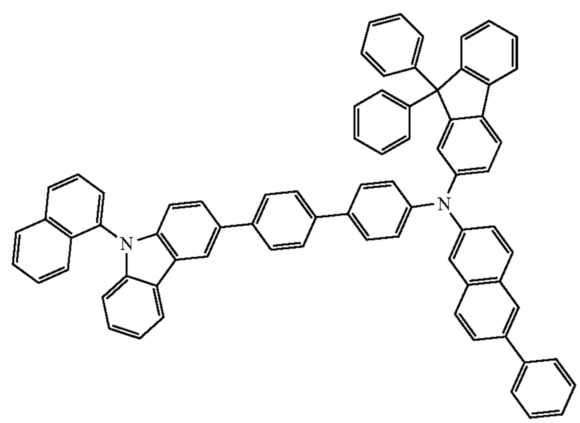

-continued
5-39
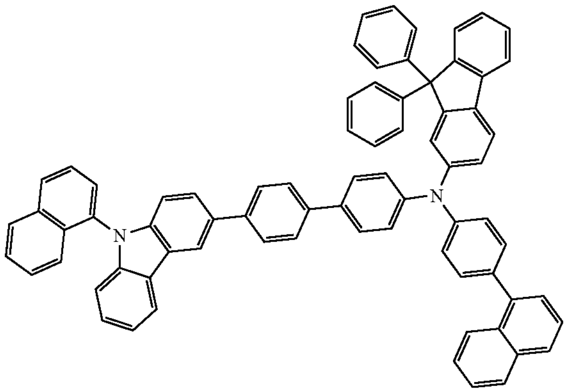
5-40
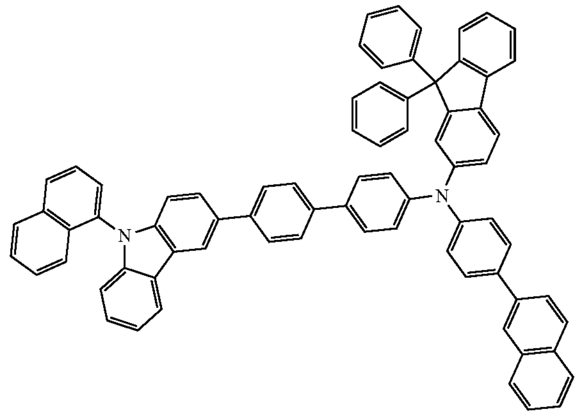
5-41
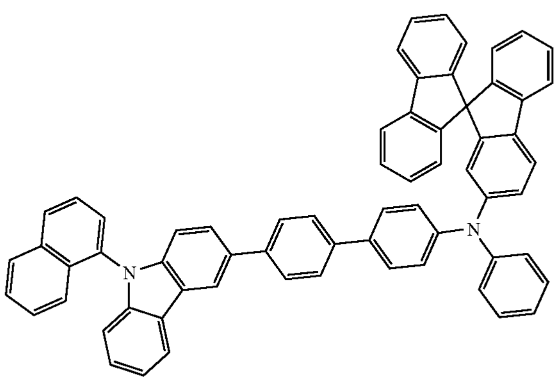
5-42
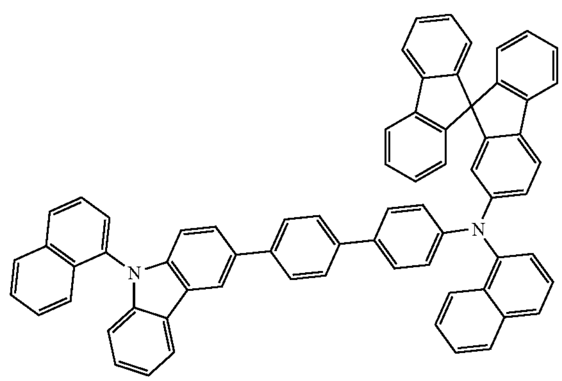
5-43
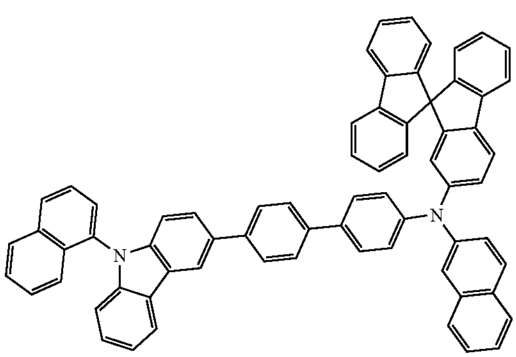
5-44
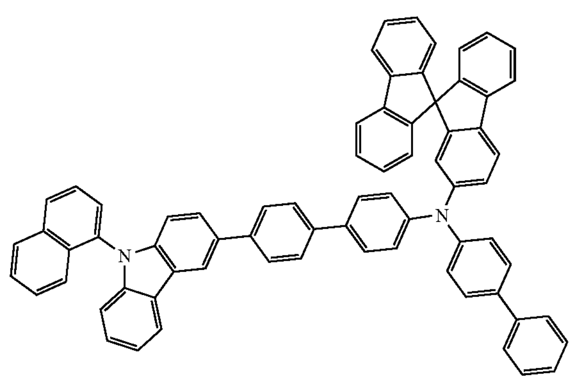

-continued
5-45
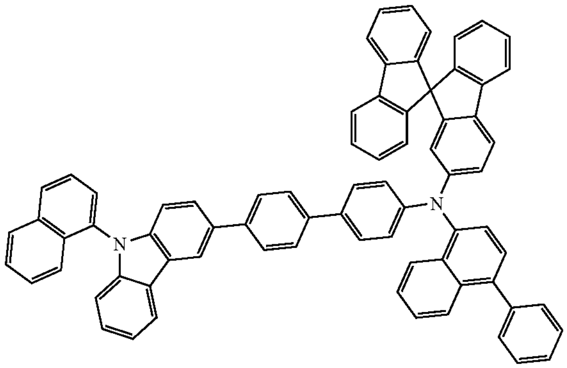
5-46
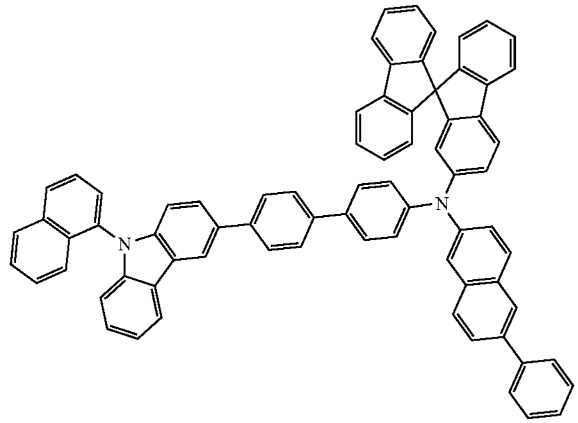
5-47
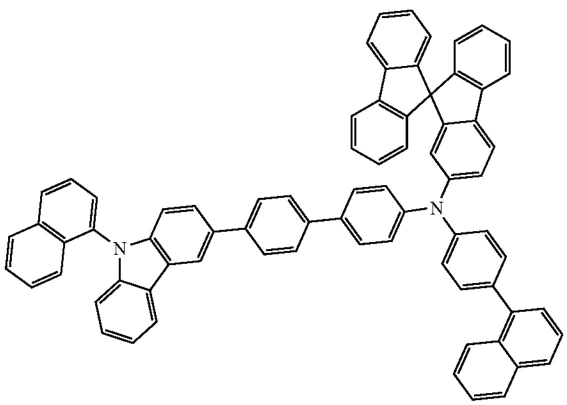
5-48
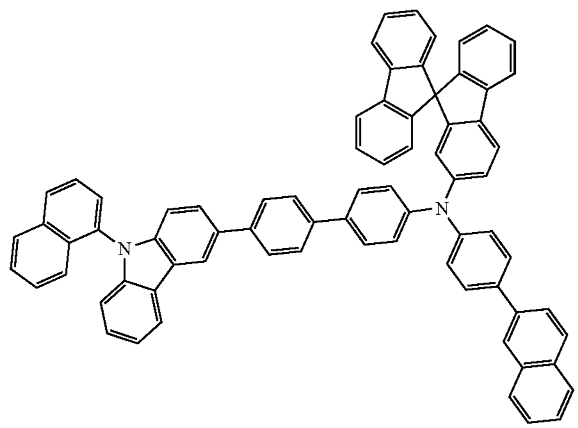
5-49
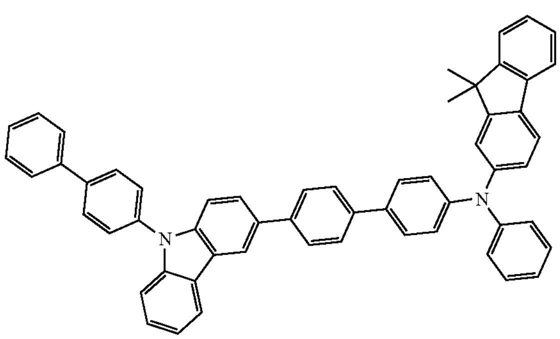
5-50
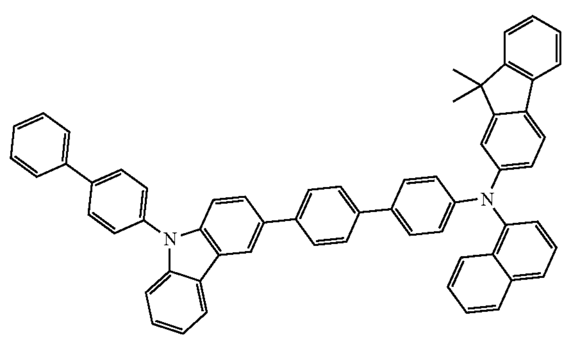

-continued
5-51
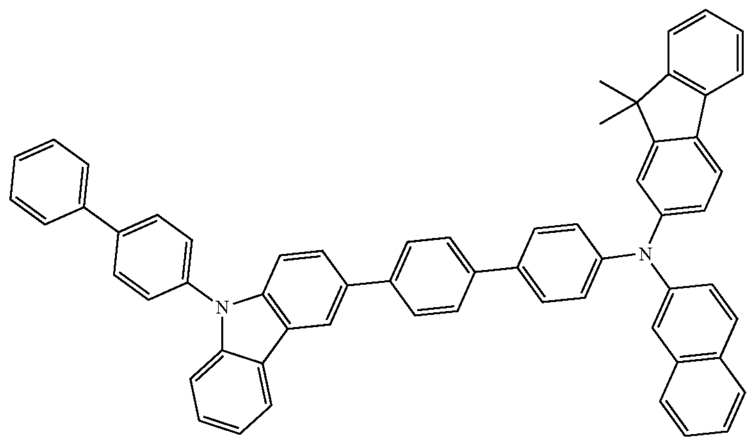
5-52
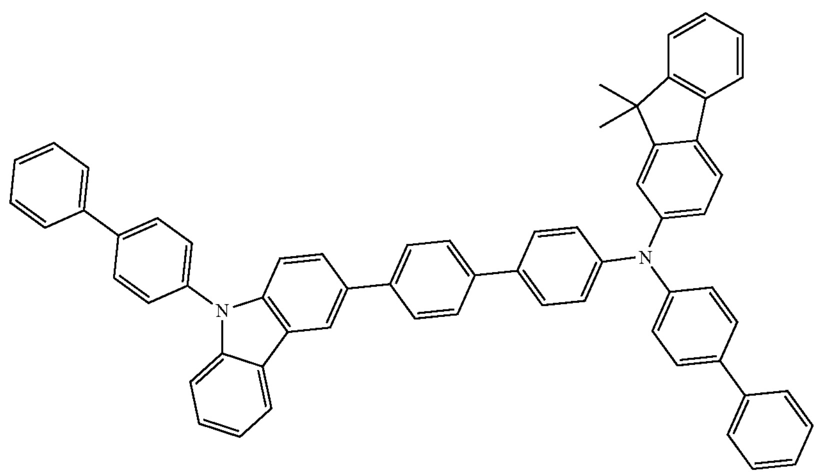
5-53
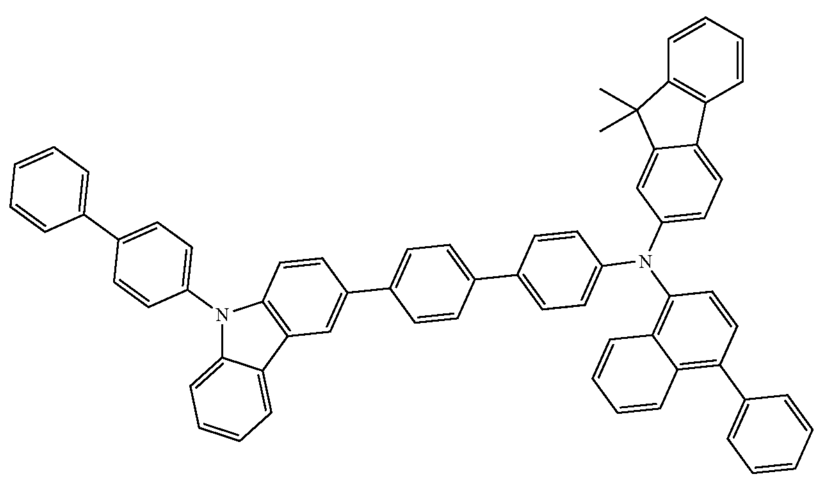

-continued
5-54
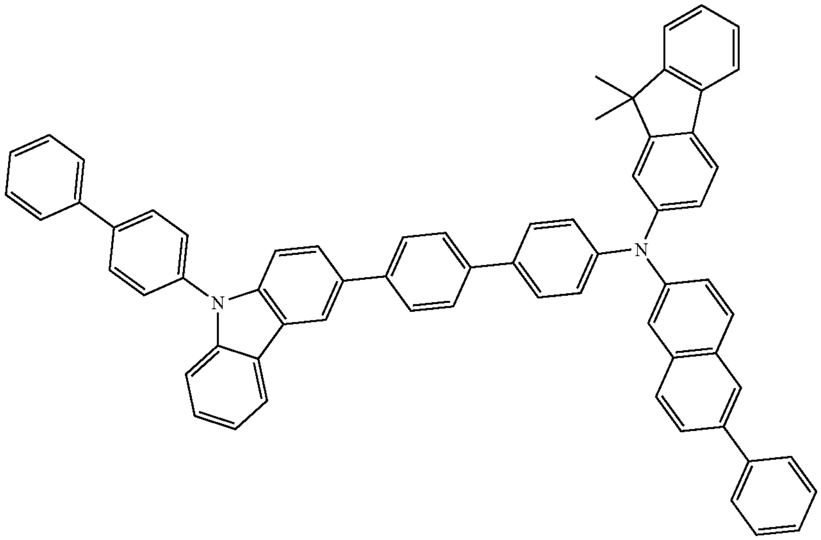
5-55
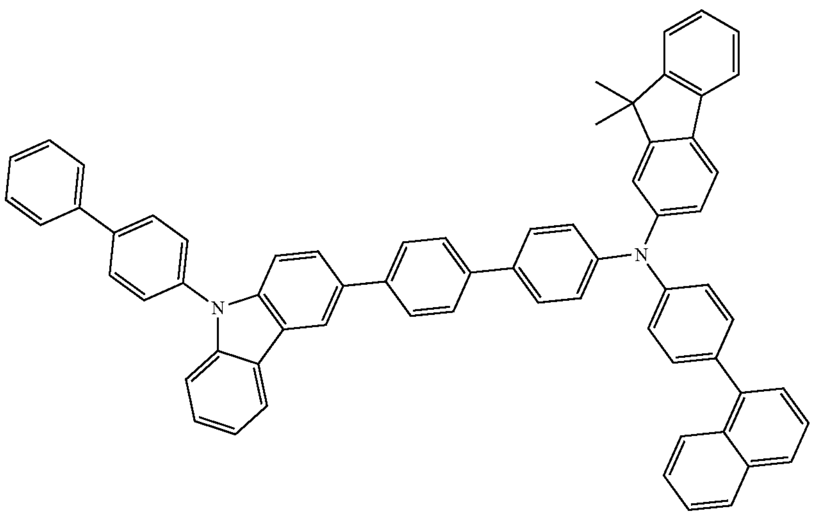
5-56
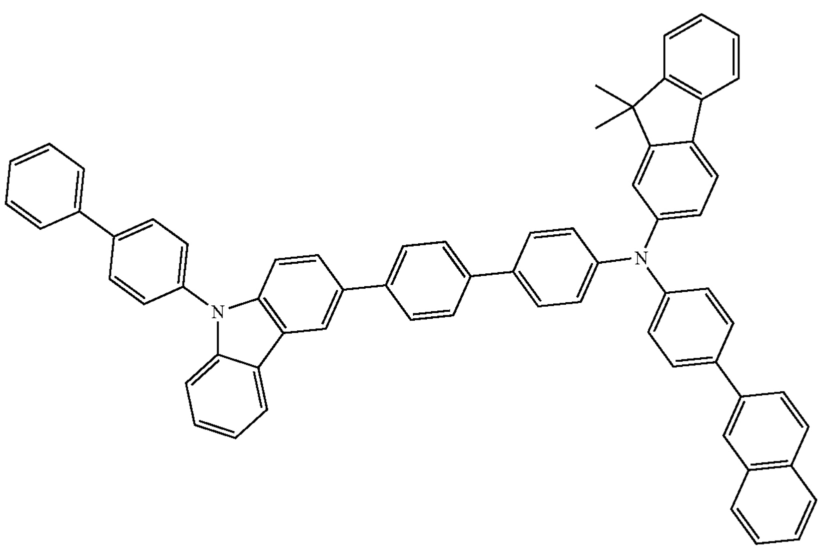

-continued
5-57
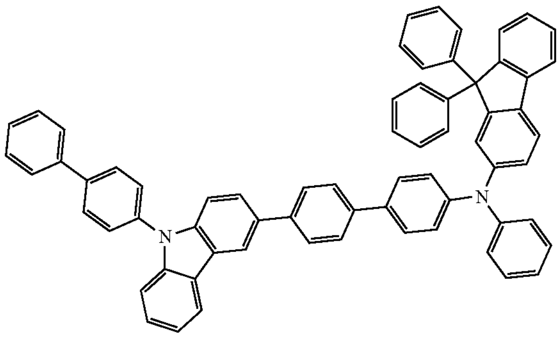
5-58
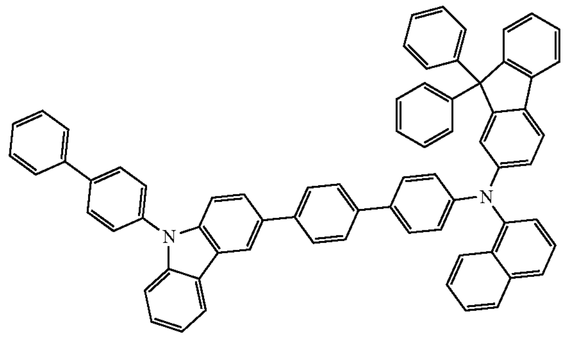
5-59
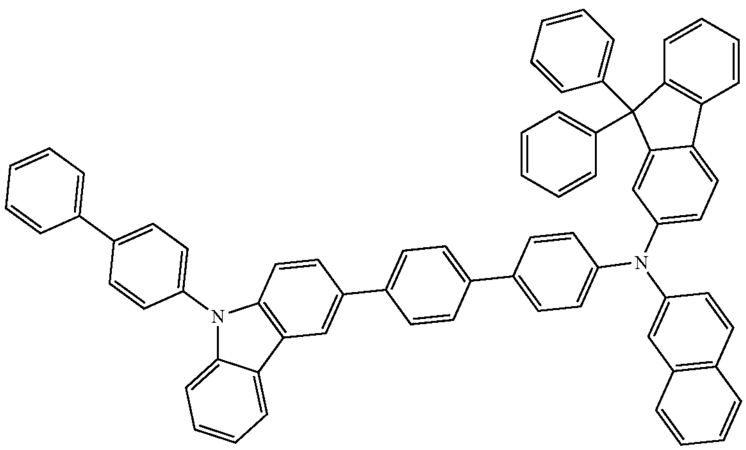
5-60
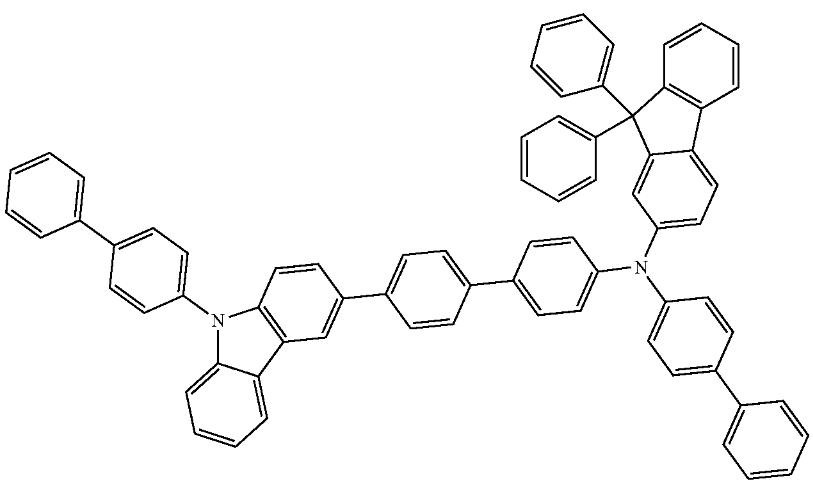

-continued
5-61
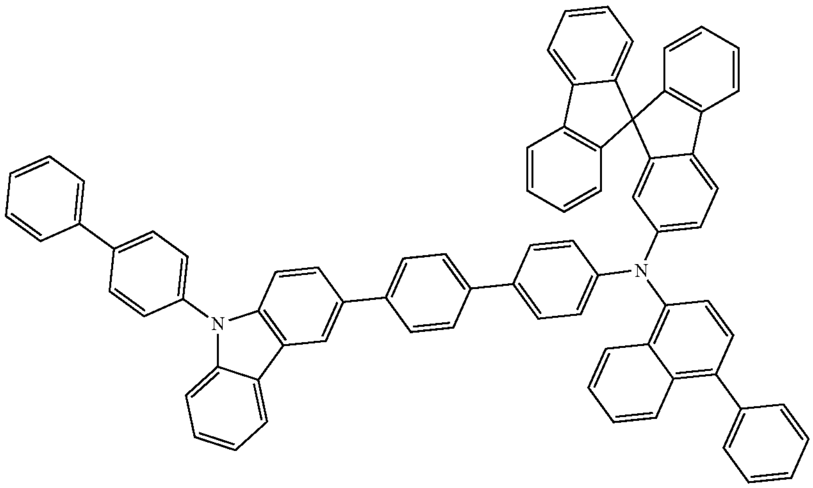
5-62
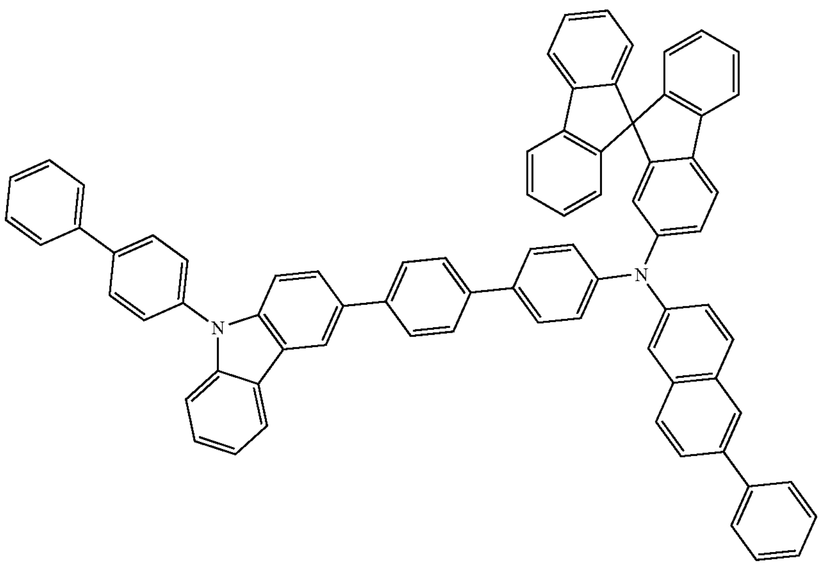
5-63
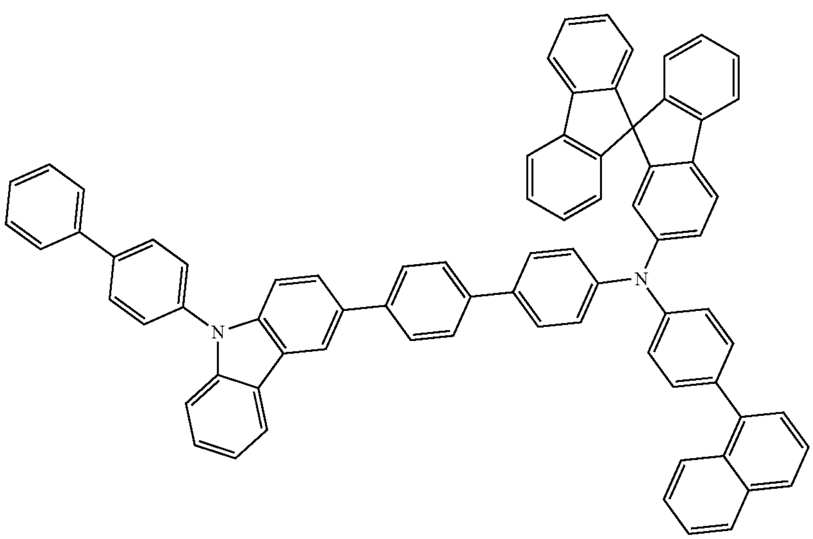

-continued
5-64
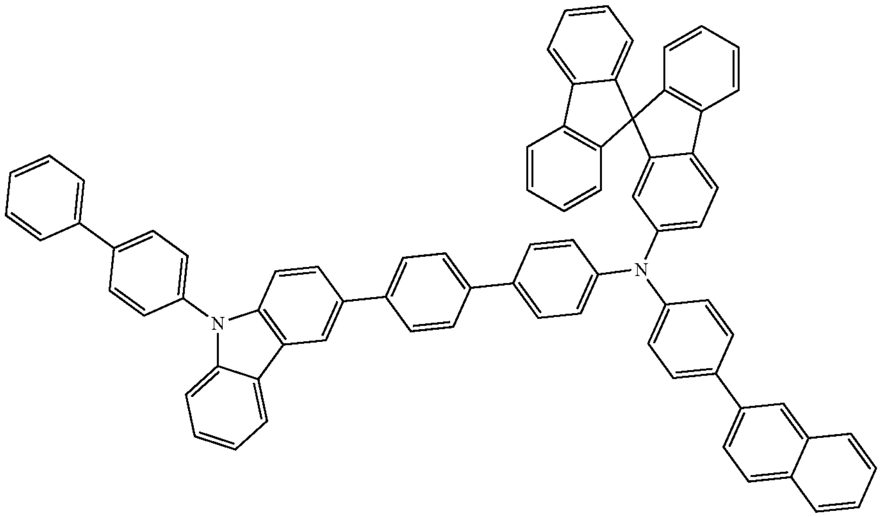
5-65
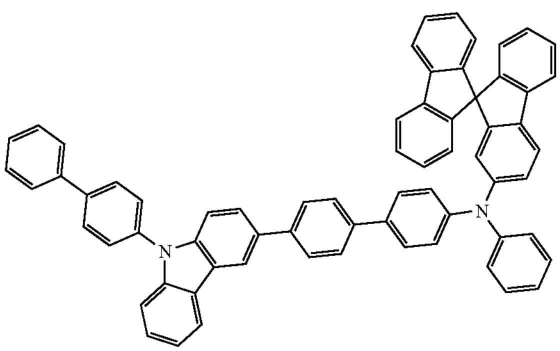
5-66
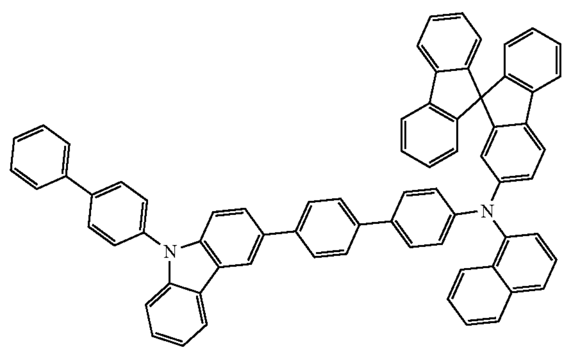
5-67
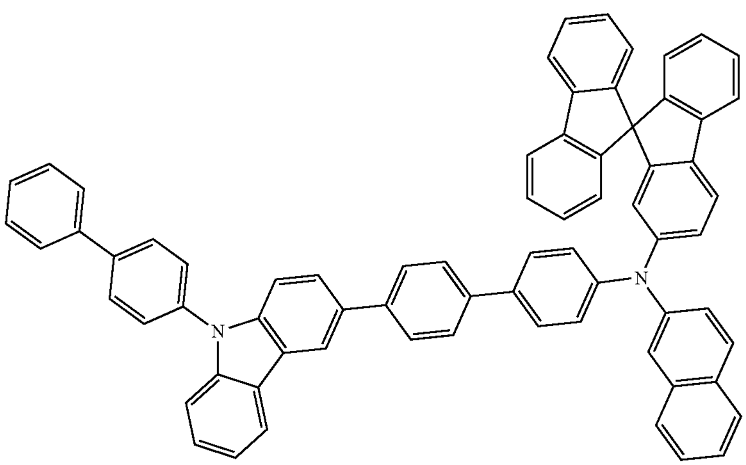

-continued
5-68
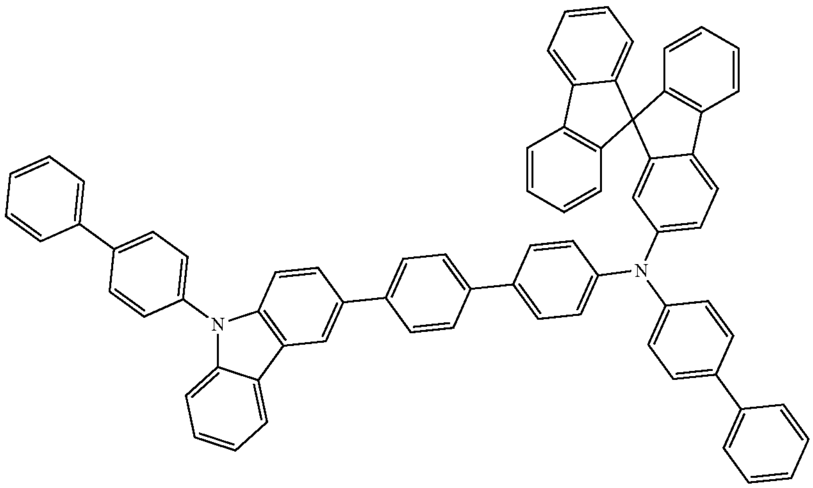
5-69
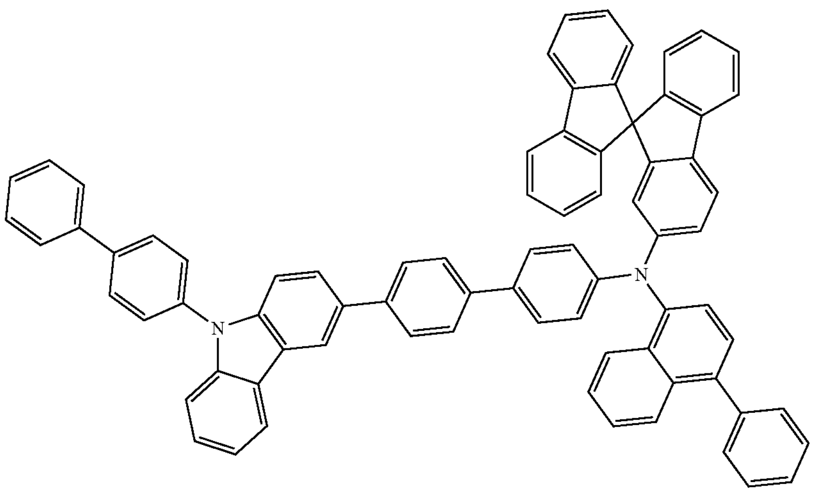
5-70
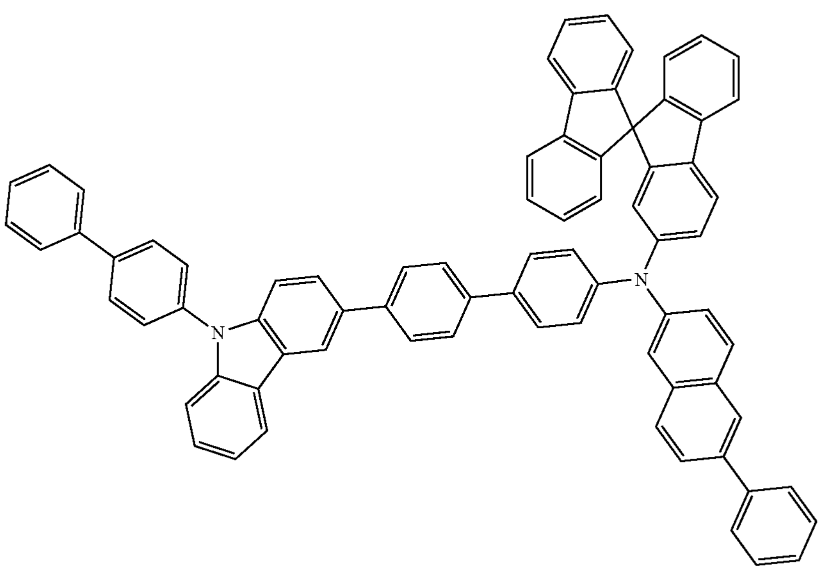

-continued
5-71
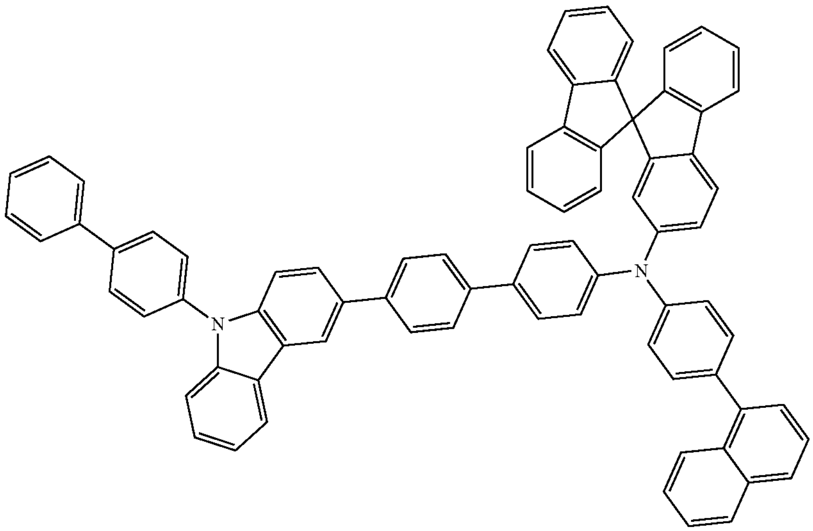
5-72
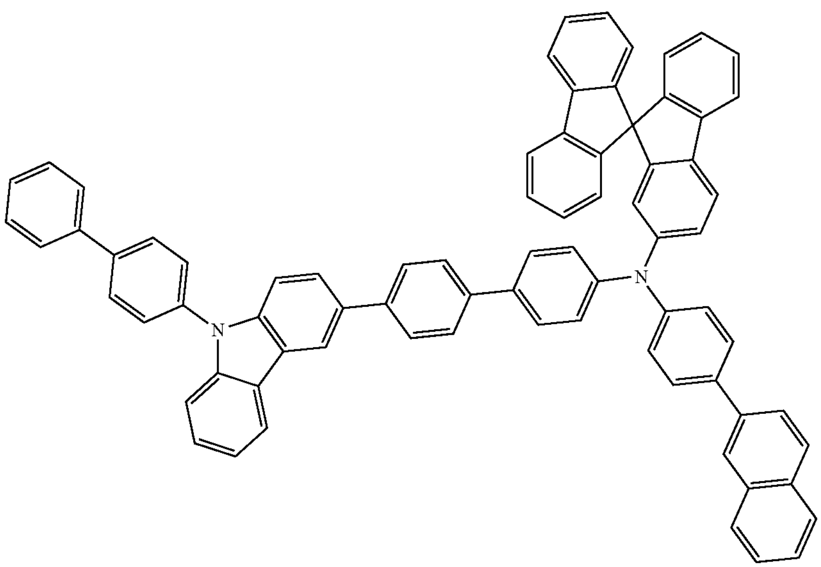
5-73
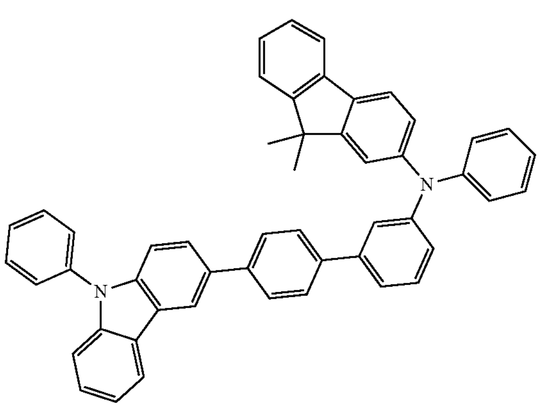
5-74
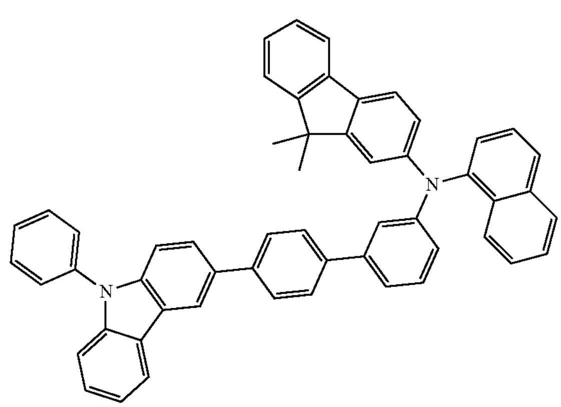

-continued
5-75
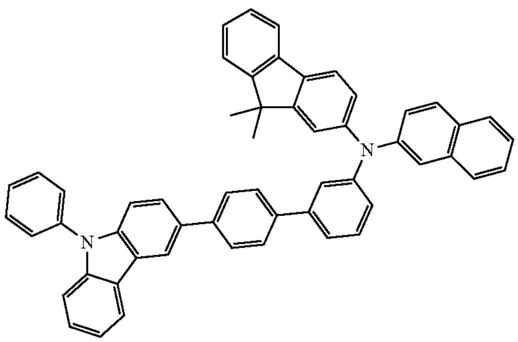
5-76
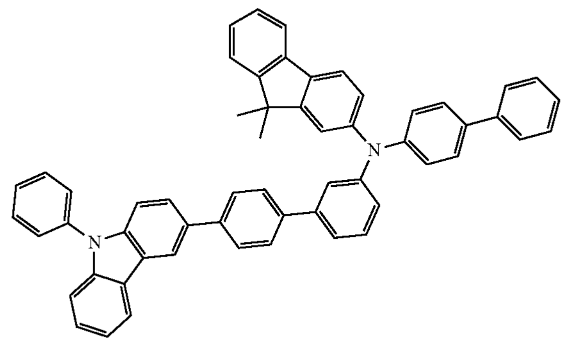
5-77
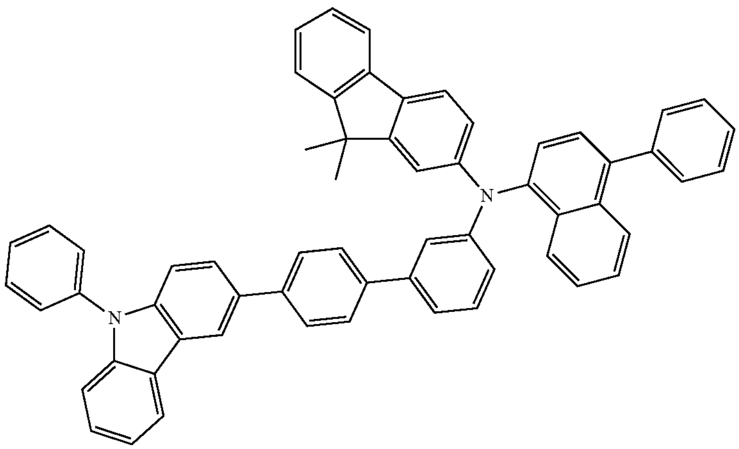
5-78
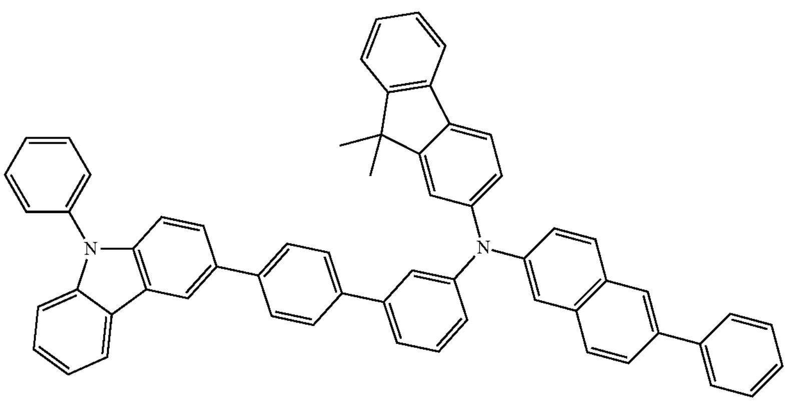
5-79
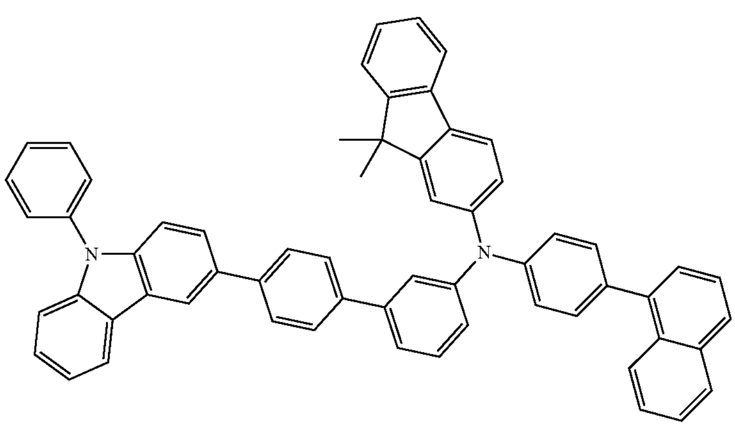

-continued
5-80
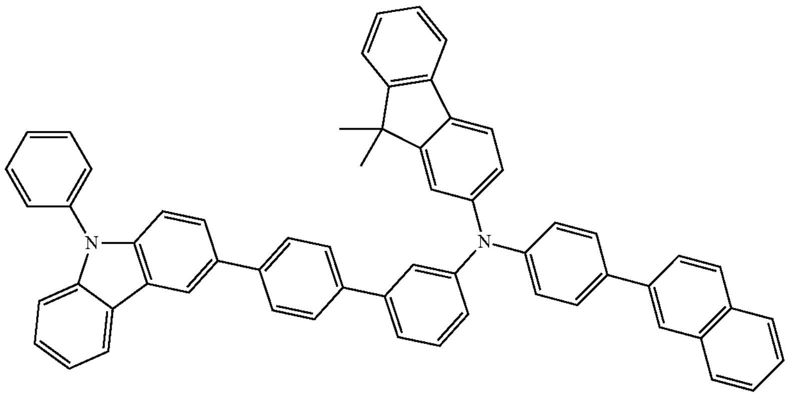
5-81
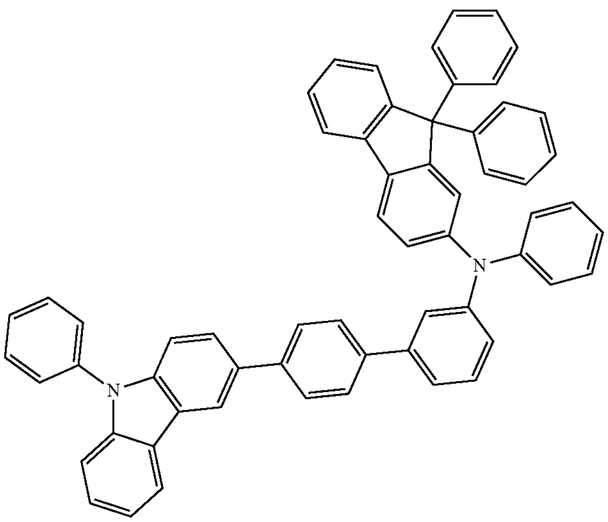
5-82
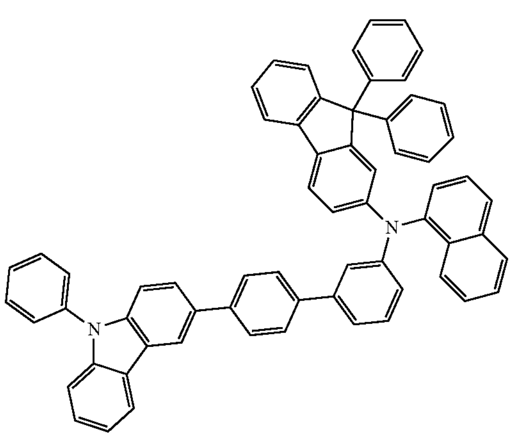
5-83
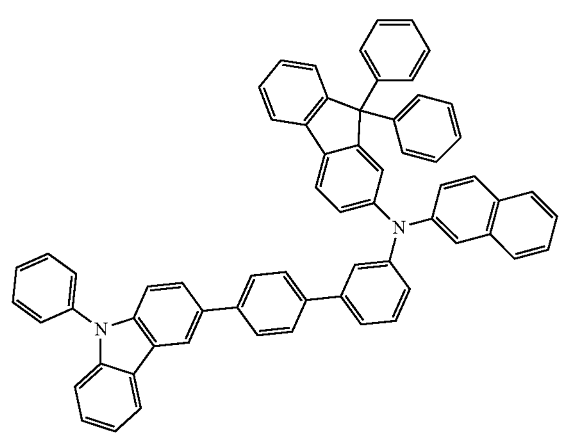

-continued
5-84
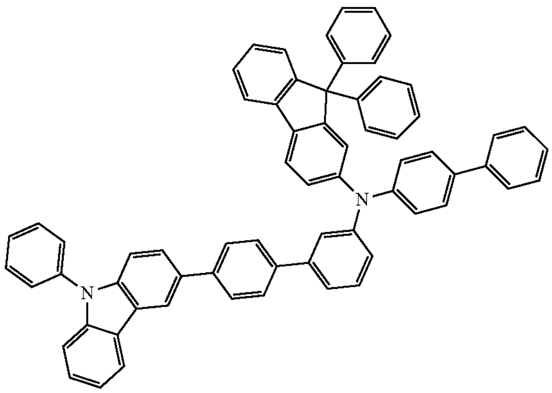
5-85
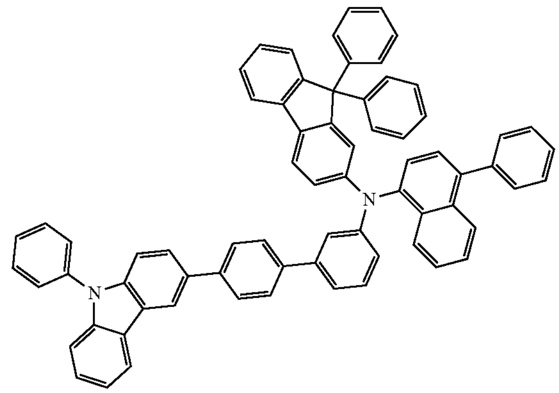
5-86
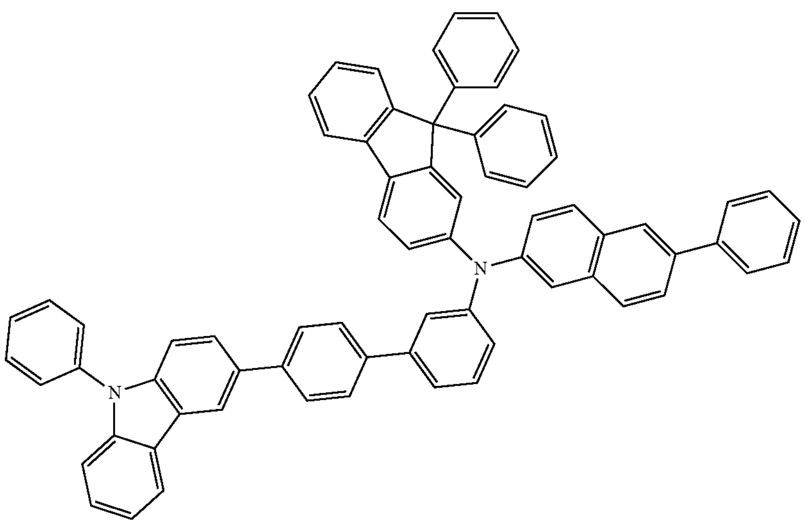
5-87
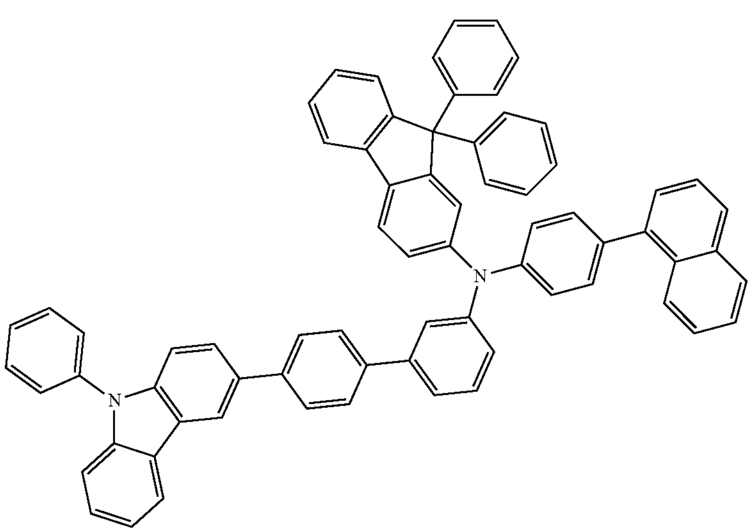

-continued
5-88
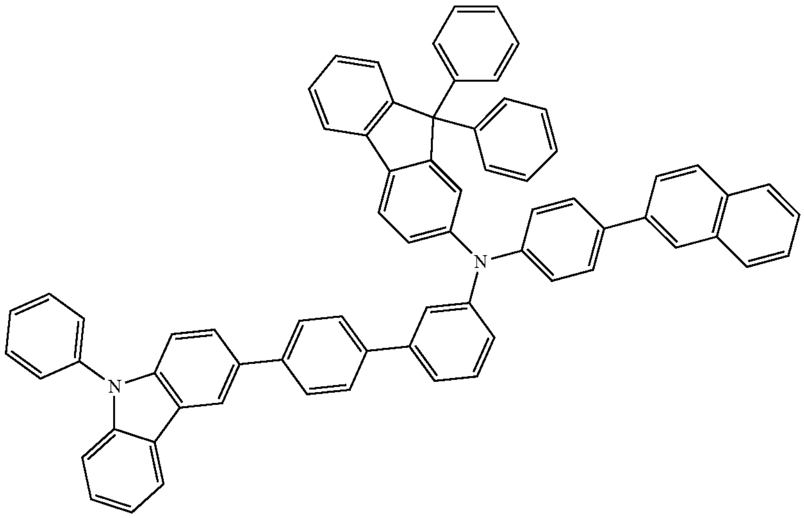
5-89
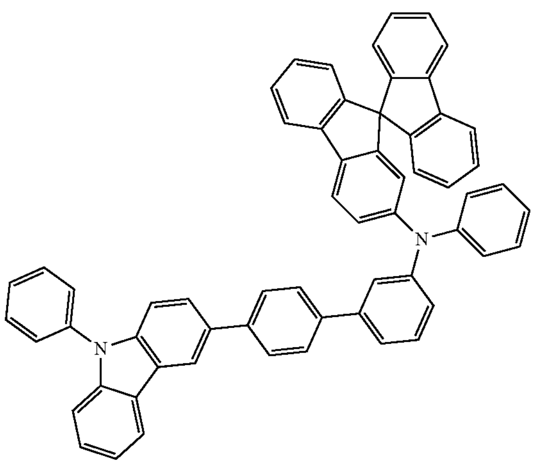
5-90
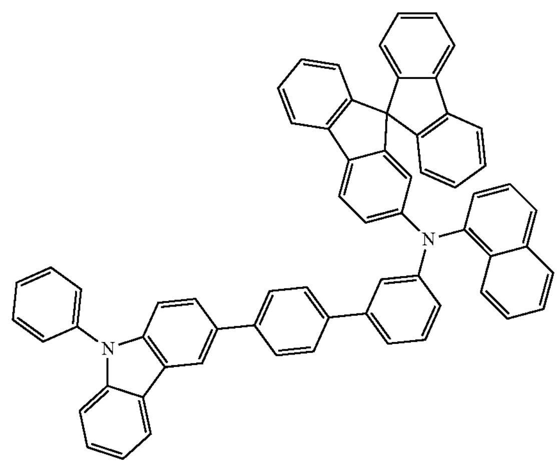
5-91
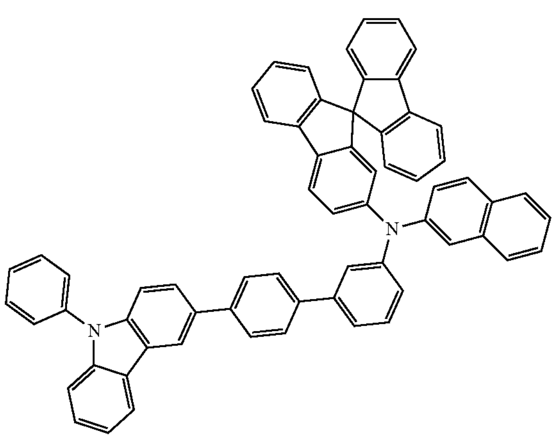
5-92
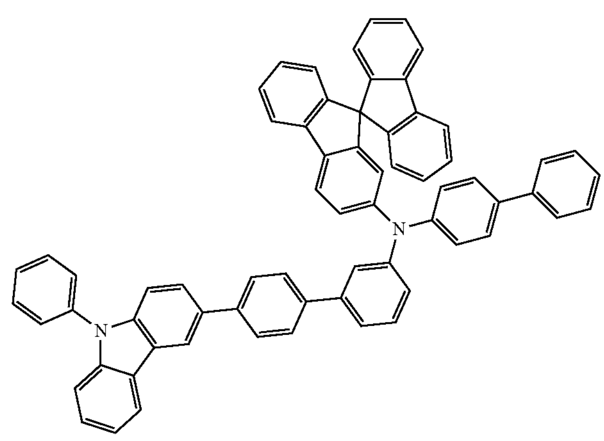

-continued
5-93
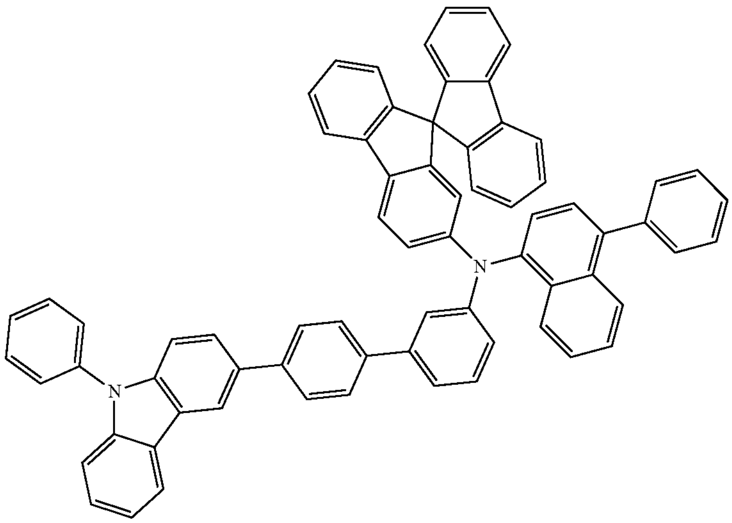
5-94
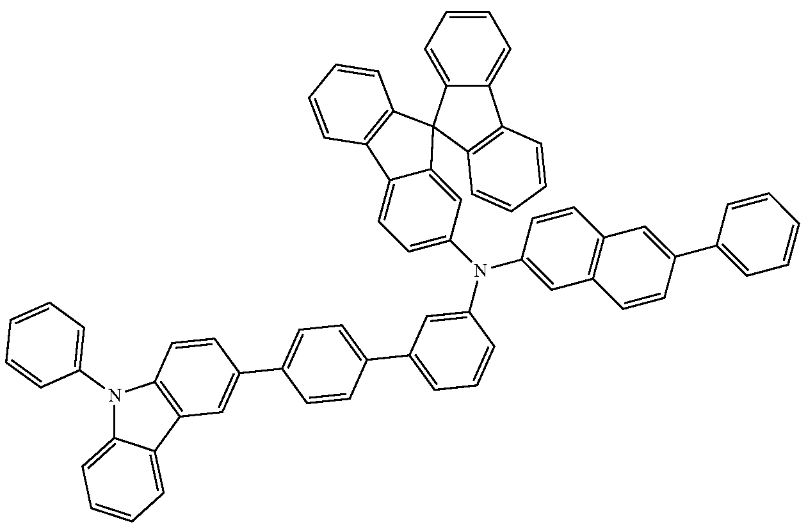
5-95
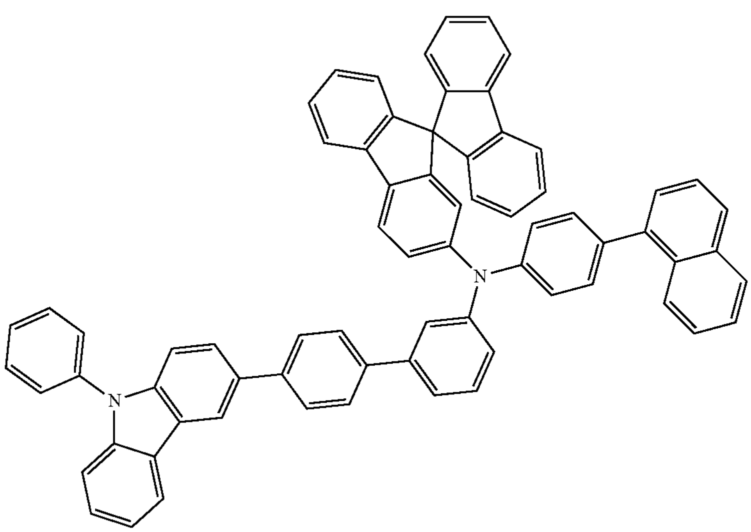

-continued
5-96
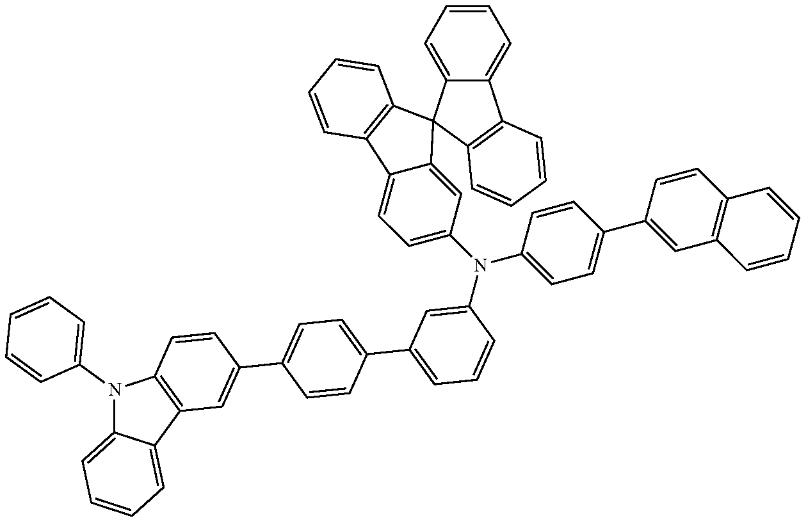
5-97
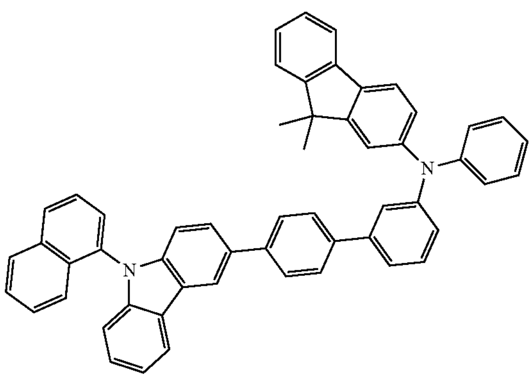
5-98
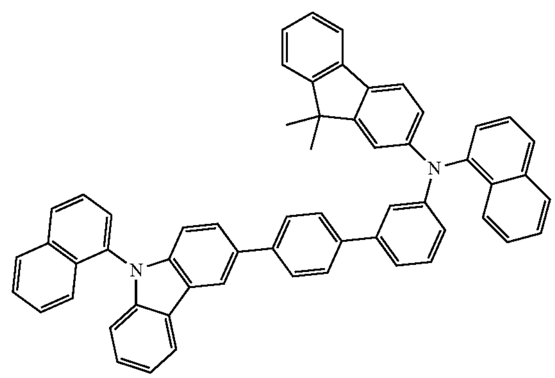
5-99
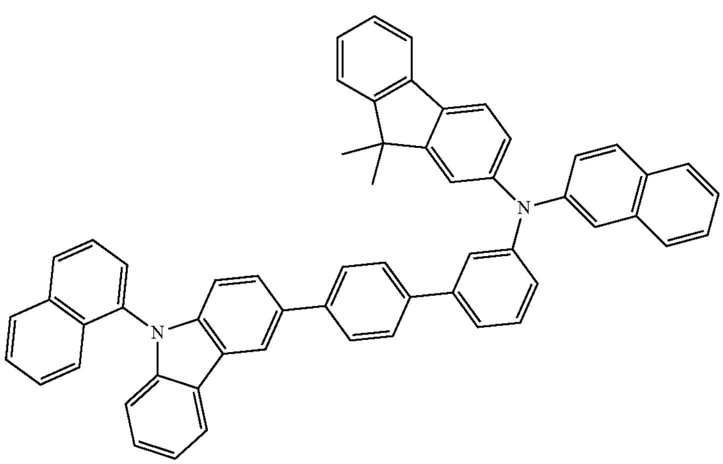

-continued
5-100
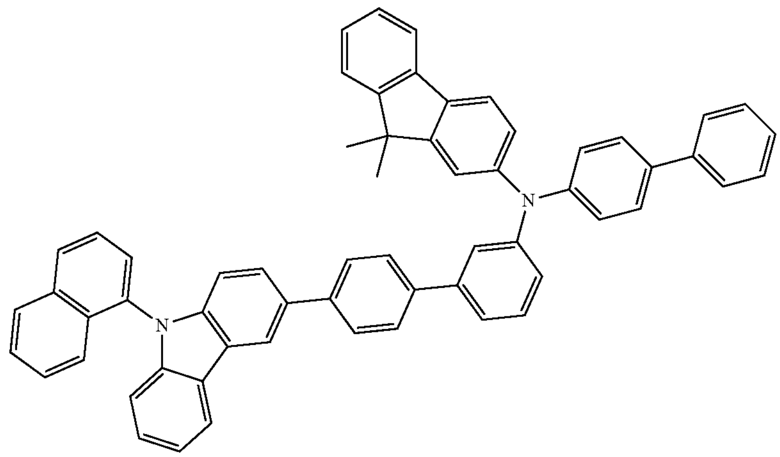
5-101
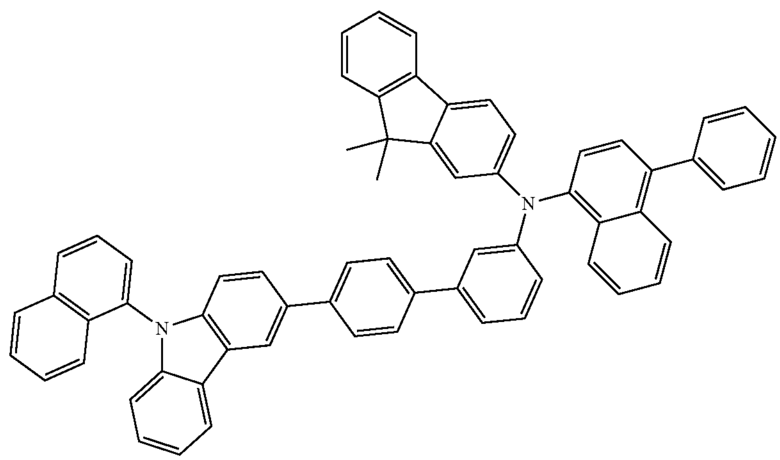
5-102
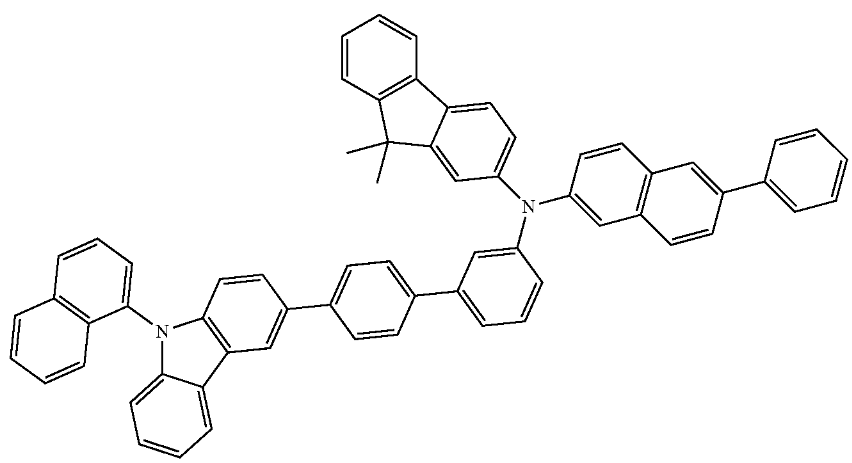

-continued
5-103
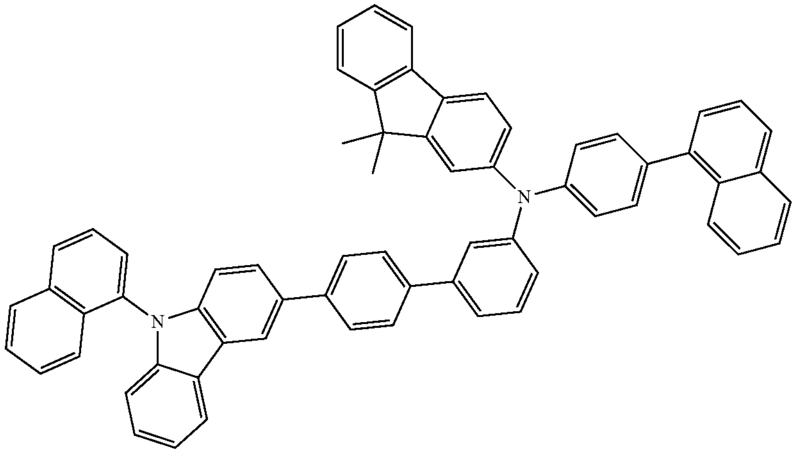
5-104
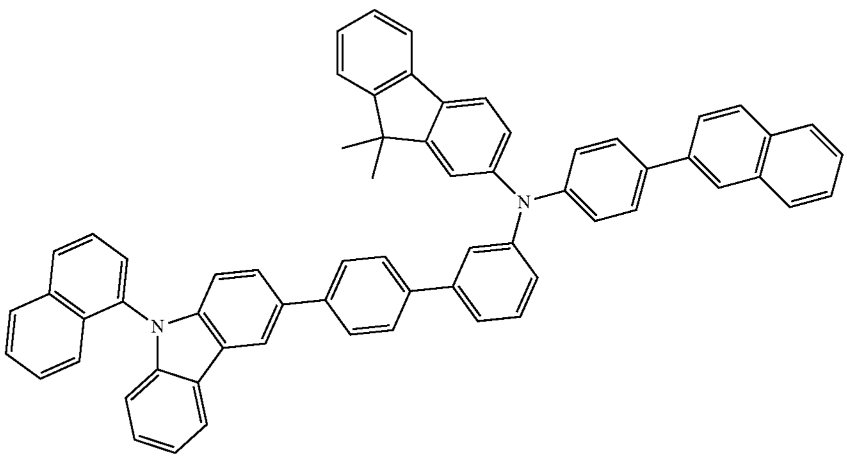
5-105
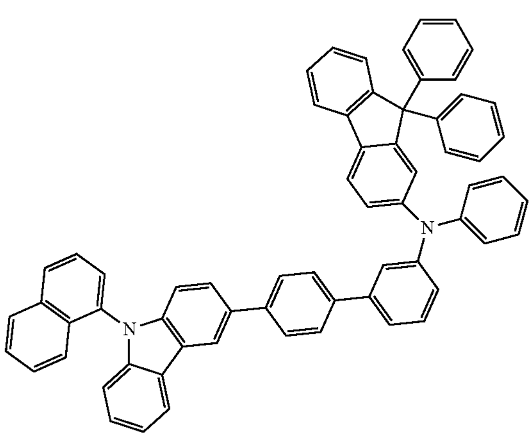
5-106
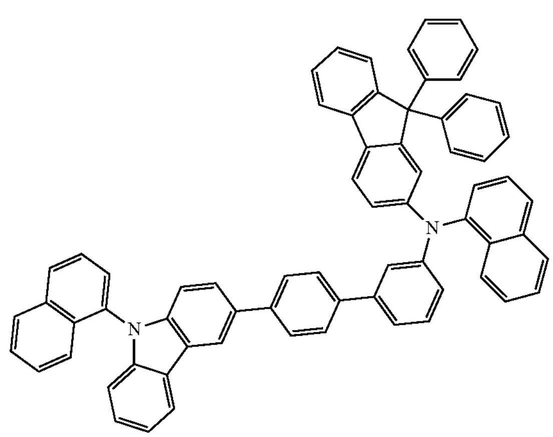

-continued
5-107
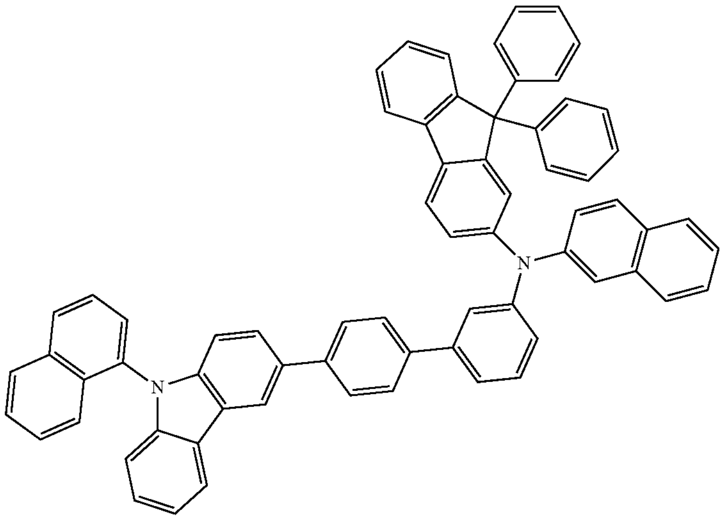
5-108
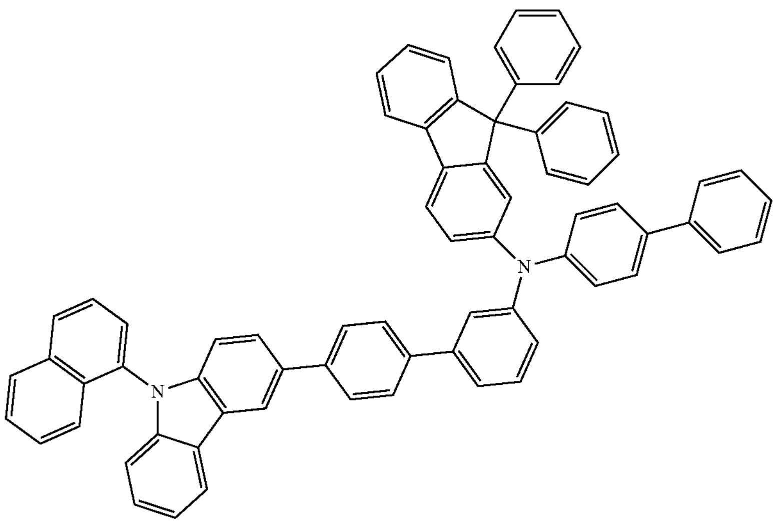
5-109
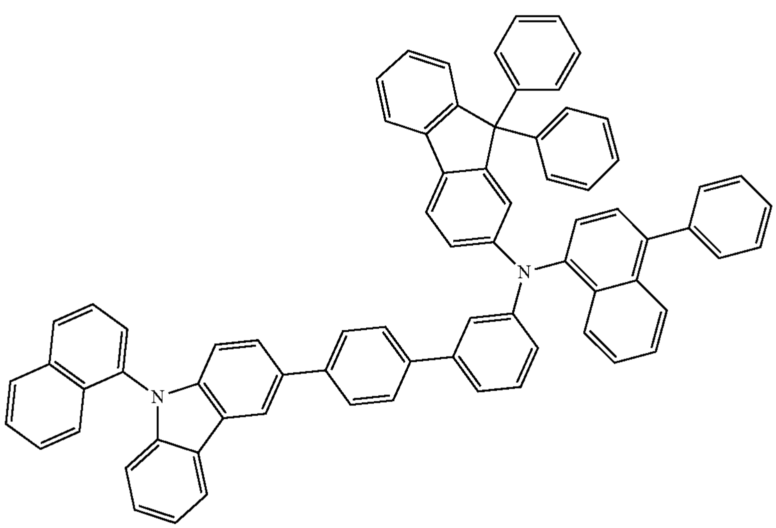

-continued
5-110
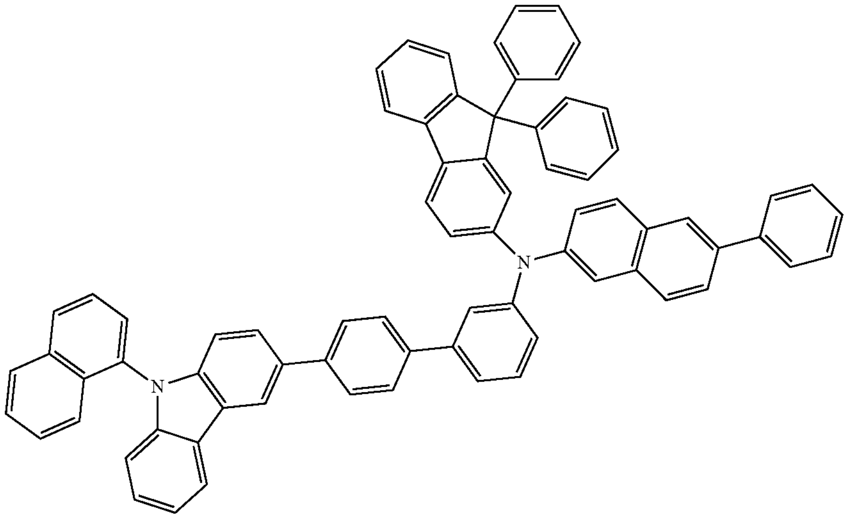
5-111
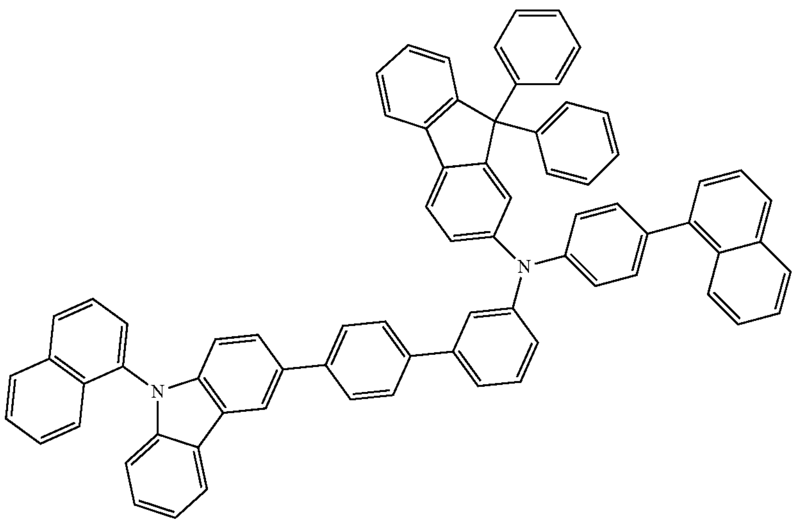
5-112
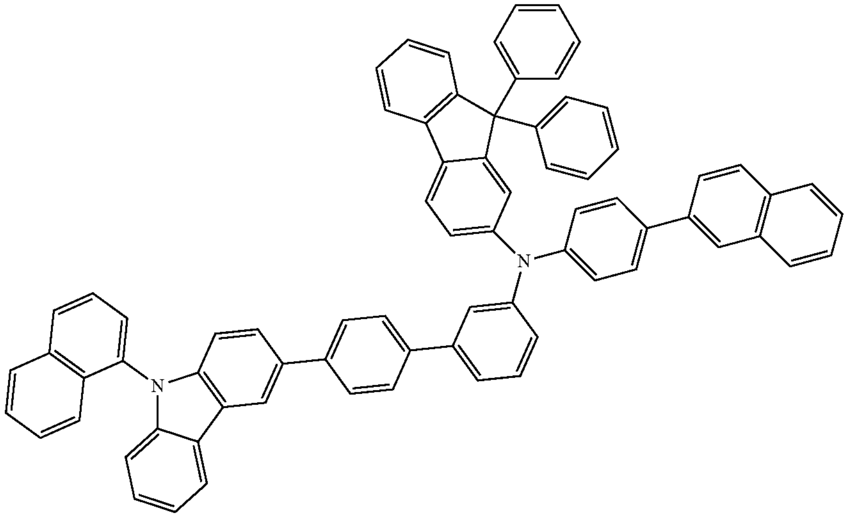

-continued
5-113
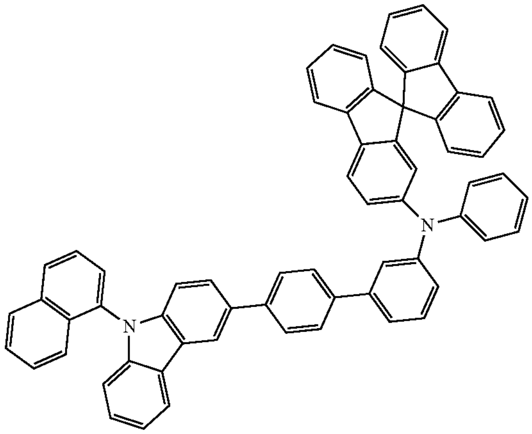
5-114
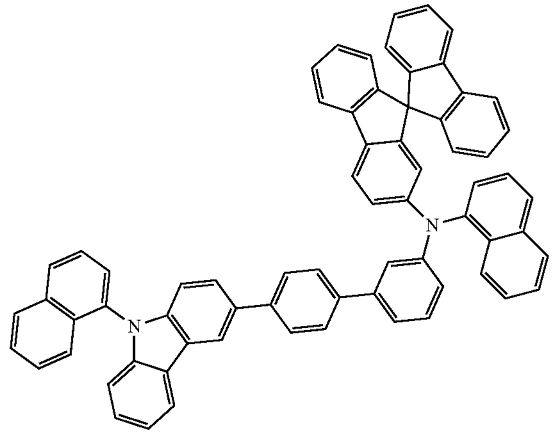
5-115
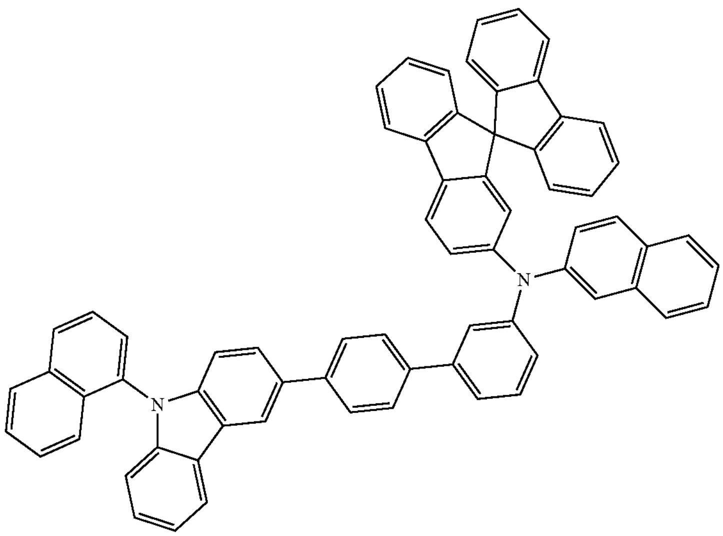
5-116
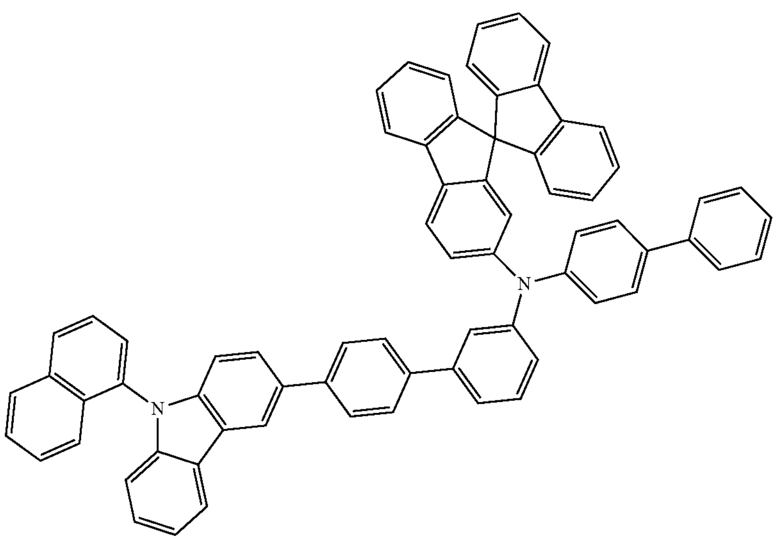

-continued
5-117
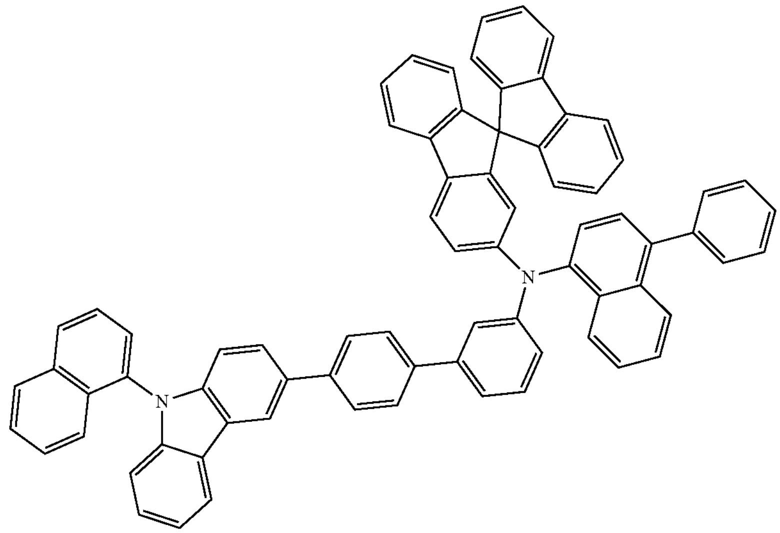
5-118
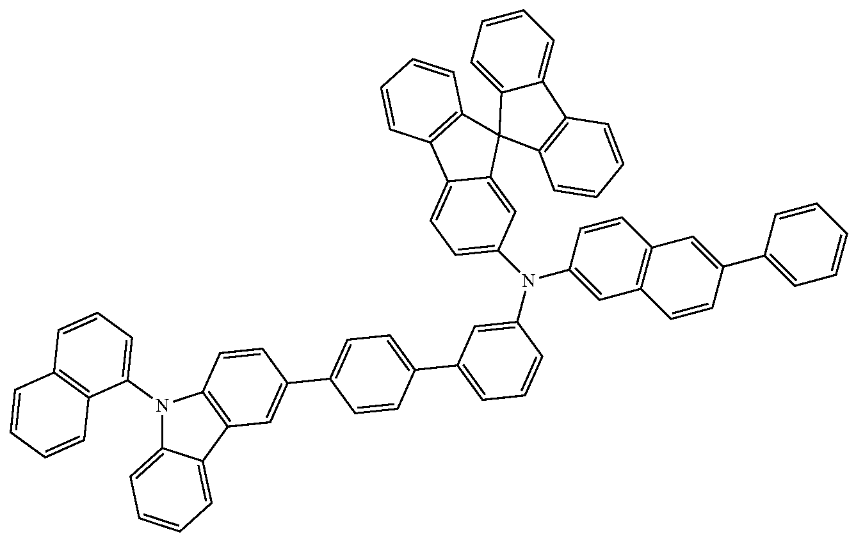
5-119
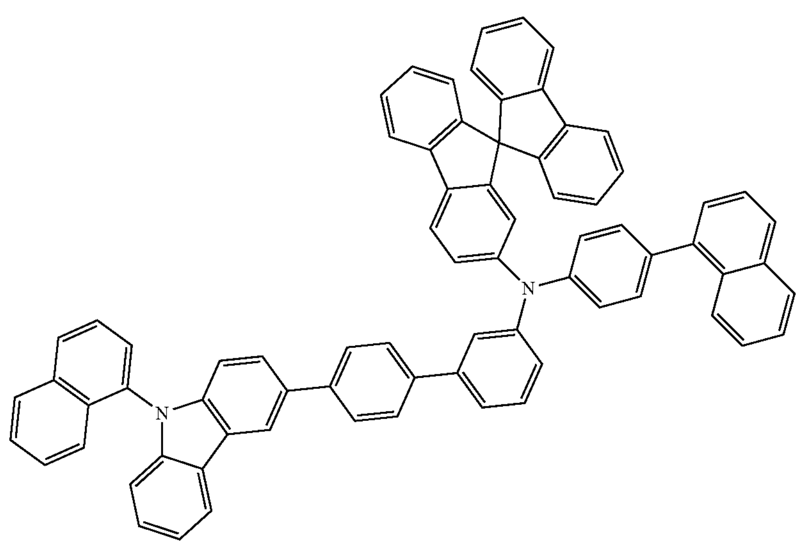

-continued
5-120
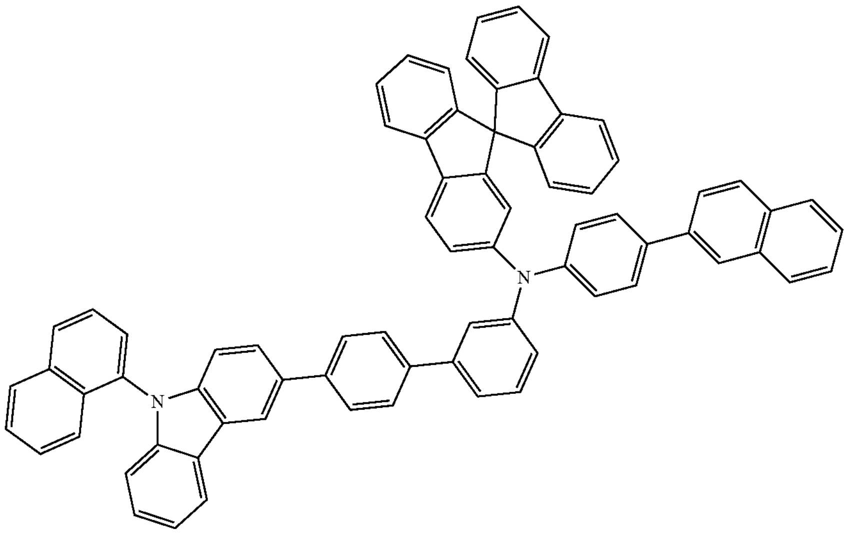
5-121
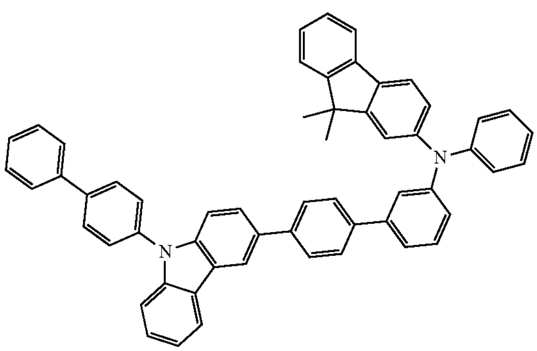
5-122
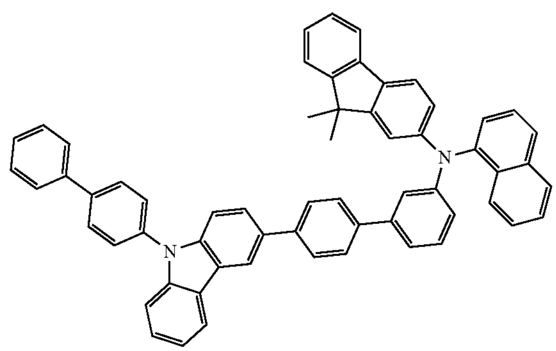
5-123
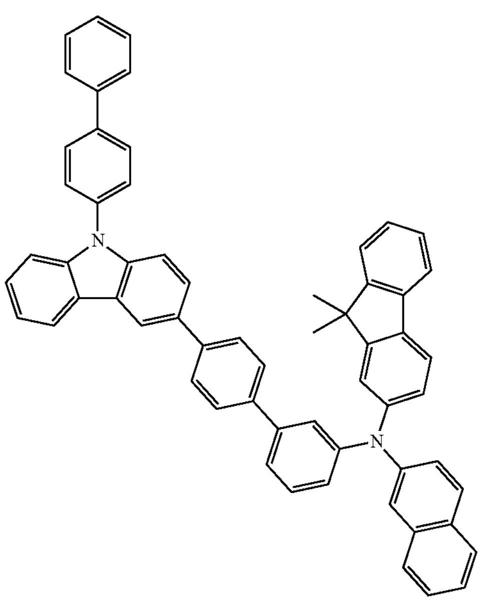
5-124
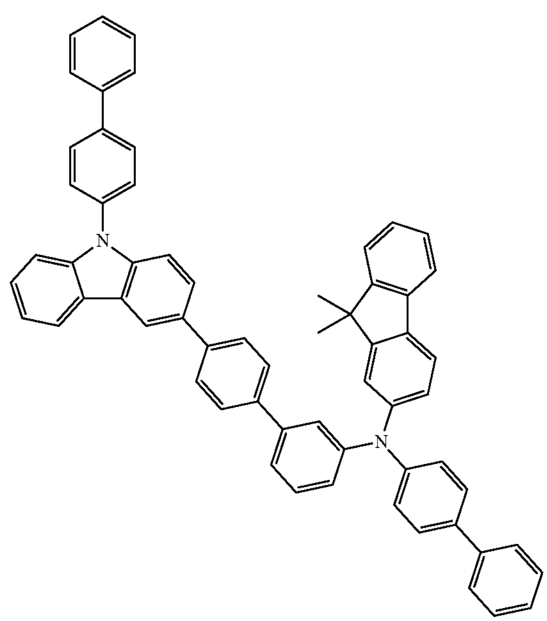

-continued
5-125
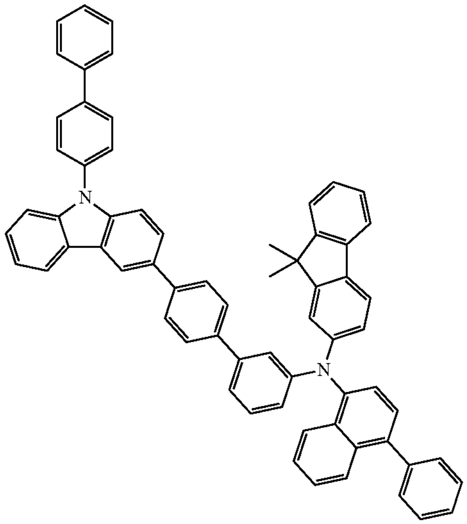
5-126
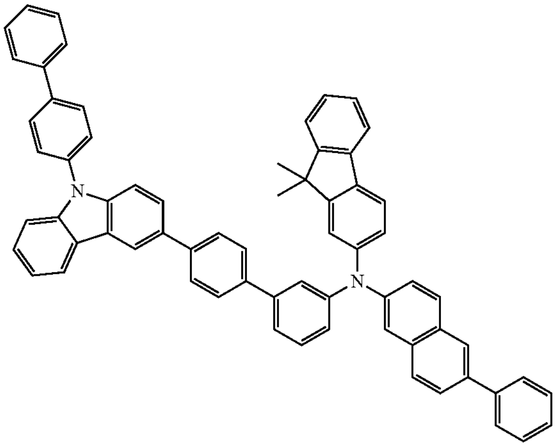
5-127
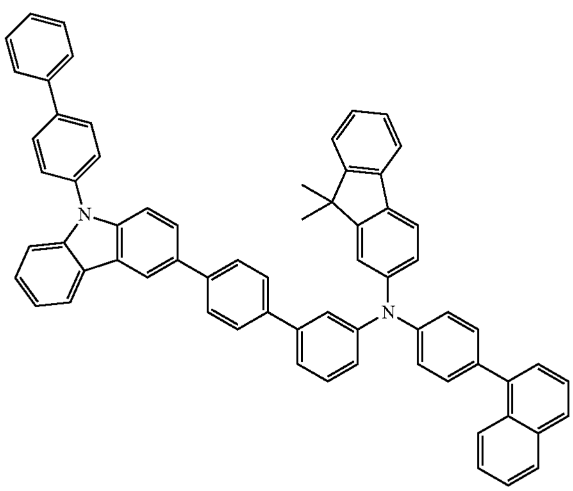
5-128
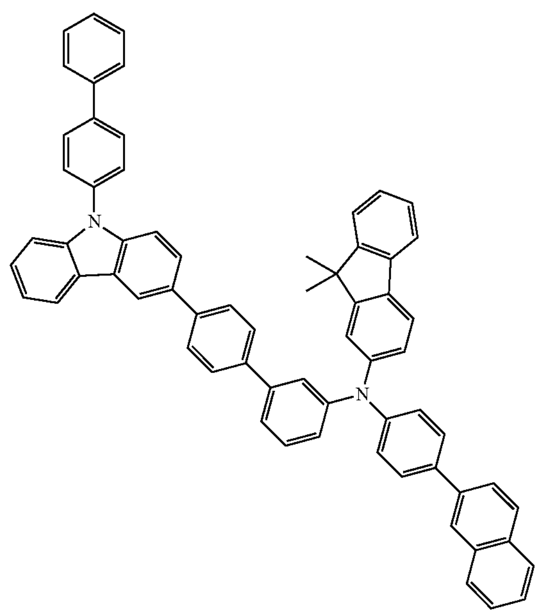

-continued
5-129
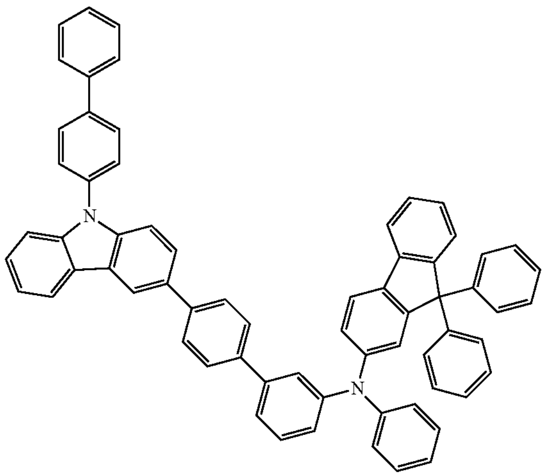
5-130
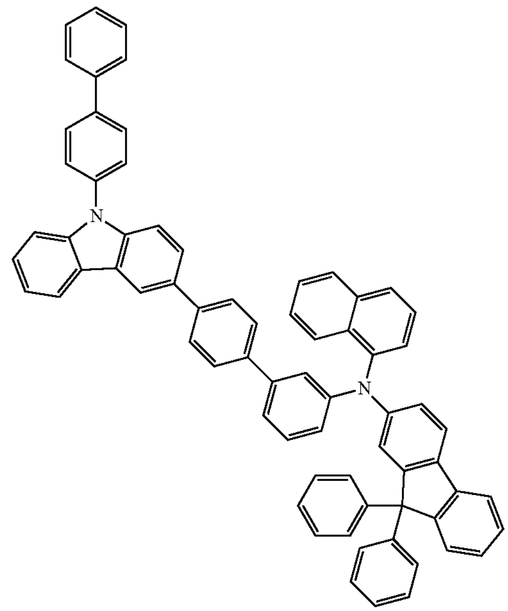
5-131
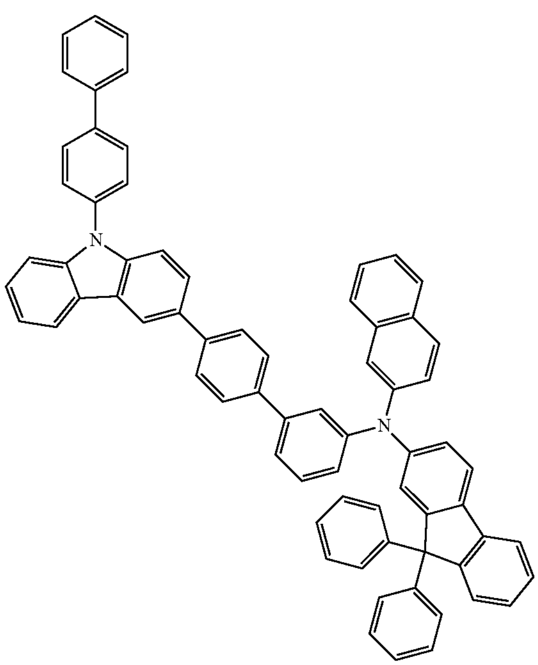
5-132
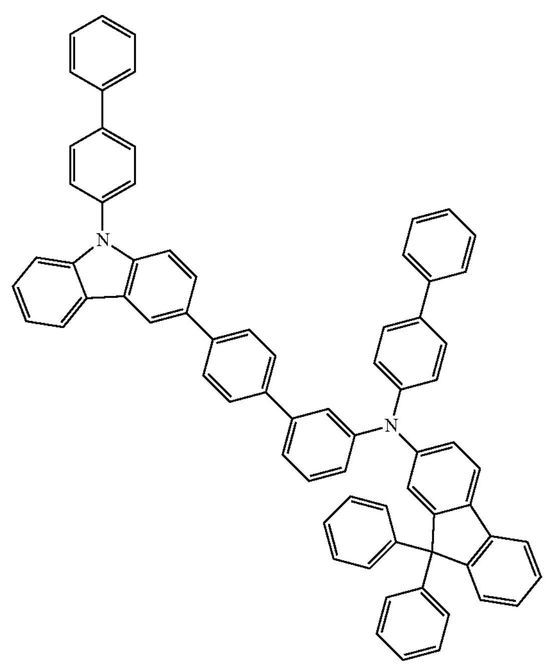

-continued
5-133
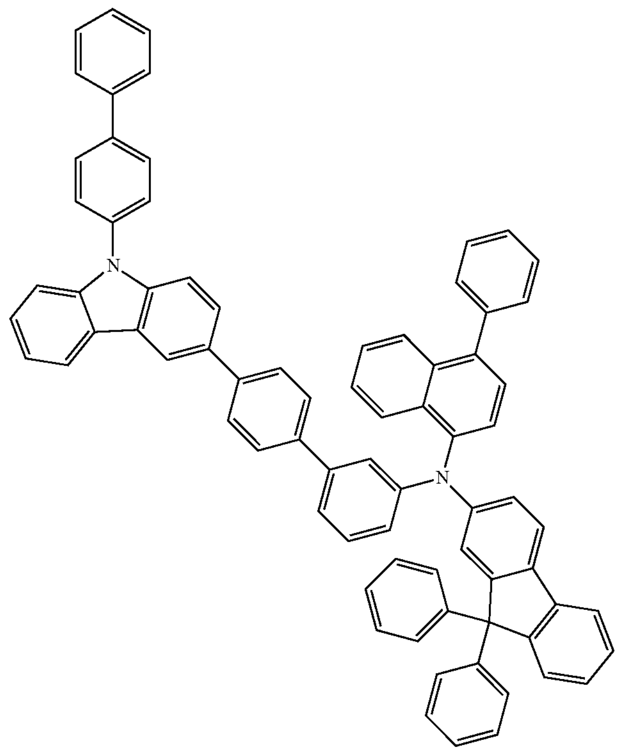
5-134
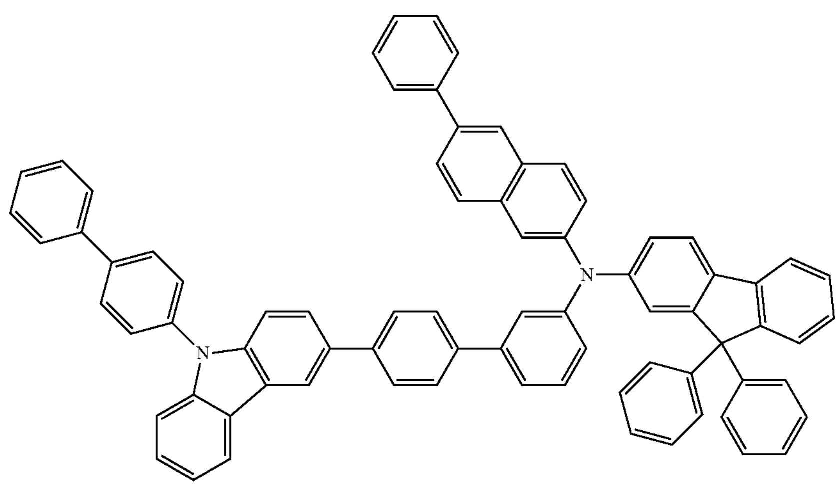
5-135
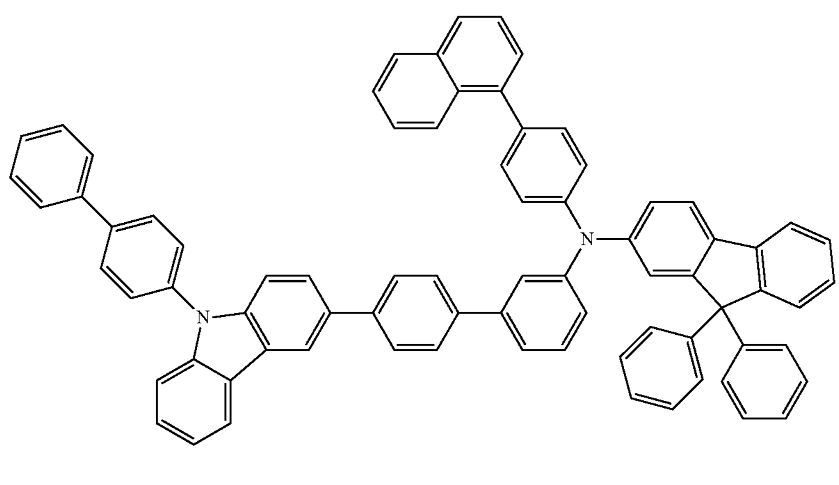

-continued
5-136
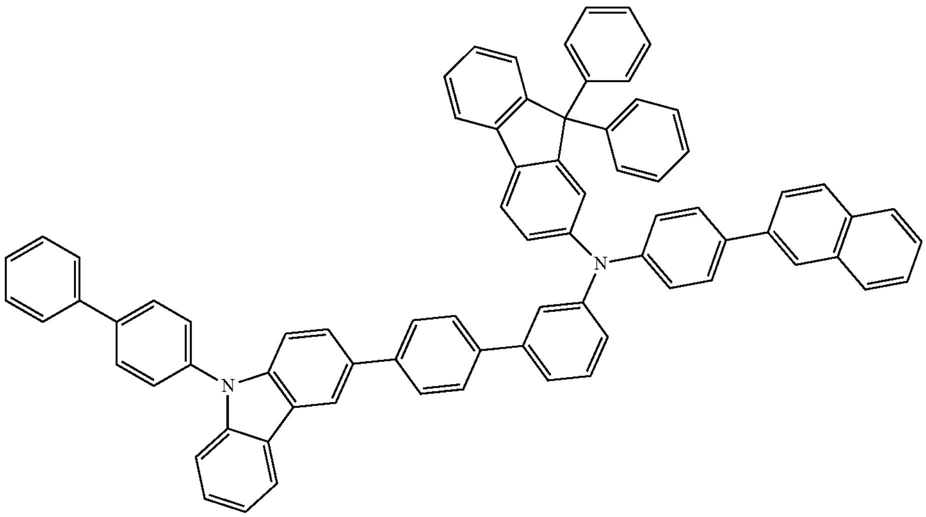
5-137
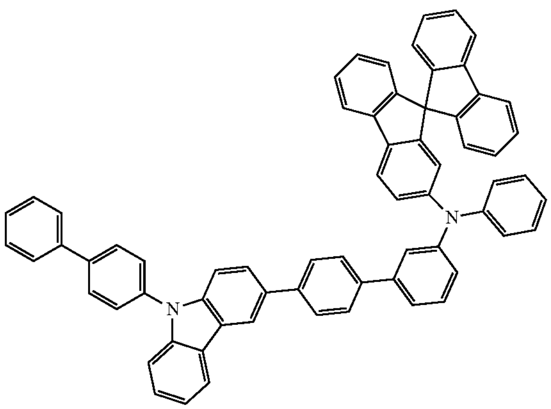
5-138
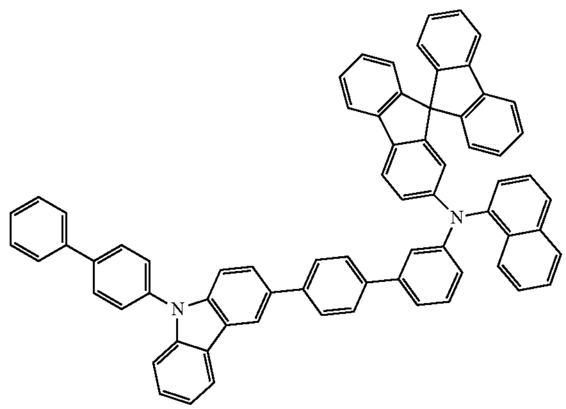
5-139
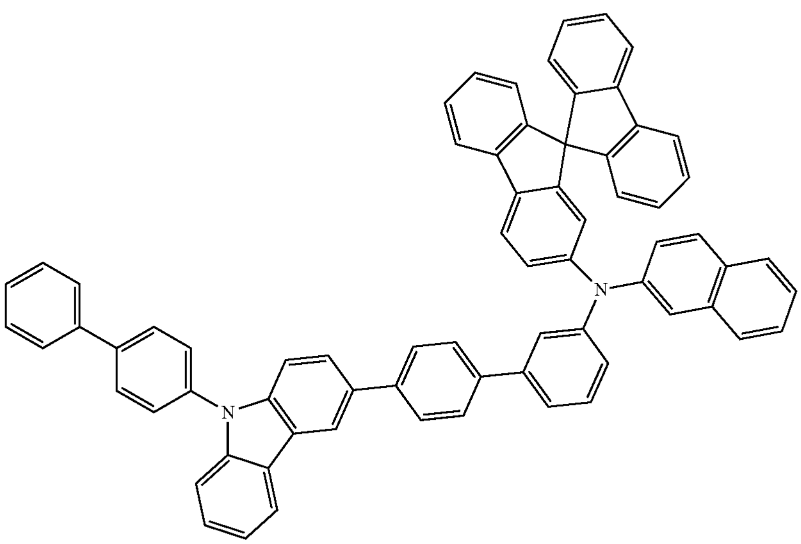

-continued
5-140
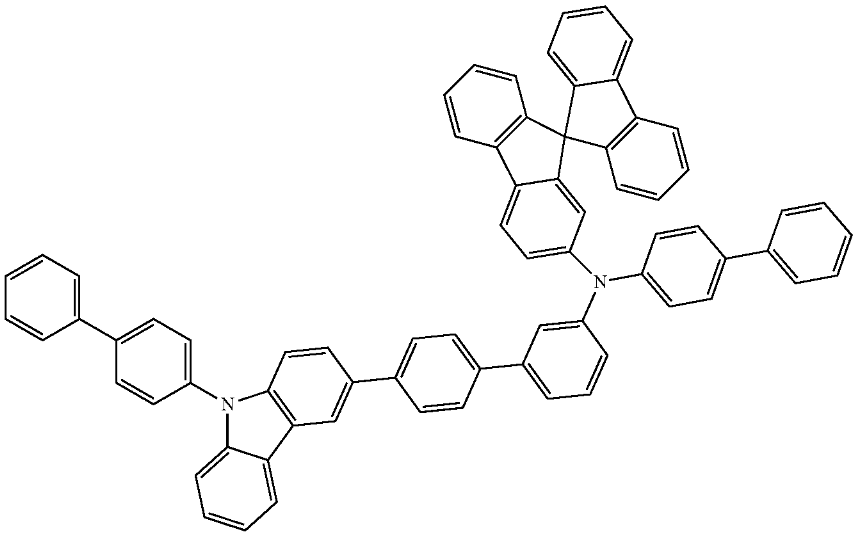
5-141
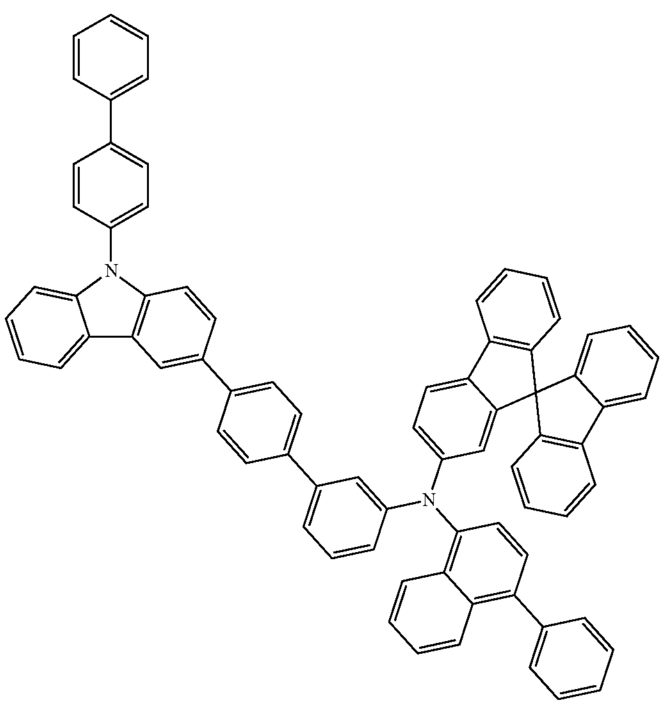

-continued
5-142
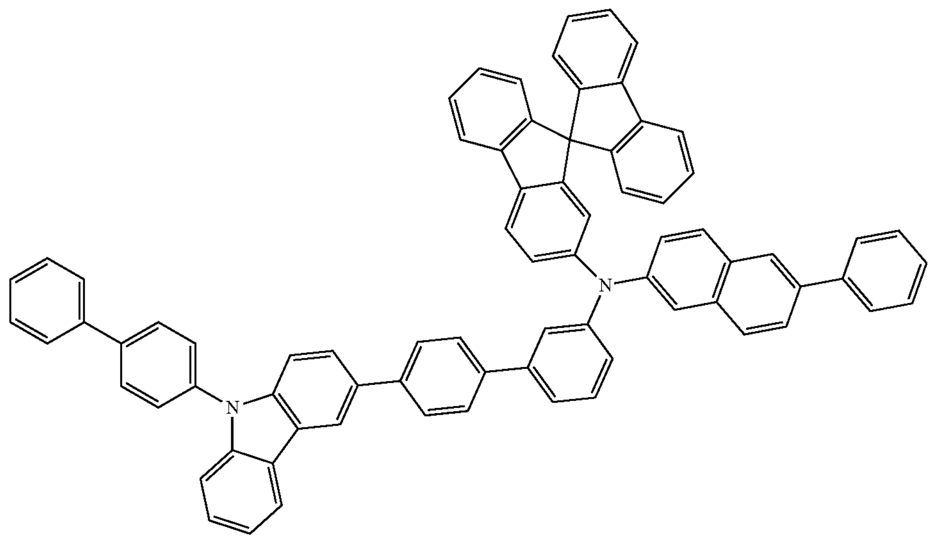
5-143
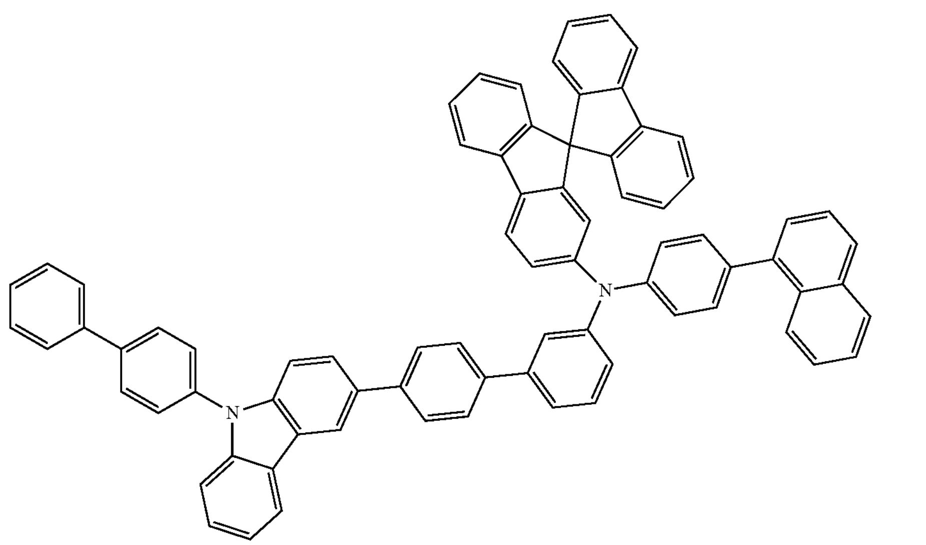
5-144
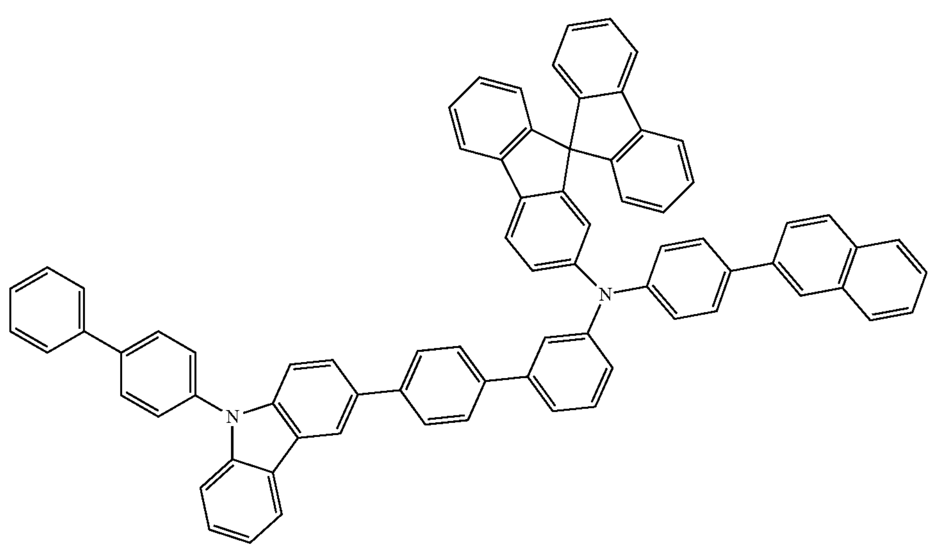

-continued
6-1
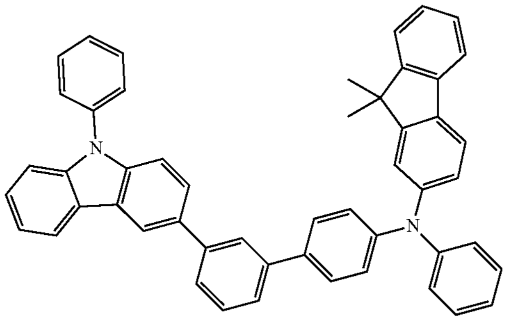
6-2
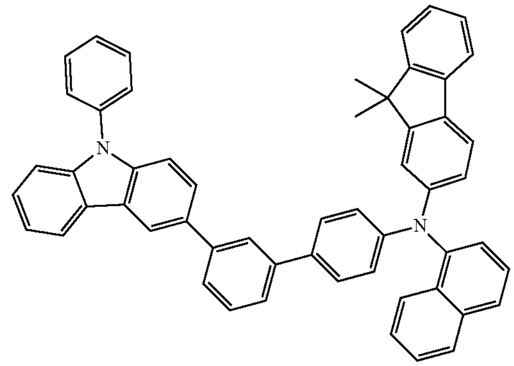
6-3
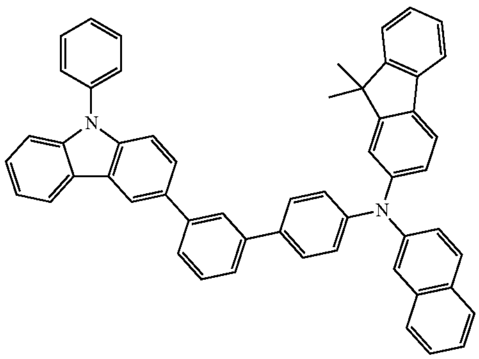
6-4
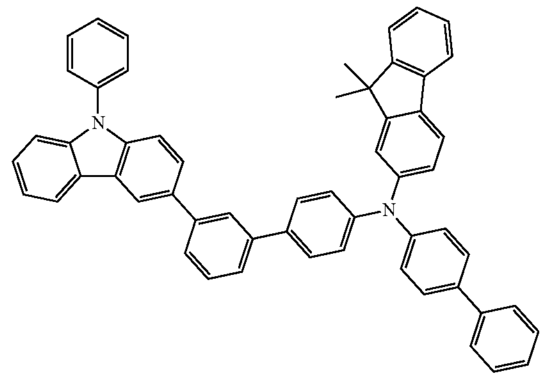
6-5
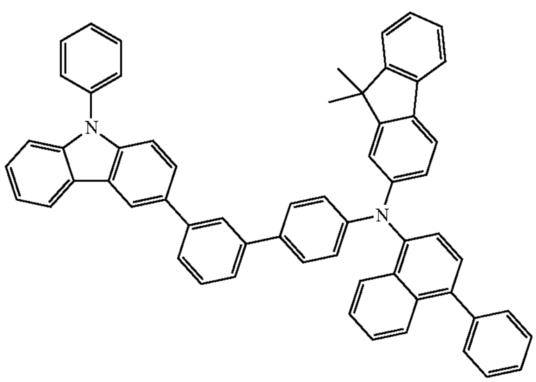
6-6
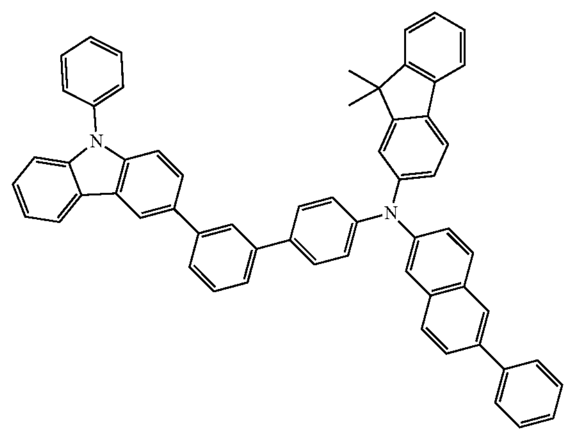
6-7
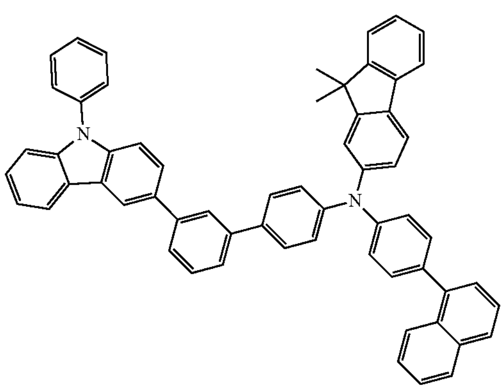
6-8
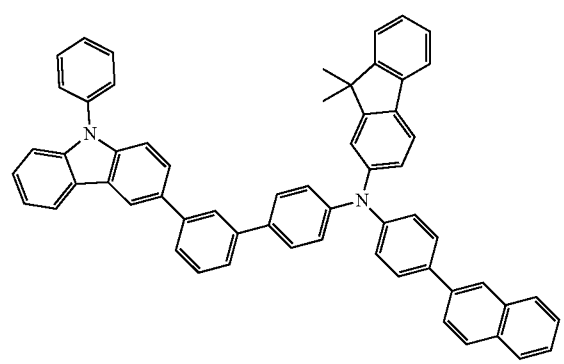

-continued
6-9
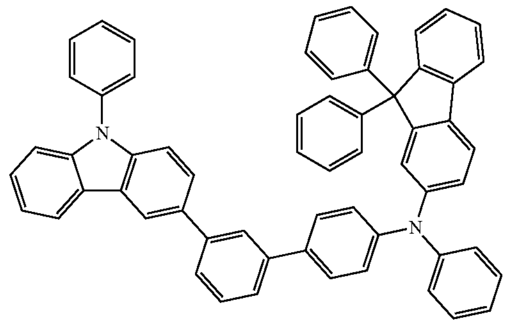
6-10
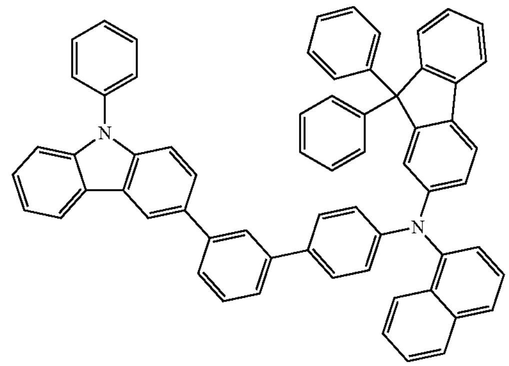
6-11
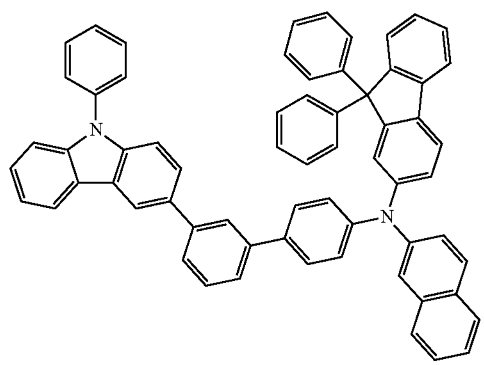
6-12
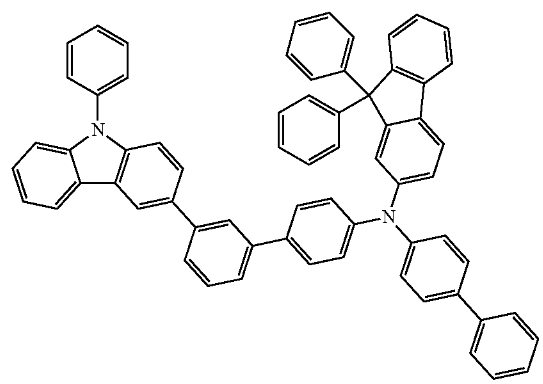
6-13
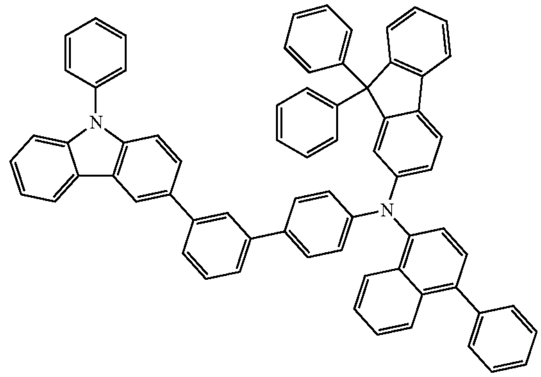
6-14
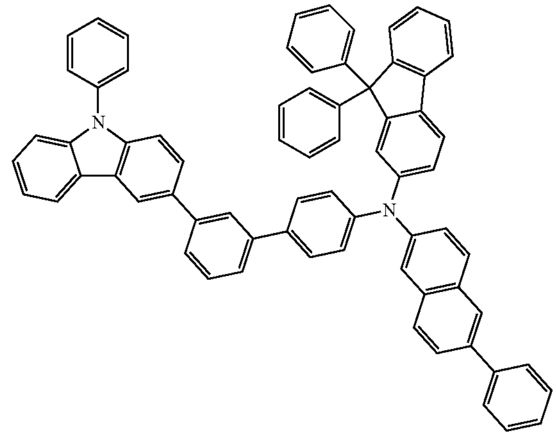

-continued
6-15
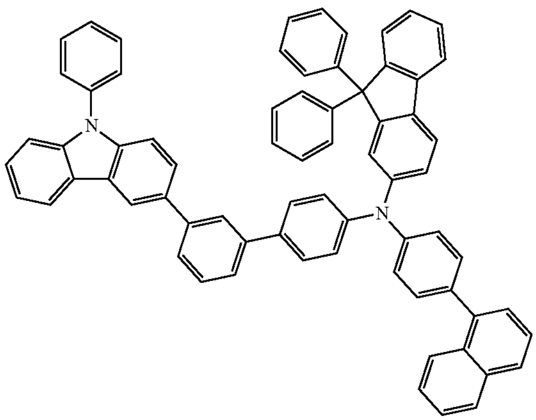
6-16
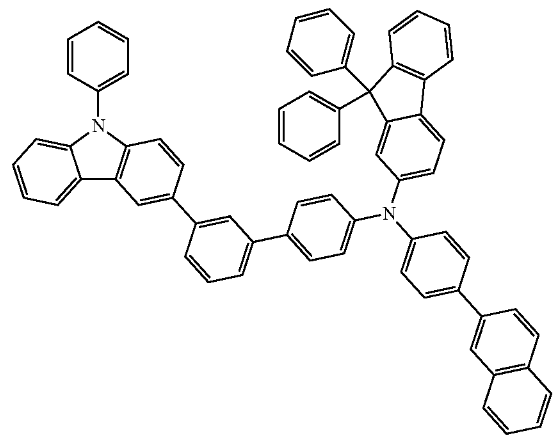
6-17
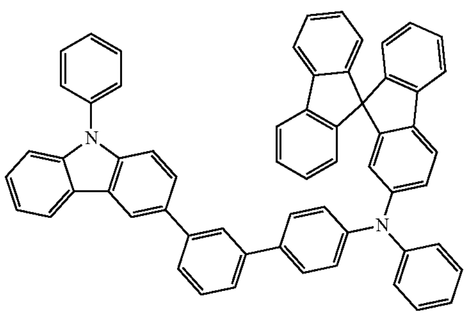
6-18
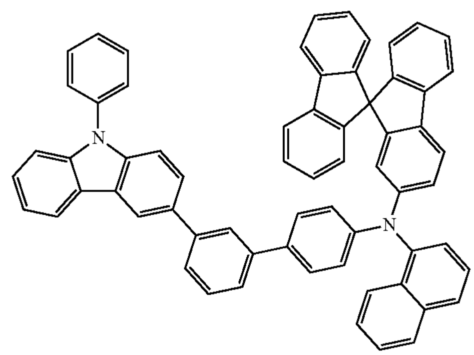
6-19
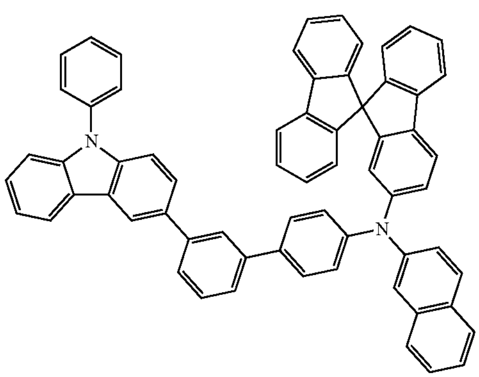
6-20
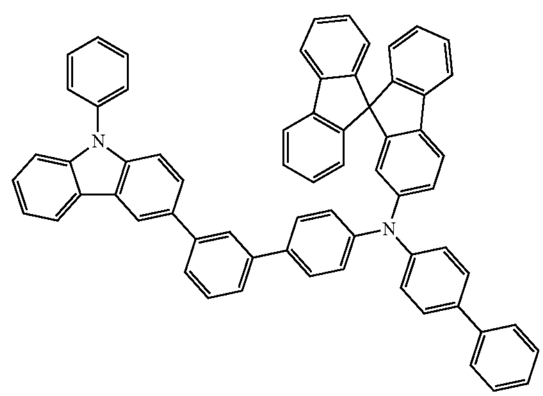

-continued
6-21
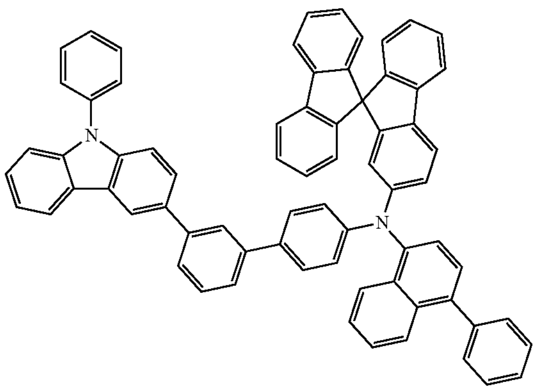
6-22
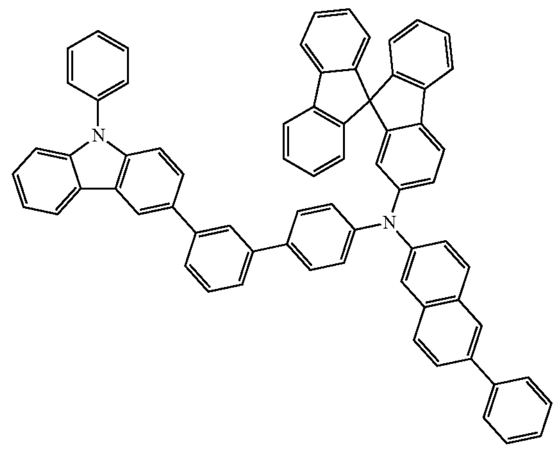
6-23
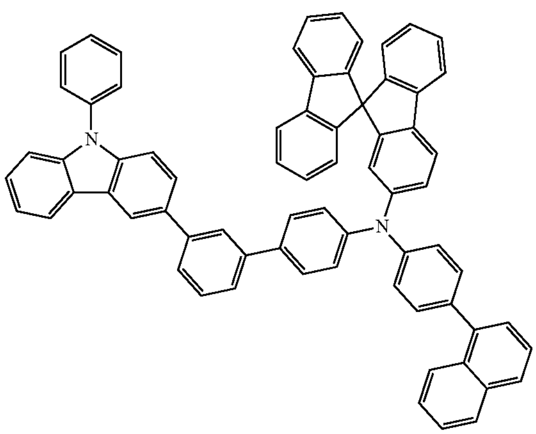
6-24
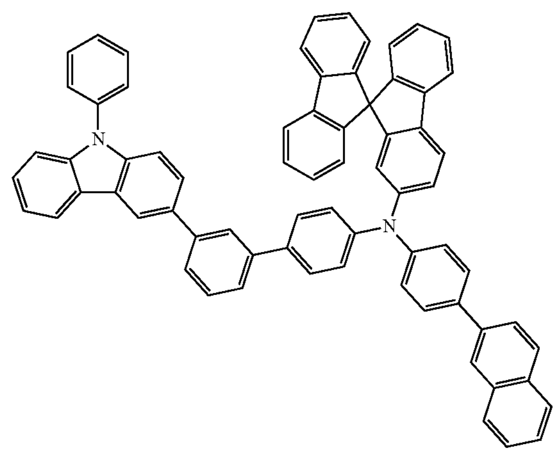
6-25
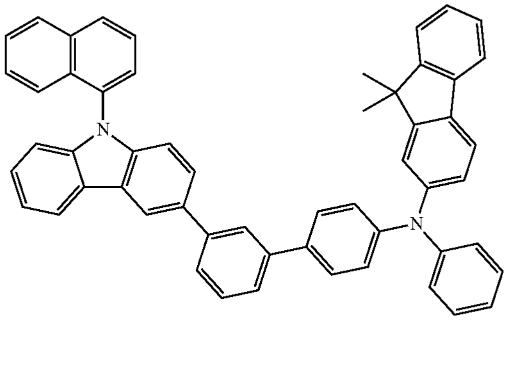
6-26
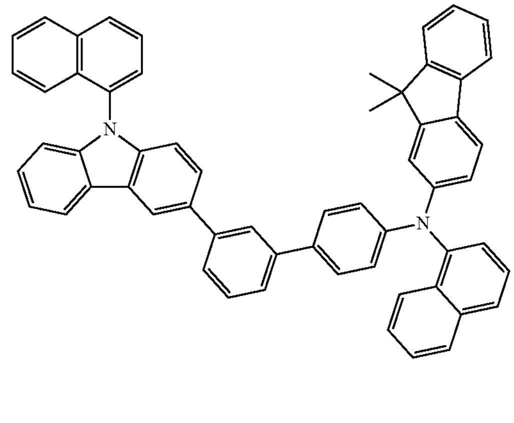

-continued
6-27
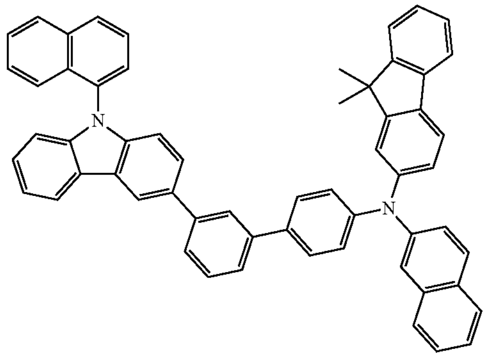
6-28
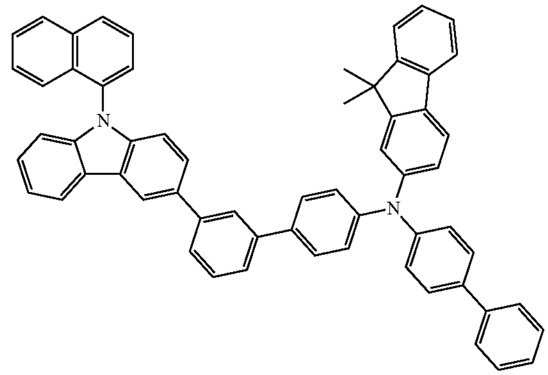
6-29
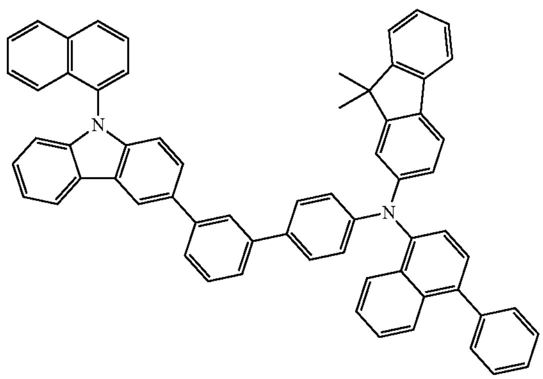
6-30
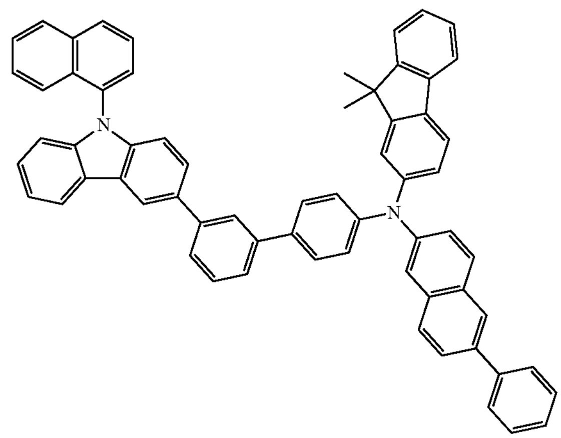
6-31
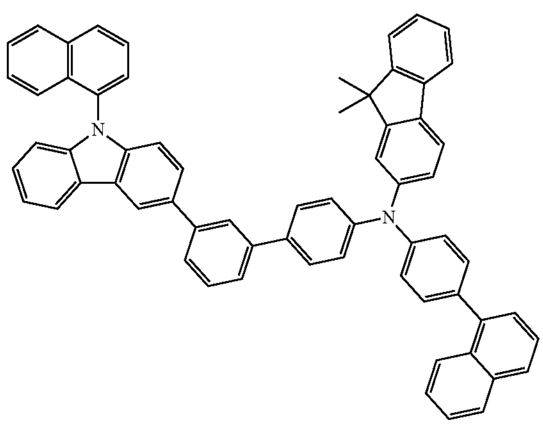
6-32
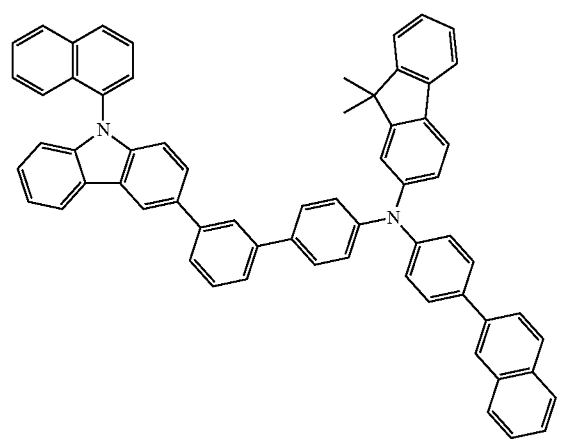
6-33
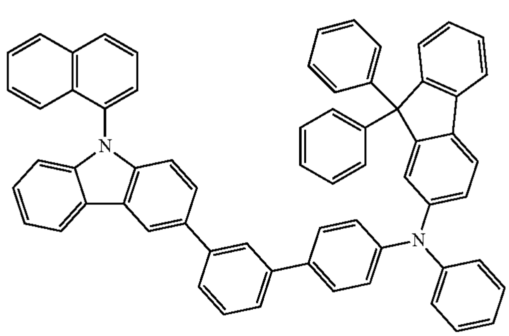
6-34
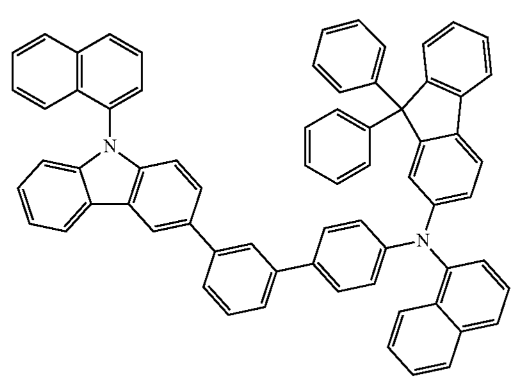

-continued
6-35
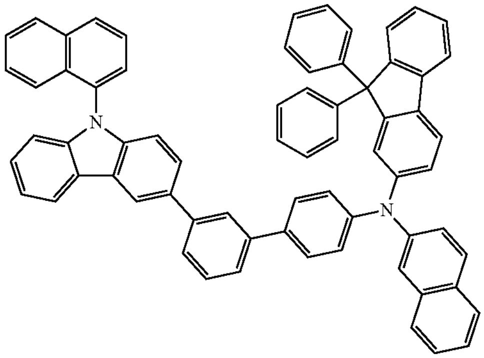
6-36
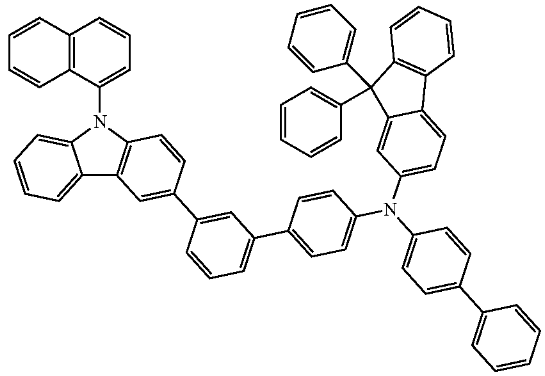
6-37
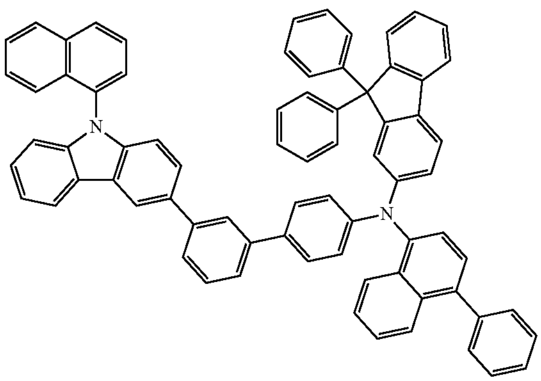
6-38
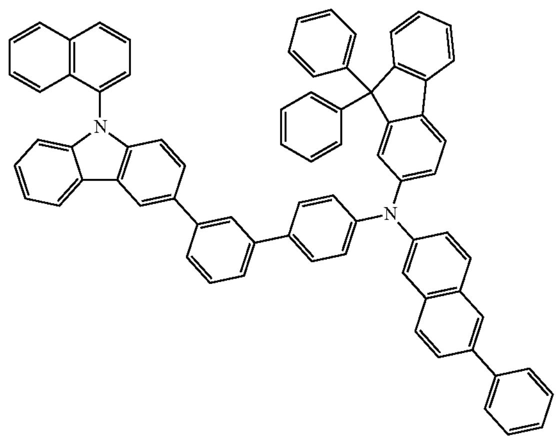
6-39
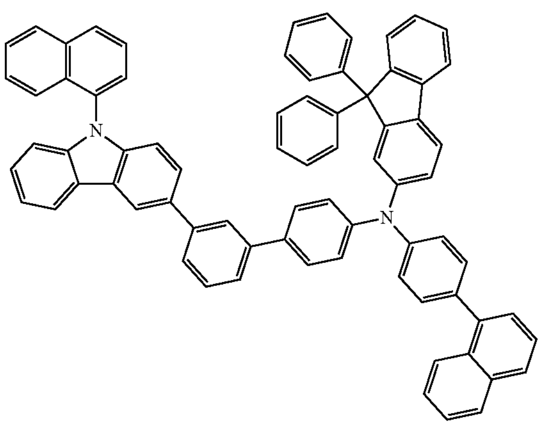
6-406
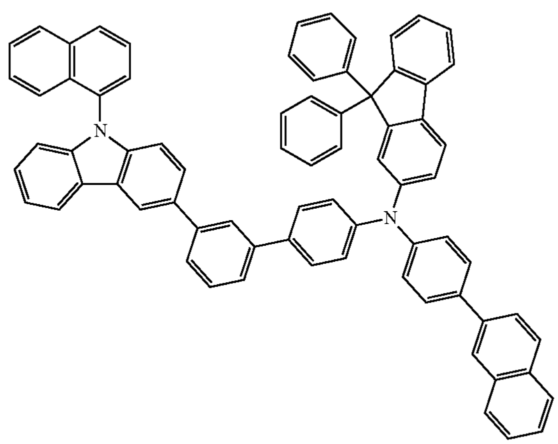
6-41
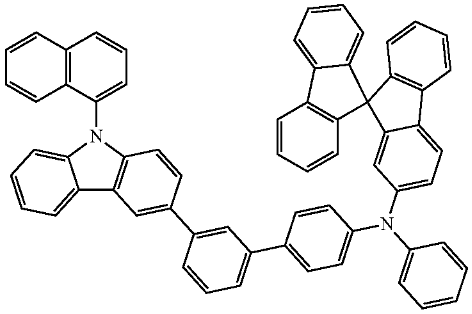
6-42
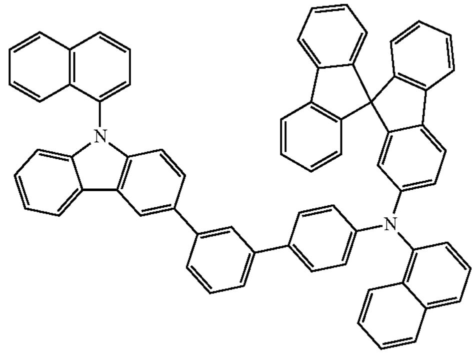

-continued
6-43
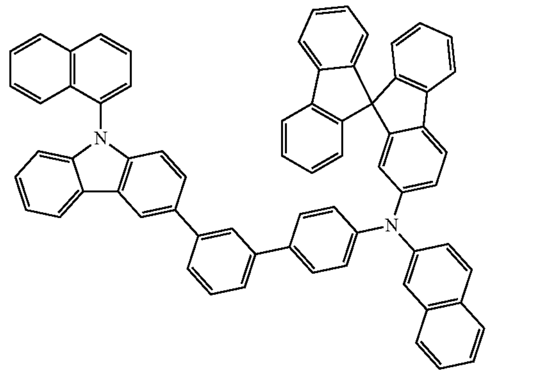
6-44
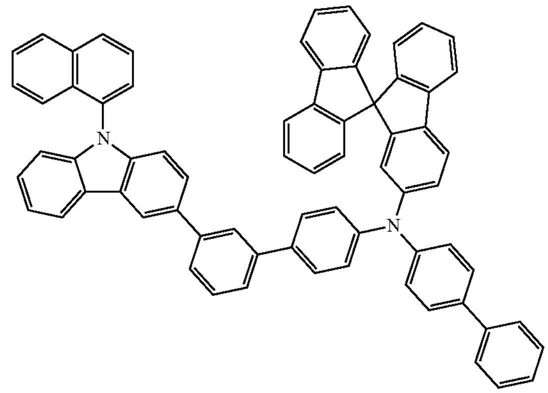
6-45
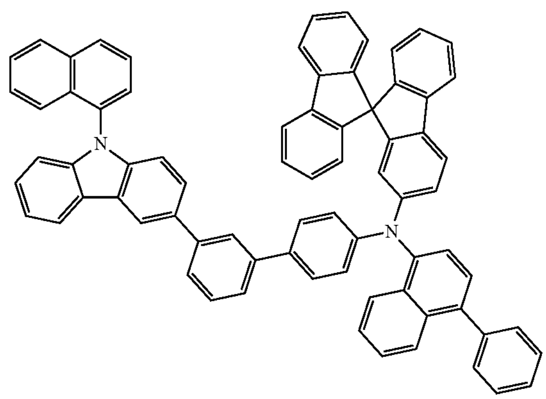
6-46
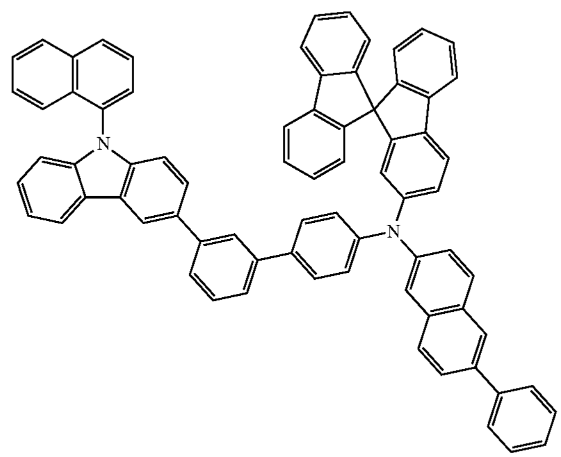
6-47
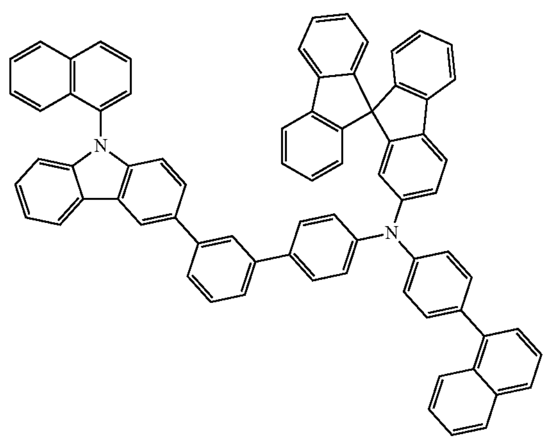
6-48
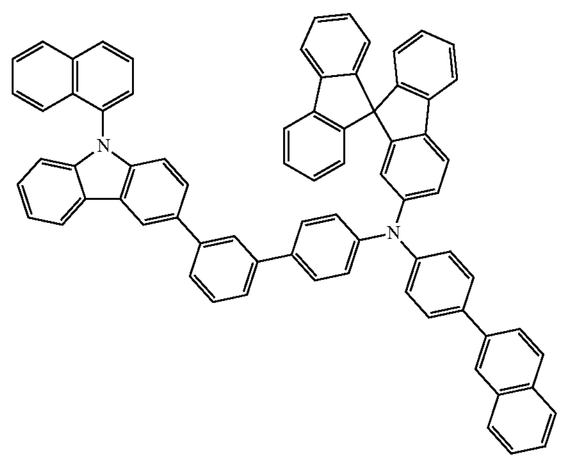

-continued
6-49
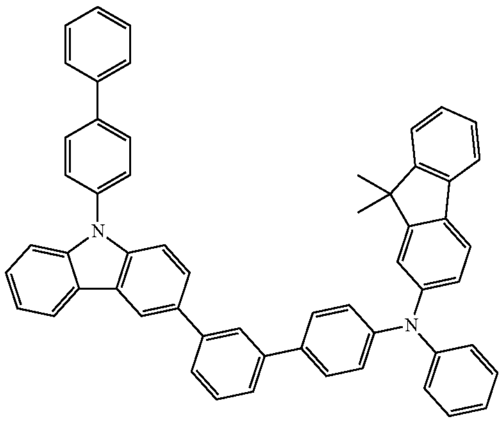
6-50
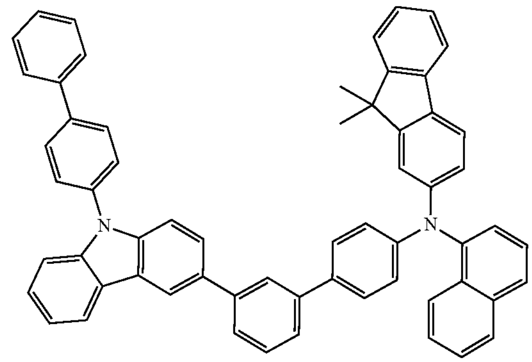
6-51
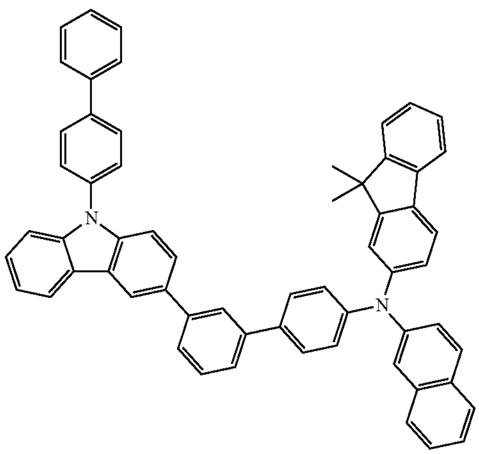
6-52
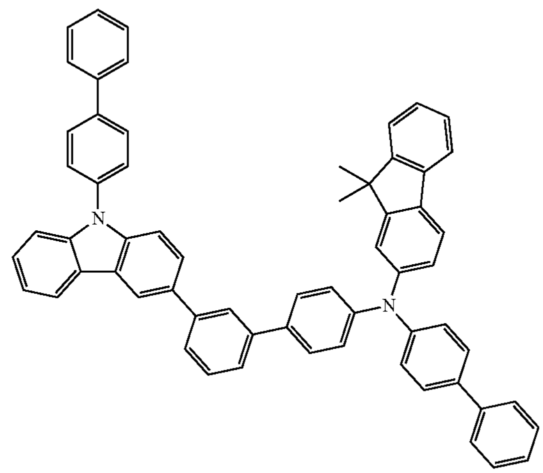
6-53
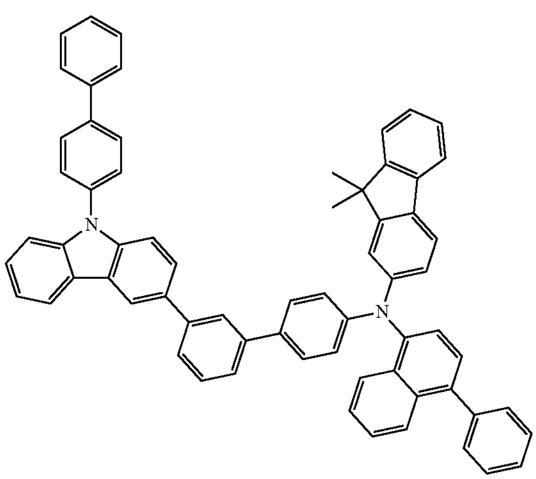
6-54
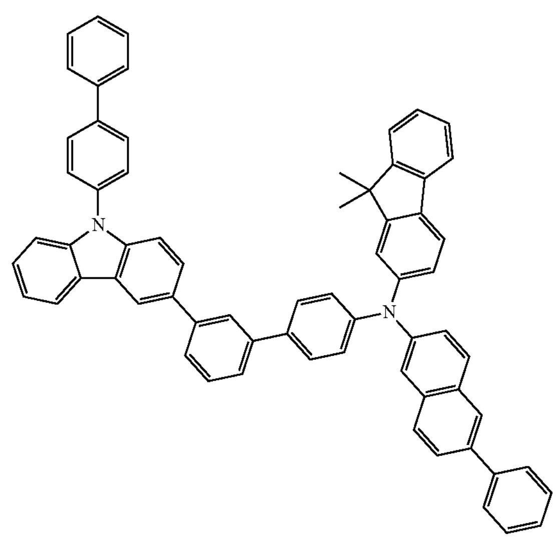

-continued
6-55
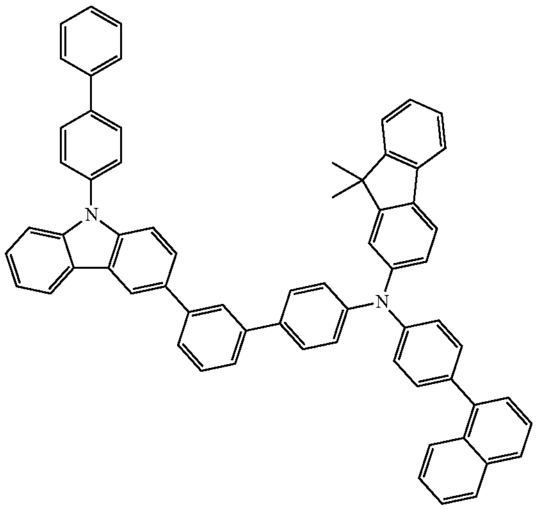
6-56
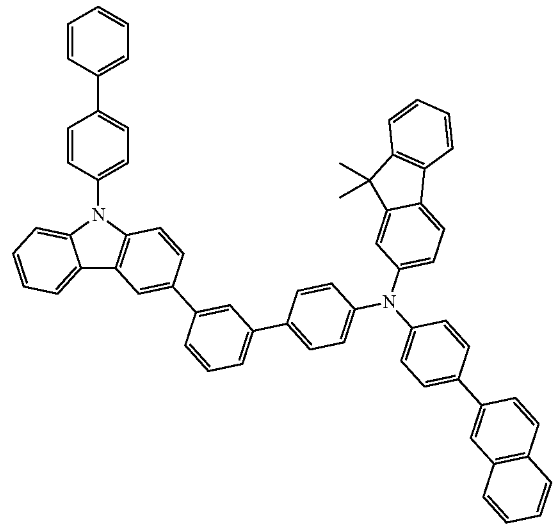
6-57
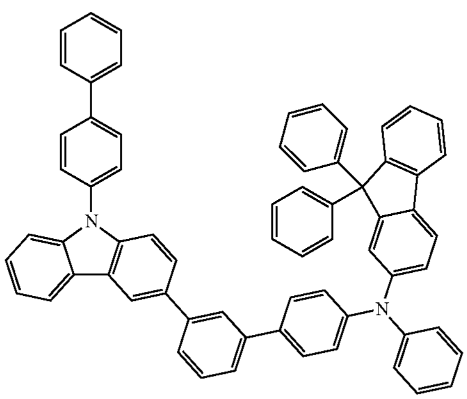
6-58
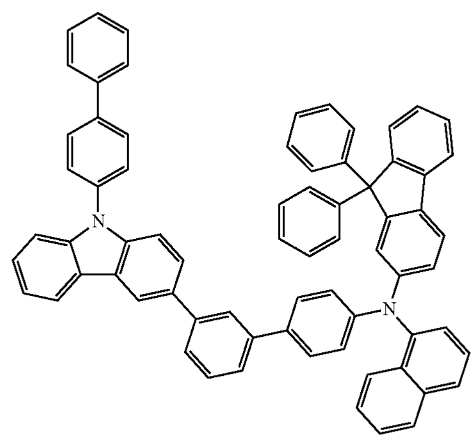
6-59
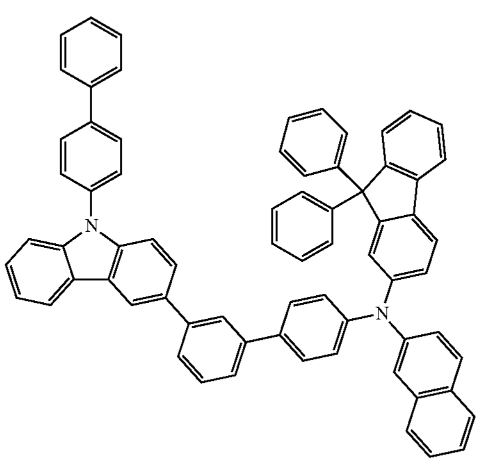
6-60
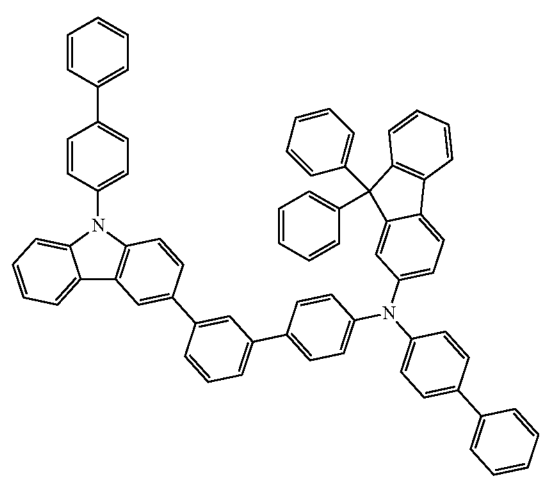

-continued
6-61
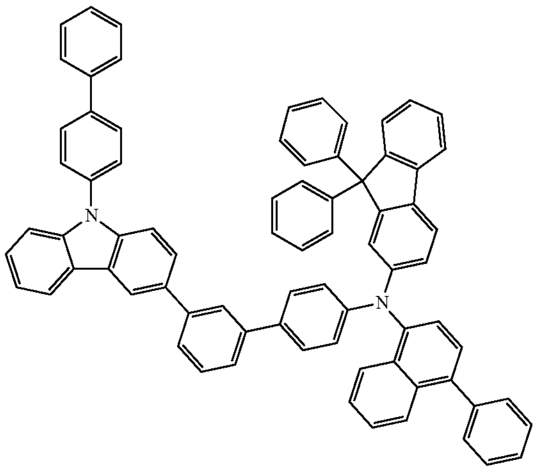
6-62
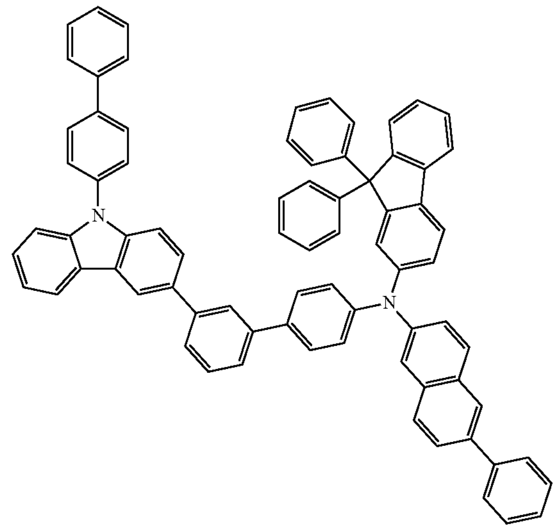
6-63
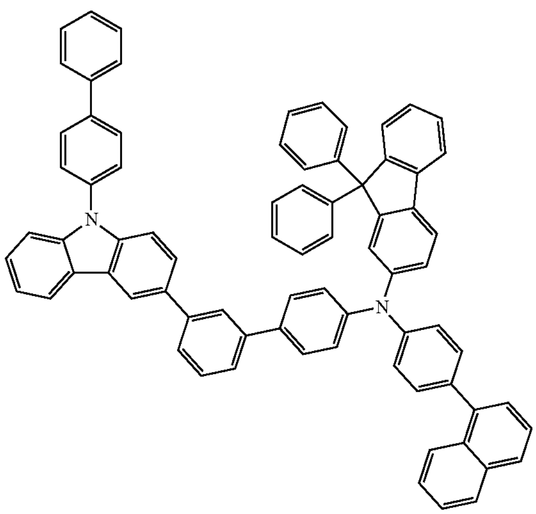
6-64
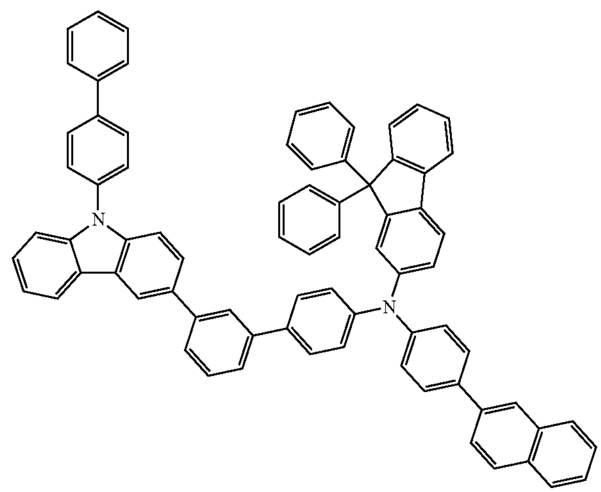
6-65
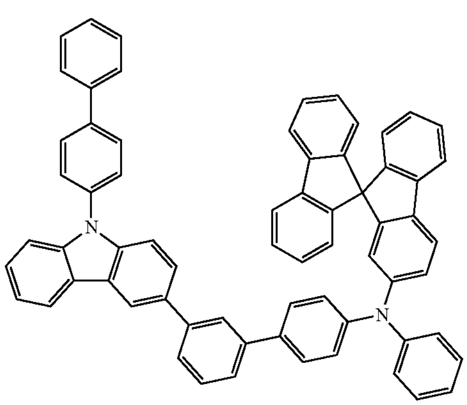
6-66
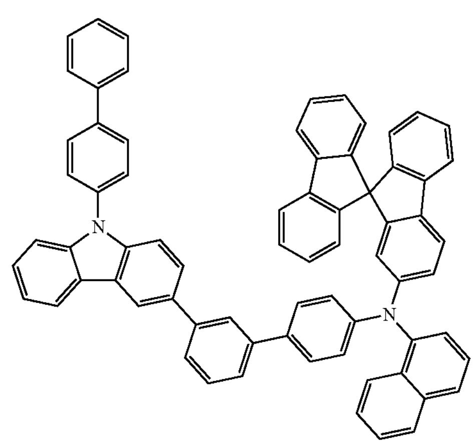

-continued
6-67
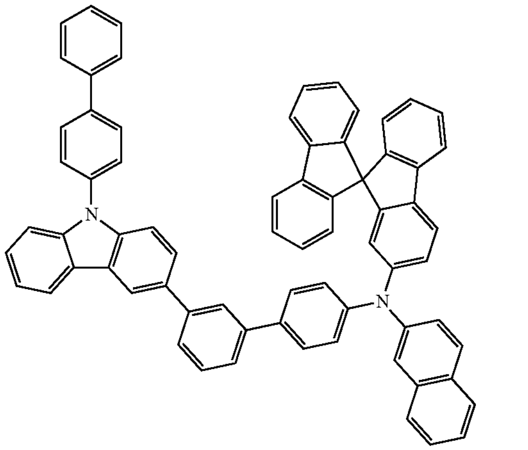
6-68
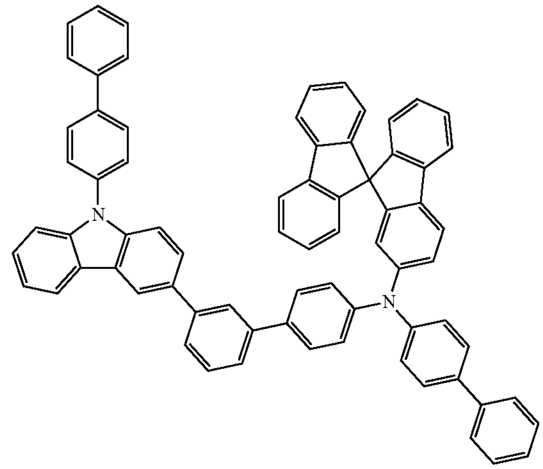
6-69
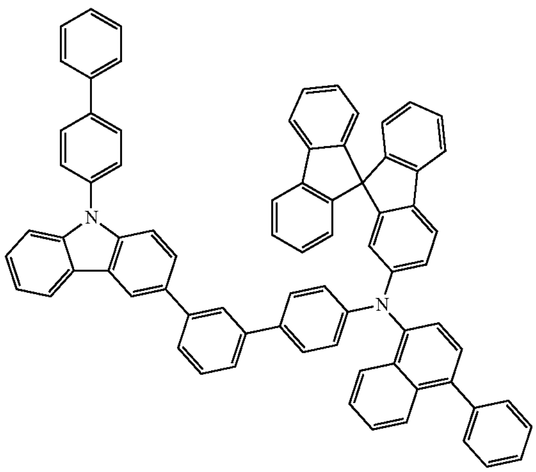
6-70
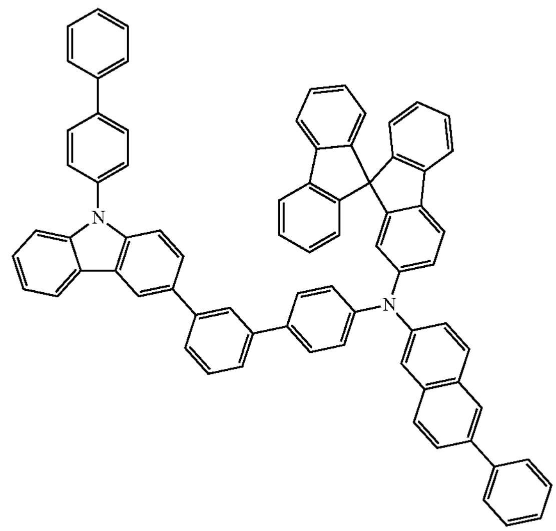
6-71
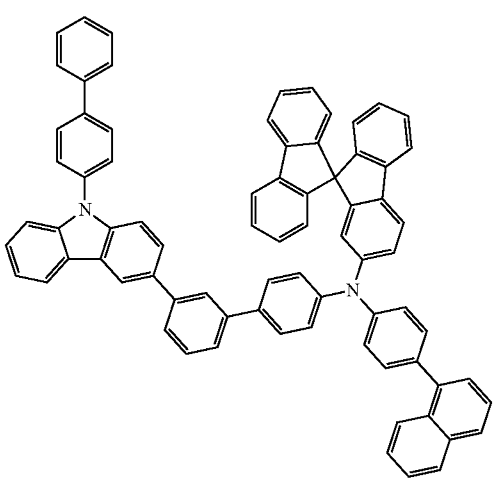
6-72
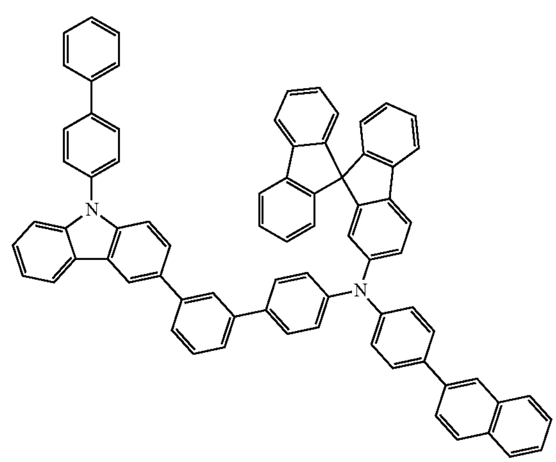

-continued
6-73
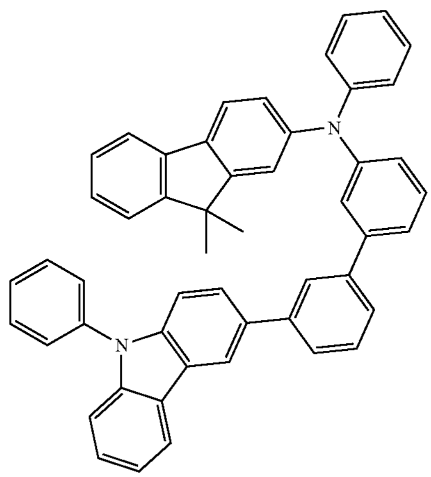
6-74
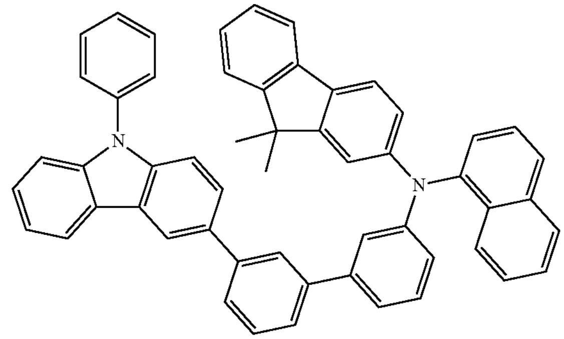
6-75
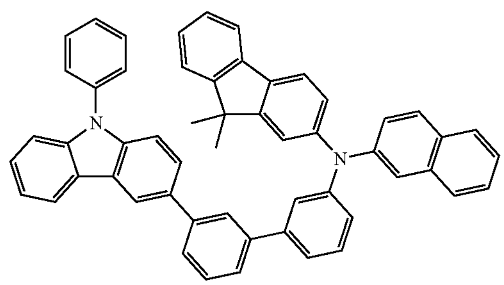
6-76
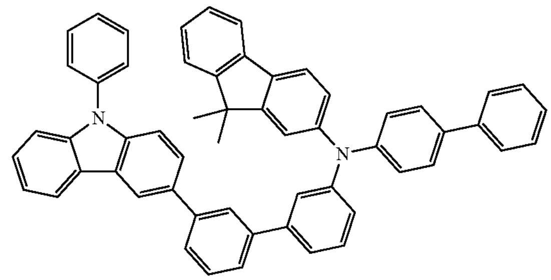
6-77
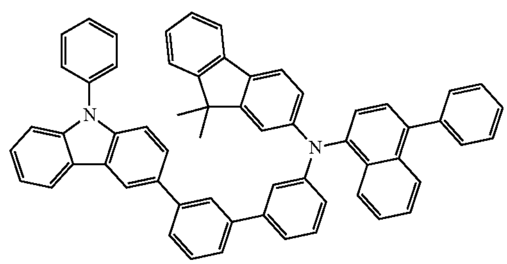
6-78
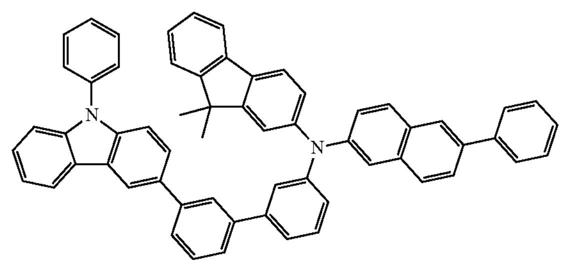
6-79
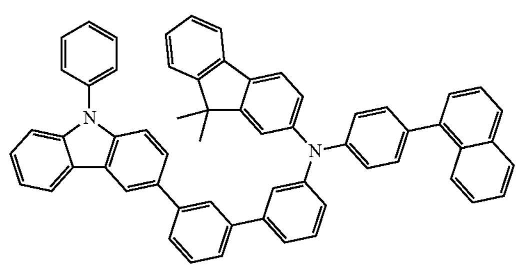
6-80
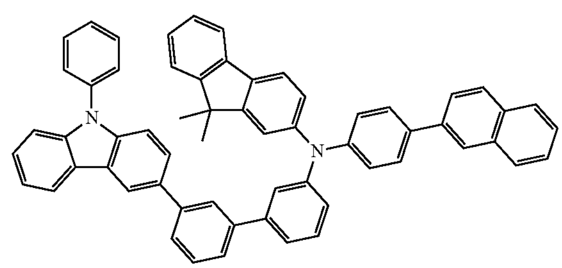

-continued
6-81
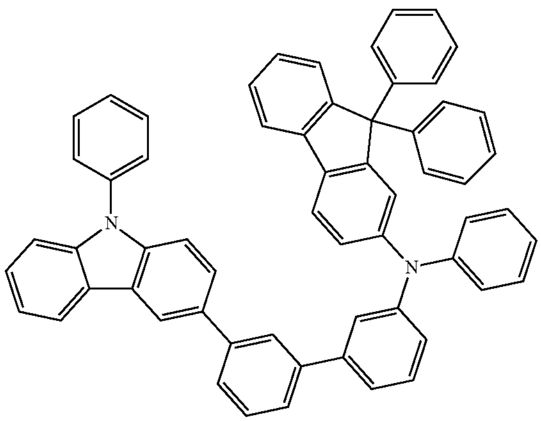
6-82
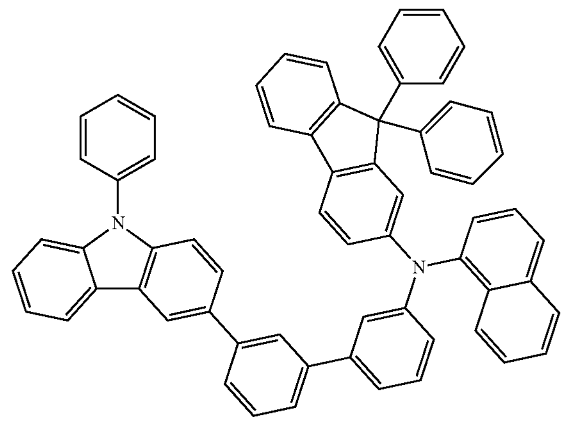
6-83
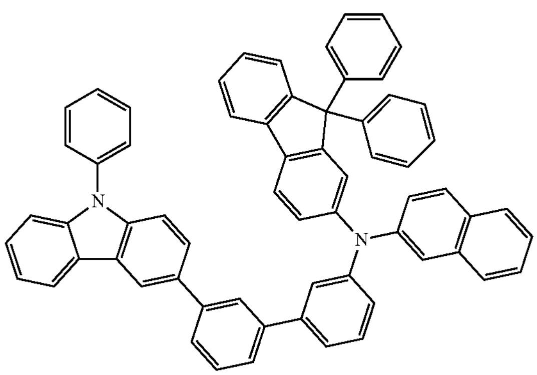
6-84
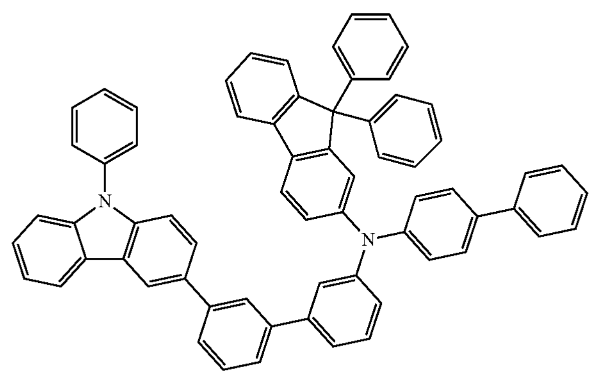
6-85
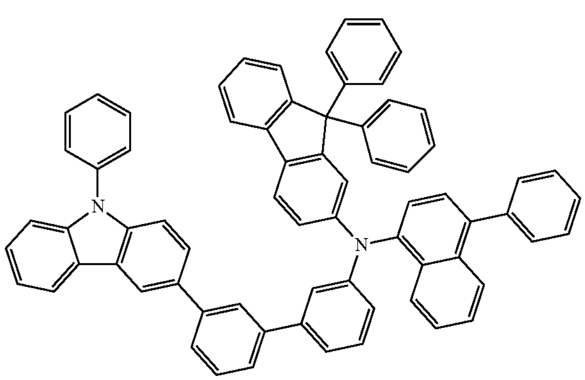
6-86
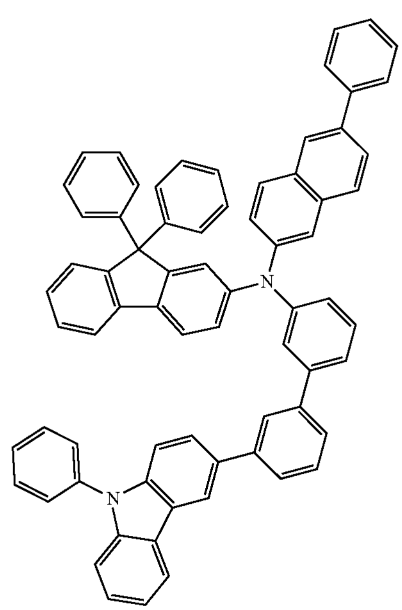

-continued
6-87
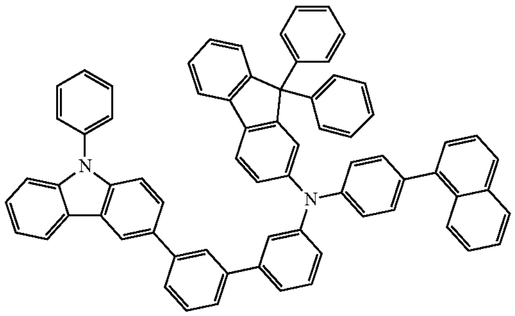
6-88
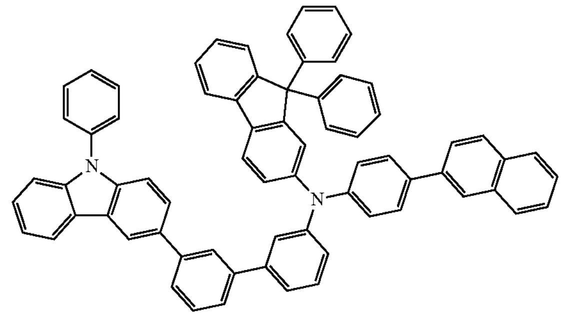
6-89
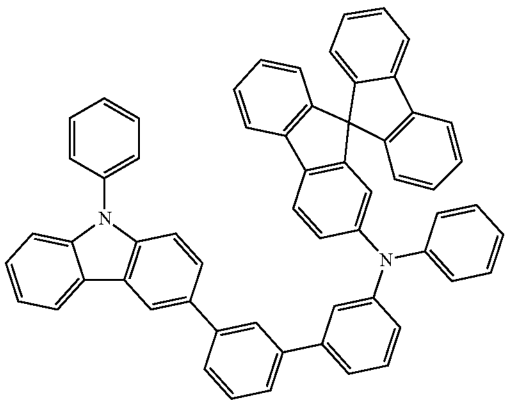
6-90
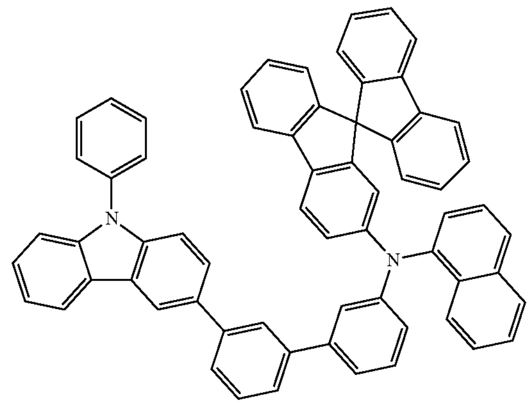
6-91
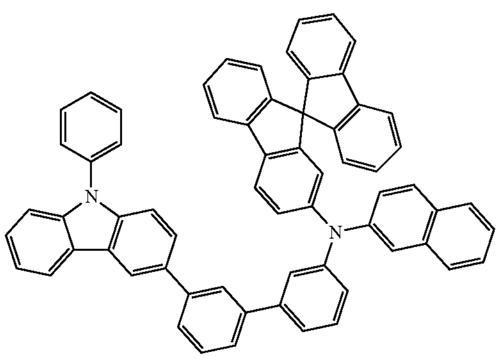
6-92
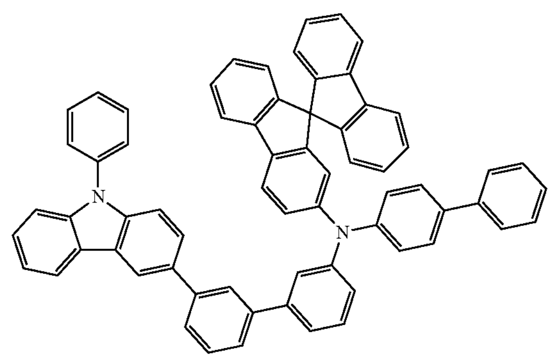
6-93
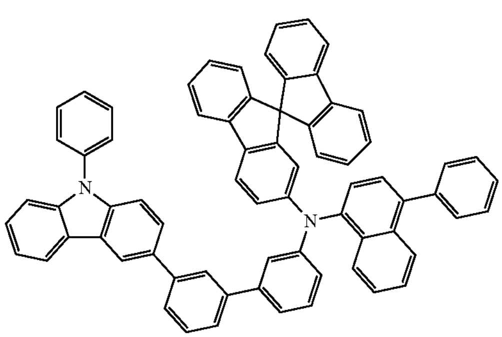
6-94
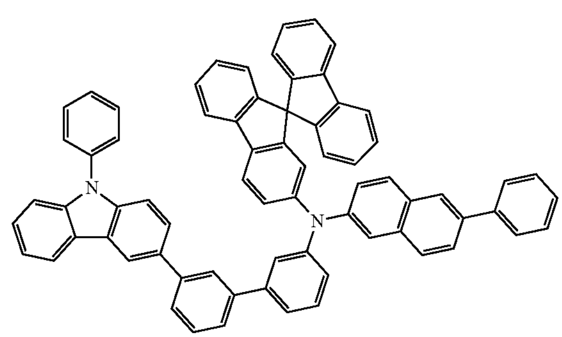

-continued
6-95
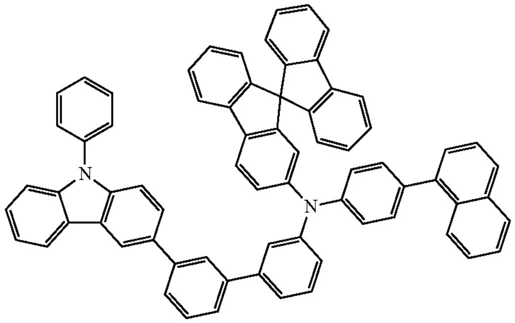
6-96
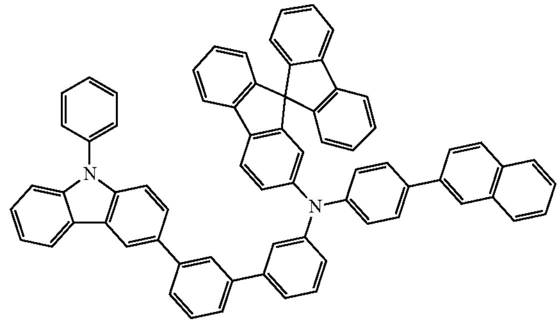
6-97
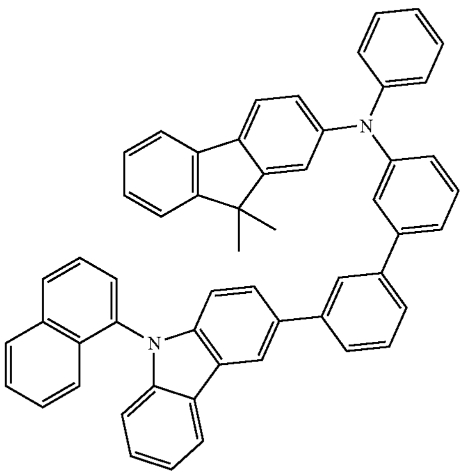
6-98
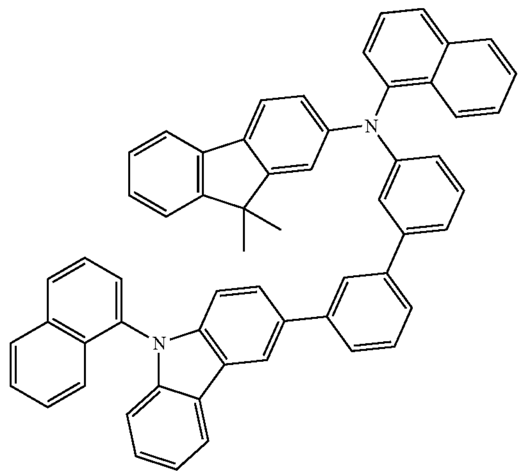
6-99
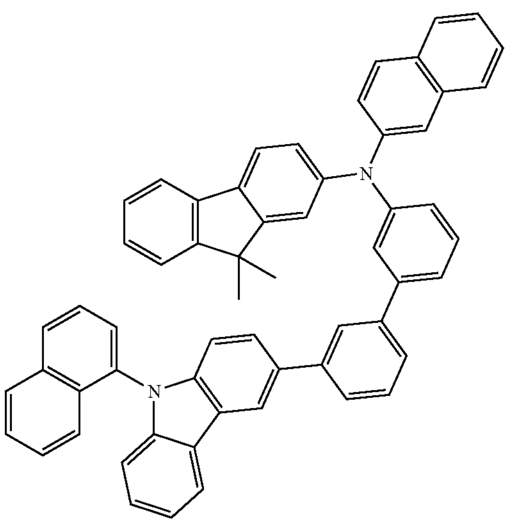
6-100
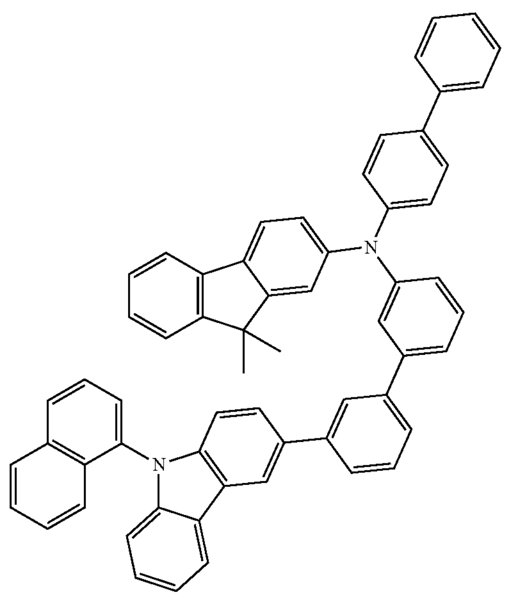

-continued
6-101
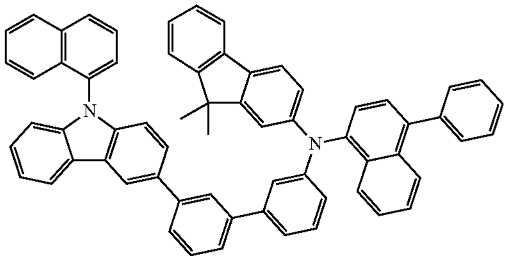
6-102
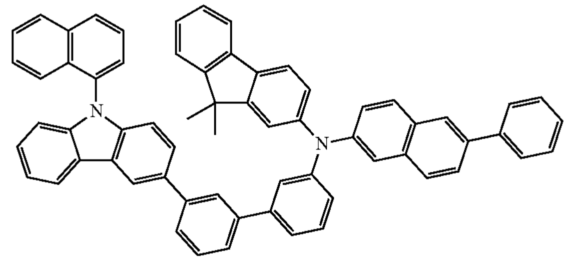
6-103
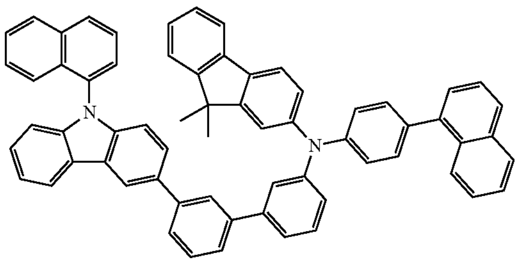
6-104
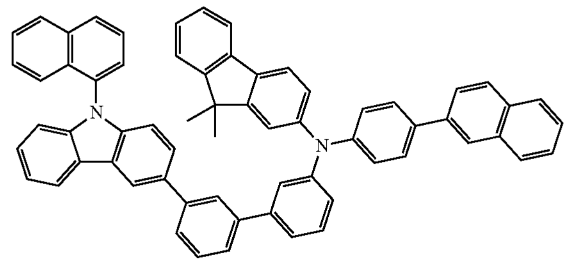
6-105
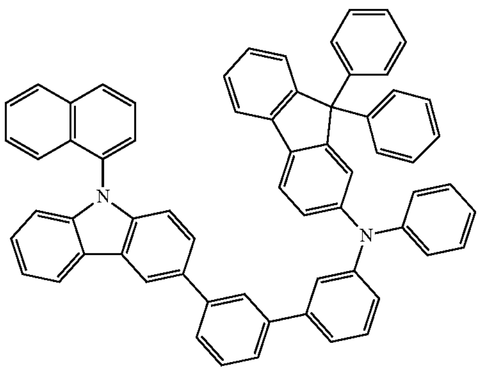
6-106
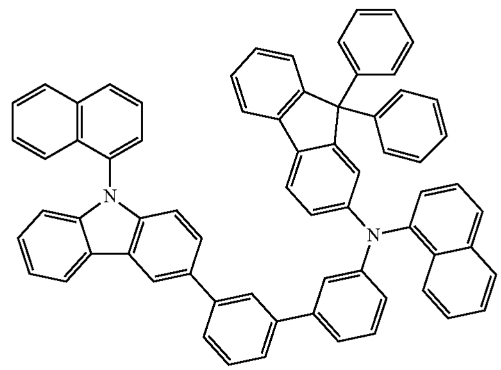
6-107
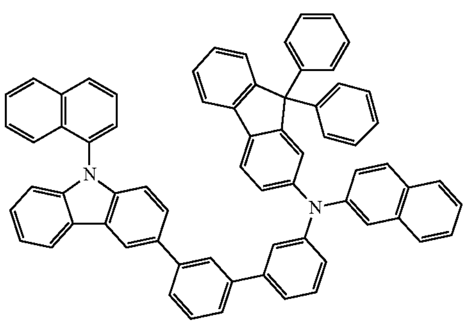
6-108
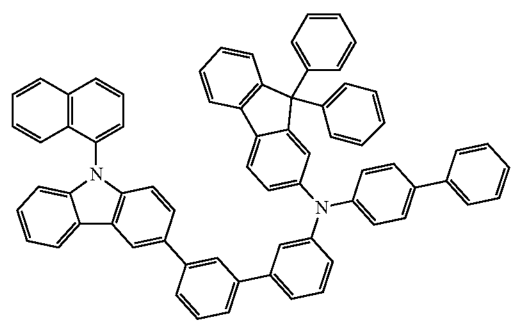
6-109
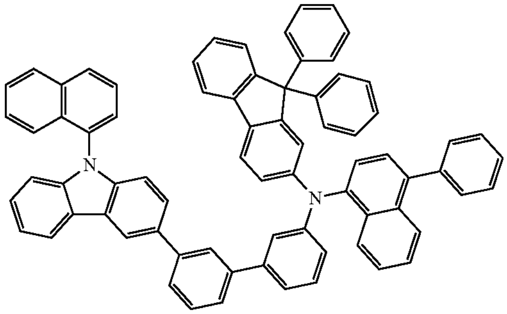
6-110
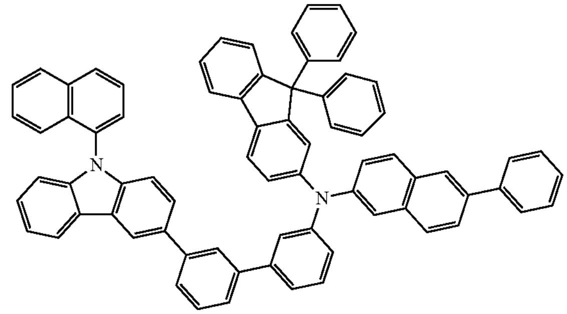

-continued
6-111
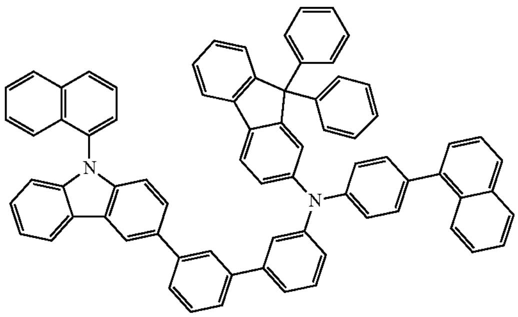
6-112
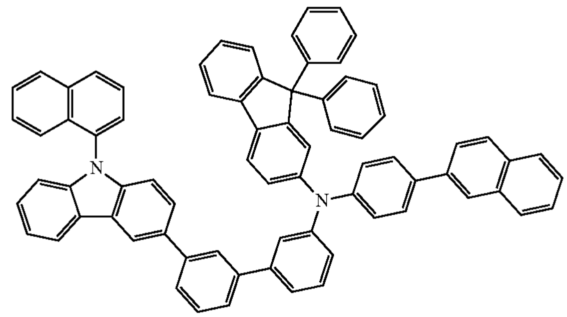
6-113
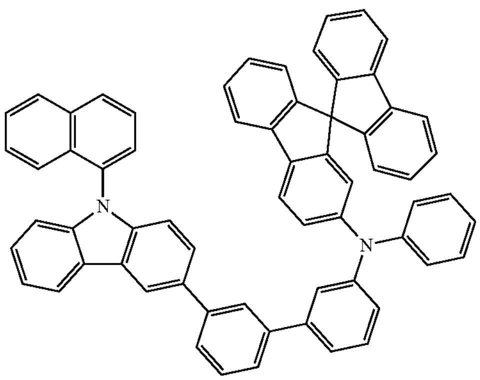
6-114
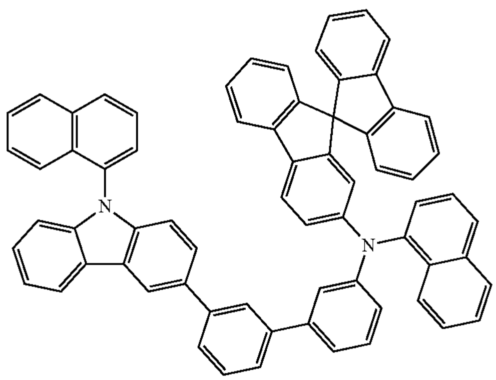
6-115
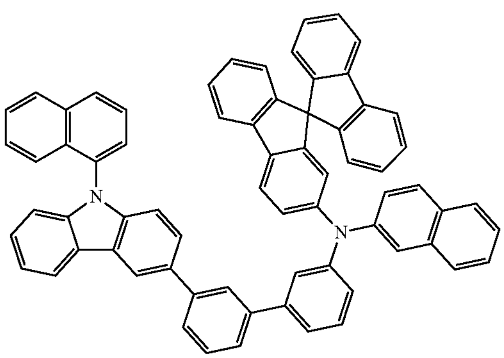
6-116
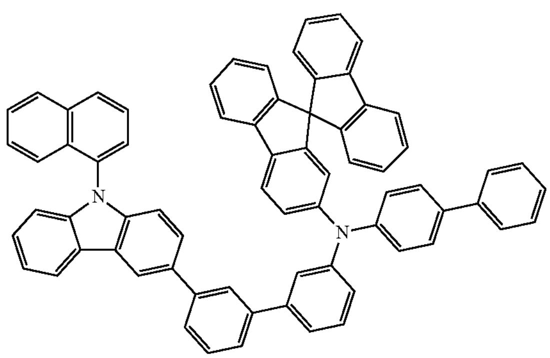
6-117
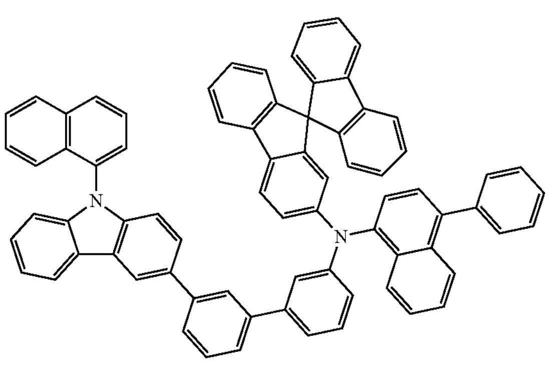

-continued
6-118
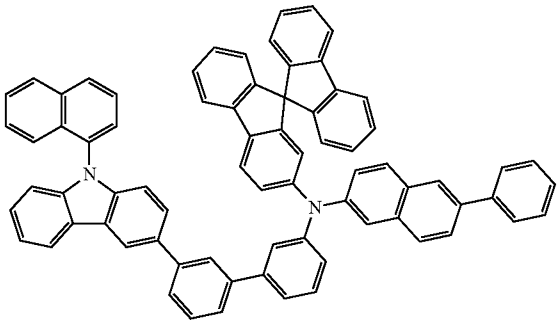
6-119
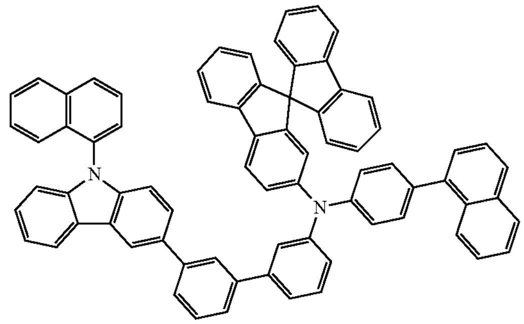
6-120
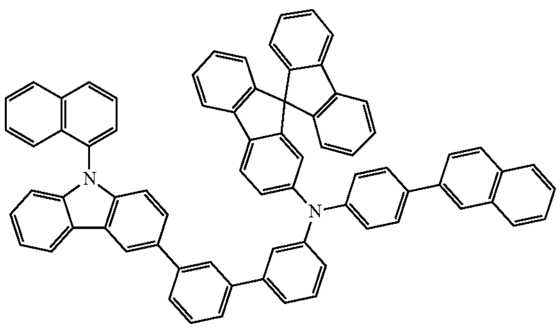
6-121
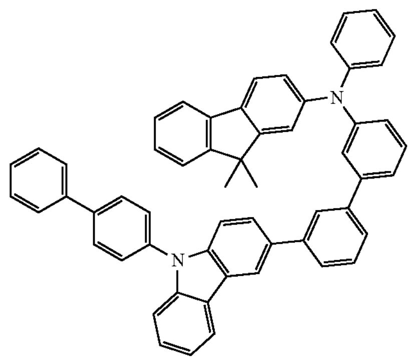
6-122
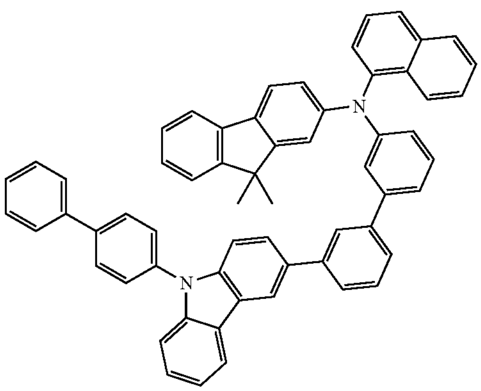
6-123
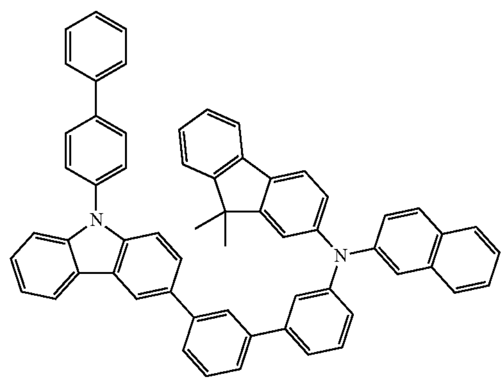
6-124
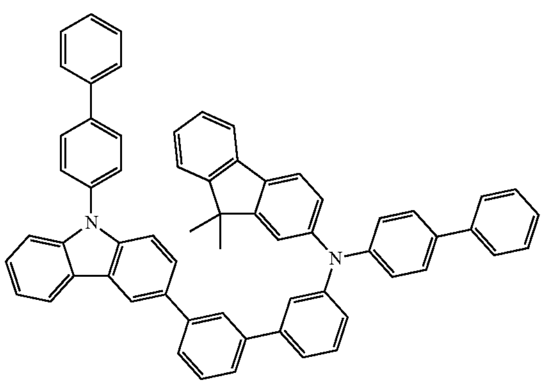
6-125
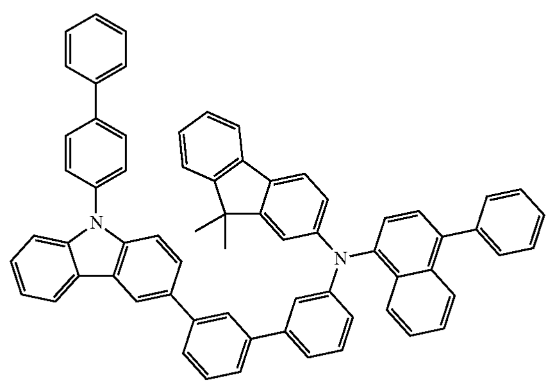

-continued
6-126
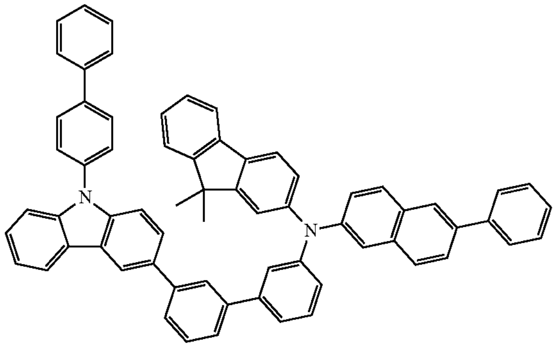
6-127
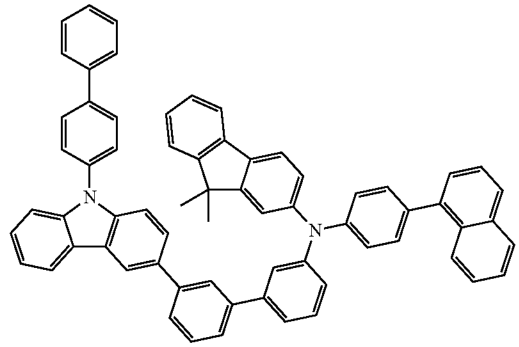
6-128
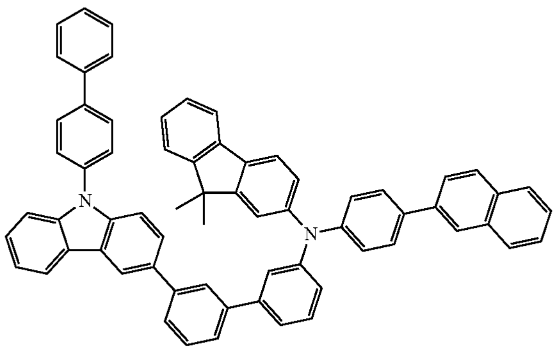
6-129
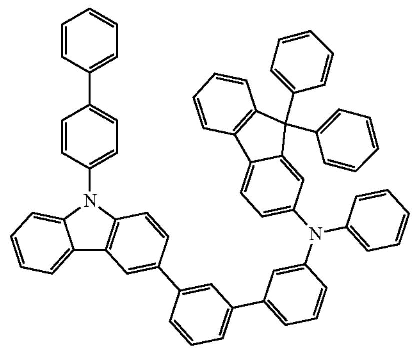
6-130
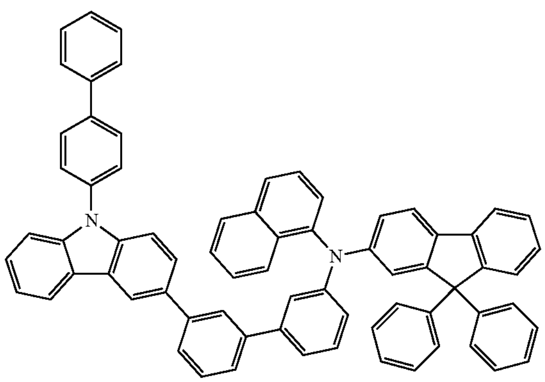
6-131
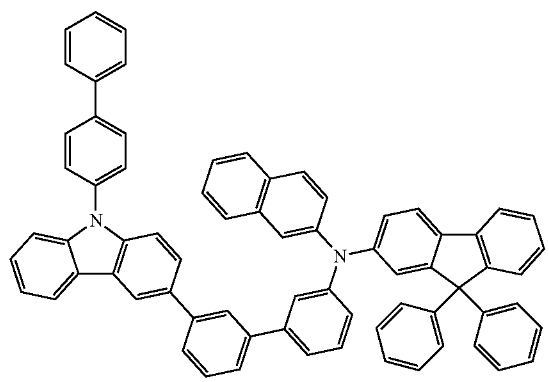
6-132
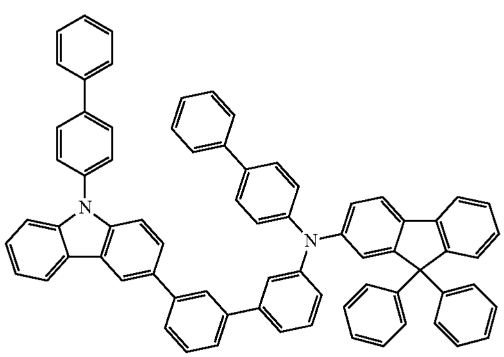
6-133
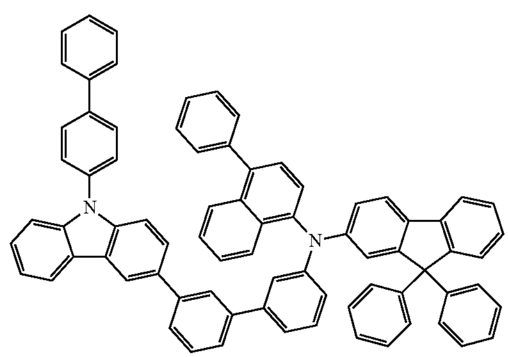

-continued
6-134
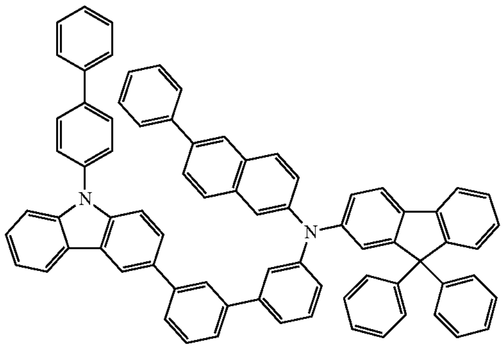
6-135
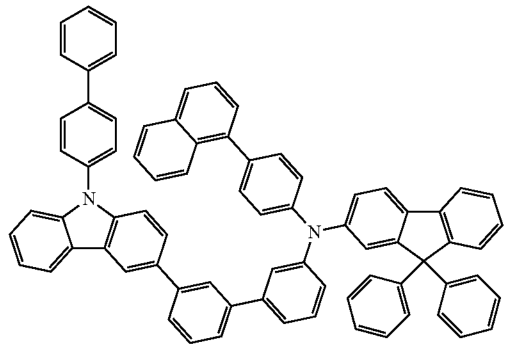
6-136
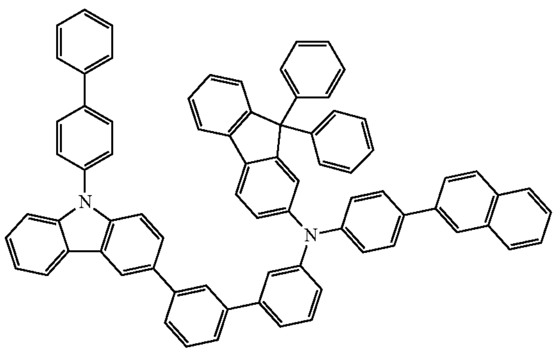
6-137
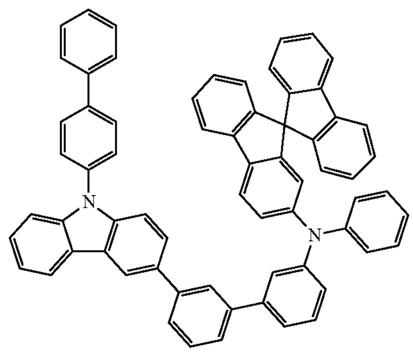
6-138
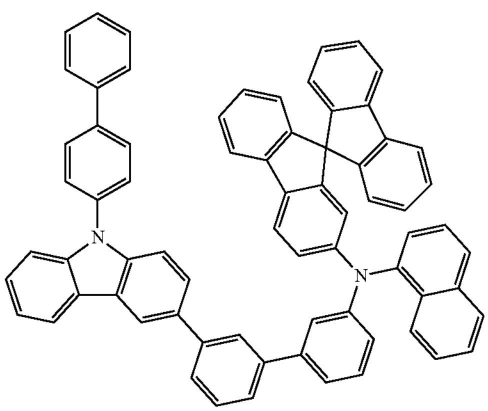
6-139
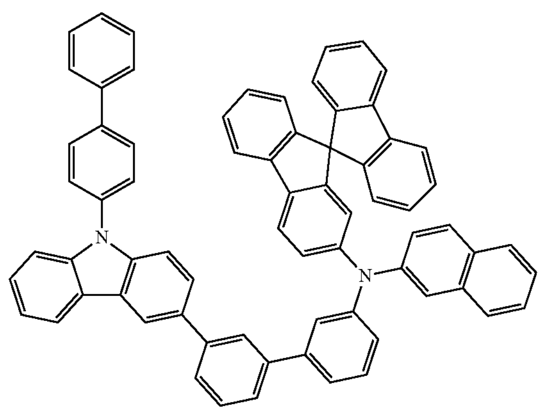
6-140
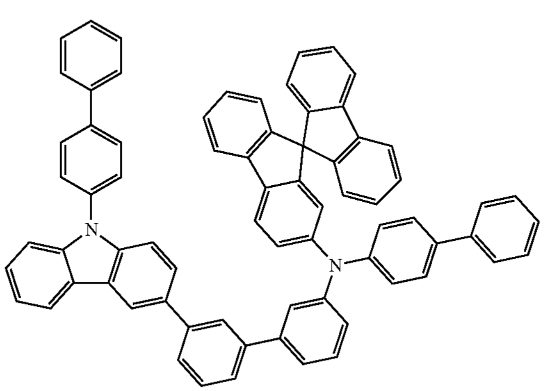
6-141
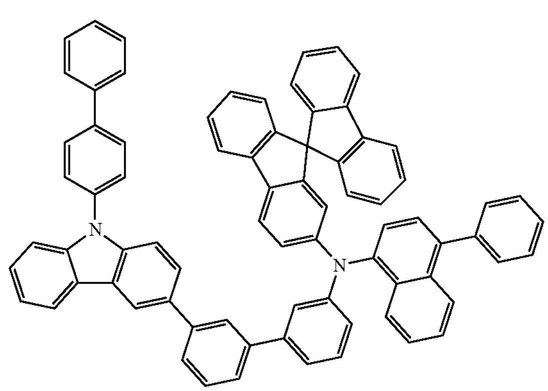

-continued 6-142

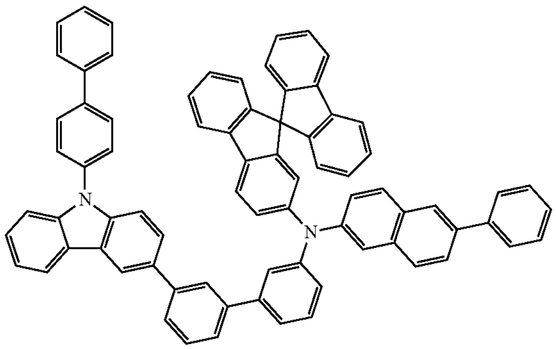

6-143

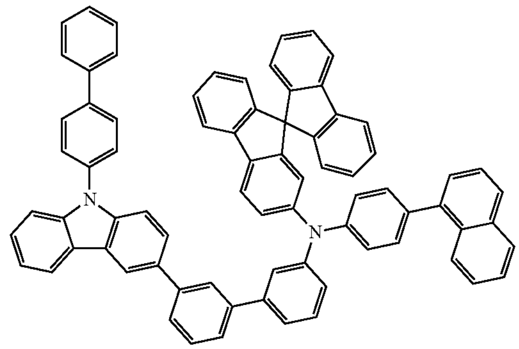

6-144

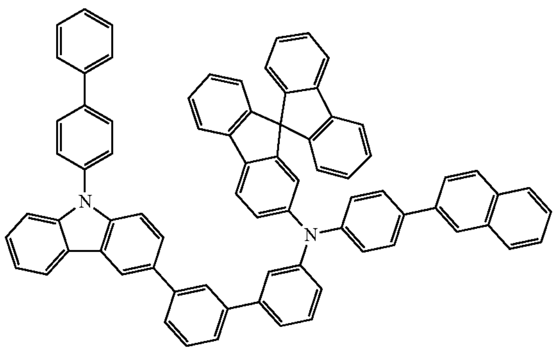

In some embodiments of the present invention, to obtain a high efficiency in an organic light-emitting diode, the hole mobility in a hole transport layer should be high enough to effectively transfer holes to an emission layer, and at the same time leakage of electrons from the emission layer into the hole transport layer should be prevented. The hole transport material represented by one of Formulae 2 to 4, according to some embodiments, above may effectively transport holes into the emission layer, and at the same time may prevent leakages of electrons from the emission layer into the hole transport layer due to having a higher lowest unoccupied molecular orbital (LUMO) level compared to the light-emitting material of Formula 1 above. In other words, the organic light-emitting diode according to any of the above-described embodiments of the present invention may reach a balance between hole migration and electron migration in the emission layer. Therefore, in some embodiments of the present invention, the use of a compound represented by one of Formulae 2 to 4 above as the hole transport material, and a compound represented by Formula 1 above as the light-emitting material may cause effective generation of exitions in the emission layer, so that the organic light-emitting diode may have a high efficiency and a long lifetime.

To achieve a high efficiency in the organic light-emitting diode in accordance with embodiments of the present invention, an organic layer including a hole transport material represented by one of Formulae 2 to 4 above, and organic layer Including a light-emitting material of Formula 1 above may be in contact with each other. However, embodiments of the present invention are not limited to this structure.

Hereinafter, a structure of an organic light-emitting diode according to an embodiment of the present invention and a method of manufacturing the same will now be described with reference to the drawing. The drawing is a schematic sectional view of an organic light-emitting diode 10 according to an embodiment of the present invention.

Referring to the drawing, the organic light-emitting diode 10 includes a substrate 11, a first electrode 13, an organic layer 15, and a second electrode 17.

The substrate 11 may be any substrate that is used in existing organic light-emitting diodes. In some embodiments the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 is an anode, a material having a high work function may be used as the first electrode-forming material to facilitate hole injection. The first electrode 13 may be a reflective electrode or a transmission electrode. Transparent and conductive materials such as Indium Tin Oxide (ITO), Indium Zinc Oxide (IZO), $SnO_2$, and ZnO may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but is not limited thereto.

The organic layer 15 may be disposed on the first electrode 13.

The organic layer 15 may include a hole injection layer (HIL), a hole transport layer (HTL), an H-functional layer (having both hole injection and hole transport capabilities), a buffer layer, an emission layer (EML), an electron transport layer (ETL), and an electron injection layer (EIL).

A HIL may be formed on the first electrode 13 by vacuum deposition, spin coating, casting, Langmuir-Blodgett (LB) deposition, or the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature from about 100° C. to about 500° C., a pressure from about $10^{-8}$ torr to about $10^{-3}$ torr, and a deposition rate from about 0.01 to about 100 Å/sec. However, the deposition conditions are not limited thereto.

When the HIL is formed using spin coating, the coating conditions may vary depending on the compound that is used to form the HIL, and the desired structure and thermal properties of the HIL to be formed. For example, the coating rate may be in the range from about 2000 rpm to about 5000 rpm, and a temperature at which heat treatment is performed to remove a solvent after coating may be in the range from about 80° C. to about 200° C. However, the coating conditions are not limited thereto.

In some embodiments, the HIL may be formed of any material that is commonly used to form a HIL. Non-limiting examples of the material that can be used to form the HIL are N,N'-diphenyl-N,N'-bis-[4-(phenyl-m-tolyl-amino)-phenyl]-biphenyl-4,4'-diamine (DNTPD), a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate) (PANT/PSS):

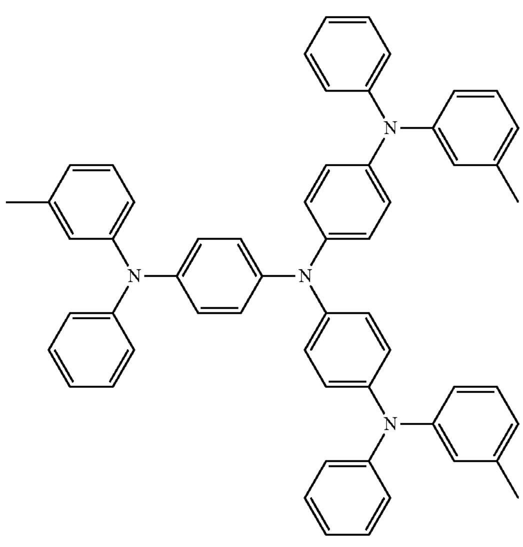

m-MTDATA

-continued

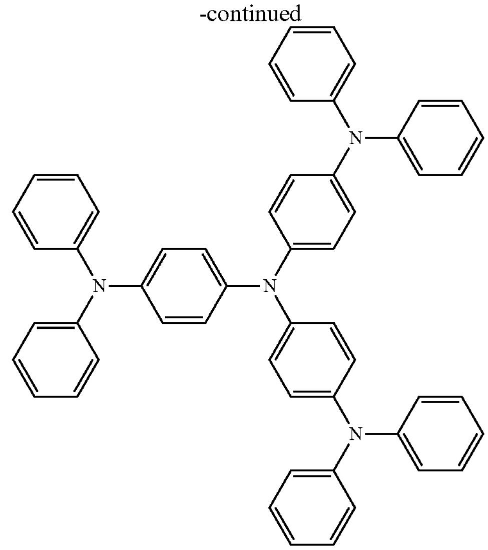

TDATA

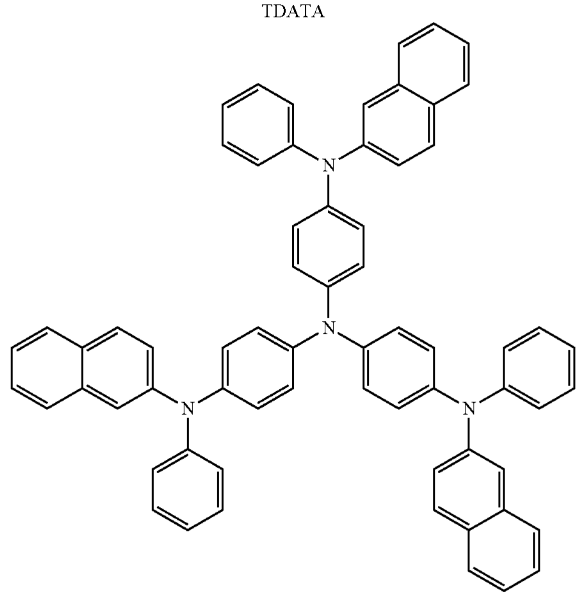

2-TNATA

The thickness of the HIL may be from about 100 Å to about 10000 Å, and in some embodiments, may be from about 100 Å to about 1000 Å. When the thickness of the HIL is within these ranges, the HIL may have good hole injecting ability without a substantial increase in driving voltage.

In some embodiments, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

Non-limiting examples of suitable known hole transport materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

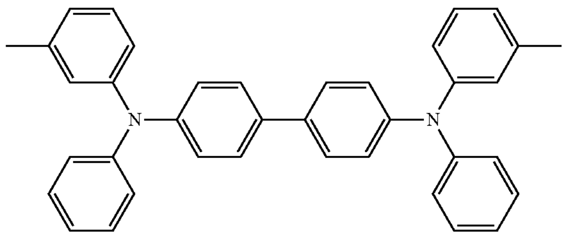

TPD

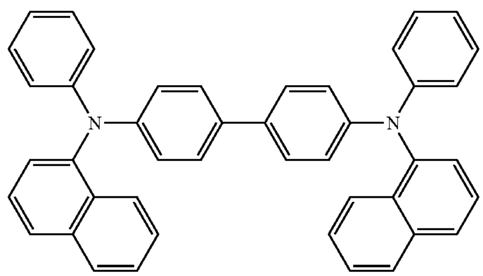

NPB

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

An H-functional layer (having both hole injection and hole transport capabilities) may contain at least one material from each group of the hole injection layer materials and hole transport layer materials. The thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

In some embodiments of the present invention, at least one of the HIL, HTL, and H-functional layer further includes a charge-generating material for improved layer conductivity, in addition to a the hole injecting material, hole transport material, and/or material having both hole injection and hole transport capabilities as described above.

The charge-generating material may be, for example, one of a quinine derivative, a metal oxide, and a cyano group-containing compound, but is not limited thereto. Non-limiting examples of the charge-generating material are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

<Compound 200>

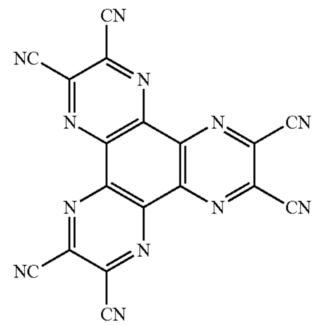

<F4-TCNQ>

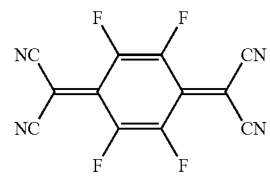

When the hole injection layer, hole transport layer, or H-functional layer further includes a charge-generating material, the charge-generating material may be homogeneously dispersed or inhomogeneously distributed in the layer.

In some embodiments, a buffer layer is placed between at least one of the HIL, HTL, and H-functional layer, and the EML. The buffer layer may compensate for an optical resonance distance of light depending on a wavelength of the light emitted from the EML, and thus may increase efficiency. The buffer layer may include any hole injecting material or hole transporting material that are widely known. In some other embodiments, the buffer layer may include the same material as one of the materials included in the HIL, HTL, and H-functional layer.

In further embodiments, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary depending on the material that is used to form the EML.

The EML may include a known light-emitting material. Non-limiting examples of the EML include a known host and a known dopant.

Non-limiting examples of the known host are tris(8-quinolinorate)aluminum (Alq3), 4,4'-N,N'-dicarbazole-biphenyl (CBP), poly(n-vinylcarbazole) (PVK), 9,10-di(naphthalene-2-yl)anthracene (herein abbreviated as DNA), TCTA, 1,3,5-tris(N-phenylbenzimidazole-2-yl)benzene (TPBI), 3-tert-butyl-9,10-di-2-naphthylanthracene (TBADN), mCP, and OXD-7.

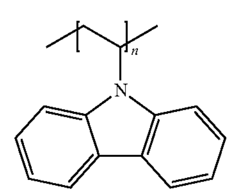

PVK

-continued

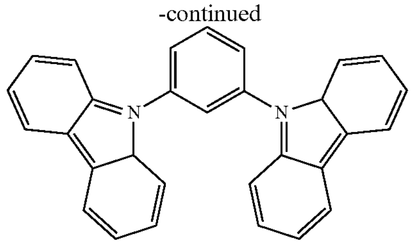

mCP

OXD-7

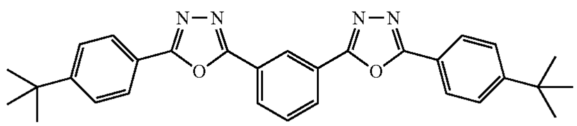

In some embodiments, at least one of a fluorescent dopant and a phosphorescent dopant may be used. Non-limiting examples of the phosphorescent dopant include, an organometallic complex including at least one selected from the group consisting of iridium (Ir), platinum (Pt), osmium (Os), rhenium (Re), titanium (Ti), zirconium (Zr), hafnium (Hf), and a combination of at least two thereof.

Non-limiting examples of known blue dopants include $F_2$Irpic, $(F_2ppy)_2$Ir(tmd), Ir(dfppz)$_3$, ter-fluorene, 4,4'-bis(4-diphenylaminostyryl)biphenyl (DPAVBi), and 2,5,8,11-tetra-tert-butyl pherylene (TBPe), and DPVBi.

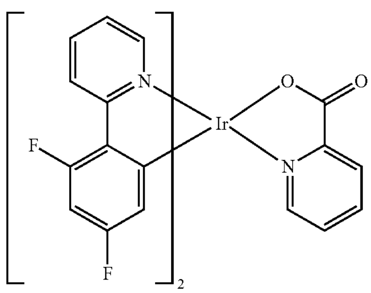

$F_2$Irpic

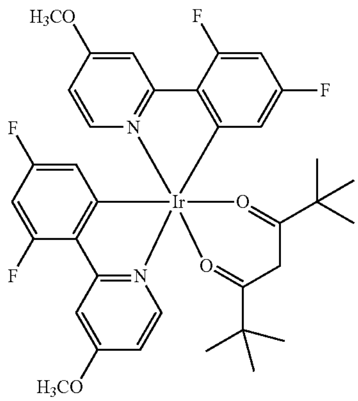

$(F_2ppy)_2$Ir (tmd)

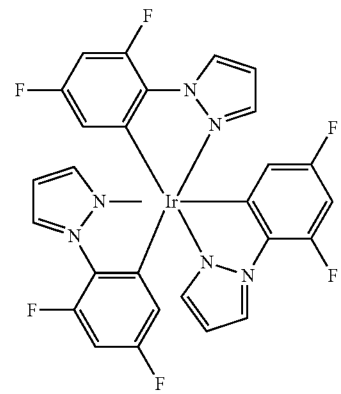

Ir(dfppz)$_3$

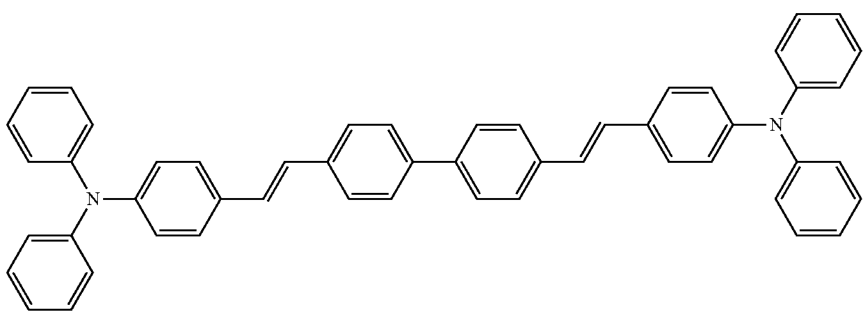

DPAVBi

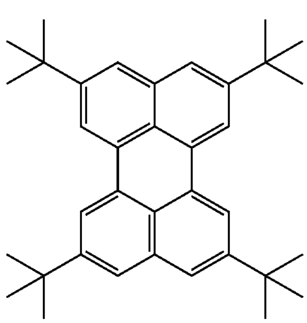

TBPe

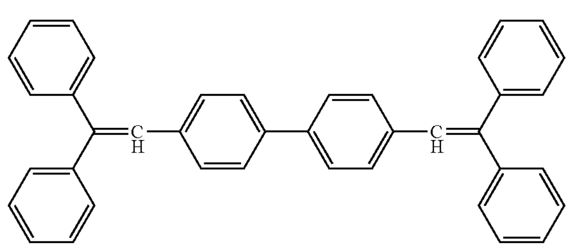

DPVBi

Non-limiting examples of known red dopants include PtOEP, $Ir(piq)_3$, and BtpIr.
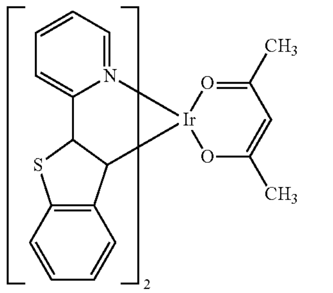
Btpir
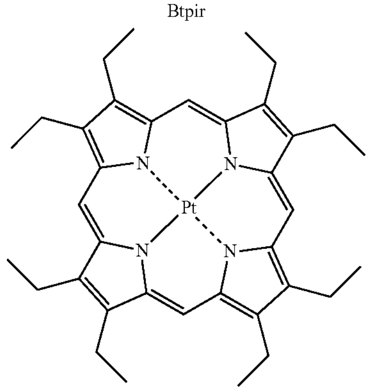
PtOEP
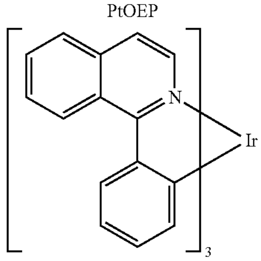
$Ir(piq)_3$
Non-limiting other examples of known red dopants include compounds represented by one of the following formulae.
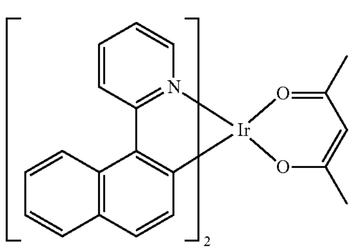
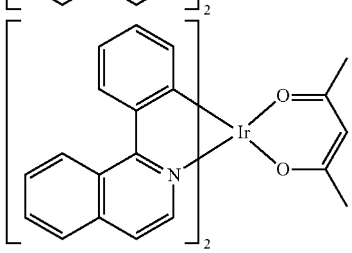
-continued
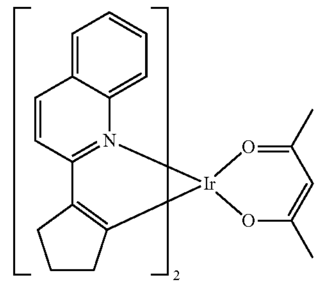
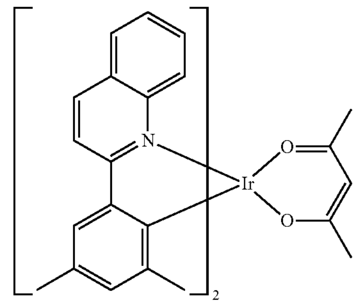
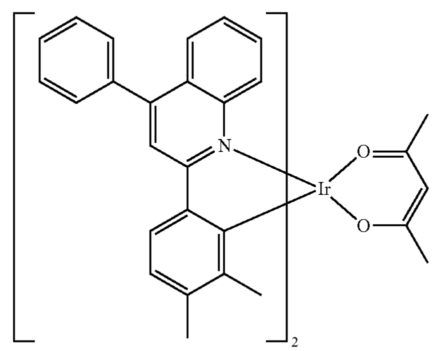
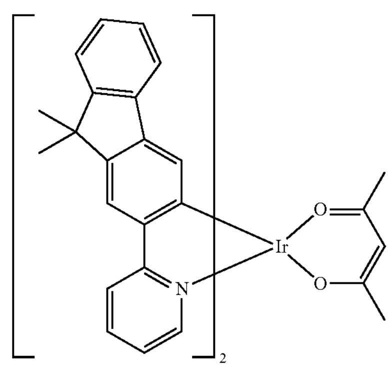
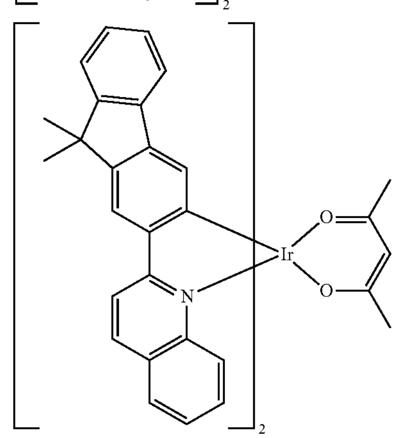

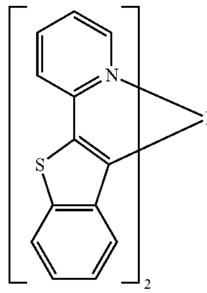
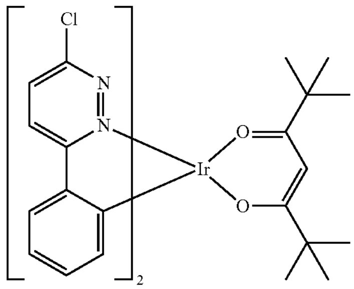
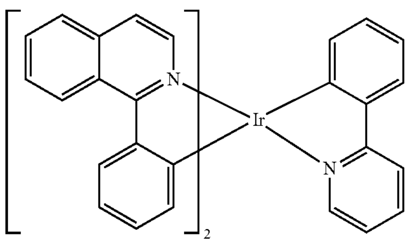
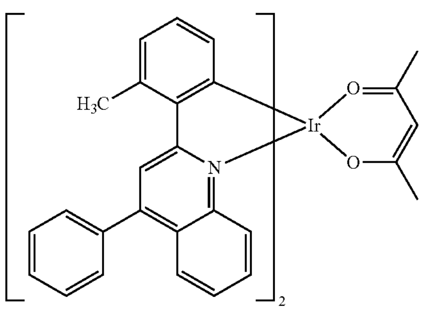
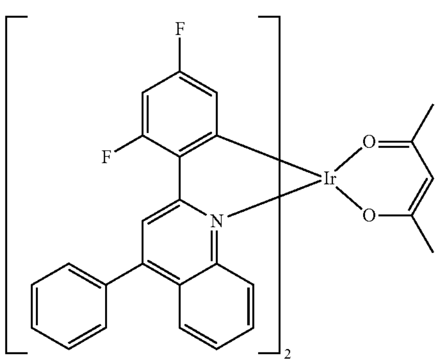
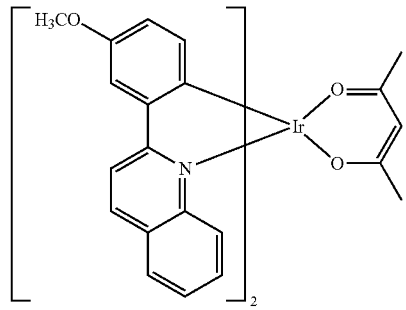
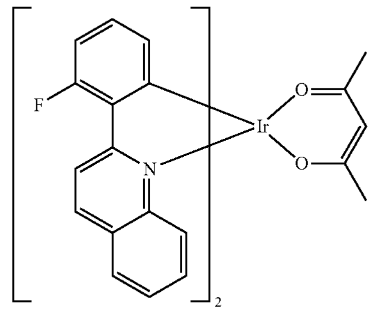
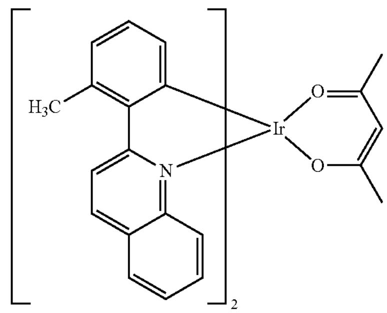
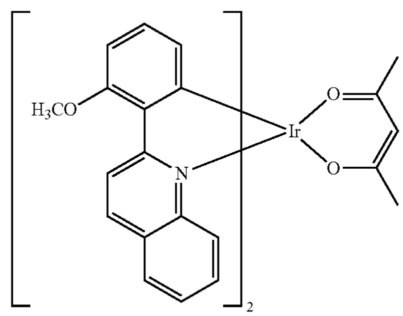
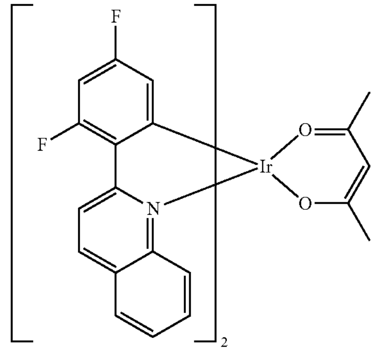

-continued

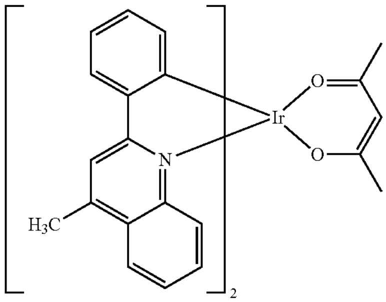

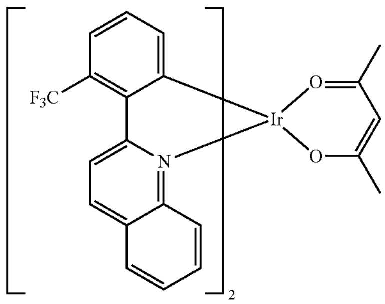

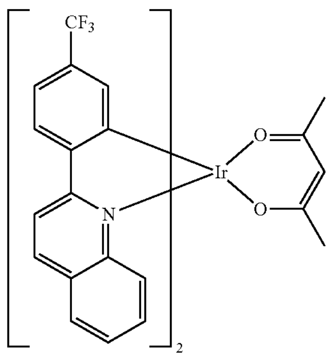

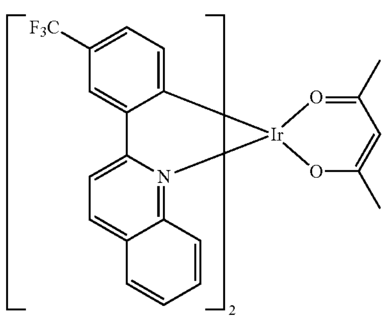

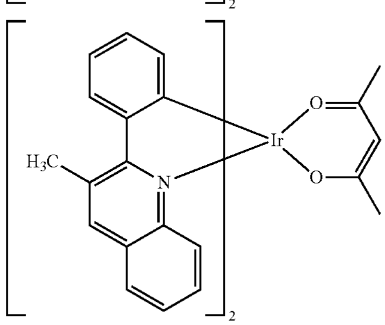

Non-limiting examples of green dopants include Ir(ppy)$_3$ (ppy=phenylpyridine), Ir(ppy)$_2$(acac), and Ir(mpyp)$_3$.

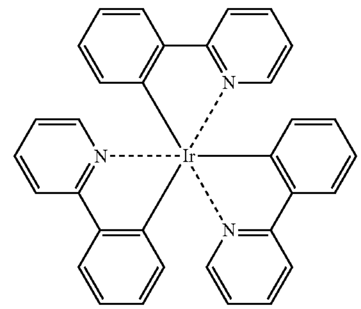

Ir(ppy)$_3$

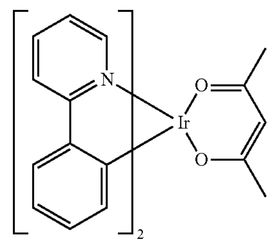

Ir(ppy)$_2$(acac)

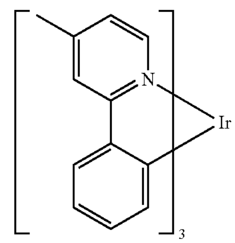

Ir(mpyp)$_3$

When the EML includes a host and a dopant, the amount of the dopant may be from about 0.01 wt % to about 15 wt % based on a total weight of the EML, but is not limited thereto.

In some embodiments, the EML may have a thickness from about 200 Å to about 700 Å. When the thickness of the EML is within this range, the EML may have good light emitting ability without a substantial increase in driving voltage.

In further embodiments, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on the compound that is used to form the ETL. A material for forming the ETL may be any known material that can stably transport electrons injected from an electron injecting electrode (cathode). Non-limiting examples of materials for forming the ETL include a quinoline derivative such as tris(8-quinolinorate)aluminum (Alq3), TAZ, BAlq, beryllium bis(benzoquinolin-10-olate (Bebq$_2$), 9,10-di(naphthalene-2-yl)anthracene (ADN), Compound 101, and Compound 102.

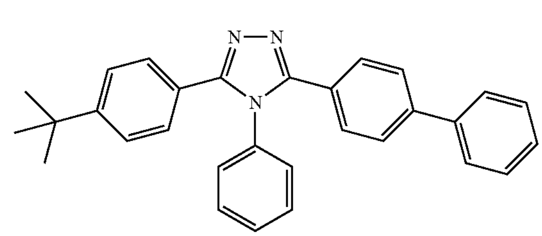

TAZ

-continued

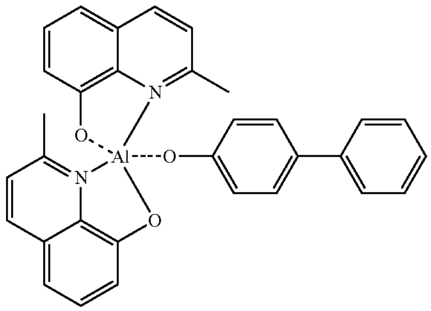

BAlq

<Compound 101>

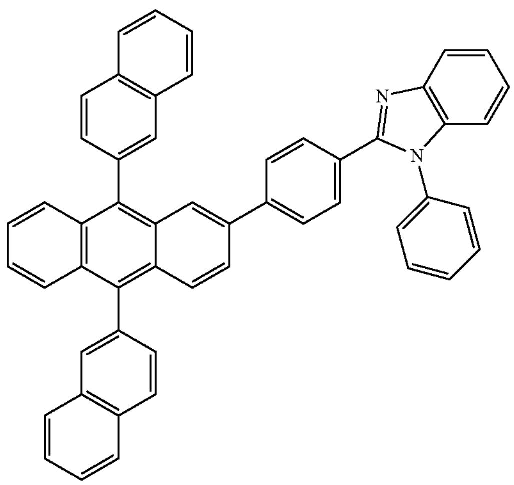

<Compound 102>

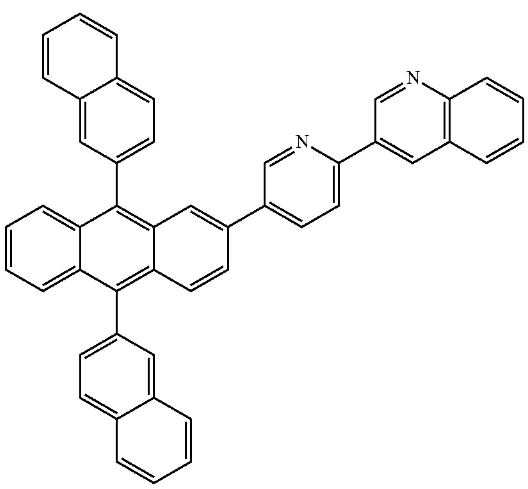

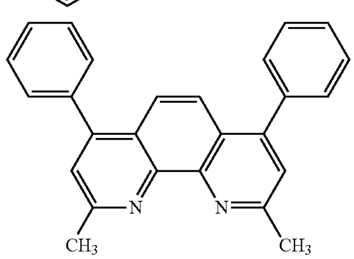

BCP

-continued

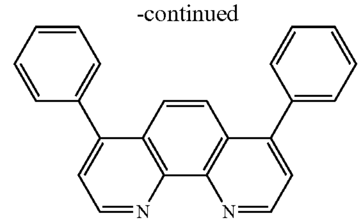

Bphen

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments, the ETL may further include a metal-containing material, in addition to any known electron-transporting organic compound. The metal-containing compound may be a lithium (Li) complex. Non-limiting examples of the Li complex are lithium quinolate (Liq) and Compound 203 below:

<Compound 203>

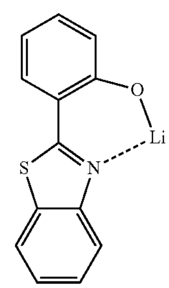

In further embodiments, an EIL, which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO, which are known in the art. The deposition and coating conditions for forming the EIL may be similar to those for the formation of the HIL, though the deposition and coating conditions may vary depending on the material that is used to form the EIL.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

In some embodiments, the second electrode 17 is positioned on the organic layer 15. The second electrode 17 may be a cathode that is an electron injection electrode. A material for forming the second electrode 17 may be a metal, an alloy, an electro-conductive compound, which have a low work function, or a mixture thereof. In this regard, the second electrode 17 may be formed of lithium (Li), magnesium (Mg), aluminum (Al), aluminum (AD-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may be formed of indium tin oxide (ITO) or indium zinc oxide (IZO).

In the embodiments when a phosphorescent dopant is used in the EML, a hole blocking layer (HBL) may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. Any known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

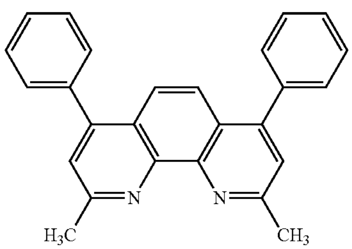

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

Although the organic light-emitting diode of the drawing is described above, the present invention is not limited thereto.

As used herein, examples of the unsubstituted $C_1$-$C_{60}$alkyl group (or a $C_1$-$C_{60}$ alkyl group) are linear or branched C1-C60 alkyl groups, including a methyl group, an ethyl group, a propyl group, an isobutyl group, a sec-butyl group, a pentyl group, an iso-amyl group, and a hexyl group. The substituted $C_1$-$C_{60}$alkyl group refers to a $C_1$-$C_{60}$ alkyl group of which at least one hydrogen atom is substituted with at least one selected from:

a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, and a $C_1$-$C_{60}$alkoxy group;

a $C_1$-$C_{60}$alkyl group, a $C_2$-$C_{60}$alkenyl group, a $C_2$-$C_{60}$alkynyl group, and a $C_1$-$C_{60}$alkoxy group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid group or a salt thereof;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridyl group, a pyrimidyl group, a pyrazinyl group, a pyridazinyl group, a triazinyl group, a quinolyl group, and an isoquinolyl group; and —$N(Q_{11})(Q_{12})$, and —$Si(Q_{13})(Q_{14})(Q_{15})$, where $Q_{11}$ and $Q_{12}$ are each independently selected from a $C_6$-$C_{60}$aryl group and a $C_2$-$C_{60}$heteroaryl group, and $Q_{13}$ to $Q_{15}$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group.

As used herein, the unsubstituted $C_1$-$C_{60}$ alkoxy group (or a $C_1$-$C_{60}$ alkoxy group) is a group represented by —OA, wherein A is an unsubstituted $C_1$-$C_{60}$ alkyl group as described above. Non-limiting examples of the unsubstituted $C_1$-$C_{60}$ alkoxy group are a methoxy group, an ethoxy group, and an isopropyloxy group. At least one hydrogen atom in the alkoxy group may be substituted with those substituents described above in conjunction with the substituted $C_1$-$C_{60}$ alkyl group.

As used herein, the unsubstituted $C_2$-$C_{60}$ alkenyl group (or a $C_2$-$C_{60}$ alkenyl group) is a $C_2$-$C_{60}$ alkyl group having at least one carbon-carbon double bond in the center or at a terminal thereof. Non-limiting examples of the alkenyl group are an ethenyl group, a propenyl group, a butenyl group, and the like. At least one hydrogen atom in the $C_2$-$C_{60}$ alkenyl group may be substituted with those substituents described above in conjunction with the substituted $C_1$-$C_{60}$ alkyl group.

As used herein, the unsubstituted $C_2$-$C_{60}$ alkynyl group (or a $C_2$-$C_{60}$ alkynyl group) is a $C_2$-$C_{60}$ alkyl group having at least one carbon-carbon triple bond in the center or at a terminal thereof. Non-limiting examples of the unsubstituted $C_2$-$C_{60}$ alkynyl group are an ethenyl group, a propynyl group, and the like. At least one hydrogen atom in the alkynyl group may be substituted with those substituents described above in conjunction with the substituted $C_1$-$C_{60}$ alkyl group.

As used herein, the unsubstituted $C_3$-$C_{60}$ cycloalkyl group indicates a cyclic, monovalent C3-C60 saturated hydrocarbon group. Non-limiting examples of the unsubstituted C3-C60 cycloalkyl group are cyclopropyl, cyclobutyl, cyclopentyl, cyclohexyl, and cyclooctyl. At least one hydrogen atom in the cycloalkyl group may be substituted with those substituents described above in conjunction with the substituted $C_1$-$C_{60}$ alkyl group.

As used herein, the unsubstituted $C_3$-$C_{30}$ cycloalkenyl group indicates a nonaromatic, cyclic unsaturated hydrocarbon group with at least one carbon-carbon double bond. Non-limiting examples of the unsubstituted $C_3$-$C_{30}$ cycloalkenyl group are cyclopropenyl, cyclobutenyl, cyclopentenyl, cyclohexcenyl, cycloheptenyl, 1,3-cyclohexadienyl, 1,4-cyclohexadienyl, 2,4-cycloheptadienyl, and 1,5-cyclooctadienyl. At least one hydrogen atom in the cycloalkenyl group may be substituted with those substituents described above in conjunction with the substituted $C_1$-$C_{60}$ alkyl group.

As used herein, the unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group have at least two rings, they may be fused (or connected) to each other via a single bond. At least one hydrogen atom in the aryl group and the arylene group may be substituted with those substituents described above in conjunction with the $C_1$-$C_{60}$ alkyl group.

Non-limiting examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, an ovalenyl group, and a spiro-fluorenyl group. Examples of the substituted $C_6$-$C_{60}$ aryl group should be apparent based on those of the unsubstituted $C_6$-$C_{60}$ aryl group and the substituted $C_1$-$C_{30}$ alkyl group described above. Examples of the substituted or unsubstituted $C_6$-$C_{60}$ arylene group should be apparent based on those examples of the substituted or unsubstituted $C_6$-$C_{60}$ aryl group described above.

As used herein, the unsubstituted $C_2$-$C_{60}$ heteroaryl group is a monovalent group having at least one aromatic ring having at least one of the heteroatoms selected from N, O, P, and S. The unsubstituted $C_2$-$C_{60}$ heteroarylene group is a divalent group having at least one aromatic ring including at least one of the heteroatoms selected from N, O, P, and S. In this regard, when the heteroaryl group and the heteroarylene group have at least two rings, they may be fused (or connected) to each other via a single bond. At least one hydrogen atom in the heteroaryl group and the heteroarylene group may be substituted with those substituents described with reference to the $C_1$-$C_{60}$ alkyl group.

Non-limiting examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the substituted or unsubstituted $C_2$-$C_{60}$ heteroarylene group should be apparent based on those examples of the substituted or unsubstituted $C_2$-$C_{60}$ arylene group described above.

The substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_6$-$C_{60}$ arylthiol group indicates —$SA_3$ (where $A_3$ is a substituted or unsubstituted $C_6$-$C_{60}$ aryl group described above).

Hereinafter, the present invention will be described in detail with reference to the following examples. However, these examples are for illustrative purposes only and are not intended to limit the scope of the present invention.

EXAMPLE 1

To manufacture an anode, a substrate with deposited ITO/Ag/ITO layers (70/1000/70 Å) was cut to a size of 50 mm×50 mm×0.7 mm and then sonicated in isopropyl alcohol and pure water, for five minutes in each, and then cleaned—by irradiation of ultraviolet rays for 30 minutes and exposure to ozone for 10 minutes. The resulting glass substrate was loaded into a vacuum deposition device.

Compound A below was vacuum-deposited on the ITO layer to form a hole injection layer (HIL) having a thickness of about 1500 Å. Compound 2-196 was then vacuum-deposited on the HIL to form a hole transport layer (HTL) having a thickness of about 700 Å.

Compound 1-1 and Compound B below were co-deposited in a weight ratio of about 1:0.02 on the HTL in a vacuum, to form an emission layer (EML) having a thickness of about 400 Å.

Compound 101 and lithium quinolate (Liq) were then co-deposited in a weight ratio of about 1:1 on the EML in a vacuum, to form an electron transport layer (ETL) having a thickness of about 360 Å. After Liq was vacuum-deposited on the ETL to form an electron injection layer (EIL) having a thickness of about 10 Å, Mg and Ag were vacuum-deposited in a weight ratio of about 10:1 to form a cathode having a thickness of about 130 Å, thereby manufacturing an organic light-emitting diode.

Compound A

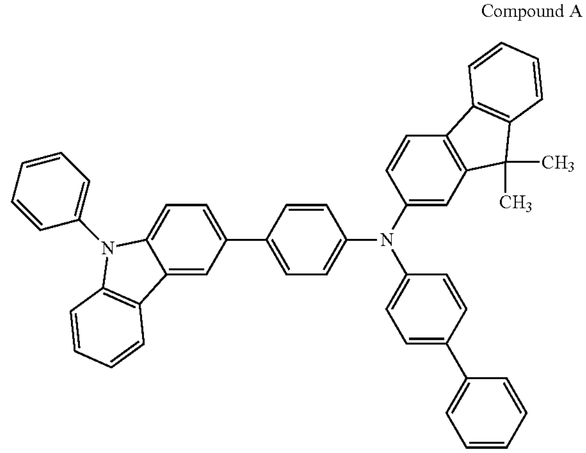

-continued

Compound B

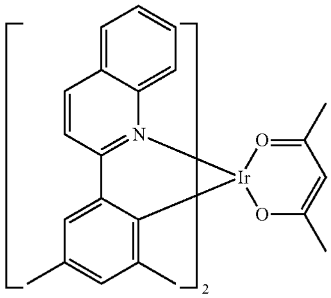

EXAMPLE 2

An organic light-emitting diode was manufactured in the same manner as in Example 1, except that Compound 2-22, instead of Compound 2-196, was used to form the HTL.

EXAMPLE 3

An organic light-emitting diode was manufactured in the same manner as in Example 1, except that Compound 4-4, instead of Compound 2-196, was used to form the HTL.

EXAMPLE 4

An organic light-emitting diode was manufactured in the same manner as in Example 1, except that Compound 2-23, instead of Compound 2-196, was used to form the HTL, and Compound 1-10, instead of Compound 1-1, was used to form the EML.

EXAMPLE 5

An organic light-emitting diode was manufactured in the same manner as in Example 1, except that Compound 6-59, instead of Compound 2-196, was used to form the HTL, and Compound 1-10, instead of Compound 1-1, was used to form the EML.

EXAMPLE 6

An organic light-emitting diode was manufactured in the same manner as in Example 1, except that Compound 3-1, instead of Compound 2-196, was used to form the HTL, and Compound 1-10, instead of Compound 1-1, was used to form the EML.

EXAMPLE 7

An organic light-emitting diode was manufactured in the same manner as in Example 1, except that Compound 3-26, instead of Compound 2-196, was used to form the HTL, and Compound 1-15, instead of Compound 1-1, was used to form the EML.

EXAMPLE 8

An organic light-emitting diode was manufactured in the same manner as in Example 1, except that Compound 2-200, instead of Compound 2-196, was used to form the HTL, and Compound 1-15, instead of Compound 1-1, was used to form the EML.

EXAMPLE 9

An organic light-emitting diode was manufactured in the same manner as in Example 1, except that Compound 4-7, instead of Compound 2-196, was used to form the HTL, and Compound 1-15, instead of Compound 1-1, was used to form the EML.

EXAMPLE 10

An organic light-emitting diode was manufactured in the same manner as in Example 1, except that Compound 5-12, instead of Compound 2-196, was used to form the HTL.

EXAMPLE 11

An organic light-emitting diode was manufactured in the same manner as in Example 1, except that Compound 5-84, instead of Compound 2-196, was used to form the HTL.

EXAMPLE 12

An organic light-emitting diode was manufactured in the same manner as in Example 1, except that Compound 6-129, instead of Compound 2-196, was used to form the HTL.

COMPARATIVE EXAMPLE 1

An organic light-emitting diode was manufactured in the same manner as in Example 1, except that Compound A, instead of Compound 2-196, was used to form the HTL.

COMPARATIVE EXAMPLE 2

An organic light-emitting diode was manufactured in the same manner as in Example 1, except that Compound A, instead of Compound 2-196, was used to form the HTL, and Compound C, instead of Compound 1-1, was used to form the EML.

Compound C

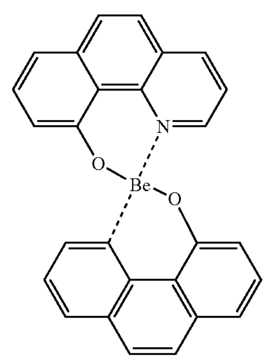

COMPARATIVE EXAMPLE 3

An organic light-emitting diode was manufactured in the same manner as in Example 1, except that Compound C, instead of Compound 1-1, was used to form the EML.

EVALUATION EXAMPLE 1

Driving voltages, current densities, luminance, power and color purities of the organic light-emitting diodes of Examples 1 to 12 and Comparative Examples 1 to 3 were measured using a Kethley SMU 236, and a PR650 (Spectroscan) Source Measurement Unit (available from Photo Research, Inc.). The results are shown in Table 1 below.

TABLE 1

| | Driving voltage (V) | Current density (mA/cm$^2$) | Luminance (cd/A @3700 cd/m$^2$) | Power (lm/W @3700 cd/m$^2$) | Color coordinates (CIE (x, y)) |
|---|---|---|---|---|---|
| Comparative Example 1 | 4.7 | 11.9 | 31.1 | 20.9 | (0.661, 0.338) |
| Comparative Example 2 | 4.5 | 11.6 | 31.8 | 22.3 | (0.665, 0.334) |
| Comparative Example 3 | 4.7 | 10.7 | 34.6 | 23.2 | (0.672, 0.327) |
| Example 1 | 4.6 | 8.9 | 41.4 | 28.3 | (0.649, 0.350) |
| Example 2 | 4.8 | 8.5 | 43.4 | 28.2 | (0.656, 0.344) |
| Example 3 | 4.6 | 9.3 | 39.7 | 27.1 | (0.663, 0.335) |
| Example 4 | 4.8 | 8.9 | 41.5 | 27.3 | (0.639, 0.360) |
| Example 5 | 4.9 | 8.4 | 44.0 | 28.5 | (0.657, 0.343) |
| Example 6 | 5.0 | 9.5 | 38.9 | 24.3 | (0.657, 0.342) |
| Example 7 | 5.4 | 9.3 | 40.0 | 23.3 | (0.655, 0.343) |
| Example 8 | 5.4 | 8.9 | 41.7 | 24.1 | (0.648, 0.351) |
| Example 9 | 5.5 | 9.2 | 40.2 | 23.2 | (0.651, 0.348) |
| Example 10 | 4.6 | 9.7 | 38.1 | 25.9 | (0.650, 0.349) |
| Example 11 | 4.9 | 9.3 | 39.6 | 25.2 | (0.657, 0.342) |
| Example 12 | 4.9 | 8.8 | 41.8 | 26.7 | (0.651, 0.347) |

Referring to Table 1, the organic light-emitting diodes of Examples 1 to 12 were found to have higher luminances, higher power, and better color purities than the organic light-emitting diodes of Comparative Examples 1 to 3.

As described above, according to the one or more of the above embodiments of the present invention, a high-quality organic light-emitting diode with high efficiency and long lifetime may be implemented using any of the light-emitting materials and any of the hole transports materials according to the above-described embodiments of the present invention.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting diode comprising:

a first electrode;

a second electrode; and an organic layer between the first electrode and the second electrode, the organic layer comprising an emission layer comprising at least one light-emitting material represented by Formula 1 below, and a region between the first electrode and the emission layer comprising at least one hole transport material represented by Formula 4a below:

<Formula 1>

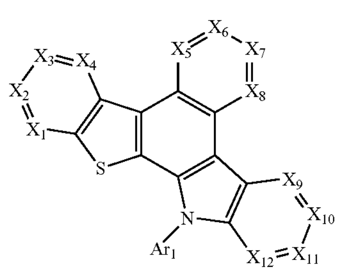

-continued

<Formula 4a>

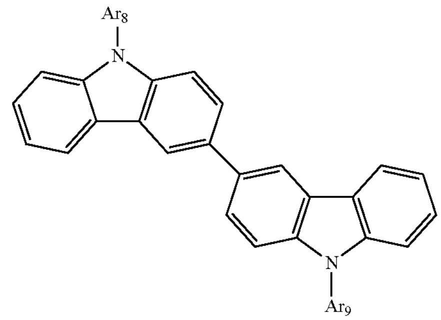

wherein, in Formulae 1 to 4a:

$X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N;

$R_1$ to $R_{12}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, and a substituted or unsubstituted $C_2$-$C_{60}$heteroaryl group;

$Ar_1$ is selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_6$-$C_{60}$arylene group, and a substituted or unsubstituted $C_2$-$C_{60}$heteroarylene group; and $Ar_8$ to $Ar_9$ are respectively an unsubstituted phenyl group and an unsubstituted biphenyl group, and an unsubstituted biphenyl group and an unsubstituted phenyl group, an unsubstituted biphenyl group and an unsubstituted naphthyl group, an unsubstituted naphthyl group and an unsubstituted biphenyl group, an unsubstituted biphenyl group and an unsubstituted biphenyl group, an unsubstituted naphthyl group and an unsubstituted naphthyl group, or are each independently selected from:

a substituted or unsubstituted phenyl group, a substituted or unsubstituted biphenyl group, a substituted or unsubstituted naphthyl group, wherein at least one of $Ar_8$ and $Ar_9$ is substituted with at least one selected from —N($Q_1$)($Q_2$), where $Q_1$ and $Q_2$ are each independently selected from:

a phenyl group, and a phenyl group, a naphthyl group, each substituted with at least one selected from a phenyl group, and a naphthyl group.

2. An organic light-emitting diode comprising:

a first electrode;

a second electrode; and an organic layer between the first electrode and the second electrode, the organic layer comprising an emission layer comprising one of Compounds 1-1 to 1-18 below, and a region between the first electrode and the emission layer comprising one of Compounds 4-2 and 4-4 to 4-7:

[Compound 1-1]

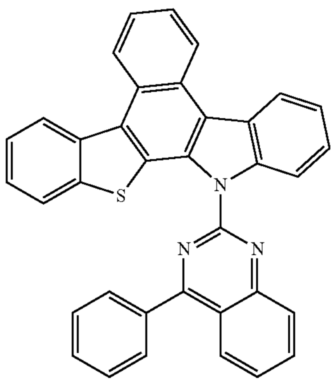

[Compound 1-2]

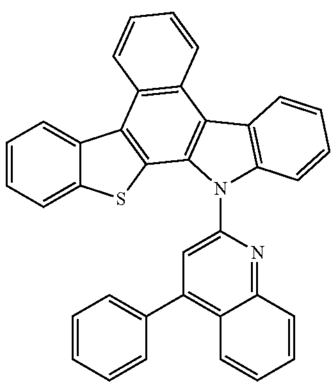

[Compound 1-3]

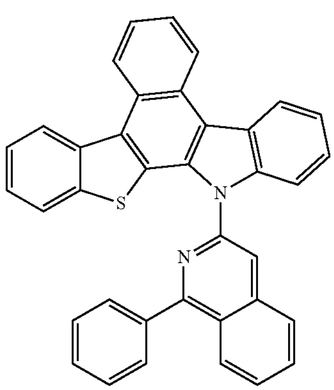

-continued

[Compound 1-4]

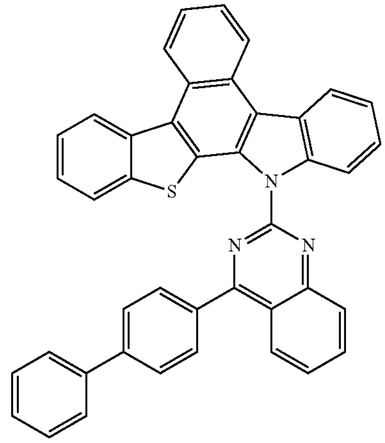

[Compound 1-5]

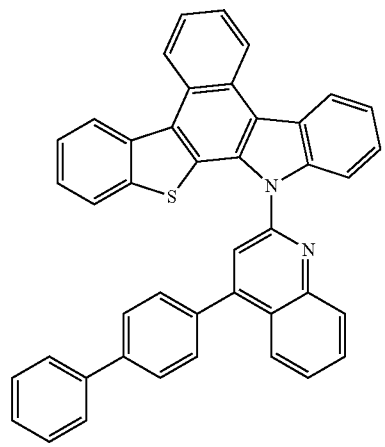

[Compound 1-6]

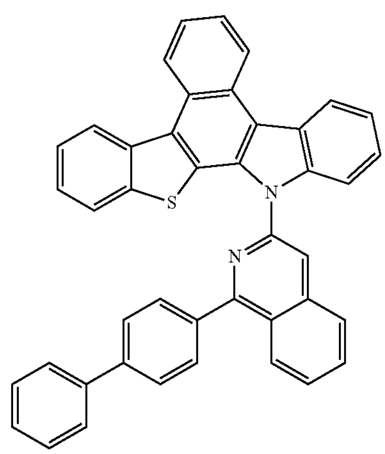

-continued
[Compound 1-7]
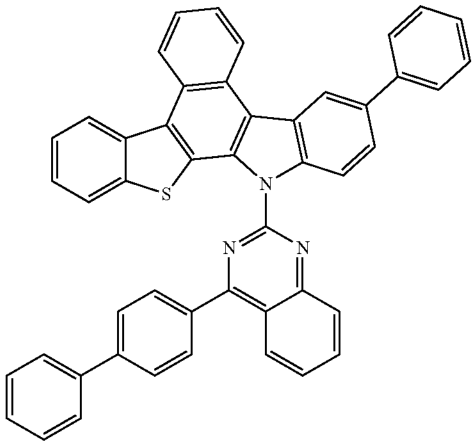
[Compound 1-8]
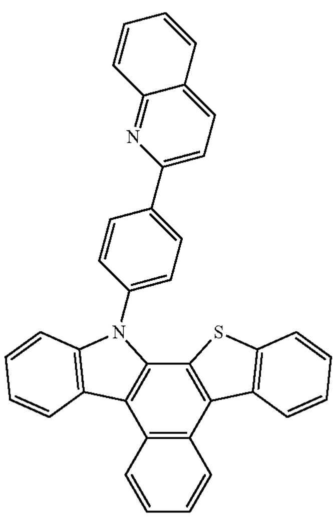
[Compound 1-9]
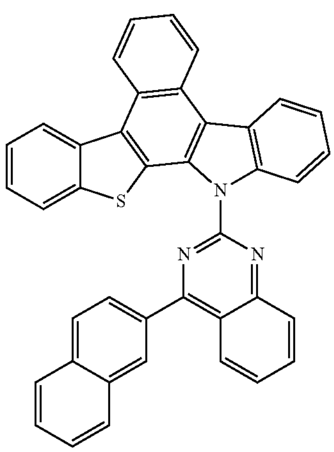
-continued
[Compound 1-10]
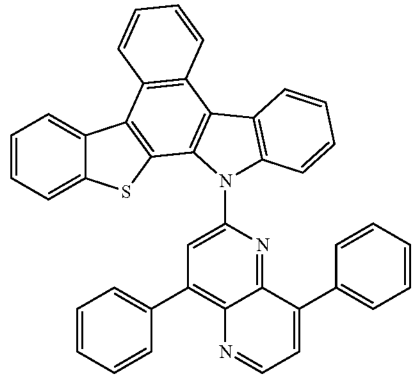
[Compound 1-11]
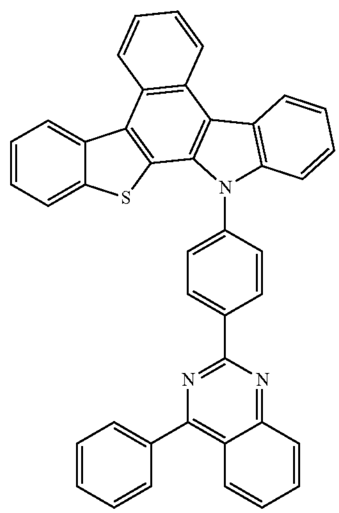
[Compound 1-12]
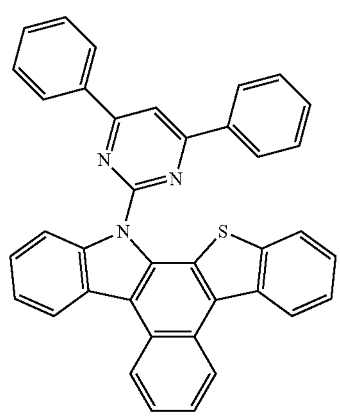

-continued
[Compound 1-13]
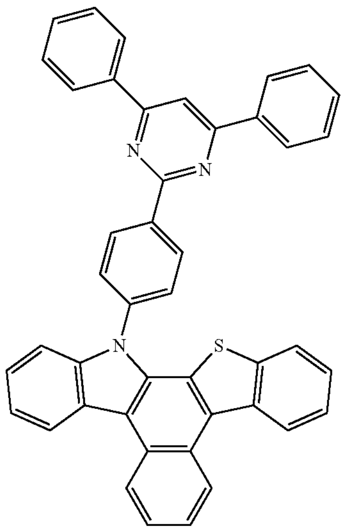
[Compound 1-14]
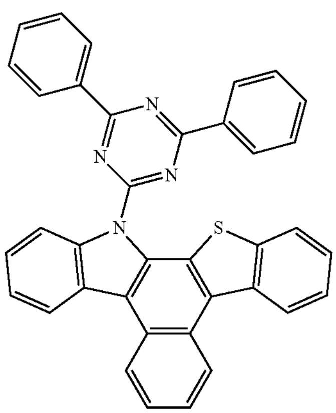
[Compound 1-15]
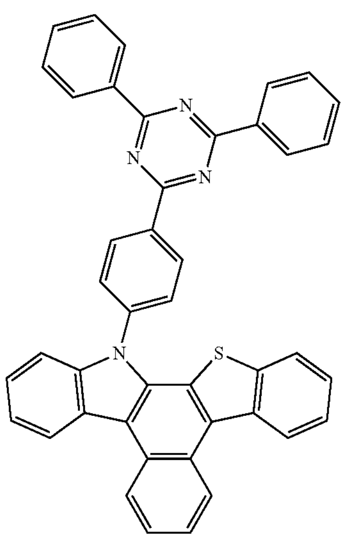
-continued
[Compound 1-16]
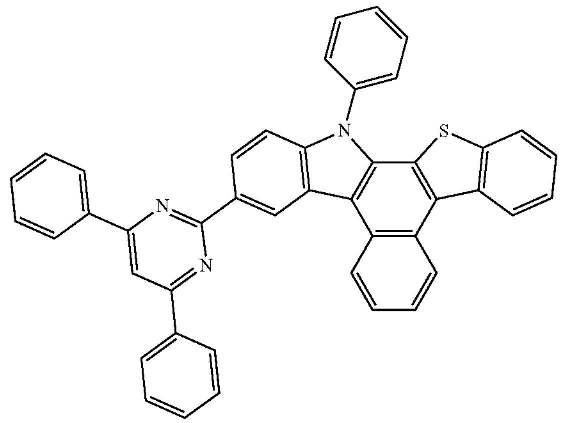
[Compound 1-17]
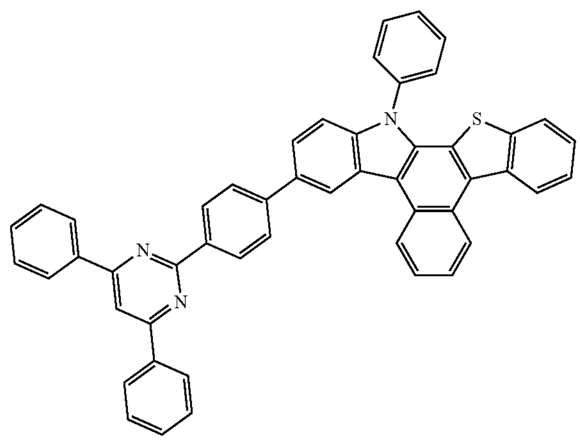
[Compound 1-18]
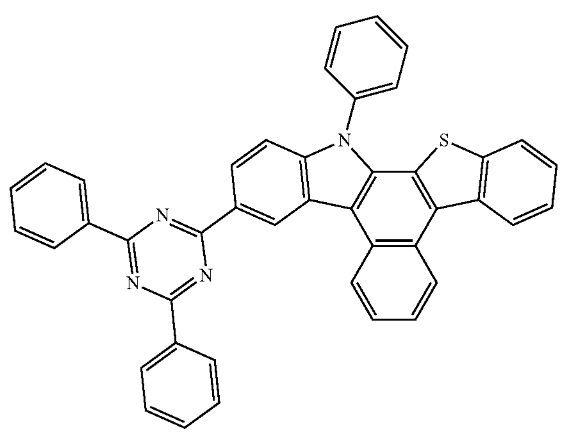

-continued 4-2

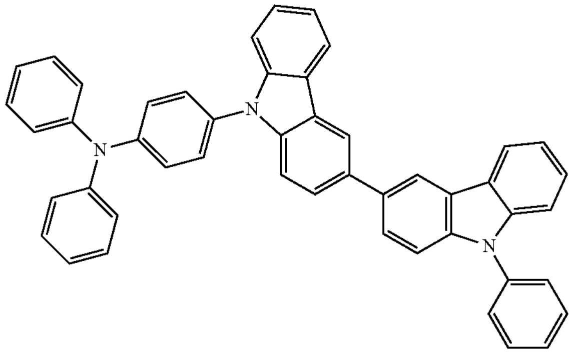

4-4

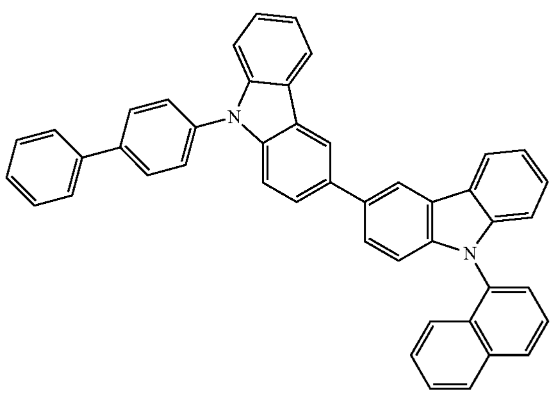

4-5

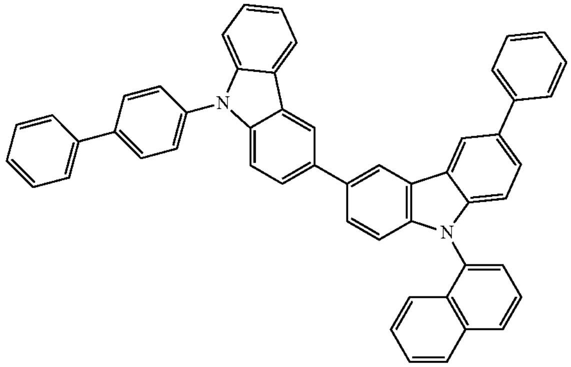

-continued 4-6

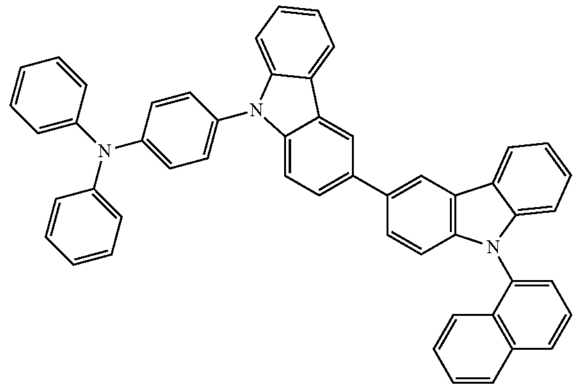

4-7

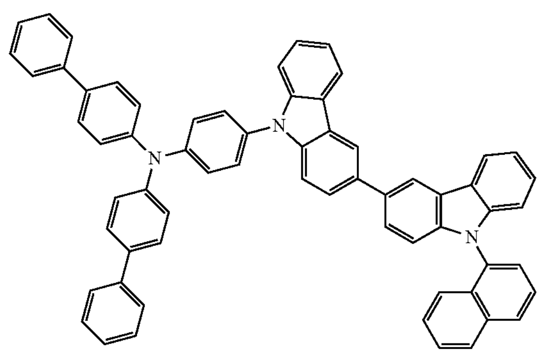

.

3. An organic light-emitting diode, comprising:

a first electrode;

a second electrode; and an organic layer between the first electrode and the second electrode, the organic layer comprising an emission layer comprising at least one light-emitting material represented by Formula 1 below, and a region between the first electrode and the emission layer comprising at least one hole transport material represented by one of Formulae 2c to 2f below:

<Formula 1>

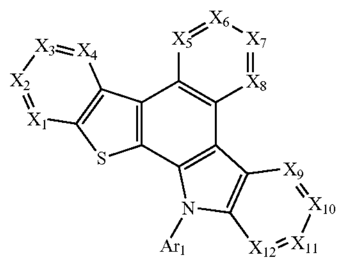

<Formula 2c>

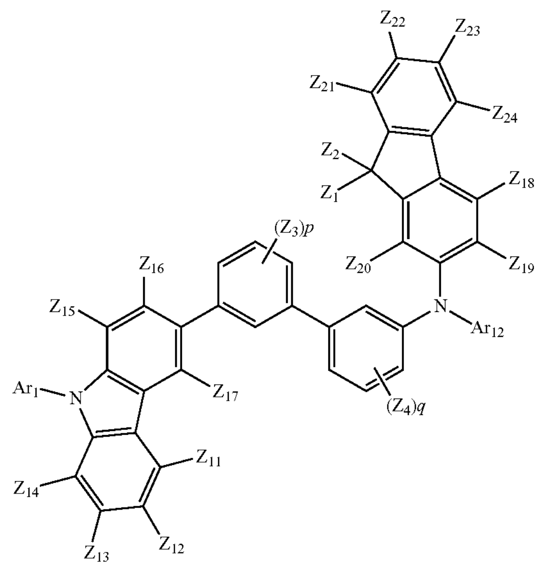

<Formula 2f>

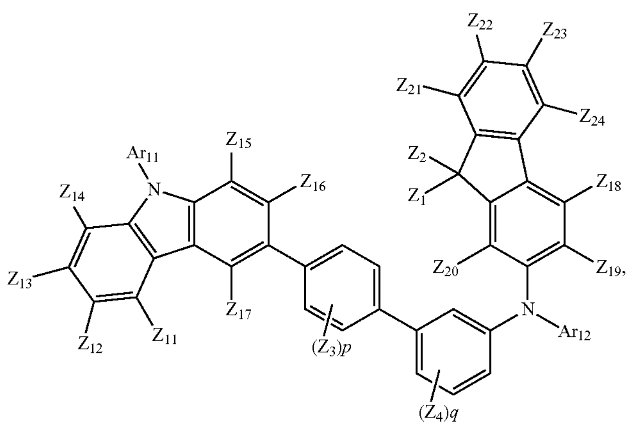

wherein, in Formula 1, and Formulae 2c to 2f:

$X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N;

$R_1$ to $R_{12}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, and a substituted or unsubstituted $C_2$-$C_{60}$heteroaryl group;

$Ar_1$ is selected from:

a spiro-fluorenyl group, a quinolinyl group, a isoquinolinyl group, a naphthyridinyl group, a quinazolinyl group, and a phenyl substituted with a quinazolinyl group;

a spiro-fluorenyl group, a quinolinyl group, a isoquinolinyl group, a naphthyridinyl group, a quinazolinyl group, and a phenyl substituted with a quinazolinyl group, each substituted with at least one selected from:

a deuterium atom, —F, a cyano group, a nitro group, —N($Q_1$)($Q_2$) (where $Q_1$ and $Q_2$ are each independently selected from a phenyl group and a naphthyl group), a methyl group, an ethyl group, a n-propyl group, and iso-propyl group, a n-butyl group, a sec-butyl group, an iso-butyl group, and a t-butyl group, a phenyl group, a naphthyl group, a fluorenyl group, a phenanthrenyl group, a pyridyl group, a pyrimidyl group, a quinolinyl group, an isoquinolinyl group, a naphthyridinyl group, a quniazolinyl group, and a triazinyl group, and a spiro-fluorenyl group, a quinolinyl group, an isoquinolinyl group, a naphthyridinyl group, a quinazolinyl group, and a phenyl substituted with a quinazolinyl group, each substituted with at least one selected from a deuterium atom, —F, a cyano group, a nitro group, —N($Q_1$)($Q_2$) (where $Q_1$ and $Q_2$ are each independently selected from a phenyl group and a naphthyl group), a methyl group, an ethyl group, a n-propyl group, an iso-propyl group, a n-butyl group, a sec-butyl group, an iso-butyl group, a t-butyl group, a phenyl group, a naphthyl group, a fluorenyl group, a phenanthrenyl group, a pyridyl group, a pyrimidyl group, a qinolinyl group, an isoquinolinyl group, a naphthyridinyl group, a quniazolinyl group, and a triazinyl group;

$Ar_{11}$, and $Ar_{12}$ are each independently selected from a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, and a substituted or unsubstituted $C_2$-$C_{60}$heteroaryl group;

$Z_1$ to $Z_4$, and $Z_{11}$ to $Z_{24}$ are each independently selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, and $C_1$-$C_{60}$alkoxy group, a $C_1$-$C_{60}$alkyl group, a $C_2$-$C_{60}$alkenyl group, a $C_2$-$C_{60}$alkynyl group, and a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group; and —N($Q_{11}$)($Q_{12}$), —Si($Q_{13}$)($Q_{14}$)($Q_{15}$), and —B($Q_{16}$)($C_{17}$), where $Q_{11}$ and $Q_{17}$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group; and p and q are each independently selected from an integer from 1 to 4.

4. The organic light-emitting diode of claim 3, wherein $X_1$ is $CR_1$; $X_2$ is $CR_2$; $X_3$ is $CR_3$; $X_4$ is $CR_4$; $X_5$ is $CR_5$; $X_6$ is $CR_6$; $X_7$ is $CR_7$; $X_8$ is $CR_8$; $X_9$ is $CR_9$; $X_{10}$ is $CR_{10}$; $X_{11}$ is $CR_{11}$; and $X_{12}$ is $CR_{12}$.

5. The organic light-emitting diode of claim 3, wherein $R_1$ to $R_{12}$ are each independently selected from:

a hydrogen atom, a deuterium atom, a halogen atom, cyano group, and a nitro group;

a pyridyl group, a pyrimidyl group, and a triazinyl group, each substituted with at least one selected from a phenyl group, a naphthyl group, and an anthryl group; and a phenyl group, a naphthyl group, and an anthryl group, each substituted with at least one selected from a pyridyl group, a pyrimidyl group, and a triazinyl group, each substituted with at least one of a phenyl group, a naphthyl group, and an anthryl group.

6. The organic light-emitting diode of claim 3, wherein $R_1$ to $R_{12}$ are each independently selected from a hydrogen atom, a phenyl group, a pyrimidyl group substituted with a phenyl group; and a phenyl group substituted with a pyrimidyl group substituted with a phenyl group.

7. The organic light-emitting diode of claim 3, wherein $Ar_{11}$ and $Ar_{12}$ are each independently selected from:

a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, and a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

8. The organic light-emitting diode of claim 3, wherein $Ar_{11}$ and $Ar_{12}$ are each independently selected from a group represented by one of Formulae 3-1 to 3-20:

-continued
Formula 3-1
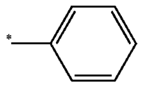
Formula 3-2
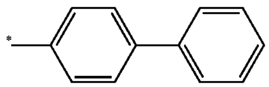
Formula 3-3
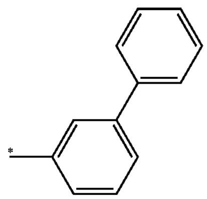
Formula 3-4
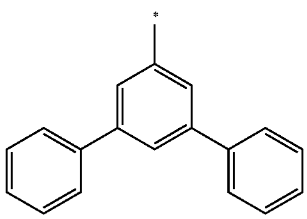
Formula 3-5
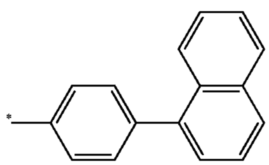
Formula 3-6
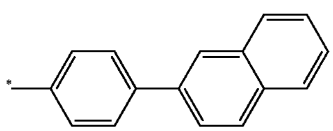
Formula 3-7
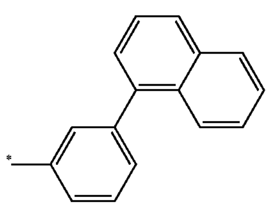
Formula 3-8
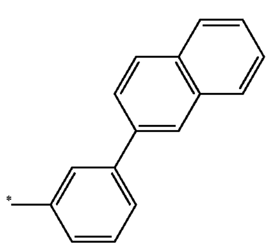
Formula 3-9
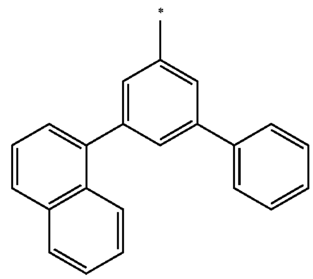
Formula 3-10
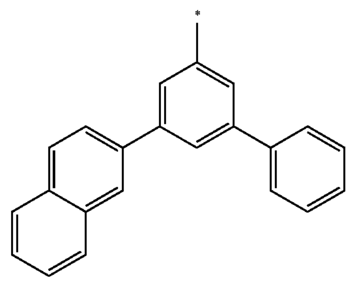
Formula 3-11
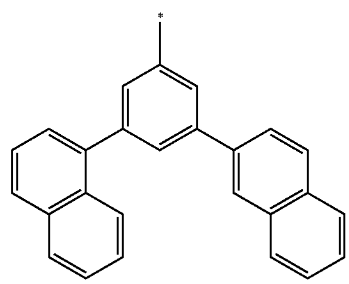
Formula 3-12
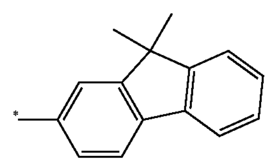
Formula 3-13
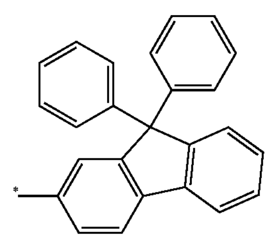
Formula 3-14
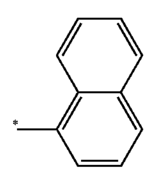
Formula 3-15
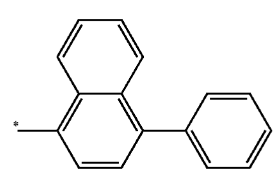

-continued

Formula 3-16

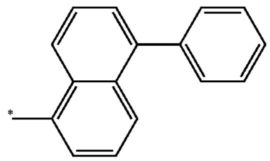

Formula 3-17

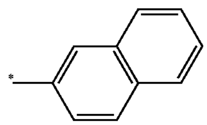

Formula 3-18

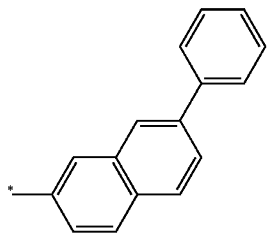

Formula 3-19

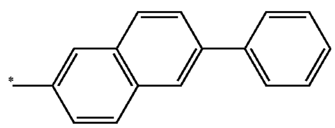

Formula 3-20

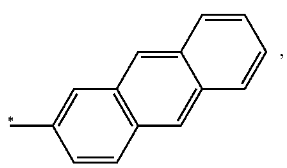

wherein, in Formulae 3-1 to 3-20, * indicates a binding site to a corresponding N in Formulae 2c to 2f.

9. The organic light-emitting diode of claim 3, wherein $Z_1$ and $Z_2$ are each independently selected from:

a $C_1$-$C_{20}$alkyl group, a $C_1$-$C_{20}$alkyl group substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, and a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

10. The organic light-emitting diode of claim 3, wherein $Z_1$ and $Z_2$ are each independently selected from a methyl group, an ethyl group, a propyl group, a butyl group, a pentyl group, a hexyl group, a heptyl group, and a group represented by one of Formulae 3-1 to 3-20 below:

Formula 3-1

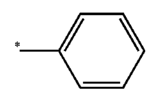

Formula 3-2

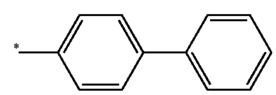

Formula 3-3

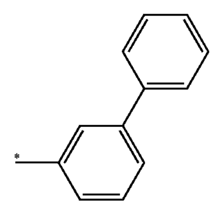

Formula 3-4

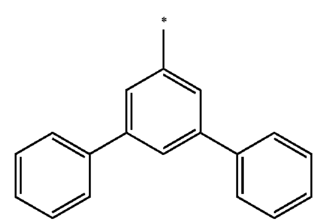

Formula 3-5

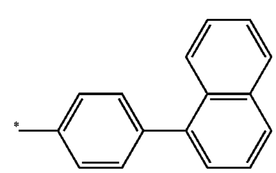

Formula 3-6

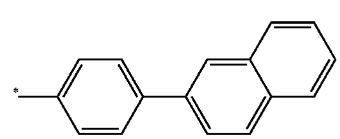

-continued

Formula 3-7

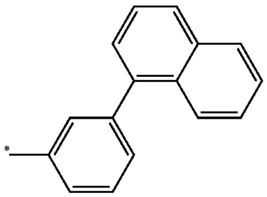

Formula 3-8

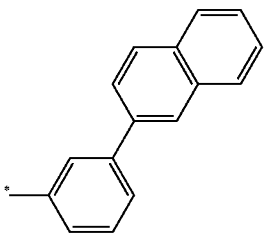

Formula 3-9

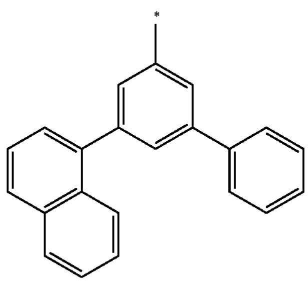

Formula 3-10

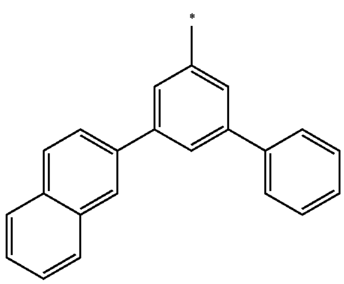

Formula 3-11

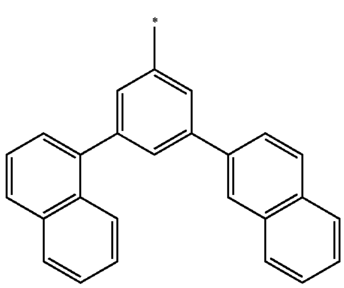

Formula 3-12

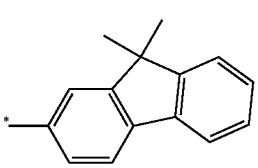

-continued

Formula 3-13

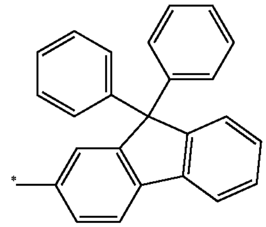

Formula 3-14

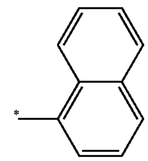

Formula 3-15

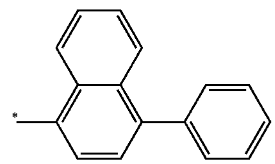

Formula 3-16

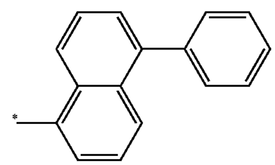

Formula 3-17

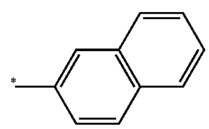

Formula 3-18

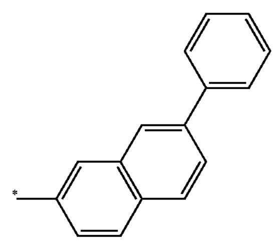

Formula 3-19

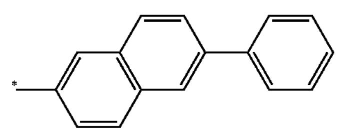

Formula 3-20

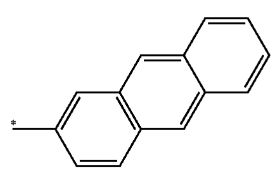

, wherein, in Formulae 3-1 to 3-20, * indicates a binding site to a corresponding fluorene carbon in Formulae 2c to 2f.

11. The organic light-emitting diode of claim 3, wherein $Z_3$, $Z_4$, and $Z_{11}$ to $Z_{24}$ are each independently selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{20}$alkyl group, a $C_1$-$C_{20}$alkyl group substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt salt thereof, a phenyl group, a naphthyl group, a fluorenyl group, a spiro-fluorenyl group, a phenanthrenyl group, and anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, and isoindolyl group, an indolyl group, a quinolinyl group, a benzoquinolinyl group, a quinoxalinyl group, a quinazolinyl group, a cinnolinyl group, a carbazolyl group, and a triazinyl group, and a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a carbazolyl group, and a triazinyl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

12. The organic light-emitting diode of claim 3, wherein $Z_3$, $Z_4$, and $Z_{11}$ to $Z_{24}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{20}$alkyl group.

13. The organic light-emitting diode of claim 3, wherein $Z_3$, $Z_4$, and $Z_{11}$ to $Z_{24}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and a group represented by one of Formulae 3-1 to 3-20 below:

Formula 3-1

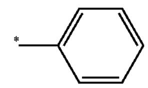

Formula 3-2

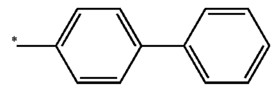

Formula 3-3

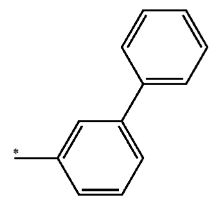

Formula 3-4

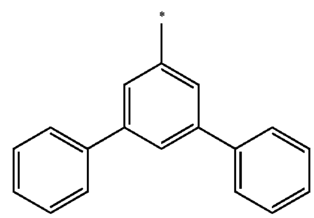

Formula 3-5

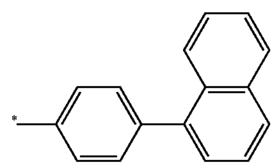

Formula 3-6

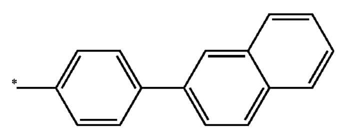

Formula 3-7

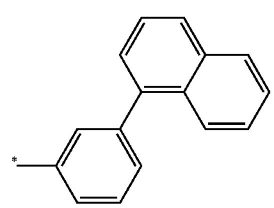

Formula 3-8

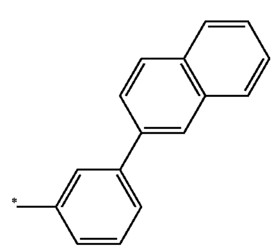

-continued

Formula 3-9

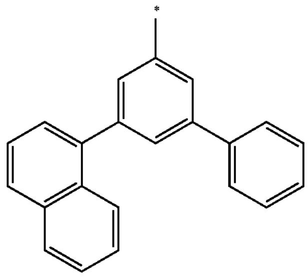

Formula 3-10

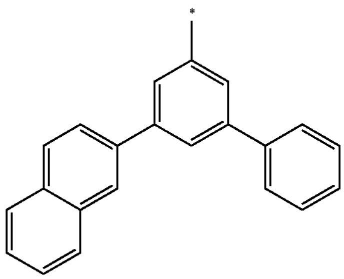

Formula 3-11

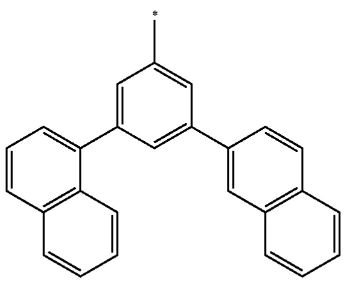

Formula 3-12

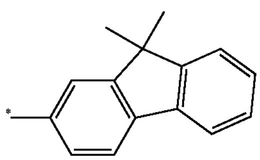

Formula 3-13

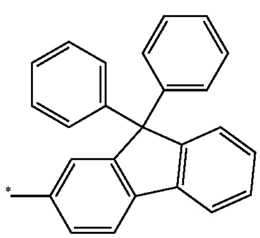

Formula 3-14

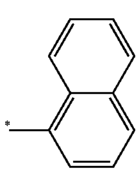

Formula 3-15

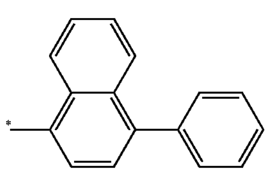

-continued

Formula 3-16

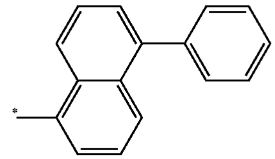

Formula 3-17

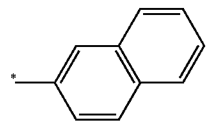

Formula 3-18

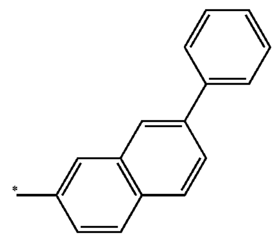

Formula 3-19

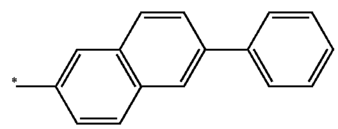

Formula 3-20

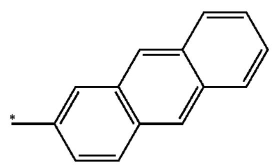

wherein, in Formulae 3-1 to 3-20, * indicates a binding site to a corresponding position in Formulae 2c to 2f.

14. The organic light-emitting diode of claim 3, wherein the light-emitting material is a compound represented by Formula 1a below, and the hole transport material is a compound represented by one of Formulae 2h to 2j below:

<Formula 1a>

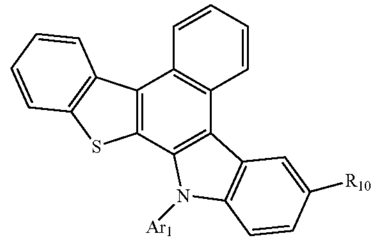

-continued

<Formula 2h>

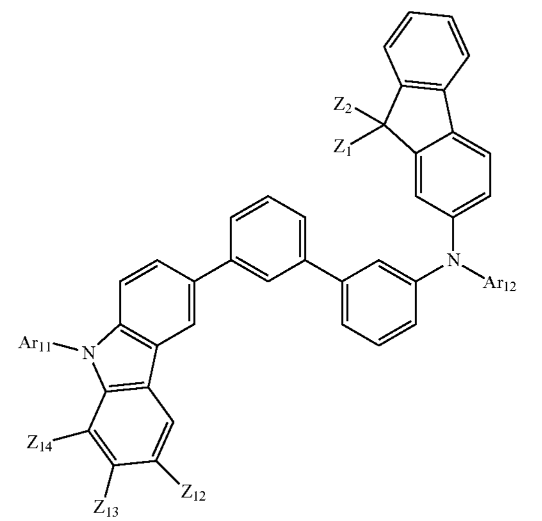

<Formula 2j>

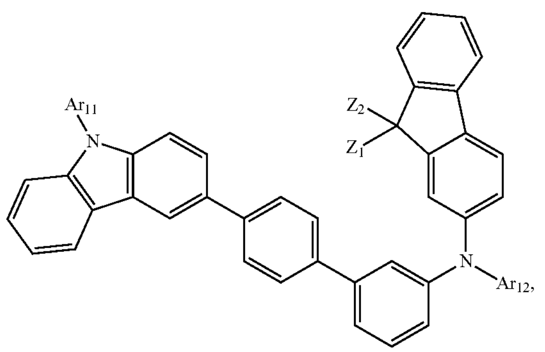

wherein, in Formula 1a and Formulae 2h to 2j:

$R_{10}$ is selected from a hydrogen atom, a phenyl group; a pyrimidyl group substituted with a phenyl group, and a phenyl group substituted with a pyrimidyl group substituted with a phenyl group;

$Ar_1$ is selected from:

a spiro-fluorenyl group, a quinolinyl group, an isoquinolinyl group, a naphthyridinyl group, a quinazolinyl group, and a phenyl substituted with a quinazolinyl group; and a spiro-fluorenyl group, a quinolinyl group, an isoquinolinyl group, a naphthyridinyl group, a quinazolinyl group, and a phenyl substituted with a quinazolinyl group, each substituted with at least one selected from:

a phenyl group, a naphthyl group, and a pyridyl group; and a phenyl group, a naphthyl group, a pyridyl group, a pyrimidyl group, a quinolinyl group, an isoquinolinyl group, a naphthyridinyl group, a quinazolinyl group, and a triazinyl group, each substituted with at least one of a phenyl group, a naphthyl group, and a pyridyl group;

$Ar_{11}$ and $Ar_{12}$ are each independently selected from a group represented by one of Formulae 3-1 to 3-20:

Formula 3-1

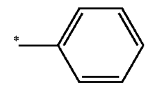

Formula 3-2

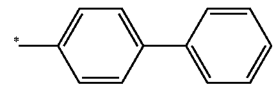

Formula 3-3

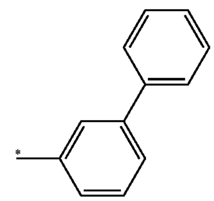

Formula 3-4

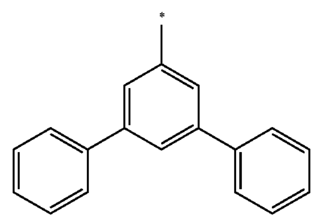

Formula 3-5

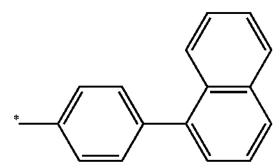

Formula 3-6

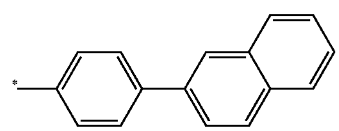

Formula 3-7

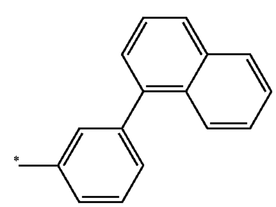

Formula 3-8

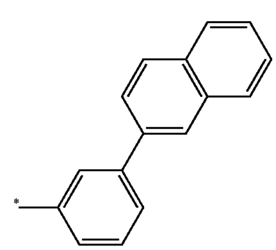

-continued

Formula 3-9

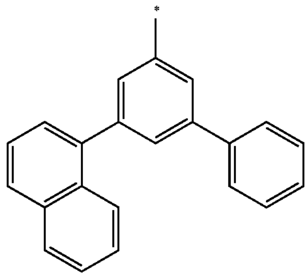

Formula 3-10

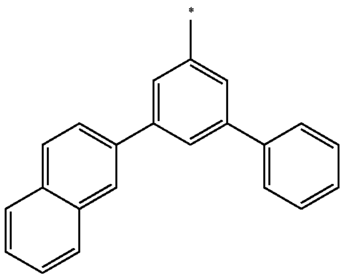

Formula 3-11

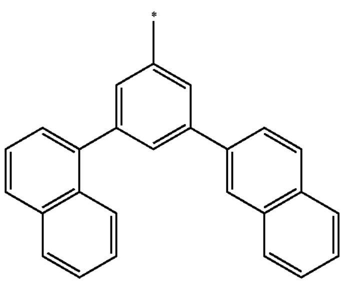

Formula 3-12

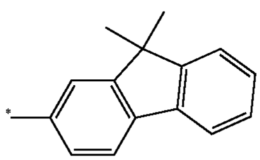

Formula 3-13

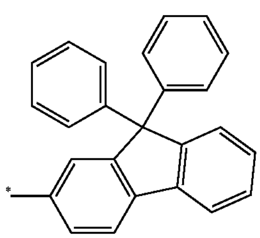

Formula 3-14

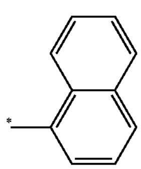

Formula 3-15

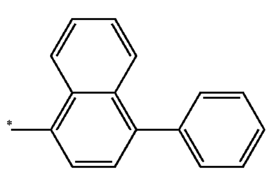

-continued

Formula 3-16

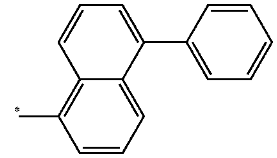

Formula 3-17

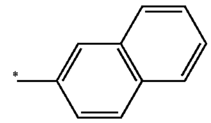

Formula 3-18

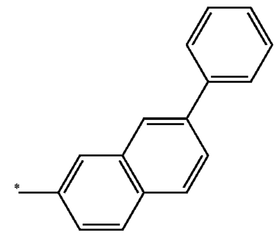

Formula 3-19

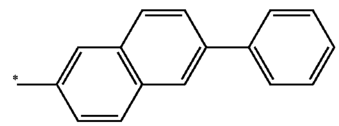

Formula 3-20

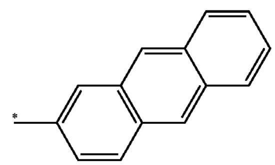

, wherein, in Formulae 3-1 to 3-20, * indicates a binding site to a corresponding N in Formulae 2h to 2j; and $Z_1$ and $Z_2$ are each independently selected from a methyl group, an ethyl group, a propyl group, a butyl group, a pentyl group, a hexyl group, a heptyl group, and a group represented by one of Formulae 3-1 to 3-20 below:

Formula 3-1

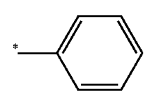

Formula 3-2

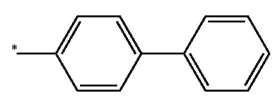

Formula 3-3

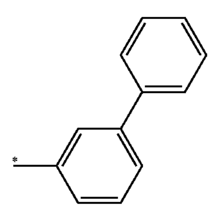

-continued
Formula 3-4
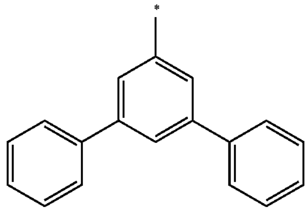
Formula 3-5
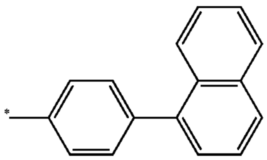
Formula 3-6
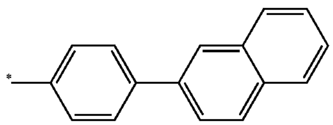
Formula 3-7
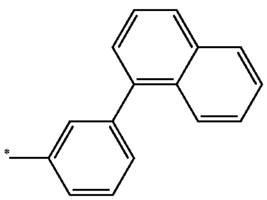
Formula 3-8
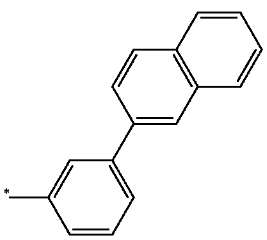
Formula 3-9
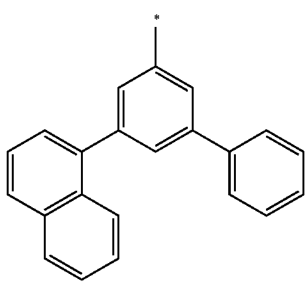
Formula 3-10
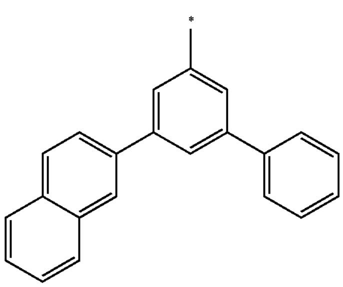
-continued
Formula 3-11
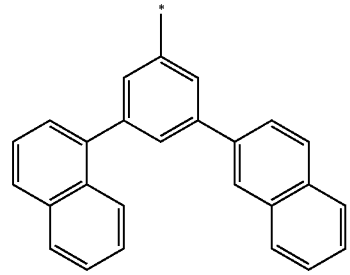
Formula 3-12
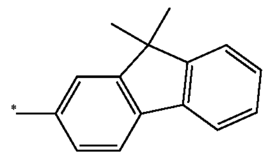
Formula 3-13
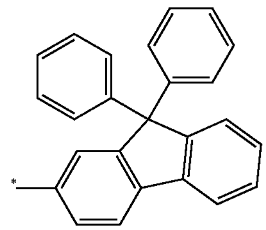
Formula 3-14
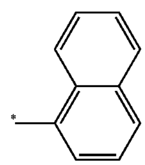
Formula 3-15
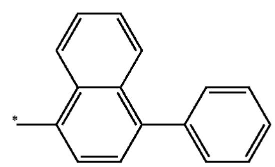
Formula 3-16
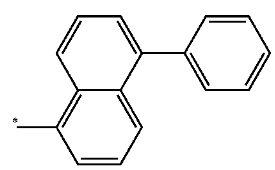
Formula 3-17
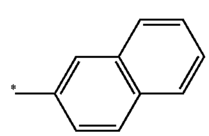

-continued

Formula 3-18

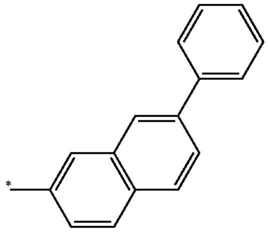

Formula 3-19

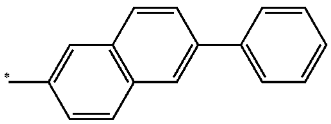

-continued

Formula 3-20

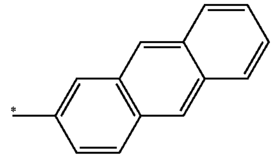

wherein, in Formulae 3-1 to 3-20, * indicates a binding site to a corresponding fluorine carbon in Formulae 2h to 2j.

15. The organic light-emitting diode of claim 3, wherein the light-emitting material is one of Compounds 1-1 to 1-7 and 1-9 to 1-11 below, and the hole transport material is one of Compounds 5-73 to 5-144, and Compounds 6-73 to 6-144:

[Compound 1-1]

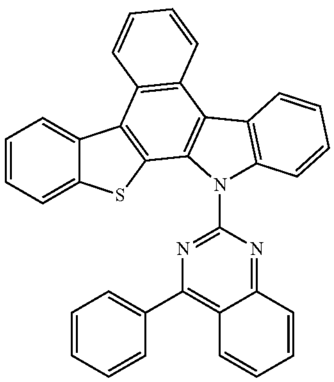

[Compound 1-2]

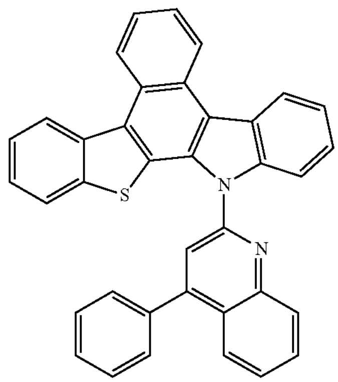

[Compound 1-3]

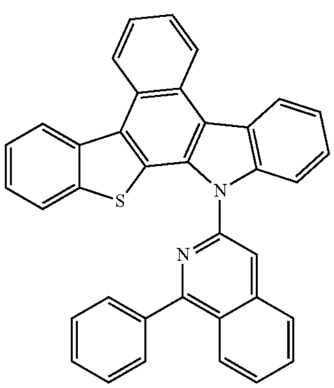

[Compound 1-4]

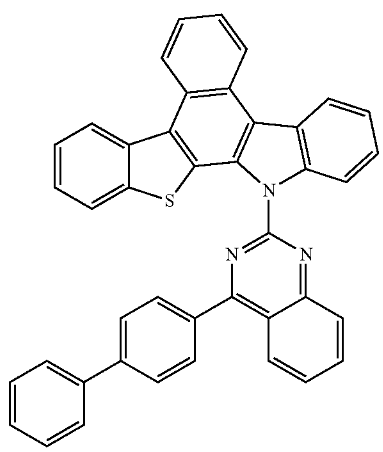

-continued
[Compound 1-5]
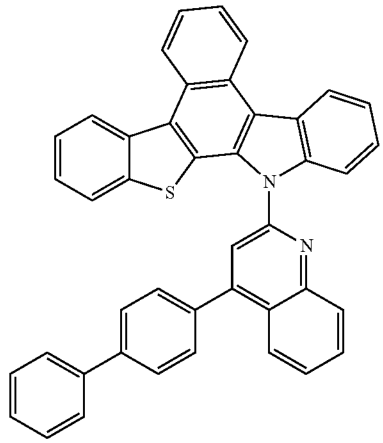
[Compound 1-6]
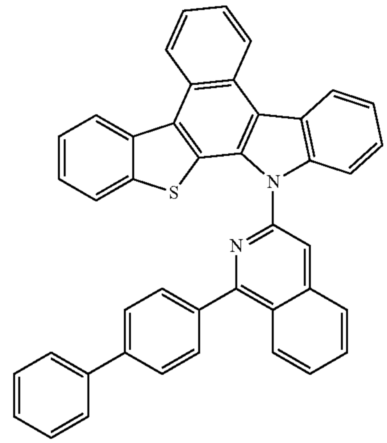
[Compound 1-7]
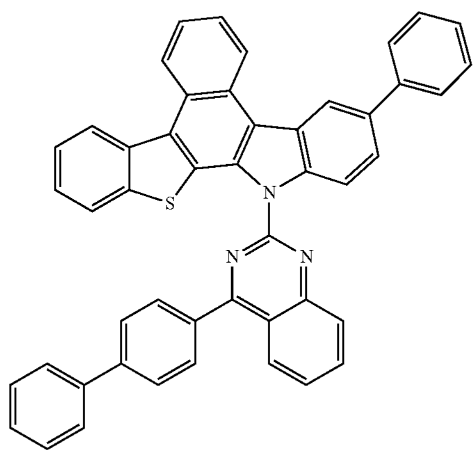
[Compound 1-9]
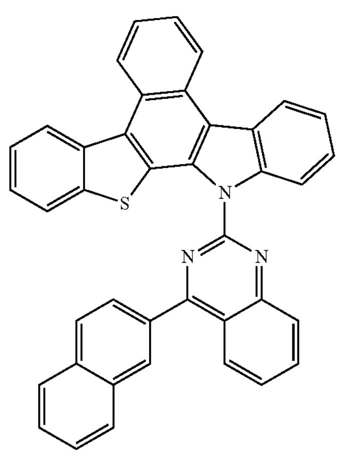
[Compound 1-10]
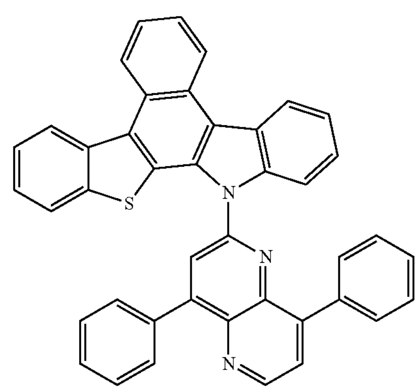

-continued
[Compound 1-11]
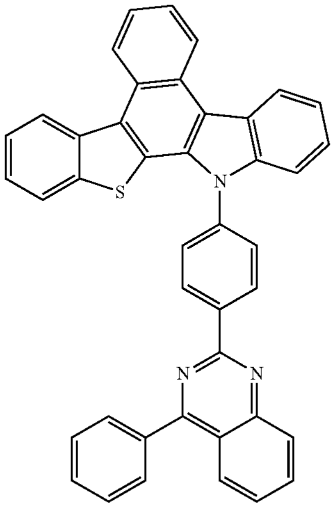
5-73
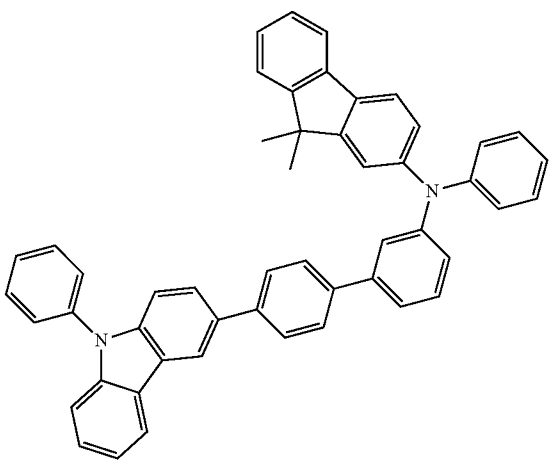
5-74
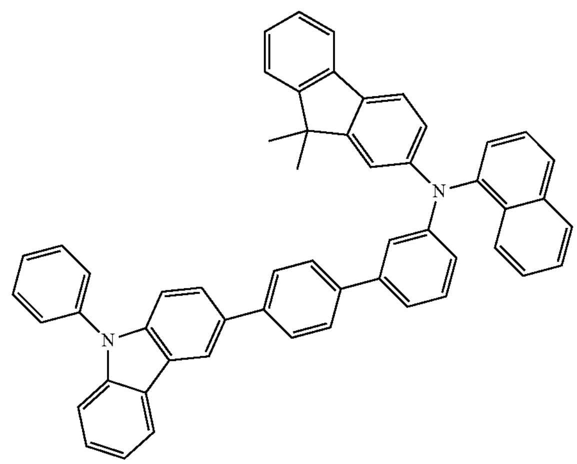
5-75
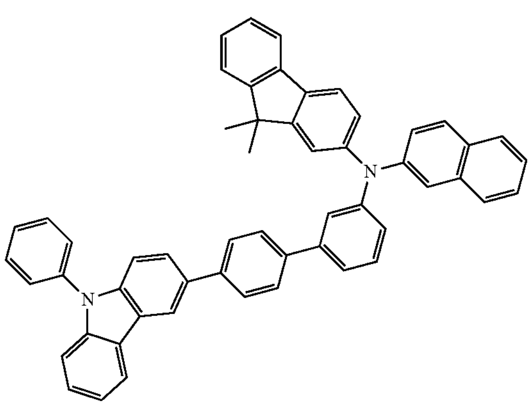
5-76
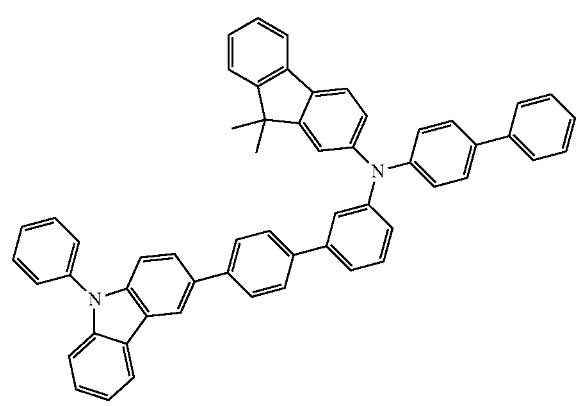

-continued
5-77
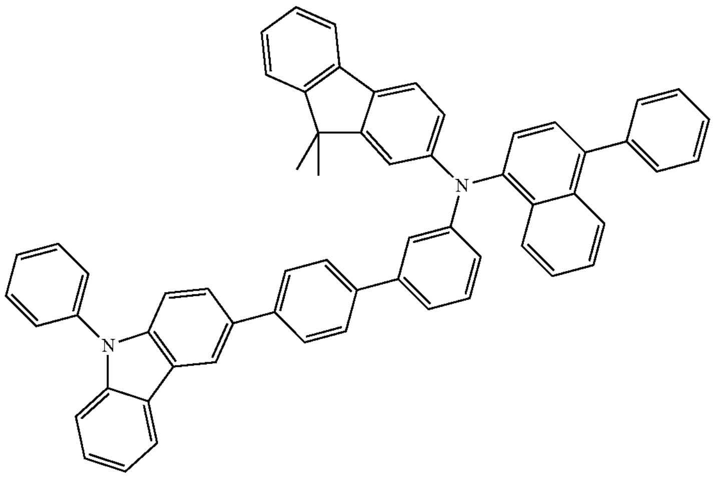
5-78
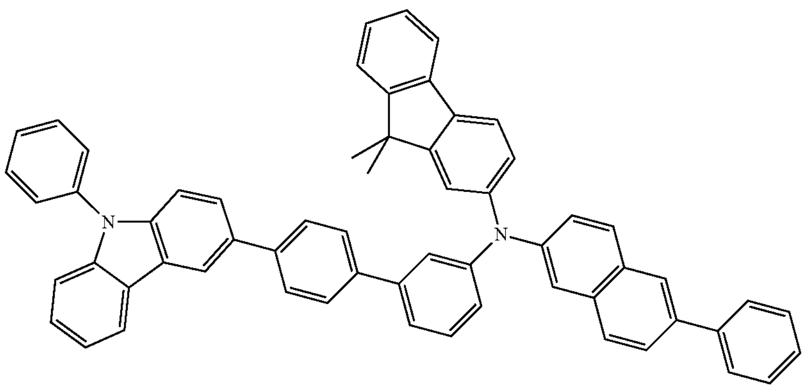
5-79
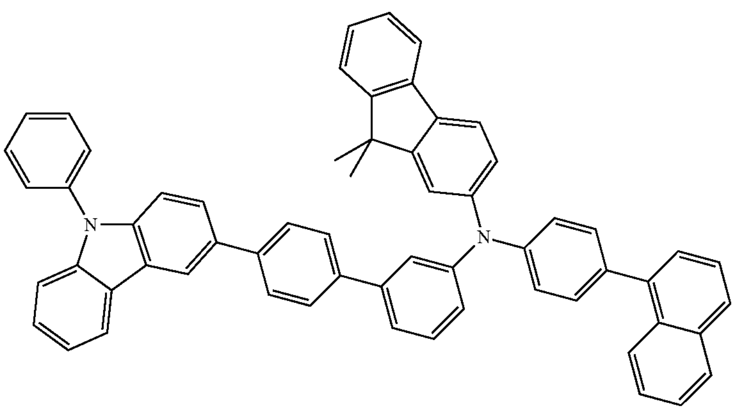
5-80
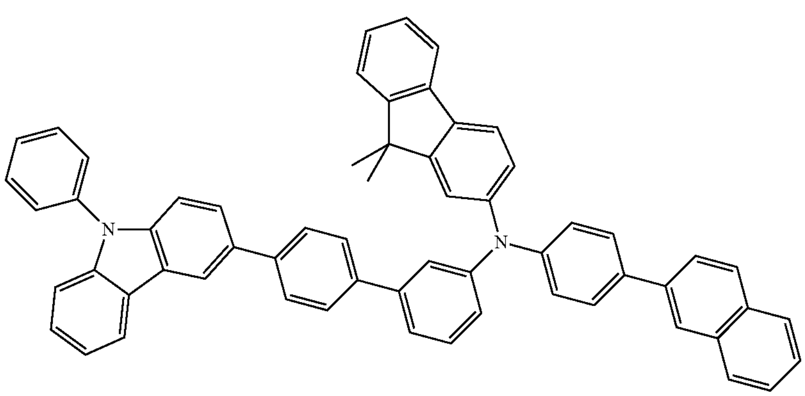

-continued
5-81
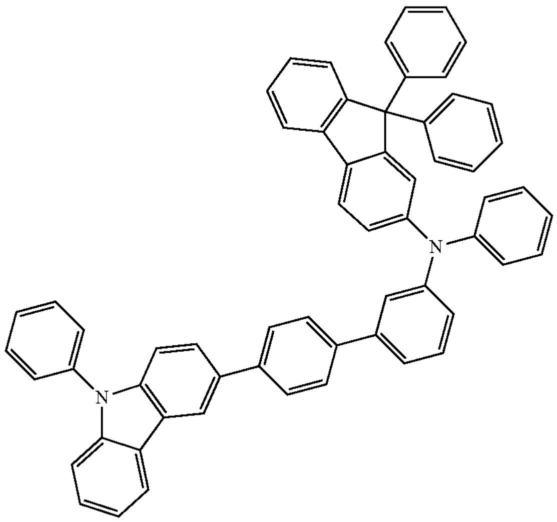
5-82
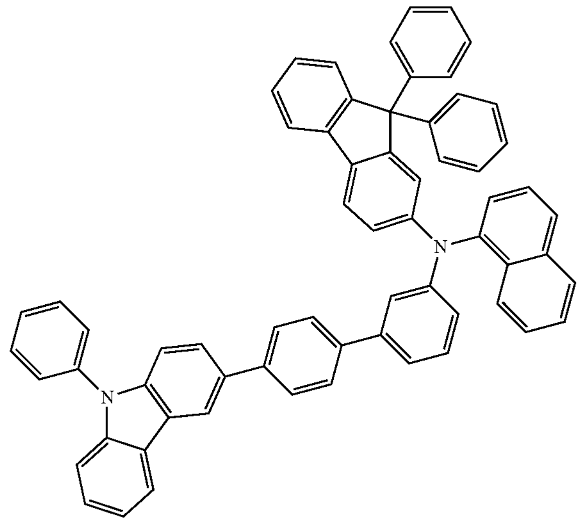
5-83
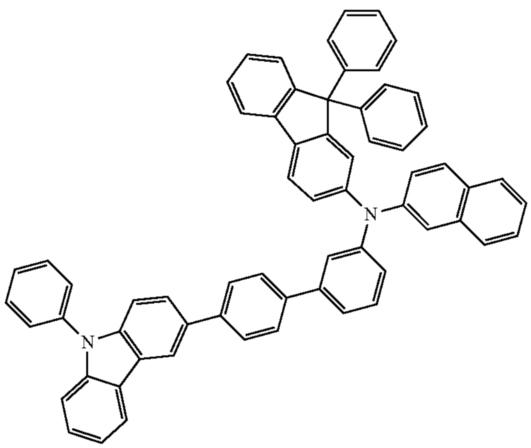
5-84
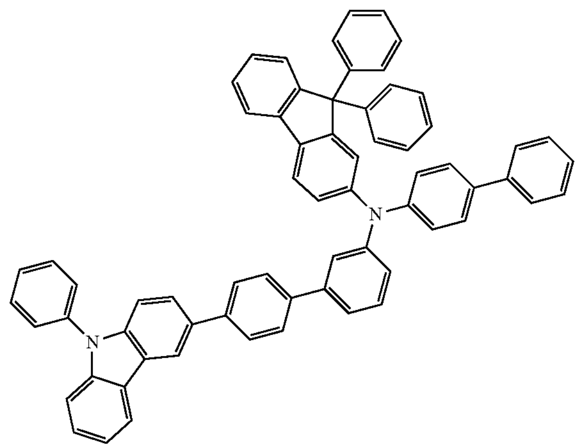
5-85
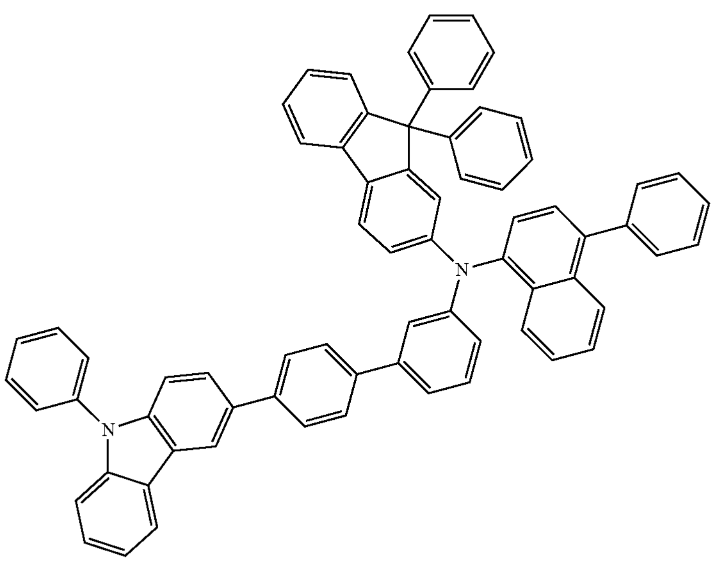

-continued
5-86
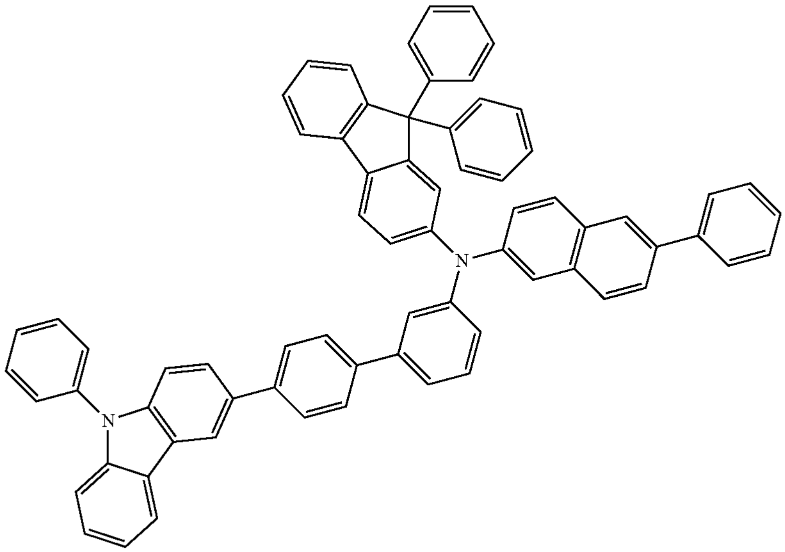
5-87
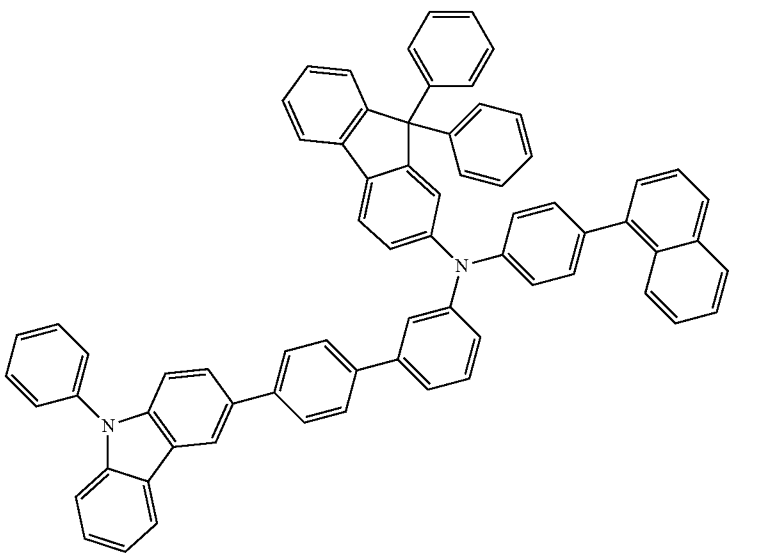
5-88
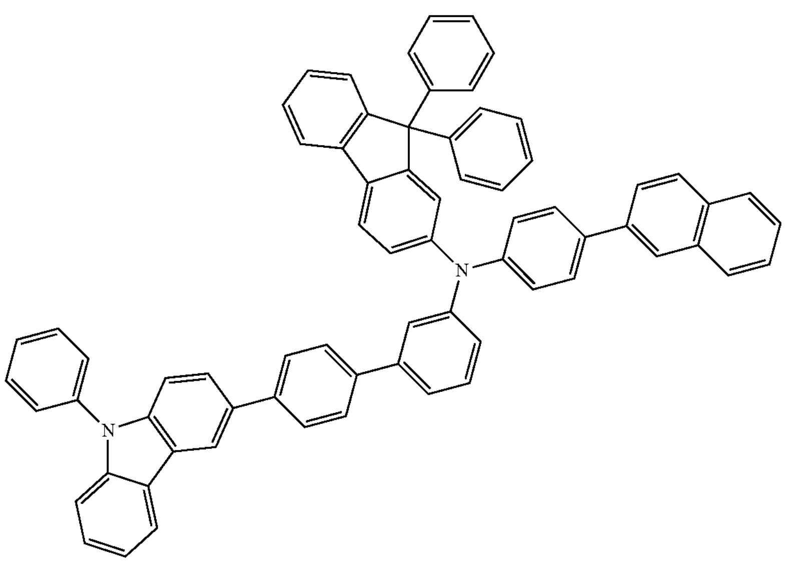

-continued
5-89
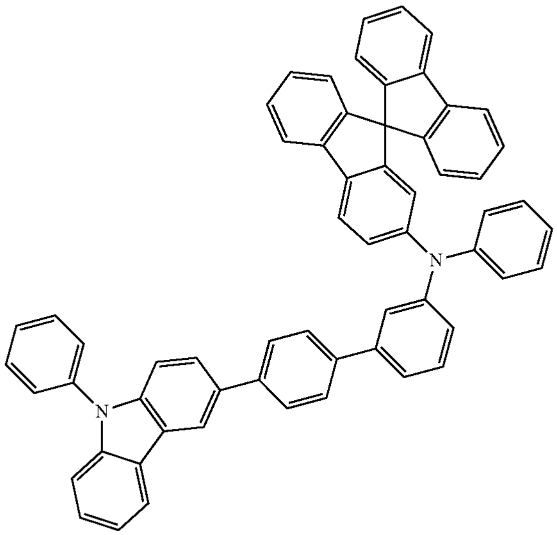
5-90
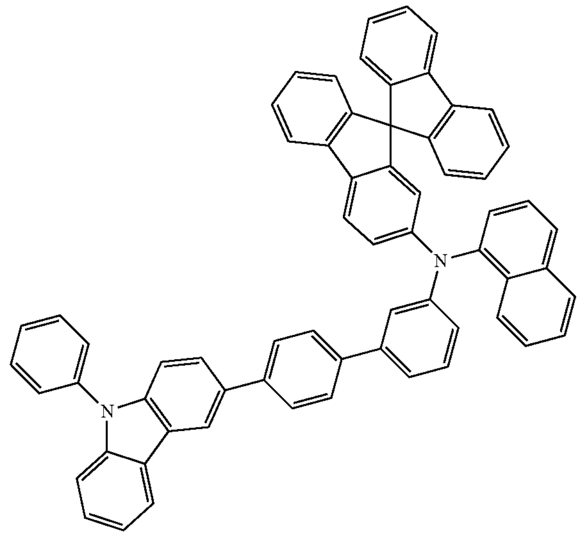
5-91
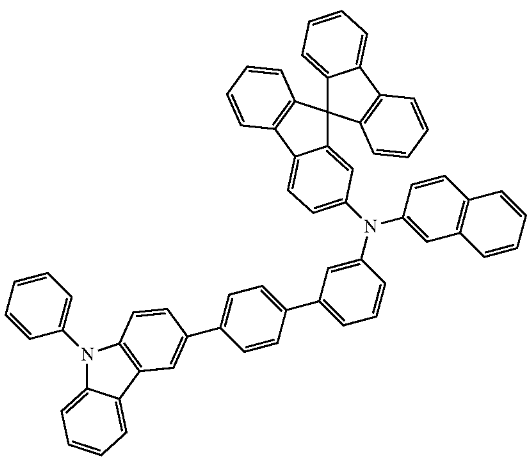
5-92
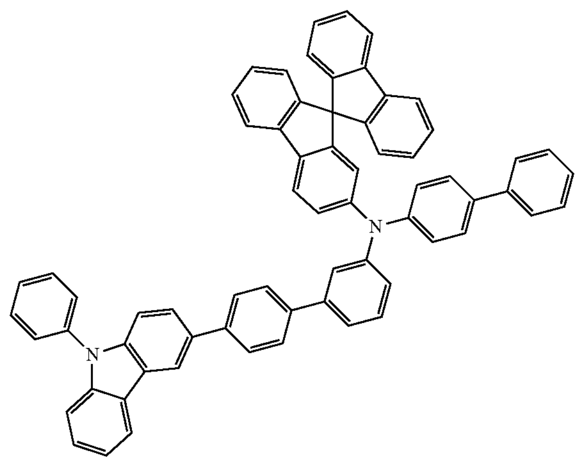
5-93
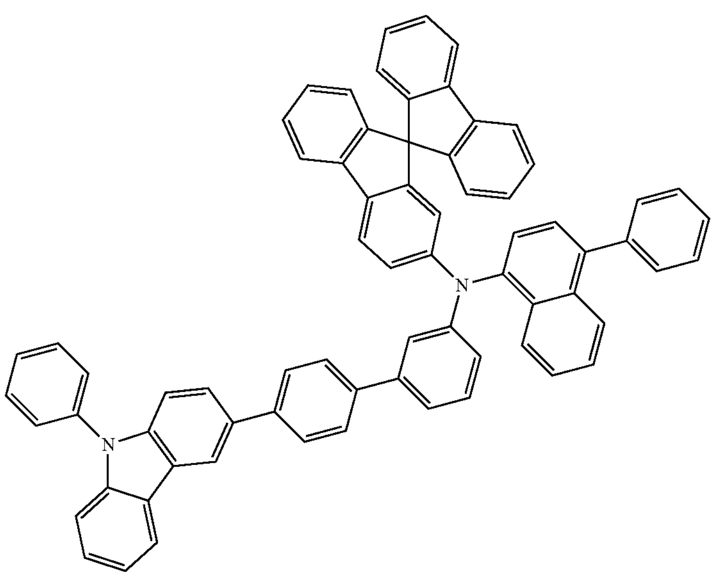

-continued
5-94
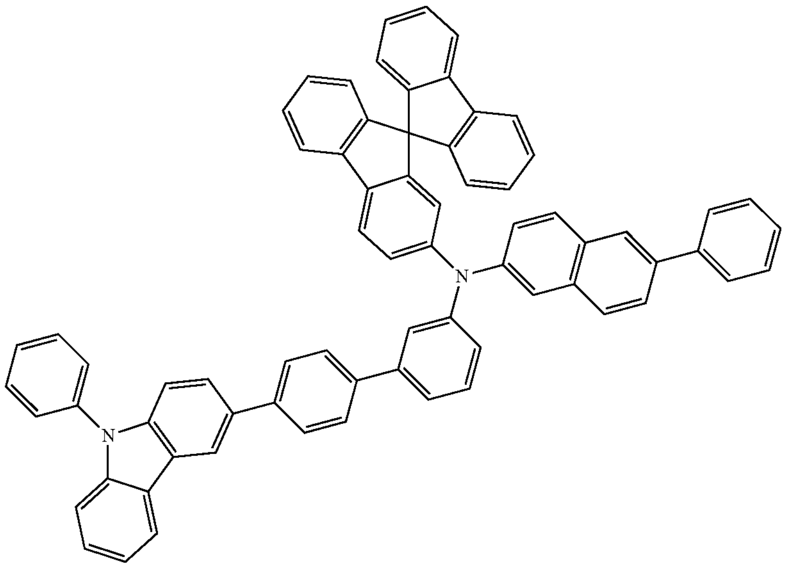
5-95
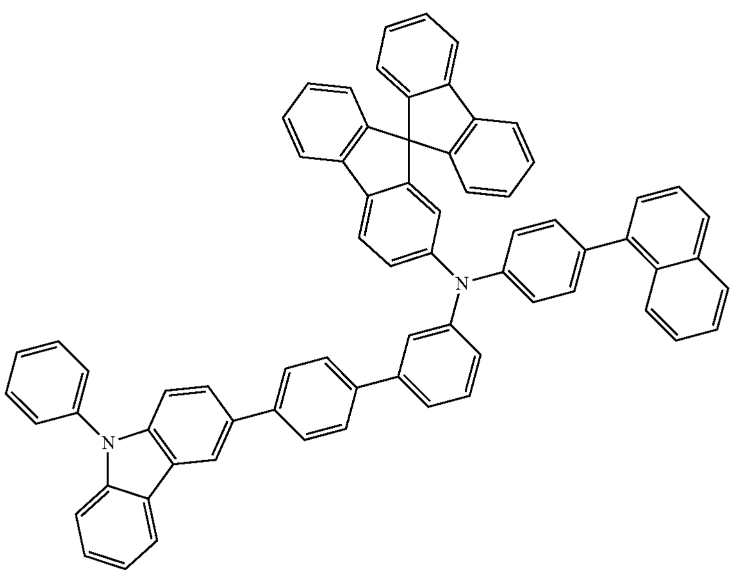

-continued
5-96
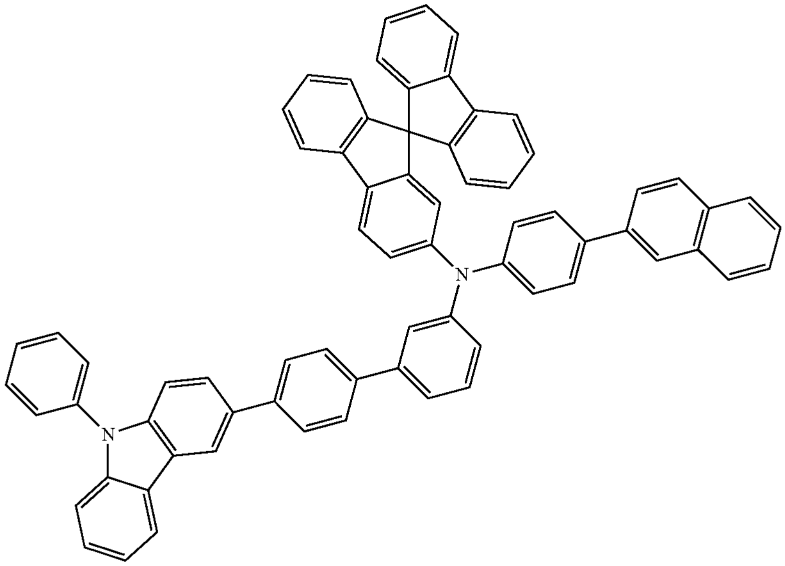
5-97
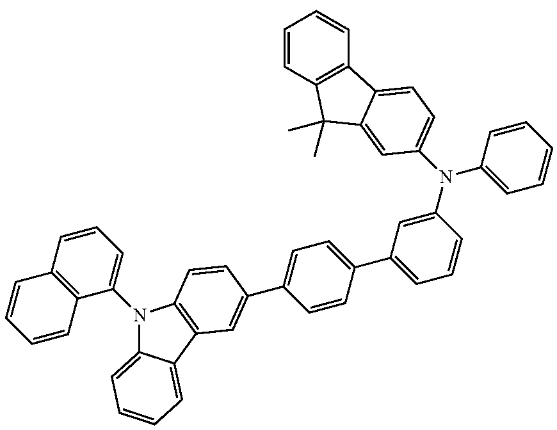
5-98
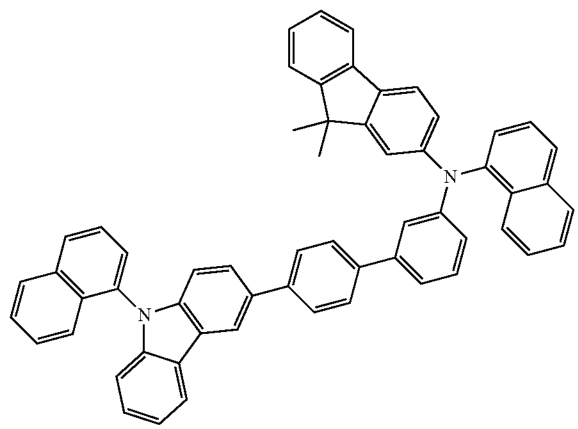
5-99
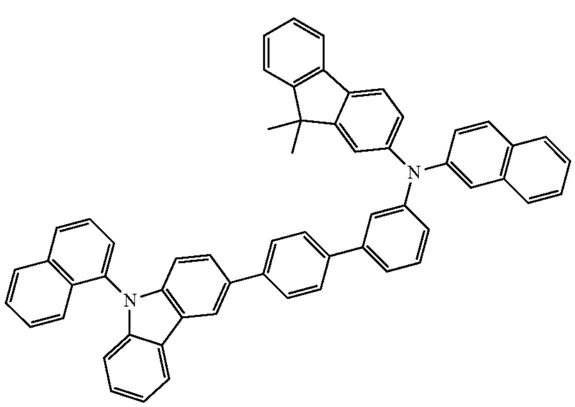
5-100
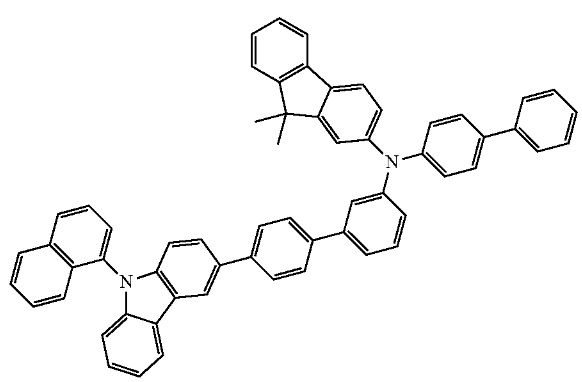

-continued
5-101
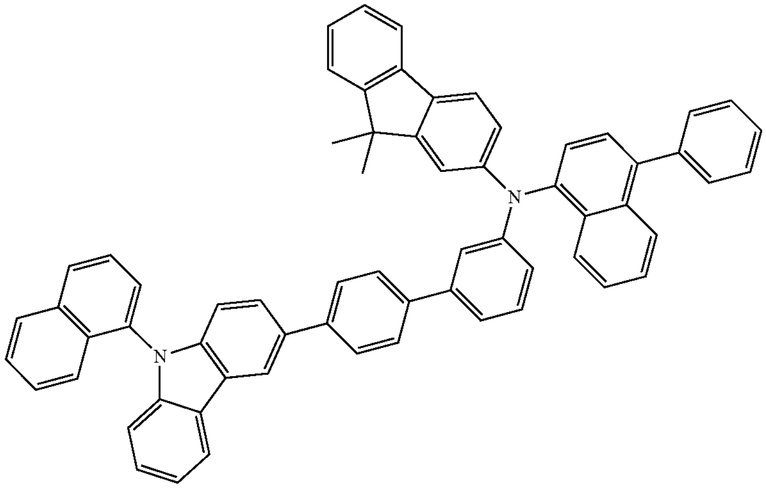
5-102
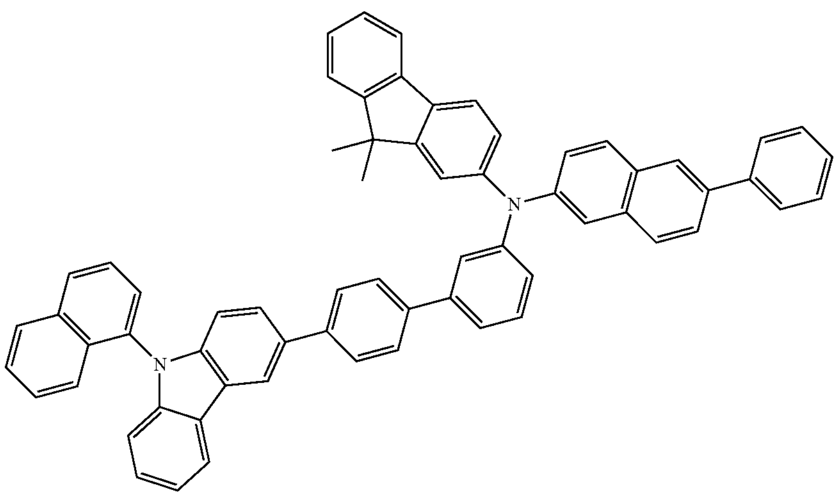
5-103
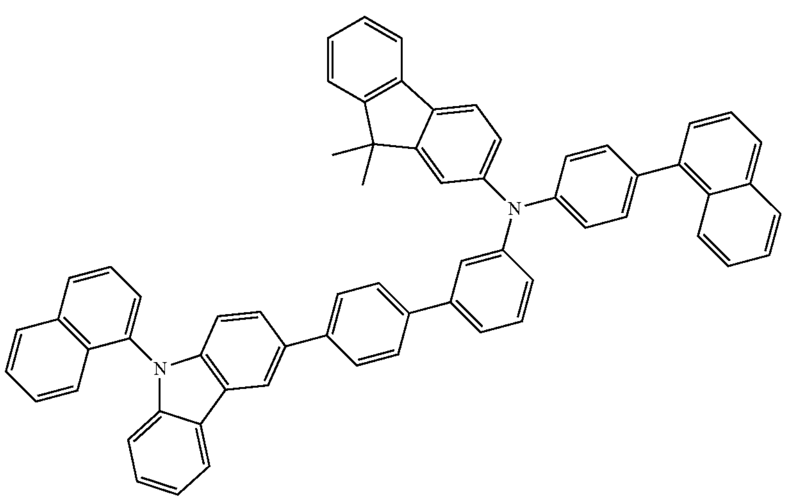

-continued
5-104
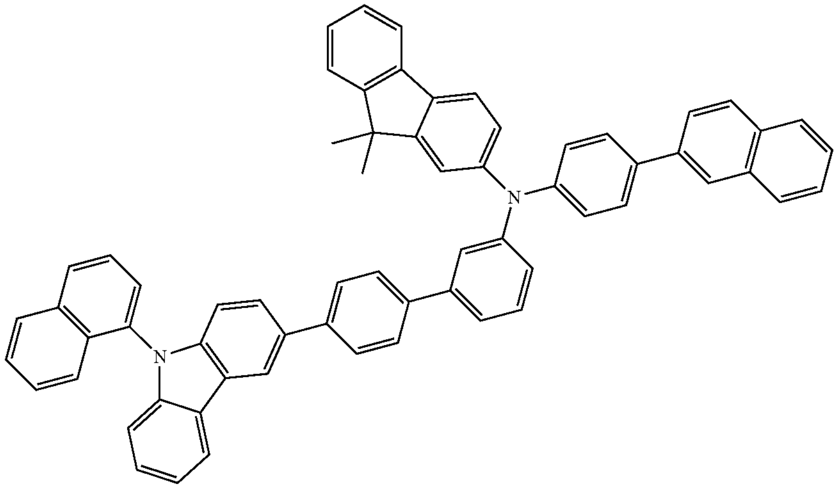
5-105
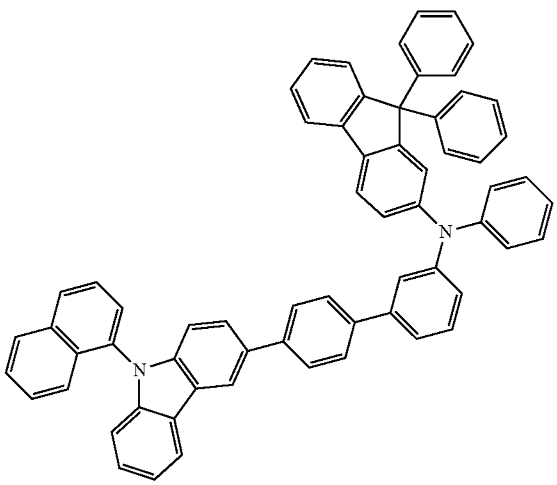
5-106
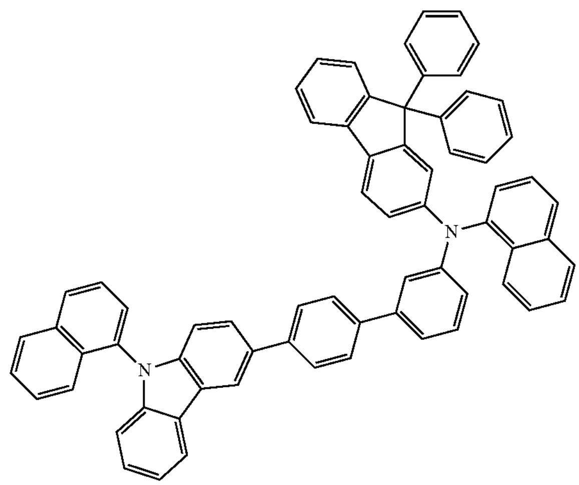
5-107
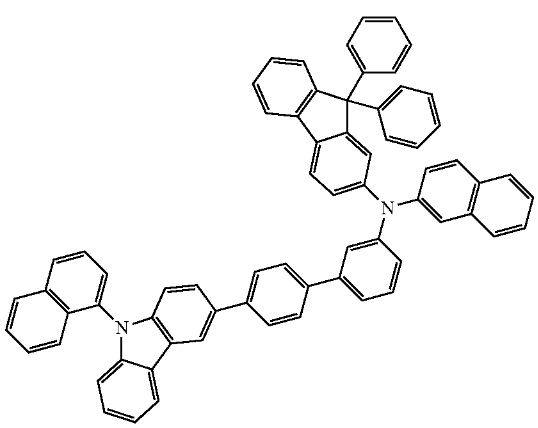
5-108
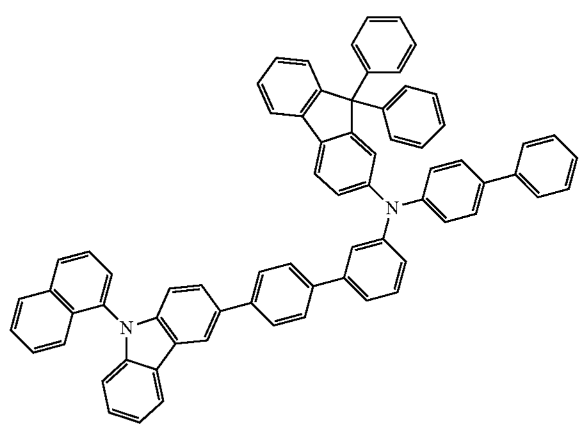

-continued
5-109
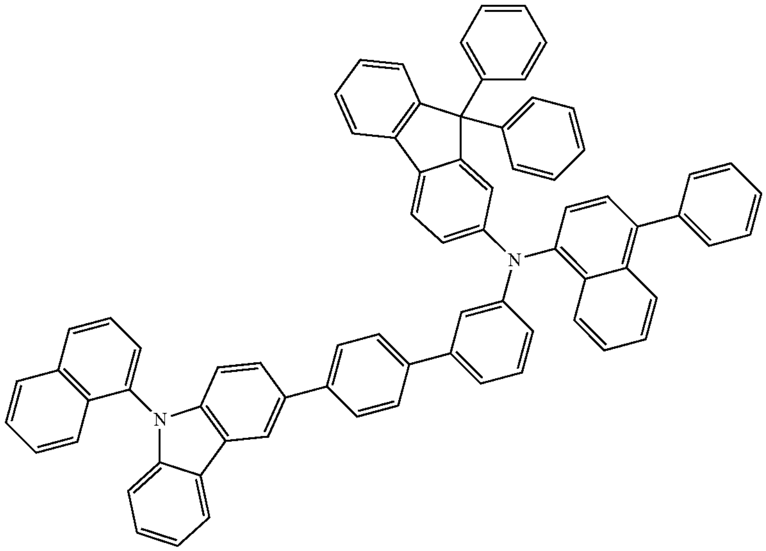
5-110
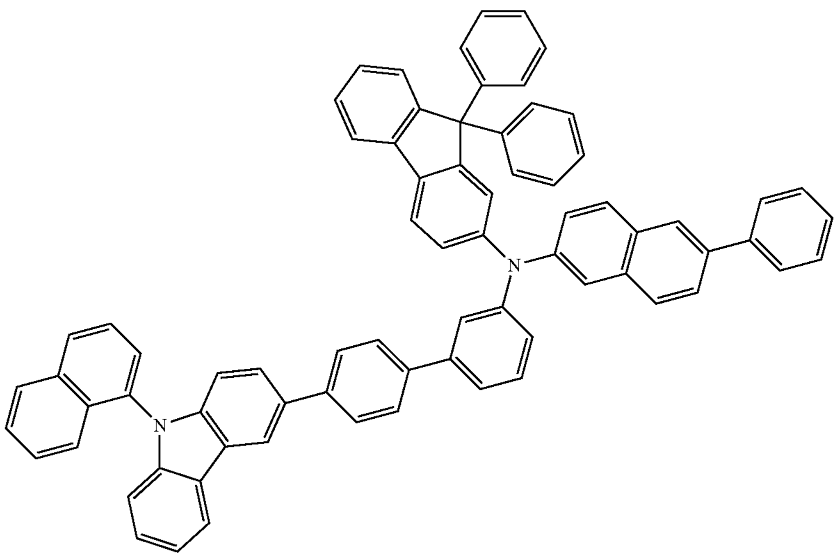
5-111
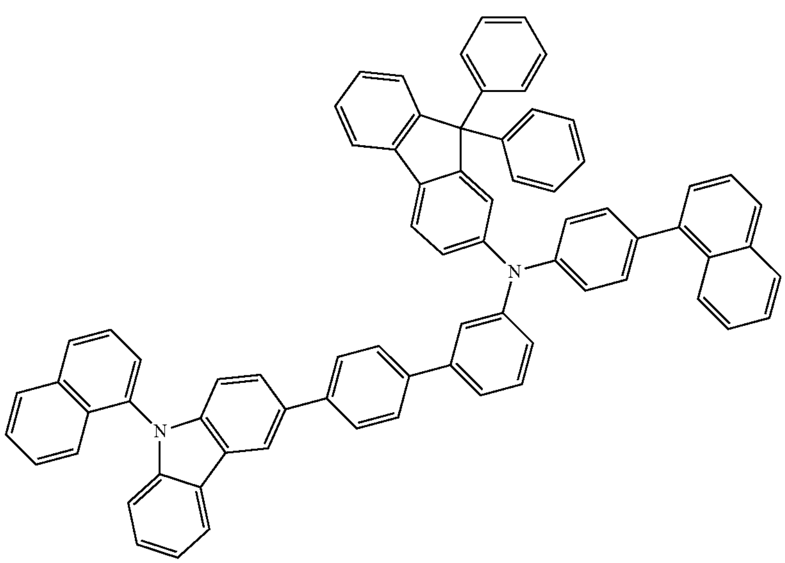

-continued
5-112
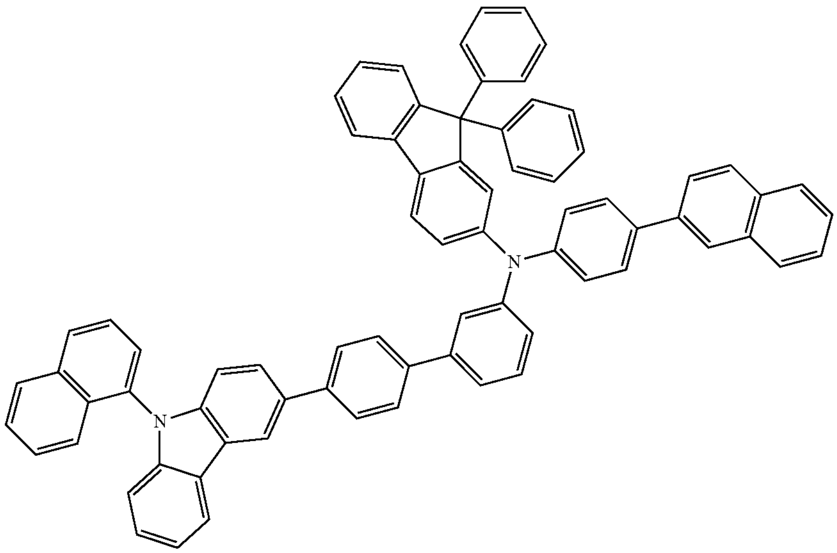
5-113
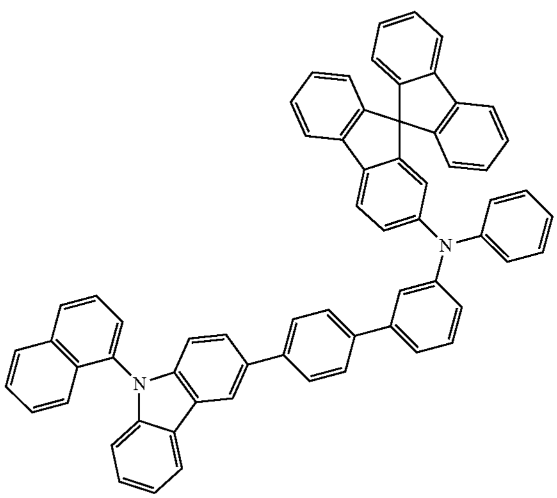
5-114
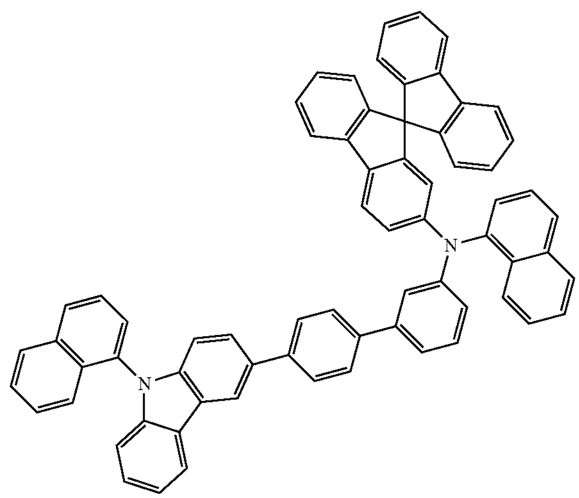
5-115
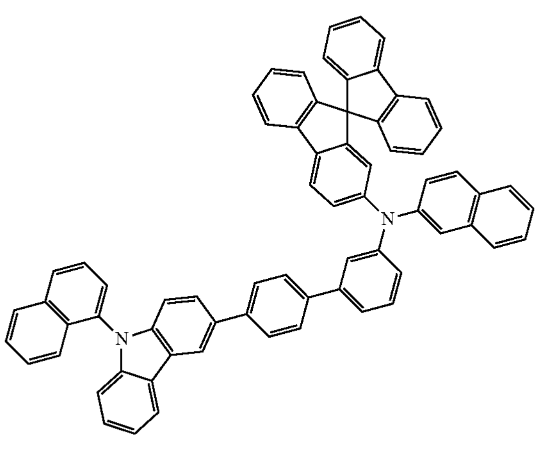
5-116
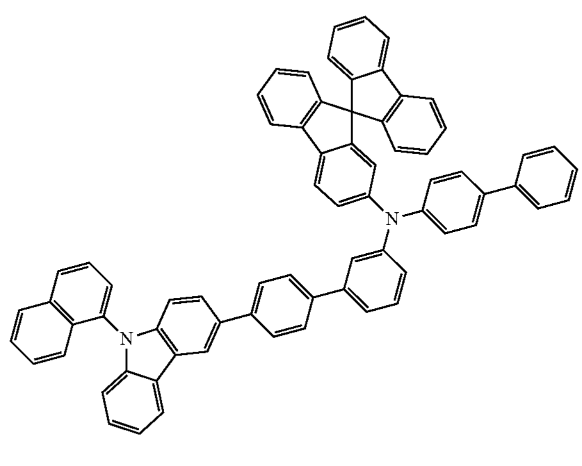

-continued
5-117
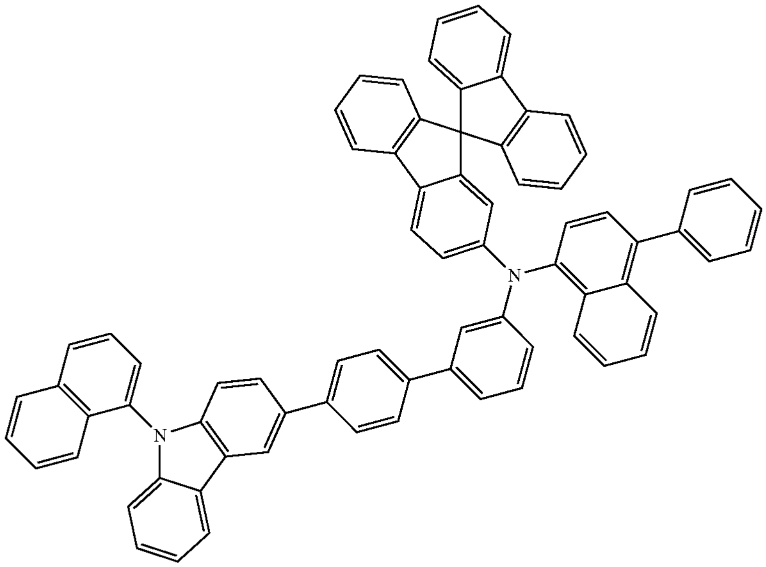
5-118
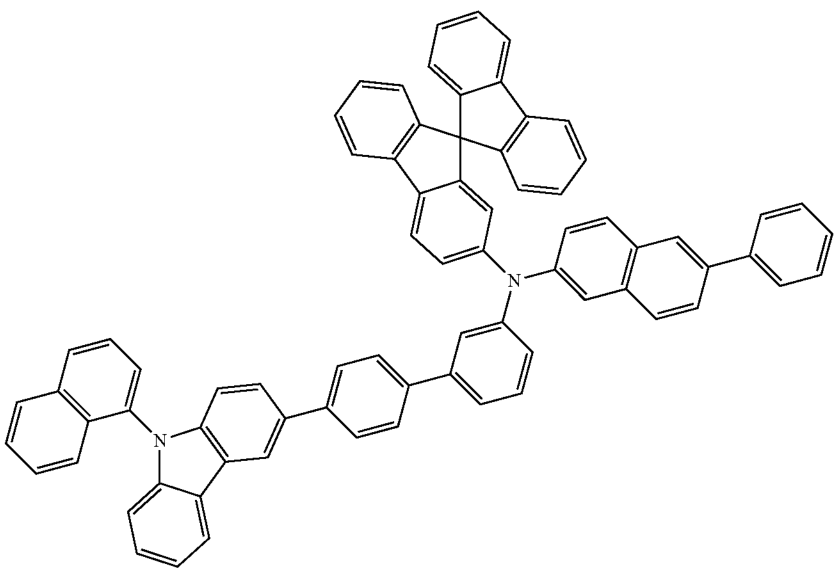

-continued
5-119
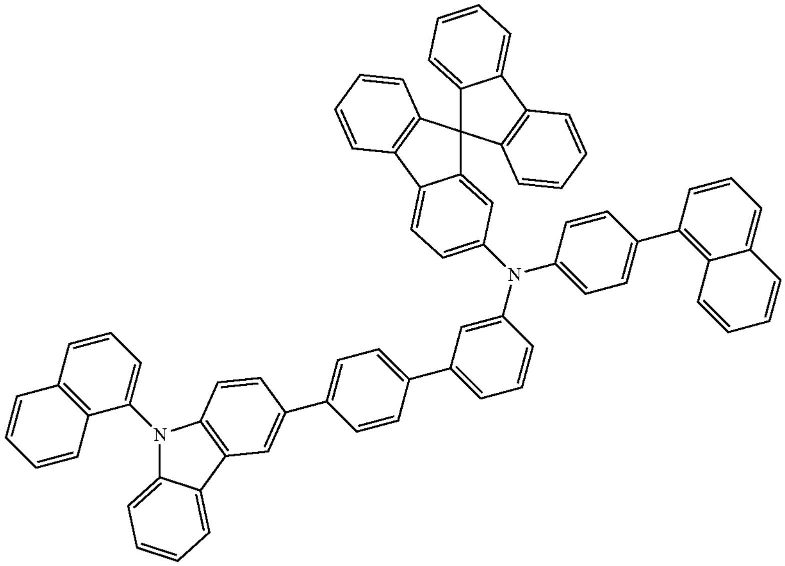
5-120
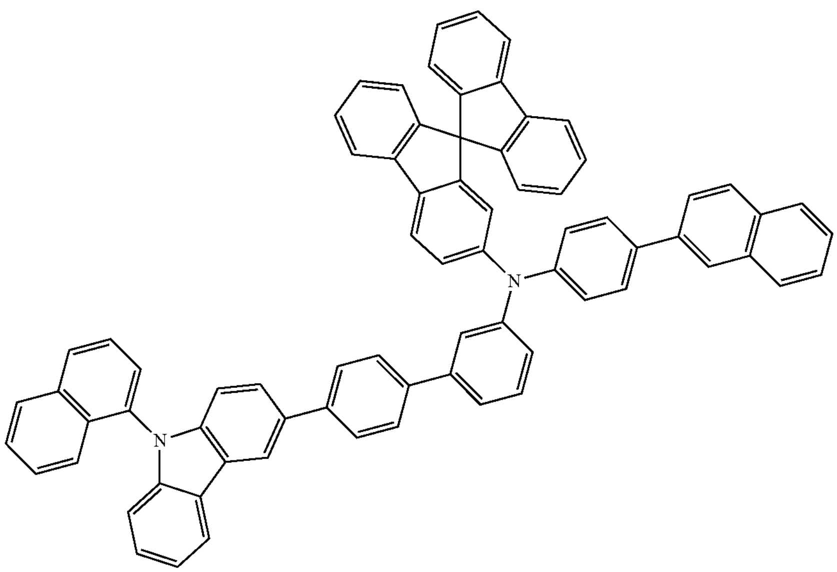
5-121
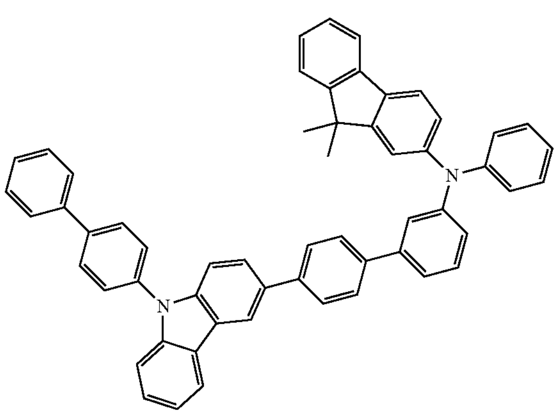
5-122
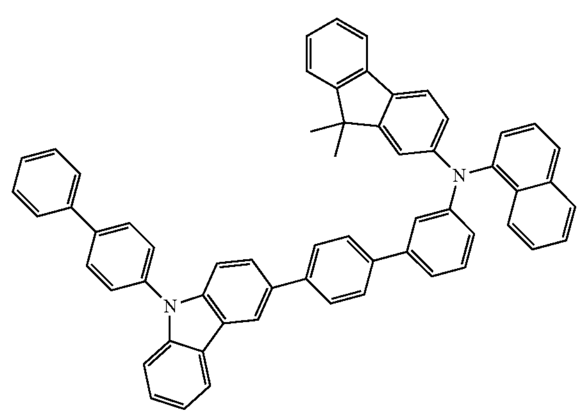

-continued
5-123
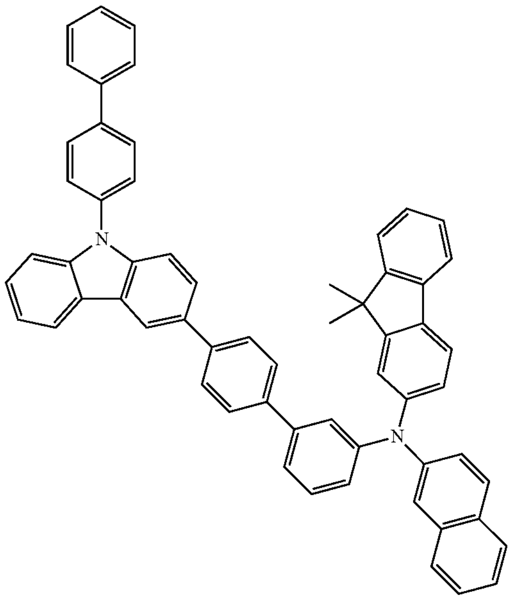
5-124
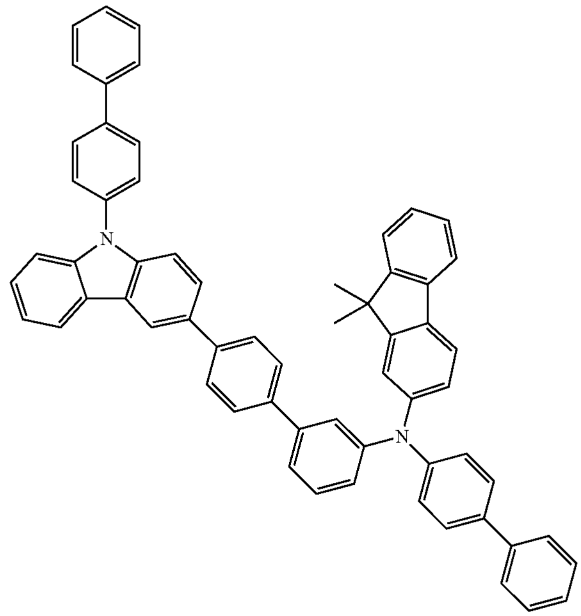
5-125
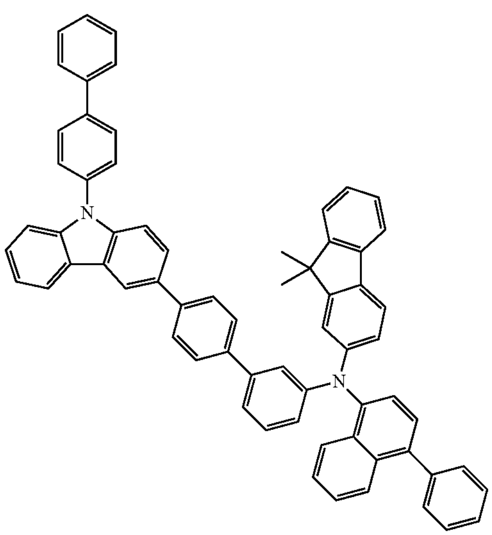
5-126
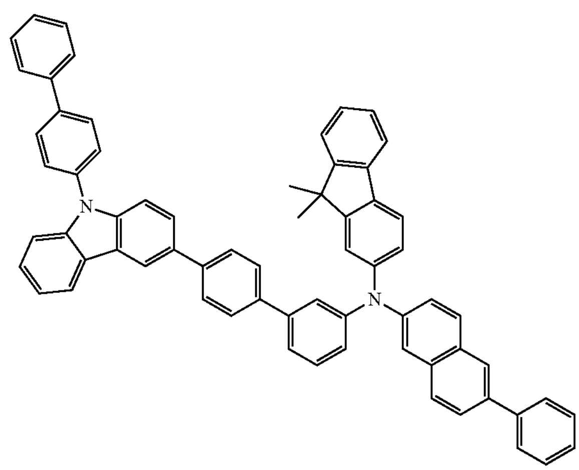

-continued
5-127
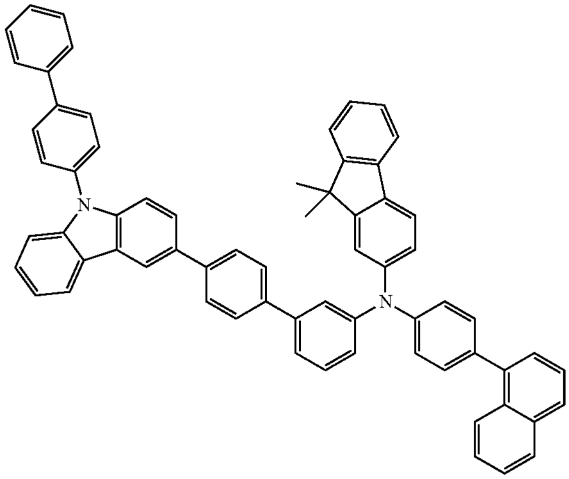
5-128
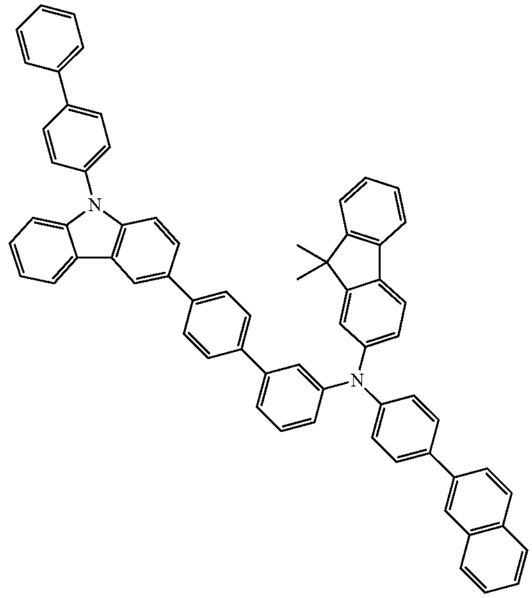
5-129
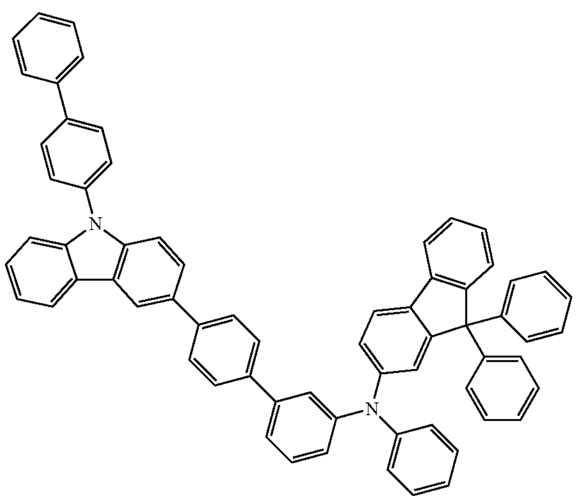
5-130
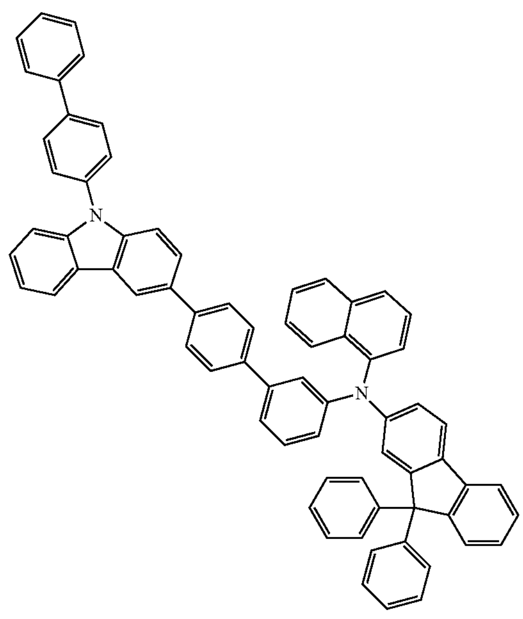

-continued
5-131
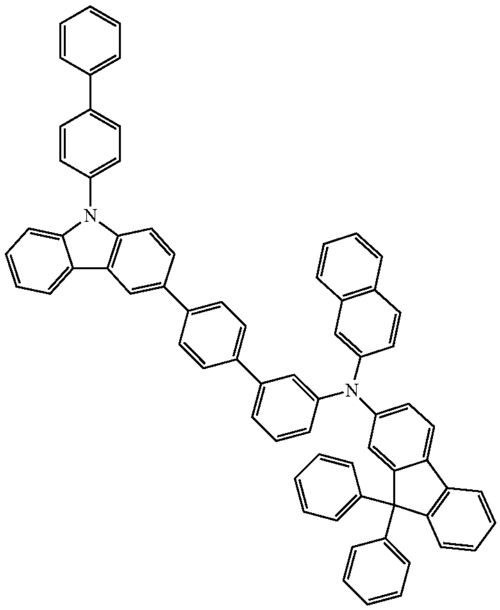
5-132
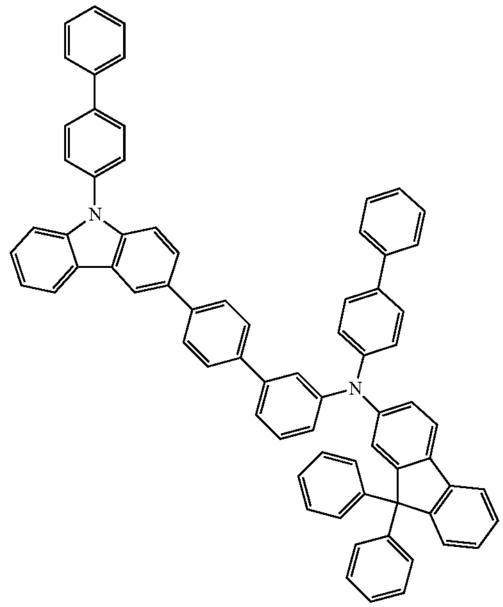
5-133
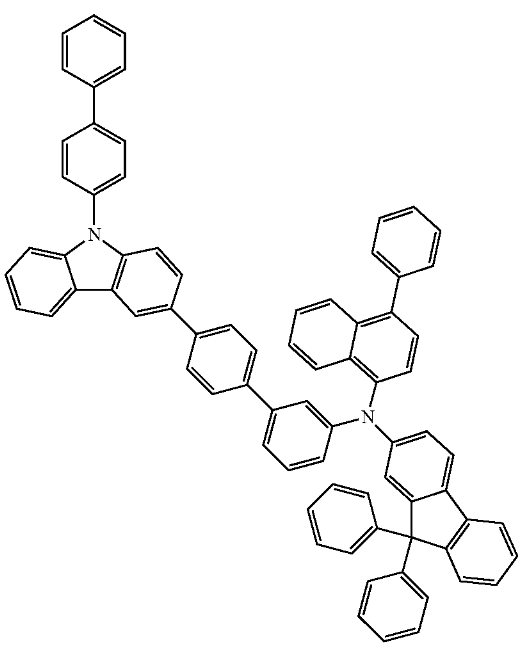

-continued
5-134
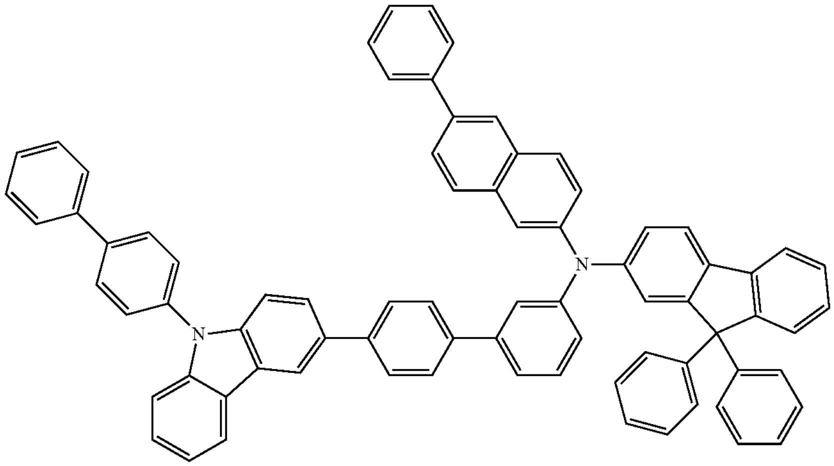
5-135
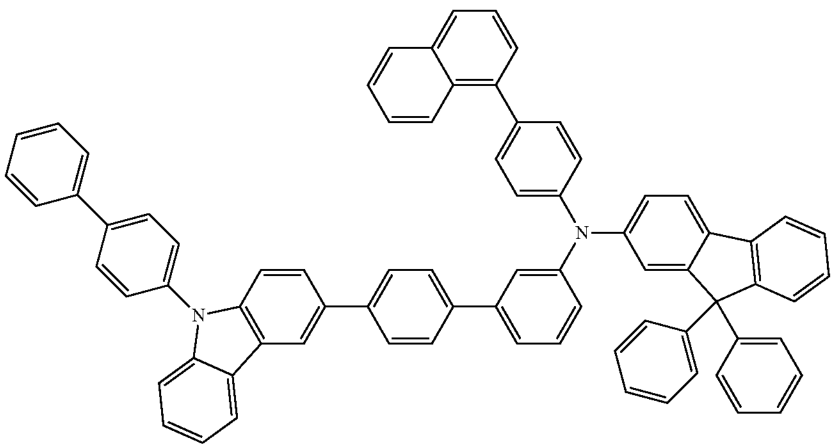
5-136
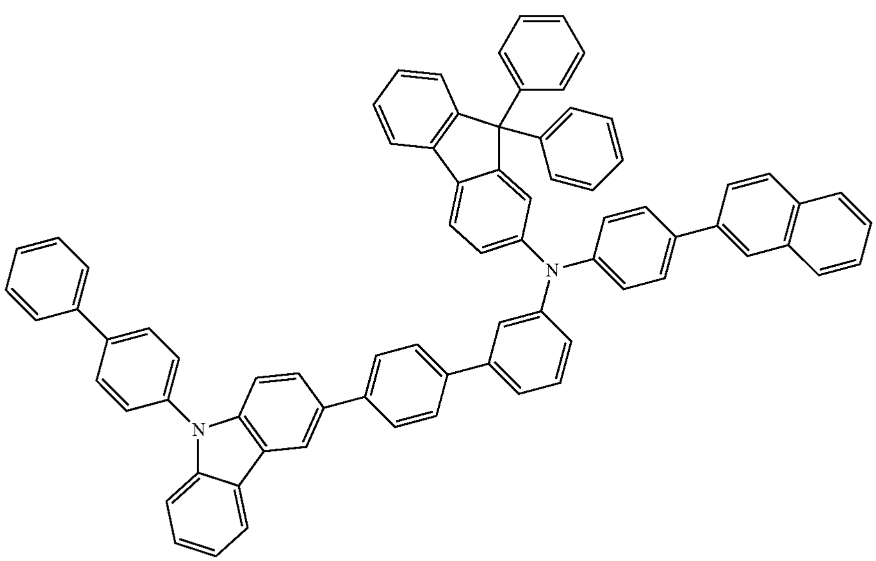

-continued
5-137
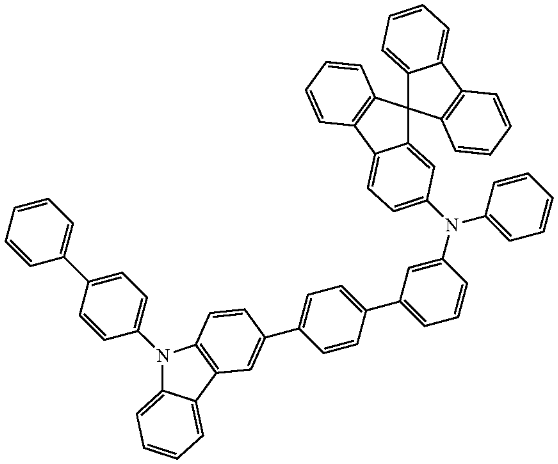
5-138
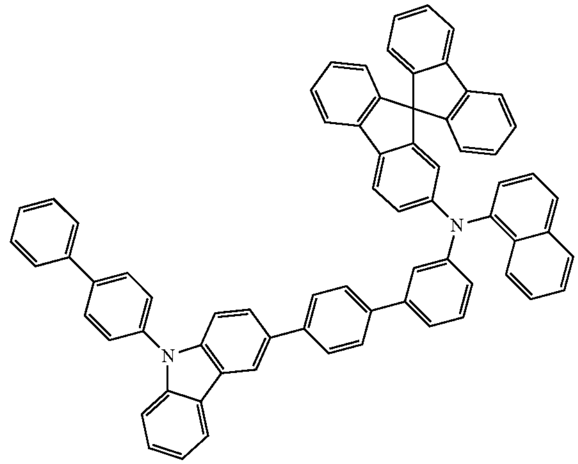
5-139
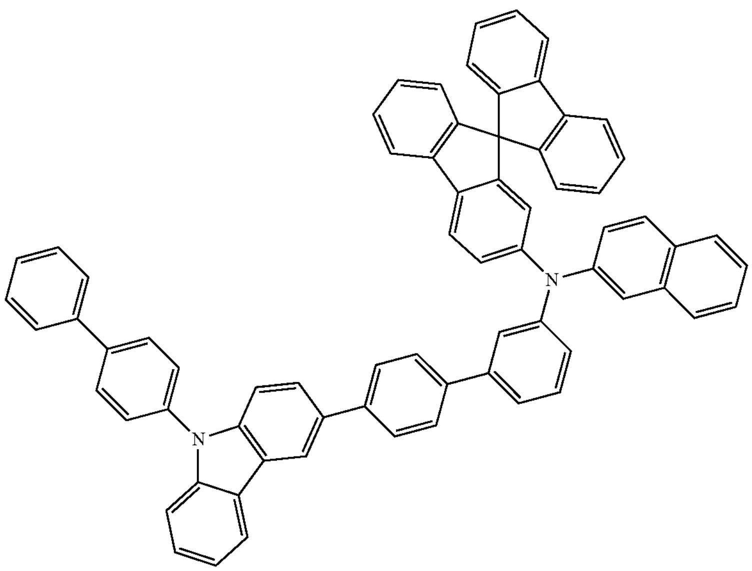
5-140
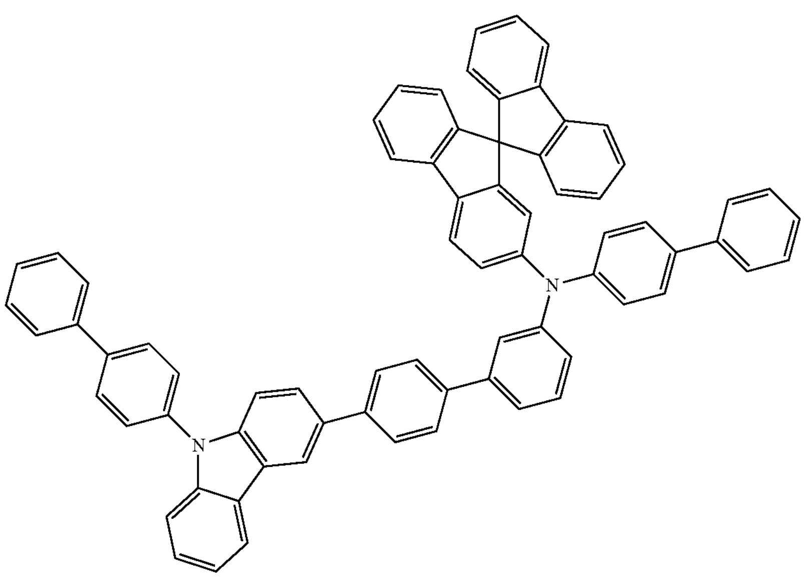

-continued
5-141
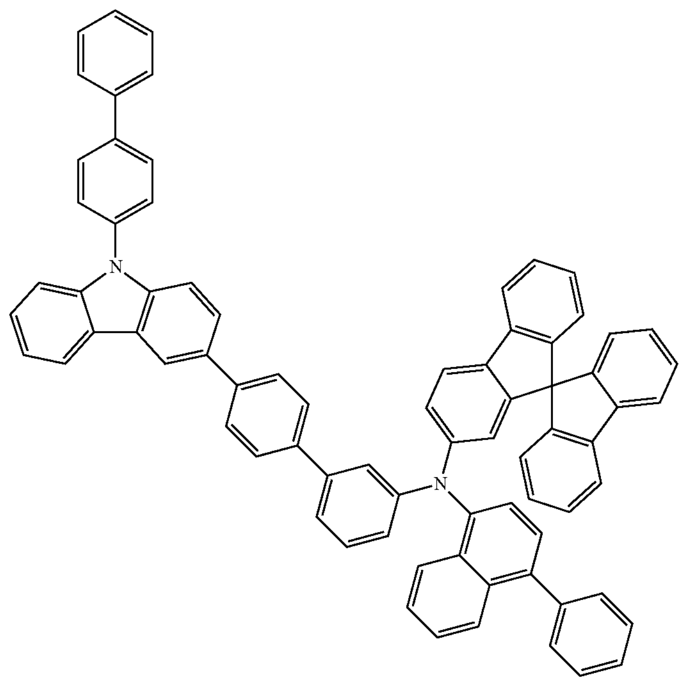
5-142
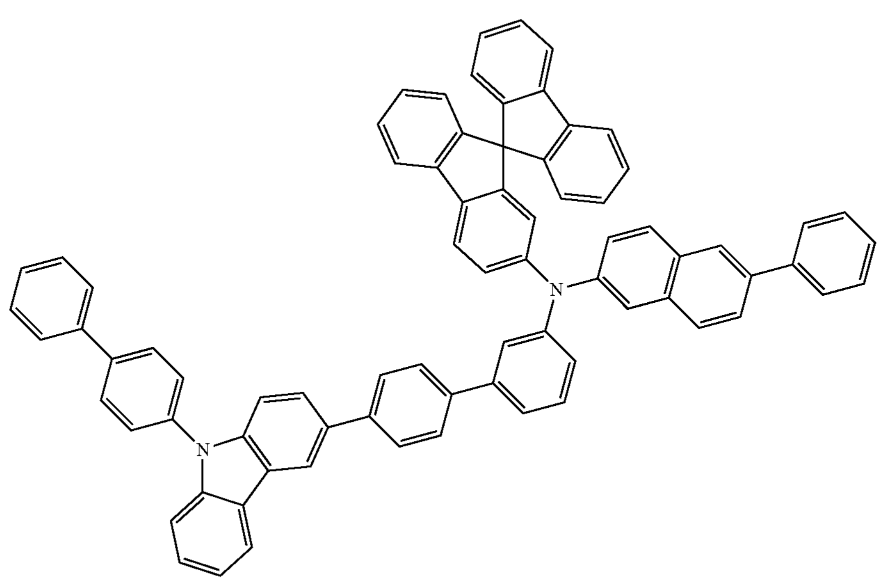

-continued
5-143
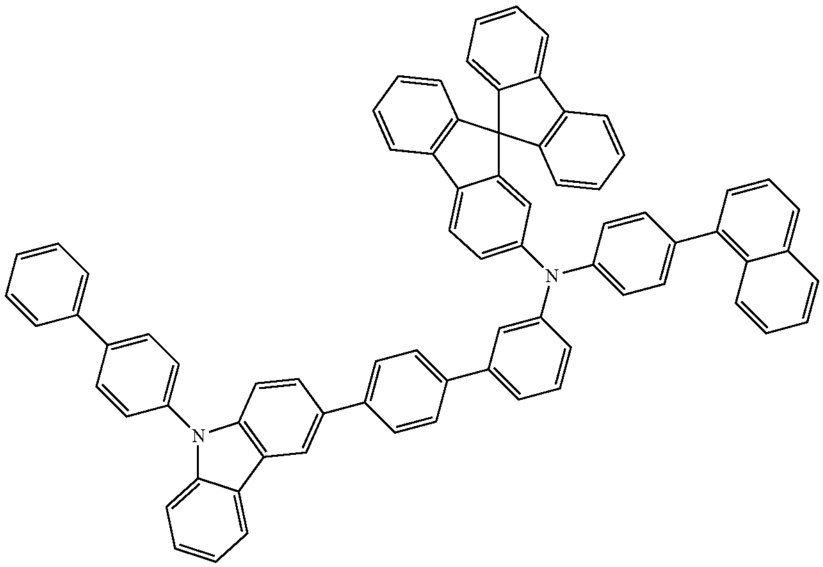
5-144
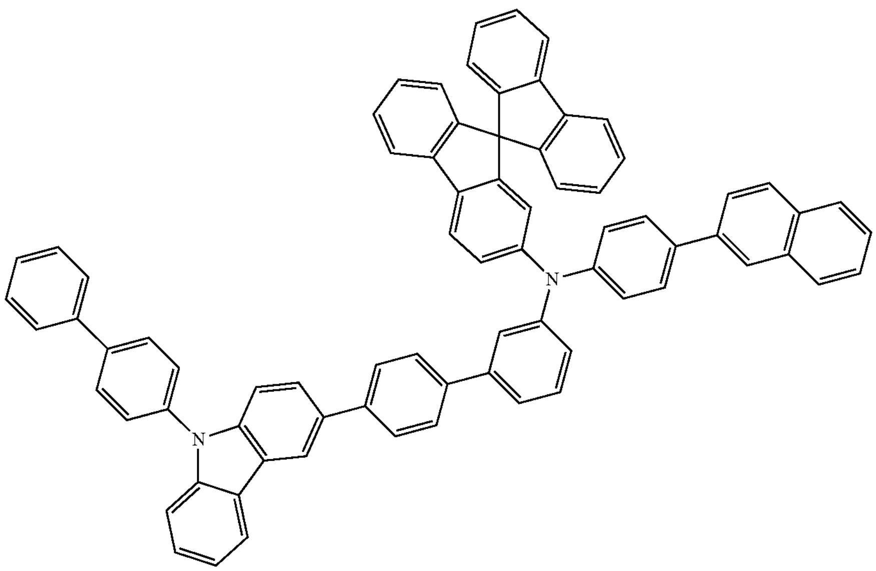
6-73
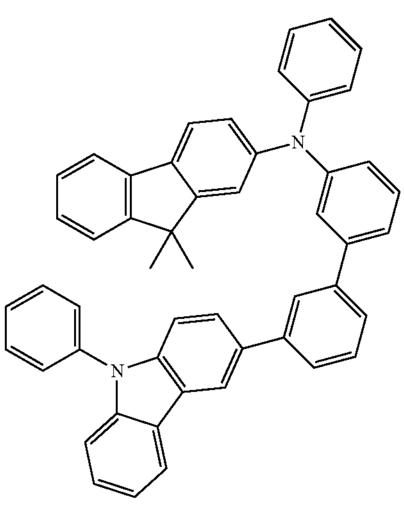
6-74
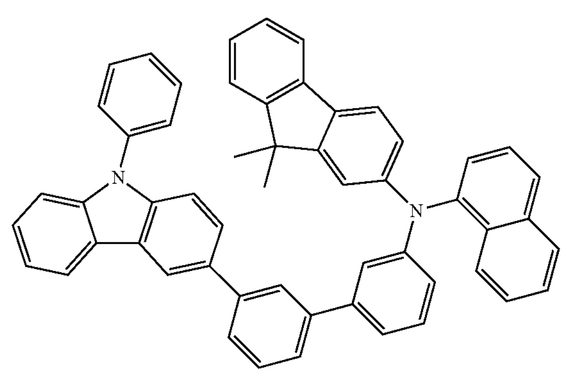

-continued
6-75
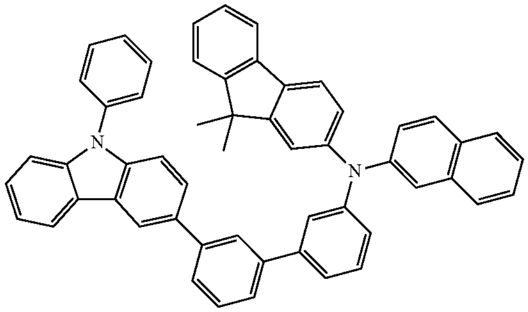
6-76
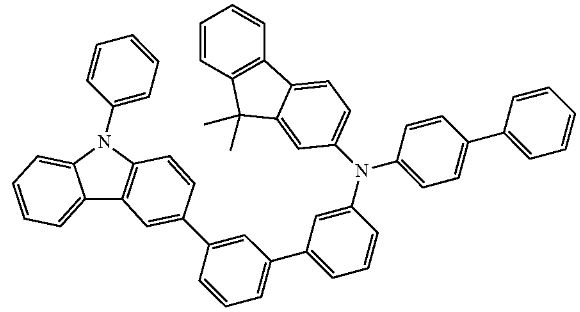
6-77
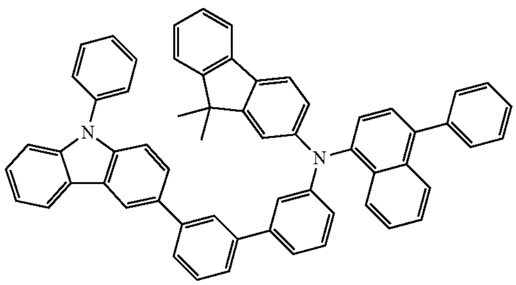
6-78
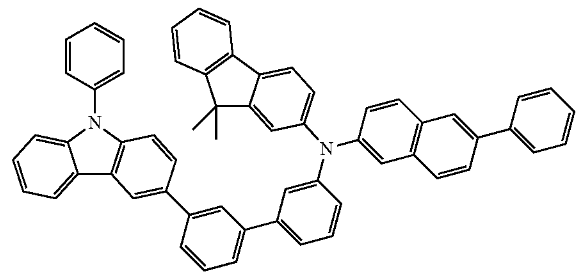
6-79
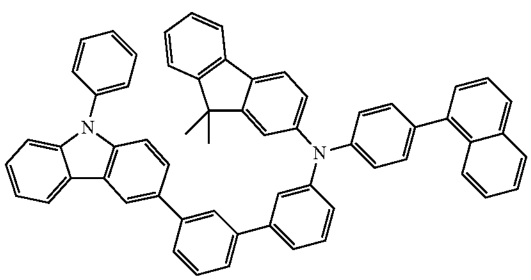
6-80
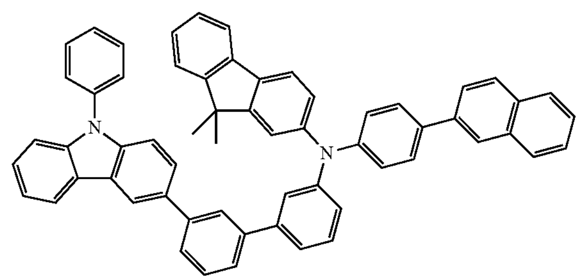
6-81
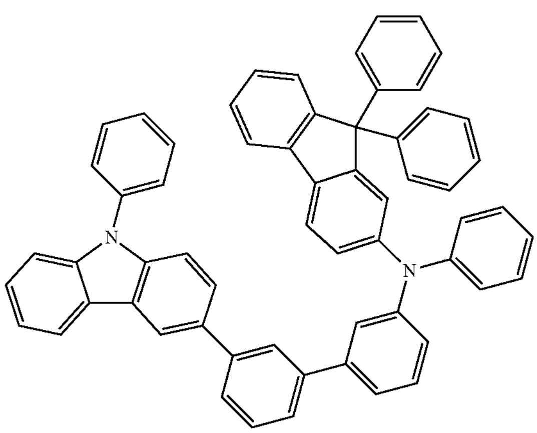
6-82
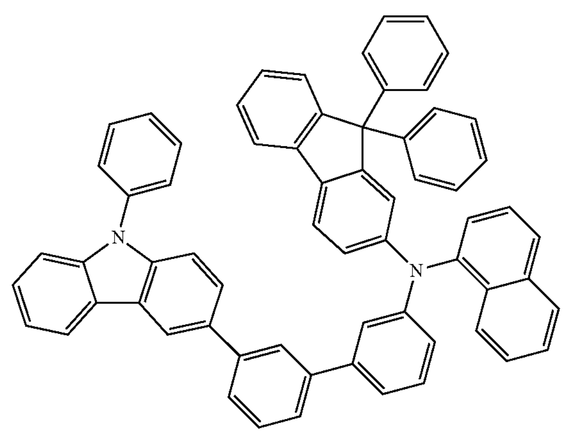

-continued
6-83
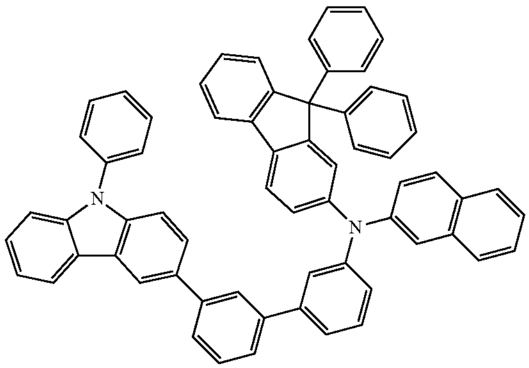
6-84
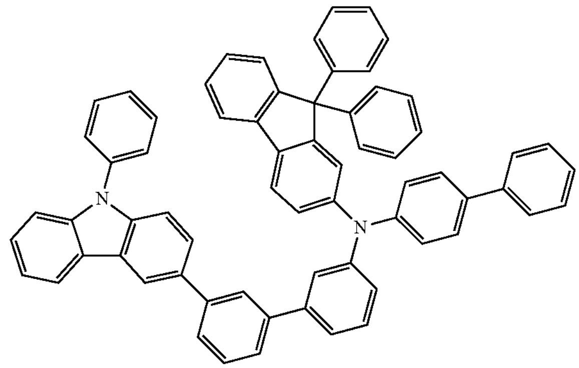
6-85
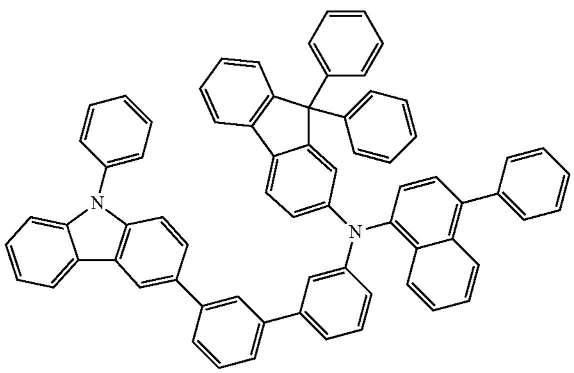
6-86
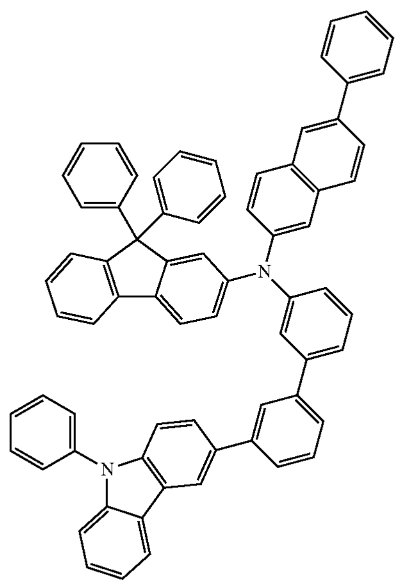
6-87
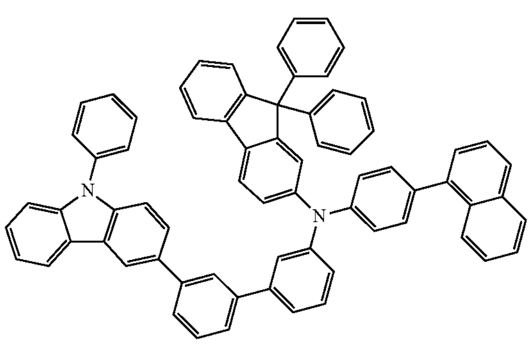
6-88
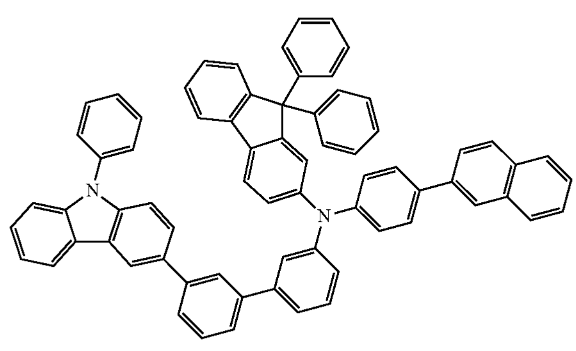

-continued
6-89
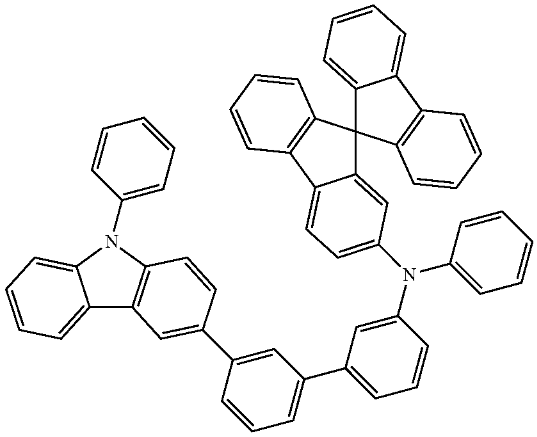
6-90
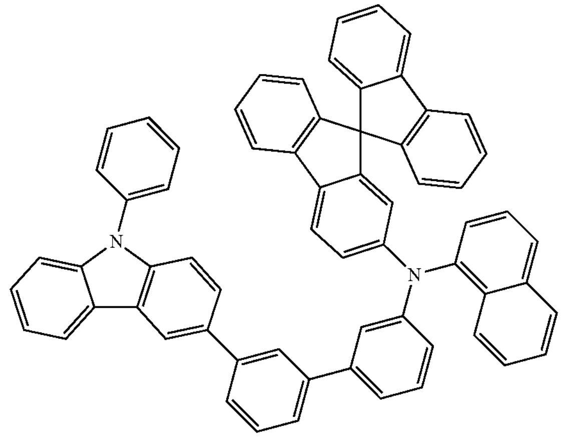
6-91
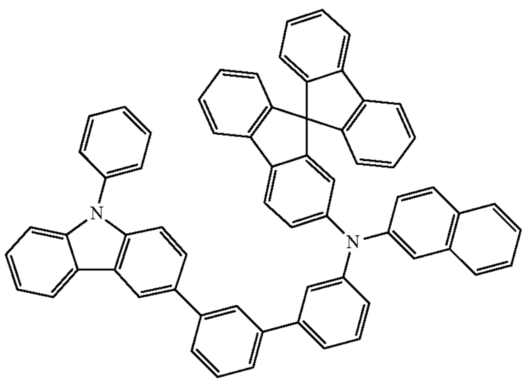
6-92
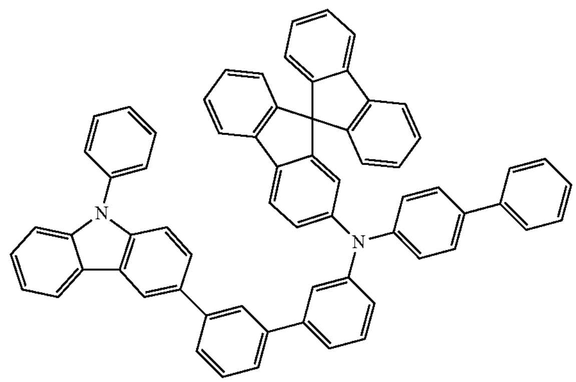
6-93
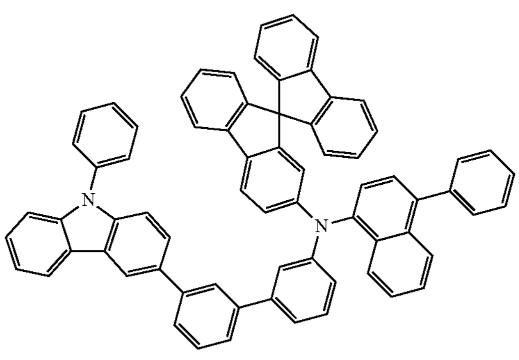
6-94
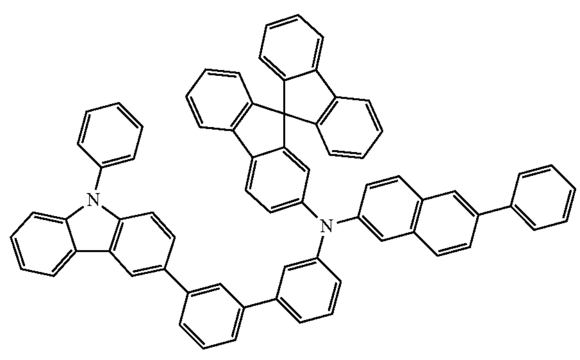
6-95
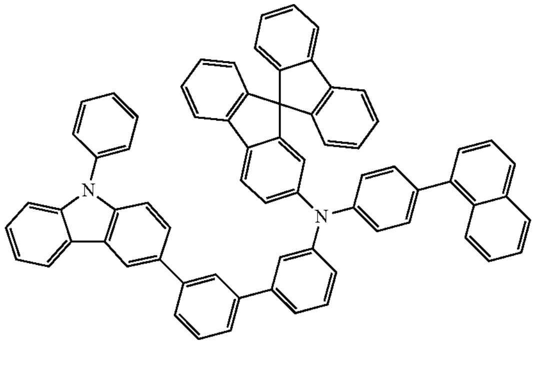
6-96
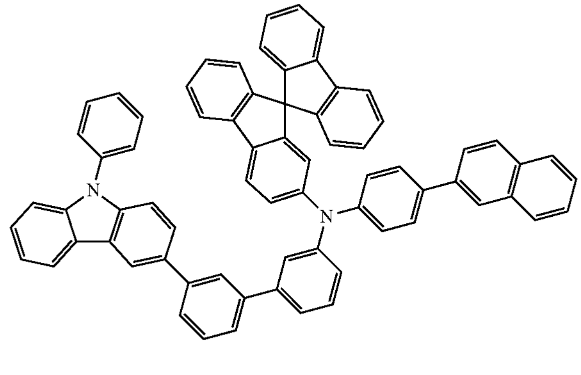

-continued
6-97
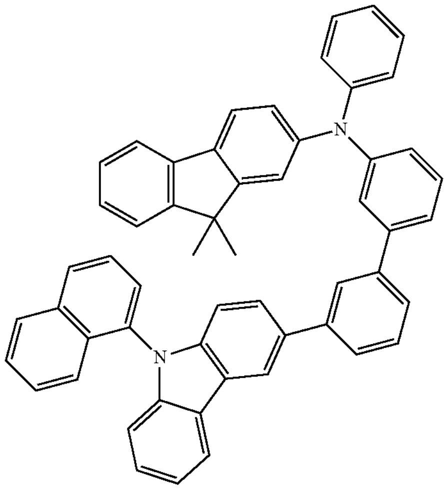
6-98
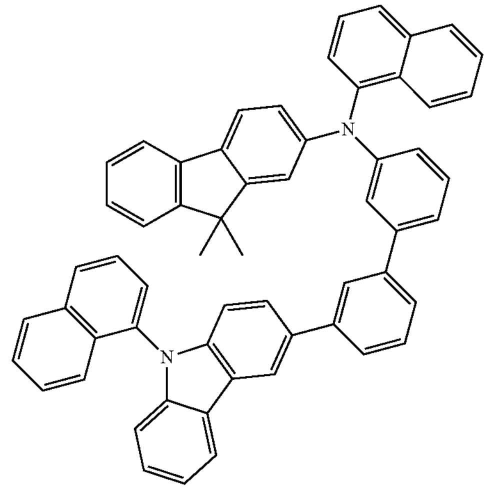
6-99
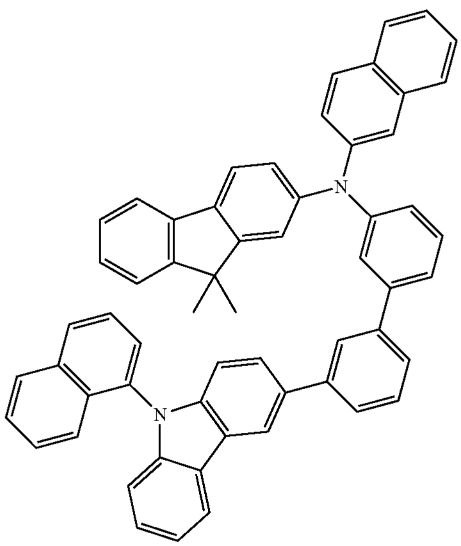
6-100
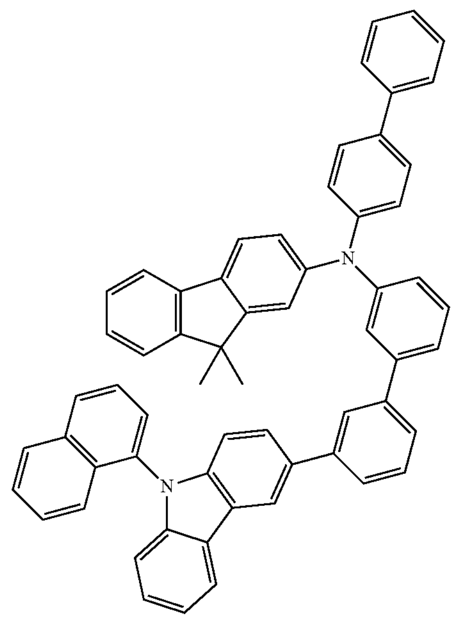
6-101
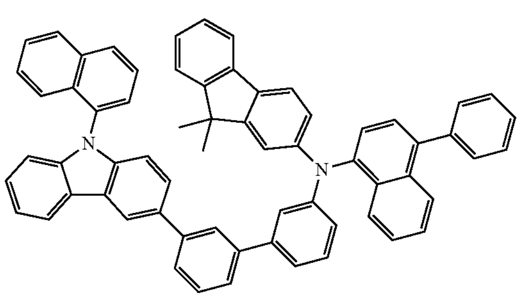
6-102
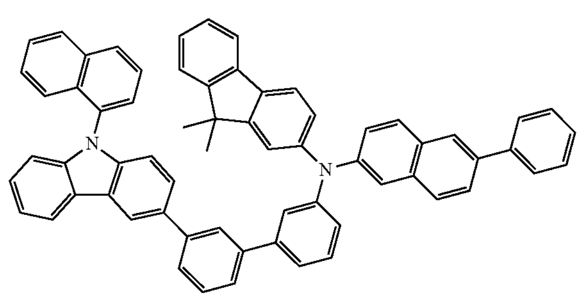

-continued
6-103
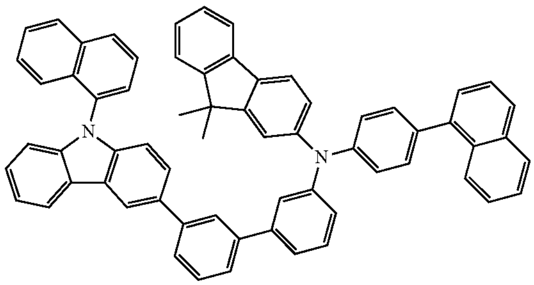
6-104
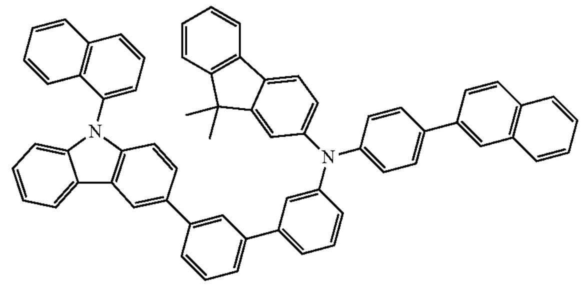
6-105
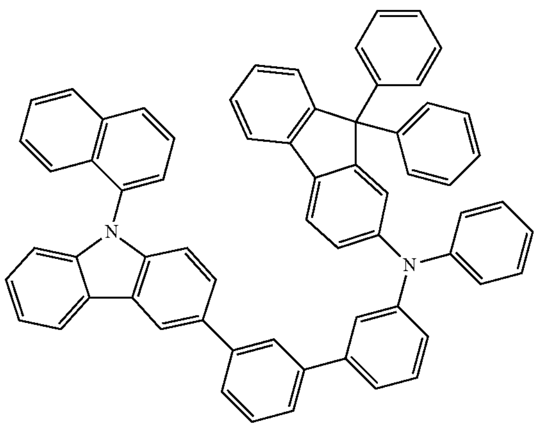
6-106
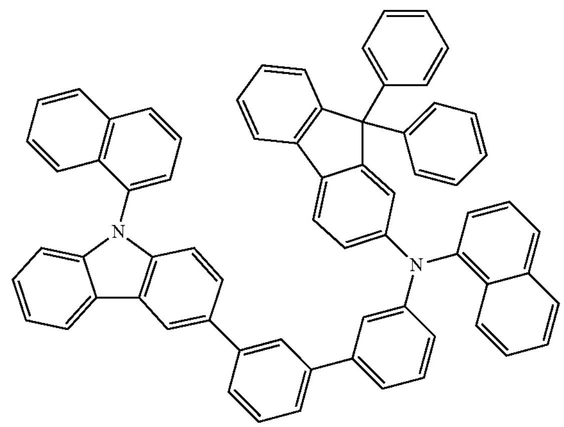
6-107
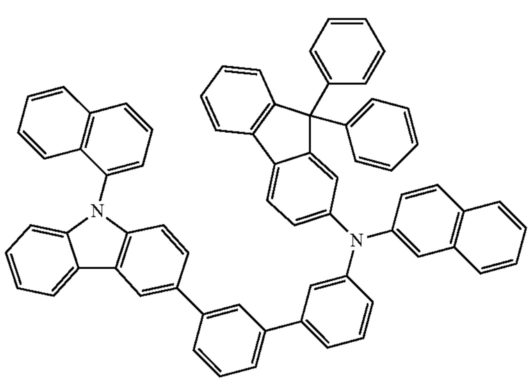
6-108
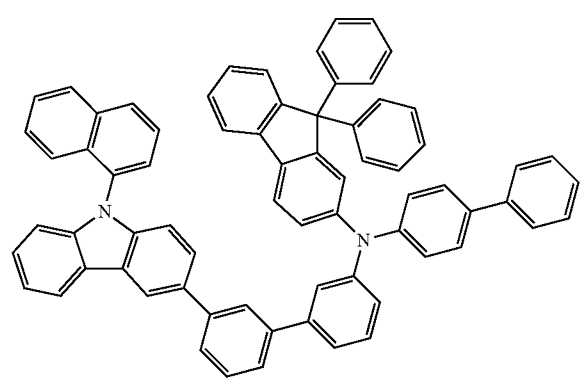
6-109
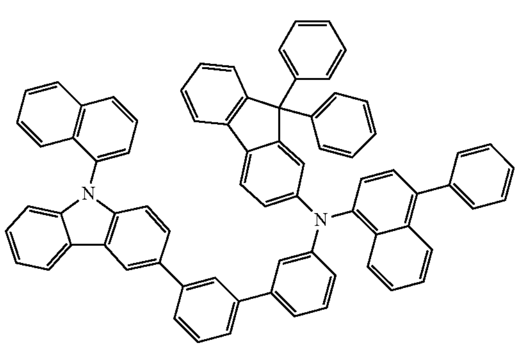
6-110
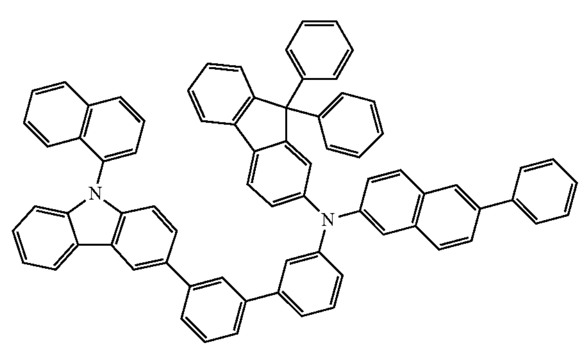

-continued
6-111
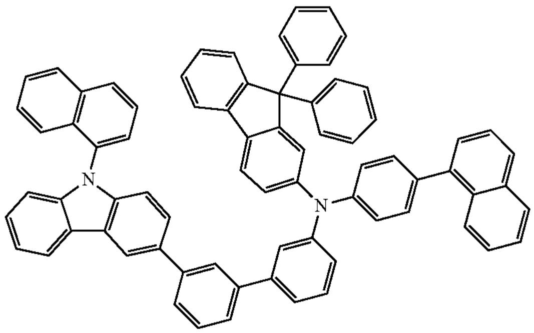
6-112
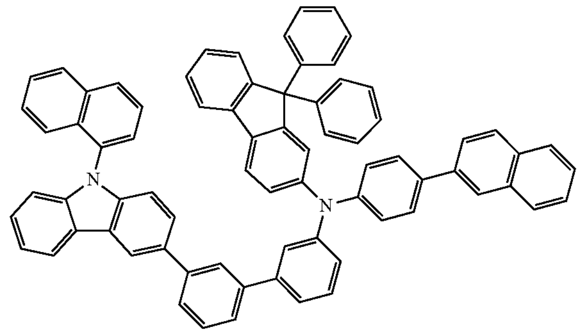
6-113
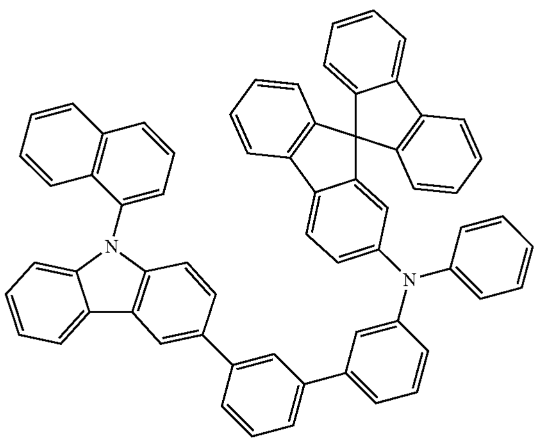
6-114
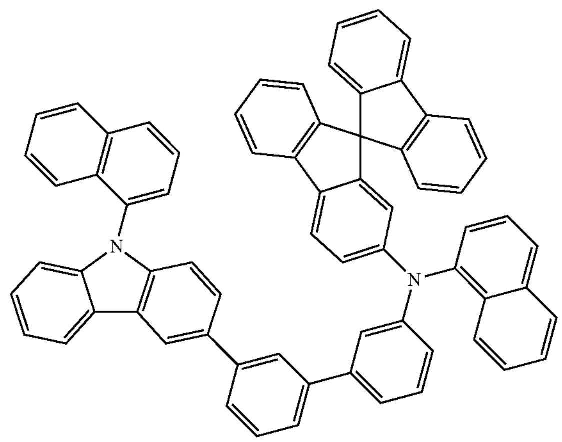
6-115
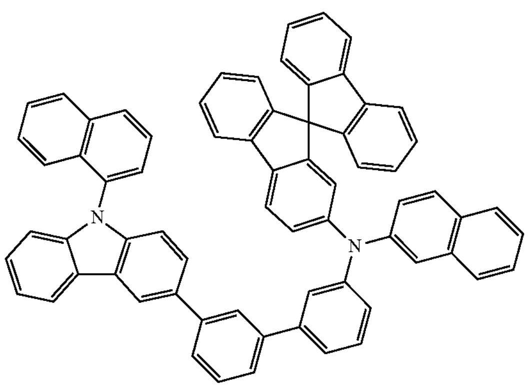
6-116
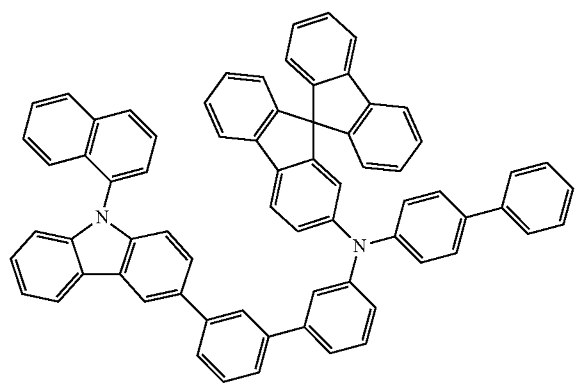
6-117
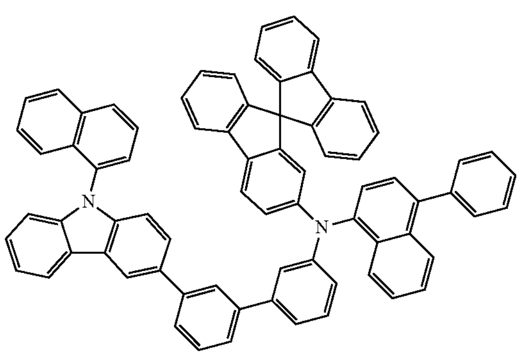
6-118
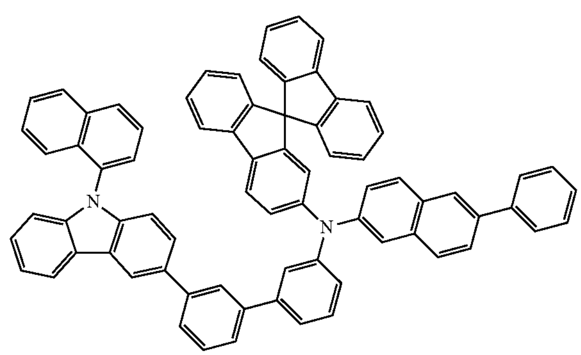

-continued
6-119
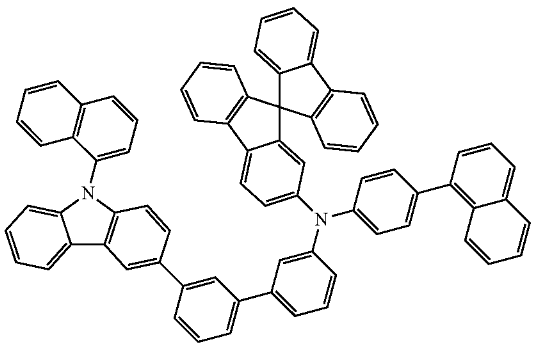
6-120
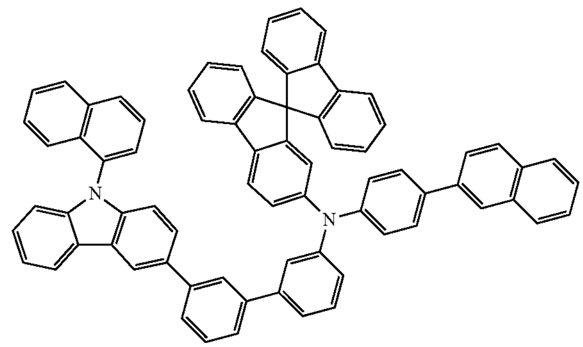
6-121
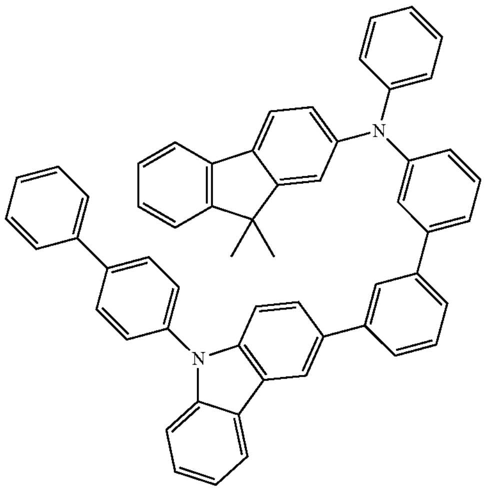
6-122
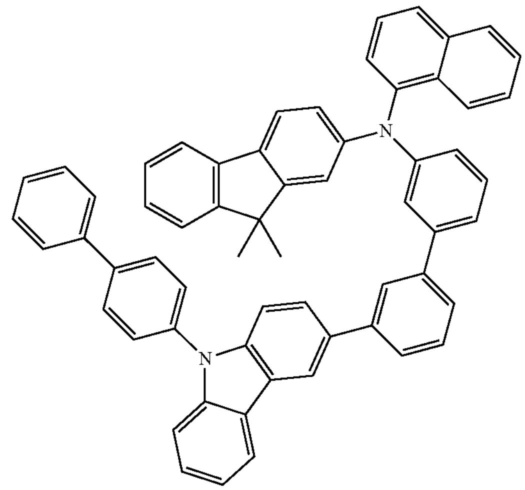
6-123
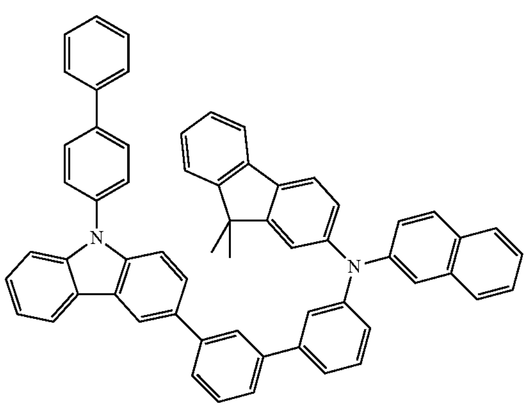
6-124
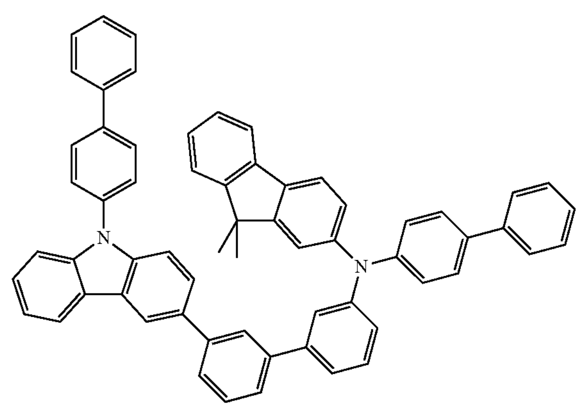
6-125
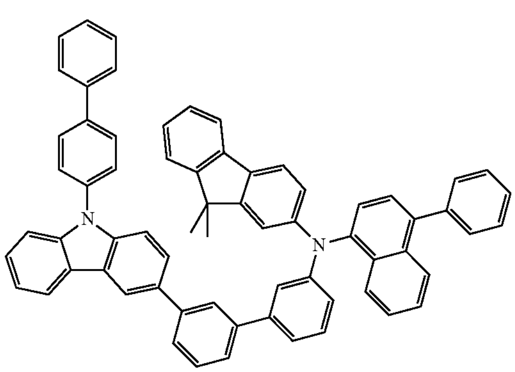
6-126
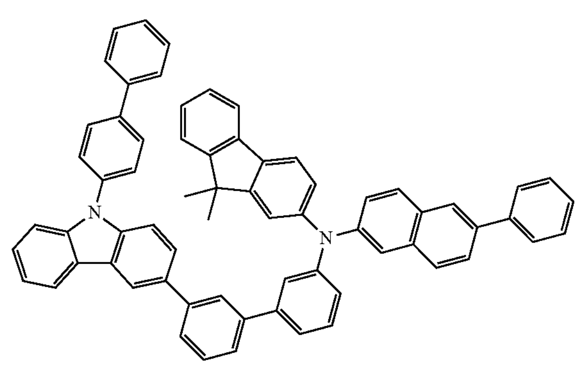

-continued
6-127
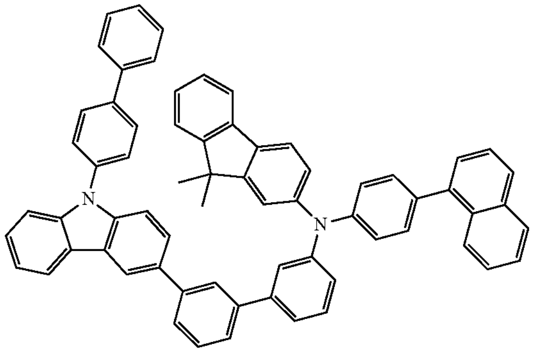
6-128
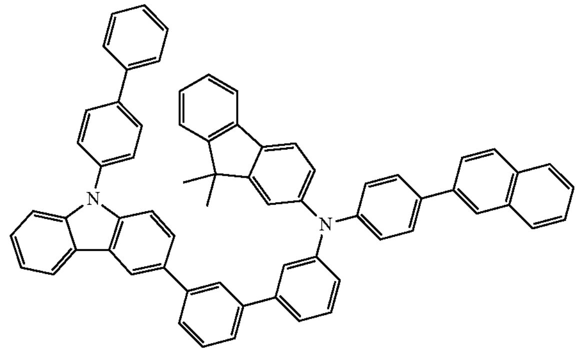
6-129
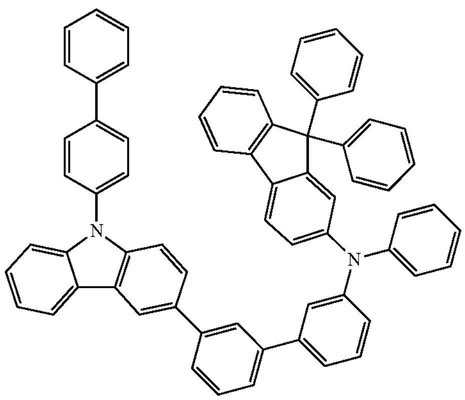
6-130
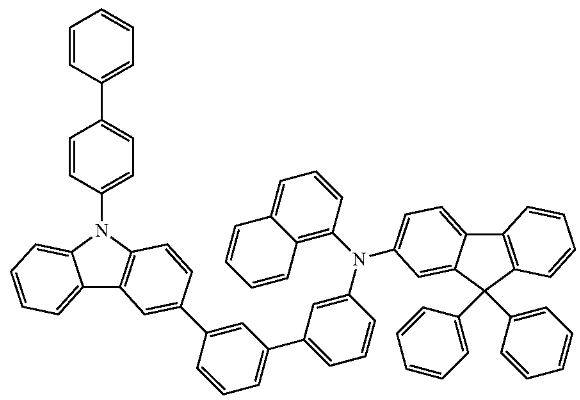
6-131
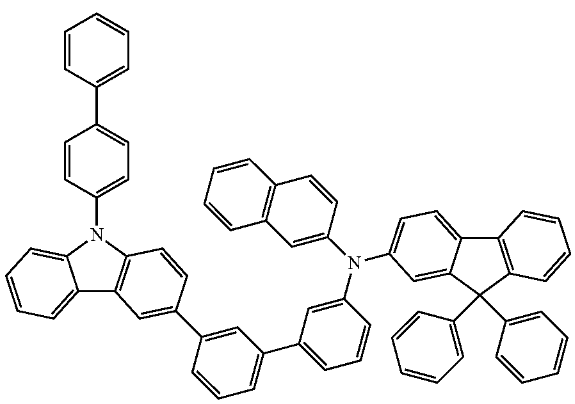
6-132
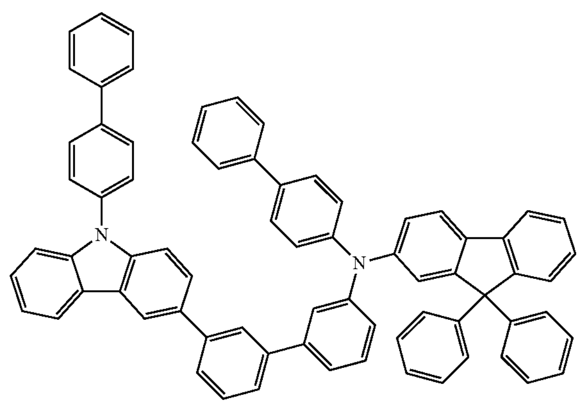
6-133
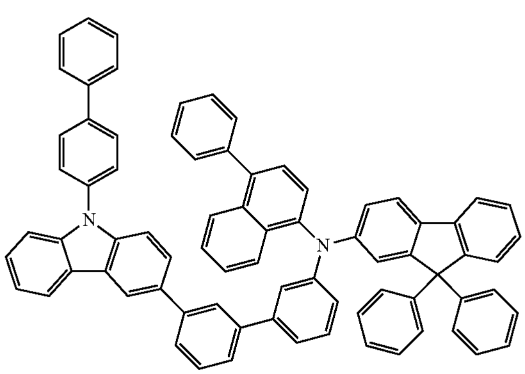
6-134
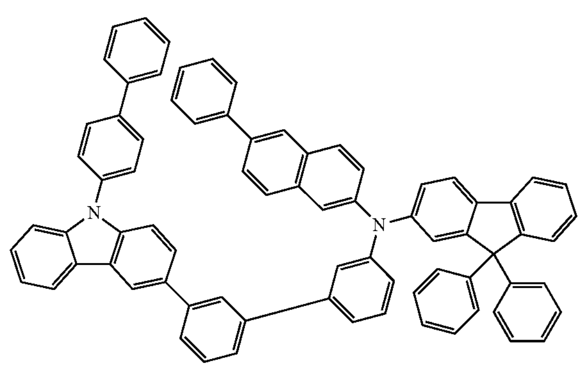

-continued
6-135
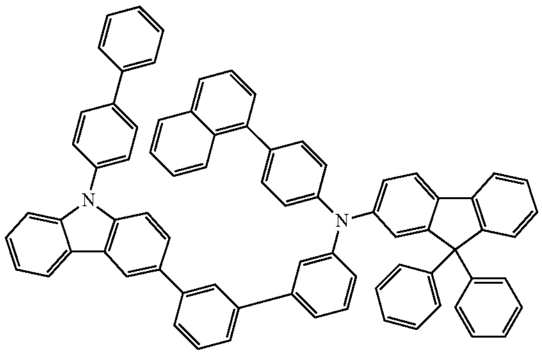
6-136
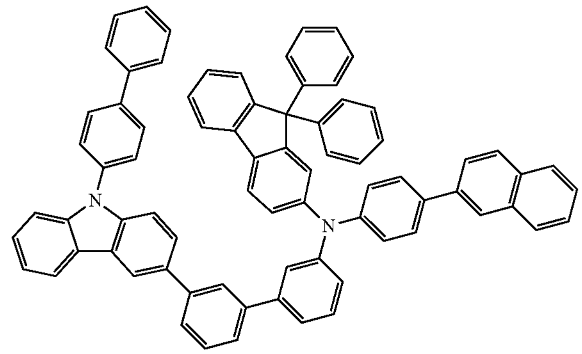
6-137
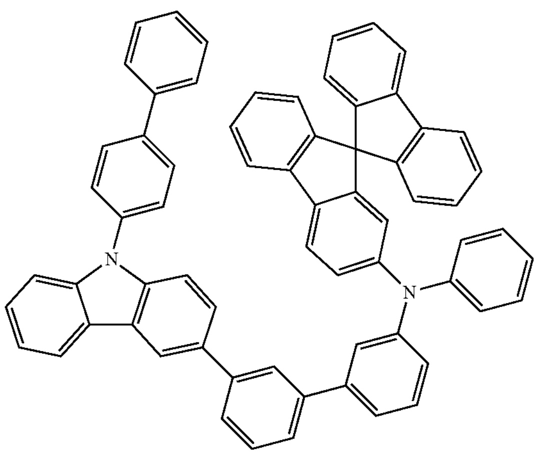
6-138
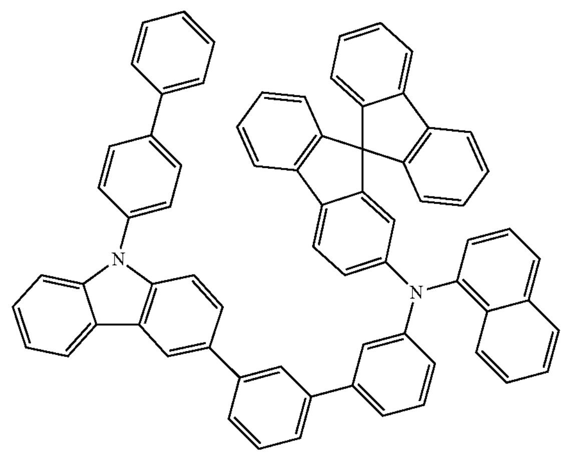
6-139
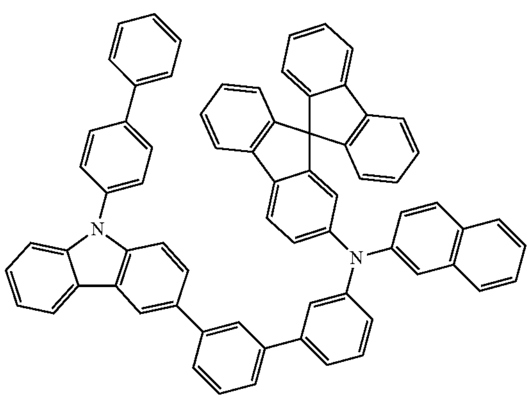
6-140
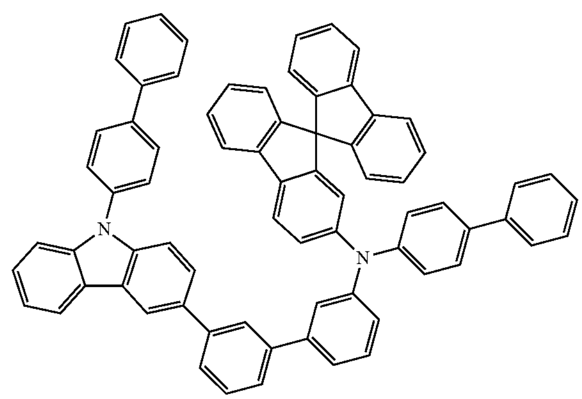
6-141
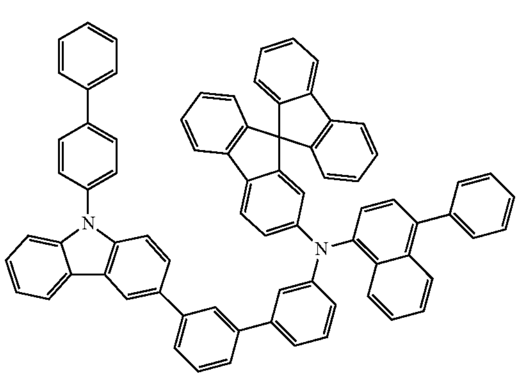
6-142
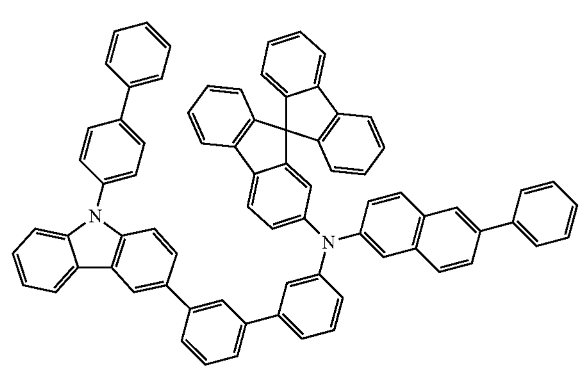

-continued 6-143

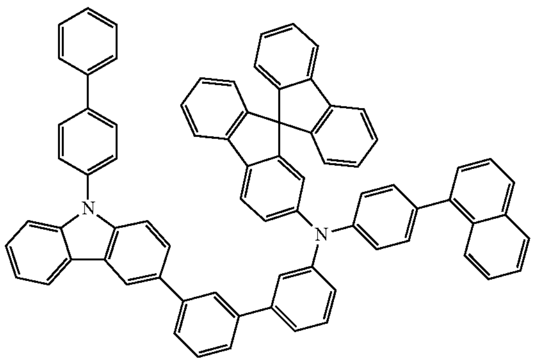

6-144

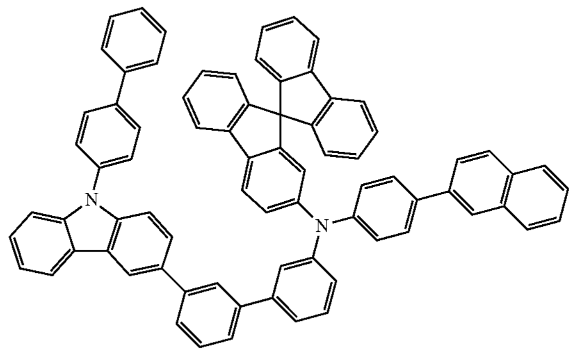

16. An organic light-emitting diode, comprising:

a first electrode;

a second electrode; and an organic layer between the first electrode and the second electrode, the organic layer comprising an emission layer comprising at least one light-emitting material represented by Formula 1 below, and a region between the first electrode and the emission layer comprising at least one hole transport material represented by one of Formulae 2d and 2e below:

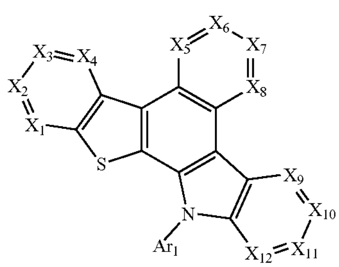

wherein, in Formulae 1, 2d and 2e, $X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; is $CR_7$ or N; $X_8$ is $CR_8$ or N; $X_9$ is $CR_9$ or N; $X_{10}$ is $CR_{10}$ or N; is $CR_{11}$ or N; $X_{12}$ is $CR_{12}$ or N;

$R_1$ to $R_{12}$ are each independently selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-Carylthio group, and a substituted or unsubstituted $C_2$-$C_{60}$heteroaryl group;

$Ar_1$is selected from:

a spiro-fluorenyl group, a quinolinyl group, an isoquinolinyl group, a naphthyridinyl group, a quinazolinyl group, and a phenyl substituted with a quinazolinyl group;

a spiro-fluorenyl group, a quinolinyl group, an isoquinolinyl group, a naphthyridinyl group, a quinazolinyl group, and a phenyl substituted with a quinazolinyl group, each substituted with at least one selected from:

a deuterium atom, —F, a cyano group, a nitro group, —N($Q_1$)($Q_2$) (where $Q_1$ and $Q_2$ are each independently selected from a phenyl group and a naphthyl group), a methyl group, an ethyl group, a n-propyl group, an iso-propyl group, a n-butyl group, a sec-butyl group, an iso-butyl group, and a t-butyl group, a phenyl group, a naphthyl group, a fluorenyl group, a phenanthrenyl group, a pyridyl group, a pyrimidyl group, a quinolinyl group, an isoquinolinyl group, a naphthyridinyl group, a quinazolinyl group, and a triazinyl group, and a spiro-fluorenyl group, a quinolinyl group, an isoquinolinyl group, a naphthyridinyl group, a quinazolinyl group, and a phenyl substituted with a quinazolinyl group, each substituted with at least one selected from a deuterium atom, —F, a cyano group, a nitro group, —N($Q_1$)($Q_2$) (where $Q_1$ and $Q_2$ are each independently selected from a phenyl group and a naphthyl group), a methyl group, an ethyl group, a n-propyl group, an iso-propyl group, a n-butyl group, a sec-butyl group, an iso-butyl group, a t-butyl group, a phenyl group, a naphthyl group, a fluorenyl group, a phenanthrenyl group, a pyridyl group, a pyrimidyl group, a quinolinyl group, an isoquinolinyl group, a naphthyridinyl group, a quinazolinyl group, and a triazinyl group;

$Ar_{11}$, and $Ar_{12}$ are each independently selected from a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, and a substituted or unsubstituted $C_2$-$C_{60}$heteroaryl group;

$Z_1$ to $Z_4$, and $Z_{11}$ to $Z_{24}$ are each independently selected from:

a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, and $C_1$-$C_{60}$alkoxy group, a $C_1$-$C_{60}$alkyl group, a $C_2$-$C_{60}$alkenyl group, a $C_2$-$C_{60}$alkynyl group, and a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, and a $C_2$-$C_{60}$heteroaryl group, each substituted with at least one selected from a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, and a $C_2$-$C_{60}$heteroaryl group; and —$N(Q_{11})(Q_{12})$, —$Si(Q_{13})(Q_{14})(Q_{15})$ , and —$B(Q_{16})(Q_{17})$ , where $Q_{11}$ and $Q_{17}$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group; and p and q are each independently selected from an integer from 1 to 4.

17. The organic light-emitting diode of claim 16, wherein the light-emitting material is one of Compounds 1-1 to 1-7 and 1-9 to 1-11 below, and the hole transport material is one of Compounds 5-1 to 5-72, and 6-1 to 6-72:

[Compound 1-1]

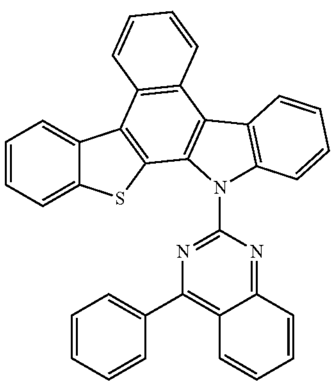

[Compound 1-2]

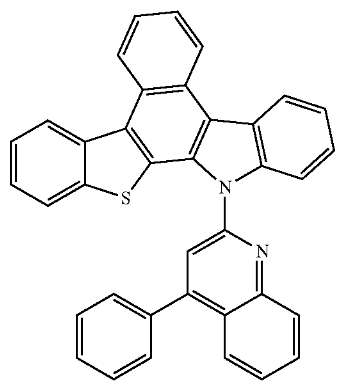

[Compound 1-3]

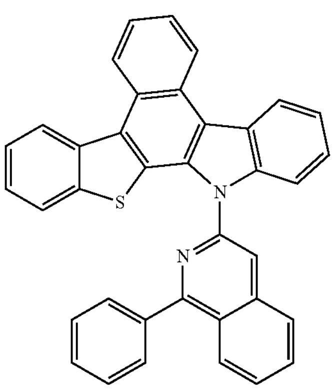

[Compound 1-4]

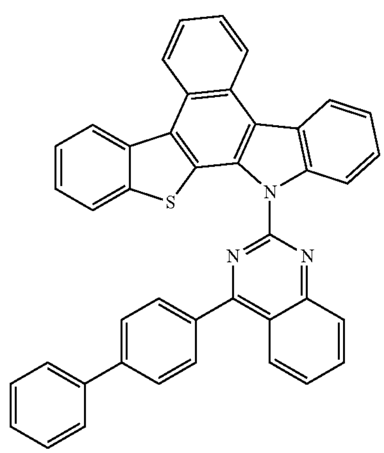

-continued
[Compound 1-5]
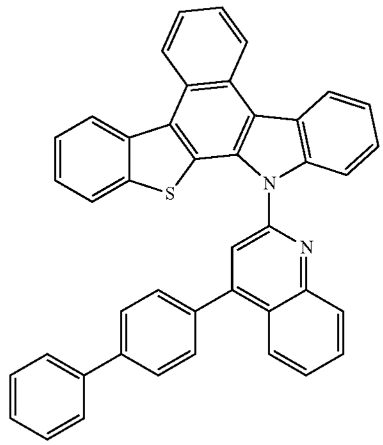
[Compound 1-6]
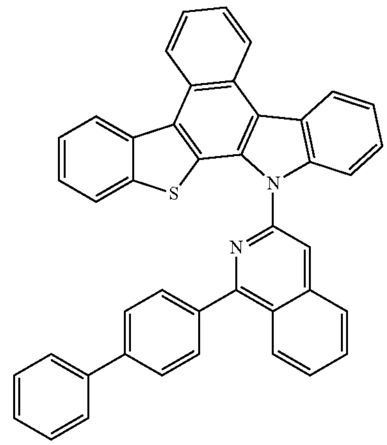
[Compound 1-7]
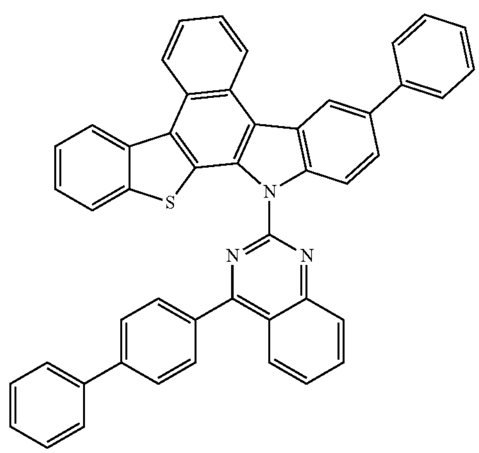
[Compound 1-9]
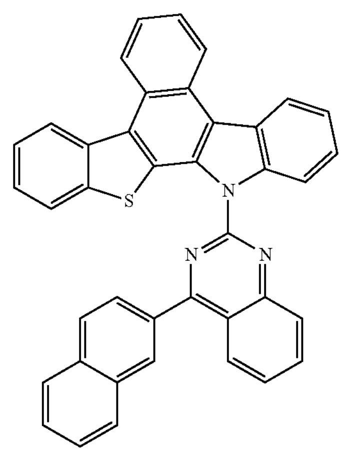
[Compound 1-10]
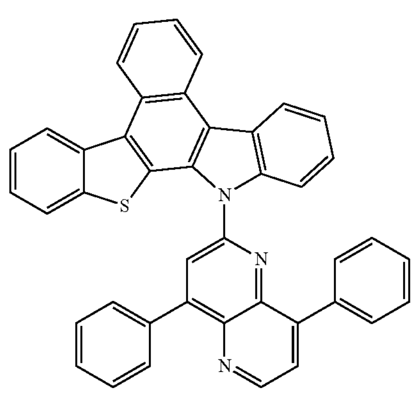
[Compound 1-11]
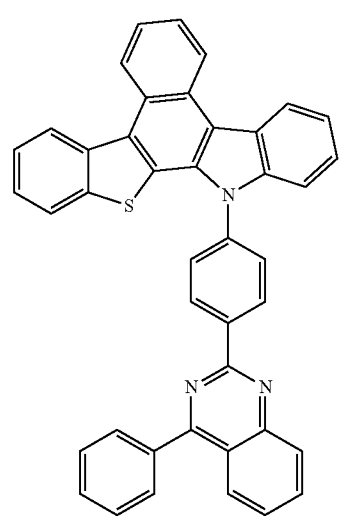

-continued
5-1
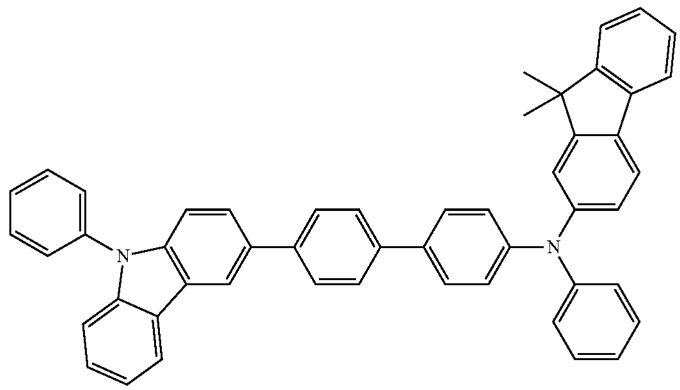
5-2
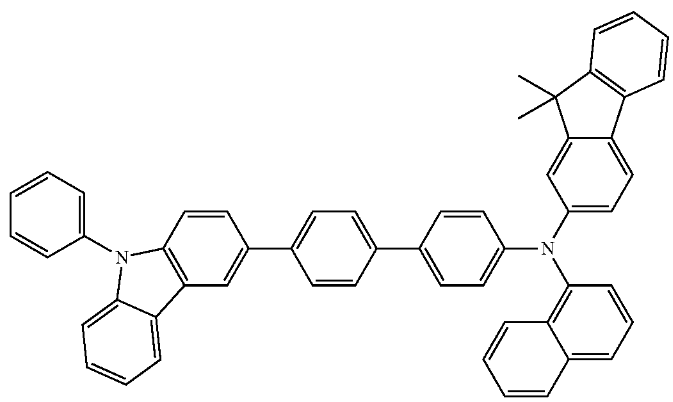
5-3
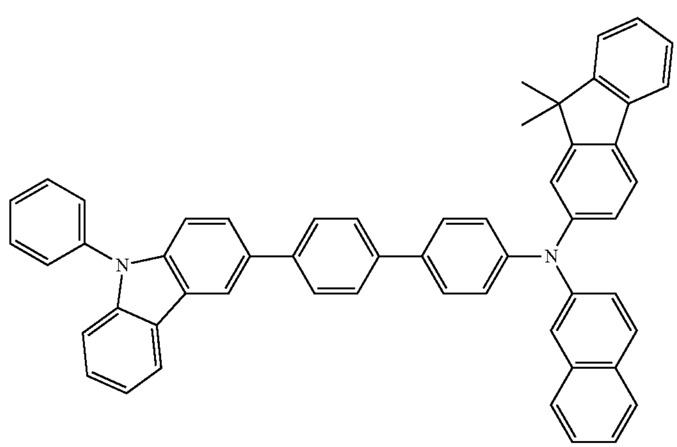

-continued
5-4
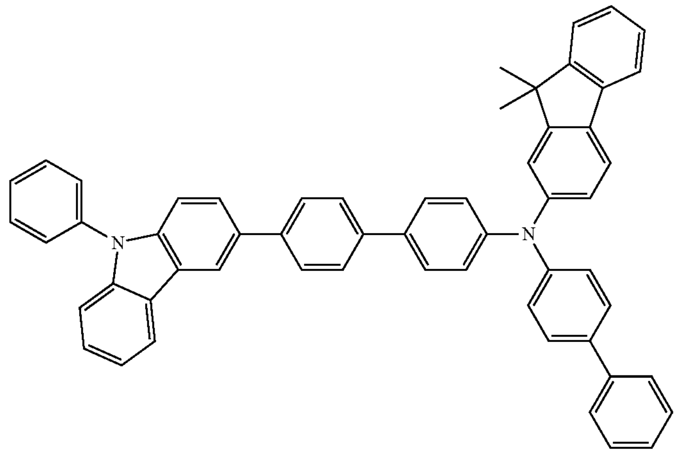
5-2
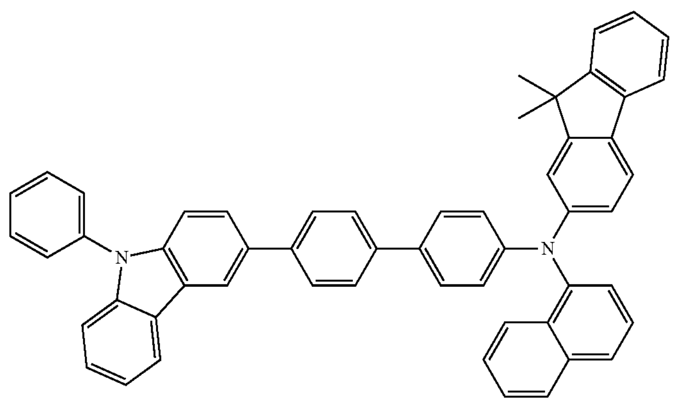
5-5
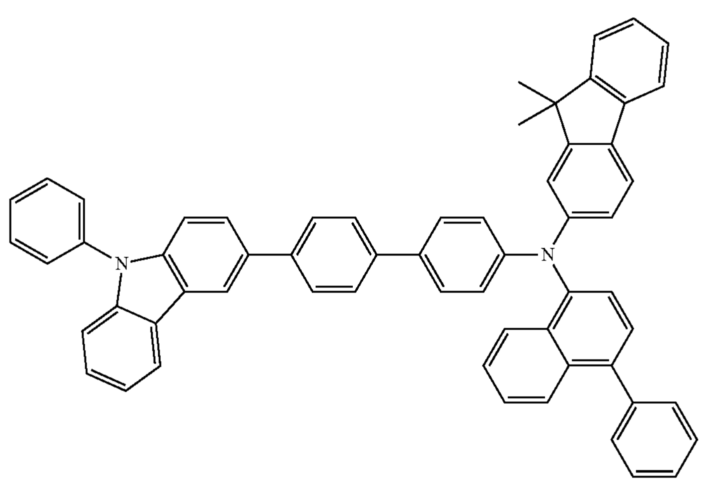

-continued
5-6
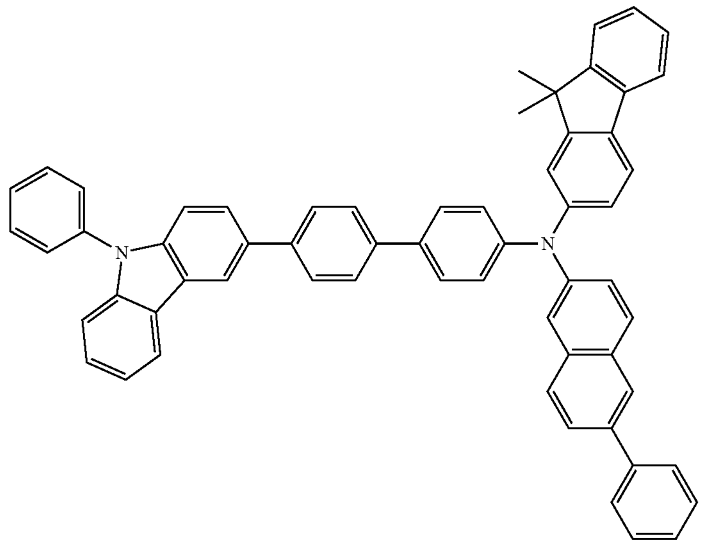
5-7
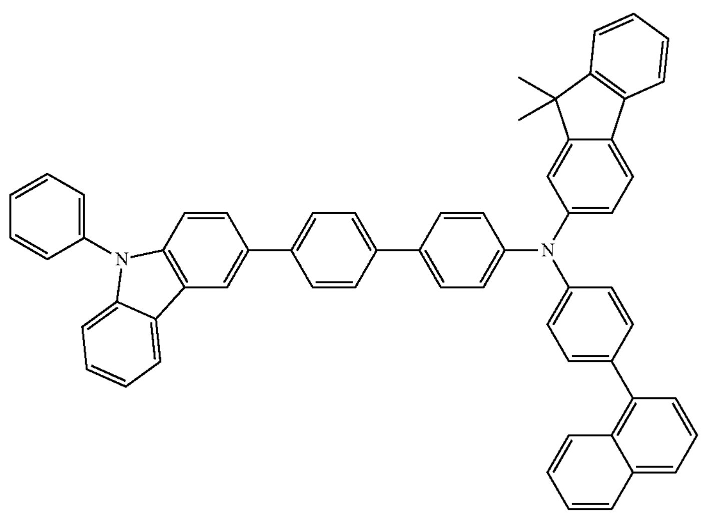
5-8
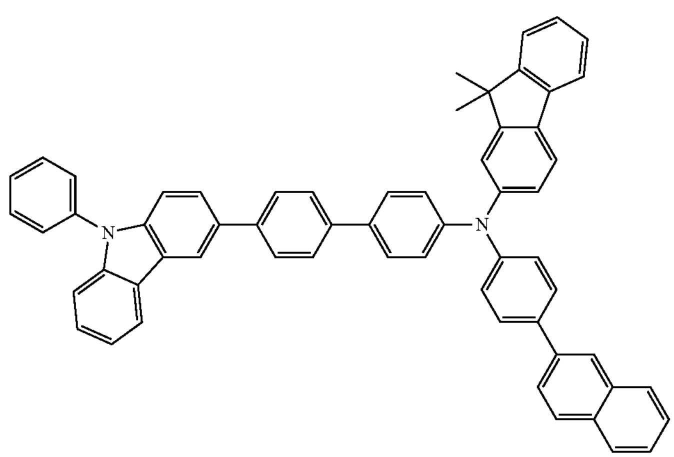

-continued
5-9
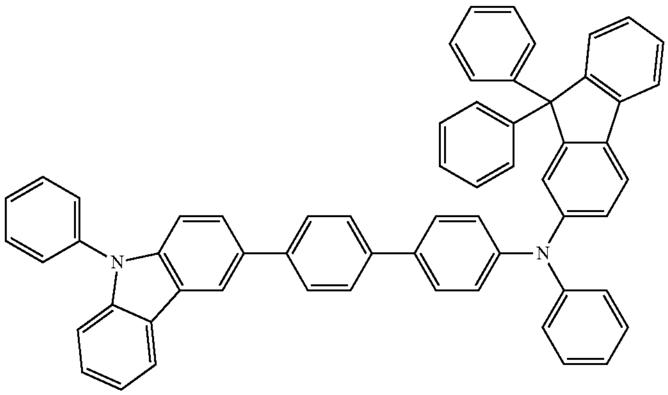
5-10
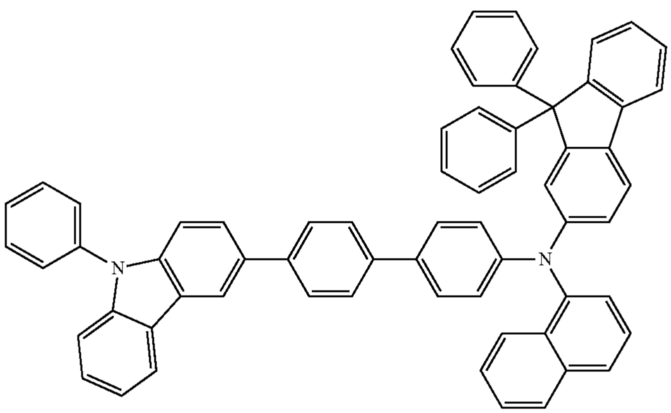
5-11
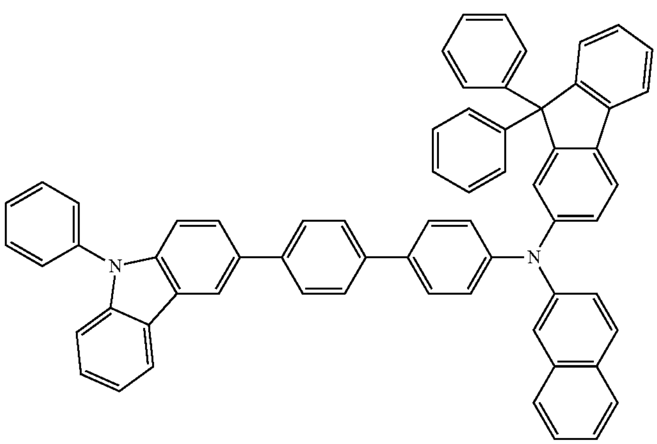

-continued
5-12
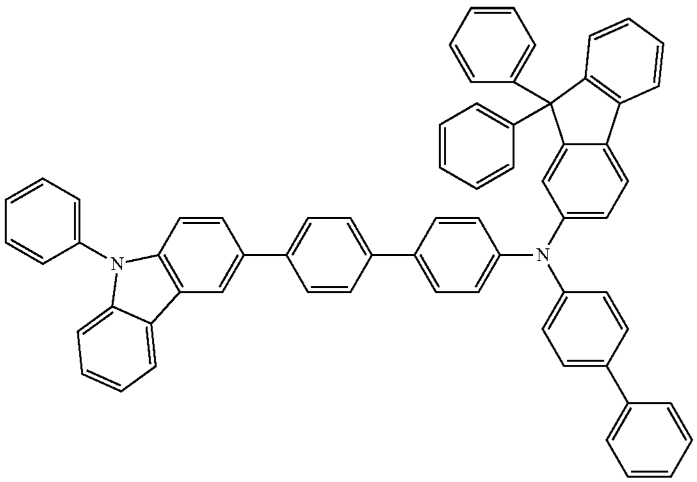
5-13
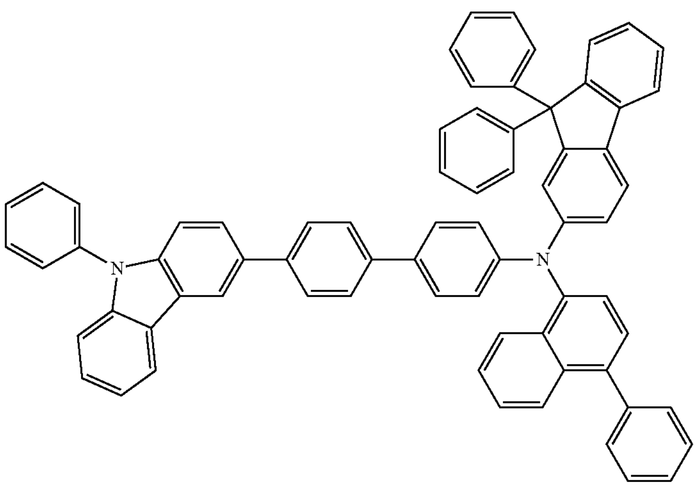
5-14
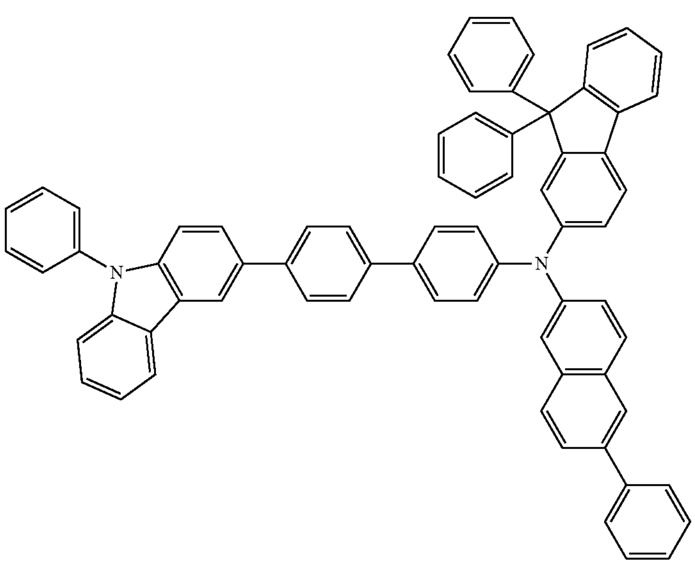

-continued
5-15
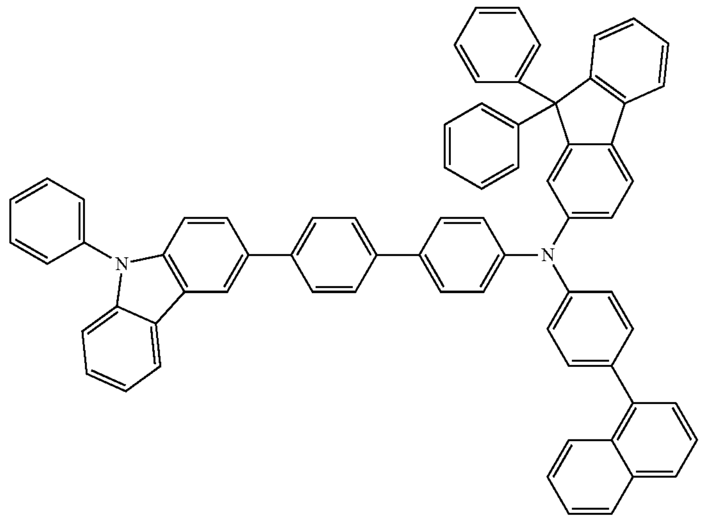
5-16
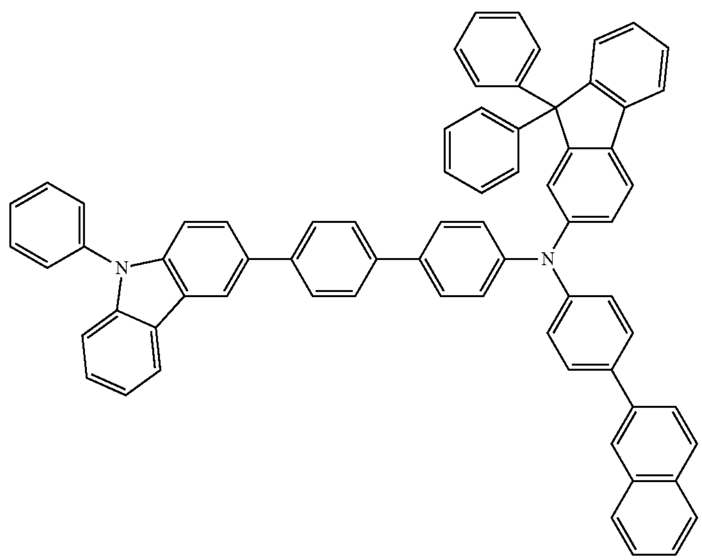
5-17
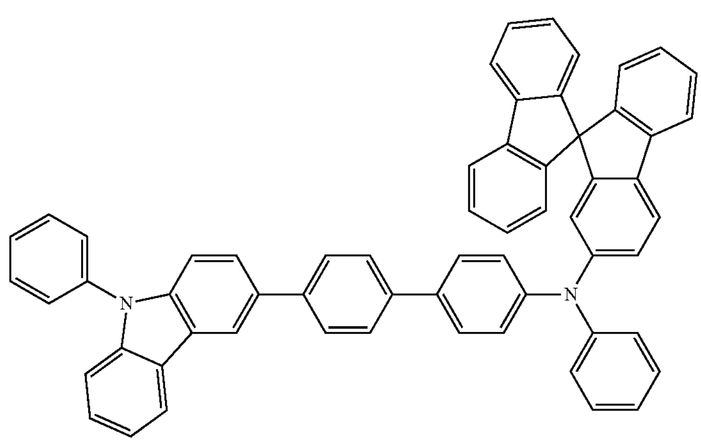

-continued
5-18
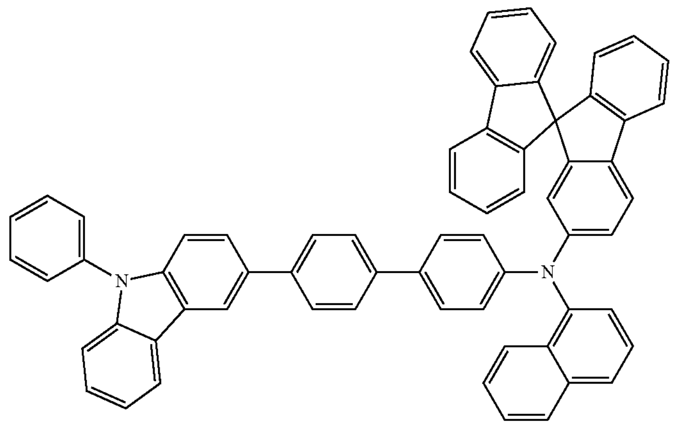
5-19
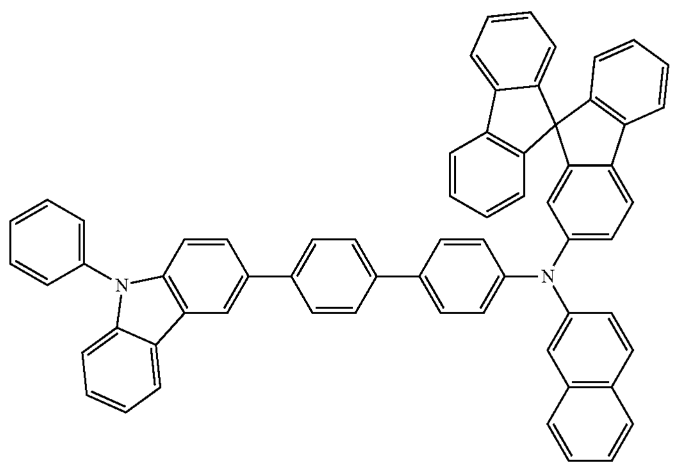
5-20
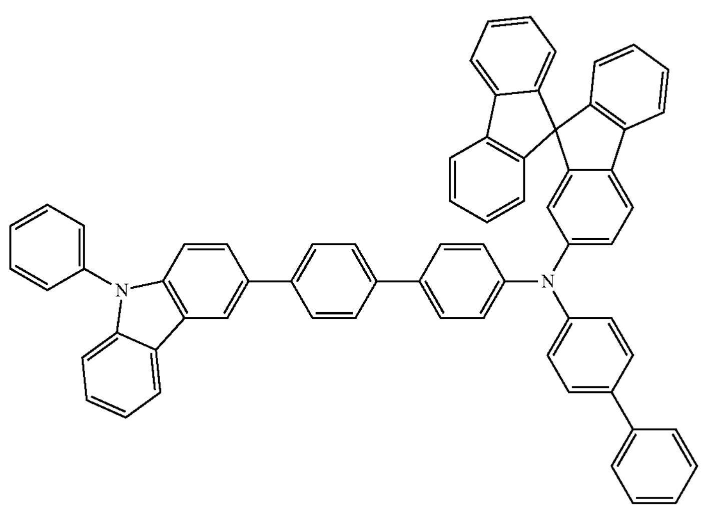

-continued
5-21
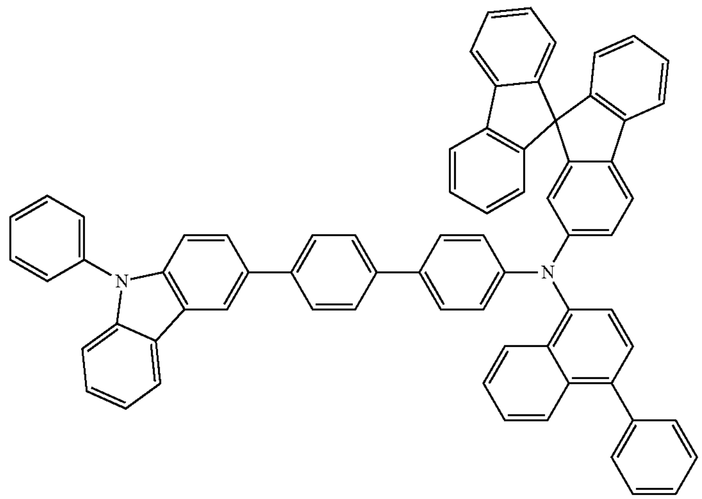
5-22
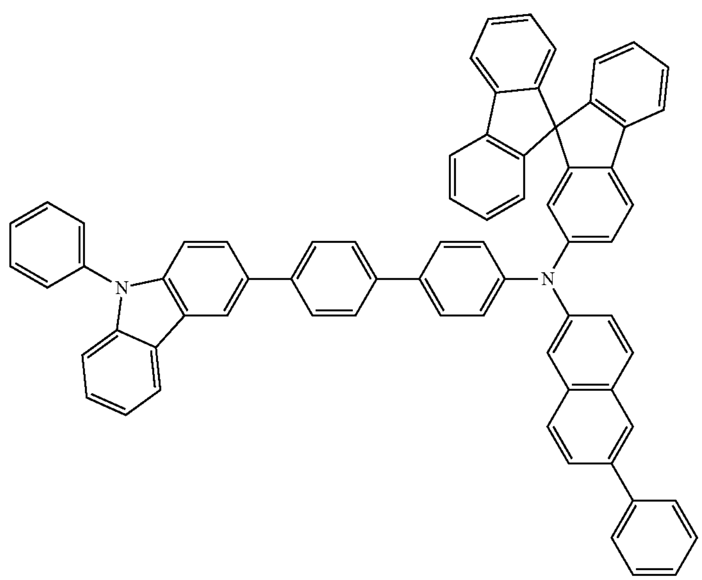
5-23
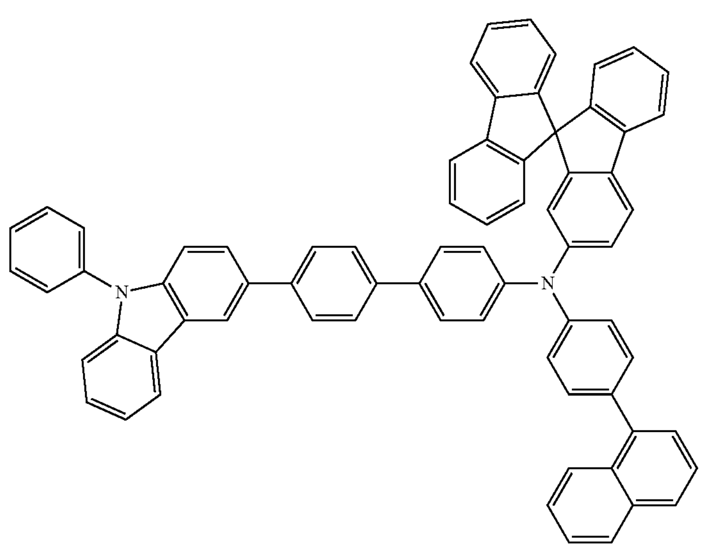

-continued
5-24
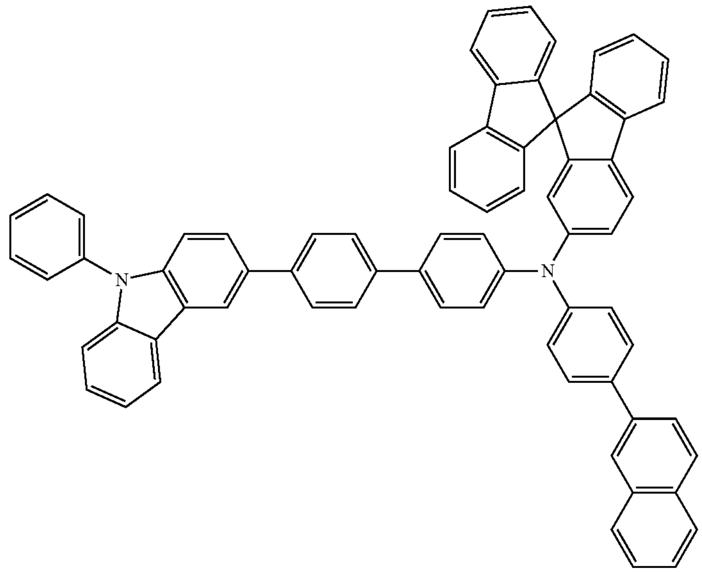
5-25
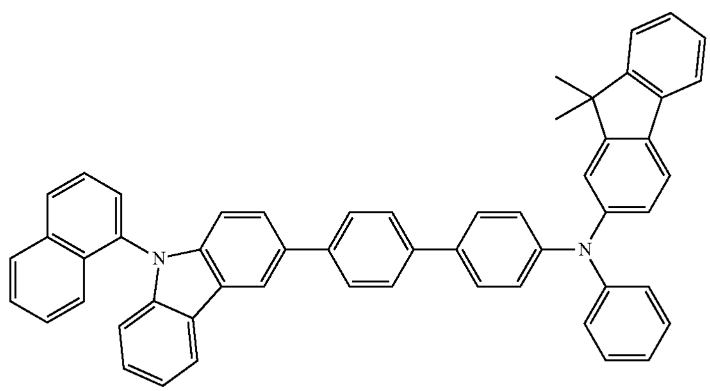
5-26
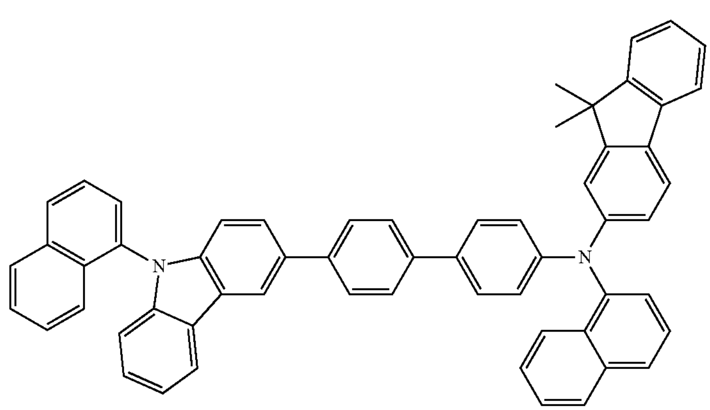

-continued
5-27
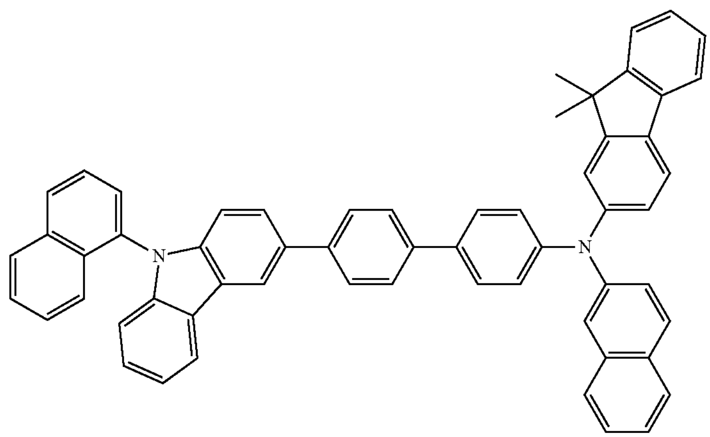
5-28
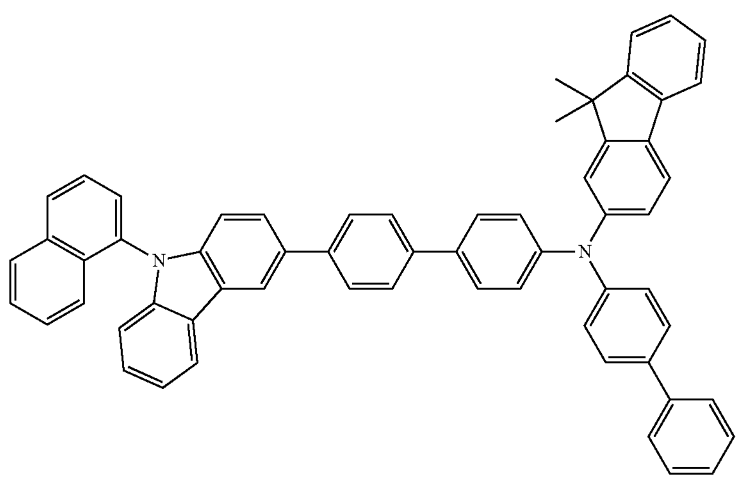
5-29
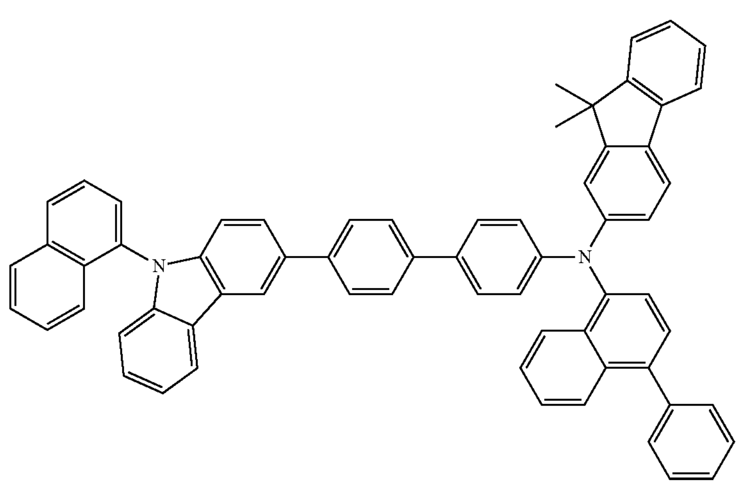

-continued
5-30
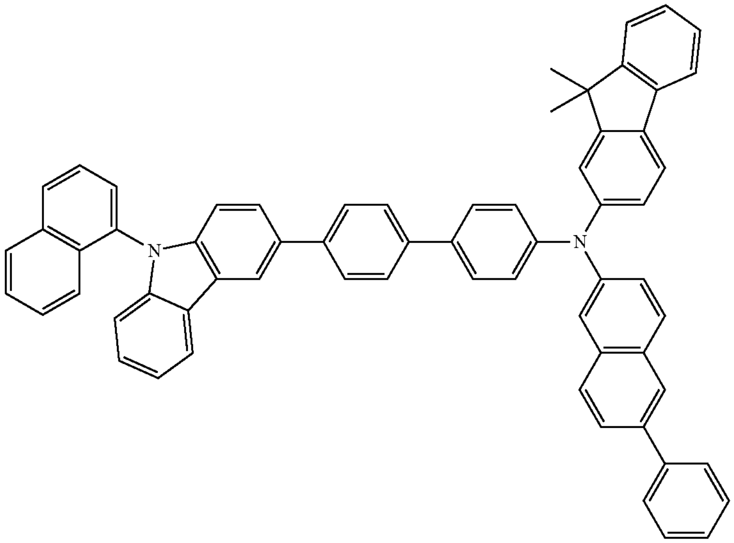
5-31
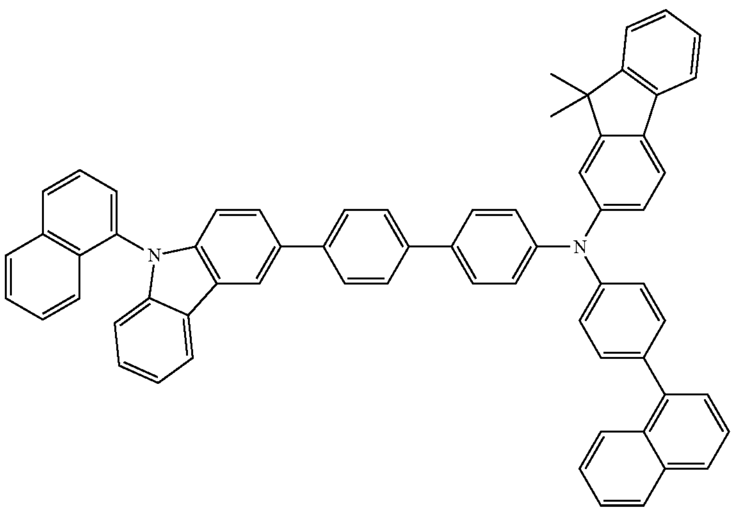
5-32
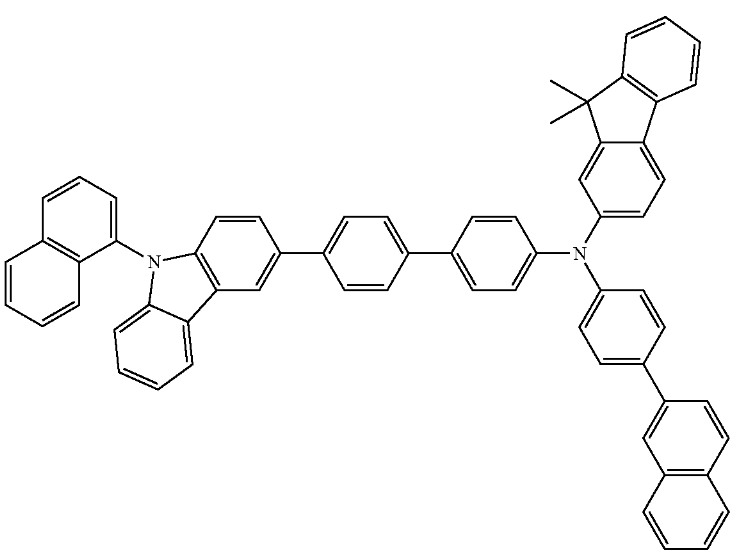

-continued
5-33
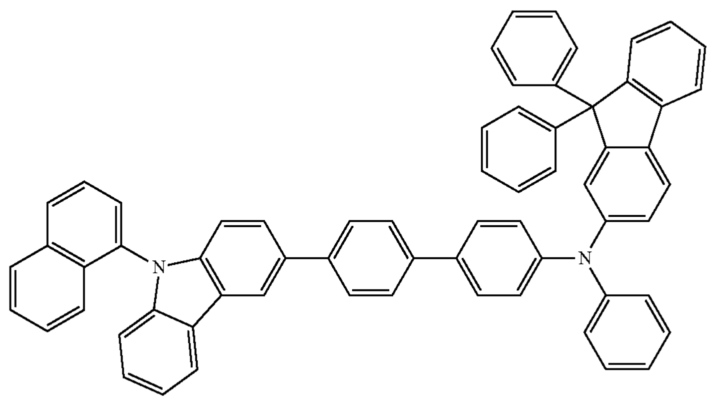
5-34
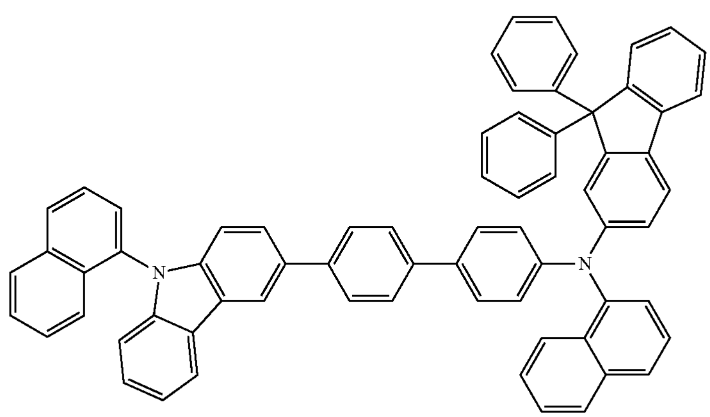
5-35
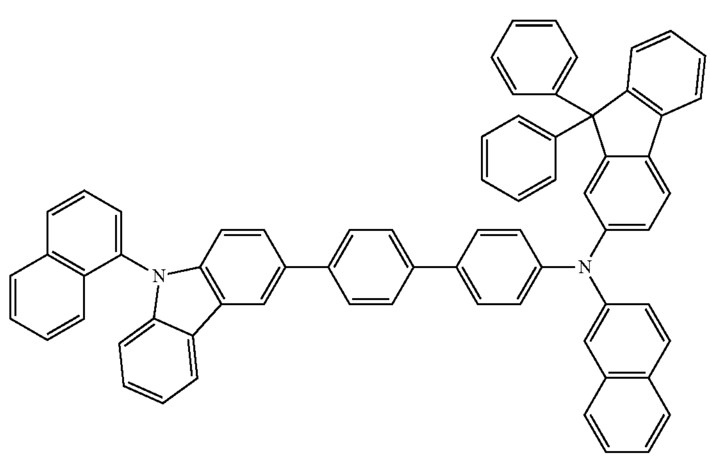

-continued
5-36
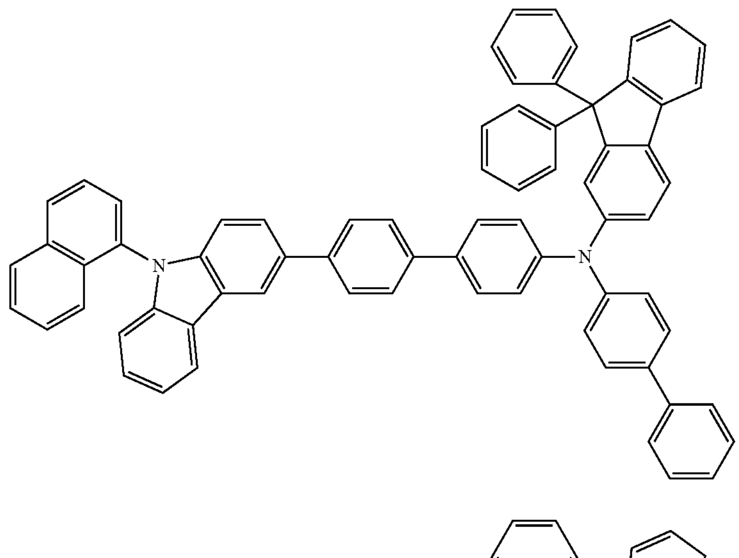
5-37
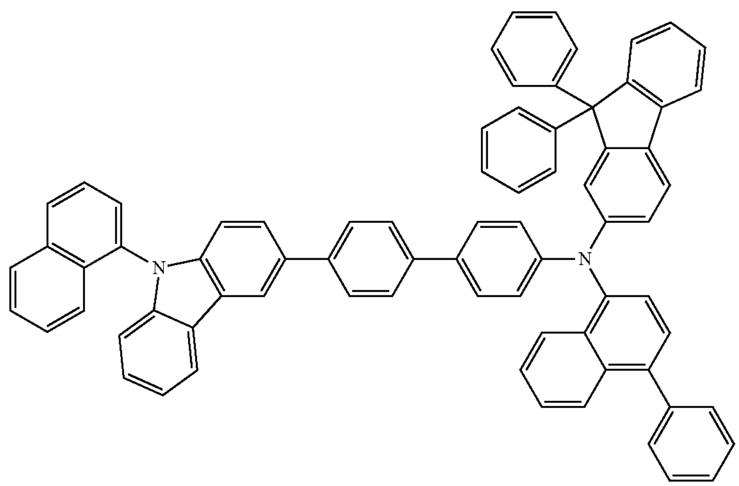
5-38
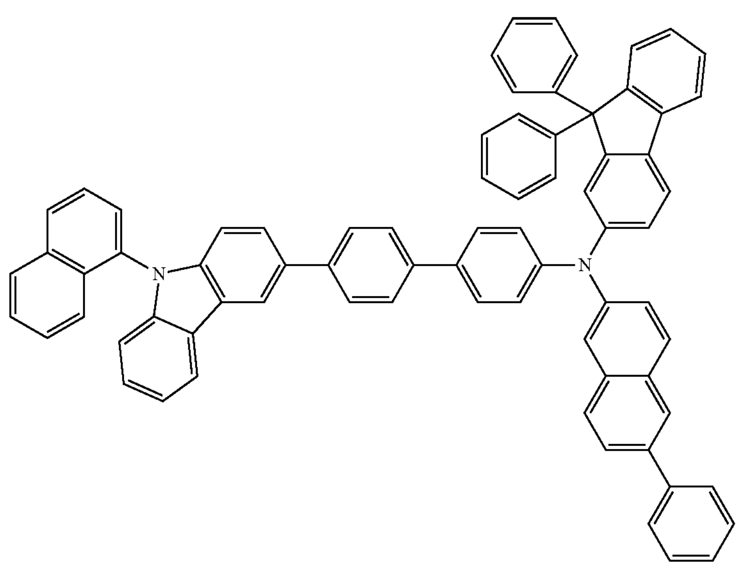

-continued
5-39
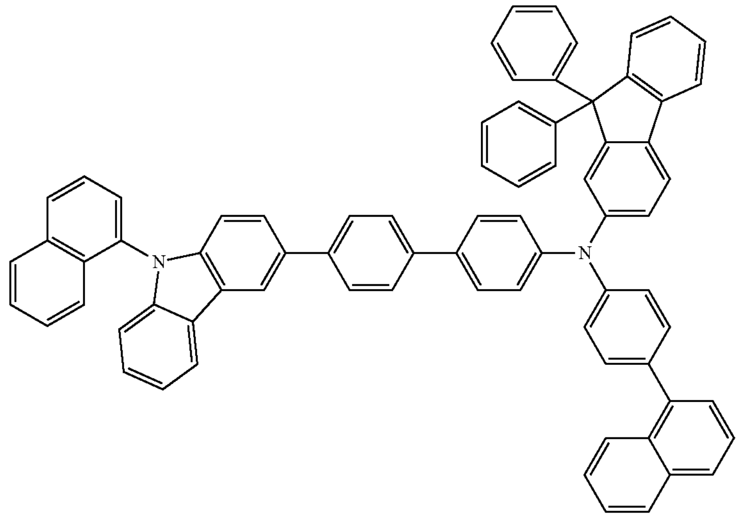
5-40
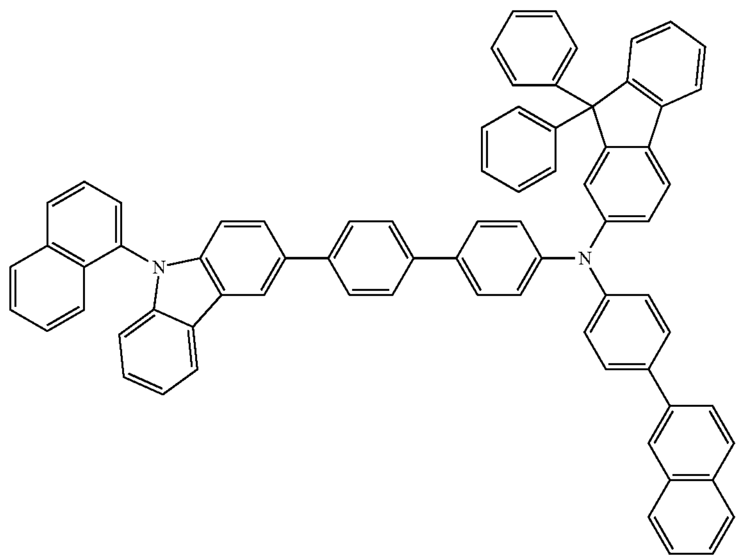
5-41
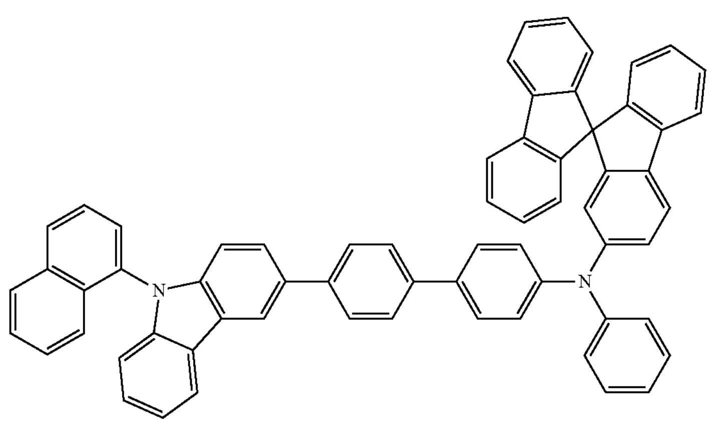

-continued
5-42
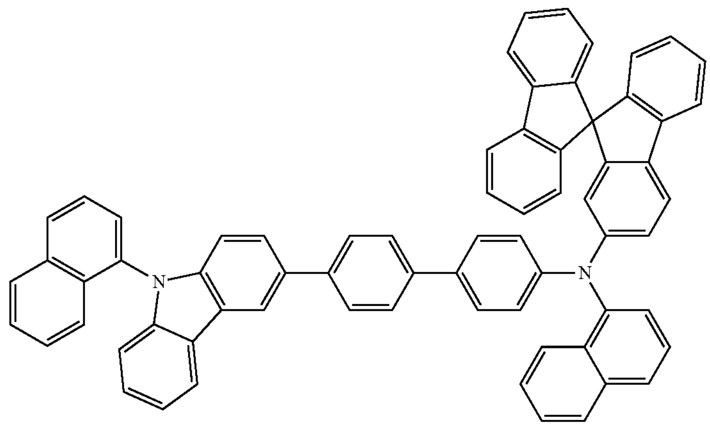
5-43
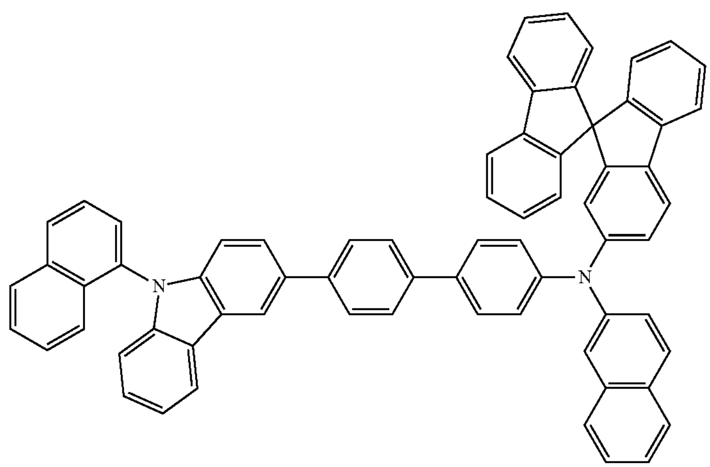
5-44
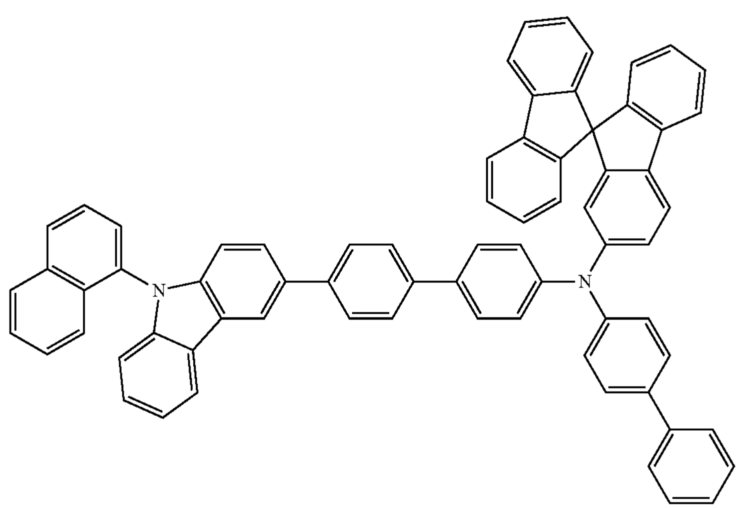

-continued
5-45
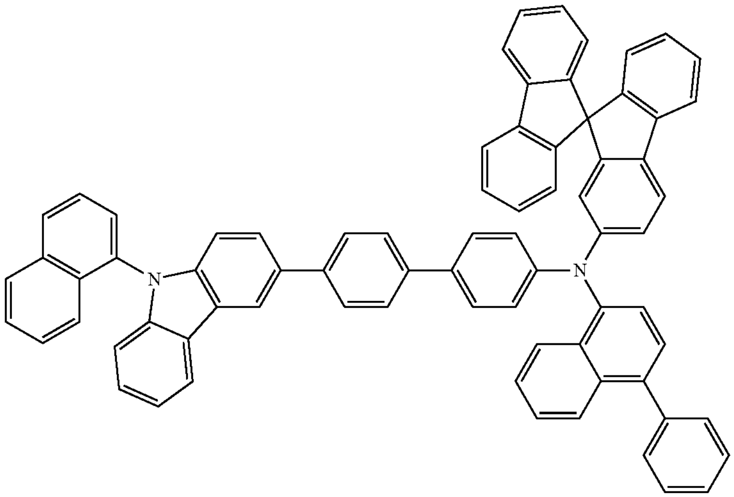
5-46
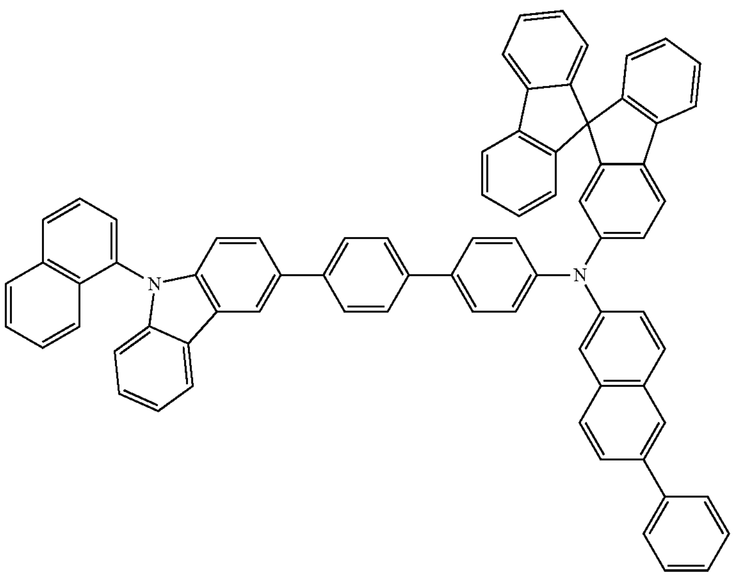
5-47
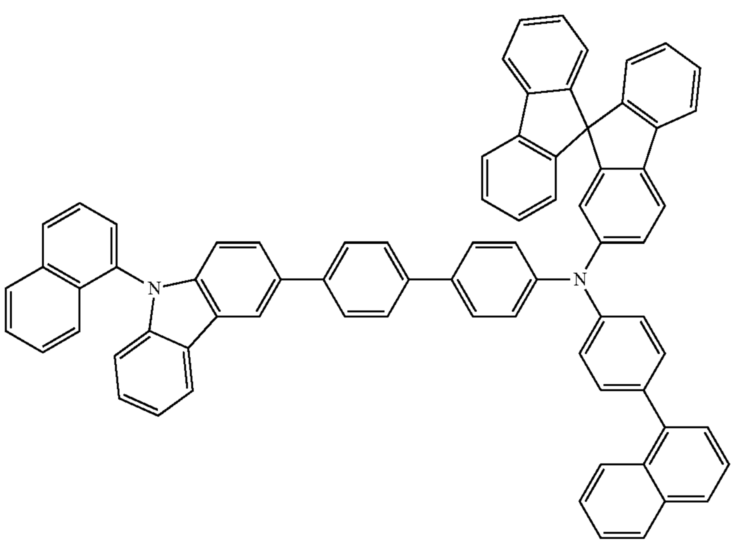

-continued
5-48
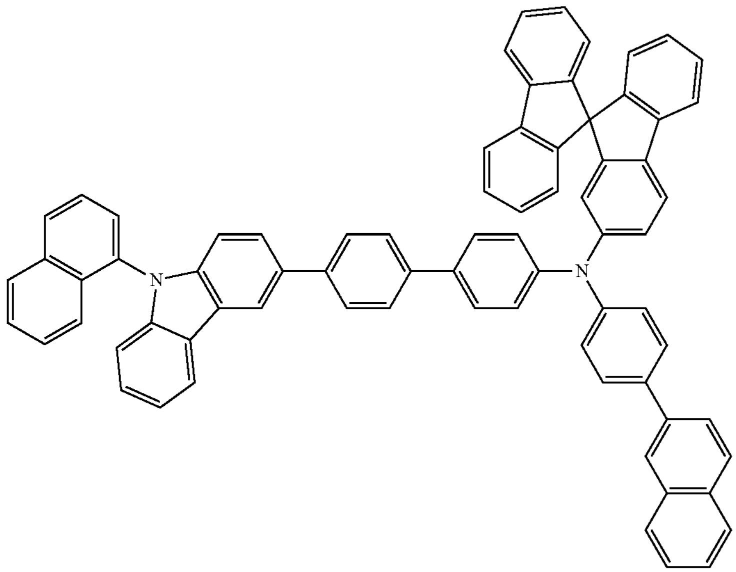
5-49
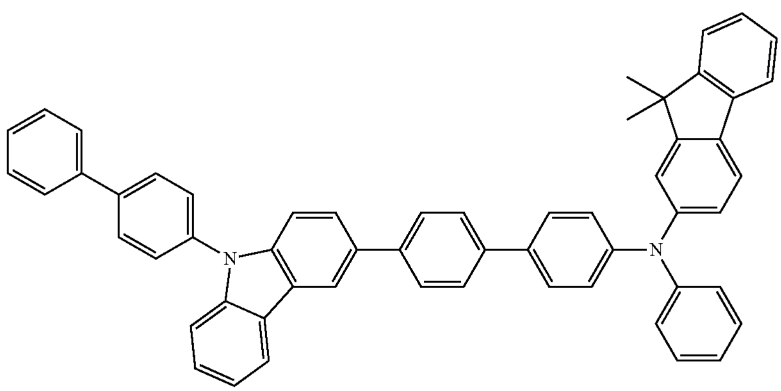
5-50
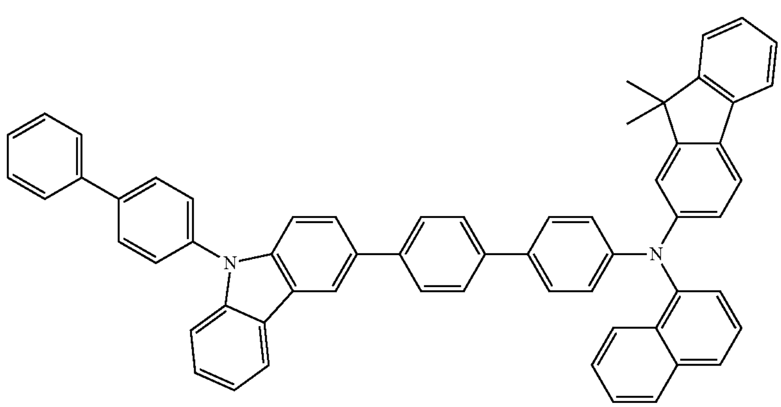

-continued
5-51
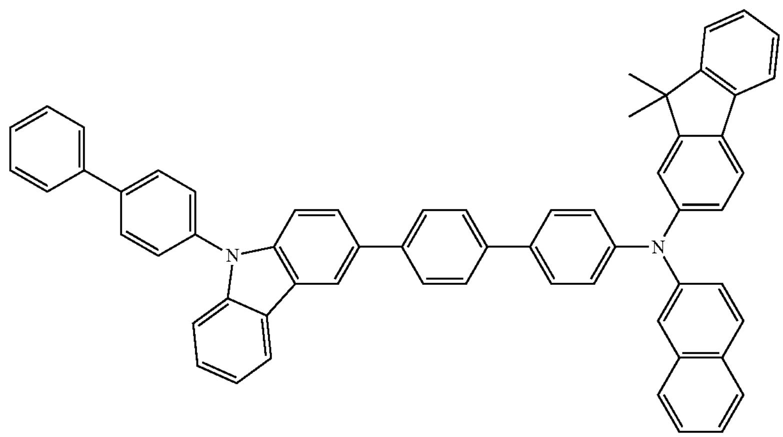
5-52
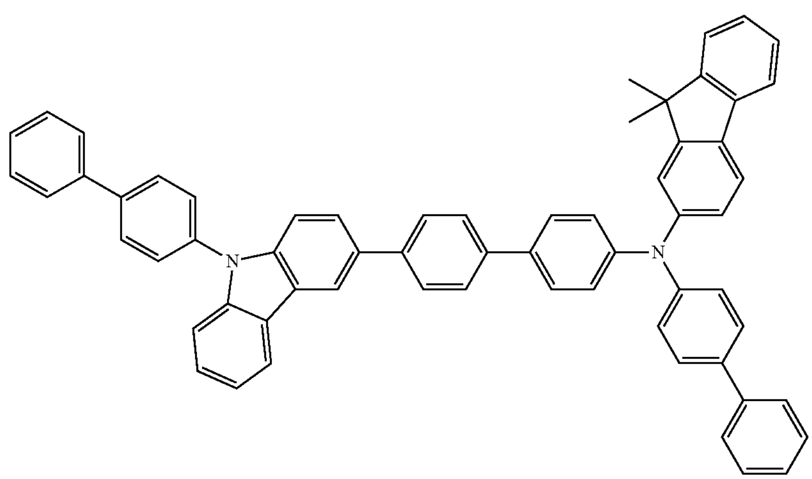
5-53
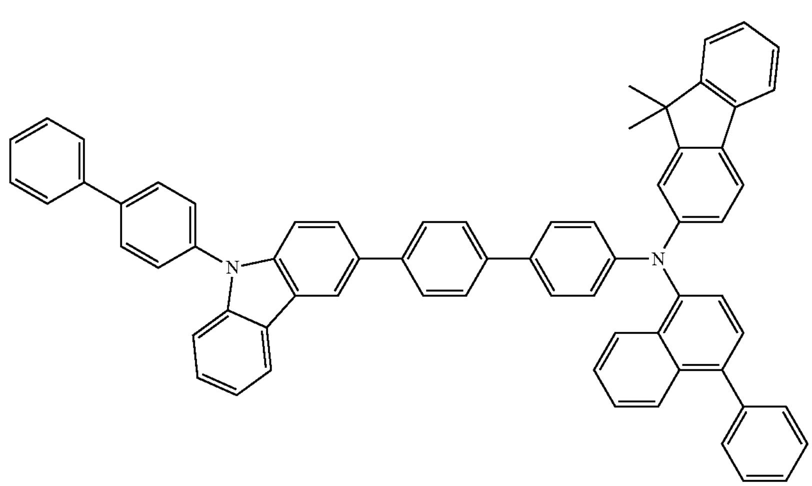

-continued
5-54
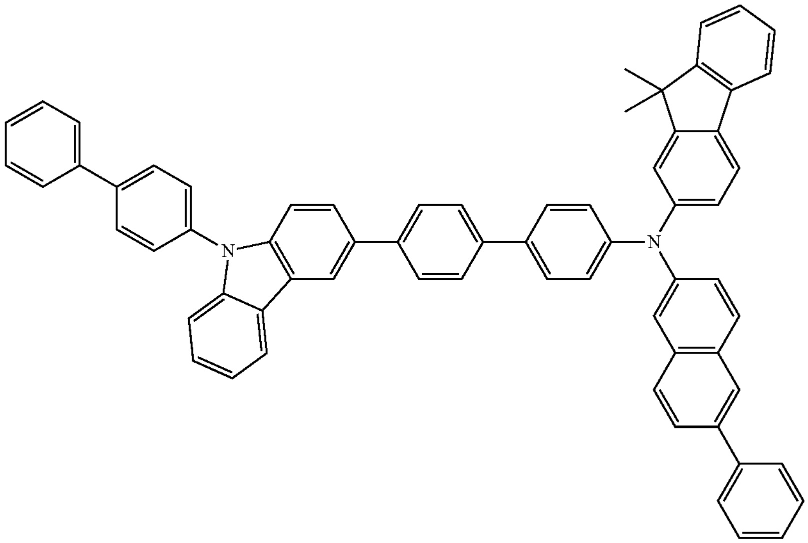
5-55
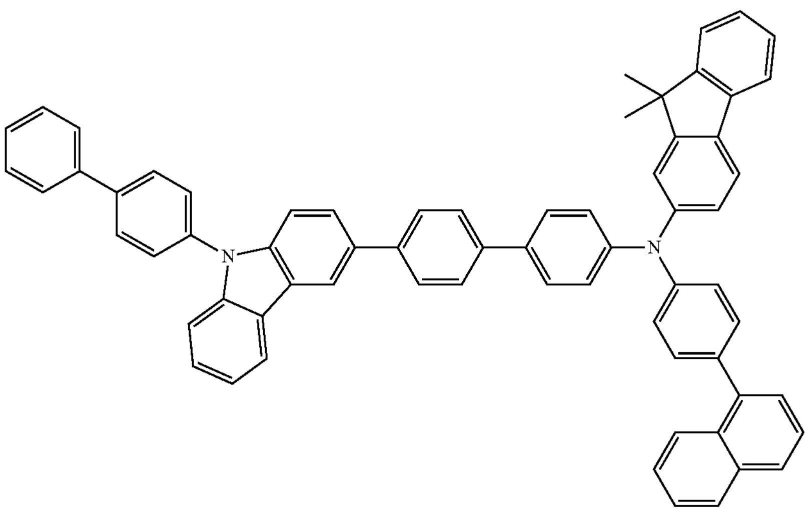
5-56
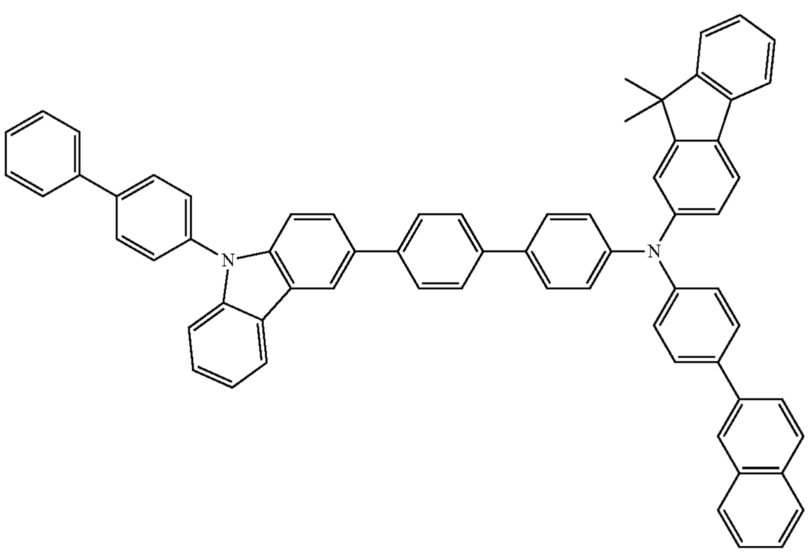

-continued
5-57
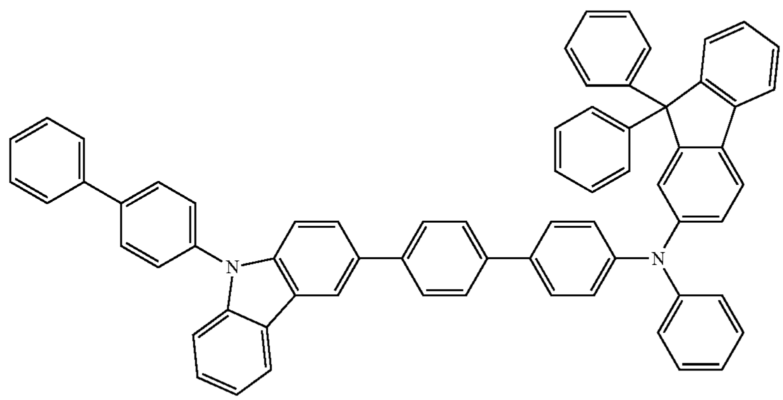
5-58
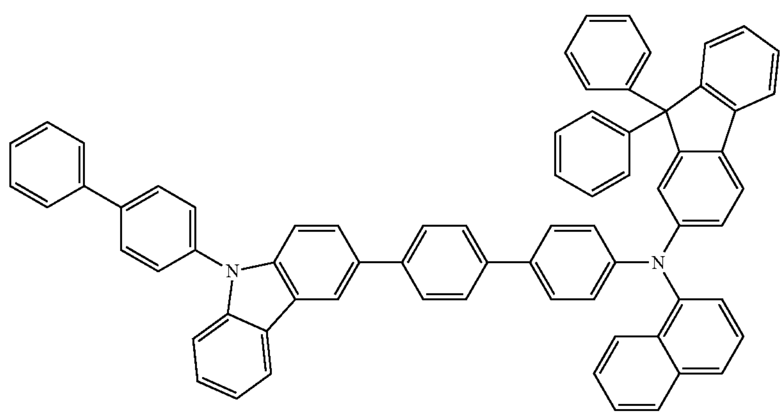
5-59
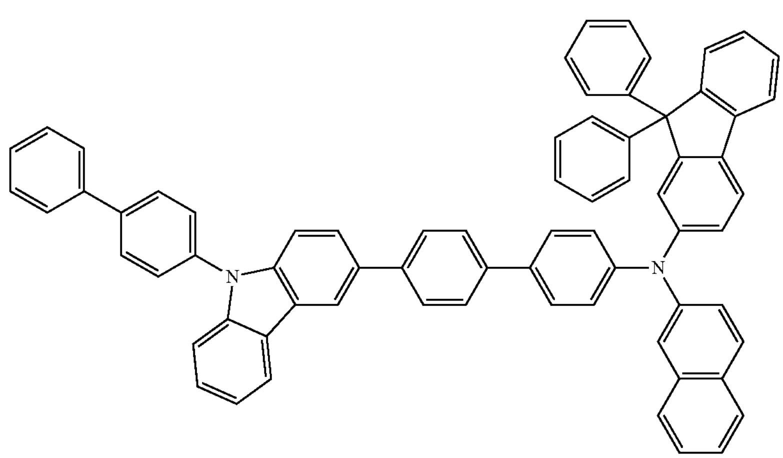

-continued
5-60
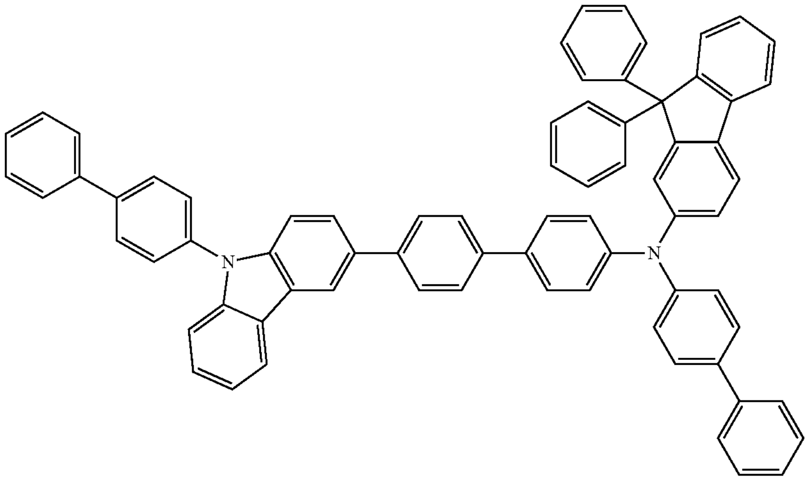
5-61
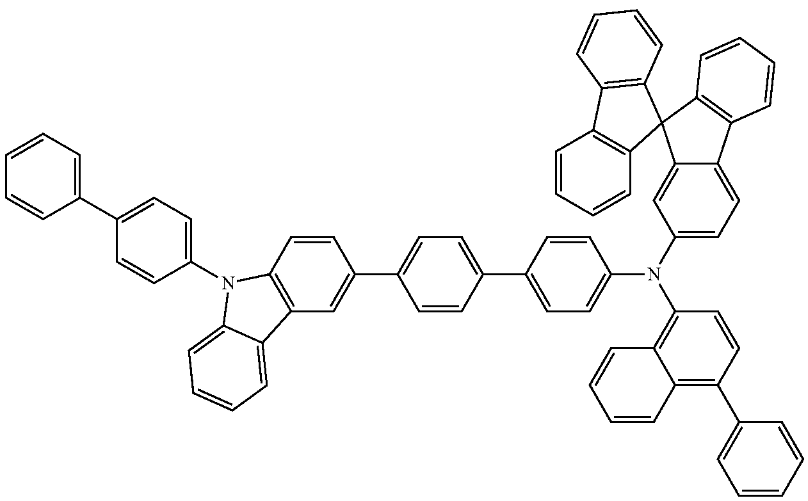
5-62
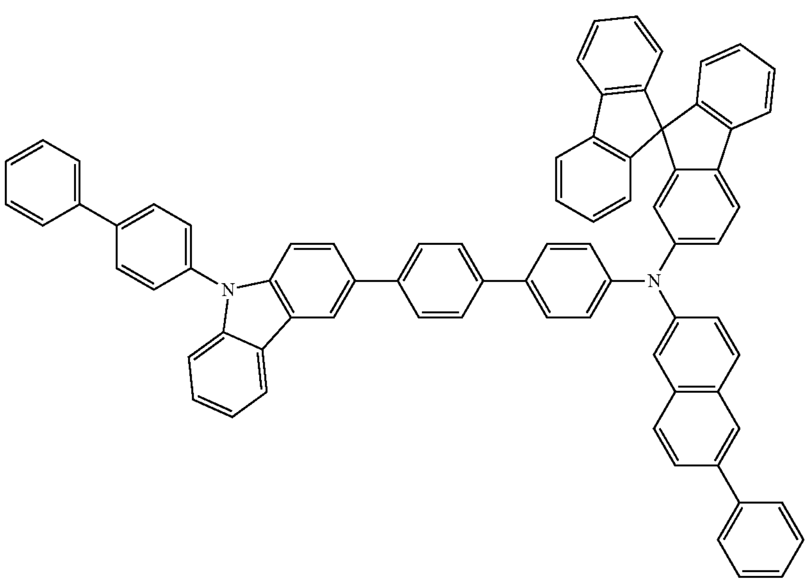

-continued
5-63
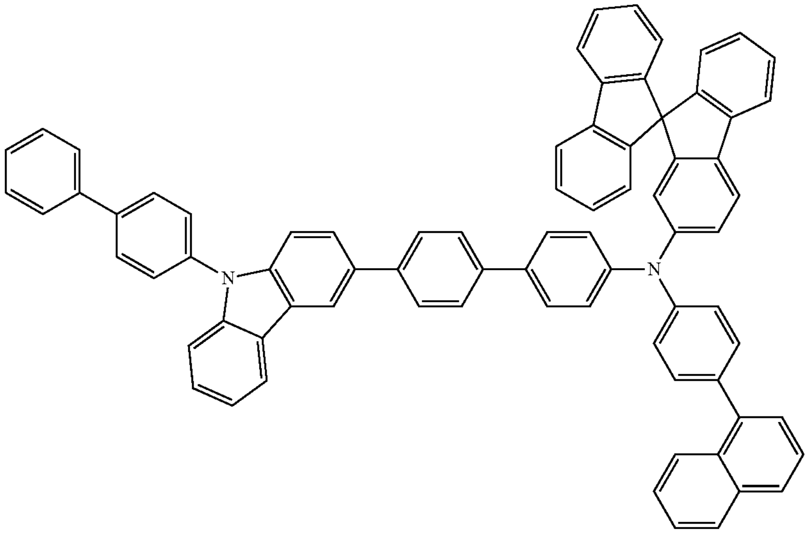
5-64
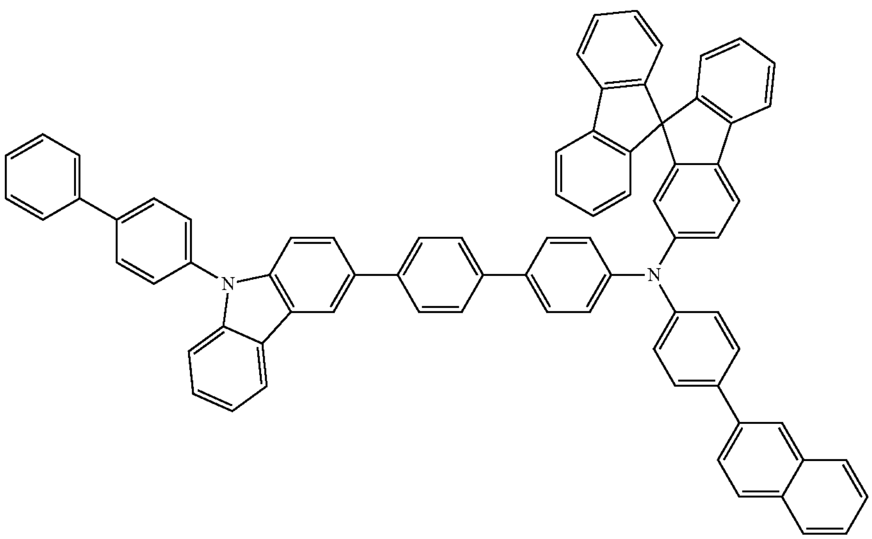
5-65
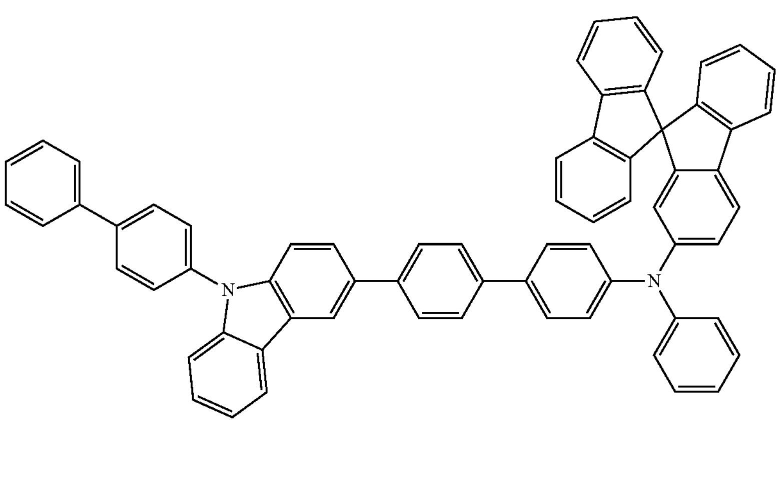

-continued
5-66
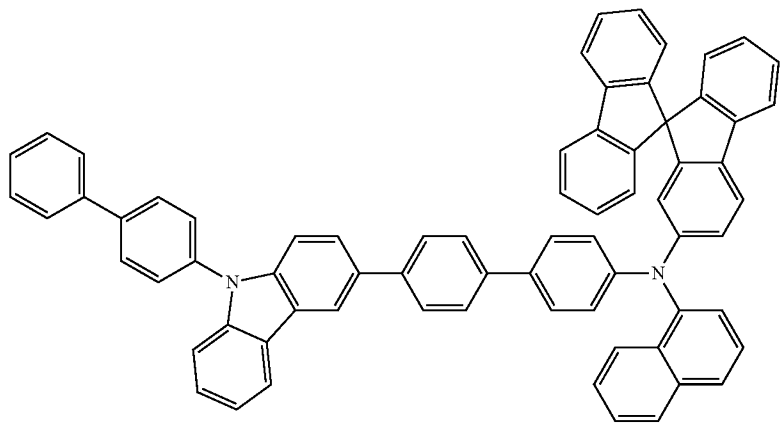
5-67
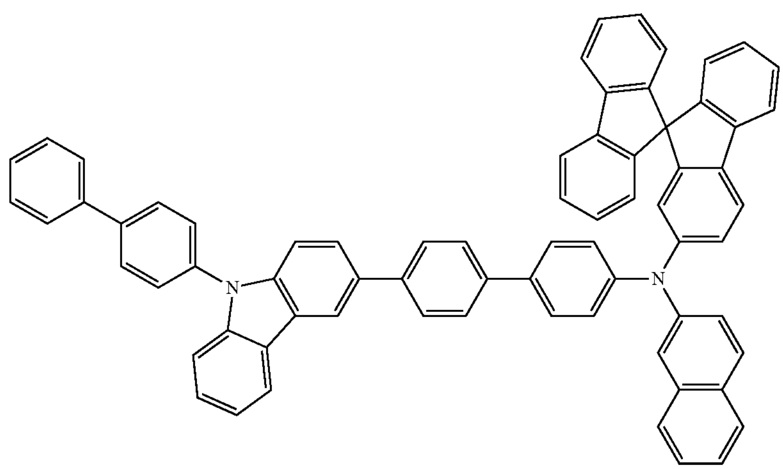
5-68
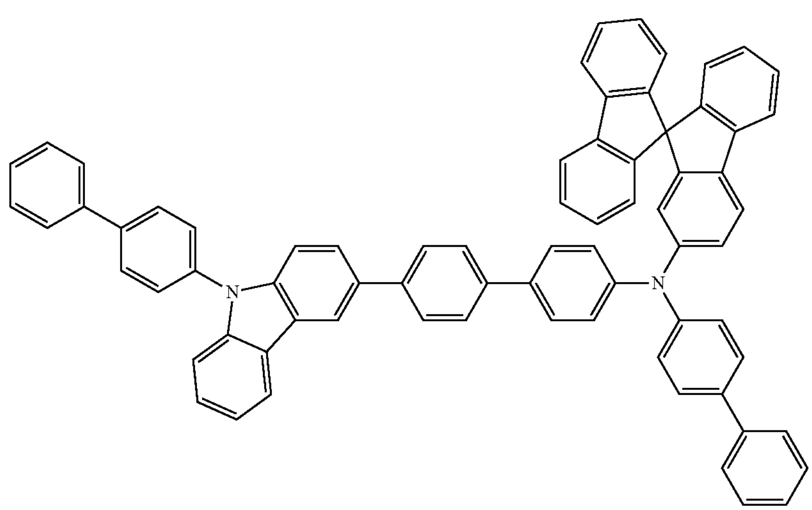

-continued
5-69
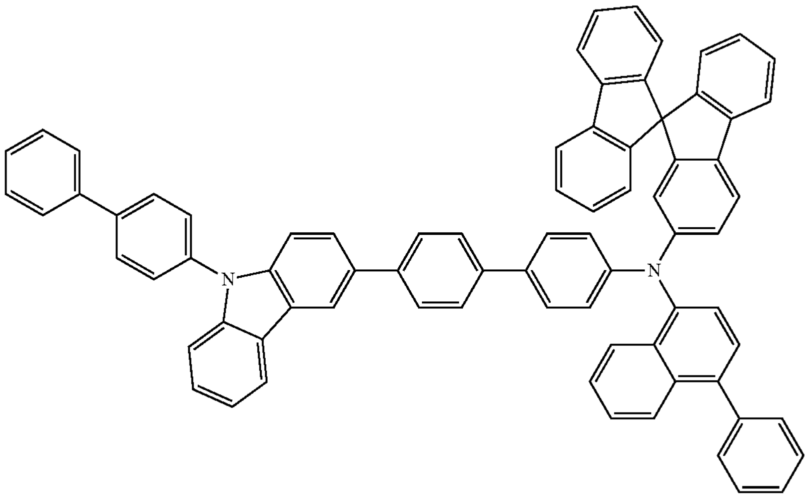
5-70
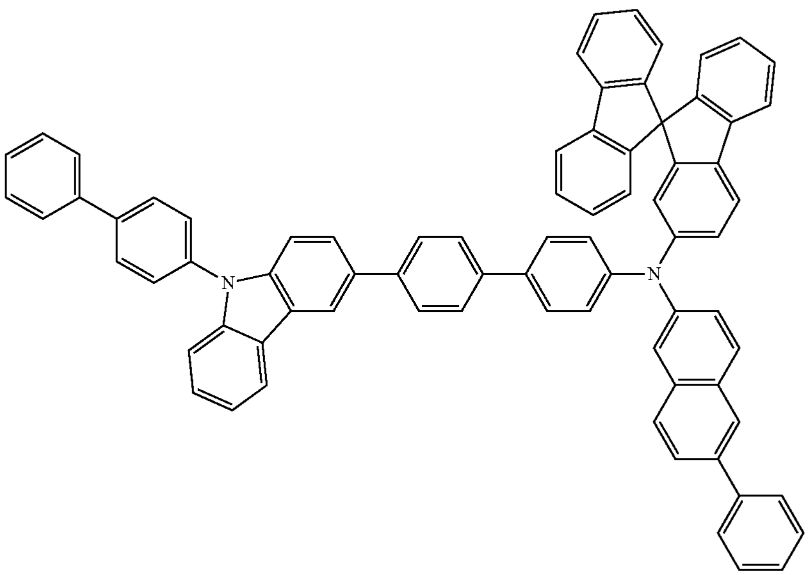
5-71
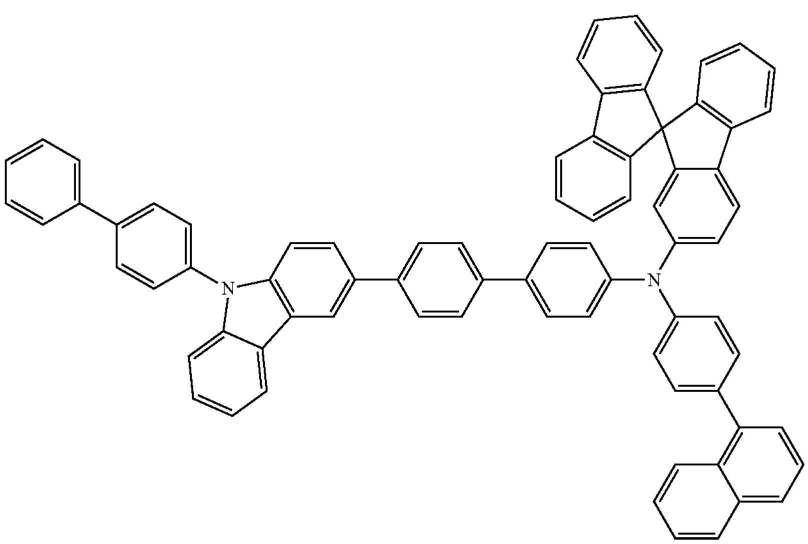

-continued
5-72
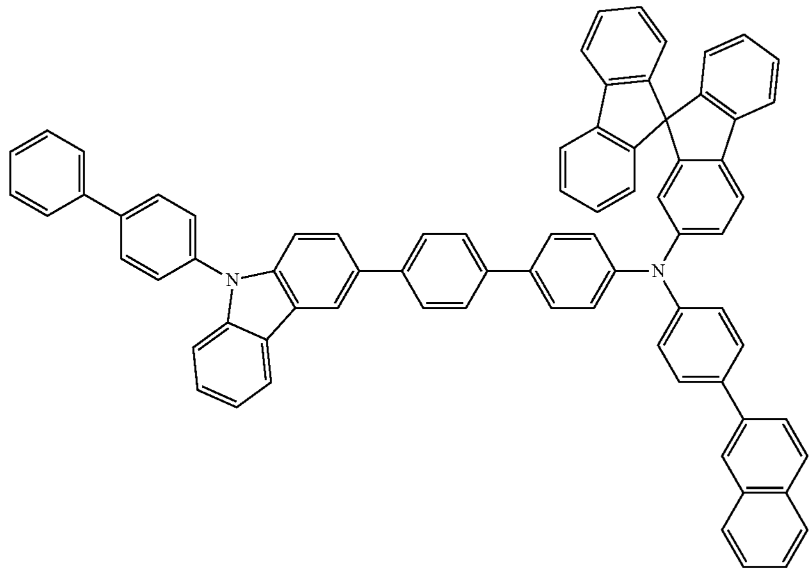
6-1
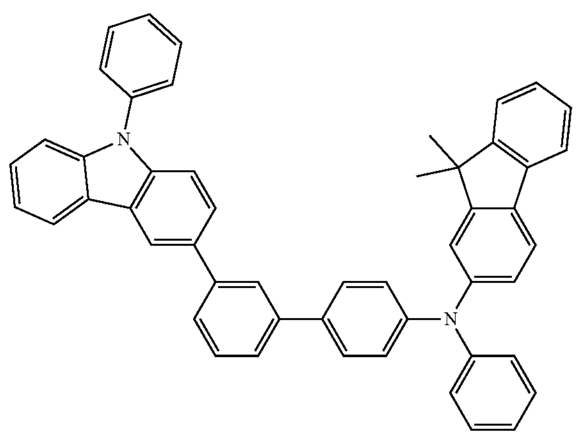
6-2
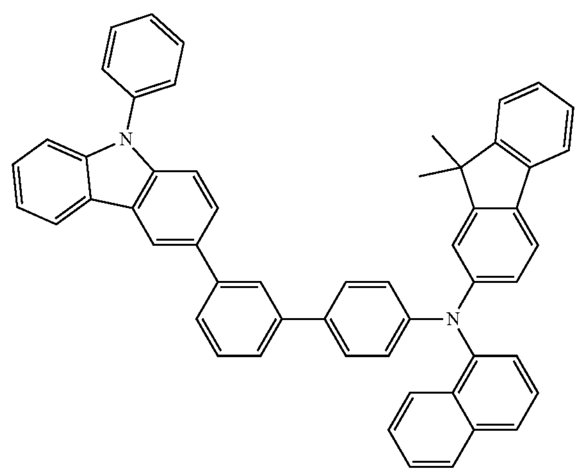
6-3
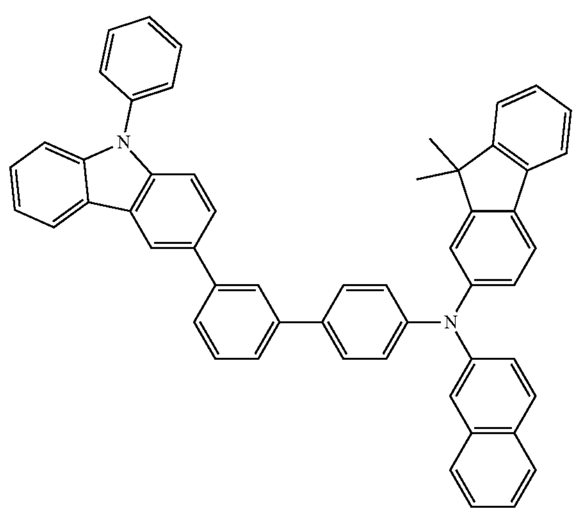

-continued
6-4
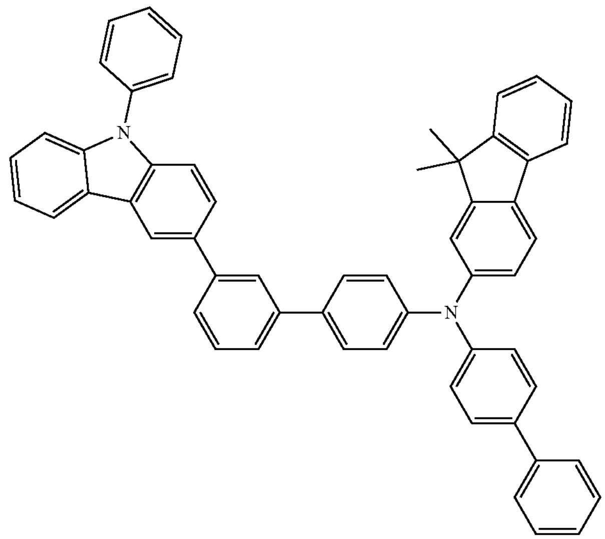
6-5
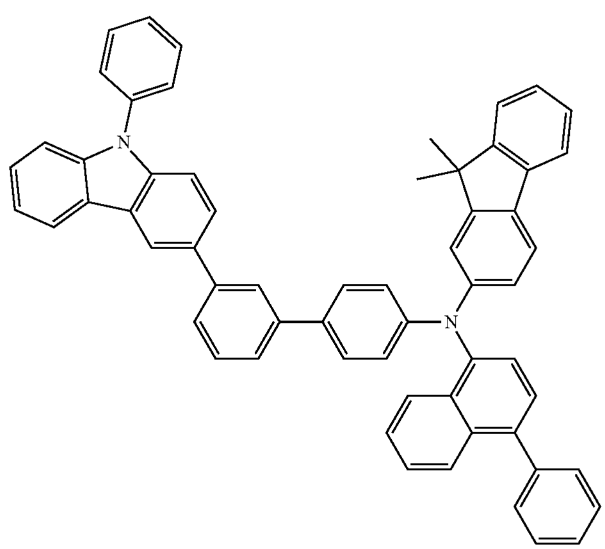

-continued
6-6
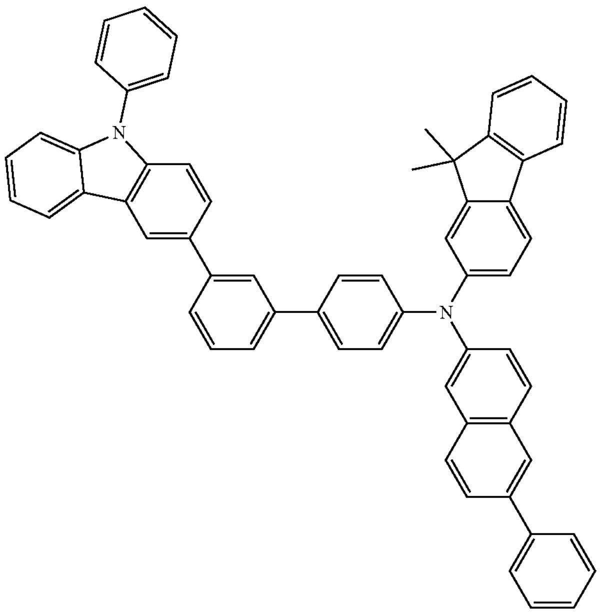
6-7
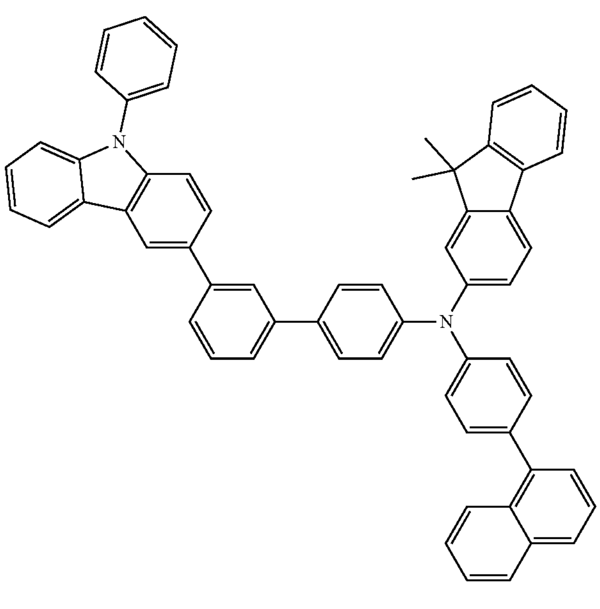

-continued
6-8
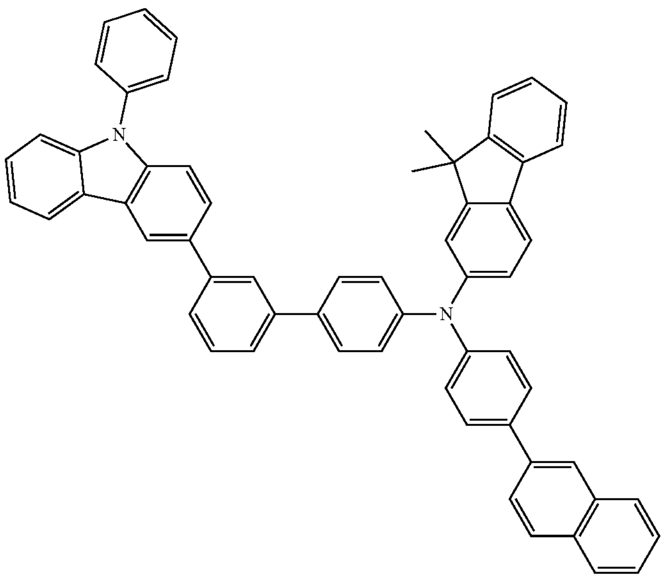
6-9
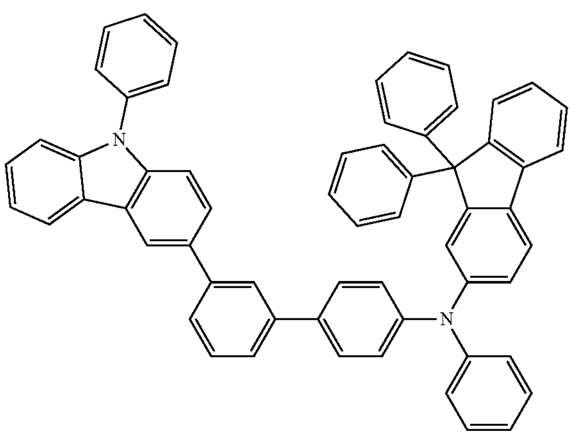
6-10
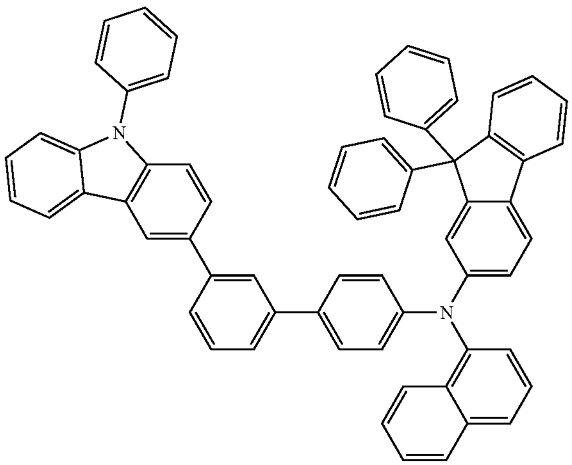

-continued
6-11
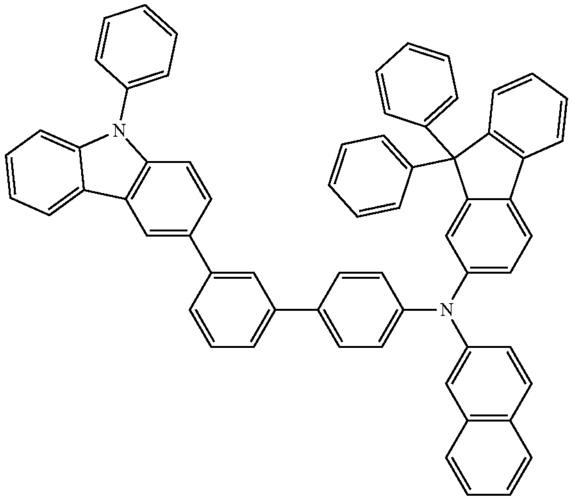
6-12
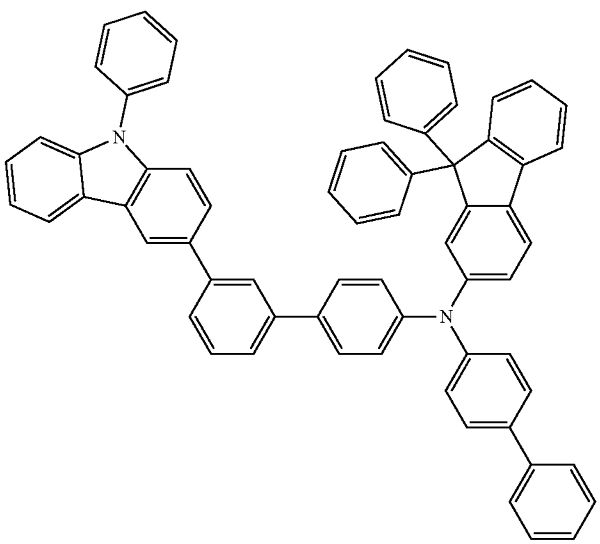
6-13
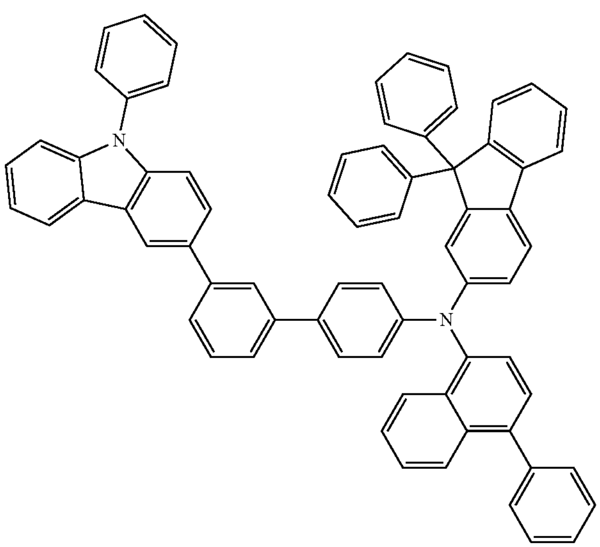

-continued
6-14
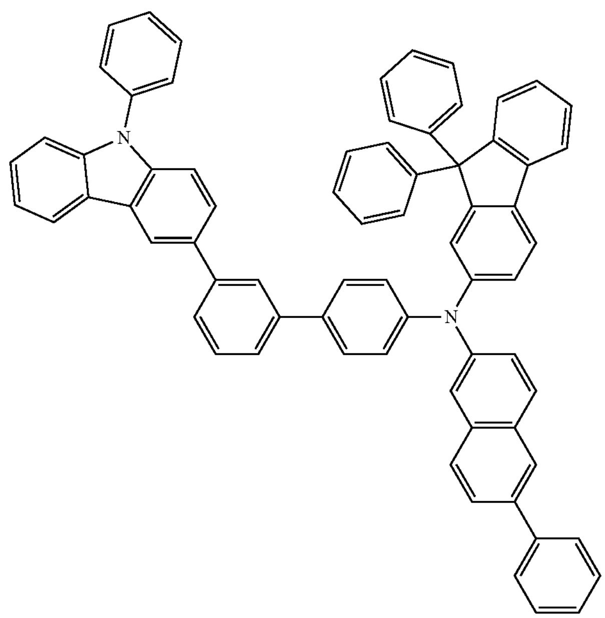
6-15
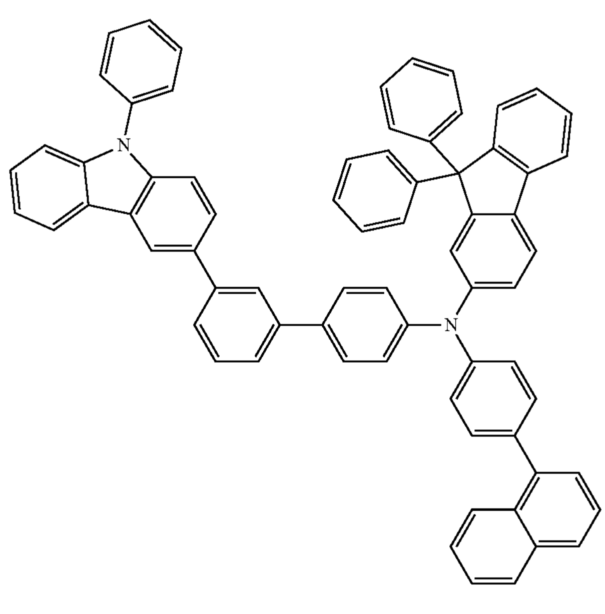

-continued
6-16
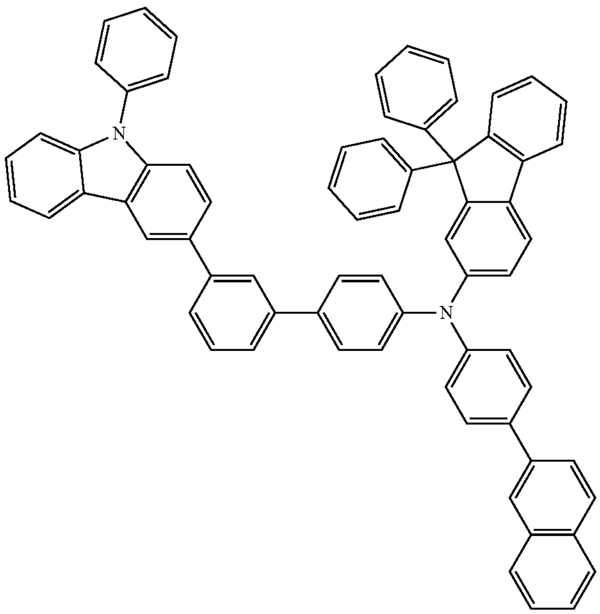
6-17
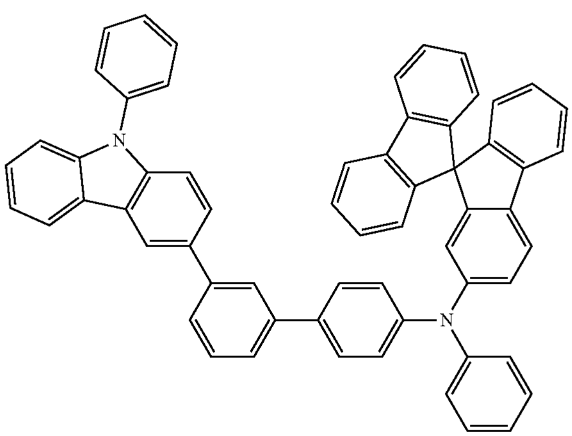
6-18
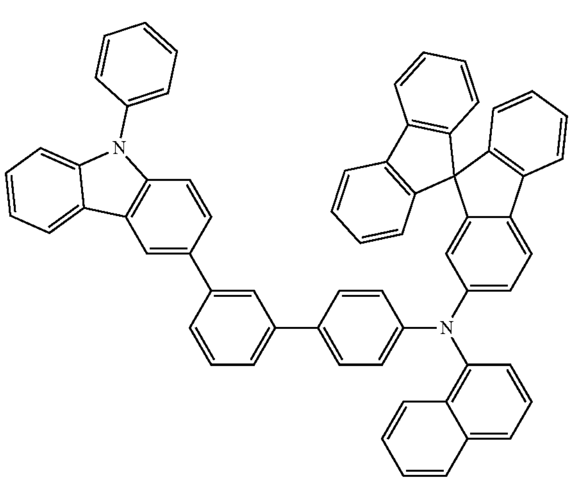

-continued
6-19
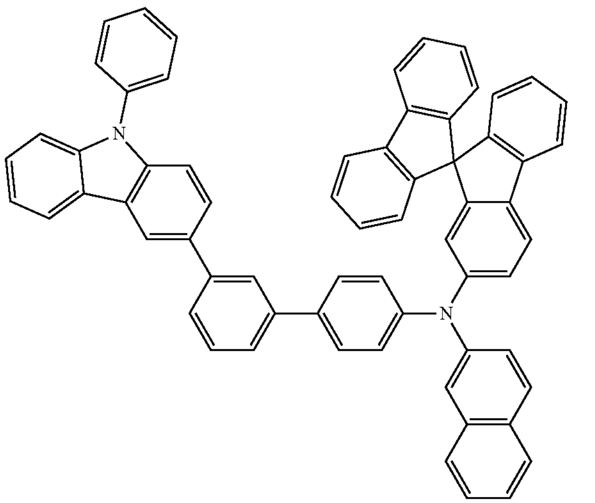
6-20
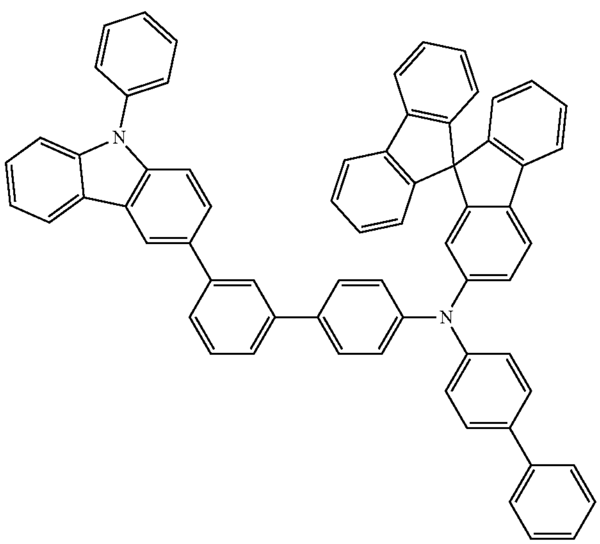
6-21
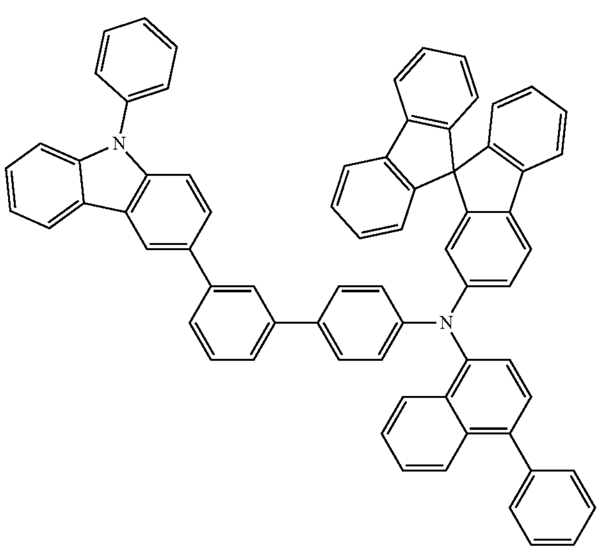

-continued
6-22
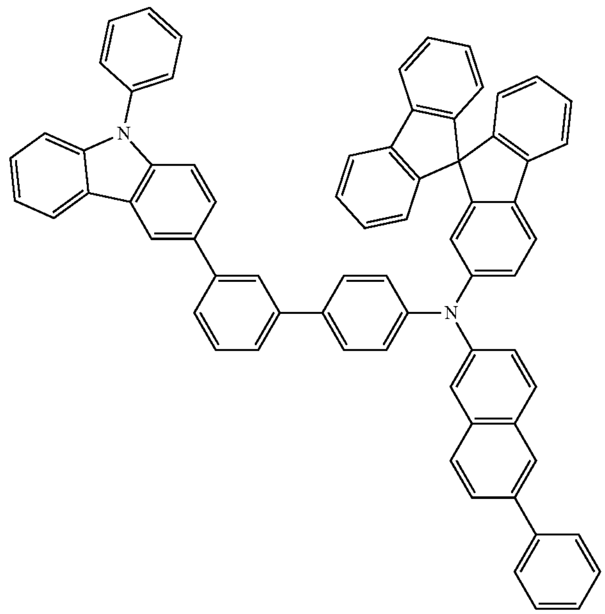
6-23
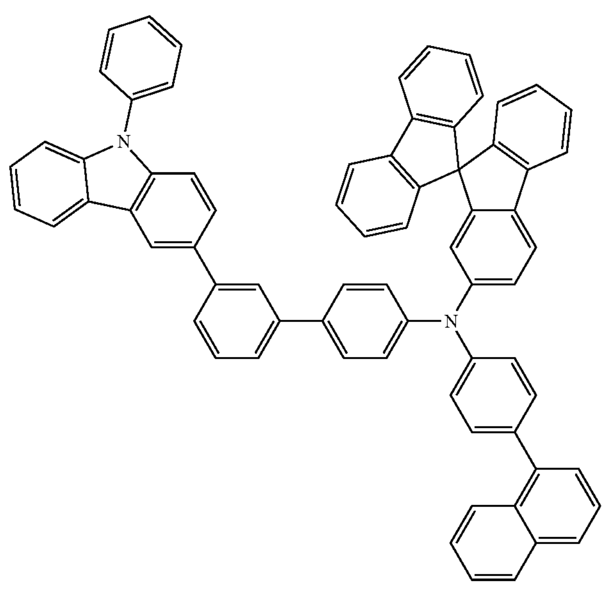

-continued
6-24
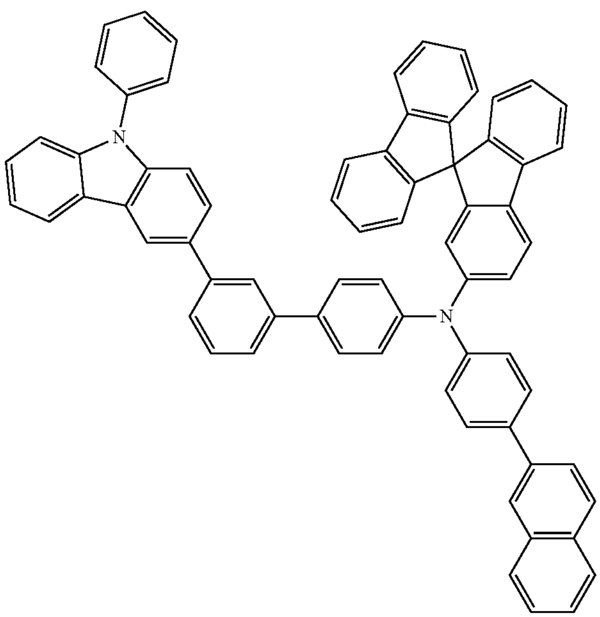
6-25
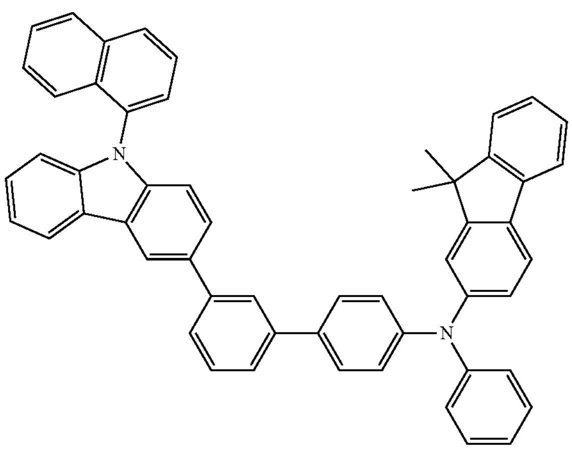
6-26
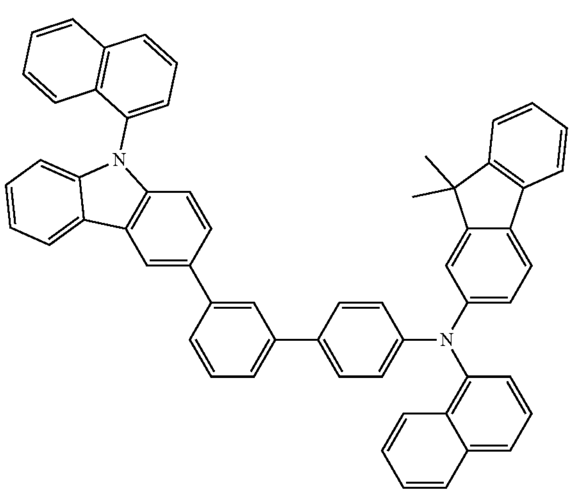

-continued
6-27
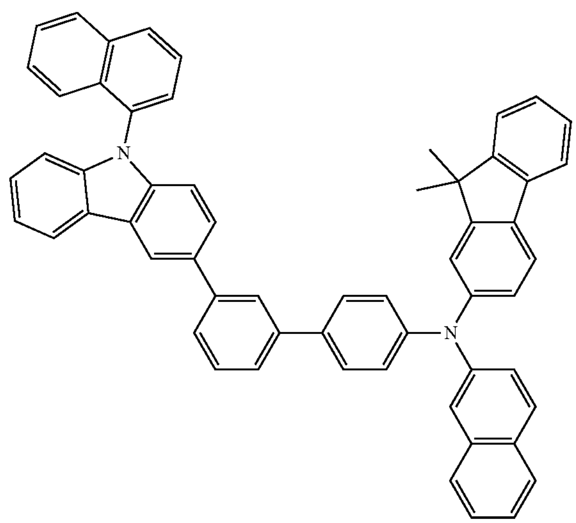
6-28
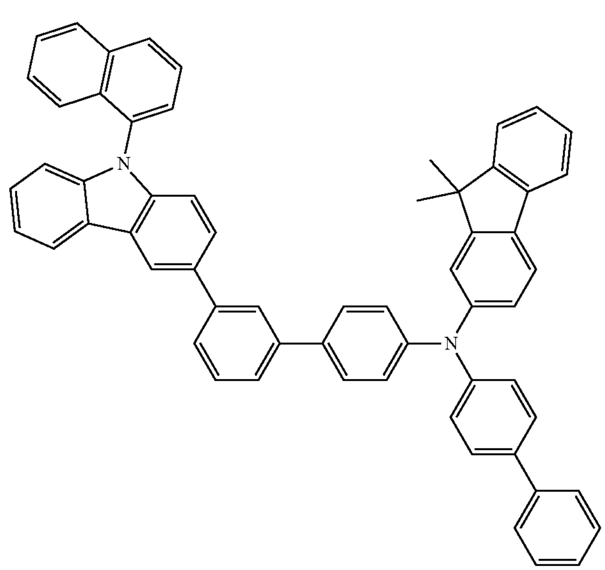

-continued
6-29
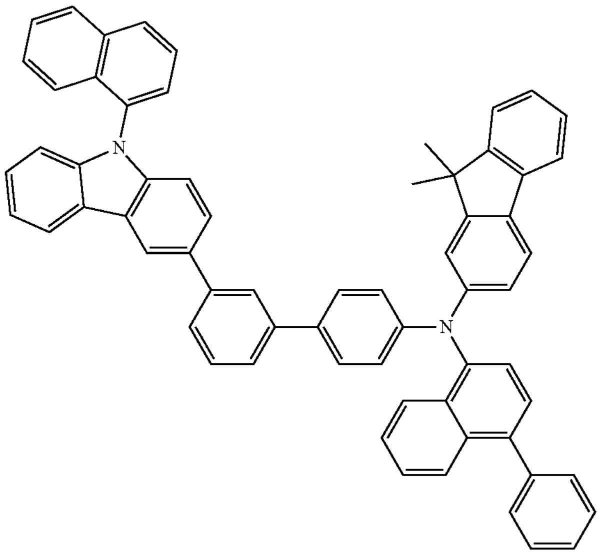
6-30
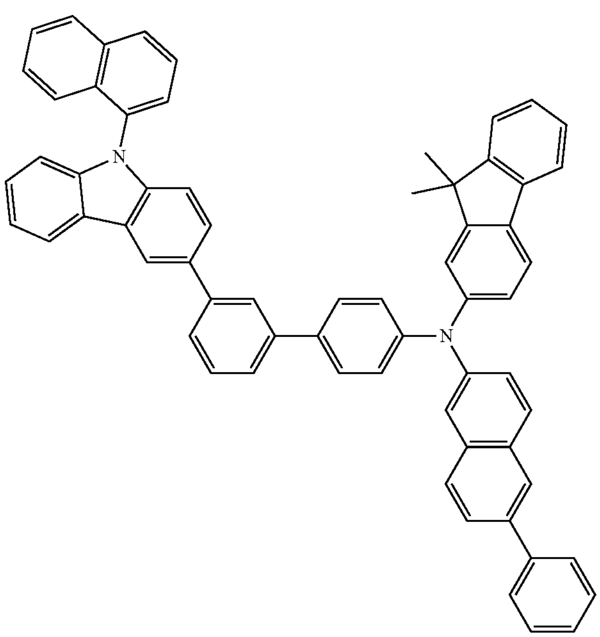

-continued
6-31
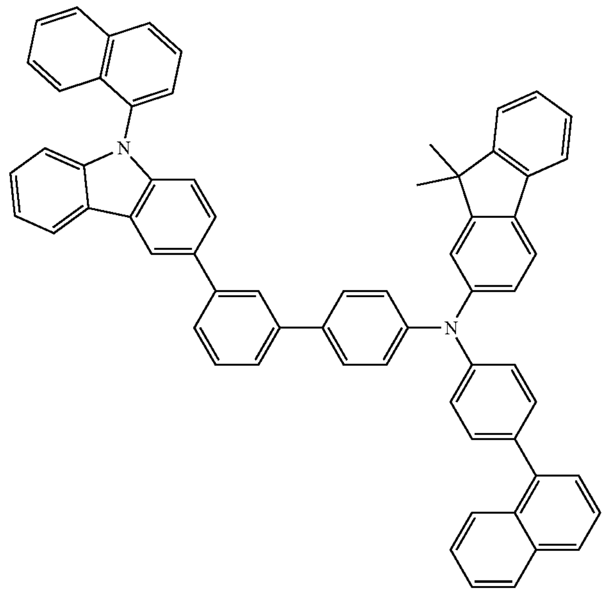
6-32
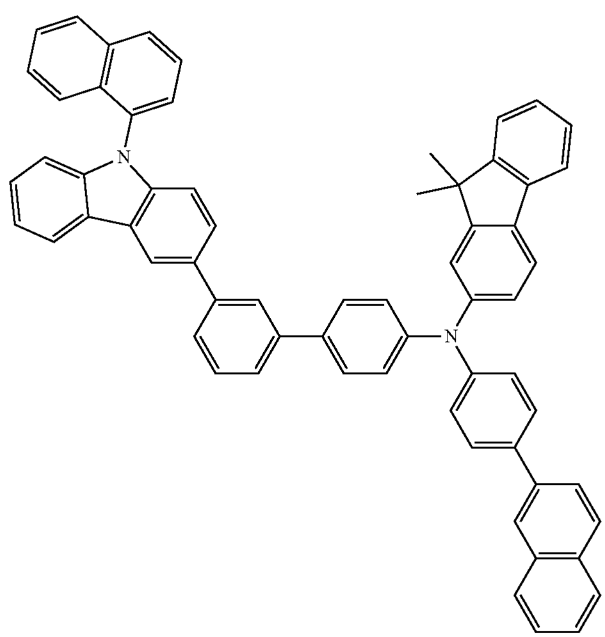

-continued
6-33
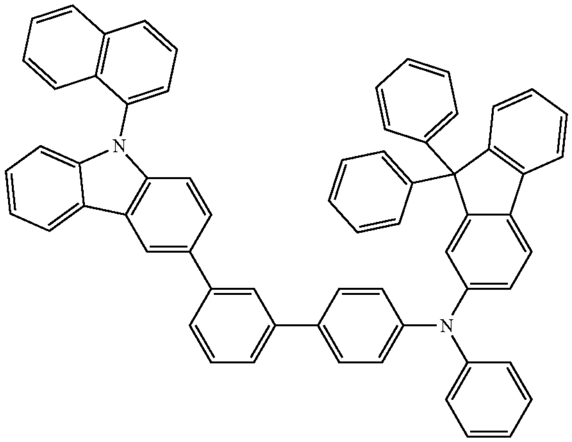
6-34
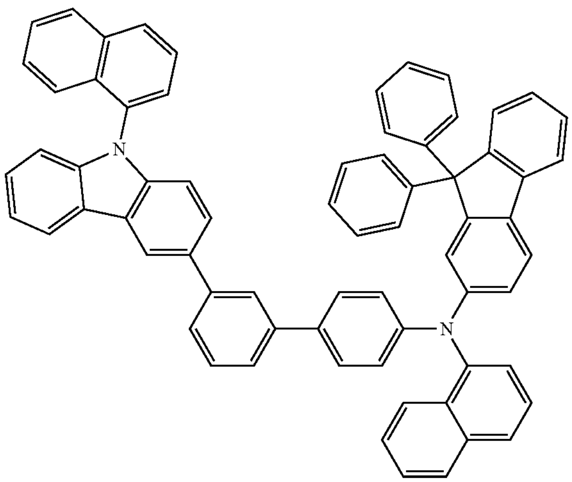
6-35
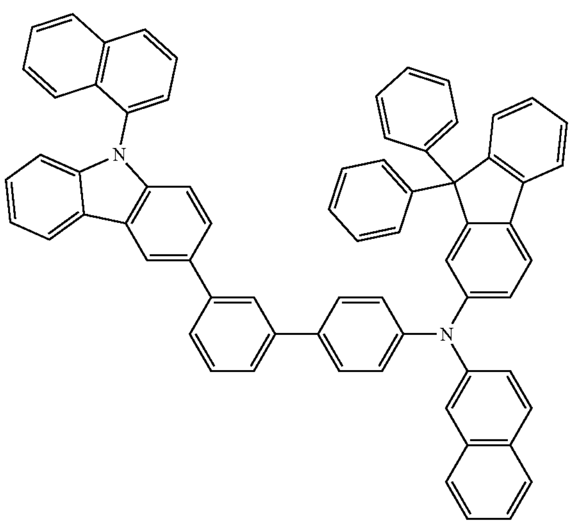

-continued
6-36
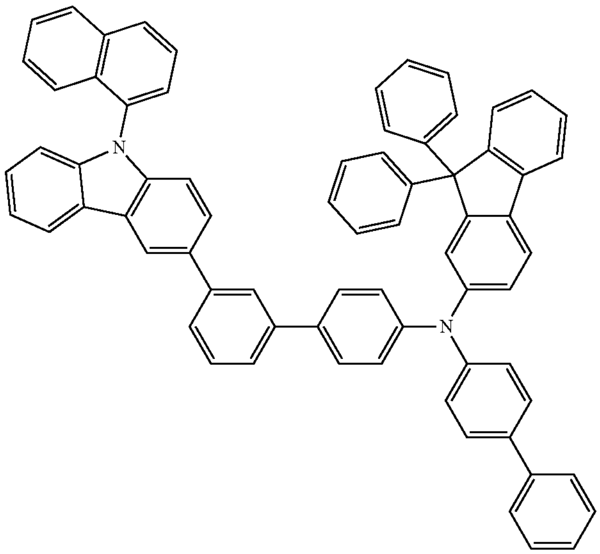
6-37
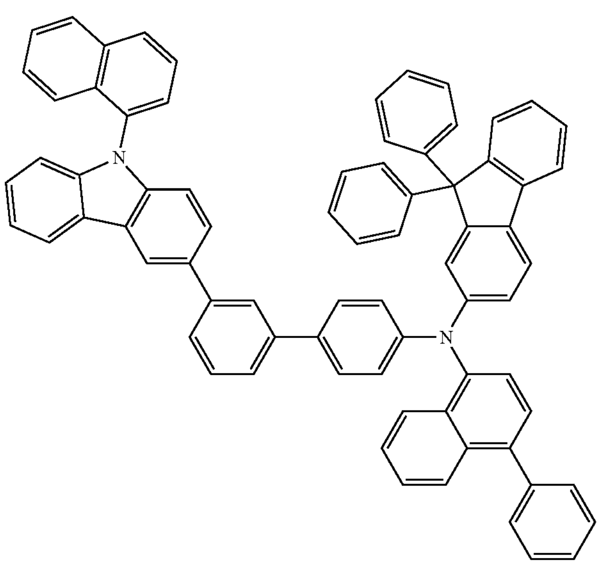

-continued
6-38
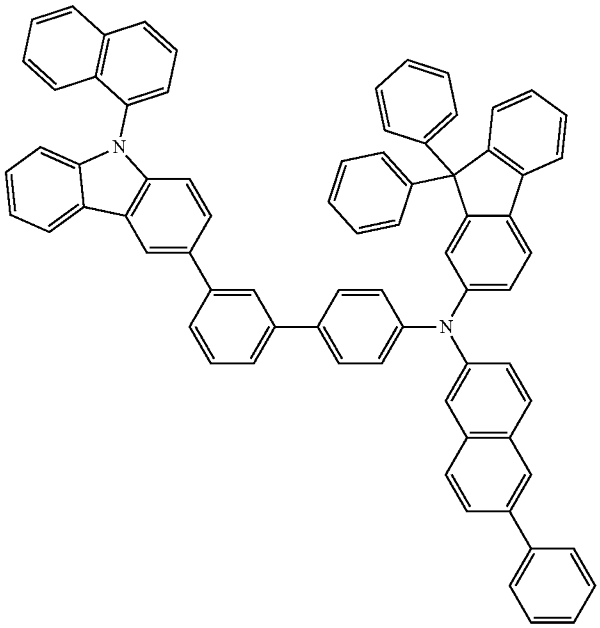
6-39
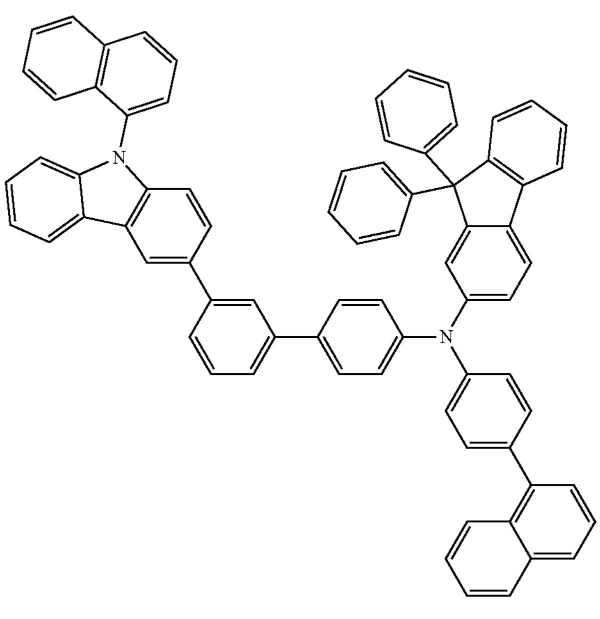

-continued
6-406
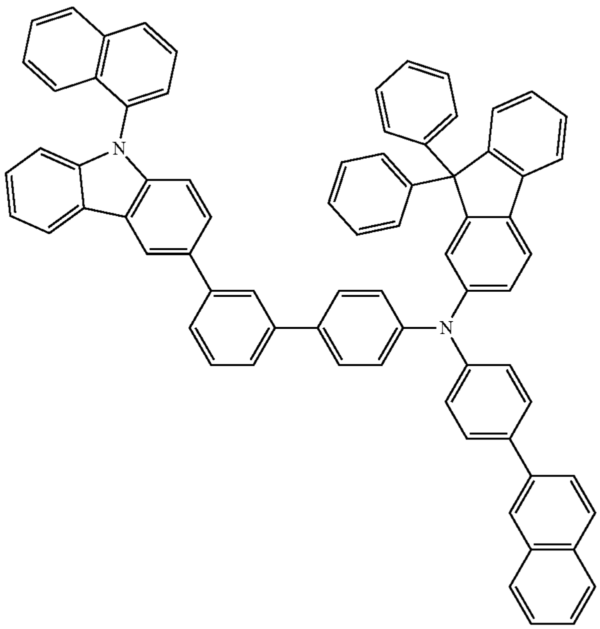
6-41
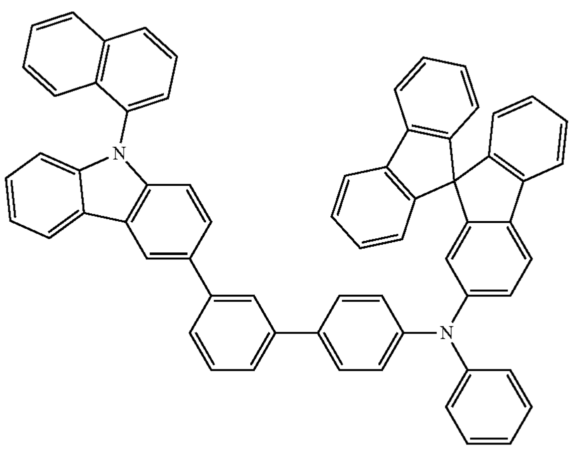
6-42
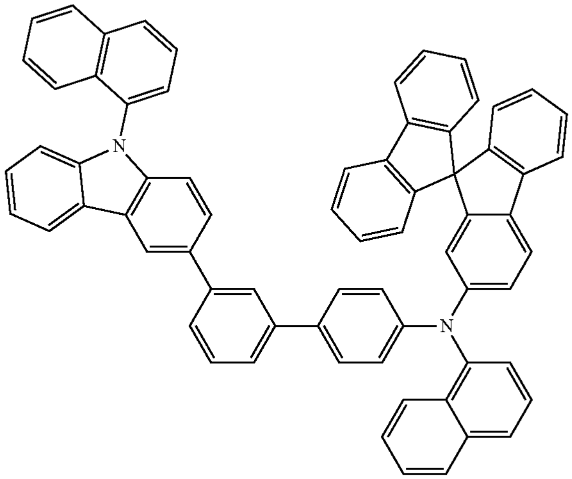

-continued
6-43
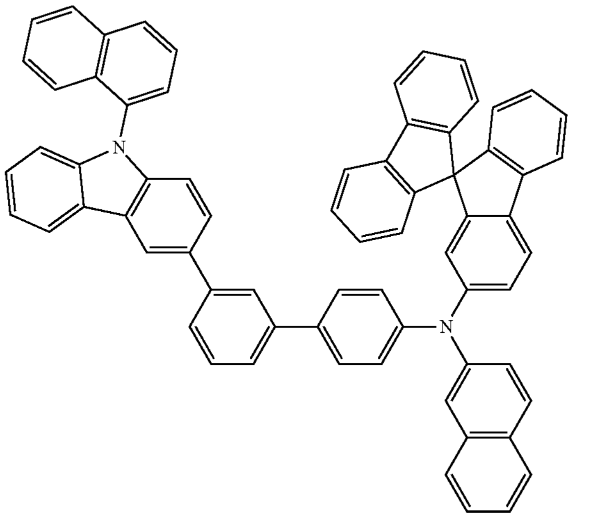
6-44
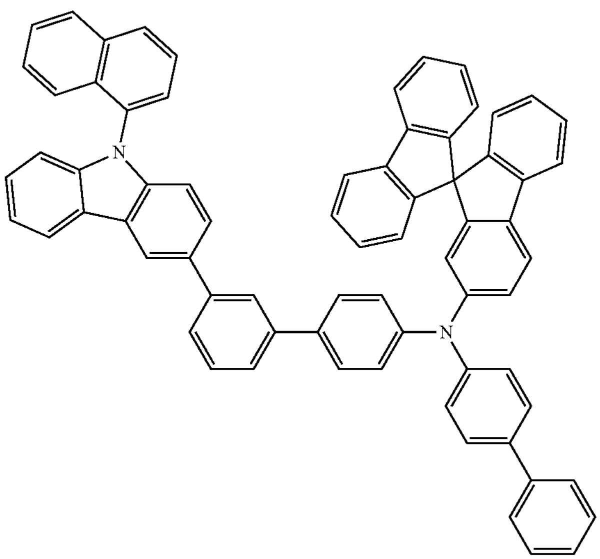
6-45
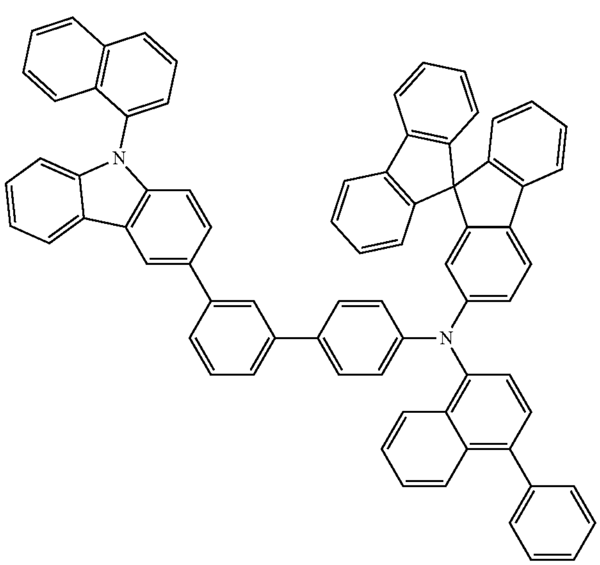

-continued
6-46
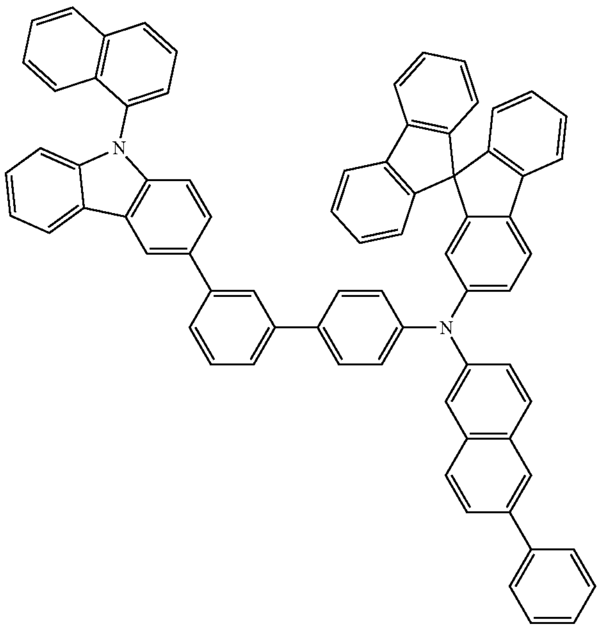
6-47
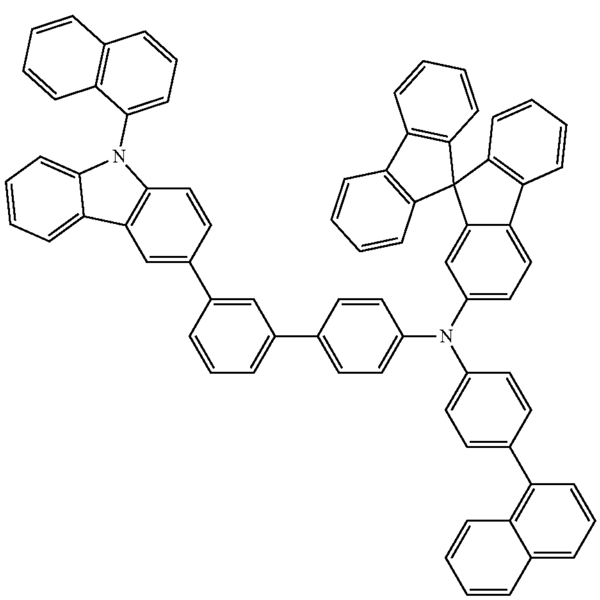

-continued
6-48
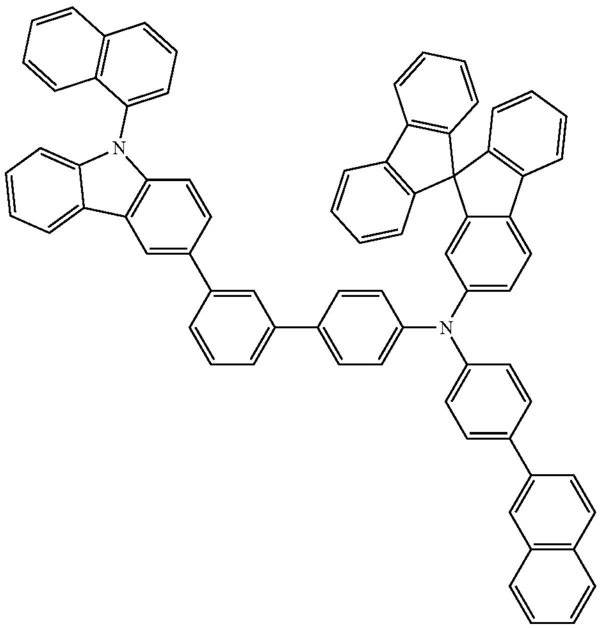
6-49
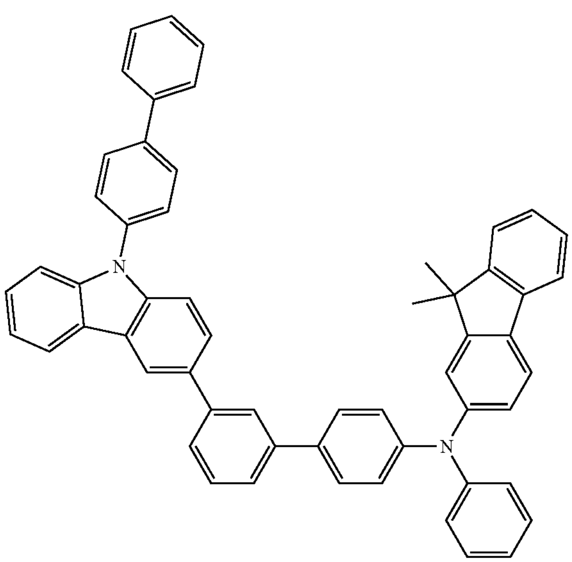

-continued
6-50
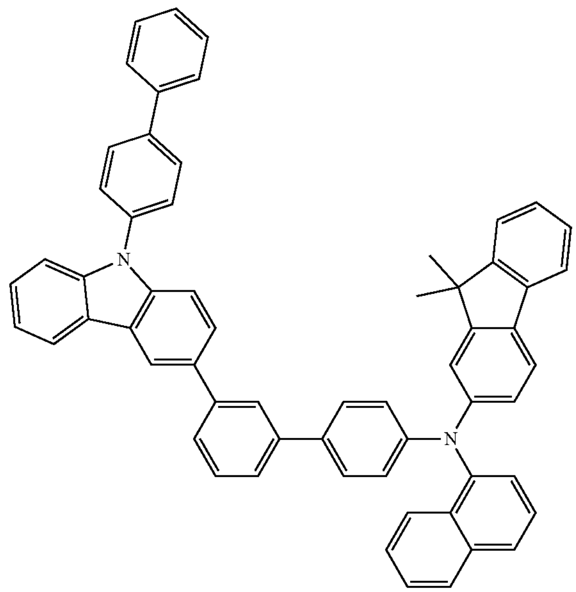
6-51
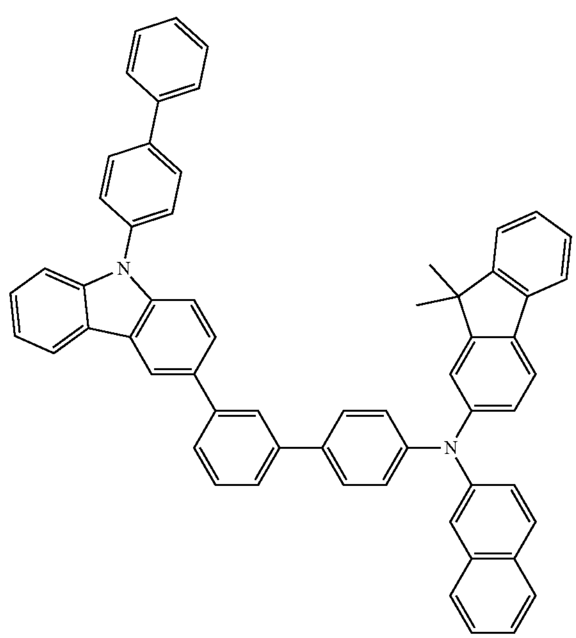

-continued
6-52
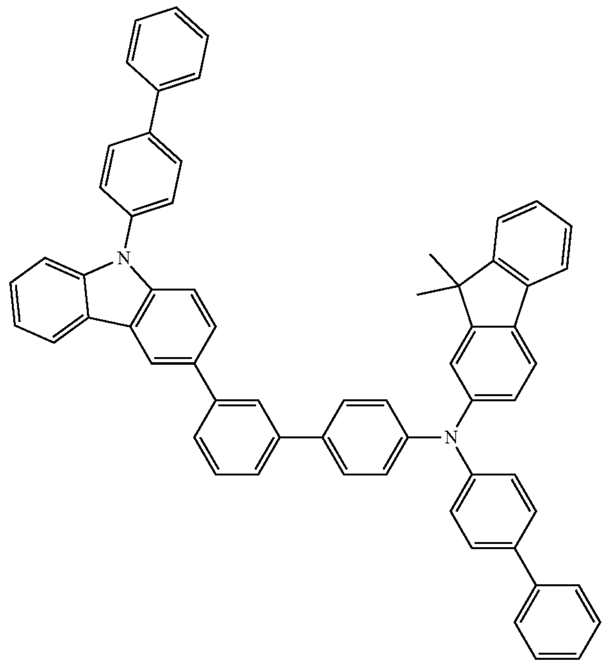
6-53
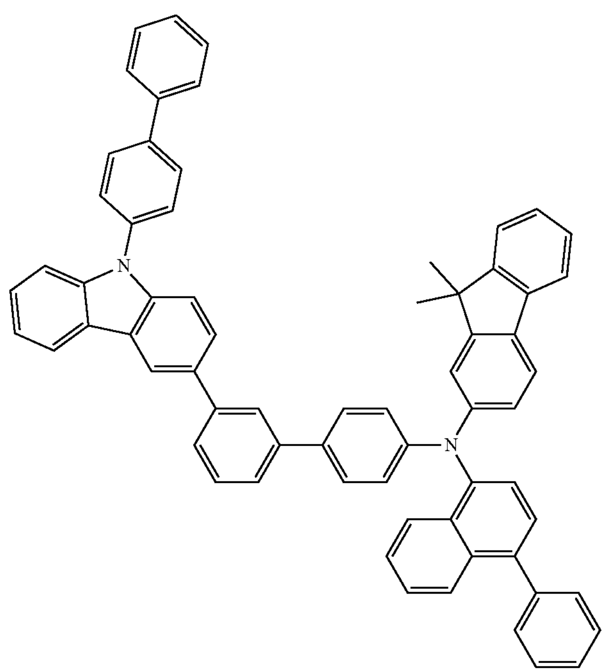

-continued
6-54
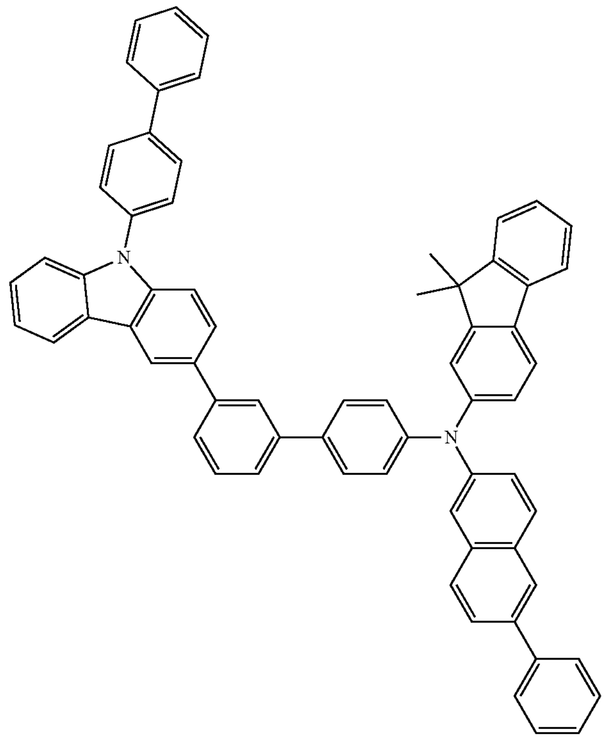
6-55
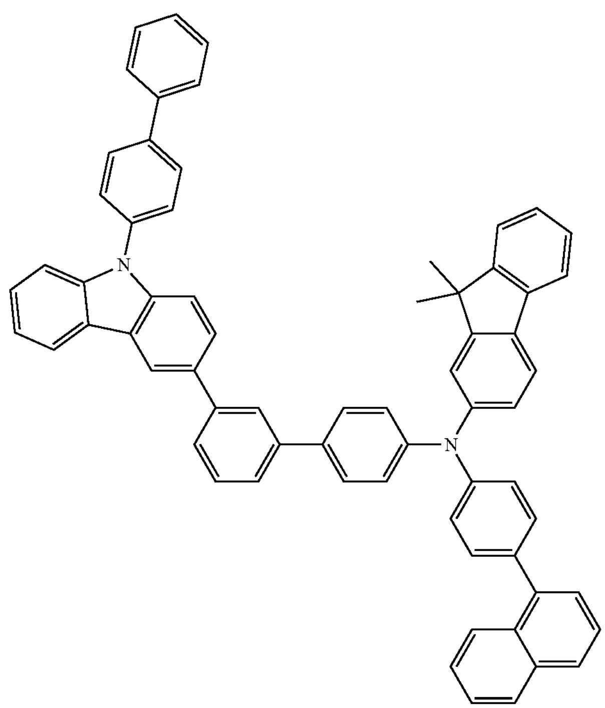

-continued
6-56
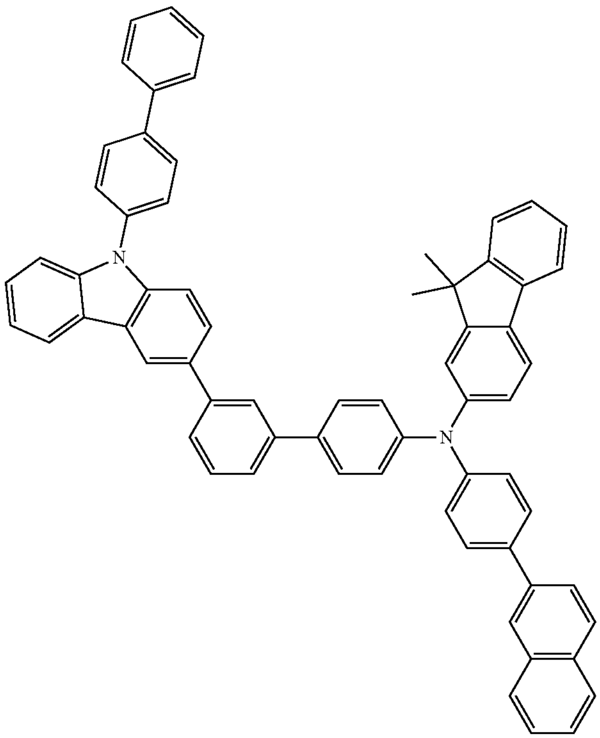
6-57
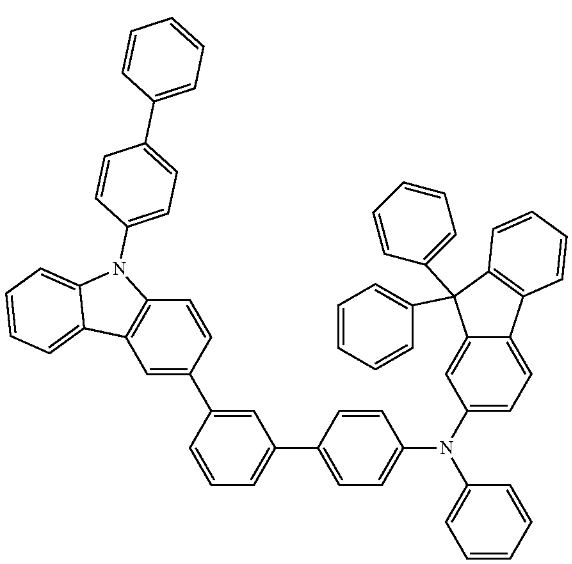

-continued
6-58
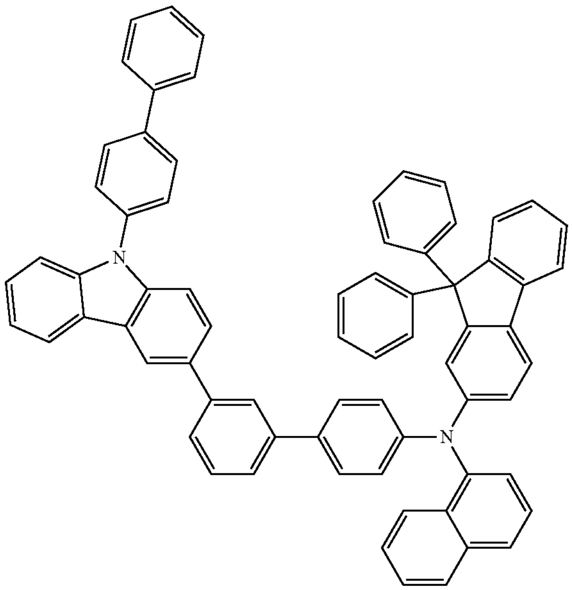
6-59
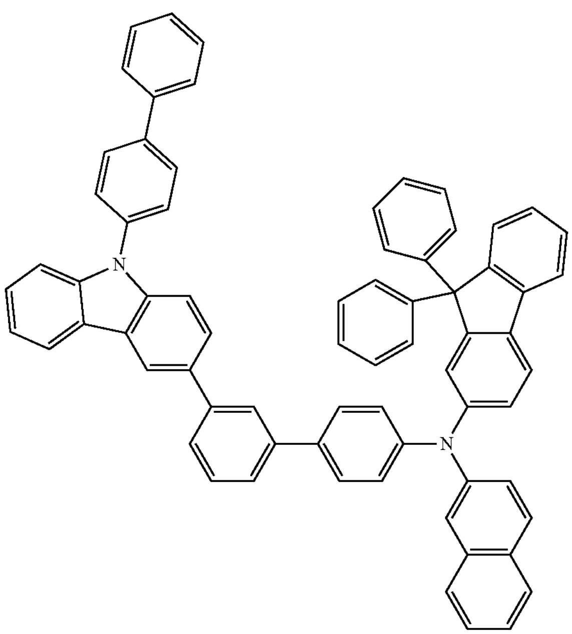

-continued
6-60
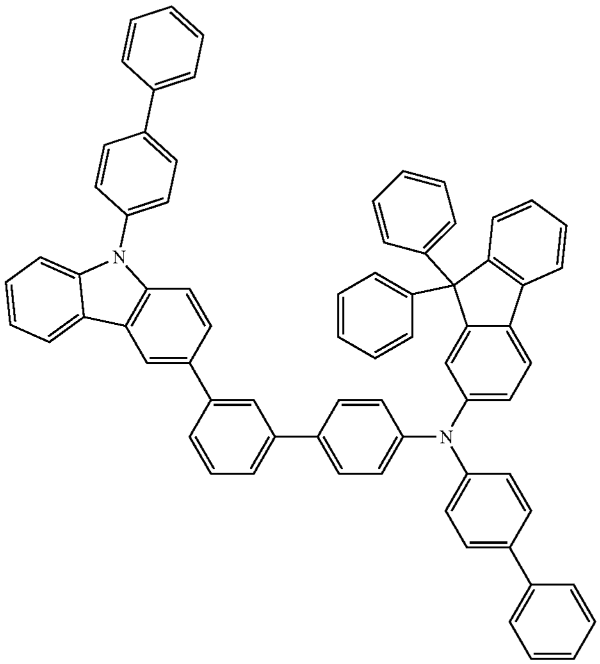
6-61
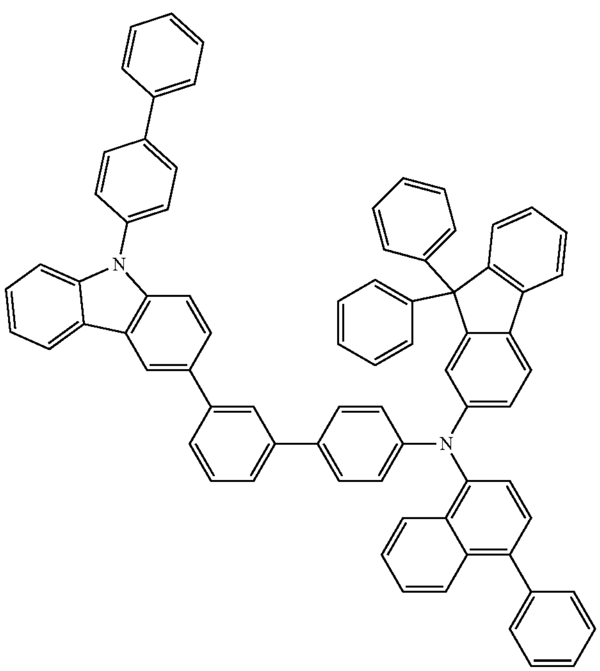

-continued
6-62
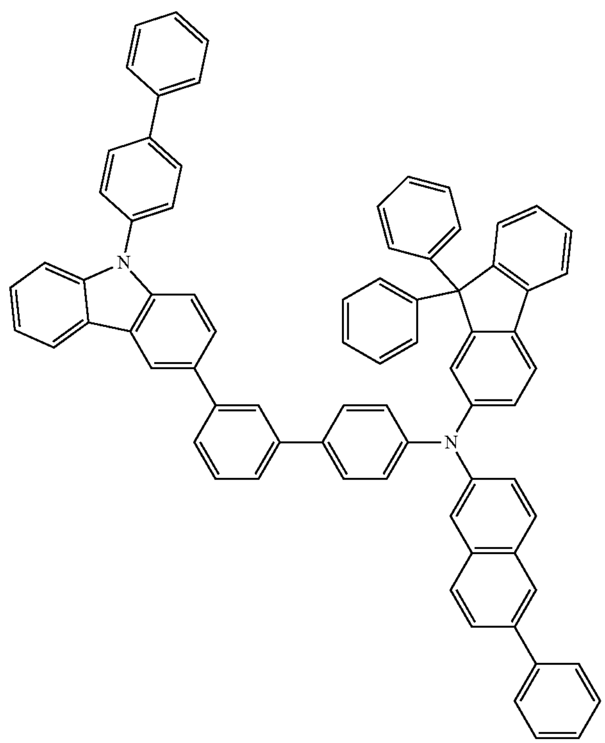
6-63
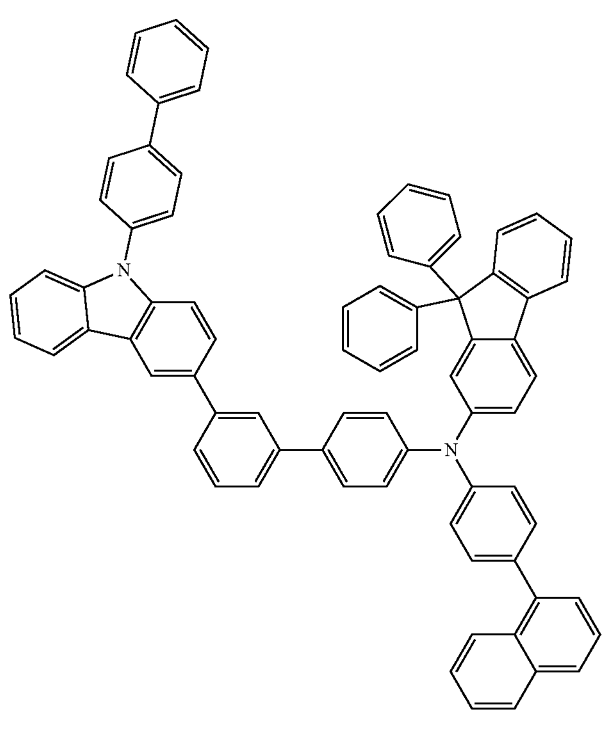

-continued
6-64
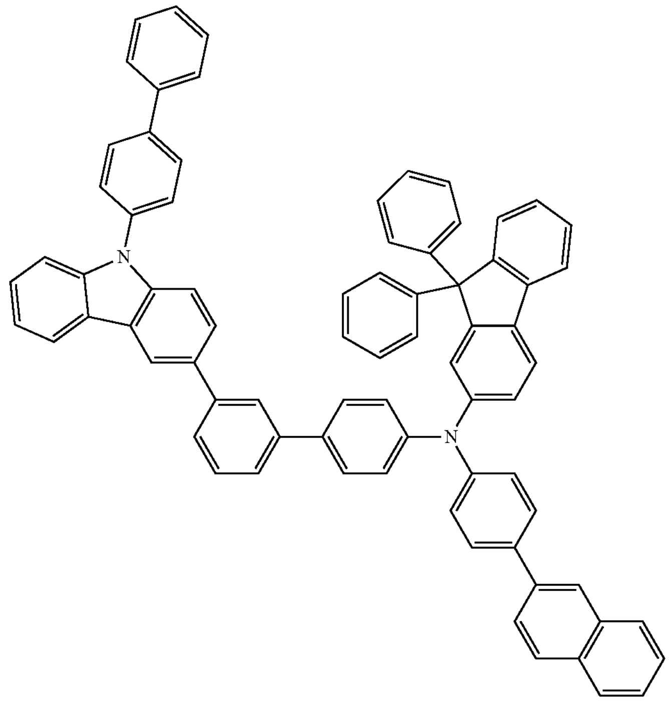
6-65
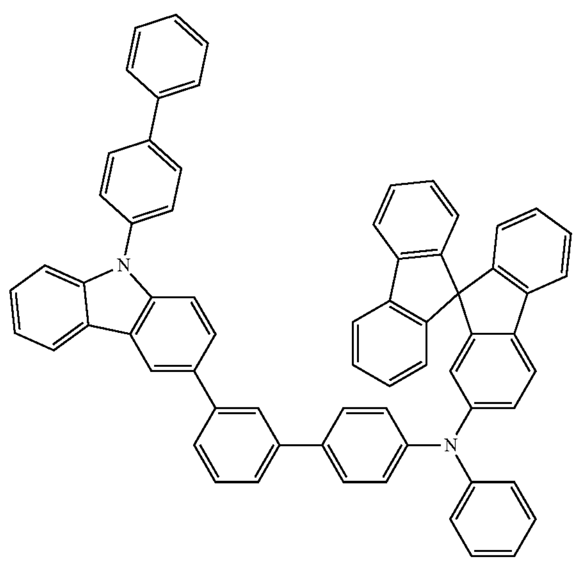

-continued
6-66
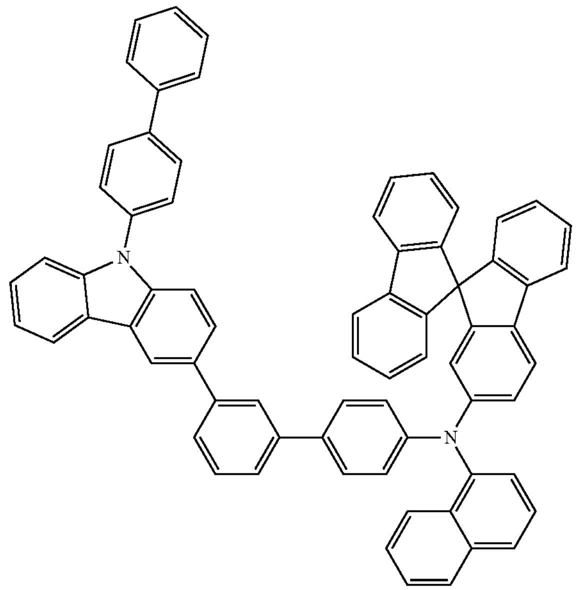
6-67
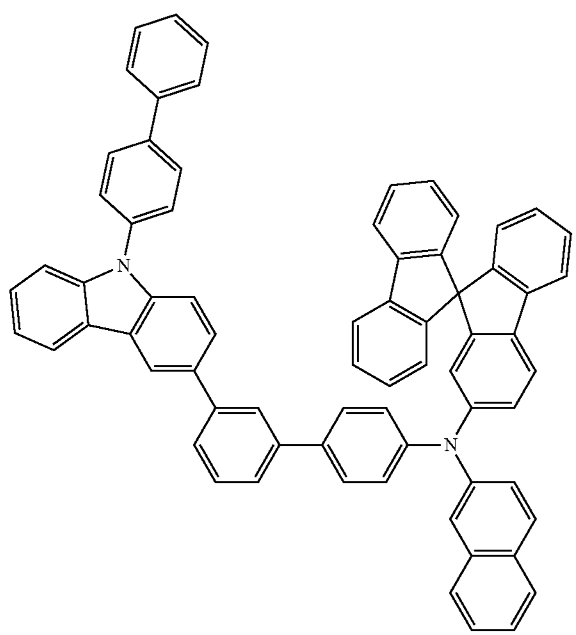

-continued
6-68
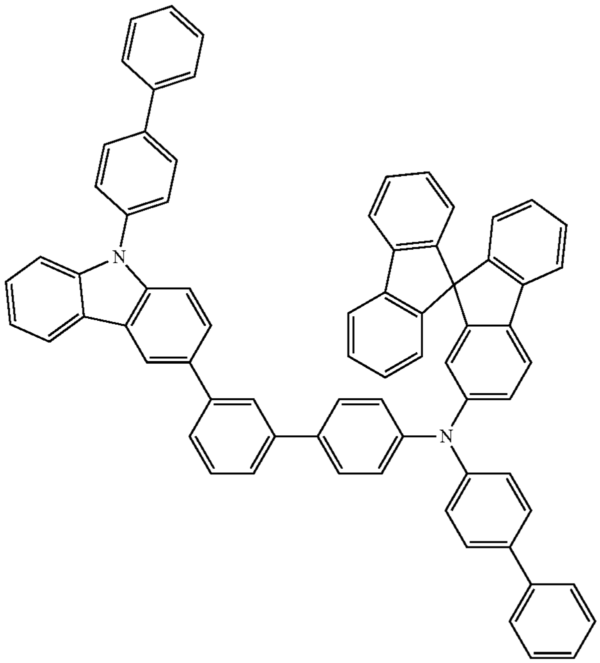
6-69
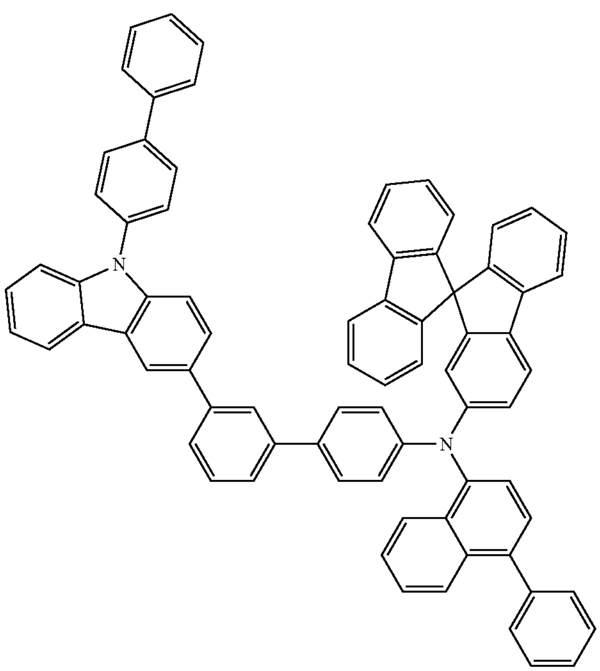

-continued
6-70
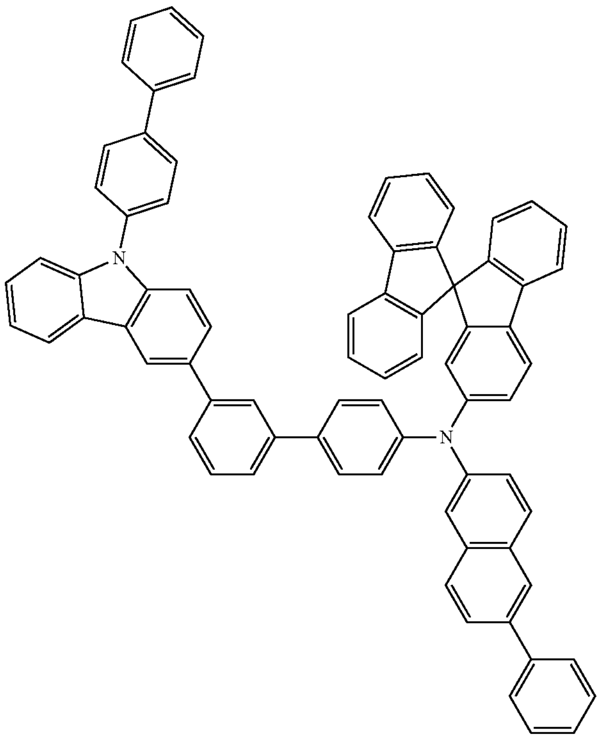
6-71
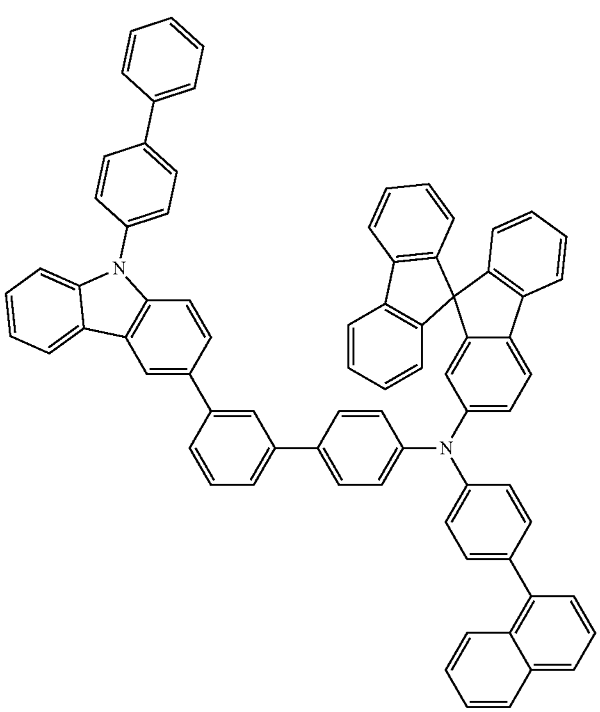

-continued
6-72
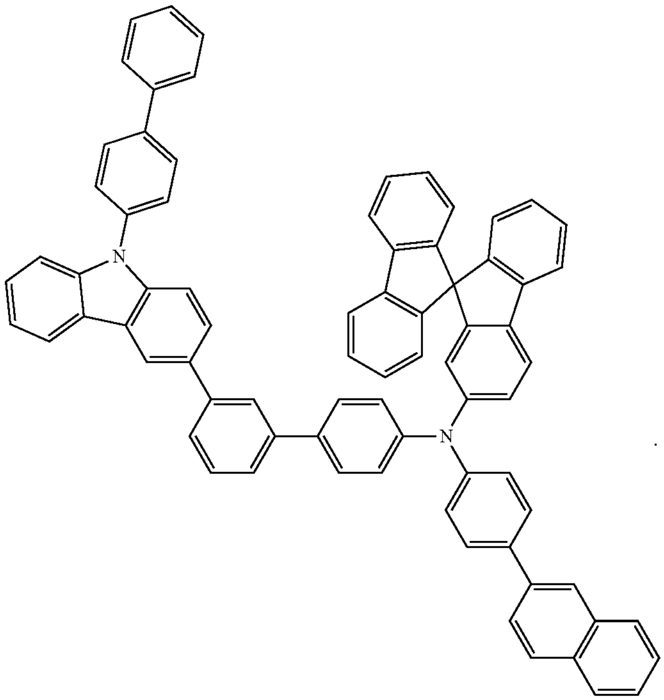
* * * * *